US012652770B2

(12) United States Patent

George

(10) Patent No.: US 12,652,770 B2
(45) Date of Patent: Jun. 9, 2026

(54) HIGH-DENSITY DATA STORAGE SYSTEMS AND METHODS

(71) Applicant: Christopher Scott George, Palo Alto, CA (US)

(72) Inventor: Christopher Scott George, Palo Alto, CA (US)

( * ) Notice: Subject to any disclaimer, the term of this patent is extended or adjusted under 35 U.S.C. 154(b) by 443 days.

(21) Appl. No.: 18/217,941

(22) Filed: Jul. 3, 2023

(65) Prior Publication Data

US 2024/0013815 A1    Jan. 11, 2024

Related U.S. Application Data

(60) Provisional application No. 63/358,776, filed on Jul. 6, 2022.

(51) Int. Cl.
| | |
|---|---|
| *H05K 5/02* | (2006.01) |
| *G06F 1/18* | (2026.01) |
| *G06F 1/183* | (2026.01) |
| *G06F 1/187* | (2026.01) |
| *H05K 5/10* | (2025.01) |
| *H05K 5/30* | (2025.01) |

(52) U.S. Cl.
CPC ........... *H05K 5/0247* (2013.01); *G06F 1/183* (2013.01); *G06F 1/187* (2013.01); *H05K 5/0256* (2013.01); *H05K 5/10* (2025.01); *H05K 5/30* (2025.01)

(58) Field of Classification Search
CPC ...... H05K 5/0247; H05K 5/0256; H05K 5/10; H05K 5/30; G06F 1/183; G06F 1/187
See application file for complete search history.

(56) References Cited

U.S. PATENT DOCUMENTS

| | | | | | |
|---|---|---|---|---|---|
| 6,459,571 | B1 * | 10/2002 | Carteau | ................... | G06F 1/184 |
| | | | | | 361/679.33 |
| 7,349,204 | B2 * | 3/2008 | Tanaka | ..................... | G06F 1/20 |
| | | | | | 361/679.33 |
| 8,331,095 | B2 * | 12/2012 | Hu | ....................... | H05K 7/1487 |
| | | | | | 361/679.33 |
| 8,991,949 | B2 * | 3/2015 | Kyle | ................... | G11B 33/128 |
| | | | | | 312/348.3 |
| 9,019,708 | B2 * | 4/2015 | Shinsato | ................ | G06F 1/181 |
| | | | | | 361/727 |
| 9,268,357 | B2 * | 2/2016 | Kyle | ...................... | G06F 1/183 |

(Continued)

*Primary Examiner* — Anthony M Haughton
*Assistant Examiner* — Theron S Milliser

(57) ABSTRACT

Storage systems and methods to provide high-density data storage. Freestanding storage servers include storage drives, left and right backplanes, a backing plate, host adapters, and cables. The left and right backplanes are secured to the backing plate. The mounting holes of each storage drive attached to the left backplane are bilaterally symmetrical about a median plane to the corresponding mounting holes of each storage drive attached to the right backplane. Each left and right backplane has plug receptacles which are aligned and coupled to cables. The plug receptacles of the left backplane are bilaterally symmetrical about the median plane to corresponding plug receptacles of the right backplane. Host adapters are aligned, and each has plug receptacles, organized into a left and a right connector group, which are coupled to cables. For each host adapter, the left connector group is bilaterally symmetrical about the median plane to the right connector group.

2 Claims, 153 Drawing Sheets

(56) References Cited

U.S. PATENT DOCUMENTS

| | | | | |
|---|---|---|---|---|
| 9,474,190 B1 * | 10/2016 | Beall | .................. | H05K 7/20145 |
| 9,671,833 B2 * | 6/2017 | Kyle | ...................... | G06F 1/181 |
| 10,039,204 B2 * | 7/2018 | Kyle | ................... | H05K 7/1445 |
| 10,539,985 B2 * | 1/2020 | Beall | .................. | H05K 7/20736 |
| 11,604,495 B2 * | 3/2023 | Beall | ................. | H05K 7/20727 |
| 2006/0187634 A1 * | 8/2006 | Tanaka | .................... | G06F 1/181 |
| | | | | 361/679.33 |
| 2009/0097200 A1 * | 4/2009 | Sharma | ................... | G06F 1/183 |
| | | | | 361/752 |
| 2013/0050955 A1 * | 2/2013 | Shinsato | ................. | G06F 1/181 |
| | | | | 361/727 |
| 2014/0125209 A1 * | 5/2014 | Kyle | ...................... | G06F 1/187 |
| | | | | 312/317.1 |
| 2014/0126144 A1 * | 5/2014 | Kyle | ...................... | G06F 1/183 |
| | | | | 312/319.1 |
| 2015/0163946 A1 * | 6/2015 | Kyle | ................... | H05K 7/1489 |
| | | | | 312/348.4 |
| 2015/0378415 A1 | 12/2015 | George | | |
| 2016/0103469 A1 * | 4/2016 | Kyle | ......................... | G06F 1/16 |
| | | | | 312/333 |
| 2017/0031392 A1 * | 2/2017 | Beall | .................... | H05K 7/1491 |
| 2020/0150730 A1 * | 5/2020 | Beall | ................. | H05K 7/20727 |
| 2024/0013815 A1 * | 1/2024 | George | ............. | G11B 33/0466 |

* cited by examiner

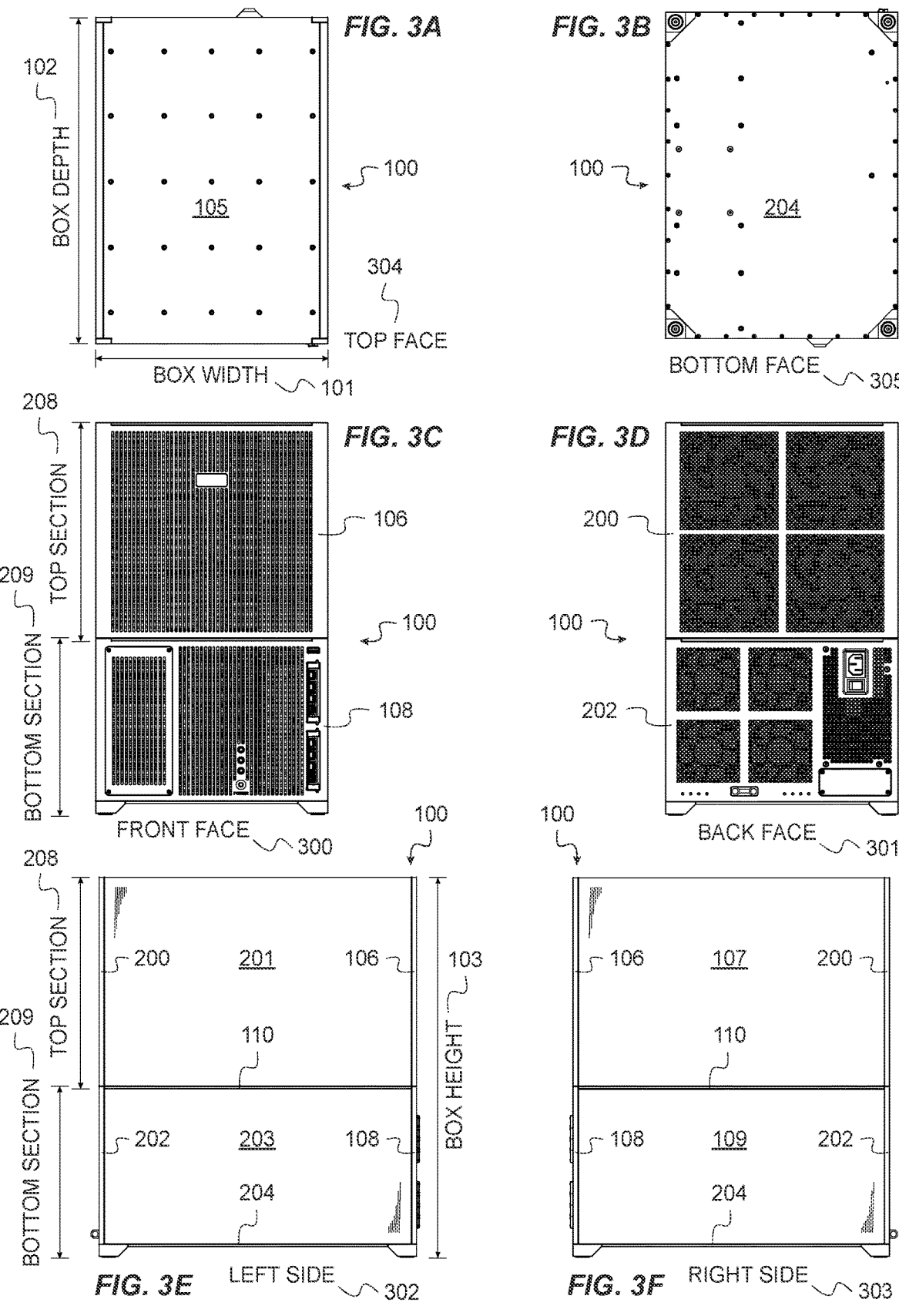

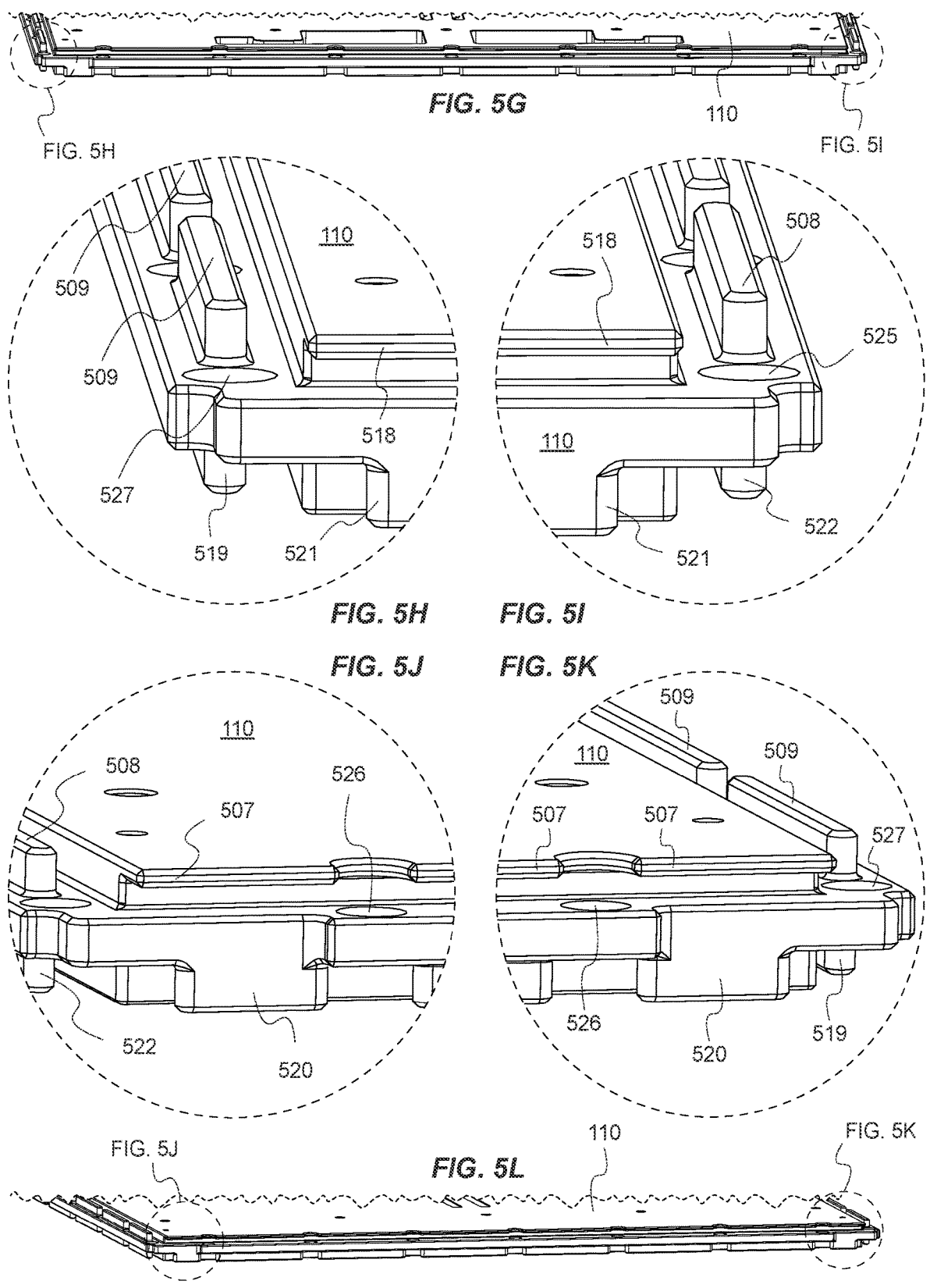

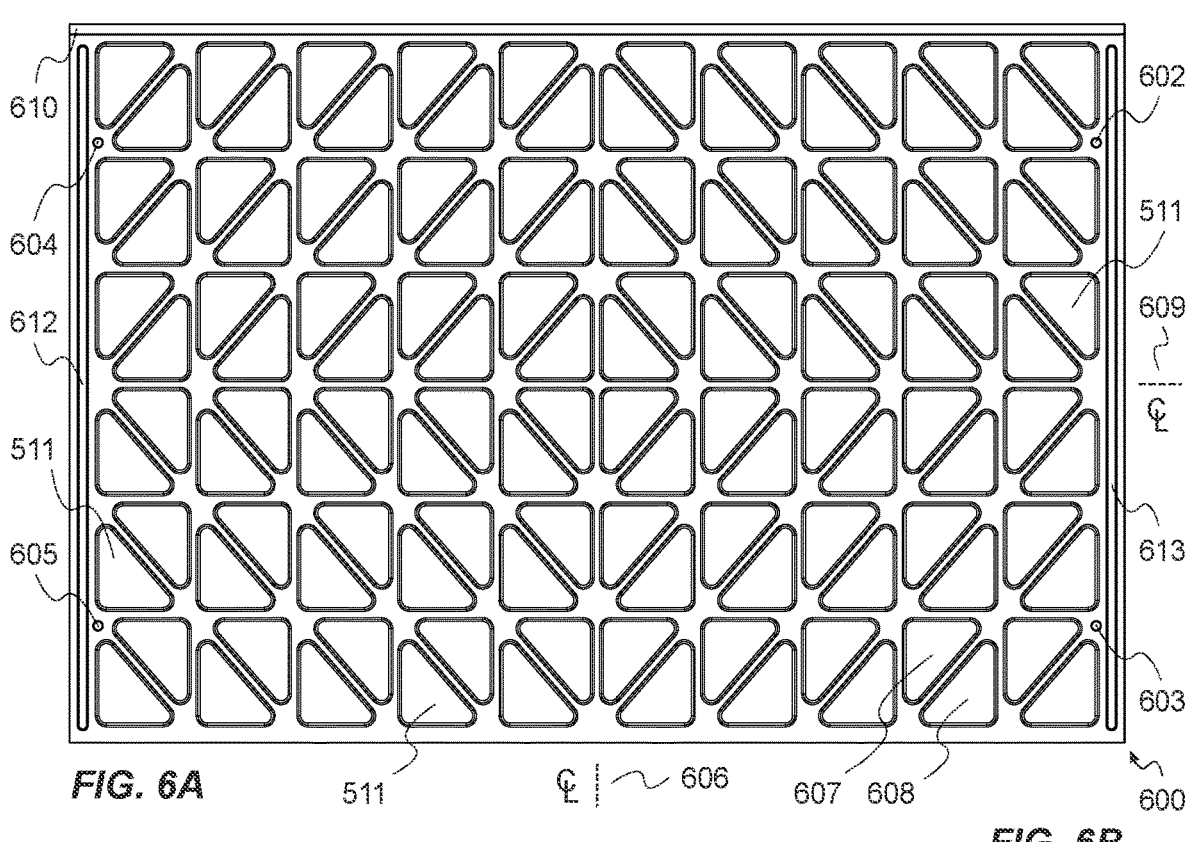
FIG. 6A
FIG. 6B
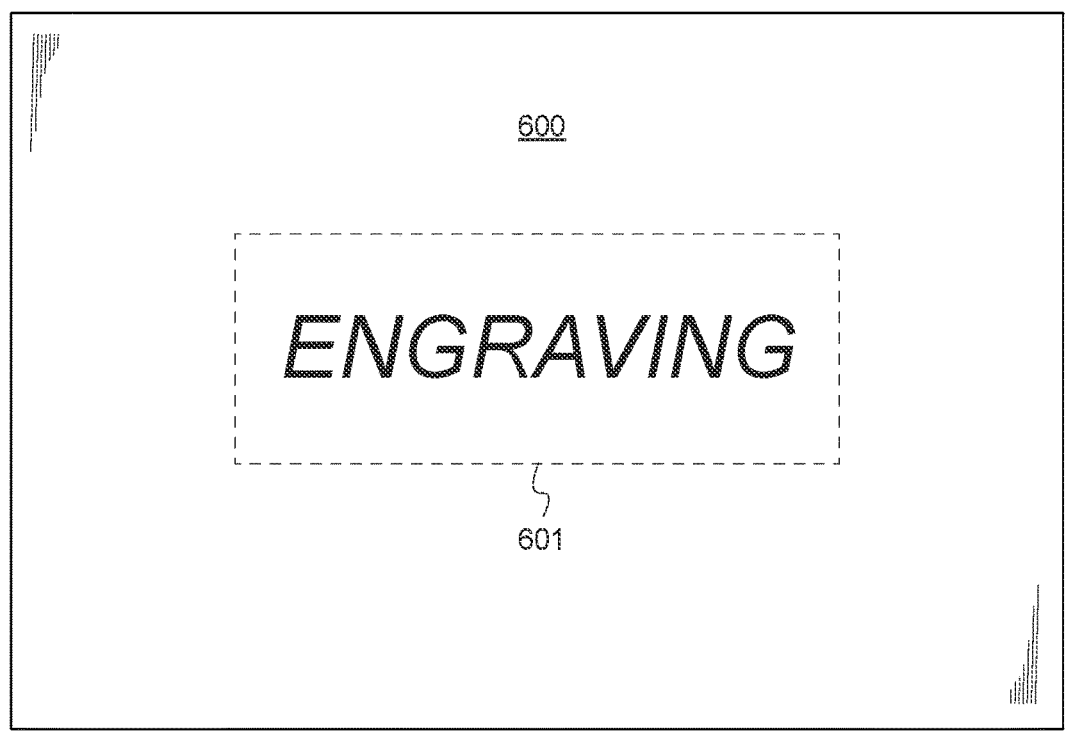
FIG. 6C

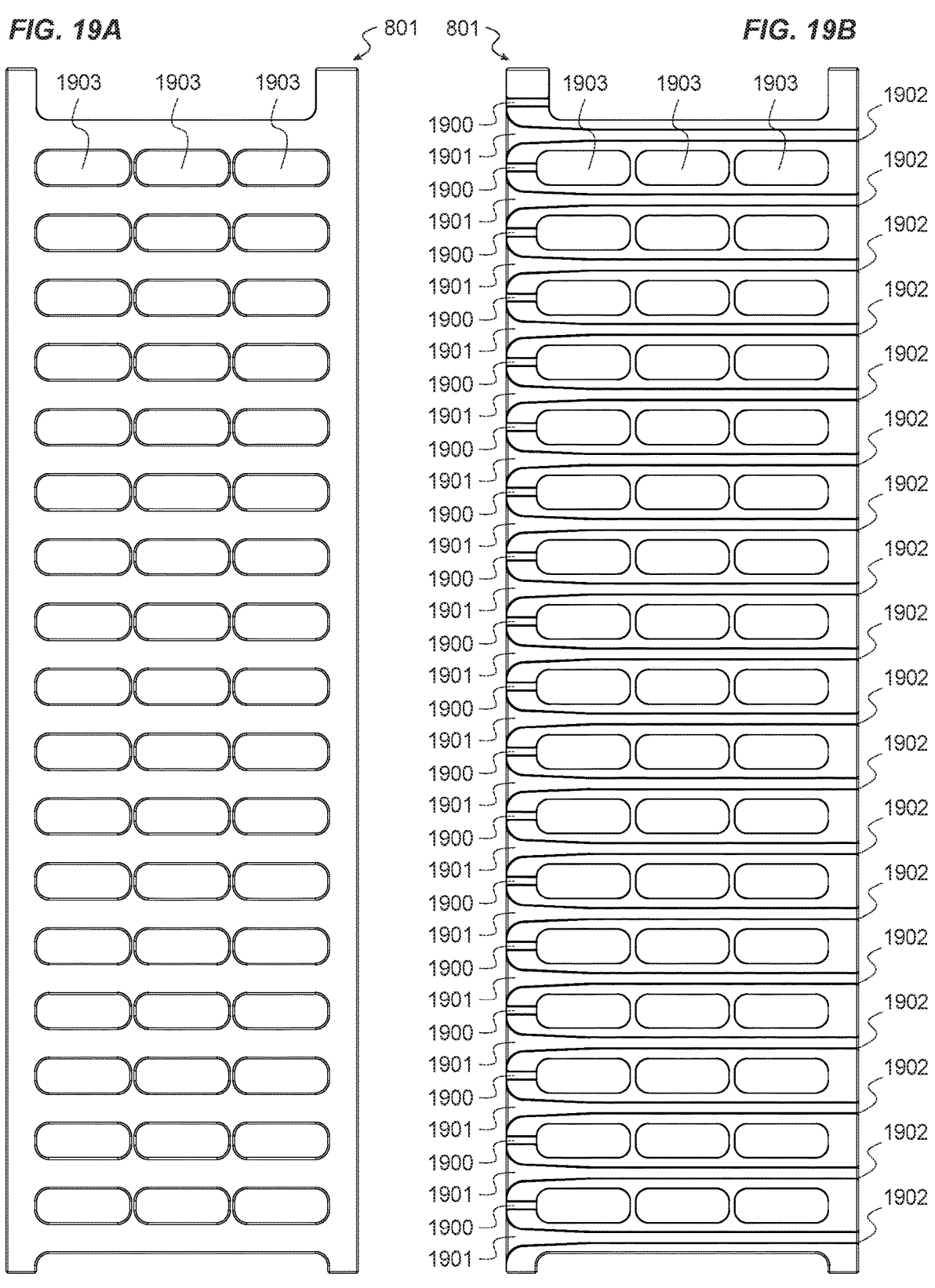

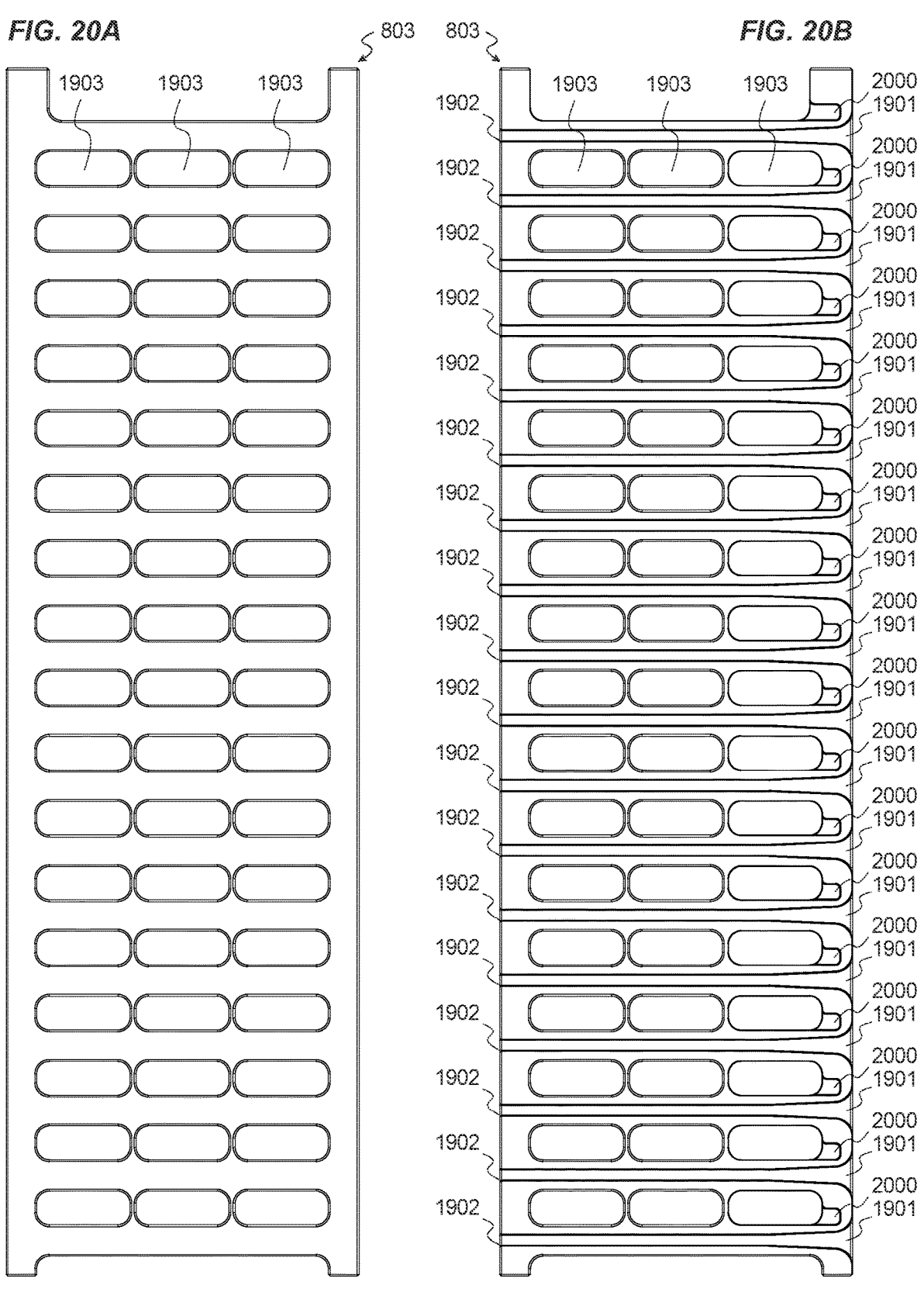
*FIG. 20A*          *FIG. 20B*

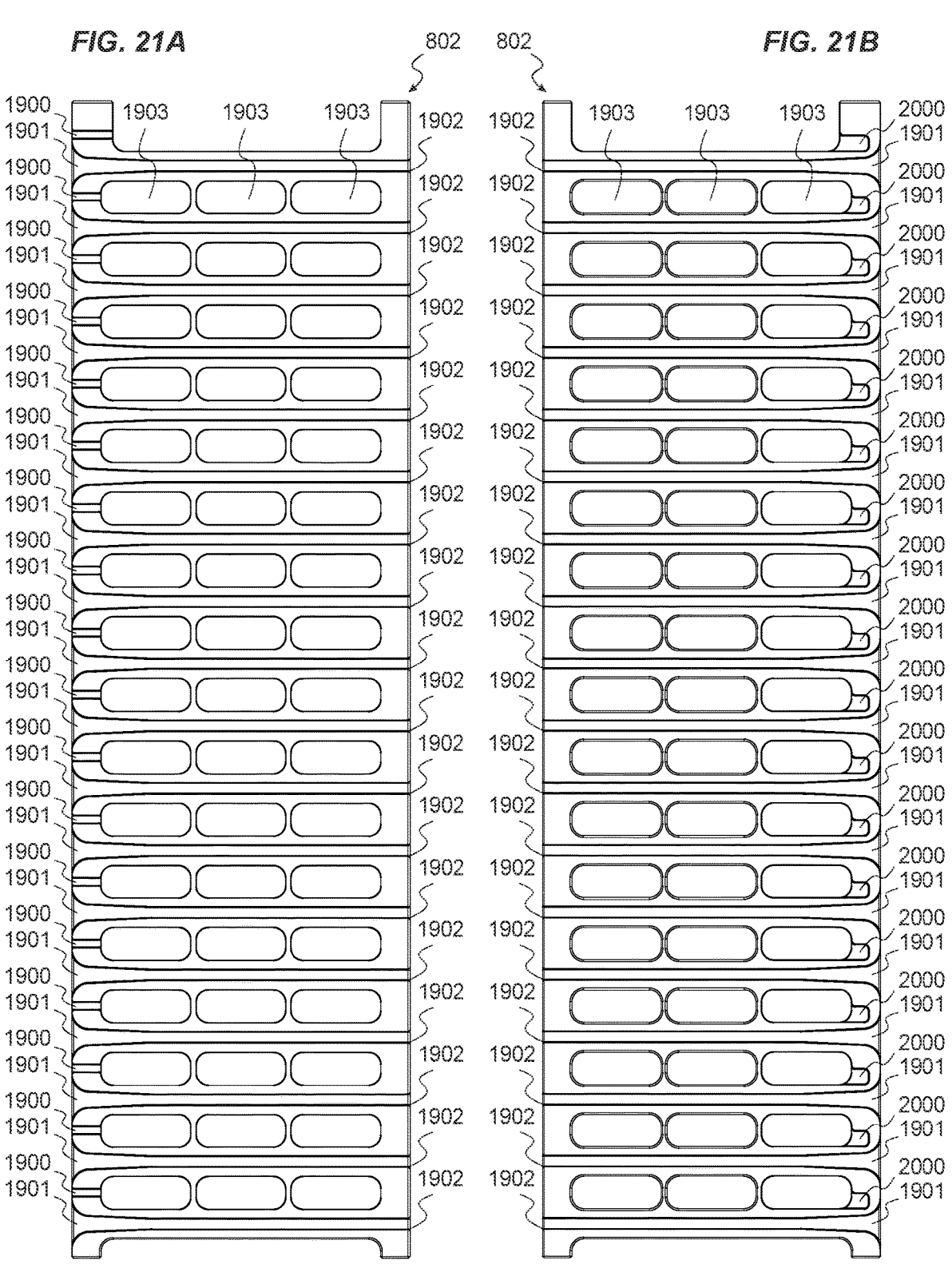
*FIG. 21A*          *FIG. 21B*

2405

FRONT
CARRIER
FACE

2414

800

2414

FIG. 24A     RIGHT CARRIER SIDE 2402

CARRIER LENGTH 2407

800

2400     1800

FIG. 24B     BOTTOM CARRIER FACE 2404

2406

BACK
CARRIER
FACE

2415

800

2415

FIG. 24C     LEFT CARRIER SIDE 2401     DEVICE OVERHANG 2413

CARRIER
HEIGHT 2409    800

DEVICE
HEIGHT

2411

DEVICE LENGTH 2410

CARRIER
WIDTH

2408

2400     900     1800

DEVICE
WIDTH

2412

FIG. 24D     TOP CARRIER FACE 2403     800

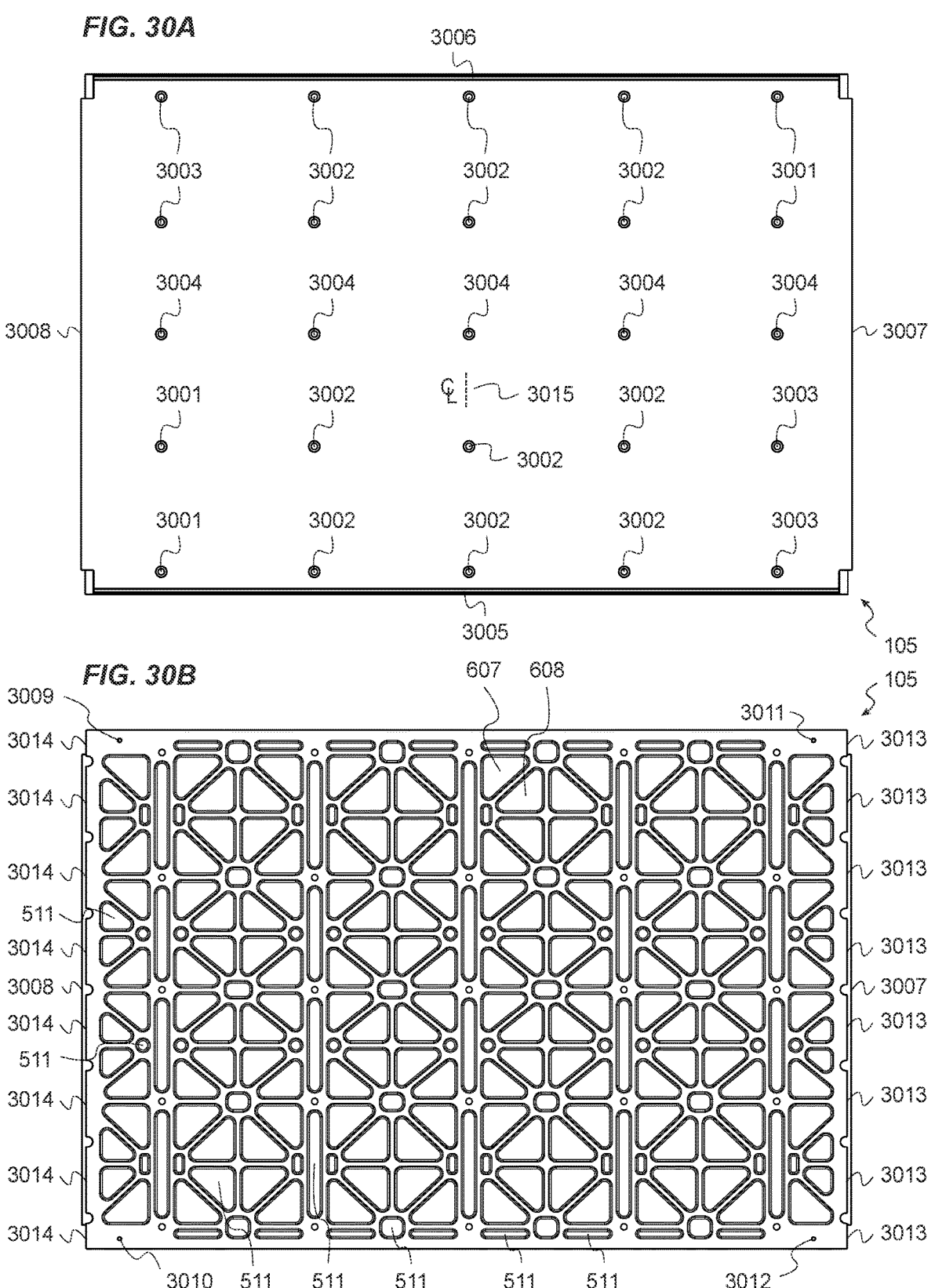

*FIG. 57A*
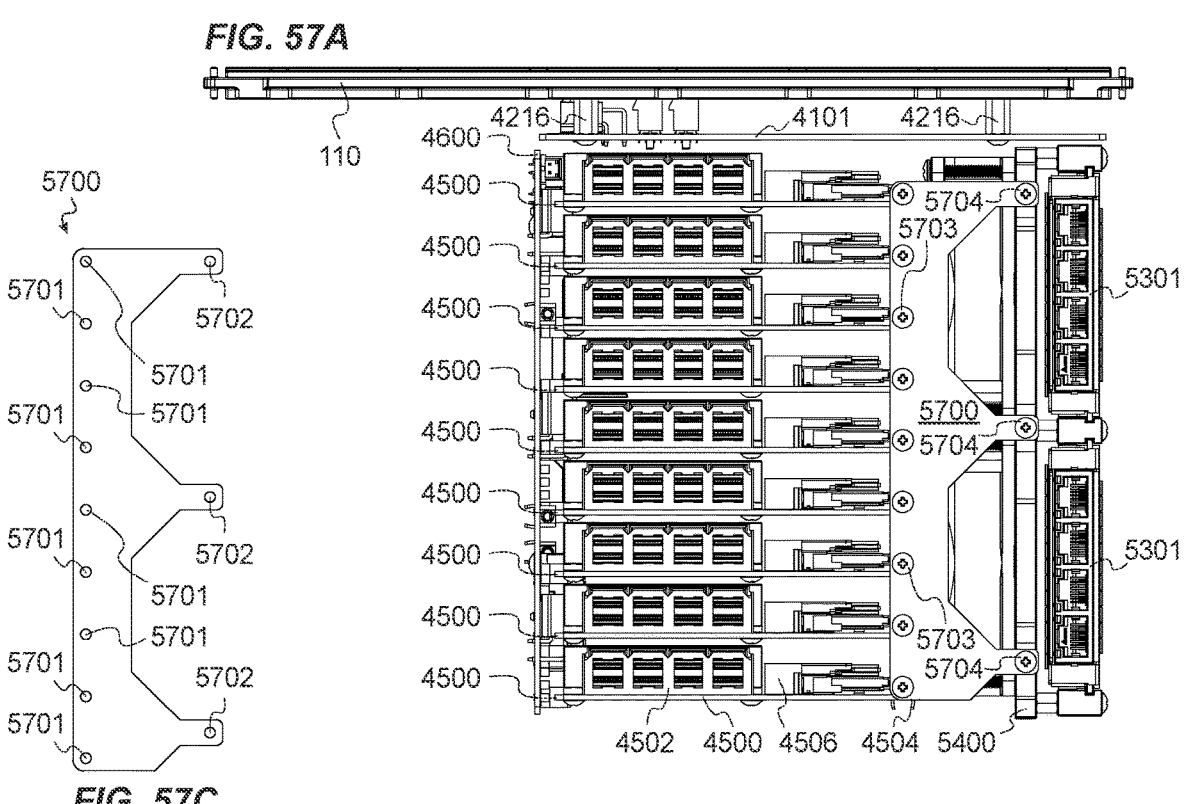
*FIG. 57C*
*FIG. 57B*
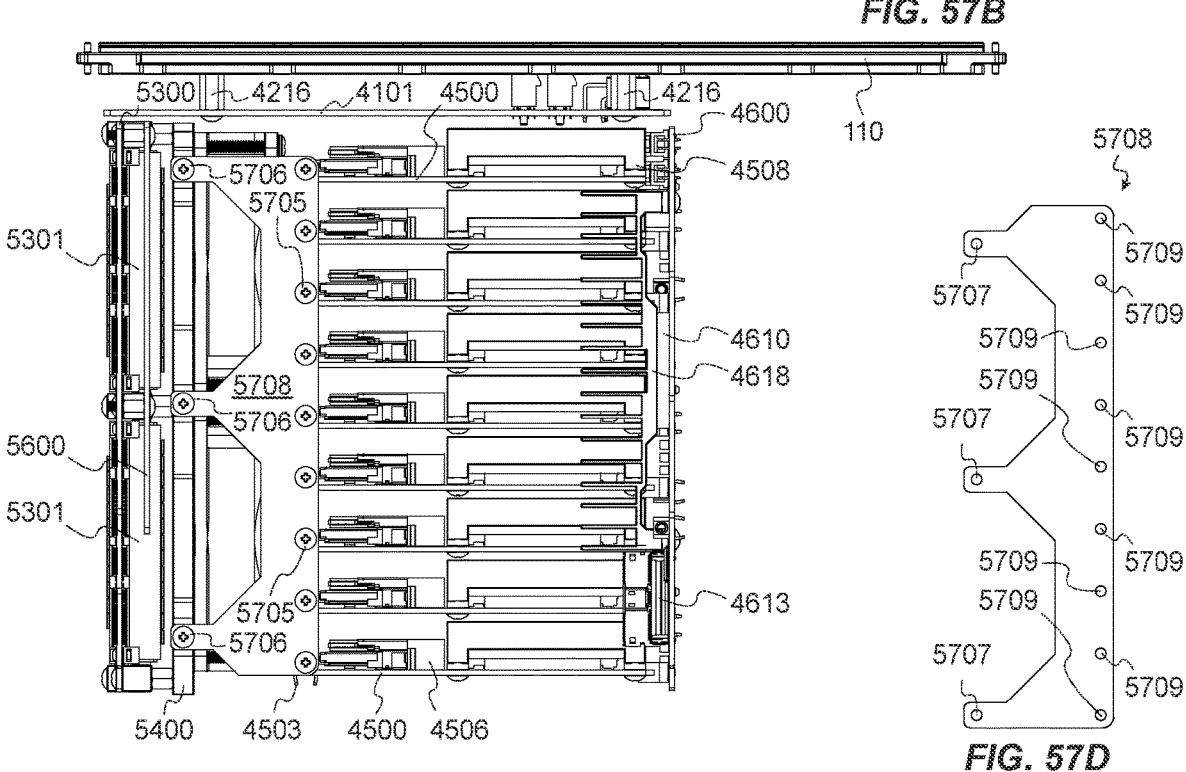
*FIG. 57D*

5810

5810

5810

5810

5810

5810

5810

5810

204

5813

5811

*204*

*204*

*204*

5810

5812

5813

5813

5813

204

5813

5813

5813

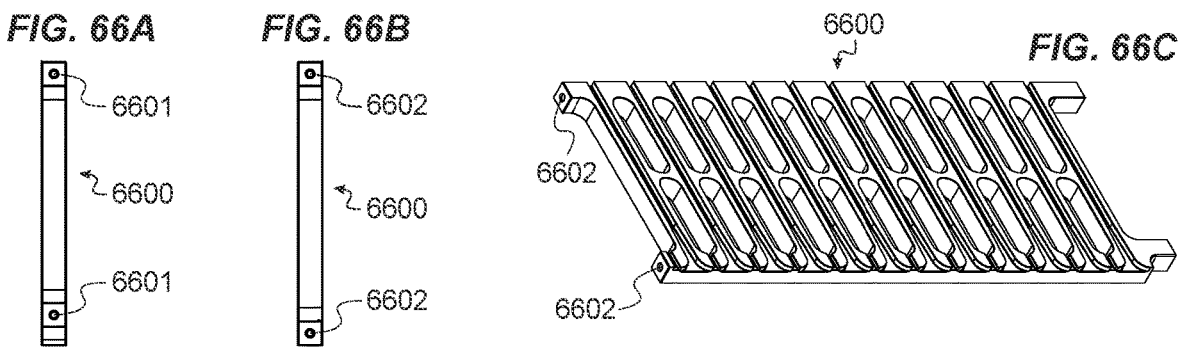
*FIG. 66A* *FIG. 66B* *FIG. 66C*
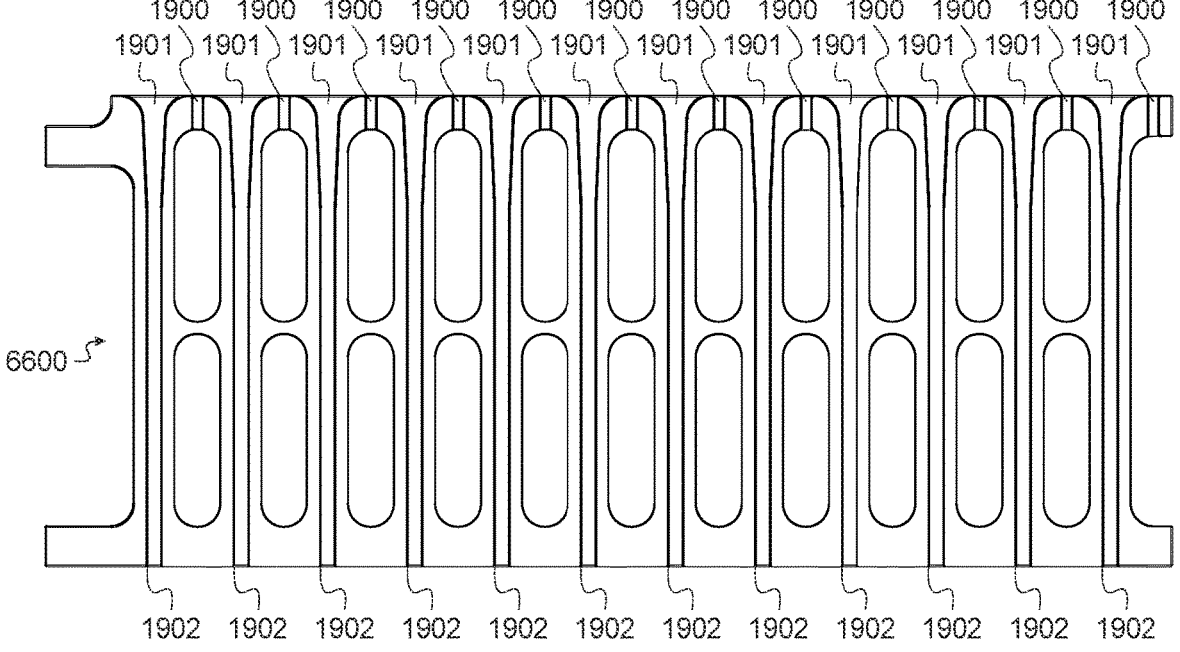
*FIG. 66D*
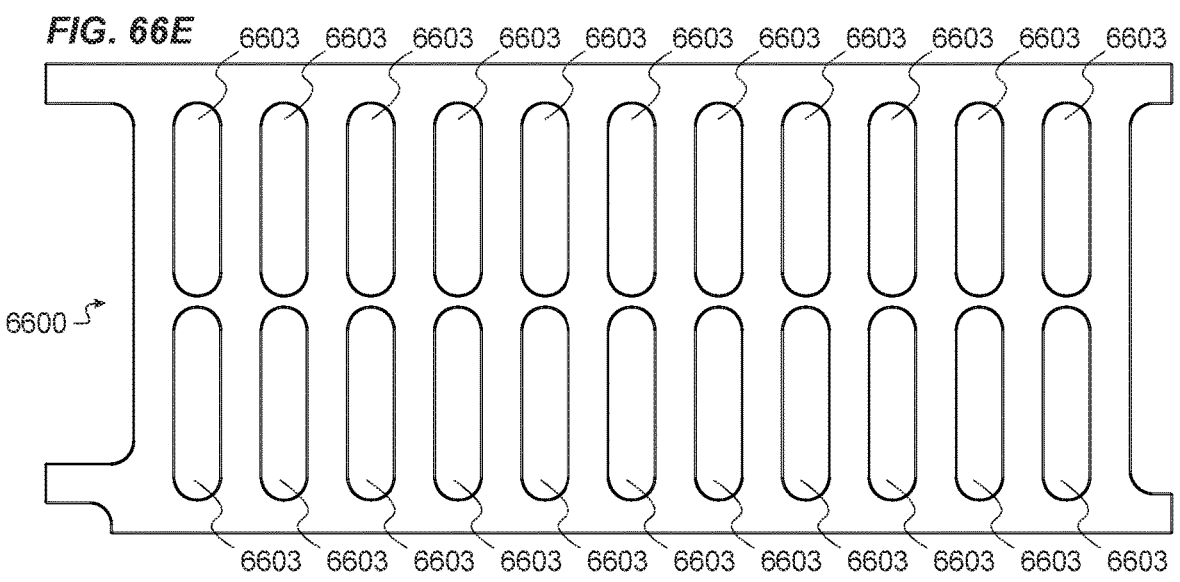
*FIG. 66E*

7004     7004

7000

7101     7101

7000

7004     7104     7004

7001

7102     7102

7100

7103     7103

1902   7105          7105     2000

1901

1902     2000

1901

7100

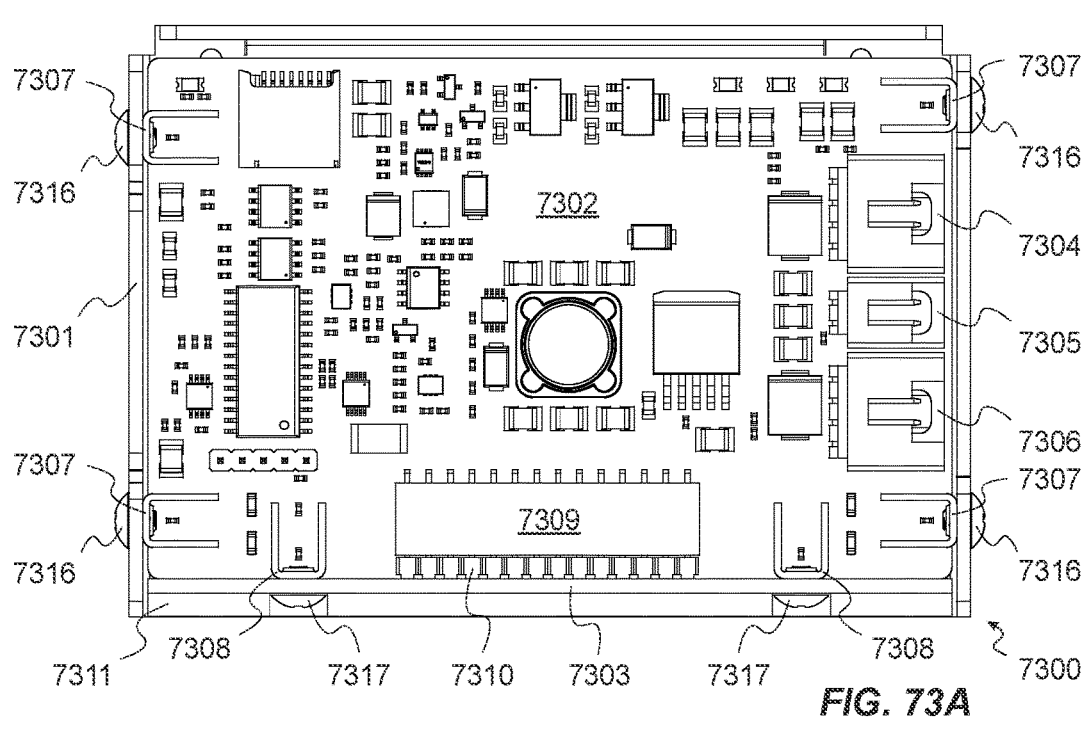
7307
7316
7301
7307
7316
7302
7307
7316
7304
7305
7306
7307
7316
7311
7308
7317
7310
7303
7317
7308
7300
7309
*FIG. 73A*
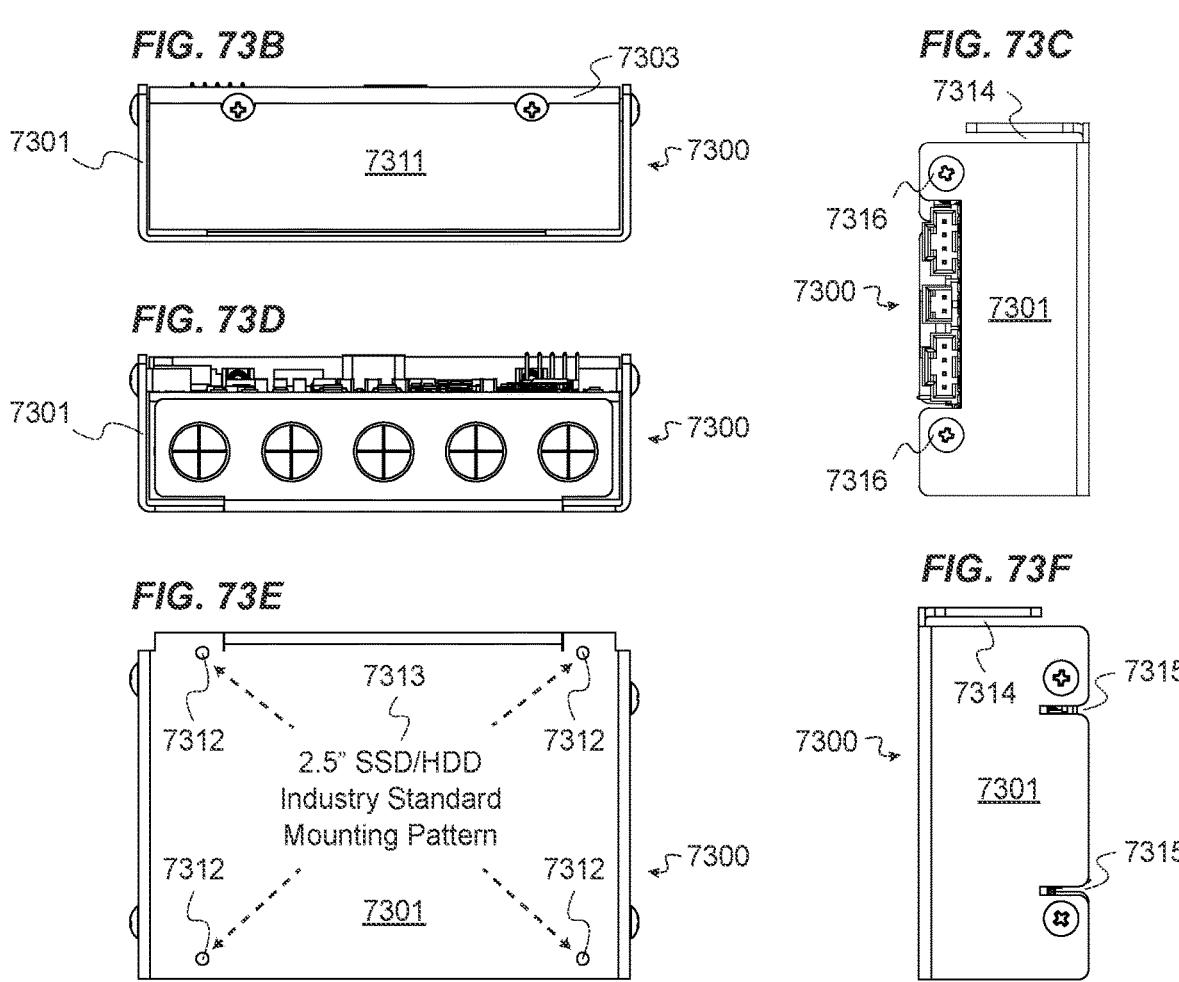
*FIG. 73B*
7301
7303
7311
7300
*FIG. 73C*
7314
7316
7300
7301
7316
*FIG. 73D*
7301
7300
*FIG. 73E*
7313
7312
7312
2.5" SSD/HDD
Industry Standard
Mounting Pattern
7312
7312
7301
7300
*FIG. 73F*
7314
7315
7300
7301
7315

Figure 75:
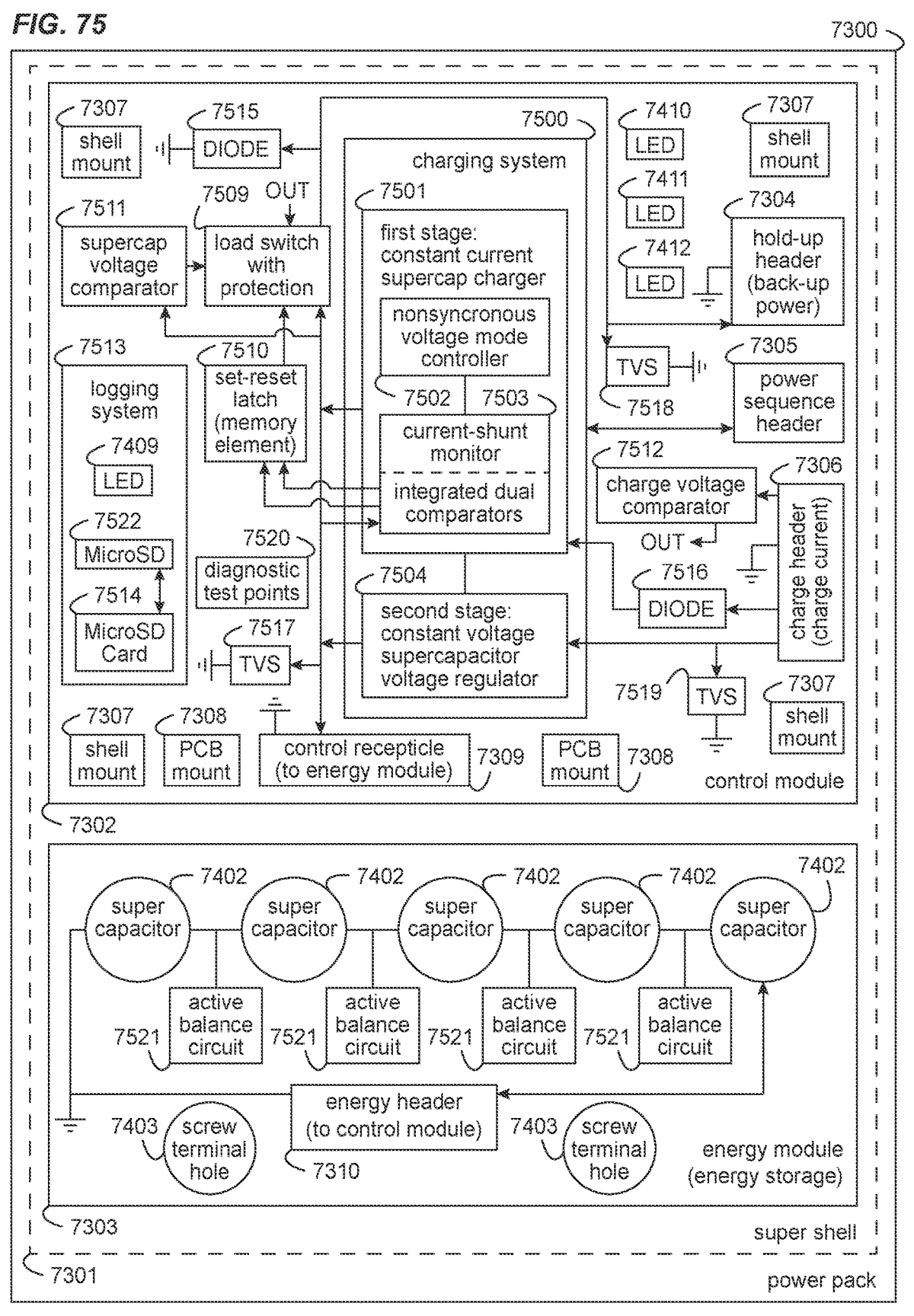

7307 shell mount

7515 DIODE

7500

7410 LED 7307 shell mount

7509 OUT charging system

7411 LED 7511 supercap voltage comparator

7501

7412 LED 7304 hold-up header (back-up power)

7513 logging system 7509 load switch with protection first stage: constant current supercap charger nonsyncronous voltage mode controller 7502 7503

TVS 7305 power sequence header

7518

7512 charge voltage comparator

7306

7510 set-reset latch (memory element)

current-shunt monitor integrated dual comparators

7409 LED

7522 MicroSD

7514 MicroSD Card 7520 diagnostic test points 7504 second stage: constant voltage supercapacitor voltage regulator

OUT charge header (charge current)

7516 DIODE

7517 TVS

7519 TVS 7307 shell mount 7307 shell mount

7308 PCB mount control recepticle (to energy module)

7309 PCB mount 7308 control module

7302

7402 super capacitor 7402 super capacitor 7402 super capacitor 7402 super capacitor 7402 super capacitor 7521 active balance circuit 7521 active balance circuit 7521 active balance circuit 7521 active balance circuit energy header (to control module)

7403 screw terminal hole 7403 screw terminal hole

7310 energy module (energy storage)

7303 super shell

7301 power pack

FIG. 78A
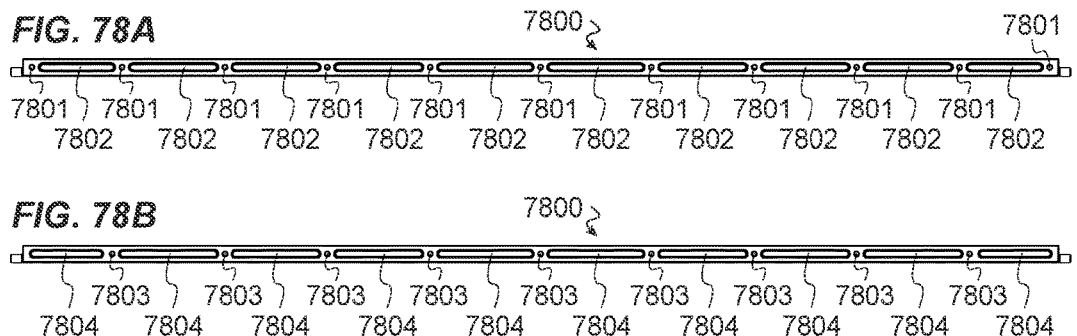
FIG. 78B
FIG. 78C
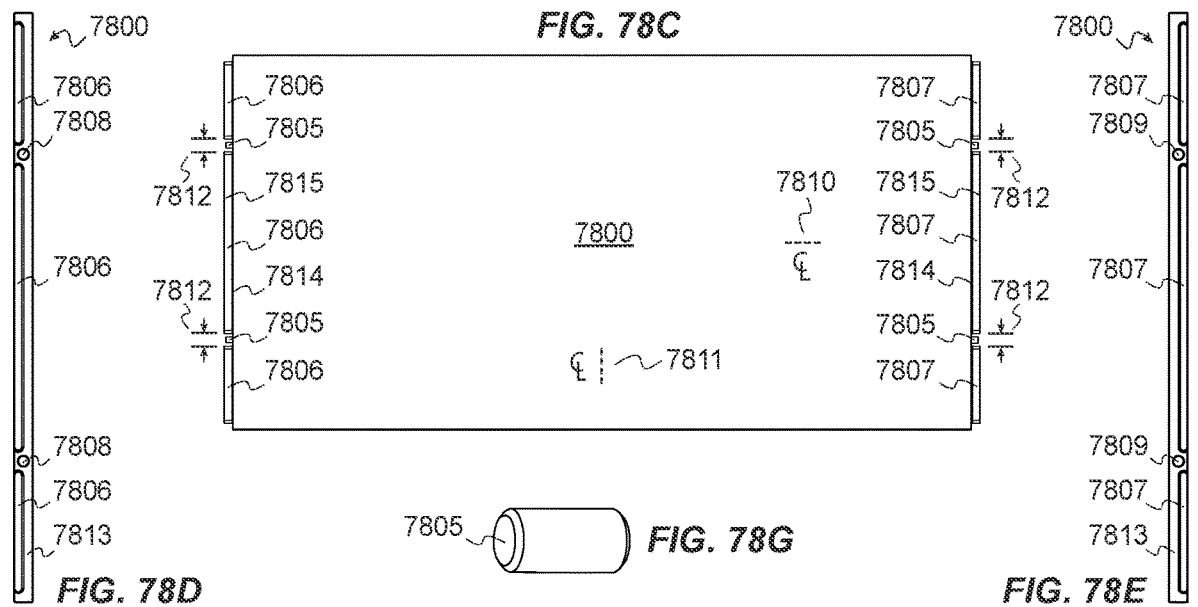
FIG. 78D
FIG. 78G
FIG. 78E
FIG. 78F
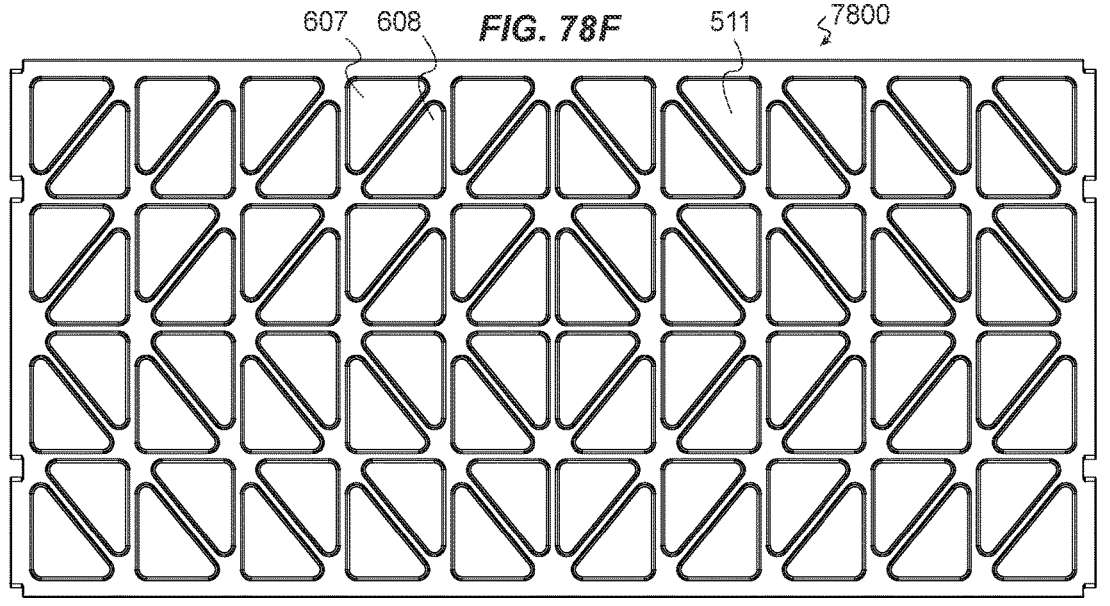

*FIG. 84A*
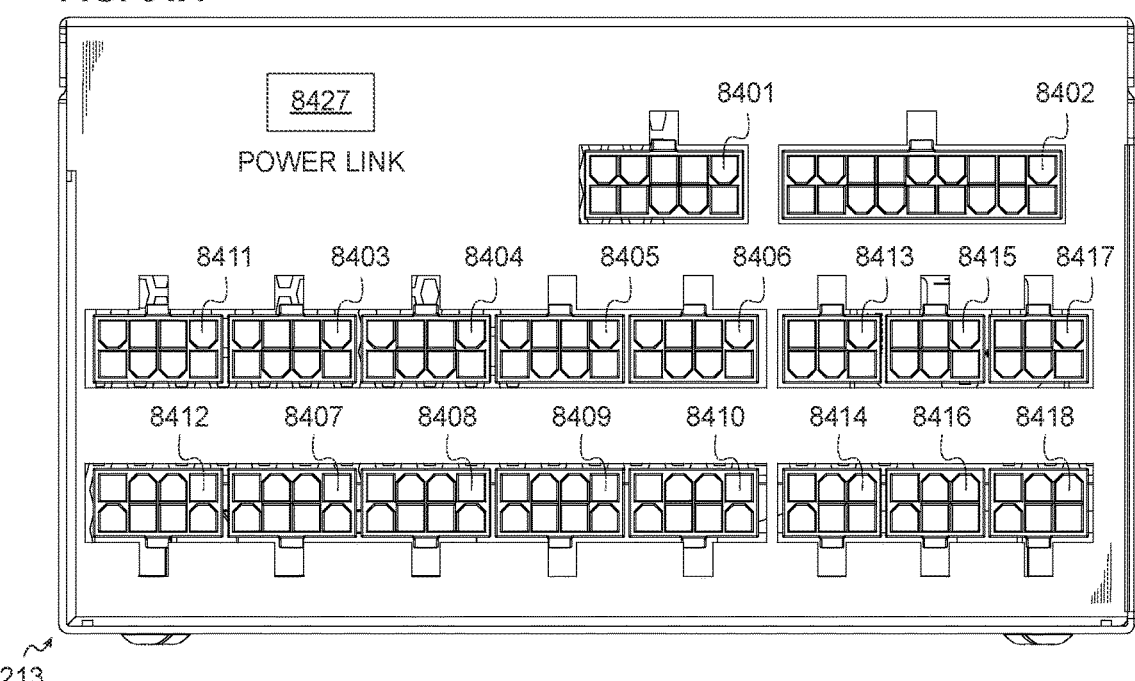
*FIG. 84B*
*FIG. 84C*
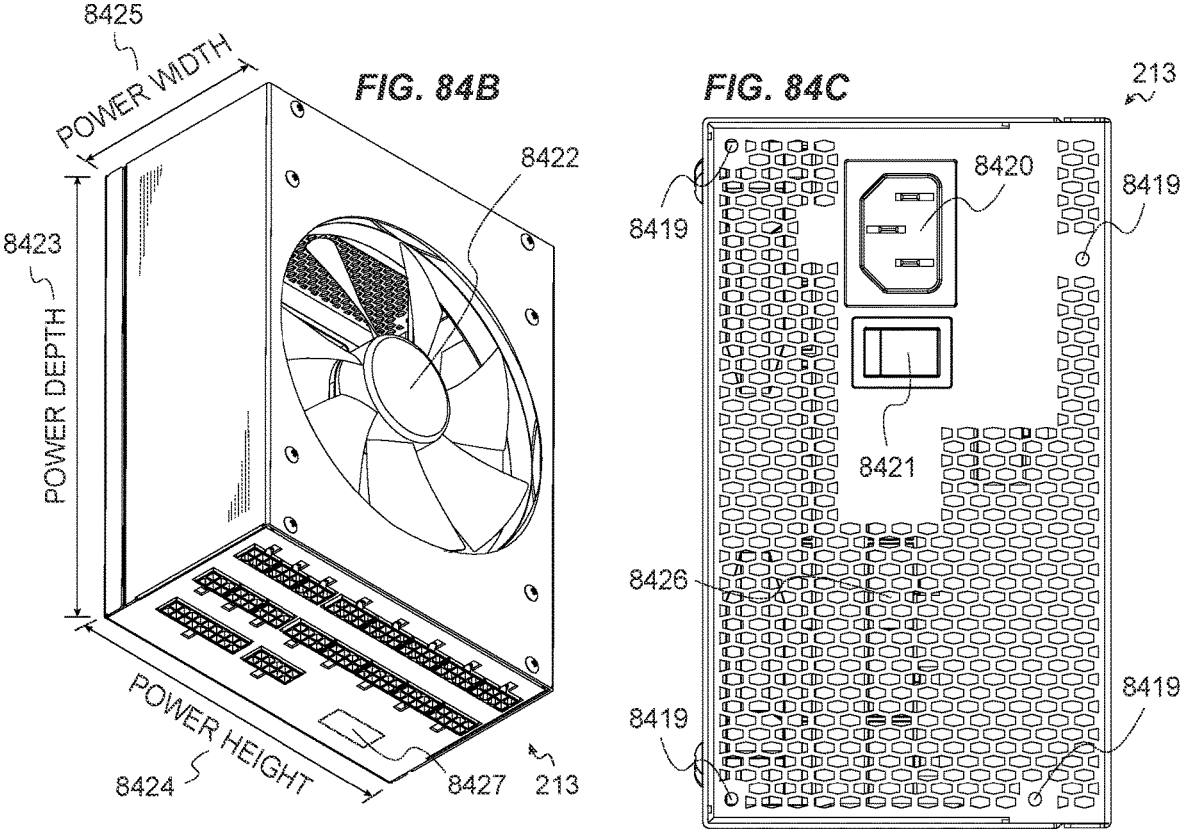

LOWERING ORIENTATION

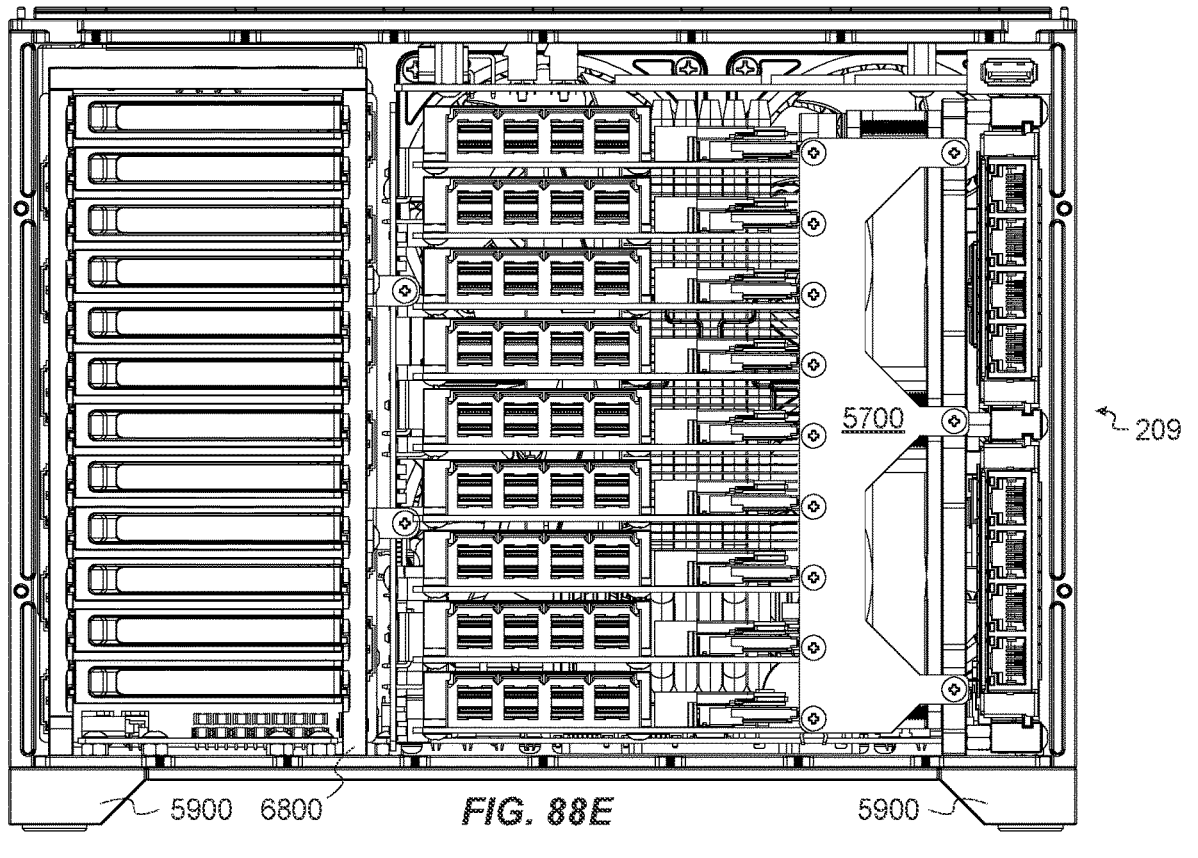
5900   6800     *FIG. 88E*     5900
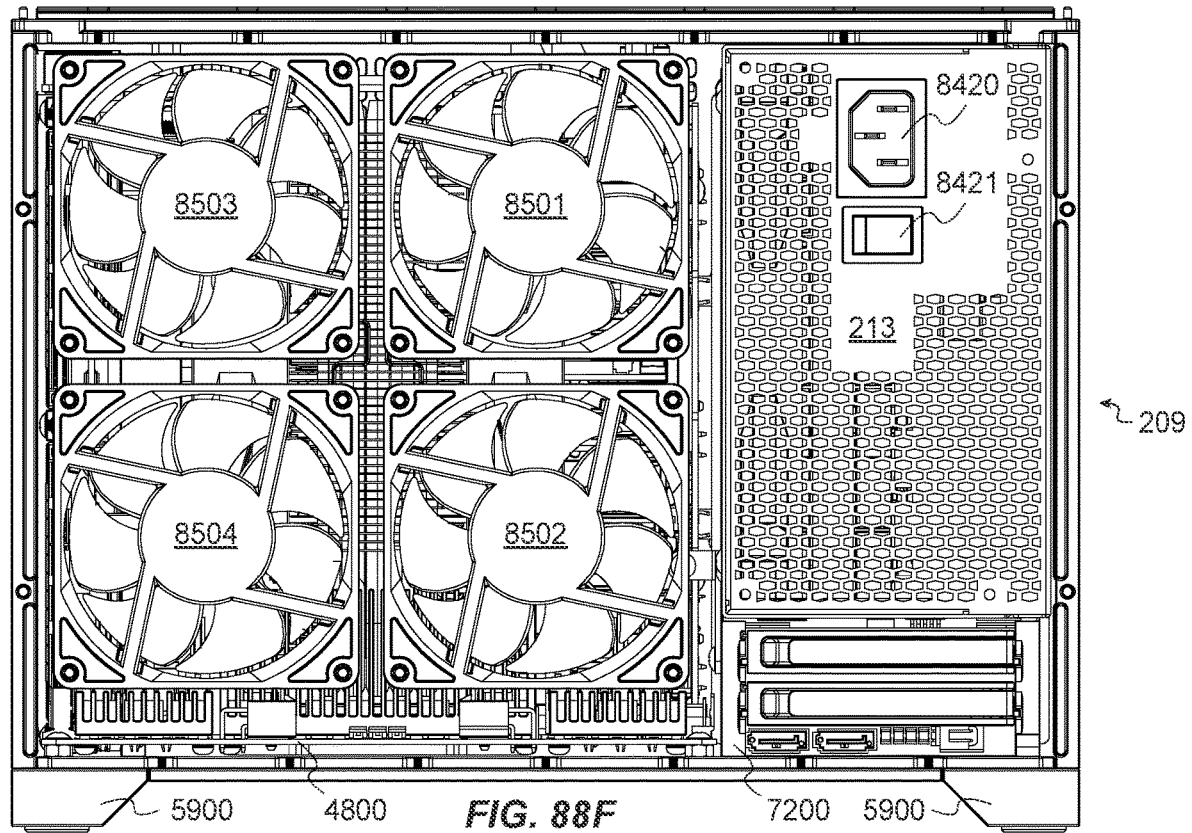
5900     4800     *FIG. 88F*     7200   5900

SFF-8643/SFF-8613 LEFT CONNECTOR GROUP/PLUG REC. PIN ASSIGNMENTS

| PIN | SIGNAL |
|-----|--------|
| A1 | GND |
| A2 | GND |
| A3 | GND |
| D4 | Tx1-P |
| D5 | Tx1-N |
| A6 | GND |
| D7 | Tx3-P |
| D8 | Tx3-N |
| A9 | GND |
| B1 | GND |
| B2 | GND |
| B3 | GND |
| B4 | Tx0-P |
| B5 | Tx0-N |
| B6 | GND |
| B7 | Tx2-P |
| B8 | Tx2-N |
| B9 | GND |
| C1 | GND |
| C2 | GND |
| C3 | GND |
| C5 | Rx1-P |
| C4 | Rx1-N |
| C6 | GND |
| C8 | Rx3-P |
| C7 | Rx3-N |
| C9 | GND |
| D1 | GND |
| D2 | GND |
| D3 | GND |
| A5 | Rx0-P |
| A4 | Rx0-N |
| D6 | GND |
| A8 | Rx2-P |
| A7 | Rx2-N |
| D9 | GND |

10600 CABLE

| |
|---|
| NC |
| NC |
| — |
| → |
| → |
| — |
| → |
| → |
| — |
| NC |
| NC |
| — |
| → |
| → |
| — |
| → |
| → |
| — |
| NC |
| NC |
| — |
| ← |
| ← |
| — |
| ← |
| ← |
| — |
| NC |
| NC |
| — |
| ← |
| ← |
| — |
| ← |
| ← |
| — |

SFF-8643/SFF-8613 HOST CONNECTOR/ PLUG RECEPTACLE PIN ASSIGNMENTS

| PIN | SIGNAL |
|-----|--------|
| A1 | SB7 |
| A2 | SB0 |
| A3 | GND |
| A4 | Rx1-P |
| A5 | Rx1-N |
| A6 | GND |
| A7 | Rx3-P |
| A8 | Rx3-N |
| A9 | GND |
| B1 | SB3 GND |
| B2 | SB1 |
| B3 | GND |
| B4 | Rx0-P |
| B5 | Rx0-N |
| B6 | GND |
| B7 | Rx2-P |
| B8 | Rx2-N |
| B9 | GND |
| C1 | SB4 |
| C2 | SB2 |
| C3 | GND |
| C4 | Tx1-P |
| C5 | Tx1-N |
| C6 | GND |
| C7 | Tx3-P |
| C8 | Tx3-N |
| C9 | GND |
| D1 | SB5 |
| D2 | SB6 |
| D3 | GND |
| D4 | Tx0-P |
| D5 | Tx0-N |
| D6 | GND |
| D7 | Tx2-P |
| D8 | Tx2-N |
| D9 | GND |

SFF-8643/SFF-8613 LEFT CUSTOM CABLE END (PLUG) PIN ASSIGNMENTS

| PIN | SIGNAL |
|-----|--------|
| A1 | NC |
| A2 | NC |
| A3 | GND |
| A4 | Rx0-N |
| A5 | Rx0-P |
| A6 | GND |
| A7 | Rx2-N |
| A8 | Rx2-P |
| A9 | GND |
| B1 | NC |
| B2 | NC |
| B3 | GND |
| B4 | Tx0-P |
| B5 | Tx0-N |
| B6 | GND |
| B7 | Tx2-P |
| B8 | Tx2-N |
| B9 | GND |
| C1 | NC |
| C2 | NC |
| C3 | GND |
| C4 | Rx1-N |
| C5 | Rx1-P |
| C6 | GND |
| C7 | Rx3-N |
| C8 | Rx3-P |
| C9 | GND |
| D1 | NC |
| D2 | NC |
| D3 | GND |
| D4 | Tx1-P |
| D5 | Tx1-N |
| D6 | GND |
| D7 | Tx3-P |
| D8 | Tx3-N |
| D9 | GND |

*FIG. 107*

SFF-8643/SFF-8613 HOST CONNECTOR/ PLUG RECEPTACLE PIN ASSIGNMENTS

| PIN | SIGNAL |
|-----|--------|
| A1 | SB7 |
| A2 | SB0 |
| A3 | GND |
| A4 | Rx1-P |
| A5 | Rx1-N |
| A6 | GND |
| A7 | Rx3-P |
| A8 | Rx3-N |
| A9 | GND |
| B1 | SB3 GND |
| B2 | SB1 |
| B3 | GND |
| B4 | Rx0-P |
| B5 | Rx0-N |
| B6 | GND |
| B7 | Rx2-P |
| B8 | Rx2-N |
| B9 | GND |
| C1 | SB4 |
| C2 | SB2 |
| C3 | GND |
| C4 | Tx1-P |
| C5 | Tx1-N |
| C6 | GND |
| C7 | Tx3-P |
| C8 | Tx3-N |
| C9 | GND |
| D1 | SB5 |
| D2 | SB6 |
| D3 | GND |
| D4 | Tx0-P |
| D5 | Tx0-N |
| D6 | GND |
| D7 | Tx2-P |
| D8 | Tx2-N |
| D9 | GND |

10700 CABLE

NC
NC
—
←
←
—
←
←
—
NC
NC
—
←
←
—
←
←
—
NC
NC
—
→
→
—
→
→
—
NC
NC
—
→
→
—
→
→
—

SFF-8643/SFF-8613 RIGHT CONNECTOR GROUP/PLUG REC. PIN ASSIGNMENTS

| PIN | SIGNAL |
|-----|--------|
| A1 | GND |
| A2 | GND |
| A3 | GND |
| C5 | Tx1-P |
| C4 | Tx1-N |
| A6 | GND |
| C8 | Tx3-P |
| C7 | Tx3-N |
| A9 | GND |
| B1 | GND |
| B2 | GND |
| B3 | GND |
| A5 | Tx0-P |
| A4 | Tx0-N |
| B6 | GND |
| A8 | Tx2-P |
| A7 | Tx2-N |
| B9 | GND |
| C1 | GND |
| C2 | GND |
| C3 | GND |
| D4 | Rx1-P |
| D5 | Rx1-N |
| C6 | GND |
| D7 | Rx3-P |
| D8 | Rx3-N |
| C9 | GND |
| D1 | GND |
| D2 | GND |
| D3 | GND |
| B4 | Rx0-P |
| B5 | Rx0-N |
| D6 | GND |
| B7 | Rx2-P |
| B8 | Rx2-N |
| D9 | GND |

SFF-8643/SFF-8613 RIGHT CUSTOM CABLE END (PLUG) PIN ASSIGNMENTS

| PIN | SIGNAL |
|-----|--------|
| A1 | NC |
| A2 | NC |
| A3 | GND |
| A4 | Tx0-N |
| A5 | Tx0-P |
| A6 | GND |
| A7 | Tx2-N |
| A8 | Tx2-P |
| A9 | GND |
| B1 | NC |
| B2 | NC |
| B3 | GND |
| B4 | Rx0-P |
| B5 | Rx0-N |
| B6 | GND |
| B7 | Rx2-P |
| B8 | Rx2-N |
| B9 | GND |
| C1 | NC |
| C2 | NC |
| C3 | GND |
| C4 | Tx1-N |
| C5 | Tx1-P |
| C6 | GND |
| C7 | Tx3-N |
| C8 | Tx3-P |
| C9 | GND |
| D1 | NC |
| D2 | NC |
| D3 | GND |
| D4 | Rx1-P |
| D5 | Rx1-N |
| D6 | GND |
| D7 | Rx3-P |
| D8 | Rx3-N |
| D9 | GND |

Figure 108A:
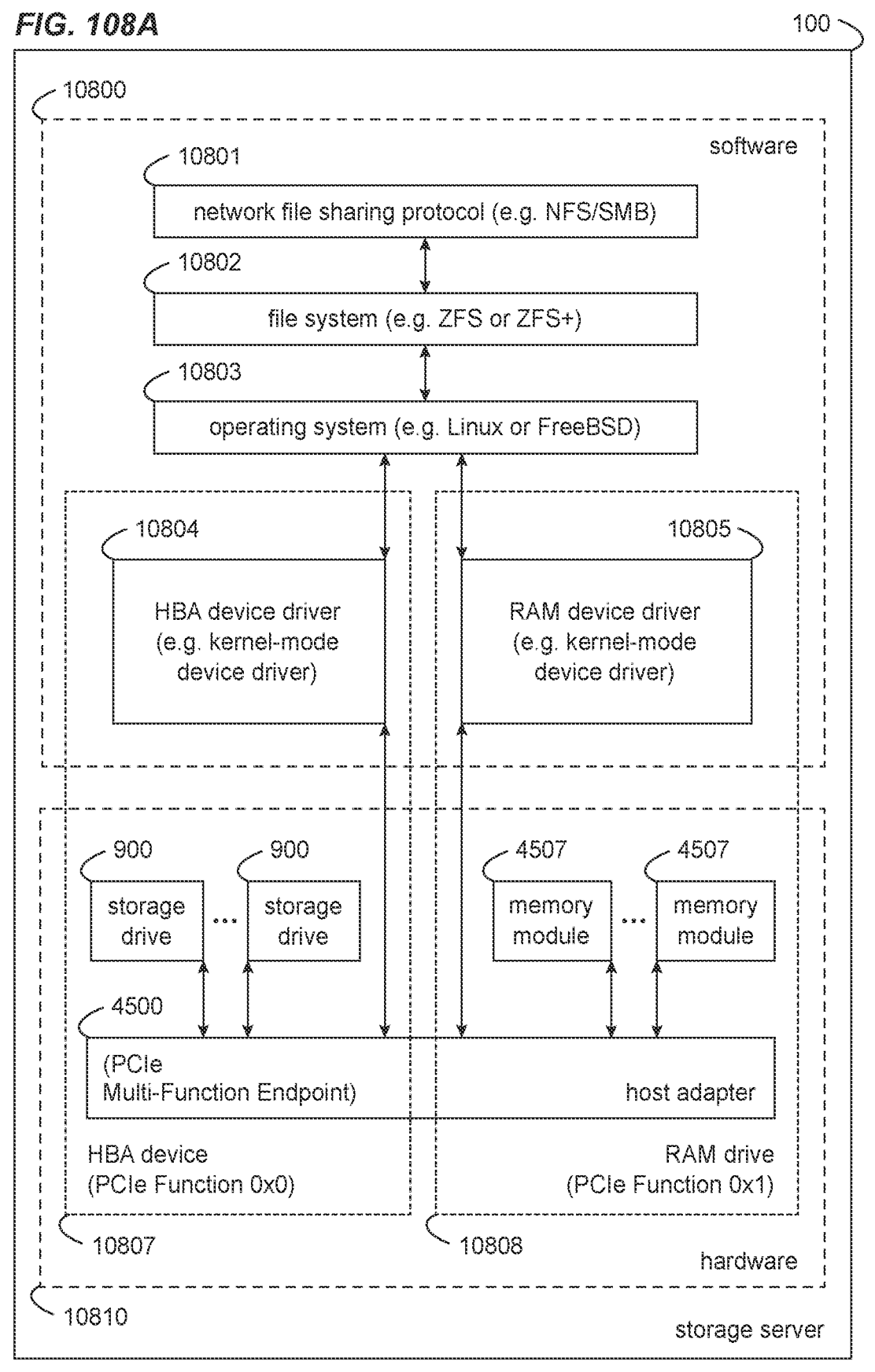

*FIG. 108A* 100

10800 software 10801
network file sharing protocol (e.g. NFS/SMB)

10802
file system (e.g. ZFS or ZFS+)

10803
operating system (e.g. Linux or FreeBSD)

10804
HBA device driver
(e.g. kernel-mode
device driver)

10805
RAM device driver
(e.g. kernel-mode
device driver)

900
storage
drive

...

900
storage
drive 4507
memory
module

...

4507
memory
module 4500
(PCIe
Multi-Function Endpoint)

host adapter

HBA device
(PCIe Function 0x0)

RAM drive
(PCIe Function 0x1)

10807

10808 hardware

10810 storage server

Figure 108B:
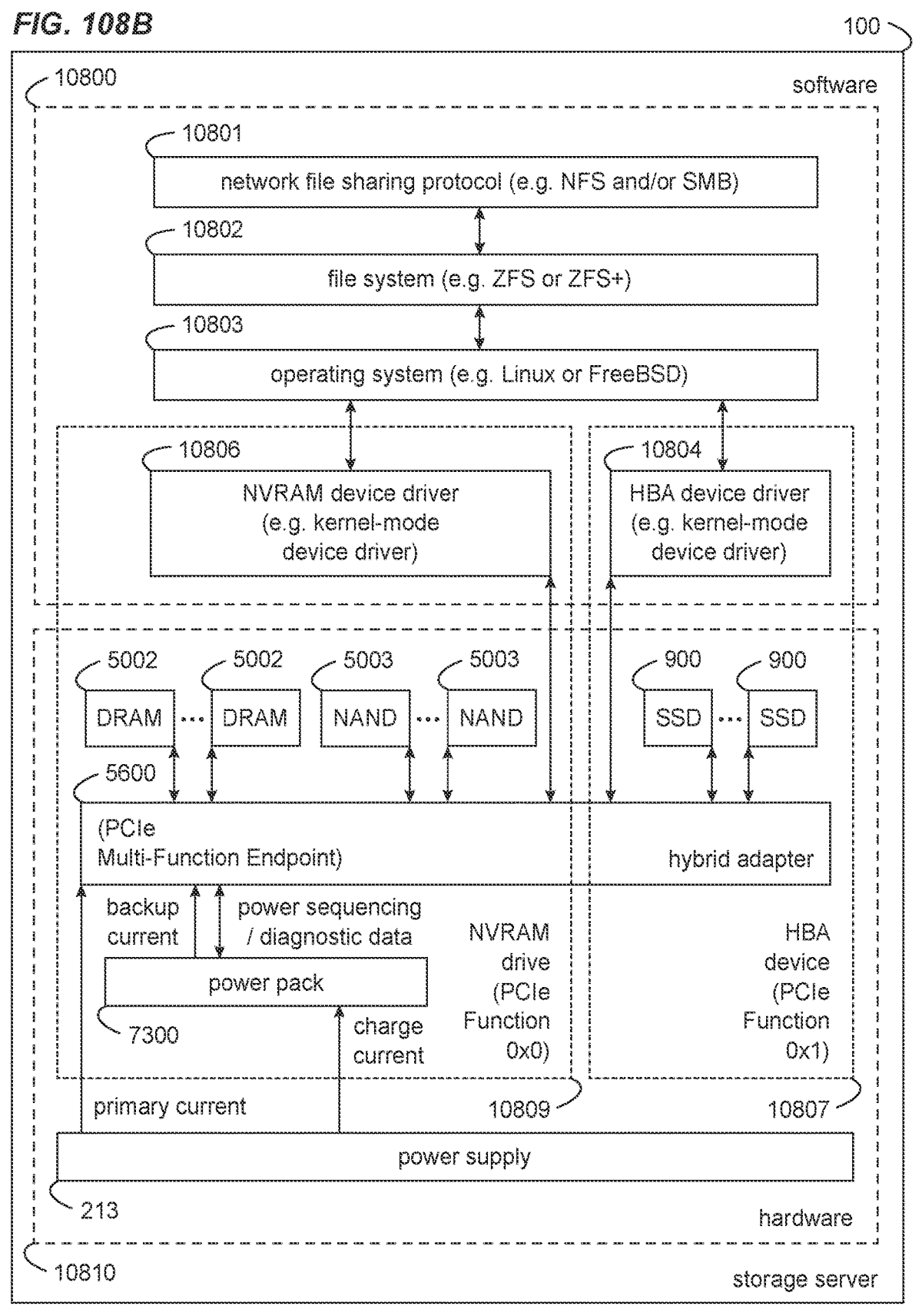

FIG. 108B                                                      100

10800                                                        software

10801 network file sharing protocol (e.g. NFS and/or SMB)

10802 file system (e.g. ZFS or ZFS+)

10803 operating system (e.g. Linux or FreeBSD)

10806

NVRAM device driver
(e.g. kernel-mode
device driver)

10804

HBA device driver
(e.g. kernel-mode
device driver)

5002        5002        5003        5003        900        900

DRAM ··· DRAM   NAND ··· NAND        SSD ··· SSD

5600

(PCIe
Multi-Function Endpoint)

hybrid adapter backup    power sequencing
current   / diagnostic data power pack 7300           charge
               current NVRAM
drive
(PCIe
Function
0x0)

HBA
device
(PCIe
Function
0x1)

primary current 10809          10807 power supply 213                                                          hardware 10810                                                  storage server

*FIG. 112*

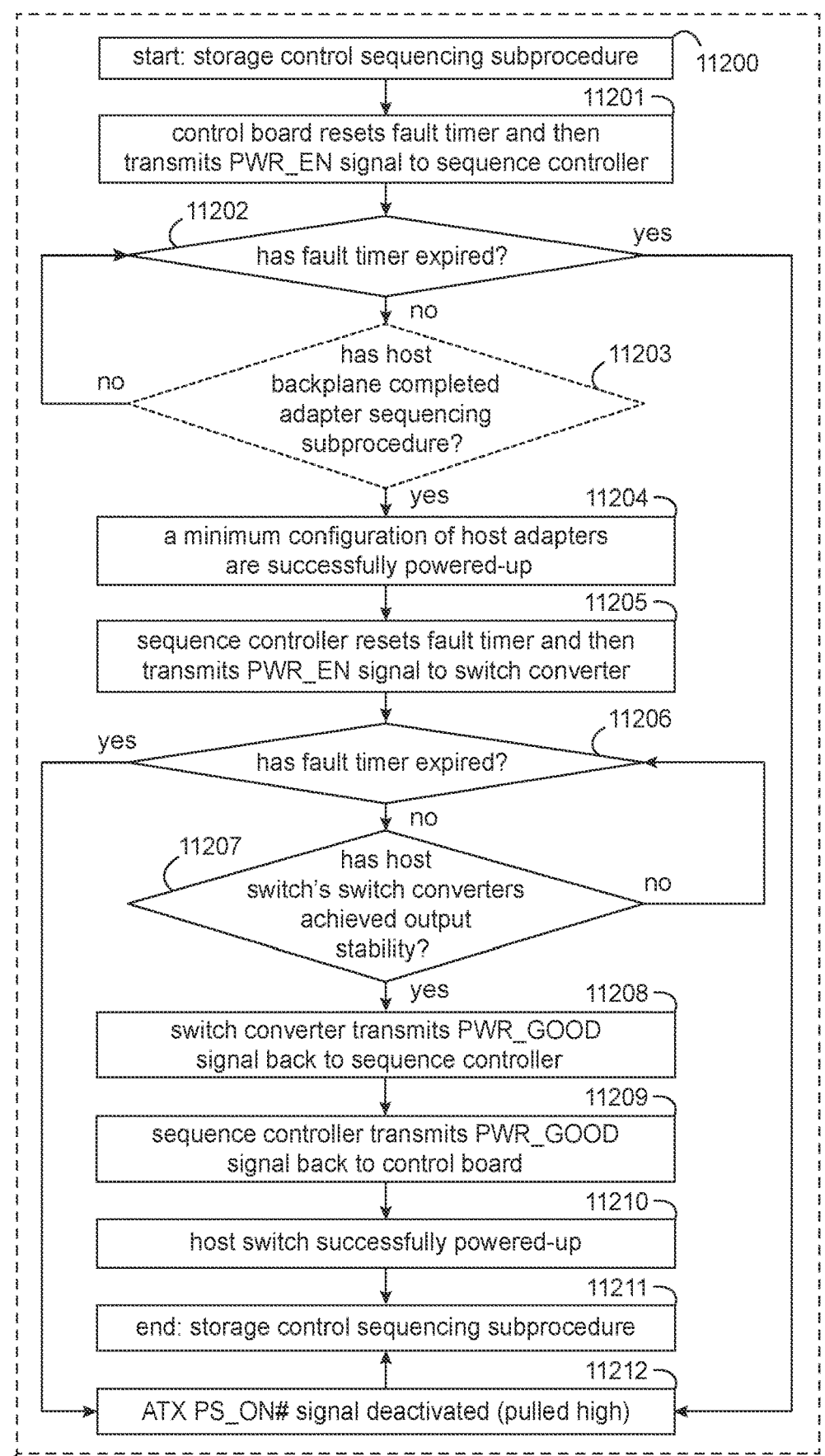

start: storage control sequencing subprocedure   11200

11201 control board resets fault timer and then transmits PWR_EN signal to sequence controller

11202 has fault timer expired?   yes no

11203 has host backplane completed adapter sequencing subprocedure?

no yes   11204 a minimum configuration of host adapters are successfully powered-up

11205 sequence controller resets fault timer and then transmits PWR_EN signal to switch converter

11206 yes   has fault timer expired?

no

11207 has host switch's switch converters achieved output stability?

no yes   11208 switch converter transmits PWR_GOOD signal back to sequence controller

11209 sequence controller transmits PWR_GOOD signal back to control board

11210 host switch successfully powered-up

11211 end: storage control sequencing subprocedure

11212

ATX PS_ON# signal deactivated (pulled high)

10919

ZFS File System

ZFS+ File System

*FIG. 121*

HIGH-DENSITY DATA STORAGE SYSTEMS AND METHODS

CROSS-REFERENCE TO RELATED APPLICATIONS

This patent application claims the benefit of U.S. Provisional Patent Application No. 63/358,776, filed Jul. 6, 2022, which is hereby incorporated by reference in its entirety.

BACKGROUND

The present disclosure relates generally to the field of data storage, and in particular to methods and apparatus for providing high-density data storage systems.

A constant in the field of data storage is the increasing demand for not only improved storage capacity, but improved data density. This is readily shown by the frequent advances in the capacity and thus density of storage drives utilizing the industry standard 2.5" form factor. But these advances have been less apparent in storage systems that utilize said storage drives in a free-standing enclosure. An example of such a storage system, is a type of NAS (Network-Attached Storage) called Desktop NAS. The desirability of a storage system which is "desktop" based (i.e. Desktop NAS) is often constrained by the form factor imposed by this "desktop" placement, and even further by the acoustic, thermal, and power practicalities expected with said placement. Altogether, these "desktop" constraints shape and ultimately restrict the number of storage drives able to be used by such storage systems. Notably, it is the storage system's form factor and the number of storage drives used by said storage system that will determine the overall storage capacity and data density of said storage system.

Thus, it is desirable to provide free-standing storage systems which contain a high-density of storage drives within a form factor that is intended for "desktop" placement.

SUMMARY

Embodiments of the present disclosure provide systems and methods that provide data storage systems, in particular high-density storage servers which utilize a free-standing enclosure.

In one aspect of the invention a storage server is provided, comprising a plurality of storage drives, wherein each of the storage drives comprises a device connector and a plurality of mounting holes; a left backplane comprising a plurality of disk receptacles and a plurality of plug receptacles, wherein each of the disk receptacles of the left backplane is mated with the device connector of a respective storage drive of the plurality of storage drives, and the plug receptacles of the left backplane are aligned in a vertically stacked orientation; a right backplane comprising a plurality of disk receptacles and a plurality of plug receptacles, wherein each of the disk receptacles of the right backplane is mated with the device connector of a respective storage drive of the plurality of storage drives, and the plug receptacles of the right backplane are aligned in a vertically stacked orientation; a backing plate comprising a left surface and a right surface, wherein the left backplane is secured to the left surface of the backing plate and the right backplane is secured to the right surface of the backing plate; a plurality host adapters, each of the host adapters comprises a left receptacle group and a right receptacle group, each of the left receptacle groups comprises a plurality of plug receptacles, each of the right receptacle groups comprises a plurality of plug receptacles, wherein the host adapters are aligned in a vertically stacked orientation; a median plane, wherein: i) the median plane equally bisects the backing plate, ii) the median plane is equidistant to the left surface and the right surface, iii) the mounting holes of each of the storage drives mated to the left backplane are bilaterally symmetrical about the median plane to the corresponding mounting holes of each of the storage drives mated to the right backplane, iv) the plug receptacles of the left backplane are bilaterally symmetrical about the median plane to the corresponding plug receptacles of the right backplane, v) the left receptacle group is bilaterally symmetrical about the median plane to the right receptacle group for each of the host adapters; a plurality of cables, wherein: vi) each of the plug receptacles of the left backplane is coupled to a corresponding plug receptacle of the plurality of plug receptacles of the left receptacle group of a host adapter of the plurality of host adapters using a respective cable of the plurality of cables, vii) each of the plug receptacles of the right backplane is coupled to a corresponding plug receptacle of the plurality of plug receptacles of the right receptacle group of a host adapter of the plurality of host adapters using a respective cable of the plurality of cables; and the storage server is free-standing and designed for independent operation and is not intended to be mounted within a separate server rack cabinet. In certain aspects, each of the cables is configured to a minimized length.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

BRIEF DESCRIPTION OF THE DRAWINGS

FIGS. 3A-3F illustrate six principal orthographic-views of a storage server according to an embodiment.

FIG. 5G illustrates a partial-view of a middle panel according to an embodiment.

FIGS. 5H-5K illustrate detail-views of a middle panel according to an embodiment.

FIG. 5L illustrates a partial-view of a middle panel according to an embodiment.

FIG. 6A illustrates an interior view of an access panel according to an embodiment.

FIG. 6B illustrates an exterior view of an access panel according to an embodiment.

FIG. 6C illustrates various EMI mitigation features of an access panel according to an embodiment.

FIGS. 19A and 19B illustrate orthographic-views of a left vertical locator according to an embodiment.

FIGS. 20A and 20B illustrate orthographic-views of a right vertical locator according to an embodiment.

FIGS. 21A and 21B illustrate orthographic-views of an inner vertical locator according to an embodiment.

FIG. 24A illustrates a right carrier side orthographic-view of a drive carrier, which includes a storage drive, according to an embodiment.

FIG. 24B illustrates a bottom carrier face orthographic-view of a drive carrier, which includes a storage drive, according to an embodiment.

FIG. 24C illustrates a left carrier side orthographic-view of a drive carrier, which includes a storage drive, according to an embodiment.

FIG. 24D illustrates a top carrier face orthographic-view of a drive carrier, which includes a storage drive, according to an embodiment.

FIG. 30A illustrates a top orthographic-view of a top panel according to an embodiment.

FIG. 30B illustrates a bottom orthographic-view of a top panel according to an embodiment.

FIG. 45E illustrates an orthographic-view of a host adapter and the intersection with a median plane according to an embodiment.

FIG. 45F illustrates an orthographic-view of a host connector and the intersection with a median plane which results in a left and a right receptacle group according to an embodiment.

FIG. 46A illustrates an orthographic-view of a switch heatsink according to an embodiment.

FIG. 46B illustrates a perspective-view of a host backplane, which includes installed host adapters, according to an embodiment.

FIG. 46C illustrates an orthographic-view of a host backplane with a switch heatsink and the host adapters removed according to an embodiment.

FIG. 46D illustrates an orthographic-view of a host backplane according to an embodiment.

FIG. 46E illustrates a host backplane's storage control sequencing subprocedure and adapter sequencing subprocedure according to an embodiment.

FIG. 47A illustrates a partial-view of a left side of a storage server with various components removed to present certain correlations between plug receptacles located in a top section to plug receptacles located in a bottom section according to an embodiment.

FIG. 47B illustrates a partial-view of a right side of a storage server with various components removed to present certain correlations between plug receptacles located in a top section to plug receptacles located in a bottom section according to an embodiment.

FIGS. 47C and 47D illustrate front orthographic-views of a storage server with various components removed to present certain correlations between plug receptacles located in a top section to plug receptacles located in a bottom section according to an embodiment.

FIGS. 48A and 48B illustrate orthographic-views of a system board according to an embodiment.

FIG. 49A illustrates a top, back, right perspective-view of a storage server with various components removed to present a correlation between a system board, host backplane, power board, and a middle panel according to an embodiment.

Figures 49A, 49B:
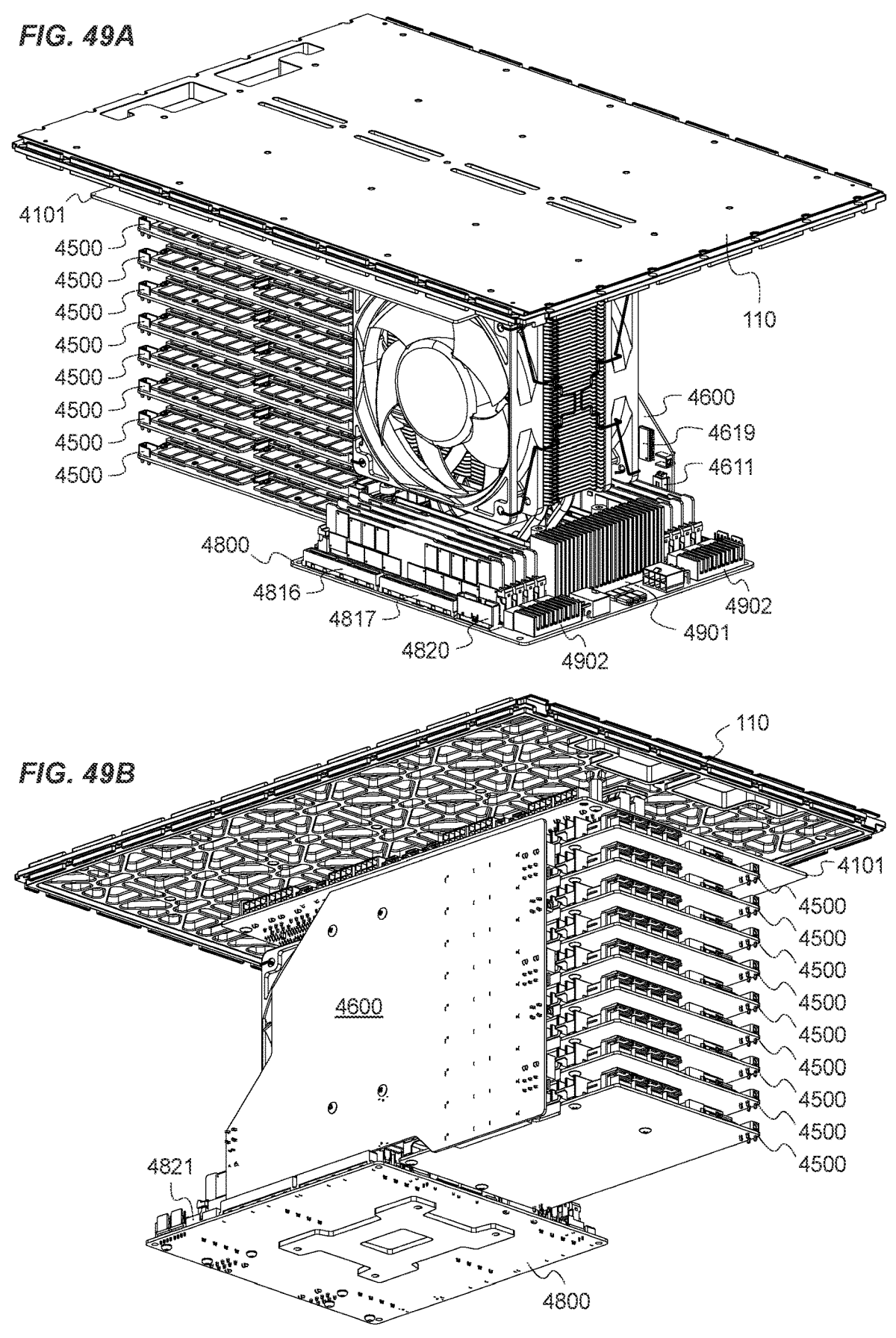

FIG. 49B illustrates a bottom, front, left perspective-view of a storage server with various components removed to present a correlation between a system board, host backplane, power board, and a middle panel according to an embodiment.

Figures 50A, 50B, 50C:
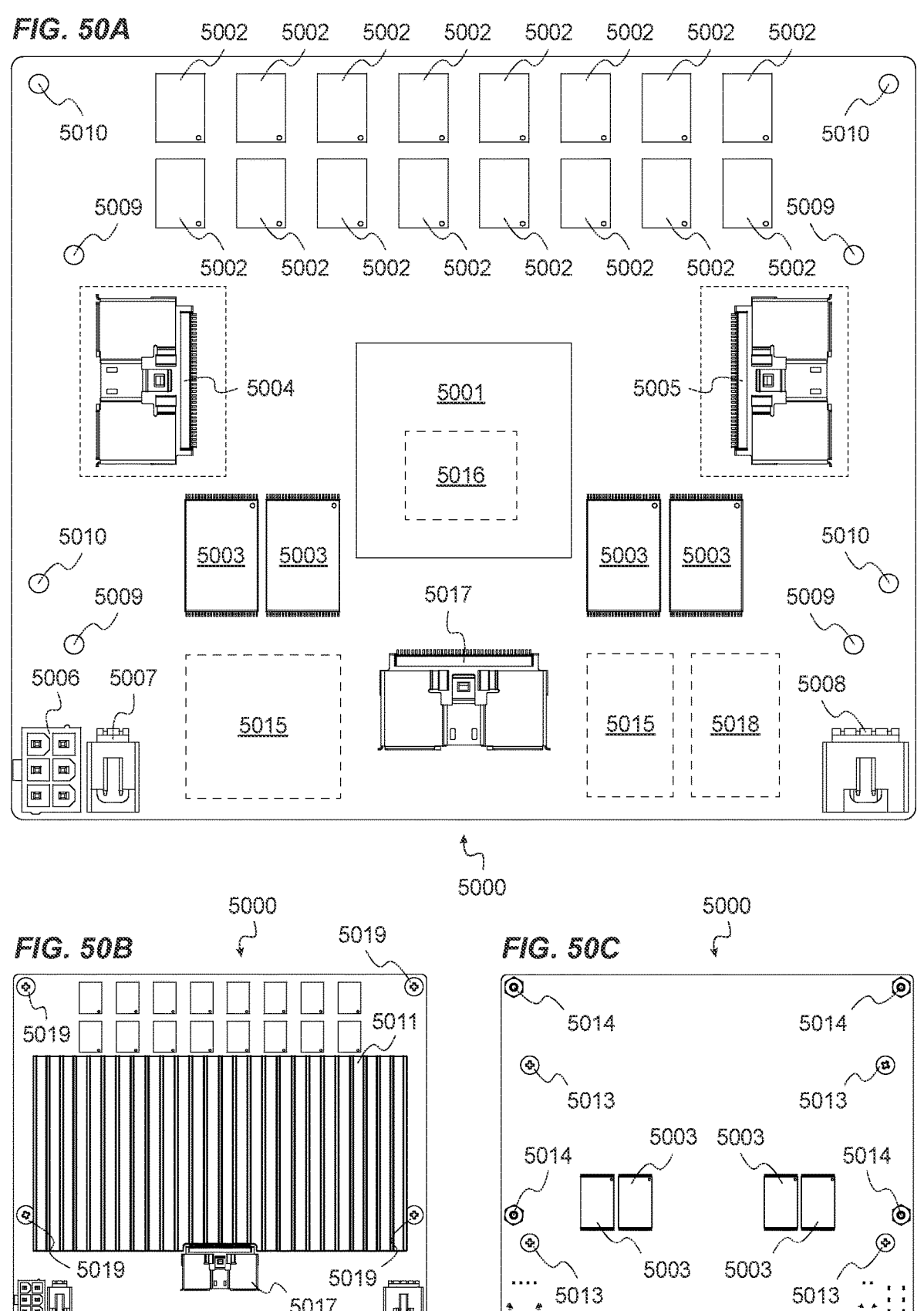

FIG. 50A illustrates an orthographic-view of a NVRAM device with a controller heatsink removed according to an embodiment.

FIGS. 50B and 50C illustrate orthographic-views of a NVRAM device according to an embodiment.

Figures 51A, 51B, 51C:
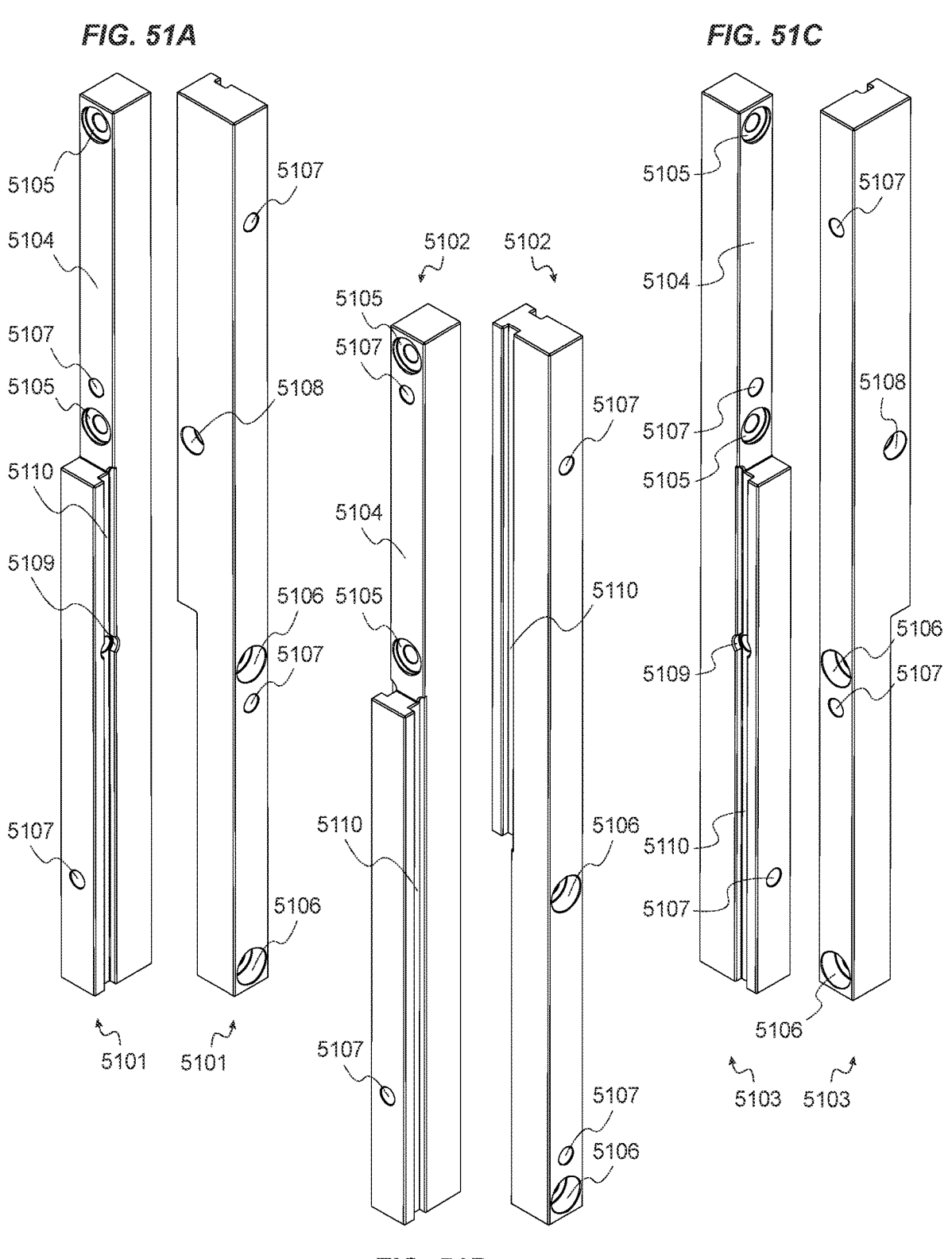

FIG. 51A illustrates perspective-views of a top guide slide according to an embodiment.

FIG. 51B illustrates perspective-views of a middle guide slide according to an embodiment.

FIG. 51C illustrates perspective-views of a bottom guide slide according to an embodiment.

Figures 52A, 52B:
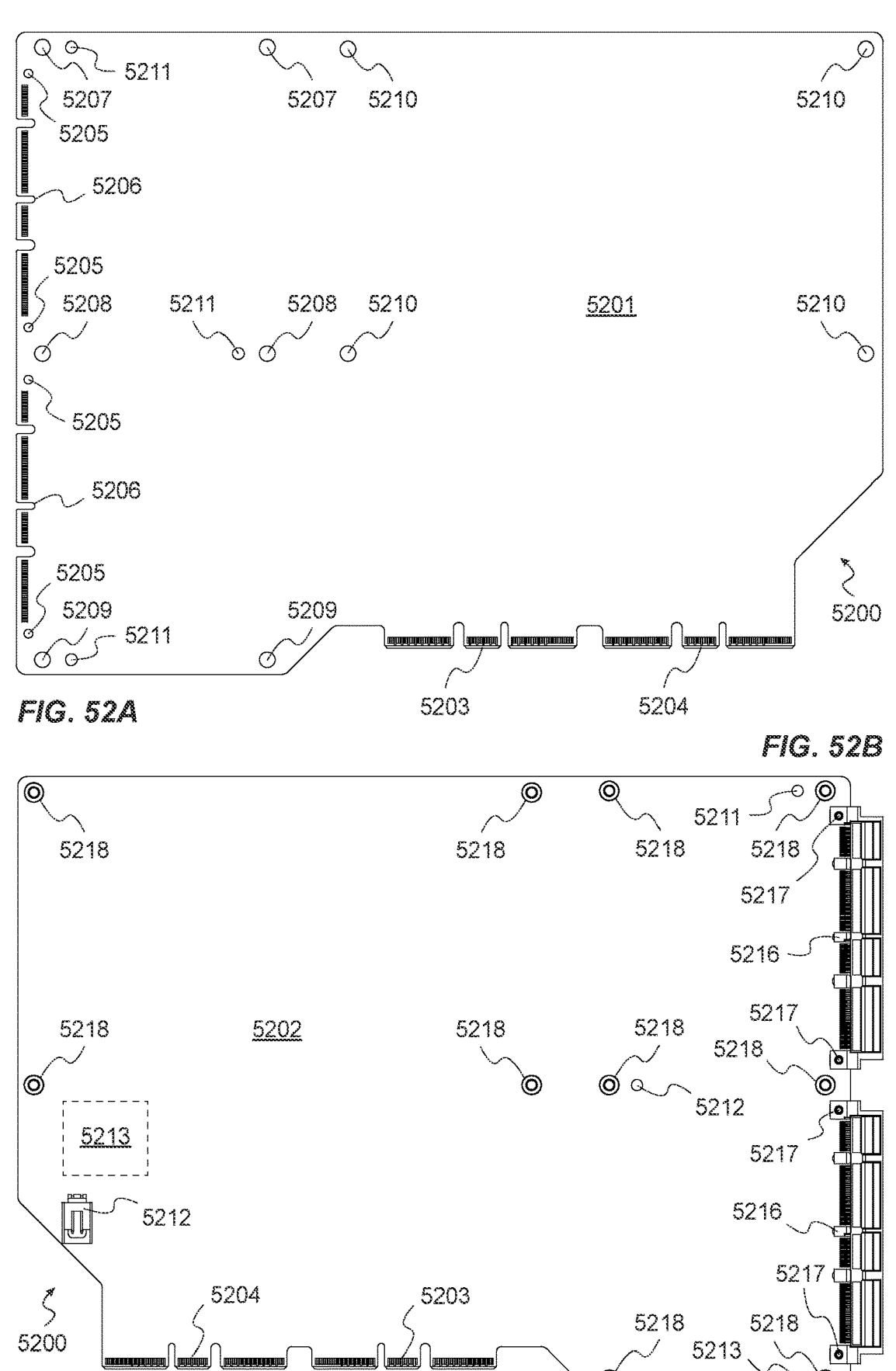

FIG. 52A illustrates an orthographic-view of a right board side of a backplane board according to an embodiment.

FIG. 52B illustrates an orthographic-view of a left board side of a backplane board according to an embodiment.

Figures 53A, 53B, 53C, 53D:
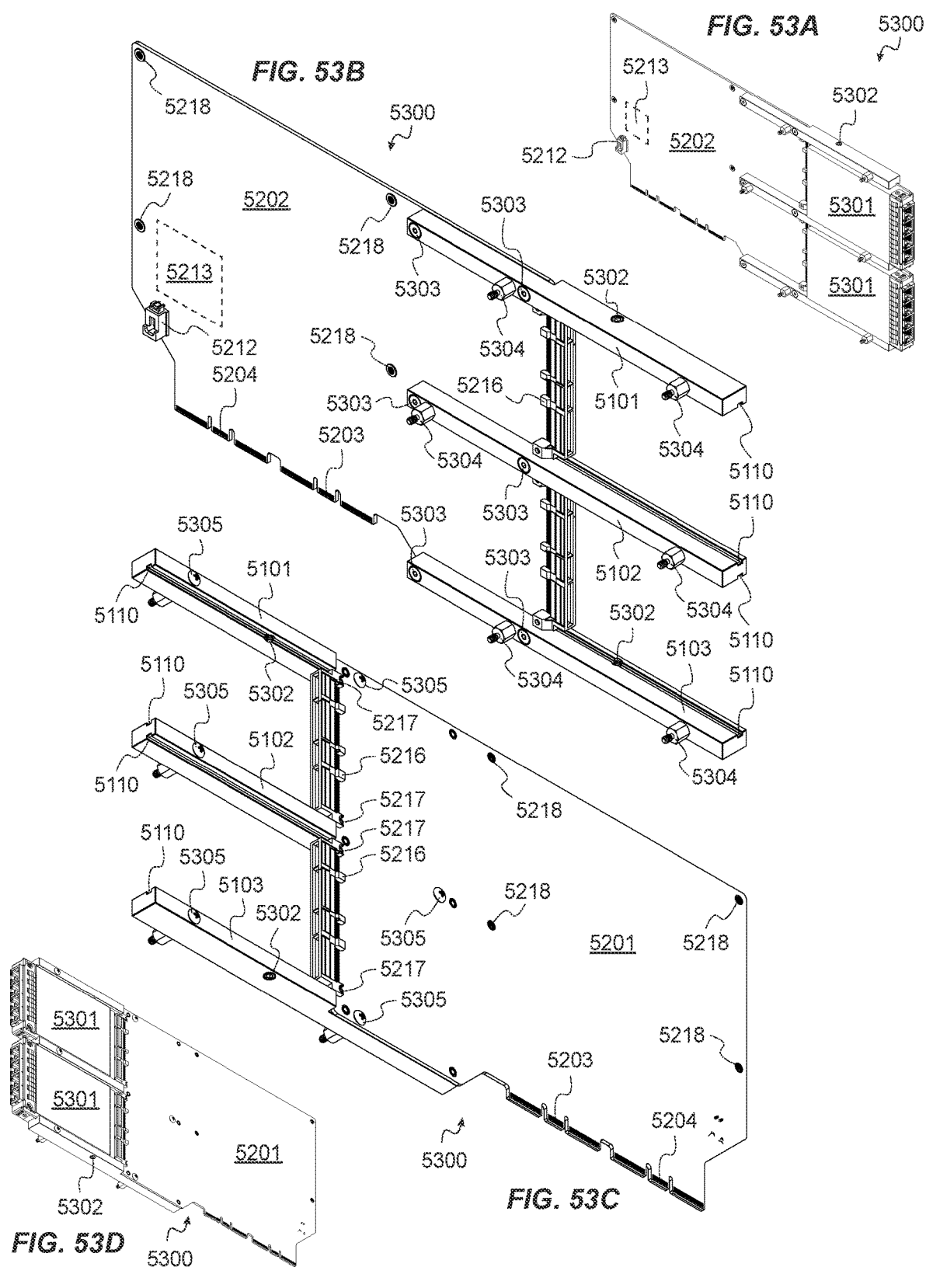

FIG. 53A illustrates a perspective-view of a left board side of a network backplane according to an embodiment.

FIGS. 53B and 53C illustrate perspective-views of a network backplane with NIC cards removed according to an embodiment.

FIG. 53D illustrates a perspective-view of a right board side of a network backplane according to an embodiment.

Figure 53E:
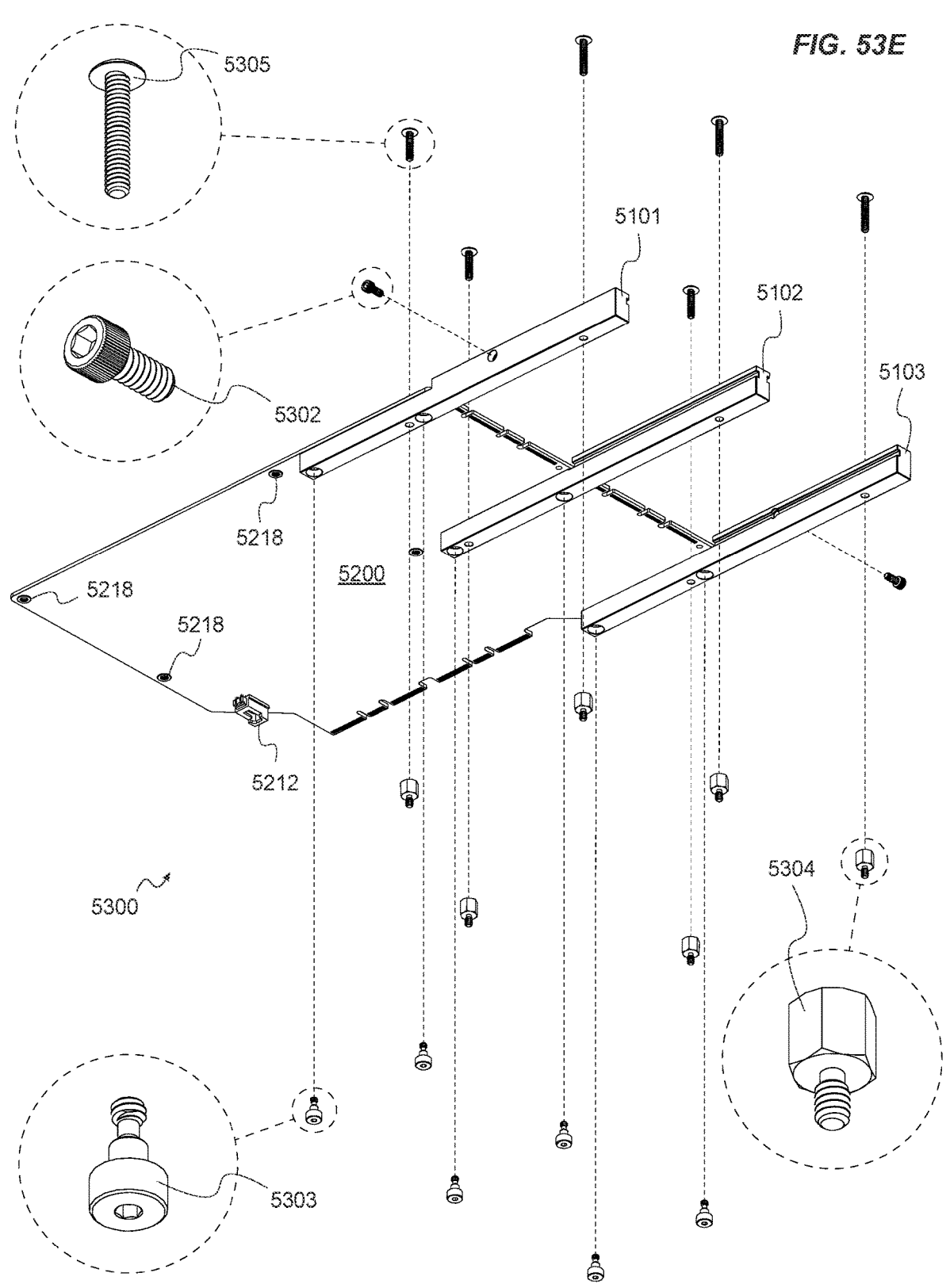
Figures 54A, 54B, 54C, 54D, 54E:
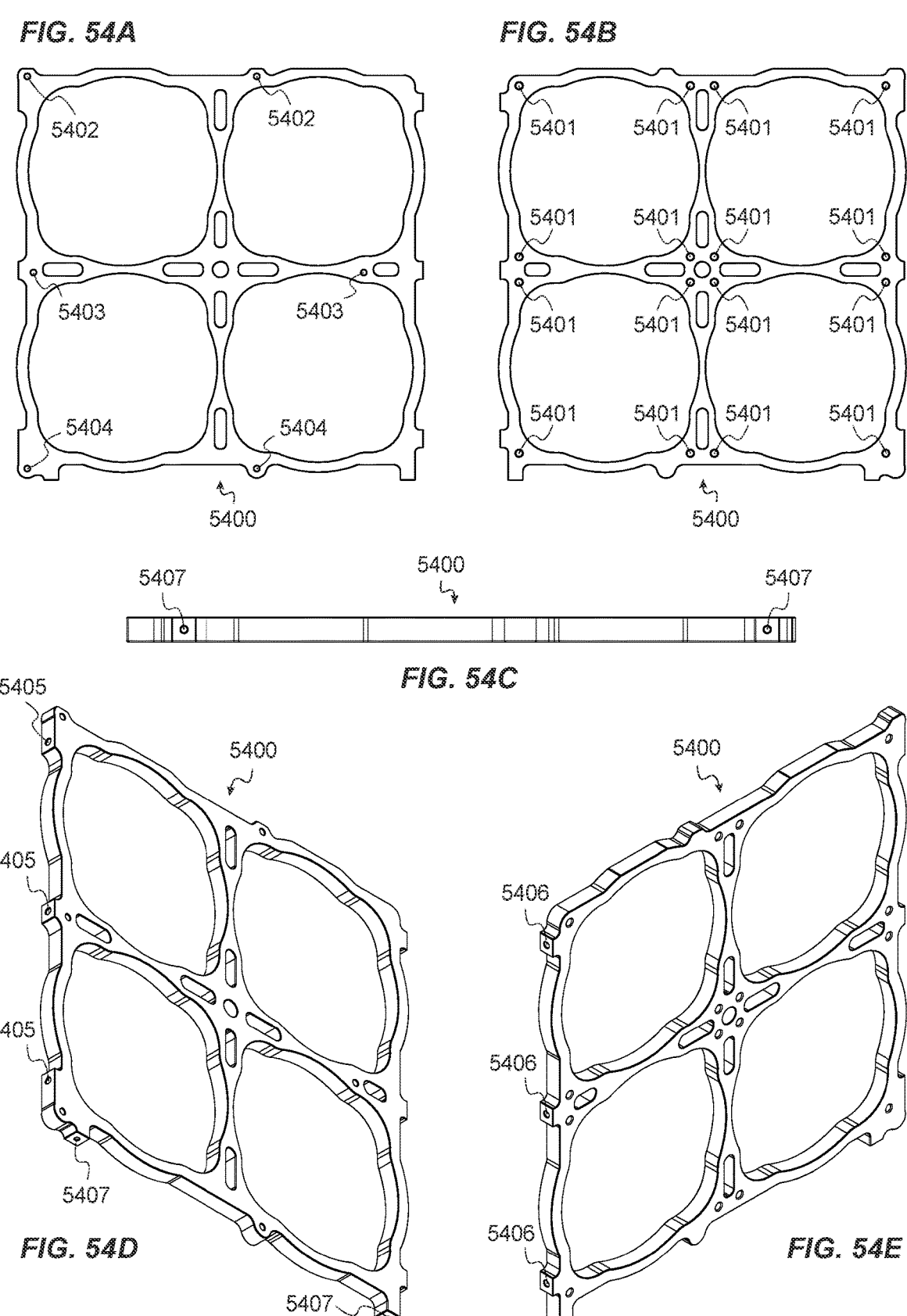
Figures 55A, 55B, 55C, 55D:
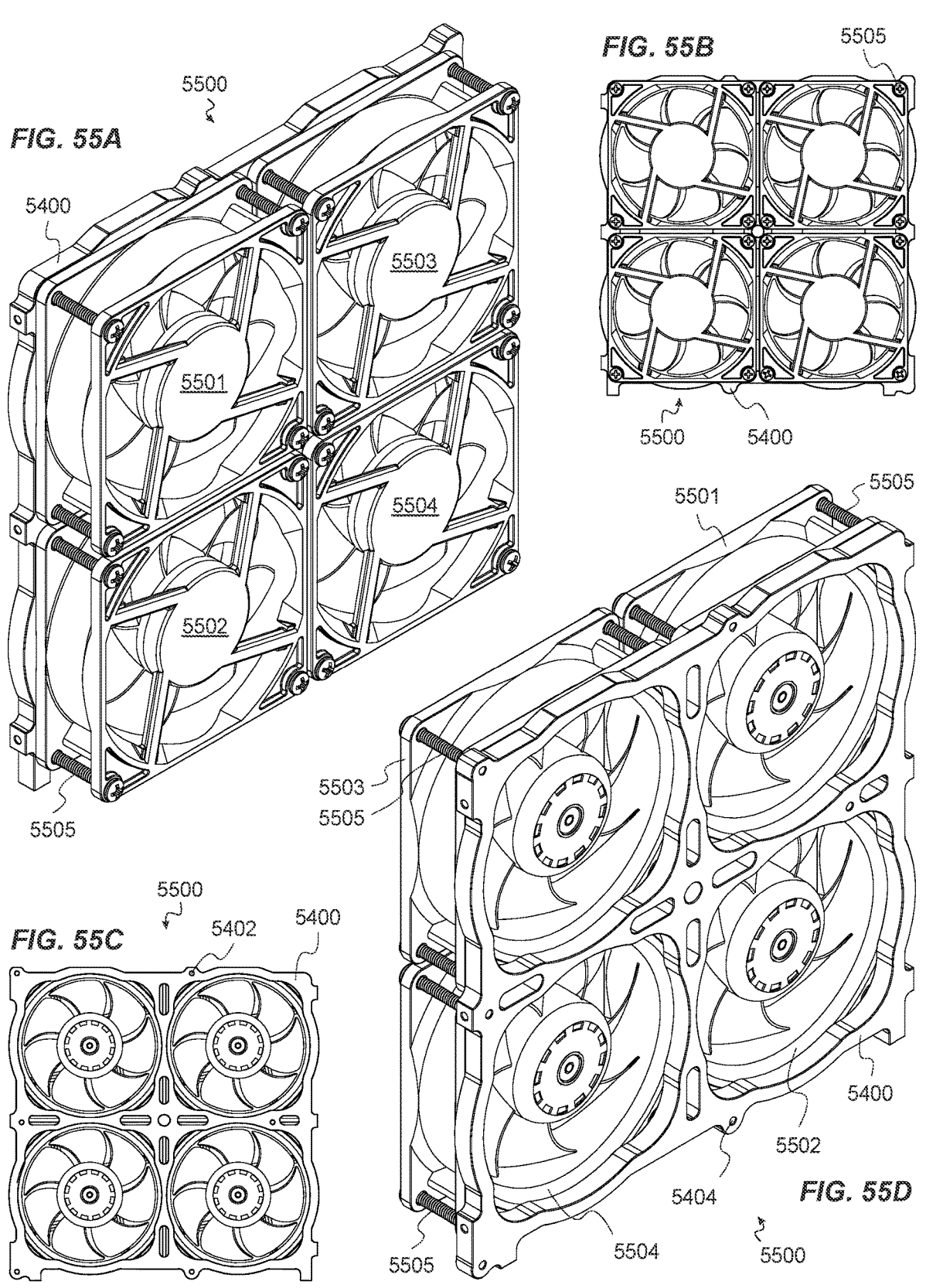

FIG. 53E illustrates an exploded-view of a network backplane according to an embodiment.

FIGS. 54A-54E illustrate various views of a fan mount according to an embodiment.

FIGS. 55A-55D illustrate various views of a fan assembly according to an embodiment.

Figures 56A, 56B, 56C, 56D:
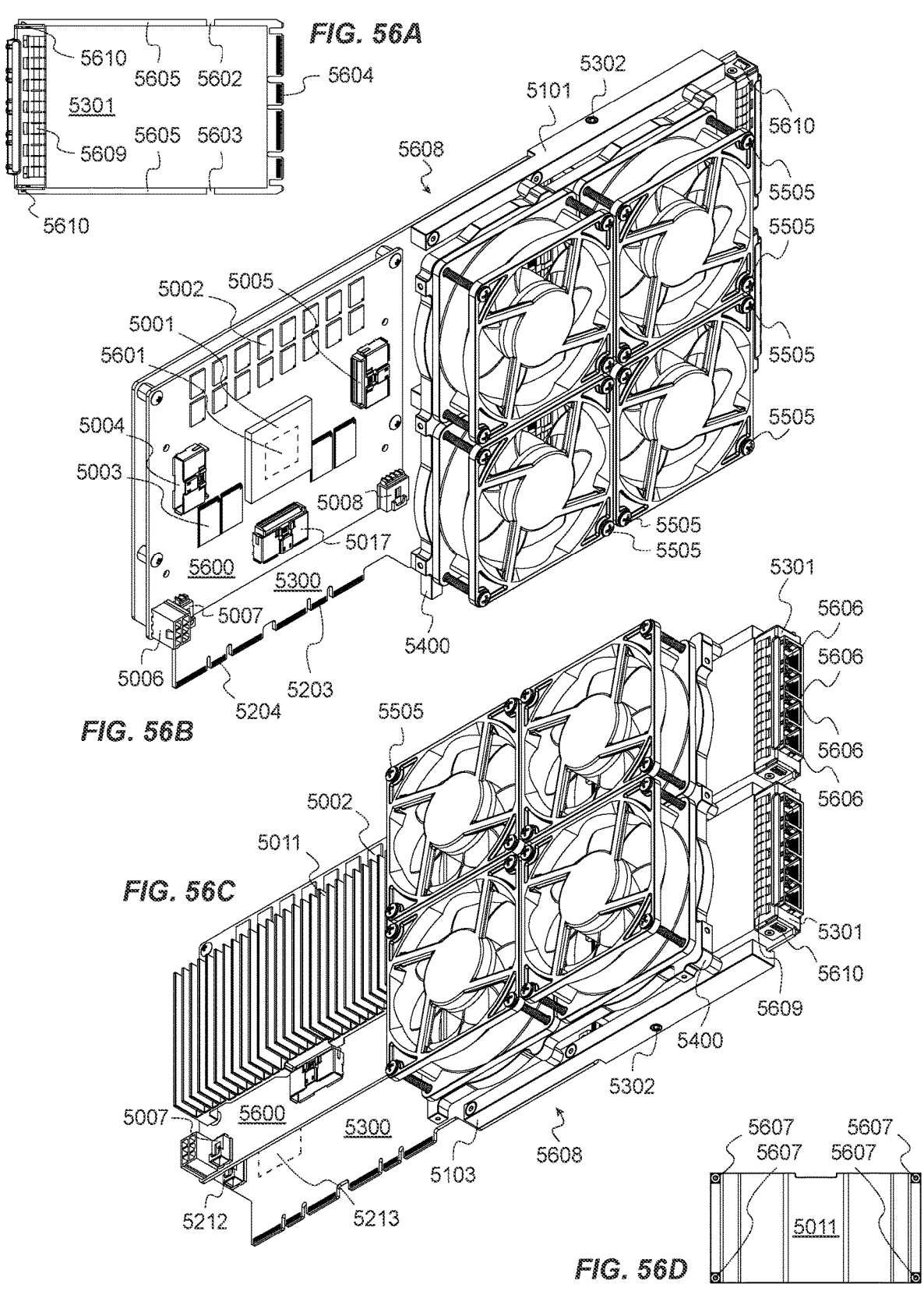

FIG. 56A illustrates an orthographic-view of a NIC card according to an embodiment.

FIG. 56B illustrates a perspective-view of a system extension with a controller heatsink removed according to an embodiment.

FIG. 56C illustrates a perspective-view of a system extension according to an embodiment.

FIG. 56D illustrates an orthographic-view of a controller heatsink according to an embodiment.

FIG. 57A illustrates a front orthographic-view of a storage server with various components removed to present a system extension and a network backplane according to an embodiment.

FIG. 57B illustrates a back orthographic-view of a storage server with various components removed to present a system extension and a network backplane according to an embodiment.

FIG. 57C illustrates an orthographic-view of a front adapter plate according to an embodiment.

FIG. 57D illustrates an orthographic-view of a back adapter plate according to an embodiment.

Figures 58A, 58B:
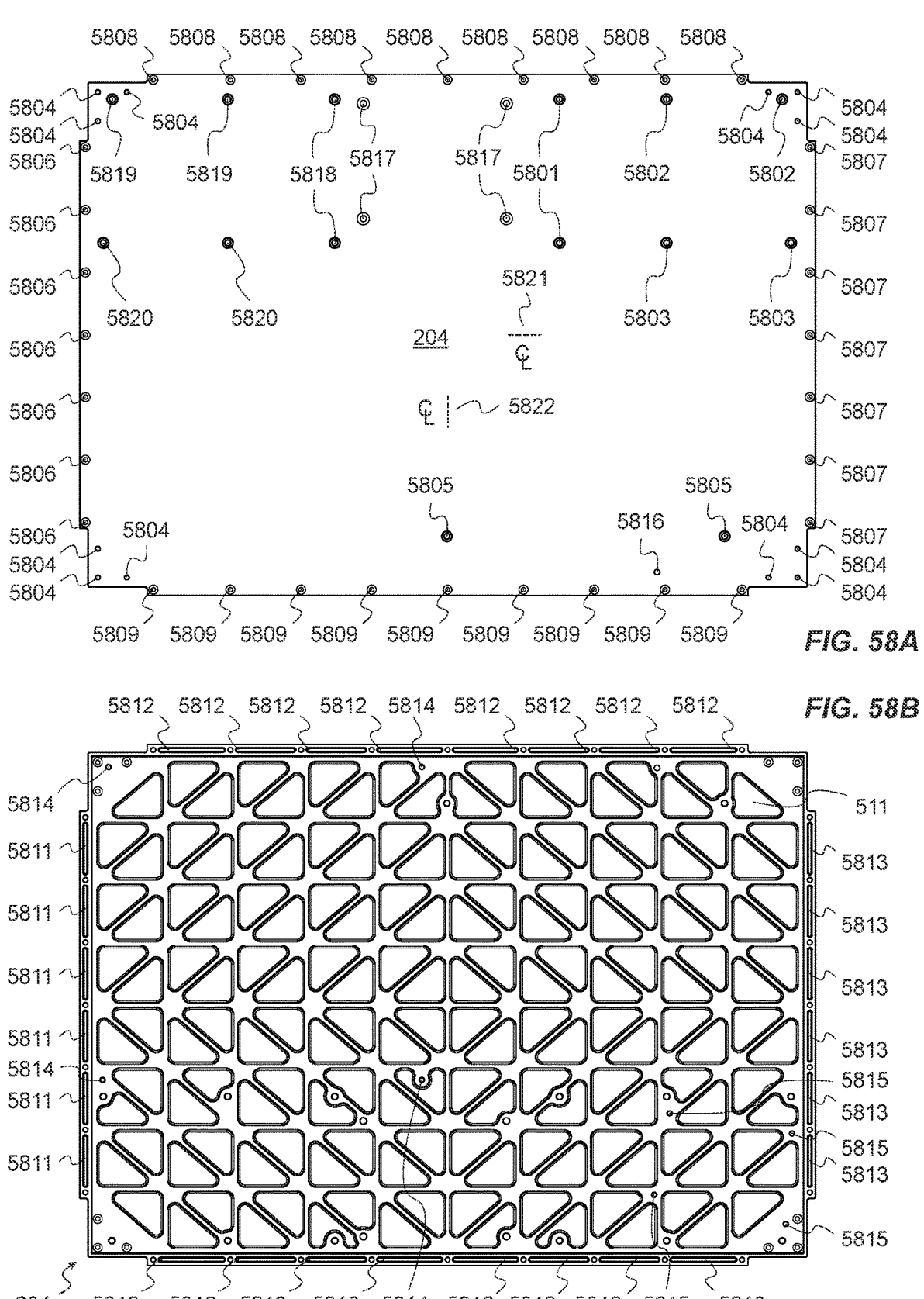

FIGS. 58A and 58B illustrate orthographic-views of a bottom panel according to an embodiment.

Figures 58C, 58D, 58E, 58F:
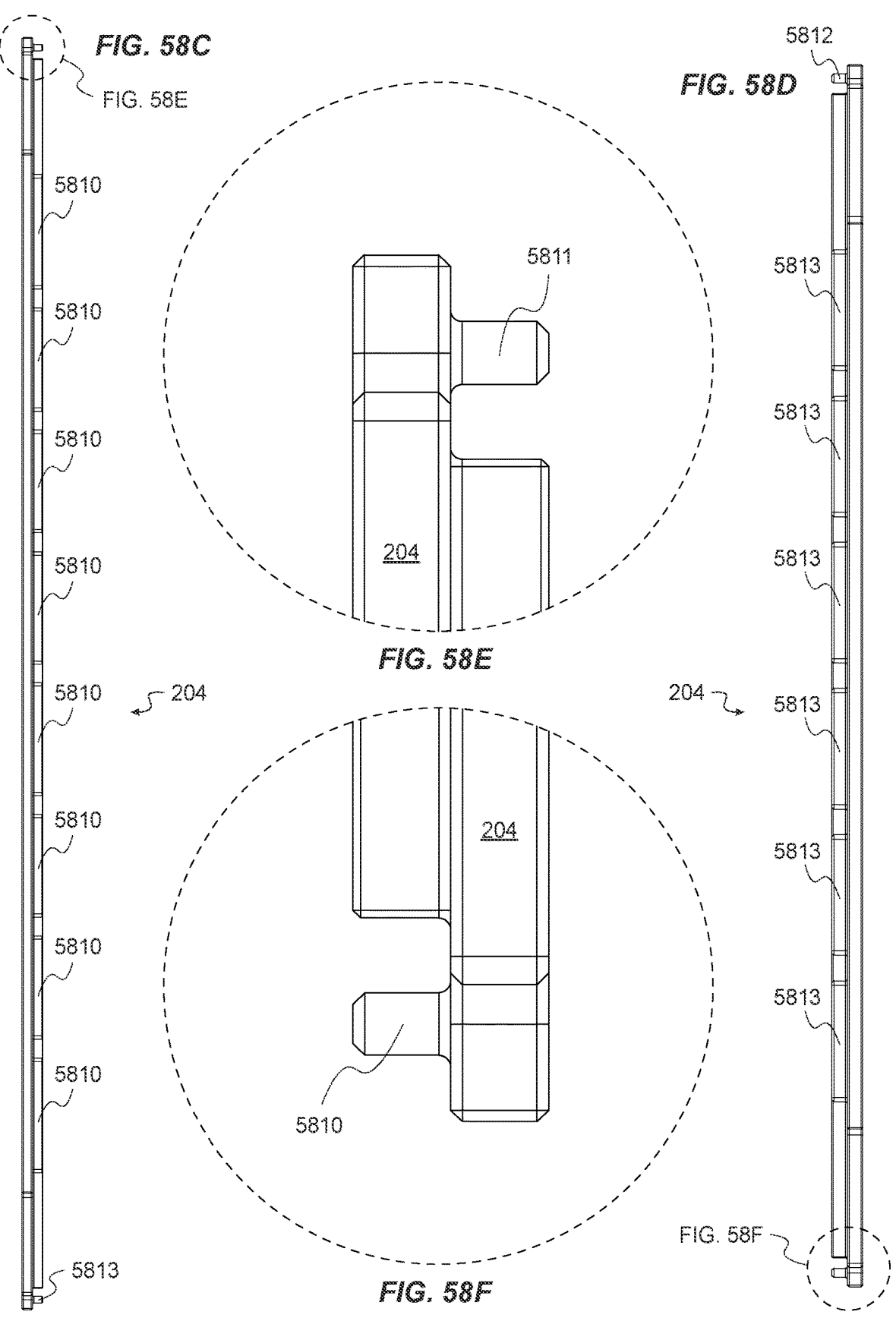

FIG. 58C illustrates a left orthographic-view of a bottom panel according to an embodiment.

FIG. 58D illustrates a front orthographic-view of a bottom panel according to an embodiment.

FIGS. 58E and 58F illustrate detail-views of certain aspects of a bottom panel according to an embodiment.

Figures 59A, 59B, 59C, 59D, 59E, 59F, 59G, 59H:
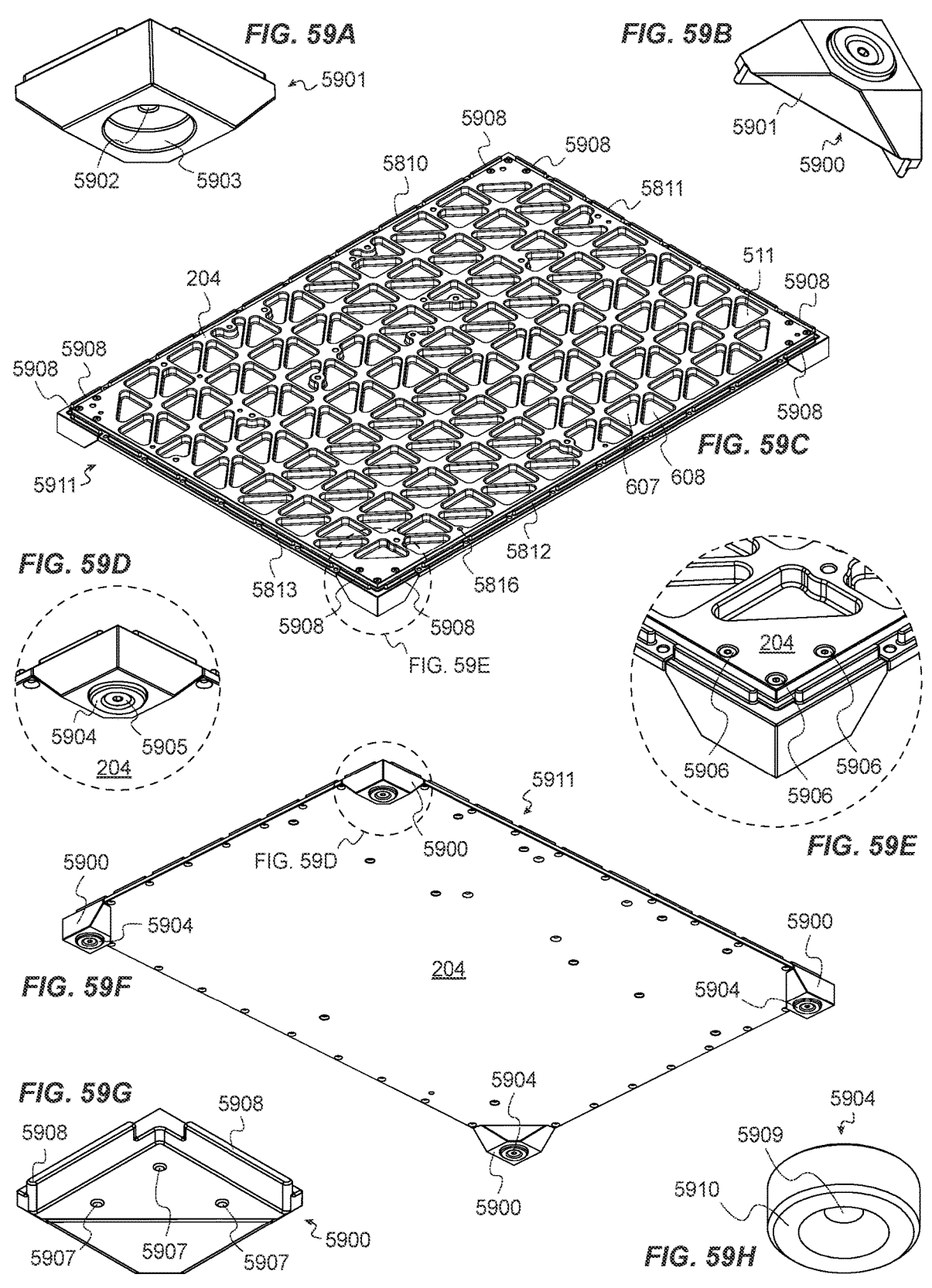

FIG. 59A illustrates a perspective-view of a riser frame according to an embodiment.

FIG. 59B illustrates a perspective-view of a case riser according to an embodiment.

FIG. 59C illustrates a perspective-view of a bottom base according to an embodiment.

FIGS. 59D and 59E illustrate detail-views of a bottom base according to an embodiment.

FIG. 59F illustrates a perspective-view of a bottom base according to an embodiment.

FIG. 59G illustrates a perspective-view of a case riser according to an embodiment.

FIG. 59H illustrates a perspective-view of a riser glider according to an embodiment.

Figure 59I:
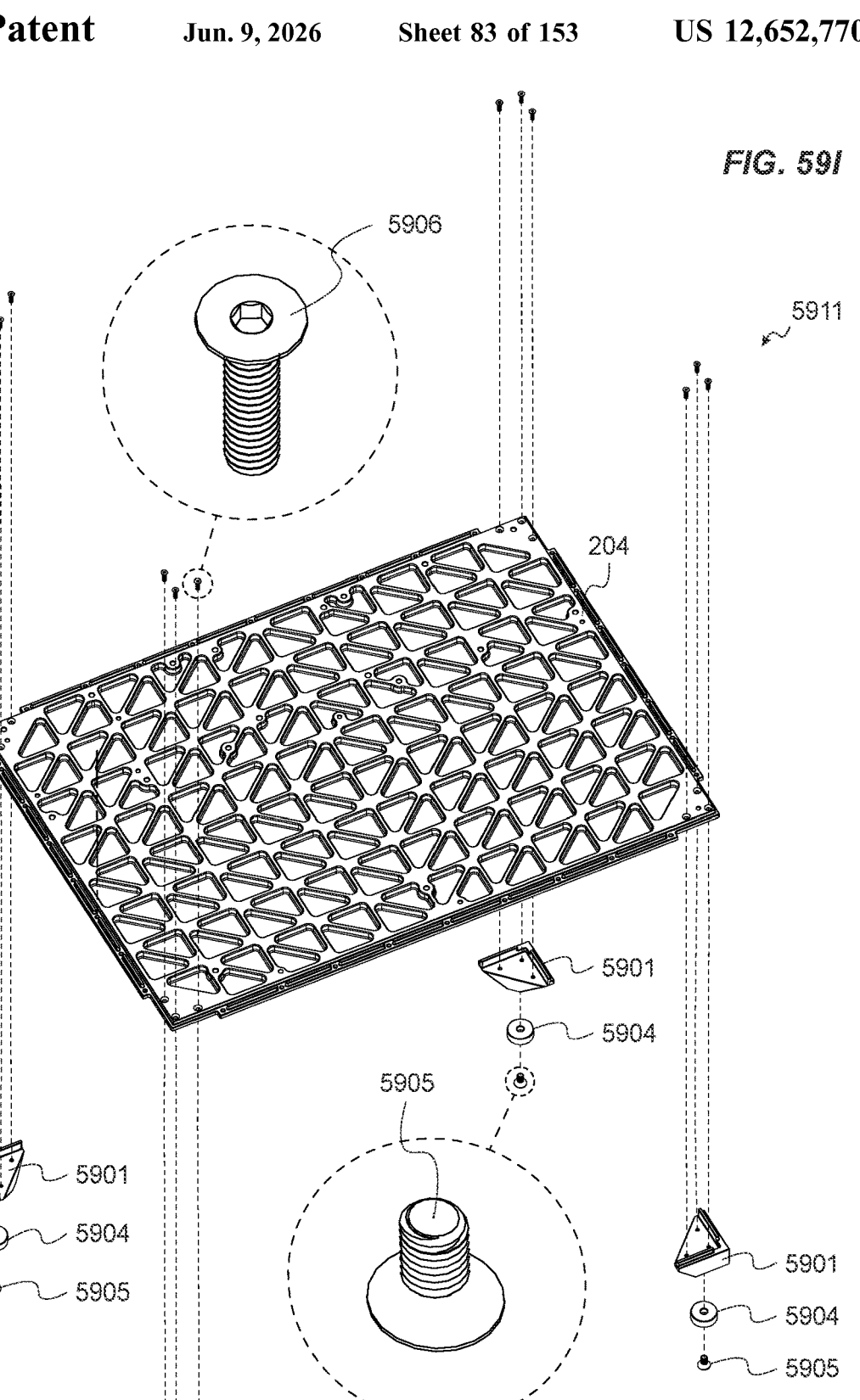

FIG. 59I illustrates an exploded-view of a bottom base according to an embodiment.

Figures 60A, 60B, 60C:
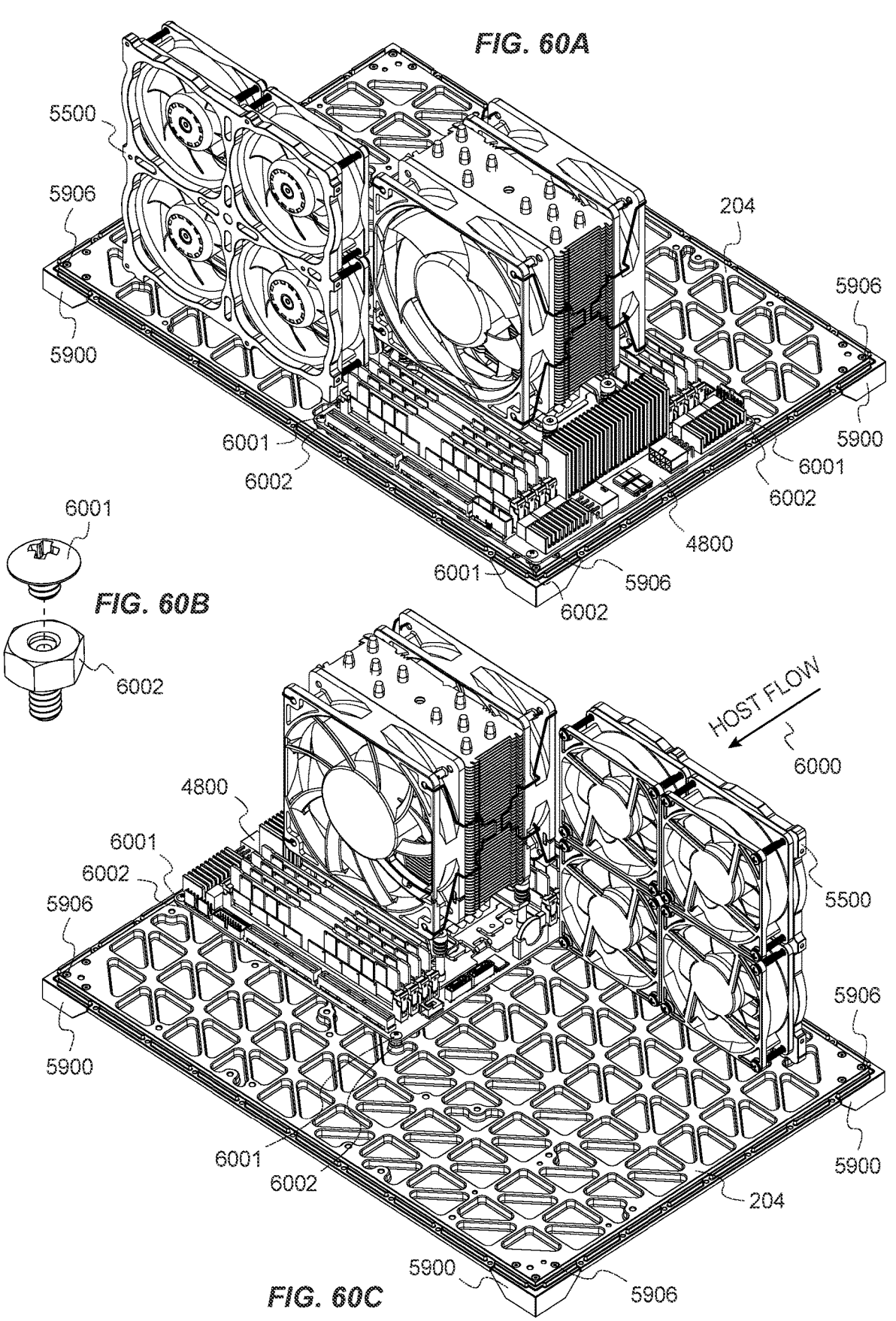

FIG. 60A illustrates a top, back, right perspective-view of a bottom base with a system board and a fan assembly attached according to an embodiment.

FIG. 60B illustrates a perspective-view of a male-female hex standoff and a respective truss head screw according to an embodiment.

FIG. 60C illustrates a top, front, left perspective-view of a bottom base with a system board and a fan assembly attached according to an embodiment.

Figures 61A, 61B:
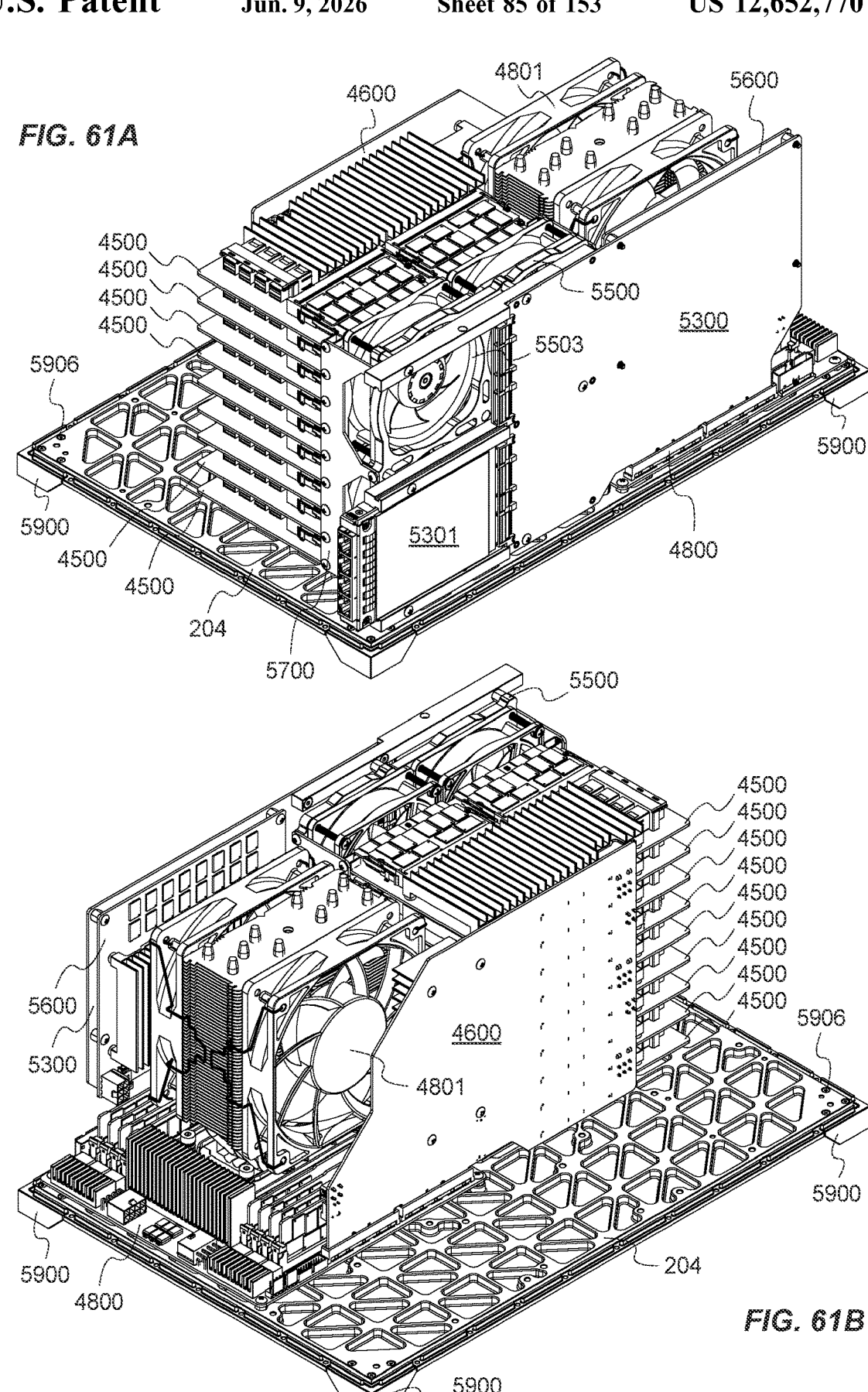

FIG. 61A illustrates a top, front, right perspective-view of a bottom base with the following attached: a system board, host backplane, system extension sans a NIC card, adapter plates, truss head screws, and male-female hex standoffs with truss head screws according to an embodiment.

FIG. 61B illustrates a top, back, left perspective-view of a bottom base with the following attached: a system board, host backplane, system extension, adapter plates, truss head screws, and male-female hex standoffs with truss head screws according to an embodiment.

Figure 62:
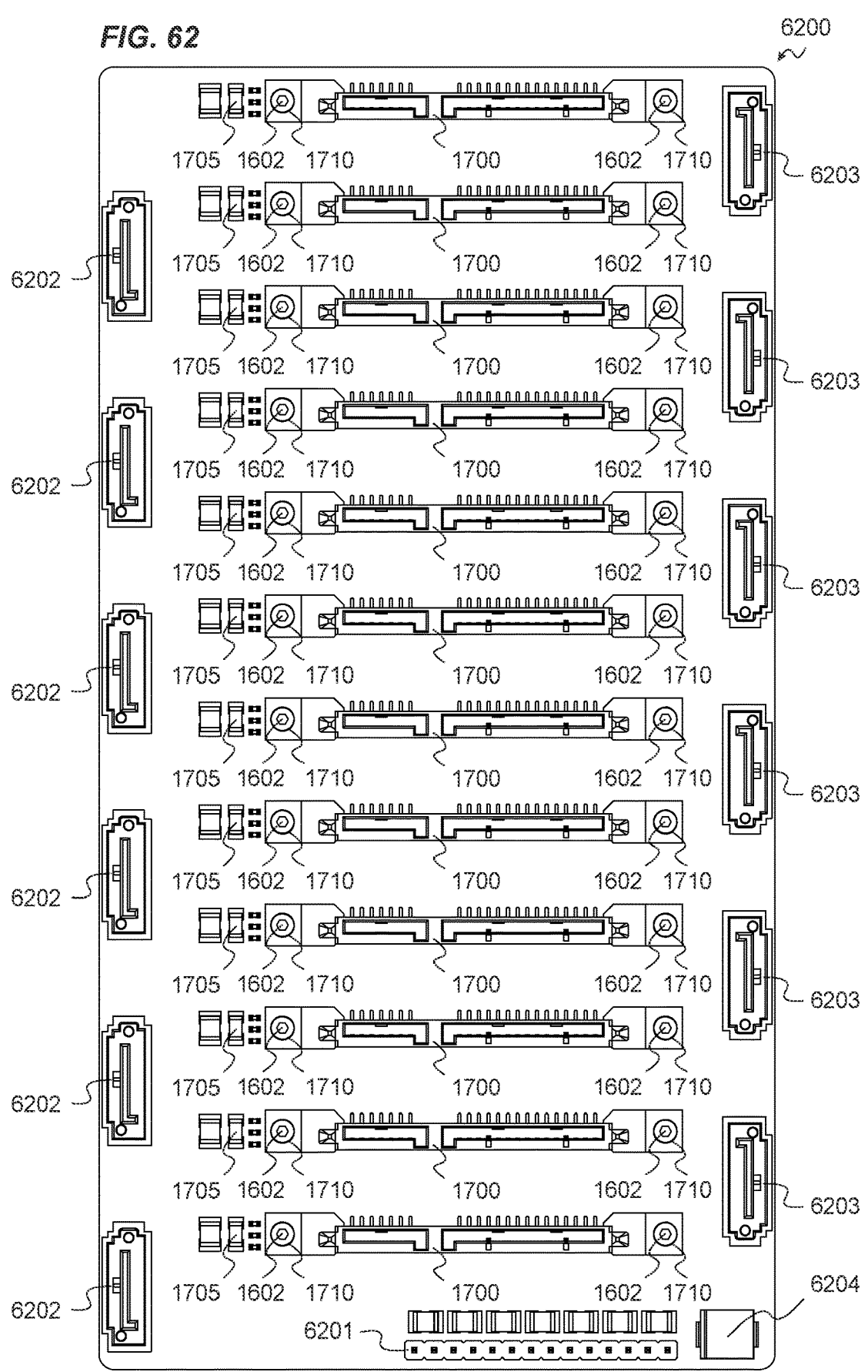

FIG. 62 illustrates an orthographic-view of a front backplane according to an embodiment.

Figures 63A, 63B, 63C, 63D:
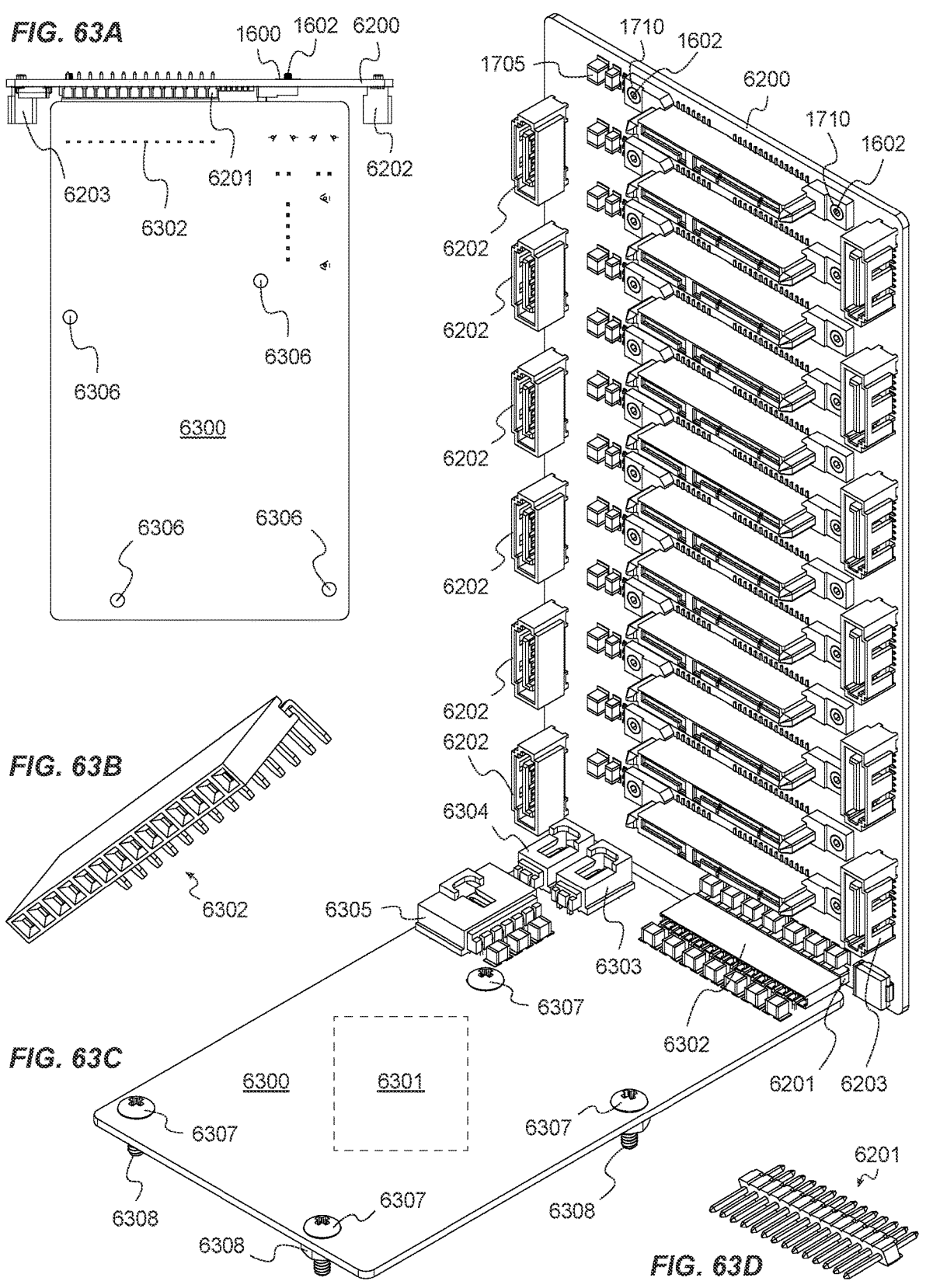

FIG. 63A illustrates an orthographic-view of a front backplane connected to a power card according to an embodiment.

FIG. 63B illustrates a perspective-view of a card receptacle according to an embodiment.

FIG. 63C illustrates a perspective-view of a front backplane connected to a power card via a card receptacle and a front header according to an embodiment.

FIG. 63D illustrates a perspective-view of a front header according to an embodiment.

Figure 64A:
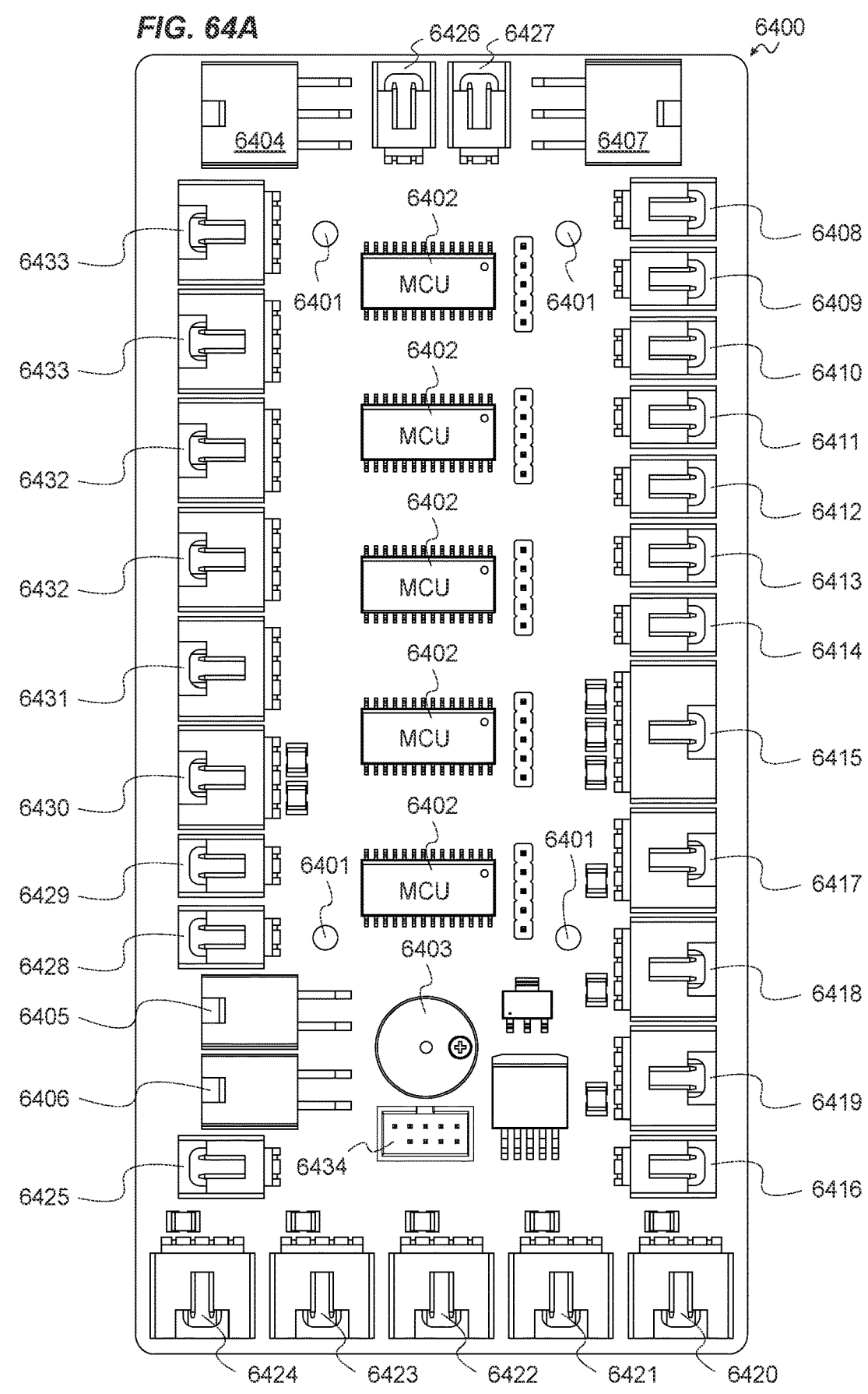

FIG. 64A illustrates an orthographic-view of a control board according to an embodiment.

Figure 64B:
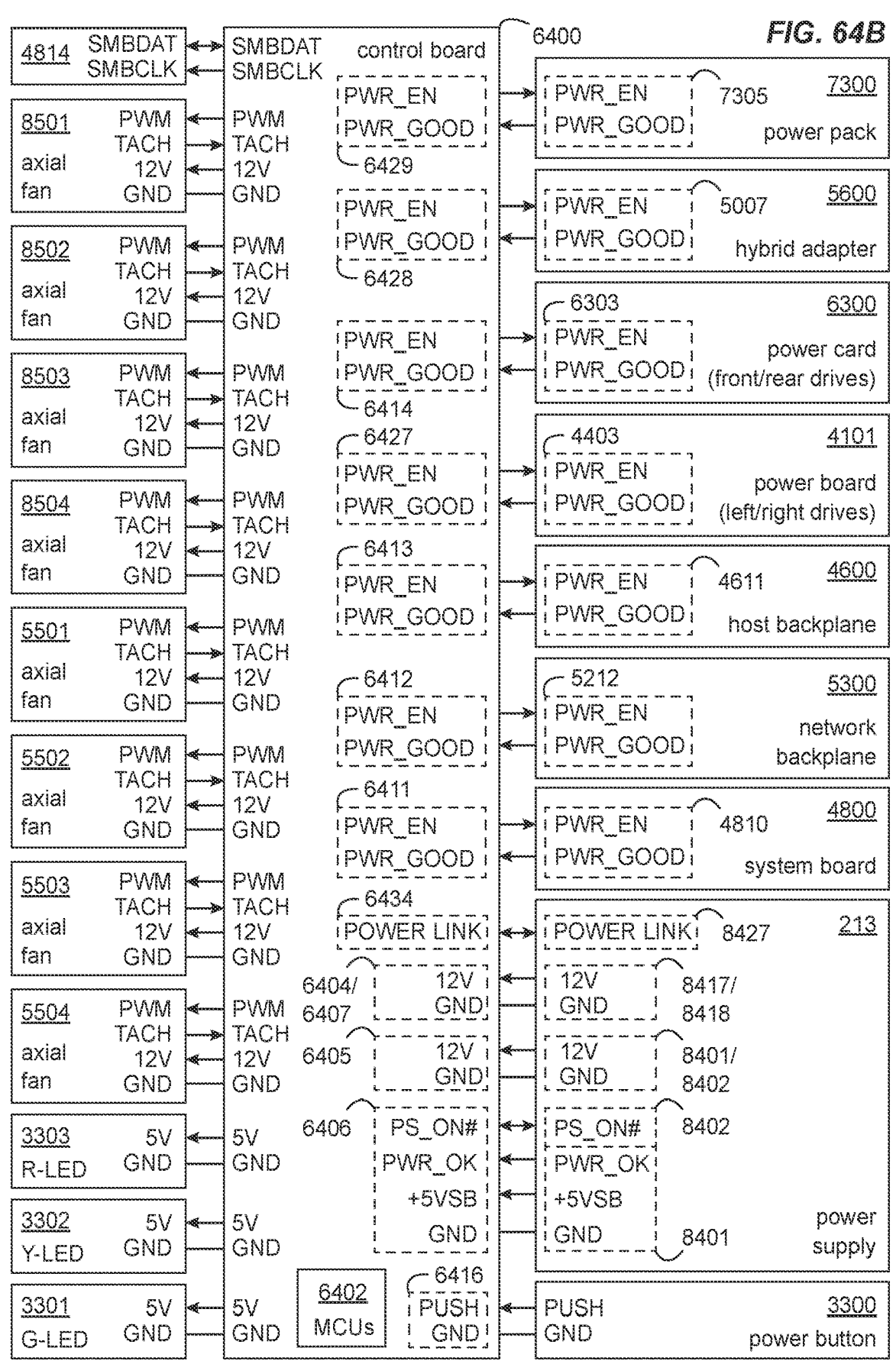

FIG. 64B illustrates the interconnections and functionalities provided by a control board to various components of a storage server according to an embodiment.

Figure 64C:
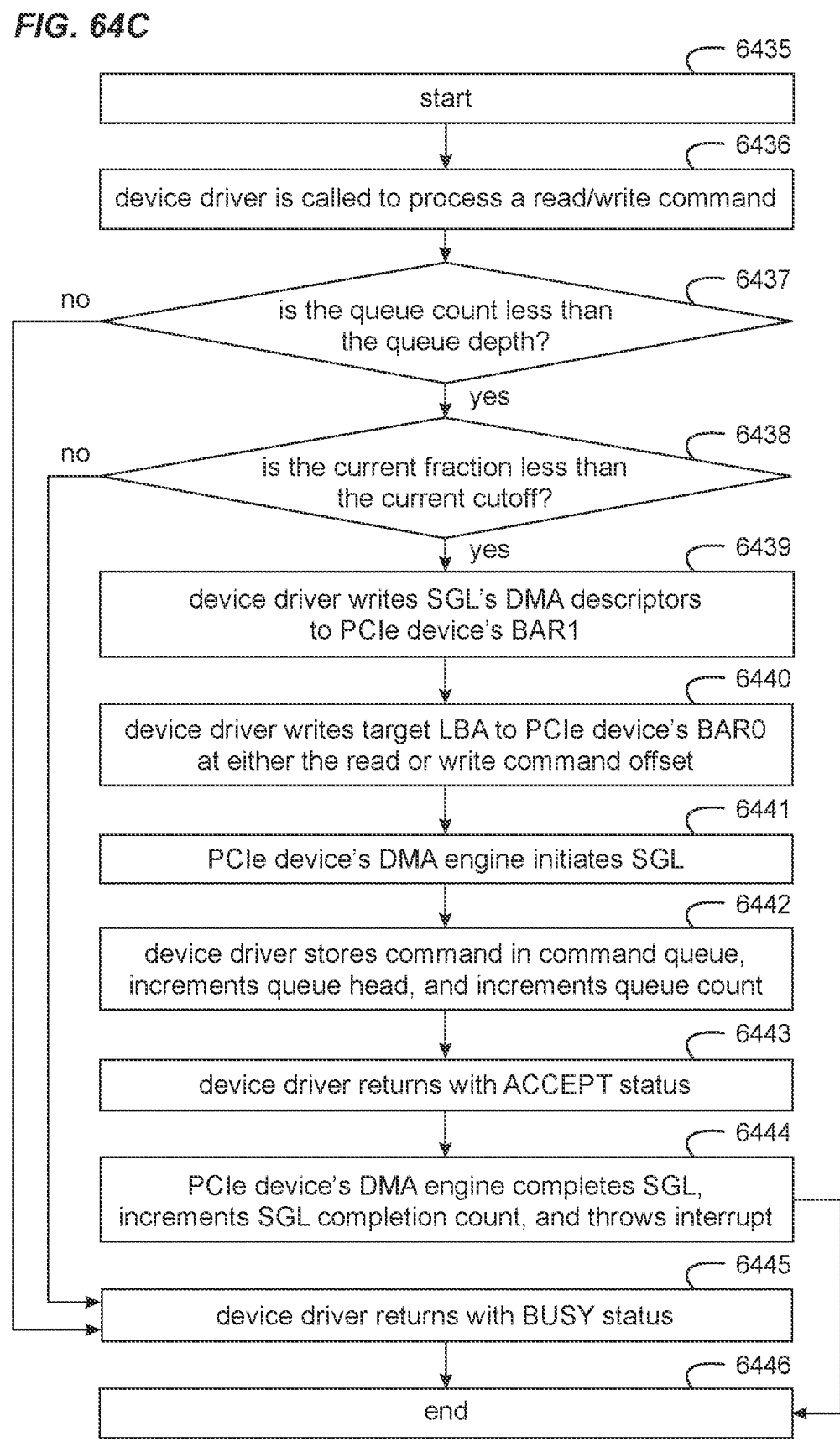

FIG. 64C illustrates a process representative of device driver subroutine which executes a read/write command and includes evaluation of a current fraction which performs as an arbiter of execution according to an embodiment.

Figures 65A, 65B, 65C, 65D, 65E:
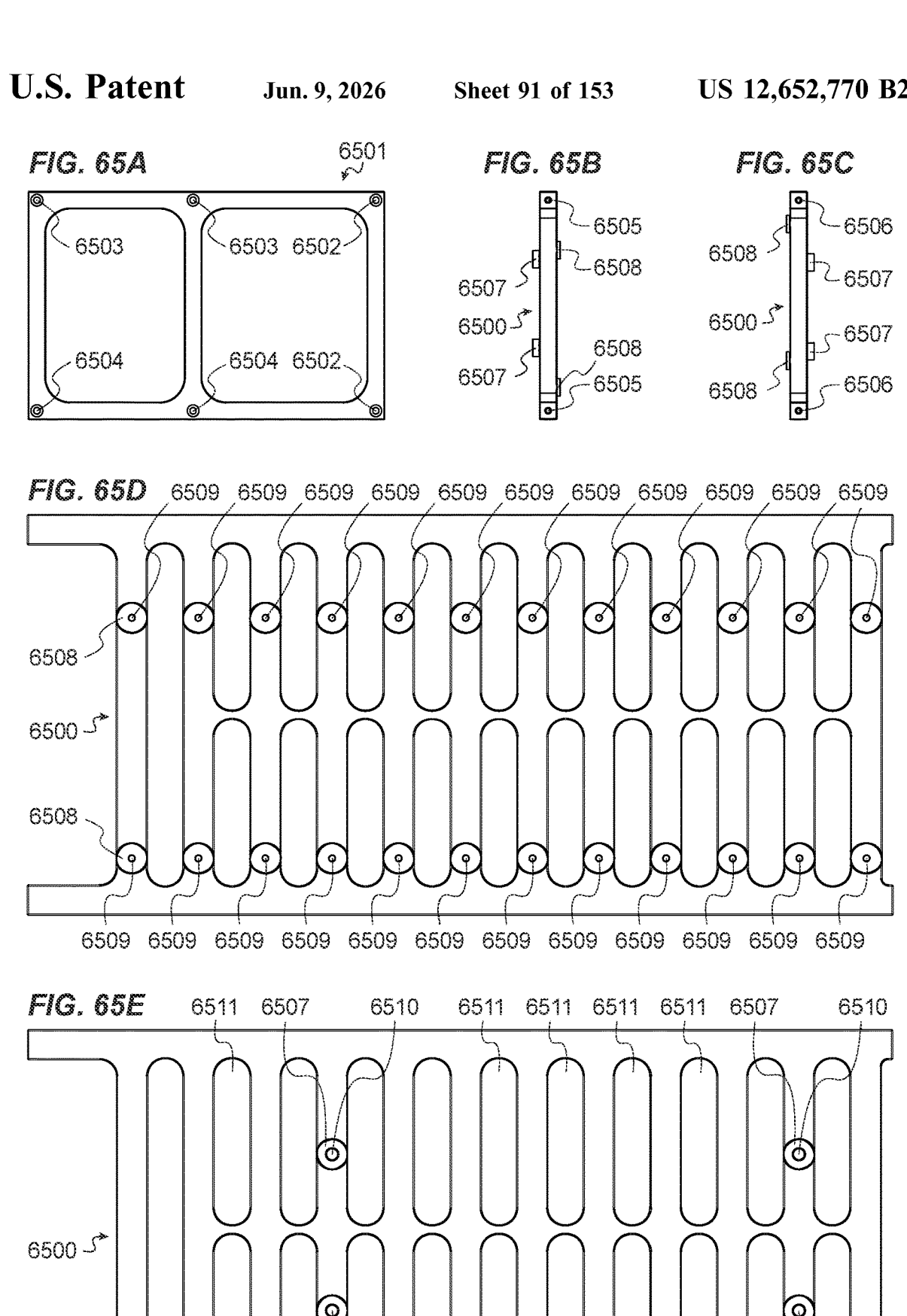

FIG. 65A illustrates an orthographic-view of a cage top according to an embodiment.

FIGS. 65B-65E illustrate orthographic-views of a front backplate according to an embodiment.

FIGS. 66A-66E illustrate various views of a left front locator according to an embodiment.

FIGS. 67A-67E illustrate various views of a right front locator according to an embodiment.

Figures 68A, 68B:
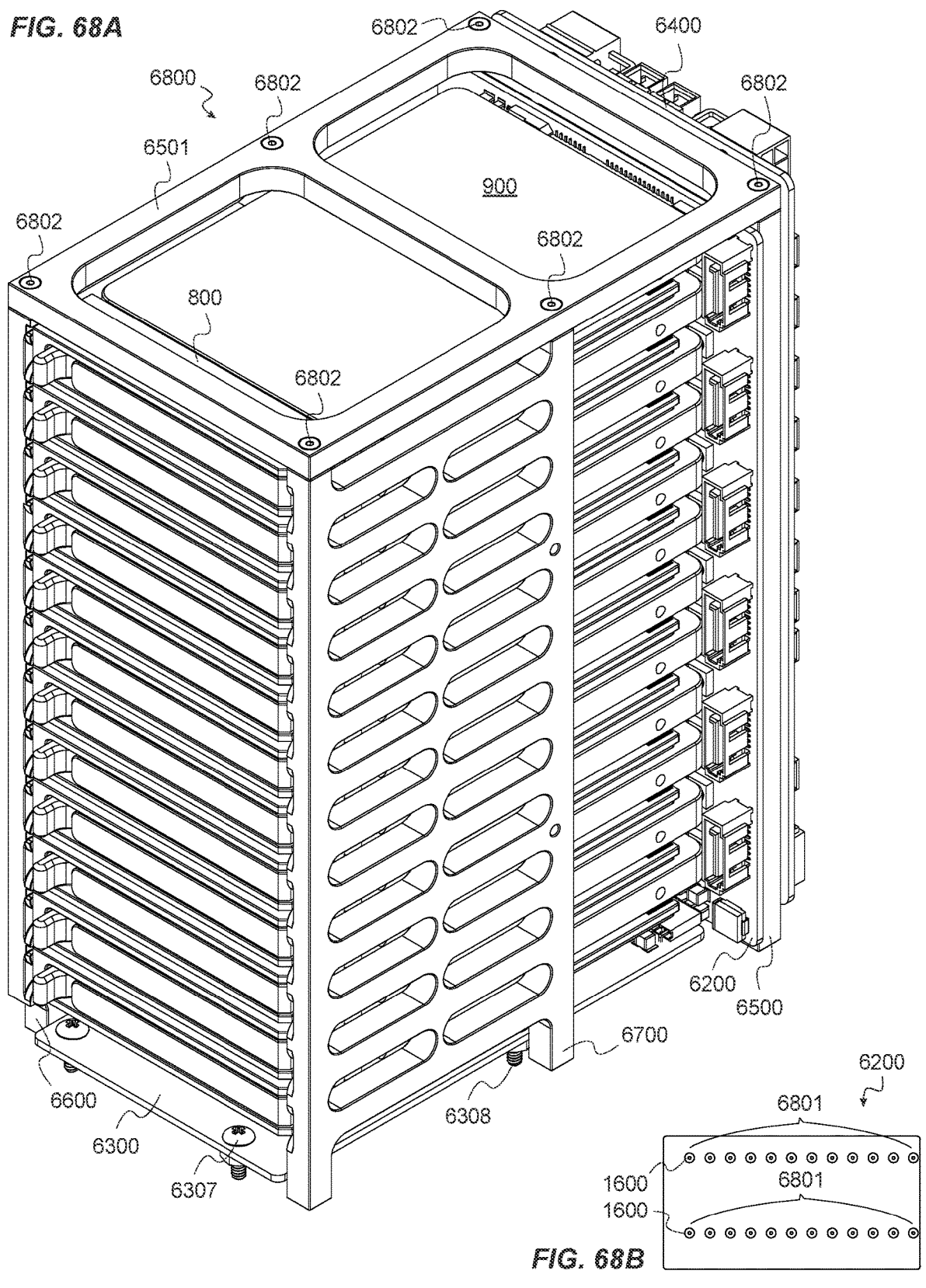

FIG. 68A illustrates a perspective-view of a front cage according to an embodiment.

FIG. 68B illustrates an orthographic-view of a front backplane according to an embodiment.

Figures 69A, 69B:
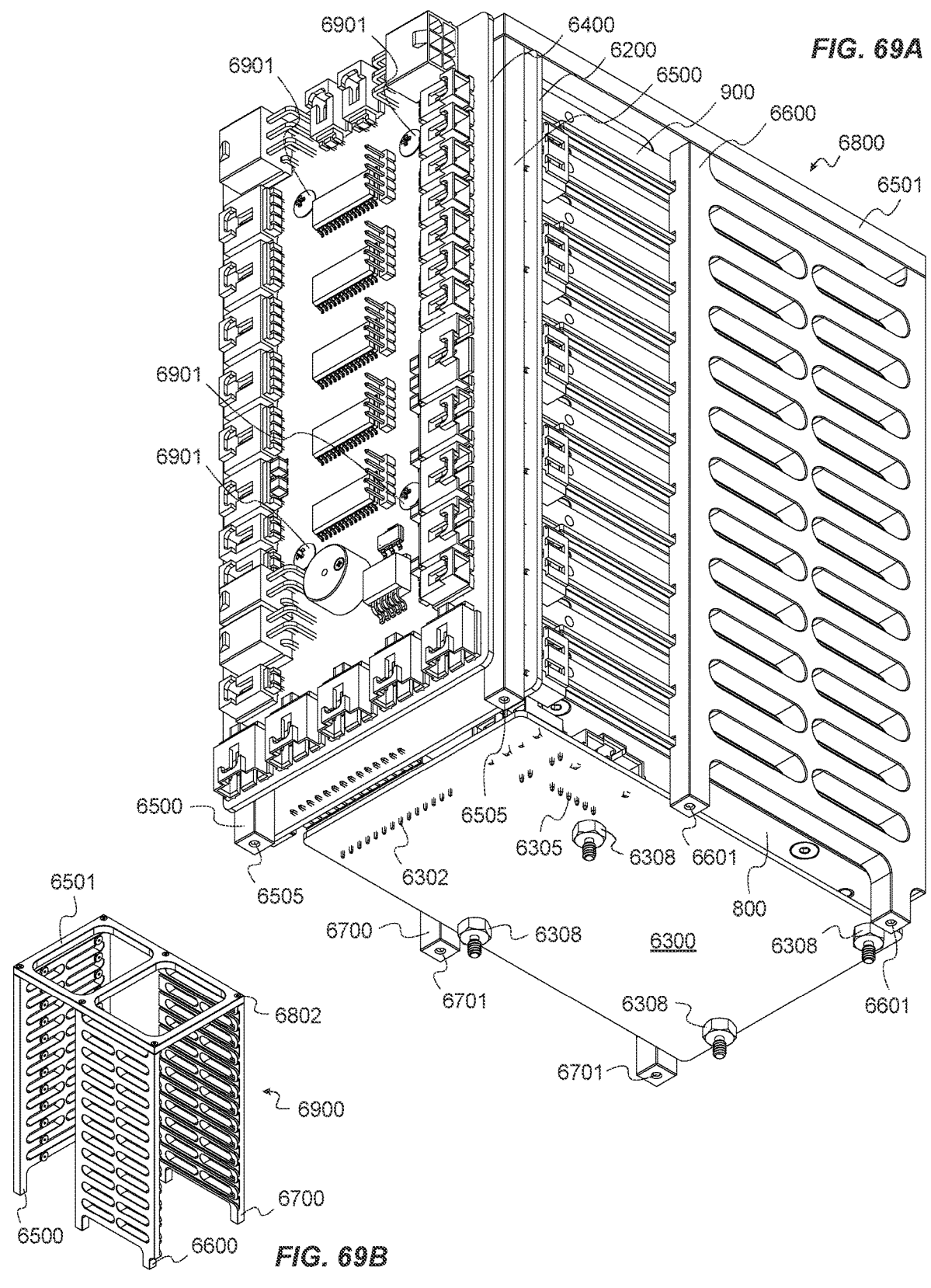

FIG. 69A illustrates a perspective-view of a front cage according to an embodiment.

FIG. 69B illustrates a perspective-view of a front structure according to an embodiment.

Figure 70A:
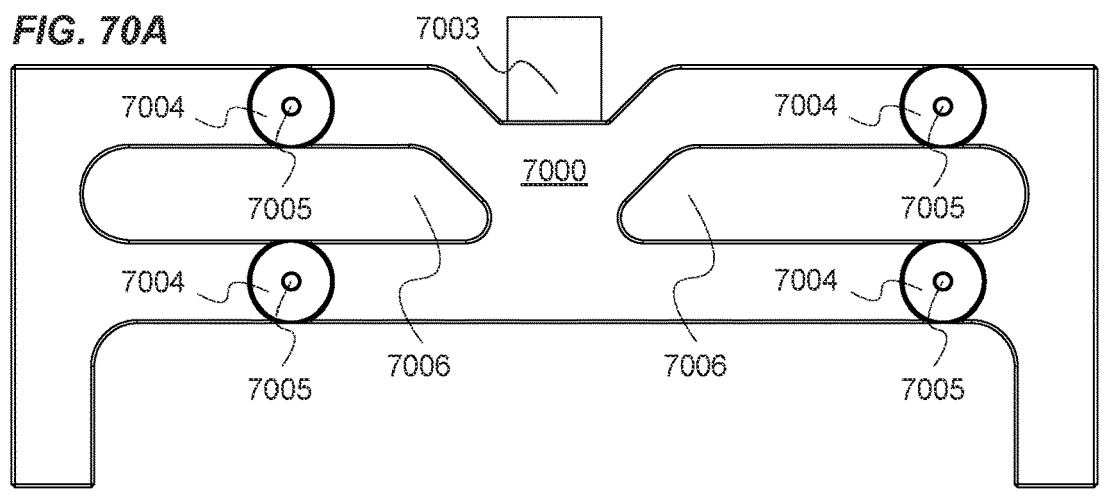

FIG. 70A illustrates an orthographic-view of a rear backplate according to an embodiment.

Figure 70B:
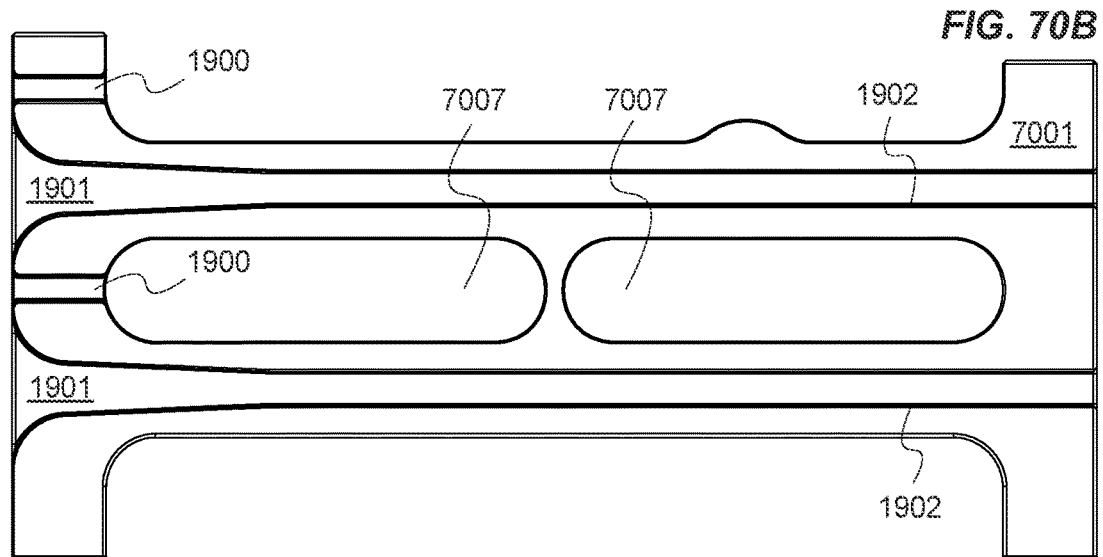
Figure 70C:
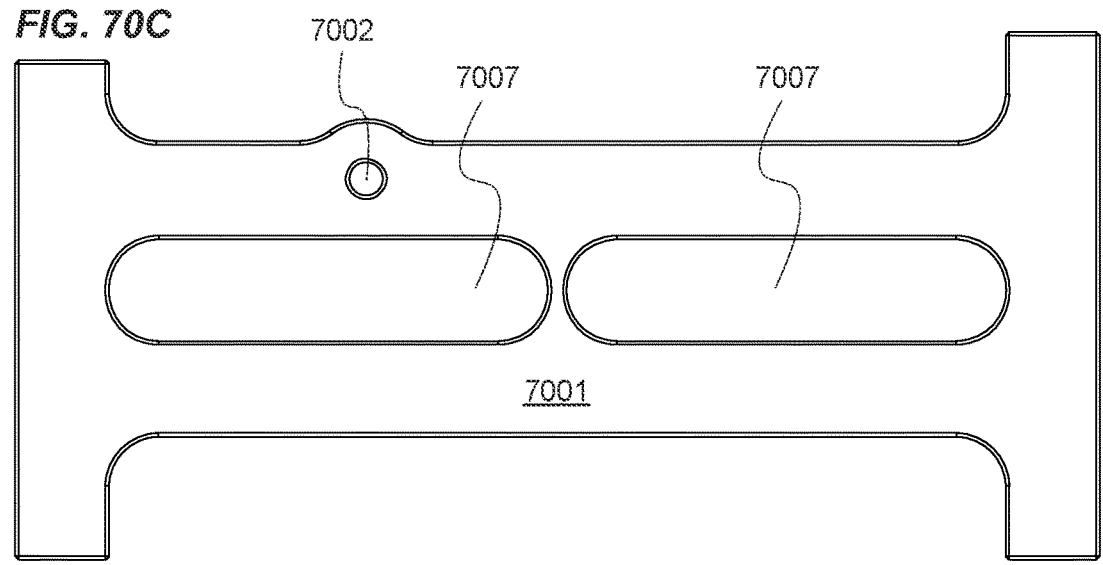

FIGS. 70B and 70C illustrate orthographic-views of a right rear locator according to an embodiment.

Figures 71A, 71B, 71C, 71D, 71E:
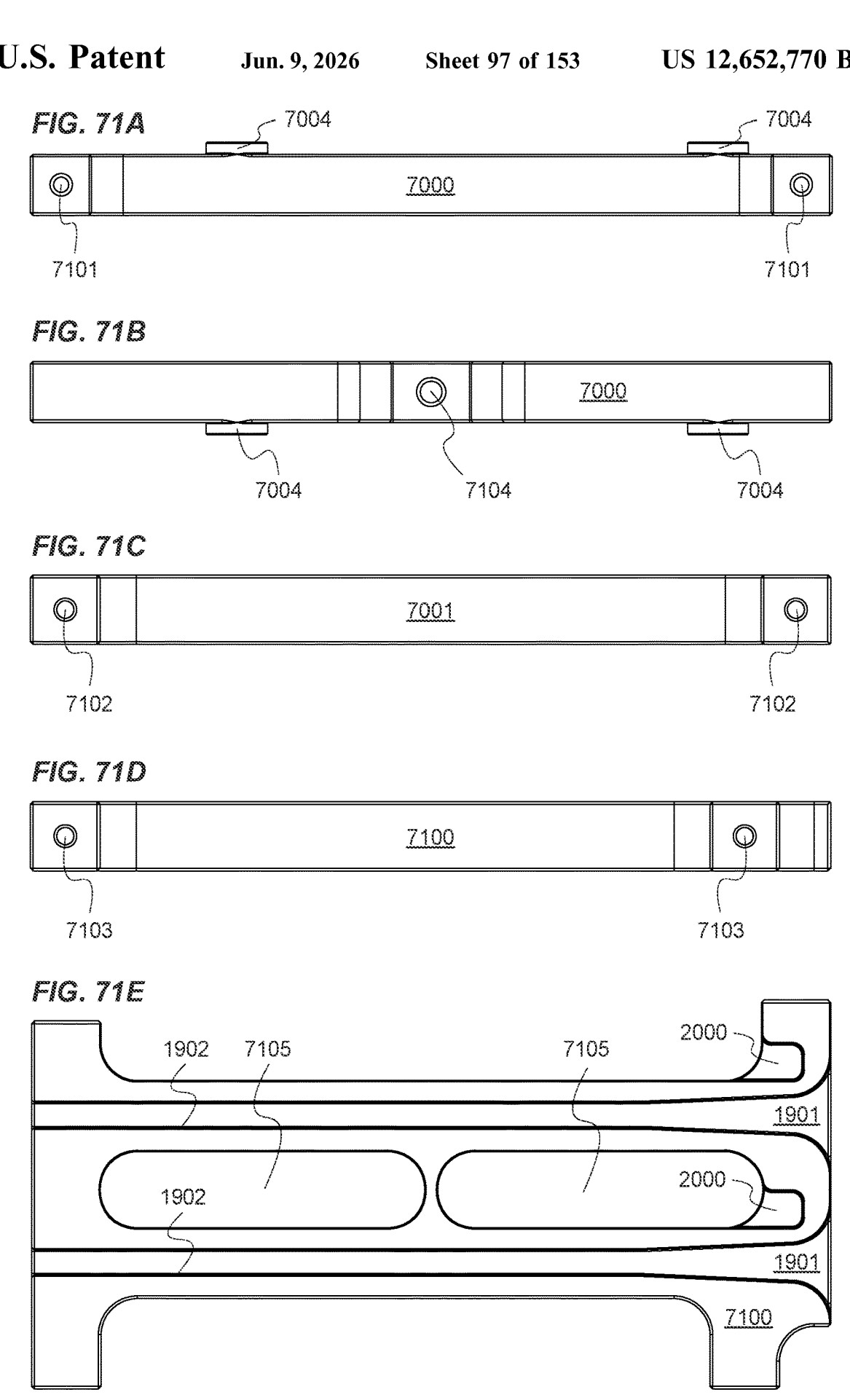

FIGS. 71A and 71B illustrate orthographic-views of a rear backplate according to an embodiment.

FIG. 71C illustrates an orthographic-view of a right rear locator according to an embodiment.

FIGS. 71D and 71E illustrate orthographic-views of a left rear locator according to an embodiment.

Figures 72A, 72B, 72C, 72D, 72E:
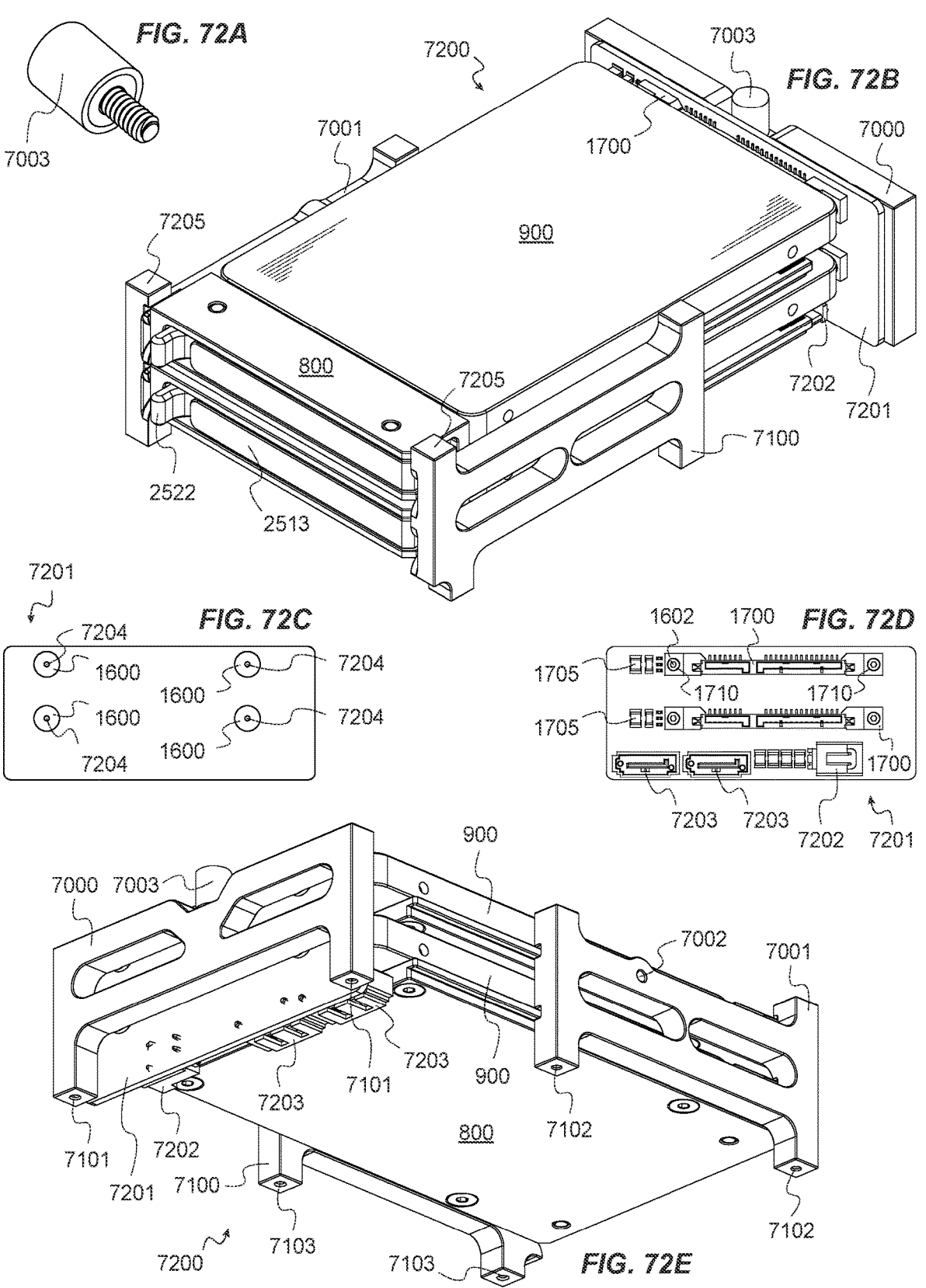

FIG. 72A illustrates a perspective-view of a power bump according to an embodiment.

FIG. 72B illustrates a perspective-view of a back cage according to an embodiment.

FIGS. 72C and 72D illustrate orthographic-views of a rear backplane according to an embodiment.

FIG. 72E illustrates a perspective-view of a back cage according to an embodiment.

FIGS. 73A-73F illustrate six principal orthographic-views of a power pack according to an embodiment.

Figures 74A, 74B, 74C, 74D, 74E:
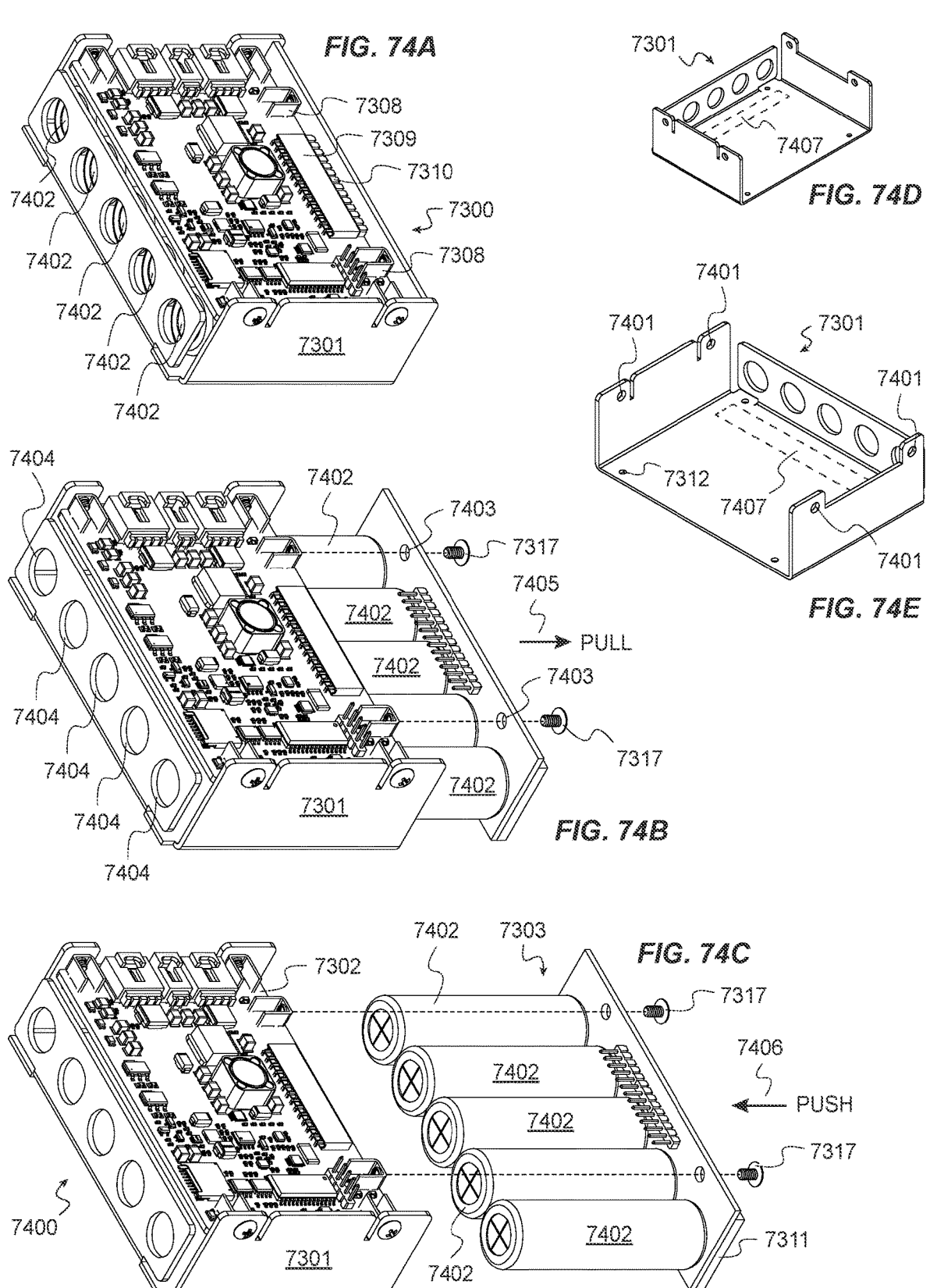

FIGS. 74A-74C illustrate perspective-views of an energy module in various states, including removal from and insertion to a power pack according to an embodiment.

FIGS. 74D and 74E illustrate perspective-views of a super shell according to an embodiment.

Figure 74F:
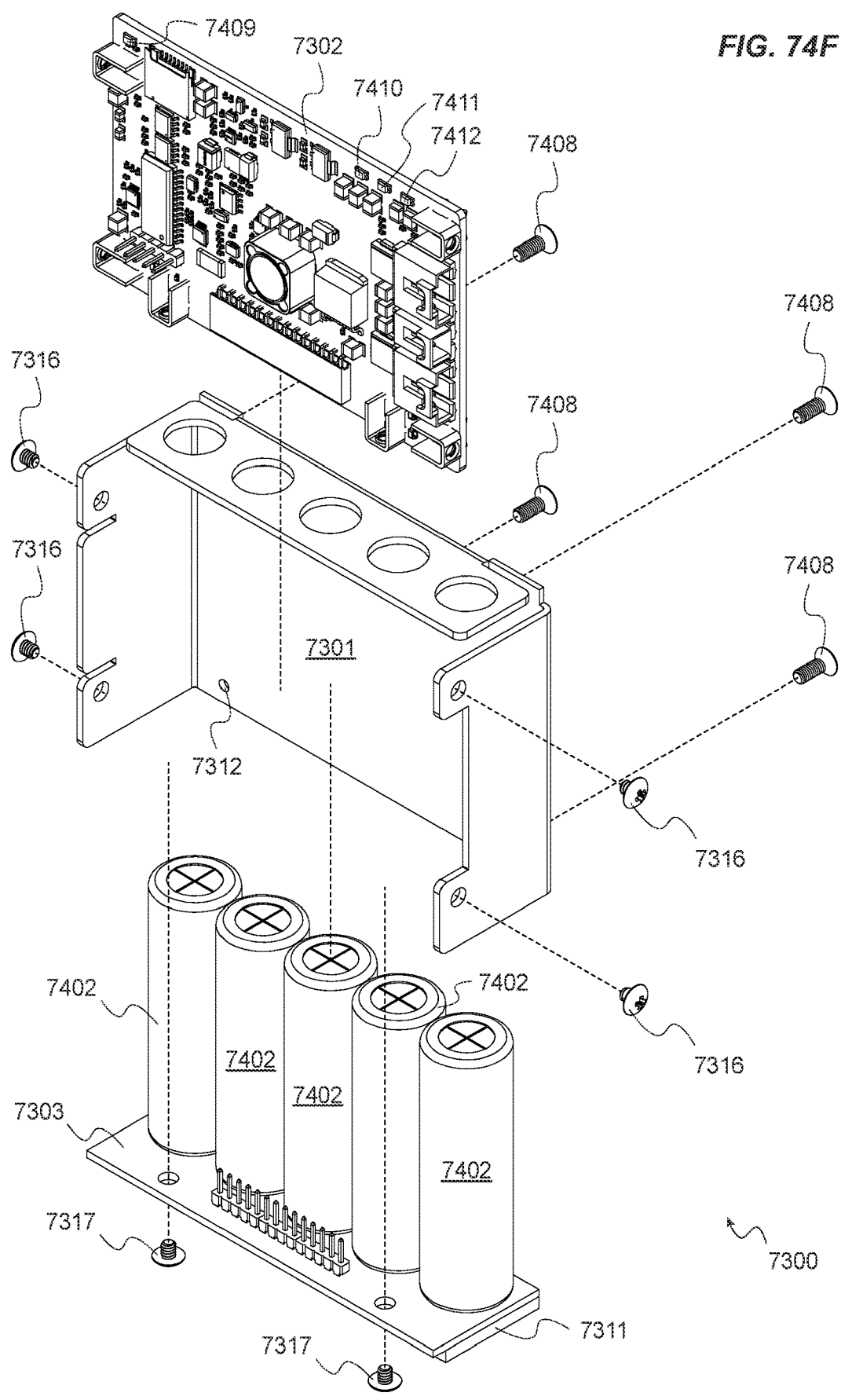

FIG. 74F illustrates an exploded-view of a power pack according to an embodiment.

FIG. 75 illustrates an embodiment of a power pack.

Figures 76A, 76B, 76C, 76D, 76E:
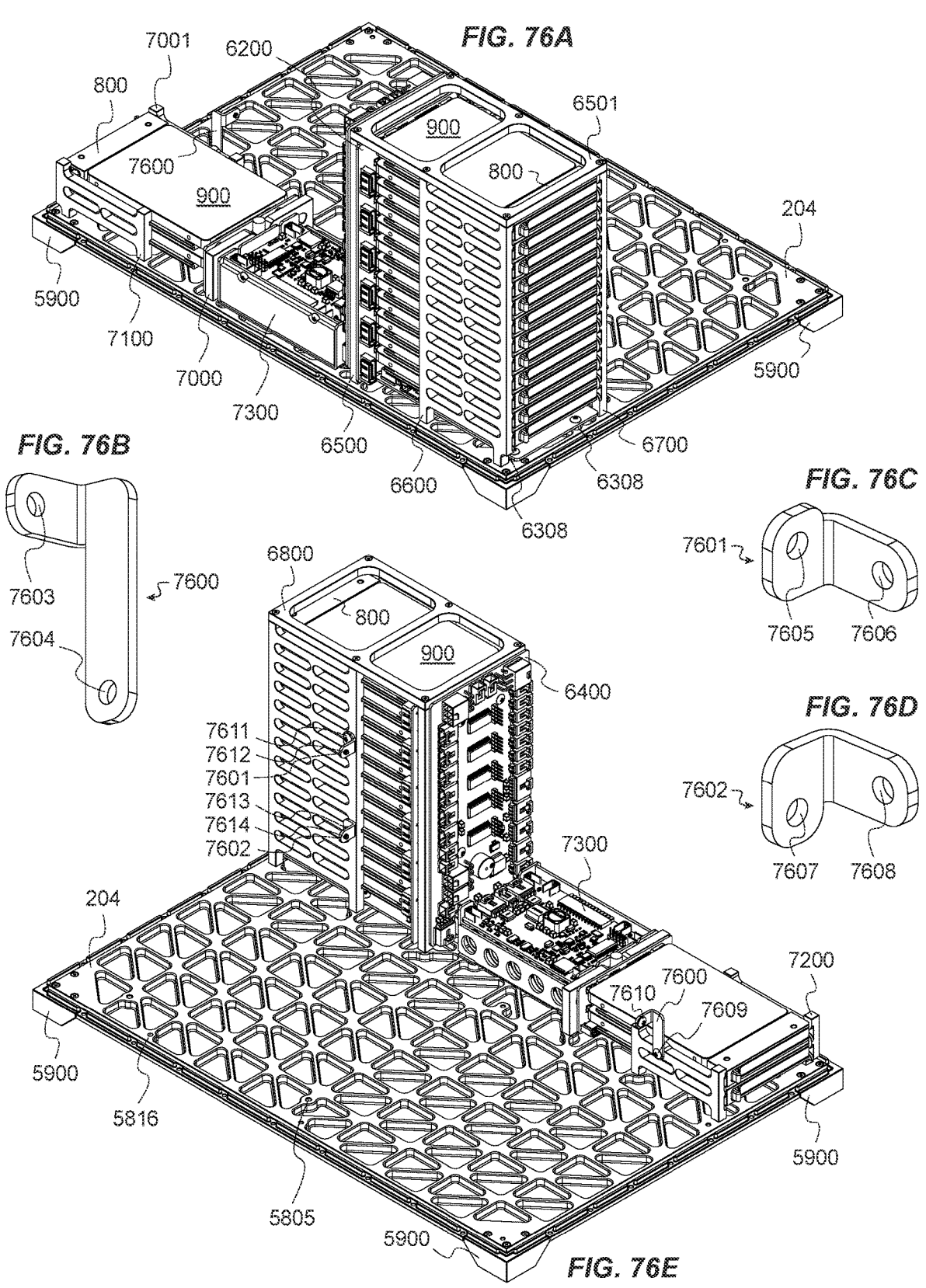

FIG. 76A illustrates a top, front, left perspective-view of a bottom base with the following attached: a front cage, power pack, back cage, angle brackets, and truss head screws according to an embodiment.

FIGS. 76B-76D illustrate perspective-views of angle brackets according to an embodiment.

FIG. 76E illustrates a top, back, right perspective-view of a bottom base with the following attached: a front cage, power pack, back cage, angle brackets, and truss head screws according to an embodiment.

Figure 77:
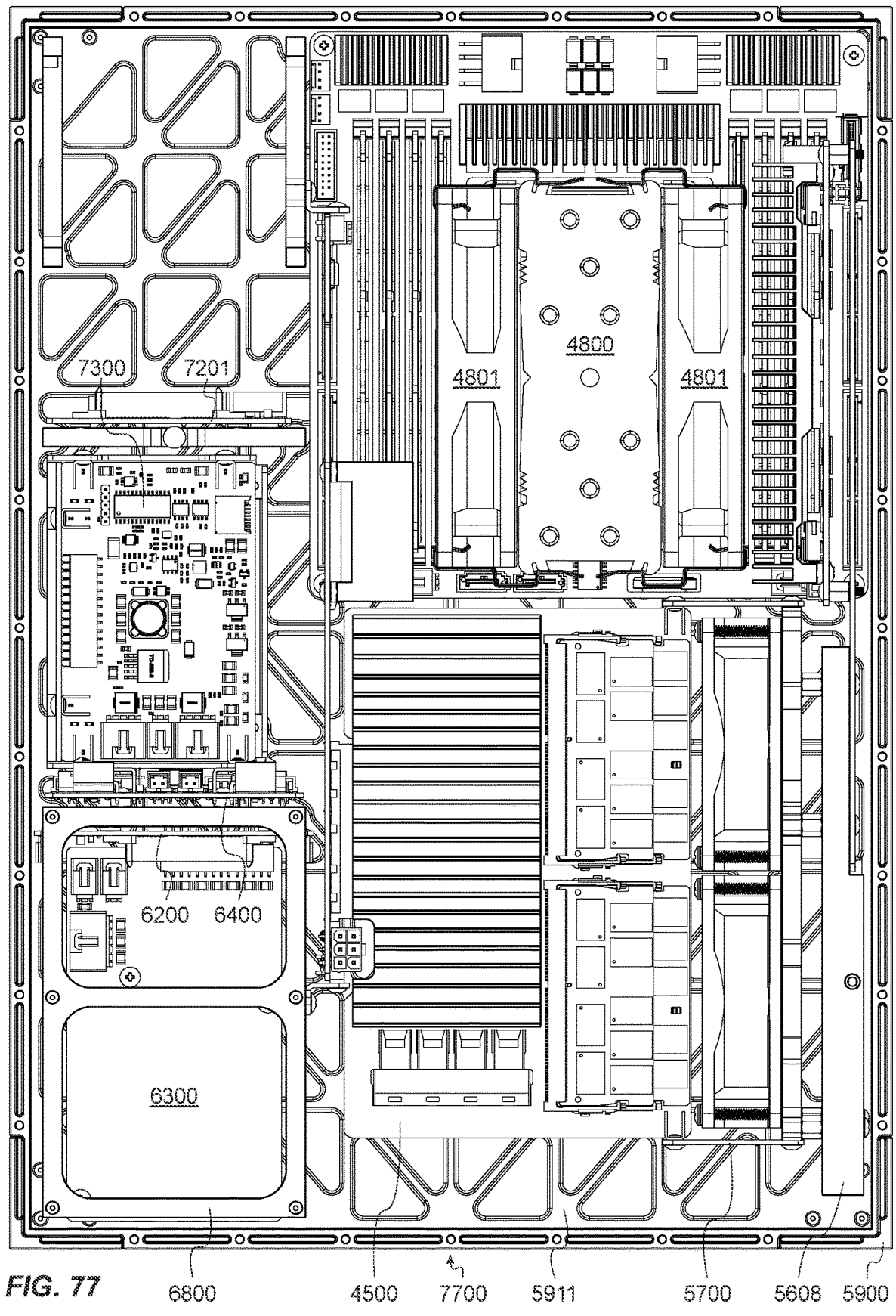

FIG. 77 illustrates a top orthographic-view of a bottom build according to an embodiment.

FIGS. 78A-78F illustrate six principal orthographic-views of a side panel according to an embodiment.

FIG. 78G illustrates a perspective-view of a dowel pin according to an embodiment.

FIGS. 79A-79D illustrate orthographic-views of a front lower panel according to an embodiment.

Figures 80A, 80B, 80C, 80D, 80E, 80F:
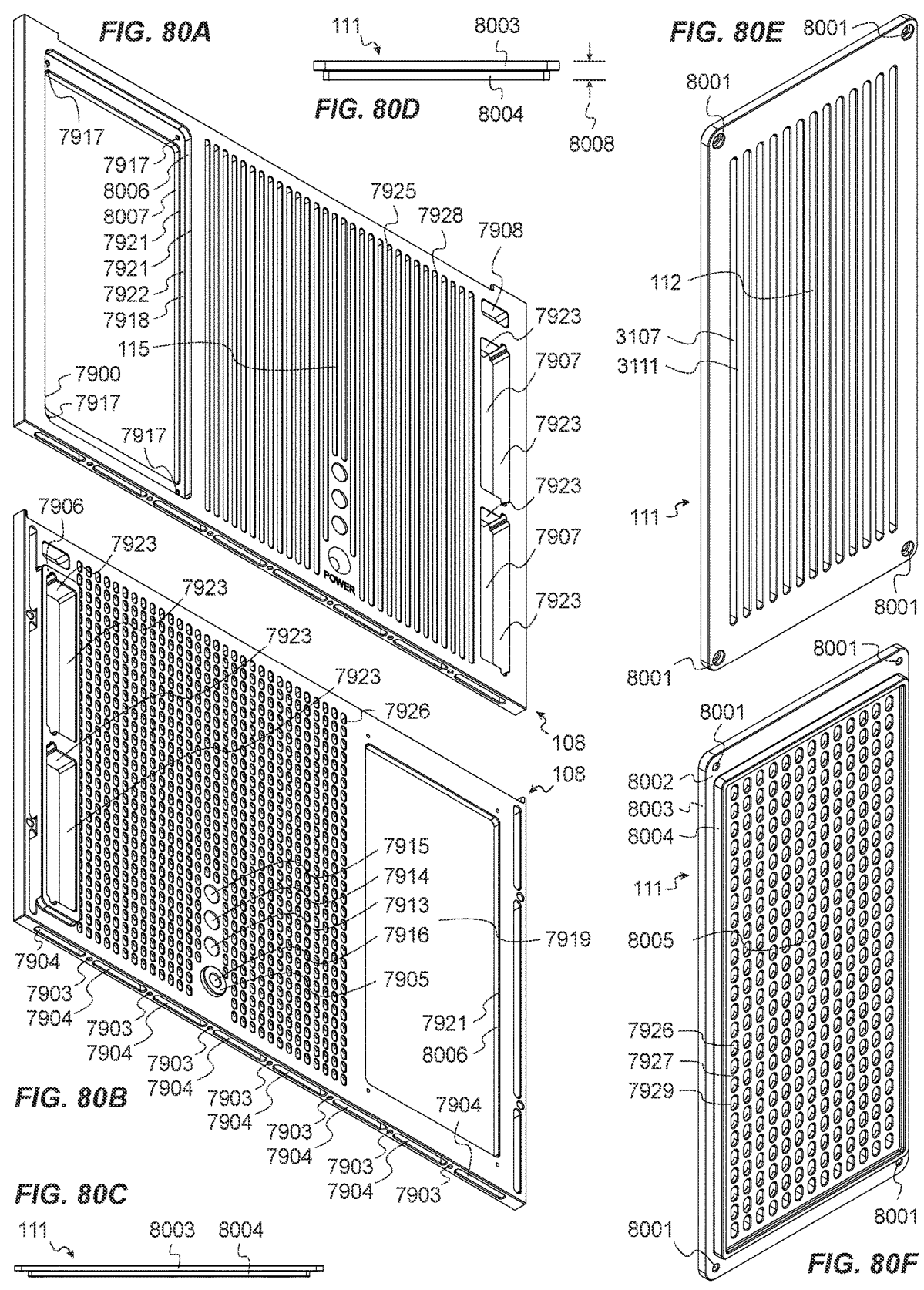

FIGS. 80A and 80B illustrate perspective-views of a front lower panel according to an embodiment.

FIGS. 80C-80F illustrate various views of a front hatch according to an embodiment.

Figures 81A, 81B, 81C, 81D:
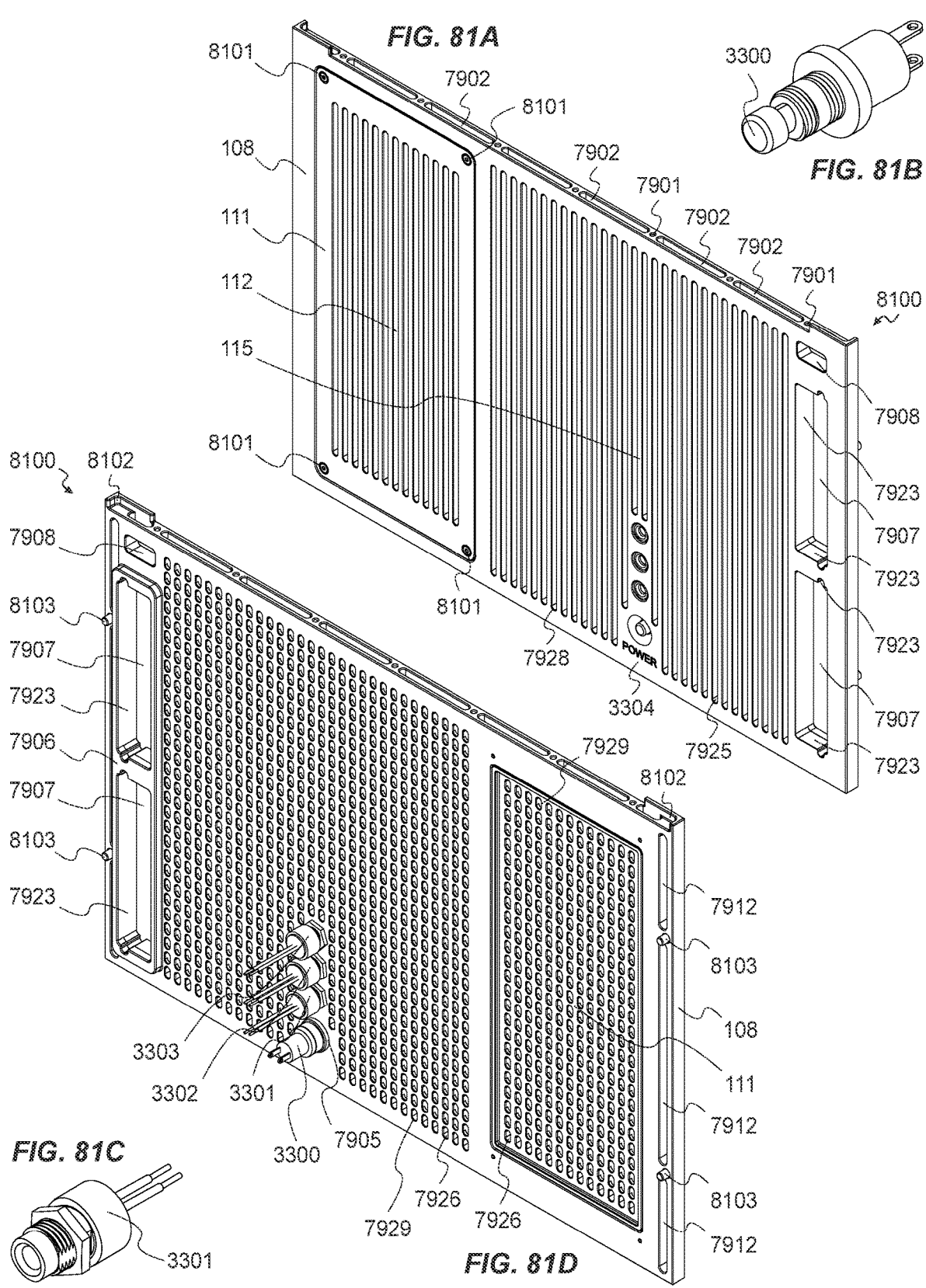

FIG. 81A illustrates a perspective-view of a front lower assembly according to an embodiment.

FIG. 81B illustrates a perspective-view of a power button according to an embodiment.

FIG. 81C illustrates a perspective-view of a green LED according to an embodiment.

FIG. 81D illustrates a perspective-view of a front lower assembly according to an embodiment.

FIGS. 82A-82D illustrate orthographic-views of a back lower panel according to an embodiment.

Figures 83A, 83B, 83C, 83D, 83E, 83F:
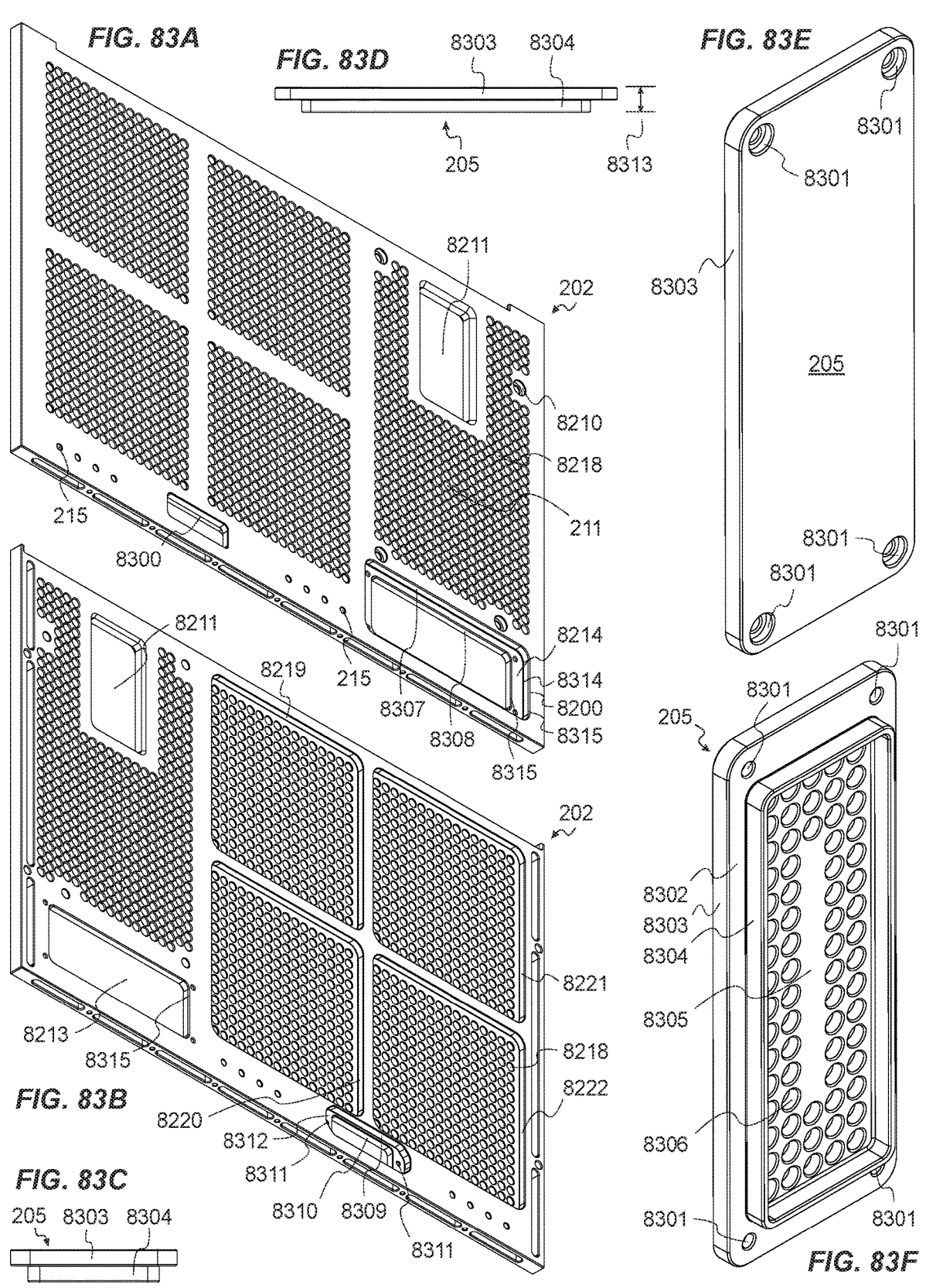

FIGS. 83A and 83B illustrate perspective-views of a back lower panel according to an embodiment.

FIGS. 83C-83F illustrate various views of a back hatch according to an embodiment.

FIGS. 84A-84C illustrate various views of a power supply according to an embodiment.

Figures 85A, 85B, 85C:
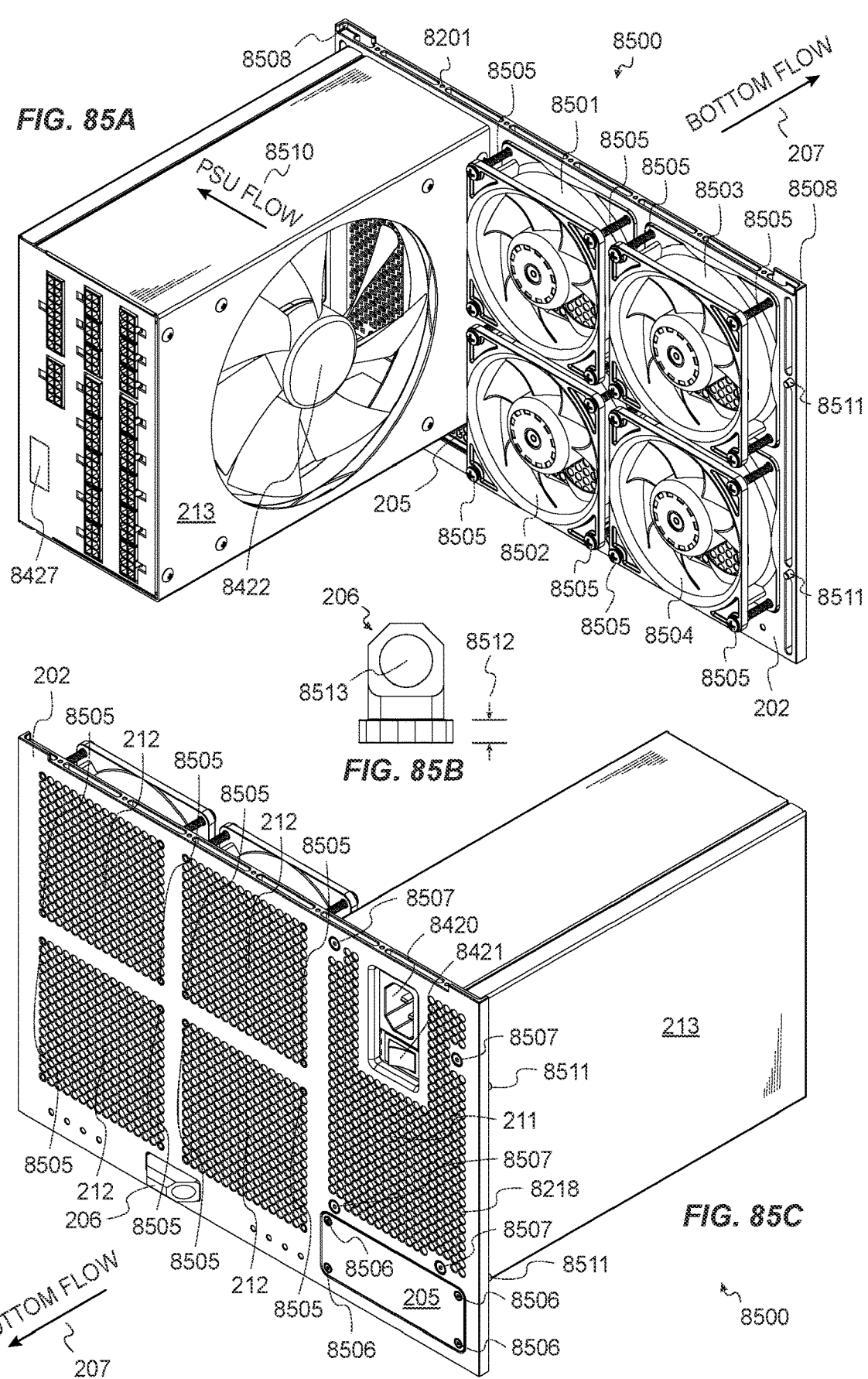

FIG. 85A illustrates a top, front, right perspective-view of a back lower assembly according to an embodiment.

FIG. 85B illustrates an orthographic-view of a security hatch according to an embodiment.

FIG. 85C illustrates a top, back, left perspective-view of a back lower assembly according to an embodiment.

Figures 86A, 86B, 86C, 86D:
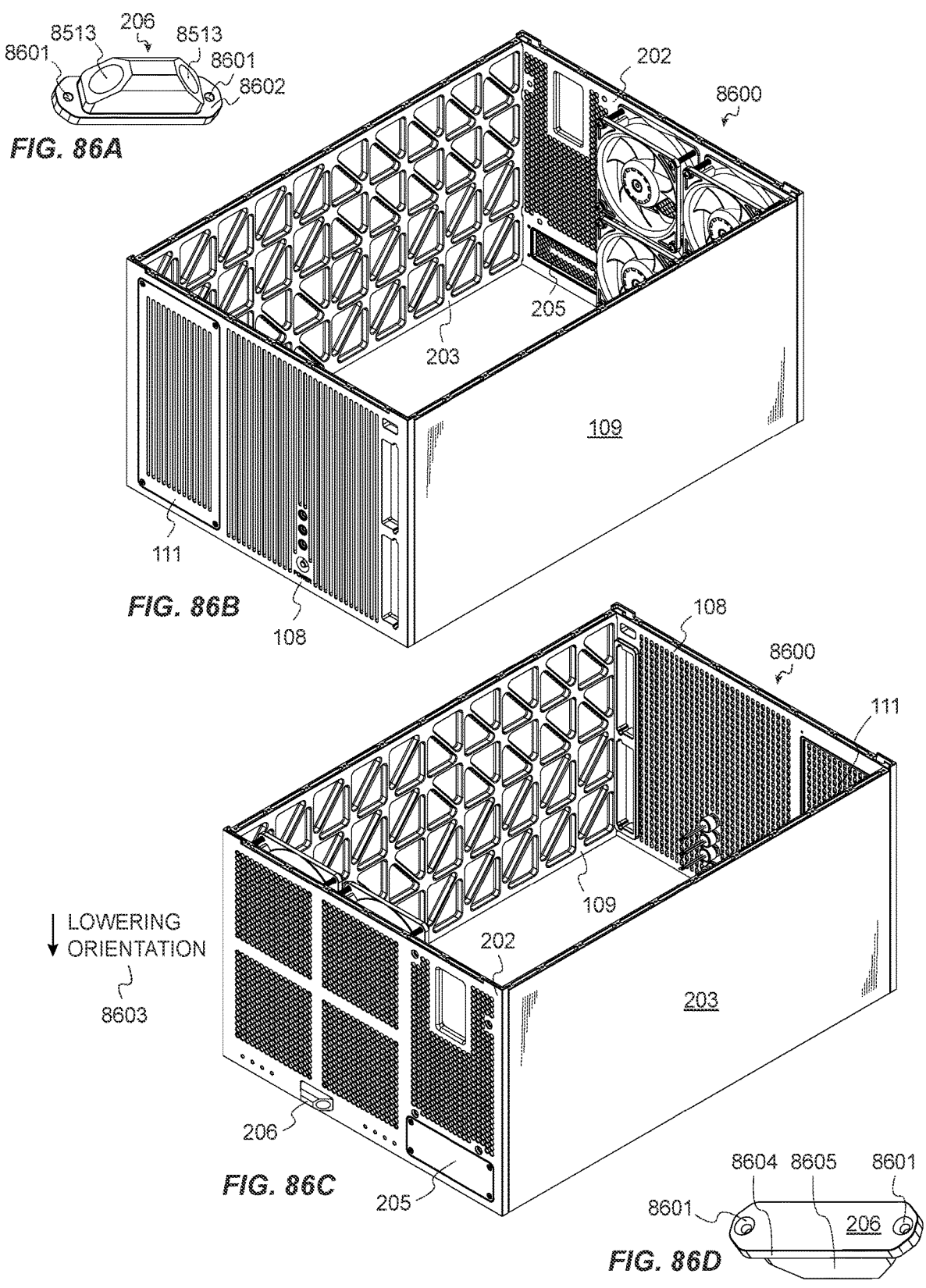

FIG. 86A illustrates a perspective-view of a security hatch according to an embodiment.

FIG. 86B illustrates a top, front, right perspective-view of a middle build according to an embodiment.

FIG. 86C illustrates a top, back, left perspective-view of a middle build according to an embodiment.

FIG. 86D illustrates a perspective-view of a security hatch according to an embodiment.

Figures 86E, 86F:
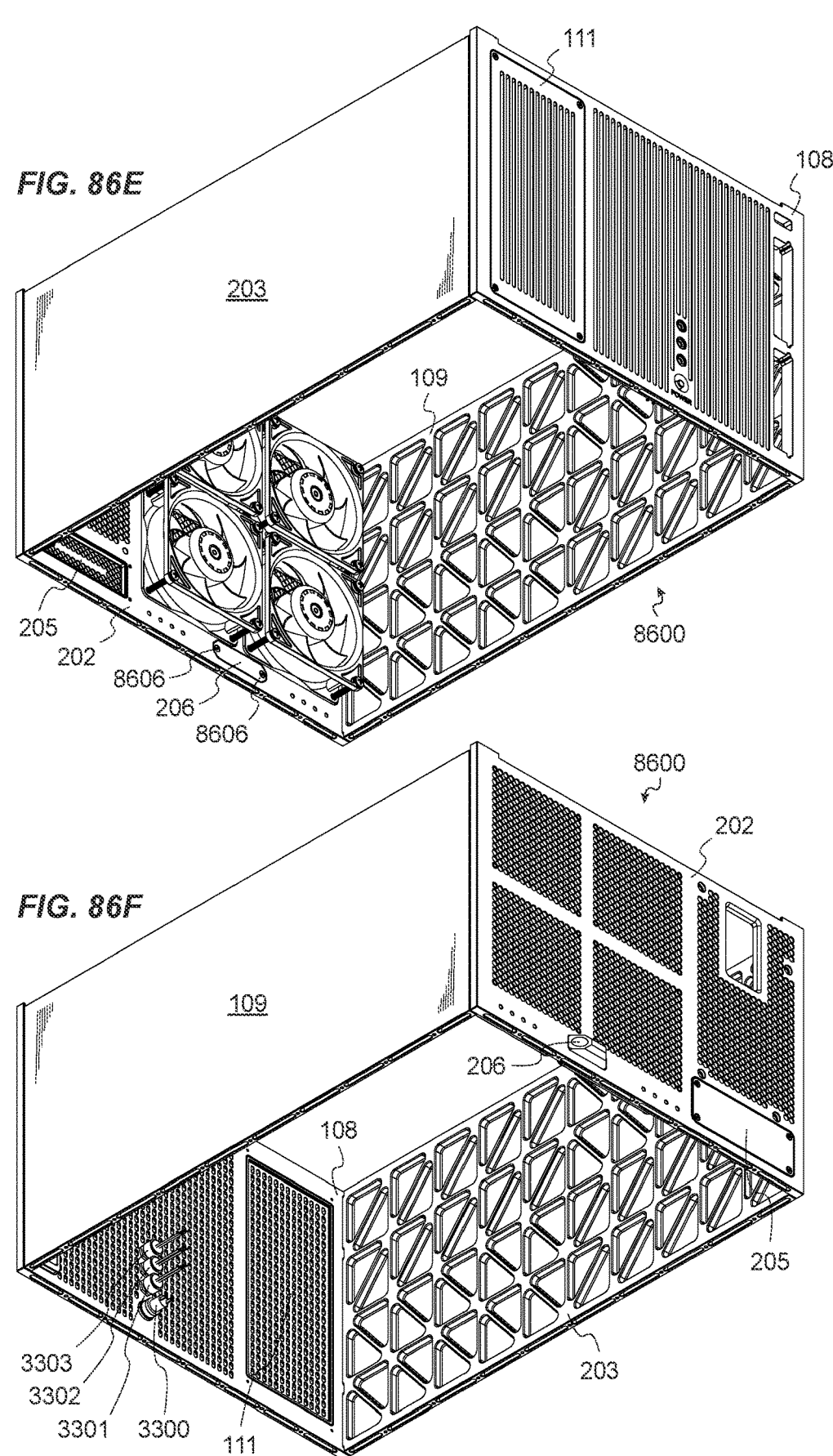

FIG. 86E illustrates a bottom, front, left perspective-view of a middle build according to an embodiment.

FIG. 86F illustrates a bottom, back, right perspective-view of a middle build according to an embodiment.

Figures 87A, 87B, 87C, 87D, 87E, 87F:
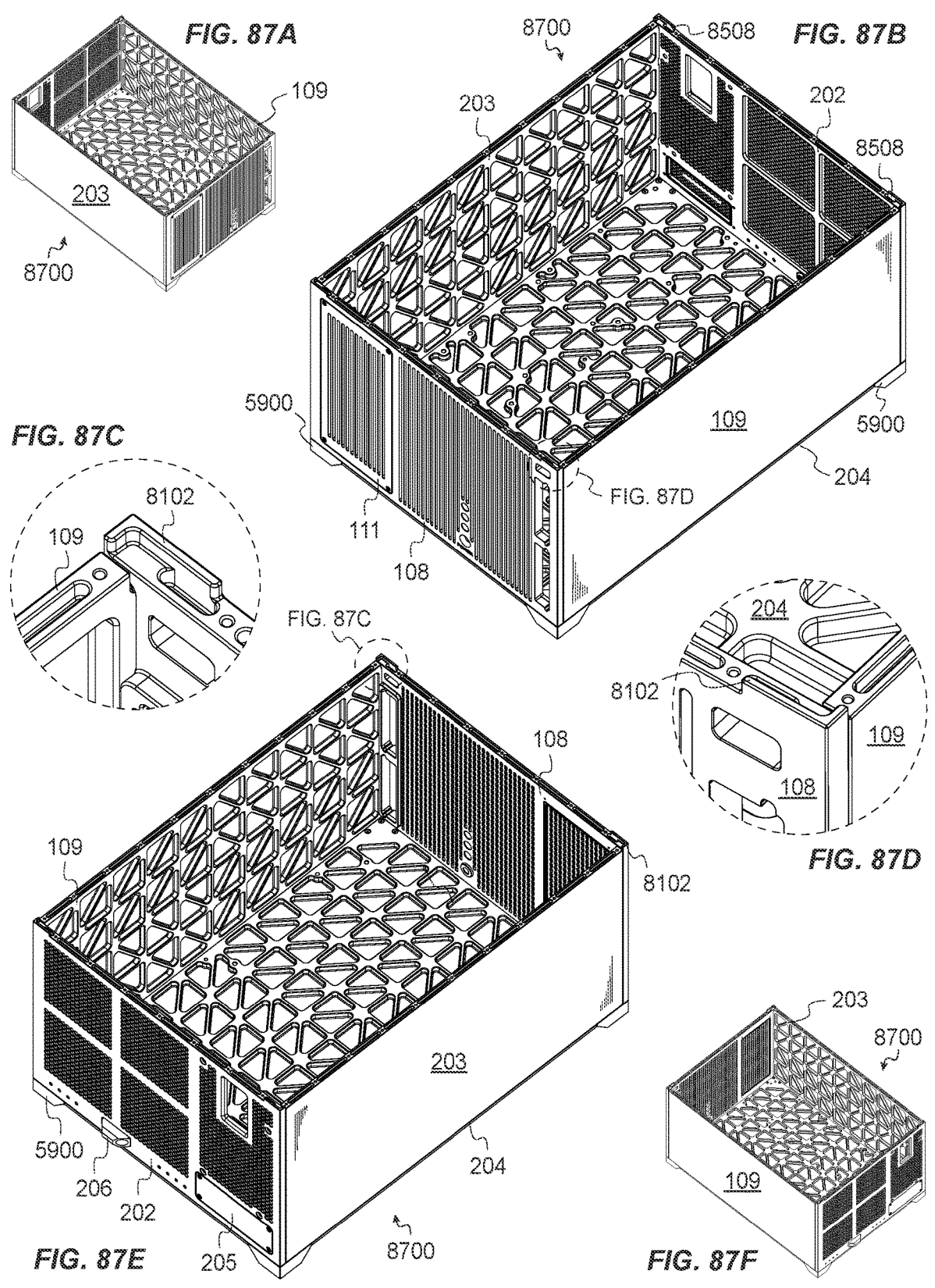

FIG. 87A illustrates a top, front, left perspective-view of a partial exoskeleton according to an embodiment.

FIG. 87B illustrates a top, front, right perspective-view of a partial exoskeleton according to an embodiment.

FIGS. 87C and 87D illustrate detail-views of a partial exoskeleton according to an embodiment.

FIG. 87E illustrates a top, back, left perspective-view of a partial exoskeleton according to an embodiment.

FIG. 87F illustrates a top, back, right perspective-view of a partial exoskeleton according to an embodiment.

Figure 88A:
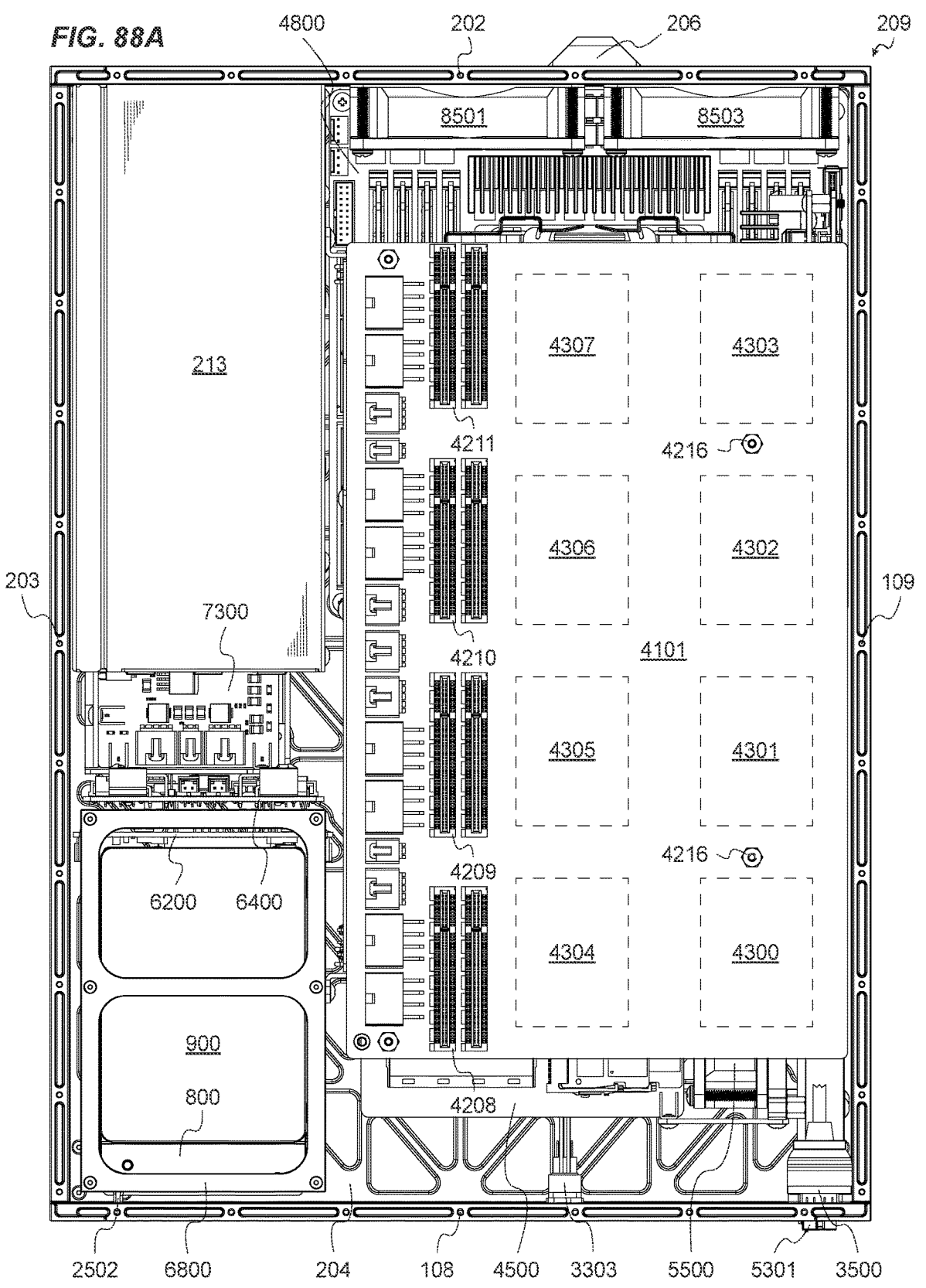

FIG. 88A illustrates a top orthographic-view of a bottom section with various components removed for the purpose of interior visibility according to an embodiment.

Figure 88B:
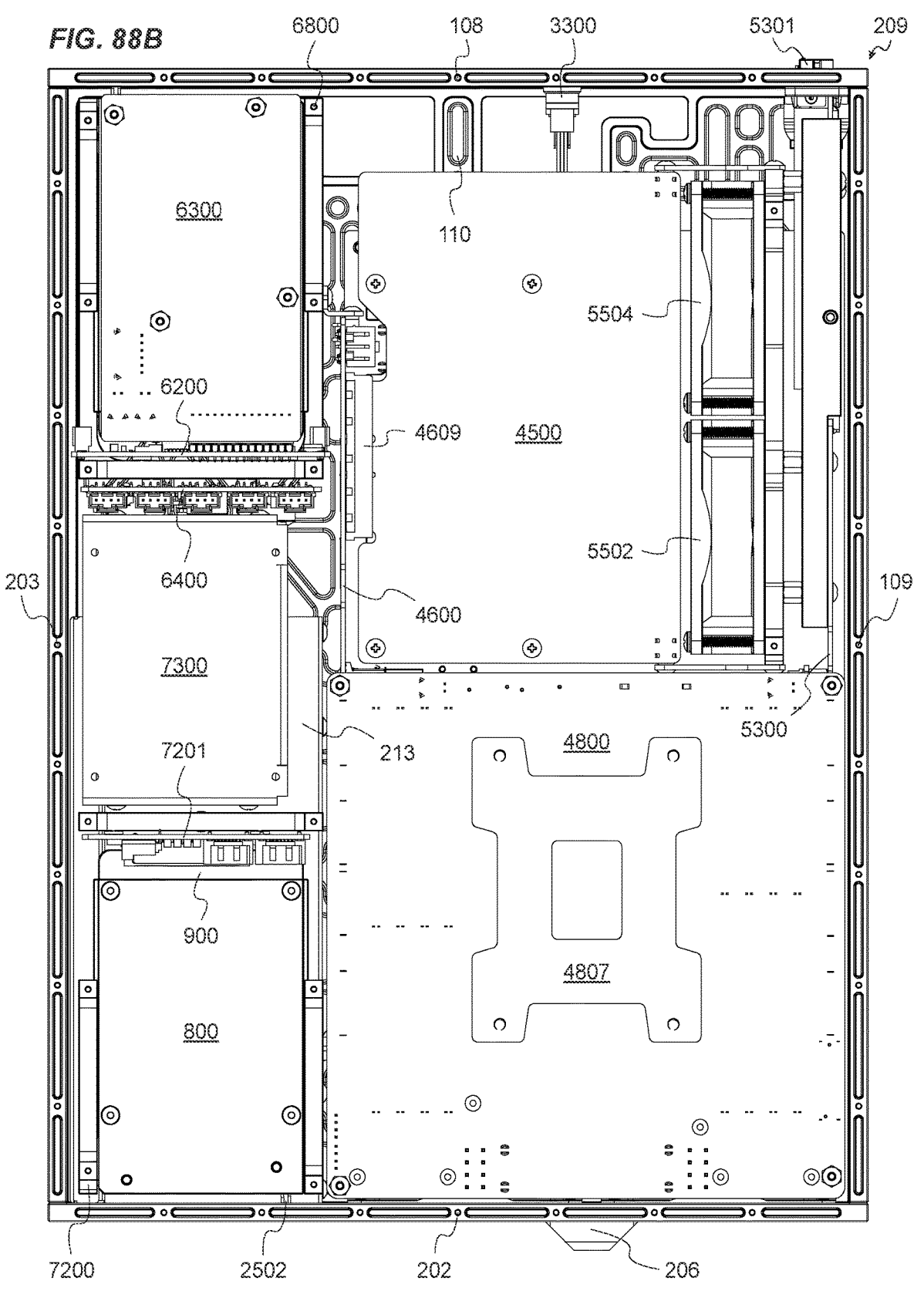

FIG. 88B illustrates a bottom orthographic-view of a bottom section with various components removed for the purpose of interior visibility according to an embodiment.

Figure 88C:
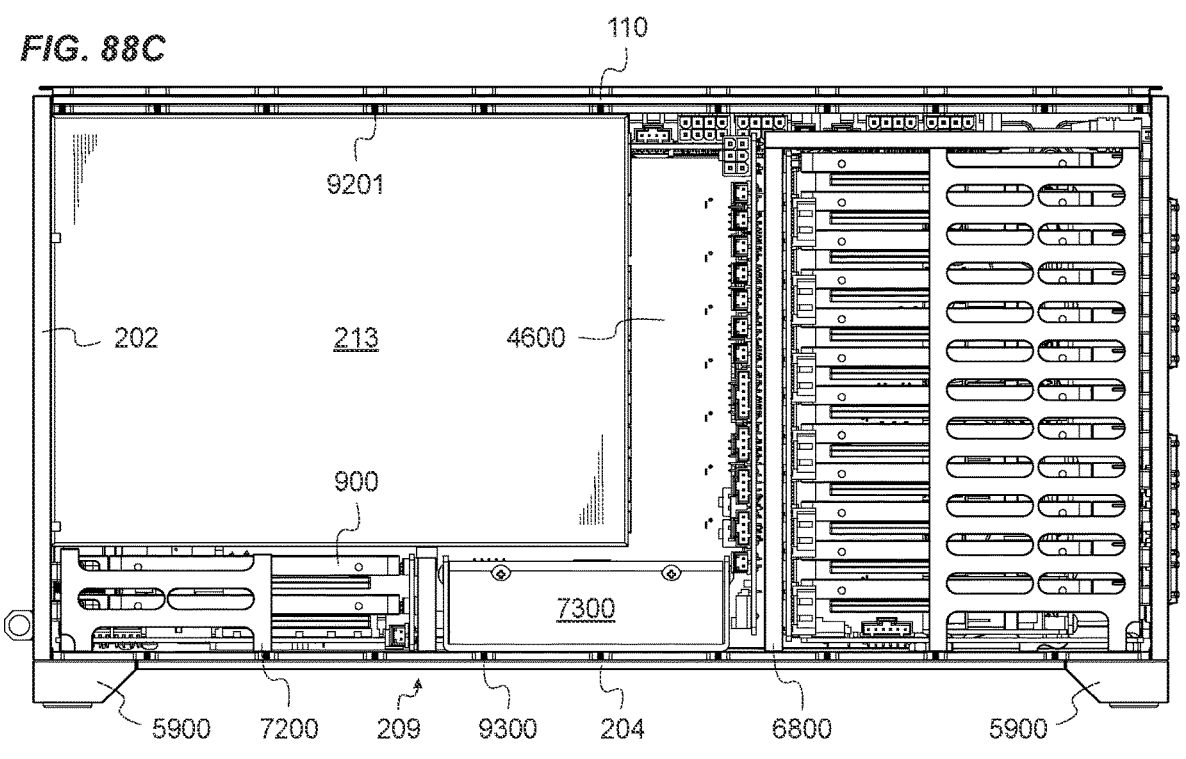

FIG. 88C illustrates a left orthographic-view of a bottom section with various components removed for the purpose of interior visibility according to an embodiment.

Figure 88D:
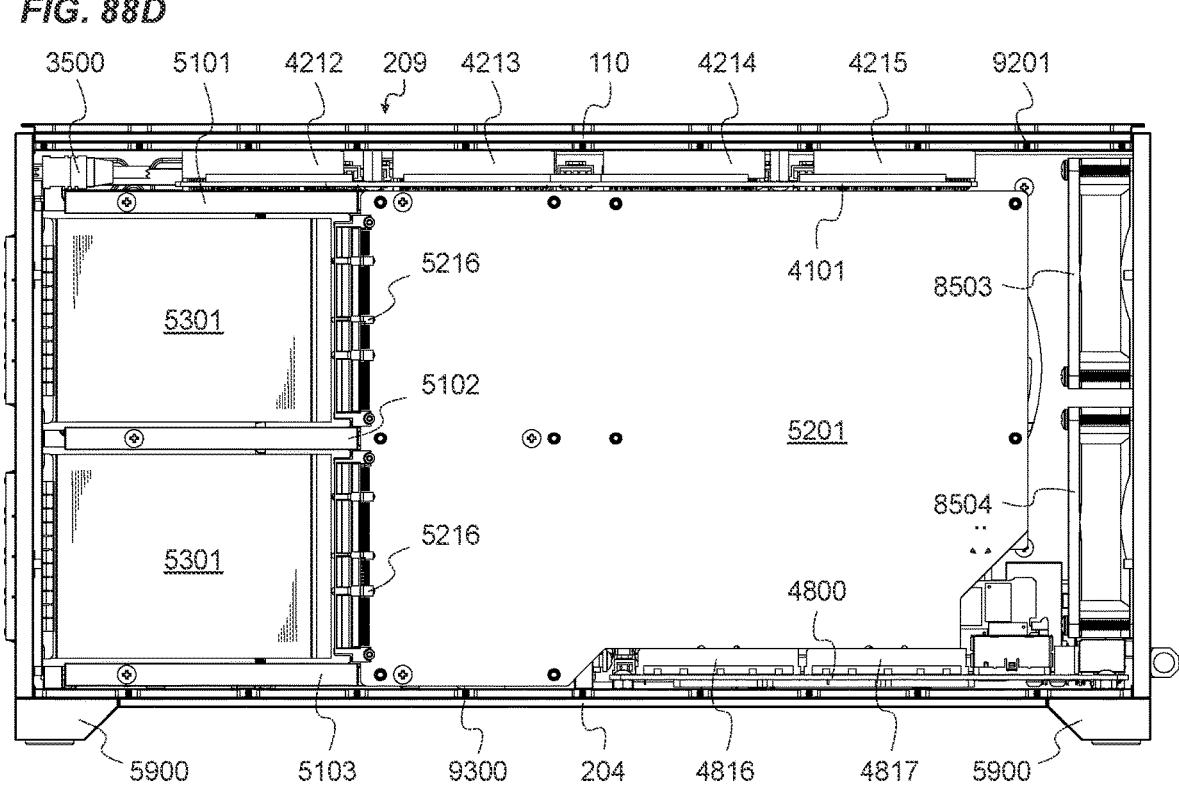

FIG. 88D illustrates a right orthographic-view of a bottom section with various components removed for the purpose of interior visibility according to an embodiment.

FIG. 88E illustrates a front orthographic-view of a bottom section with various components removed for the purpose of interior visibility according to an embodiment.

FIG. 88F illustrates a back orthographic-view of a bottom section with various components removed for the purpose of interior visibility according to an embodiment.

Figures 89A, 89B:
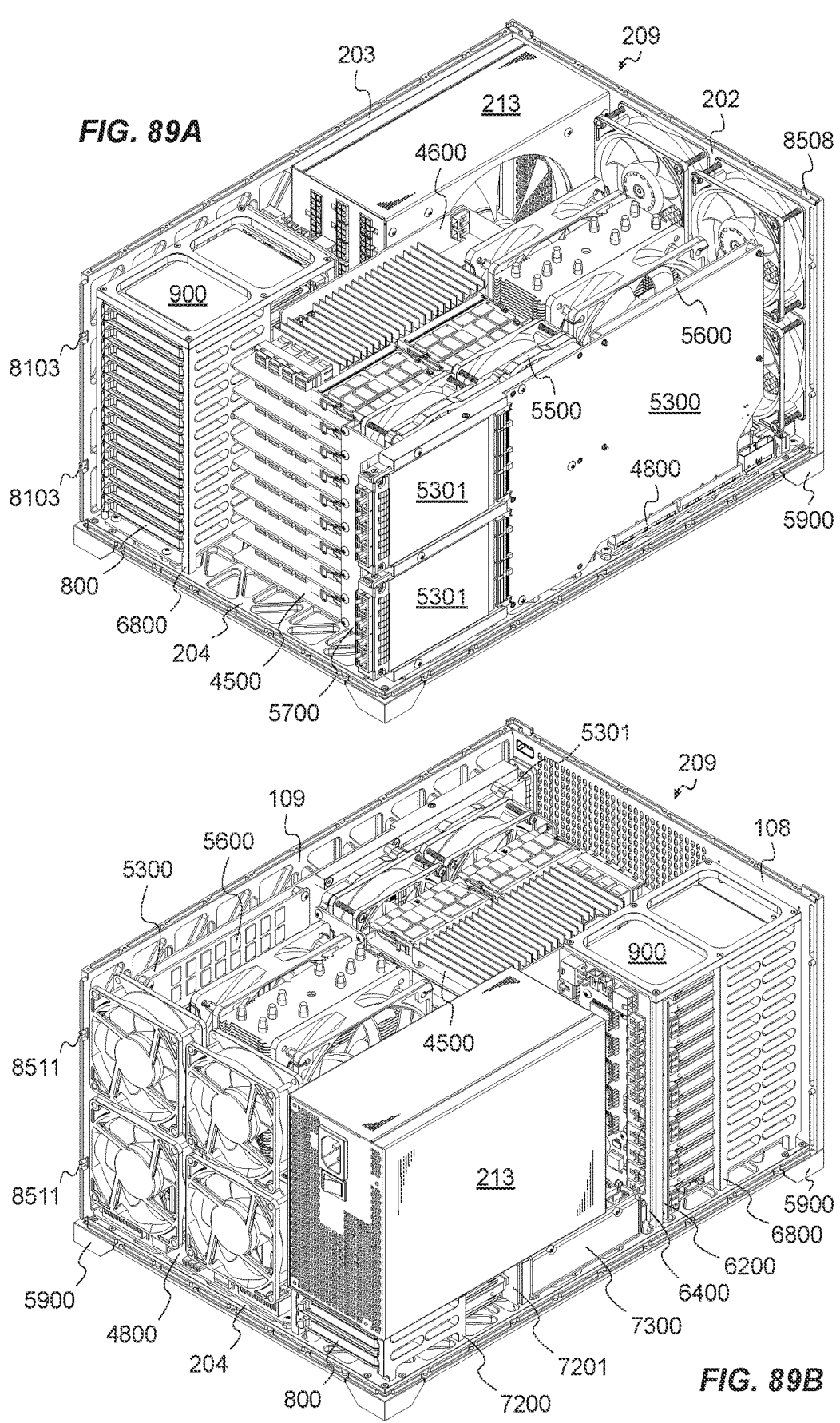

FIG. 89A illustrates a top, front, right perspective-view of a bottom section with various components removed for the purpose of interior visibility according to an embodiment.

FIG. 89B illustrates a top, back, left perspective-view of a bottom section with various components removed for the purpose of interior visibility according to an embodiment.

Figure 90:
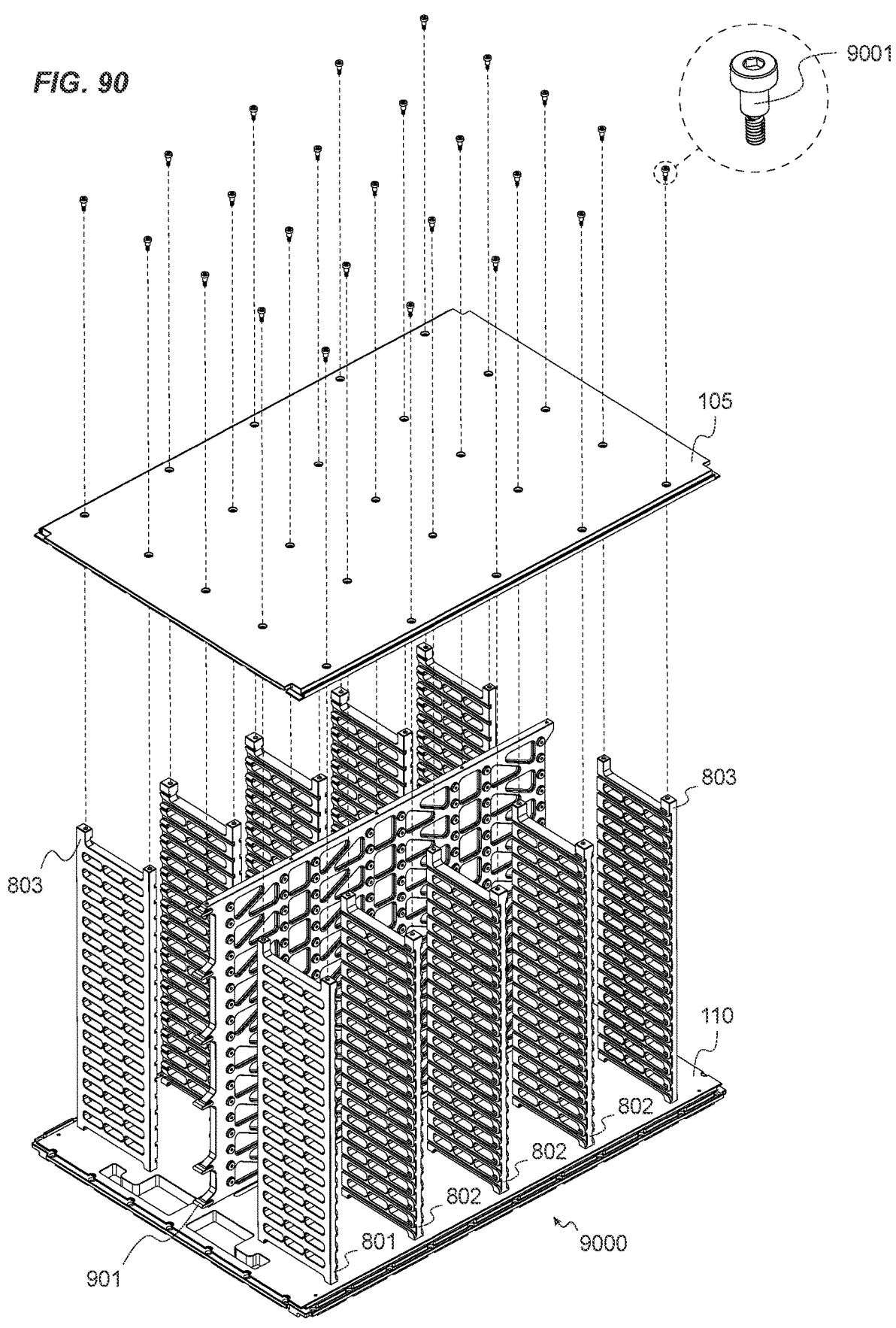

FIG. 90 illustrates a top, front, right exploded-view of the following: a top panel, backing plate, vertical locators, middle panel, and shoulder screws according to an embodiment.

Figure 91:
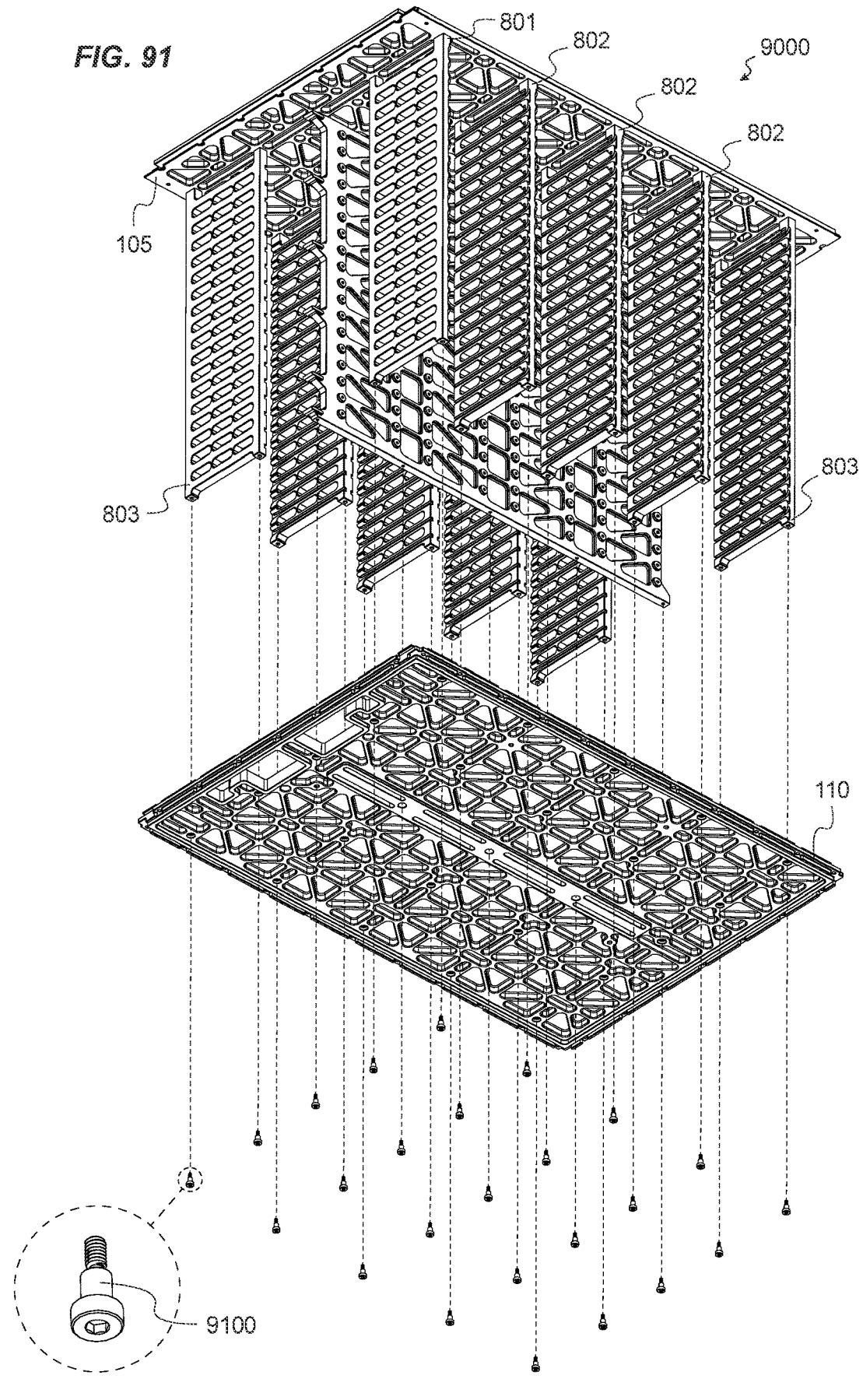

FIG. 91 illustrates a bottom, front, right exploded-view of the following: a top panel, backing plate, vertical locators, middle panel, and shoulder screws according to an embodiment.

Figure 92:
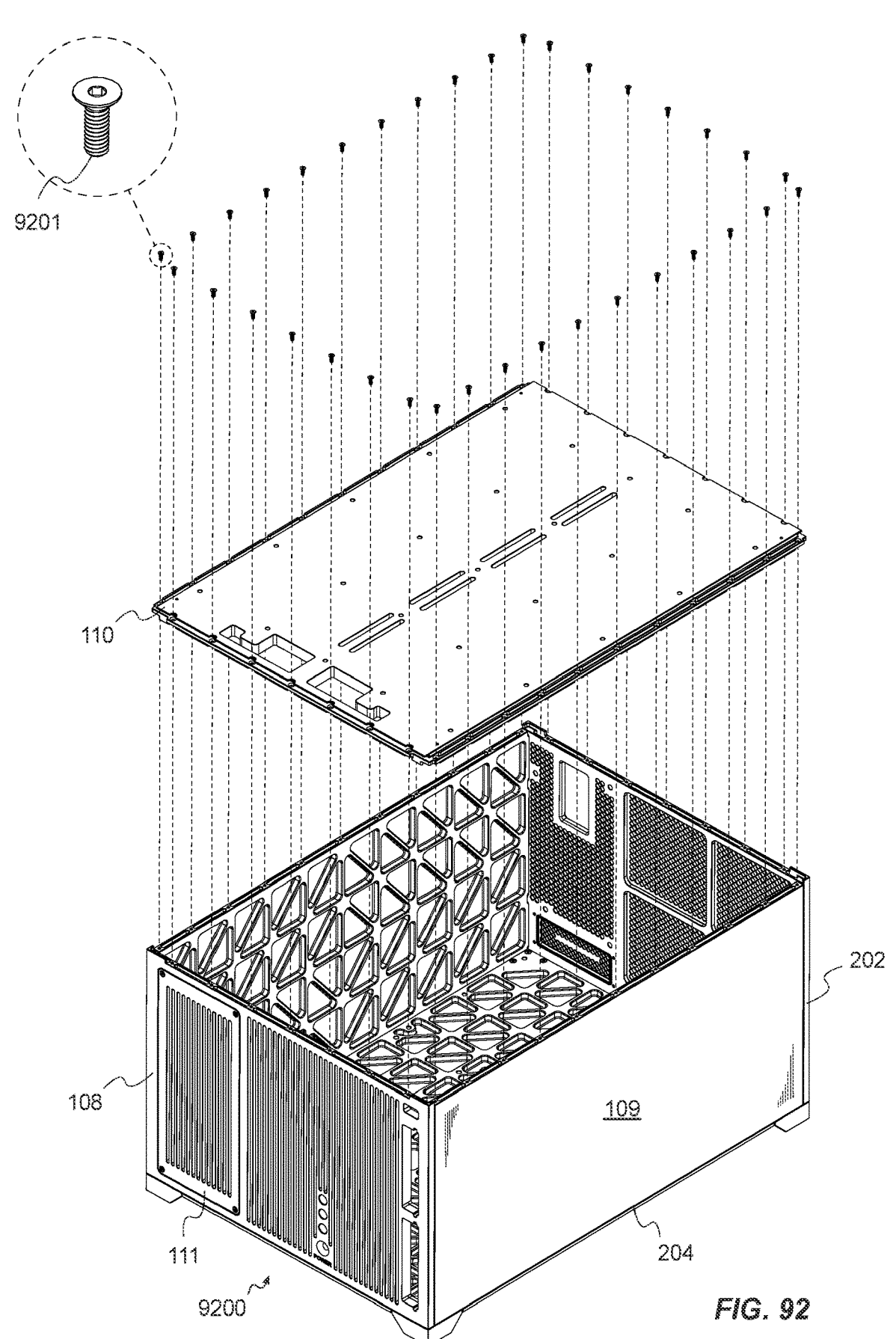

FIG. 92 illustrates a top, front, right exploded-view of an exoskeleton shell according to an embodiment.

Figure 93:
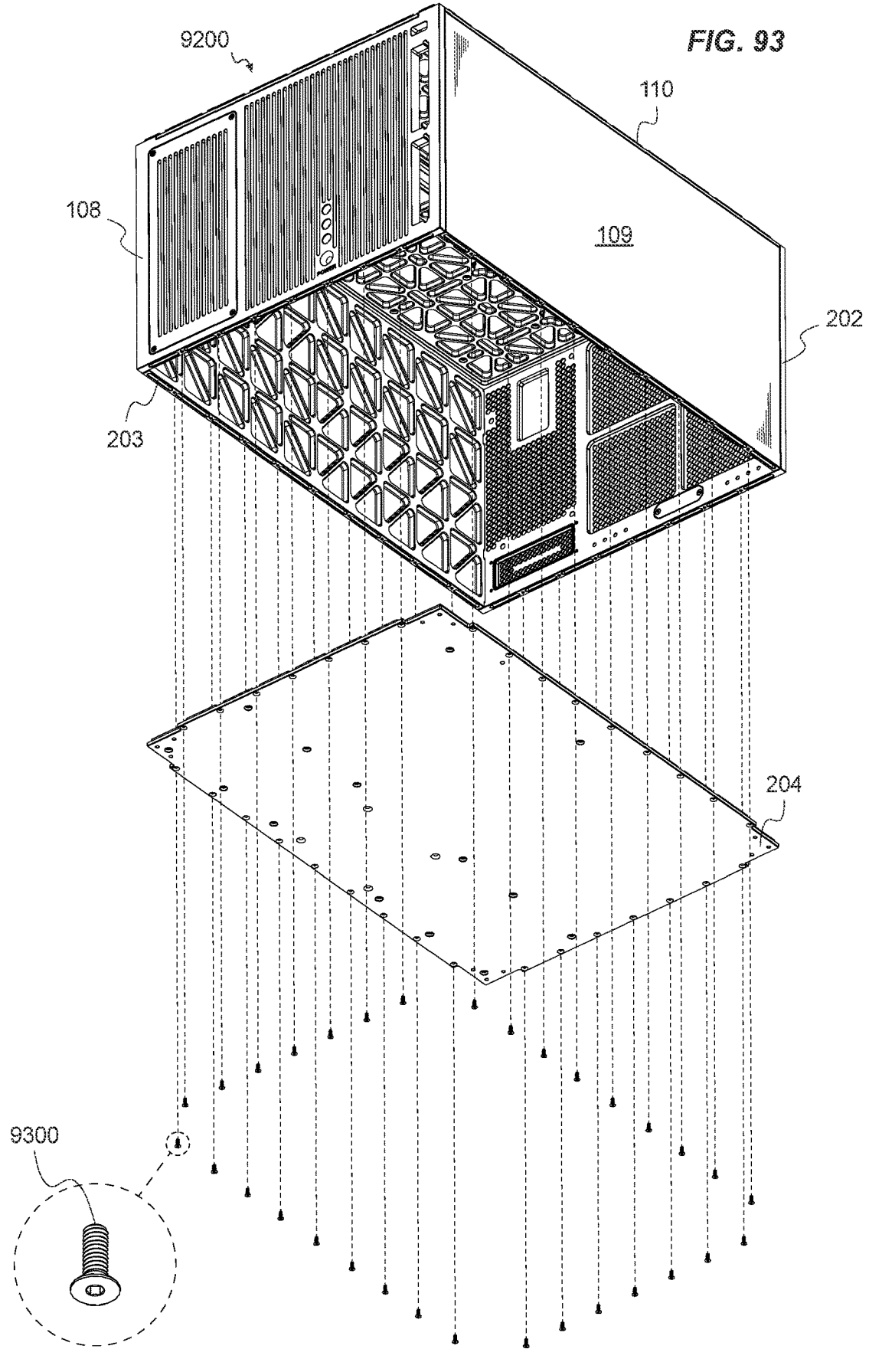

FIG. 93 illustrates a bottom, front, right exploded-view of an exoskeleton shell according to an embodiment.

Figure 94:
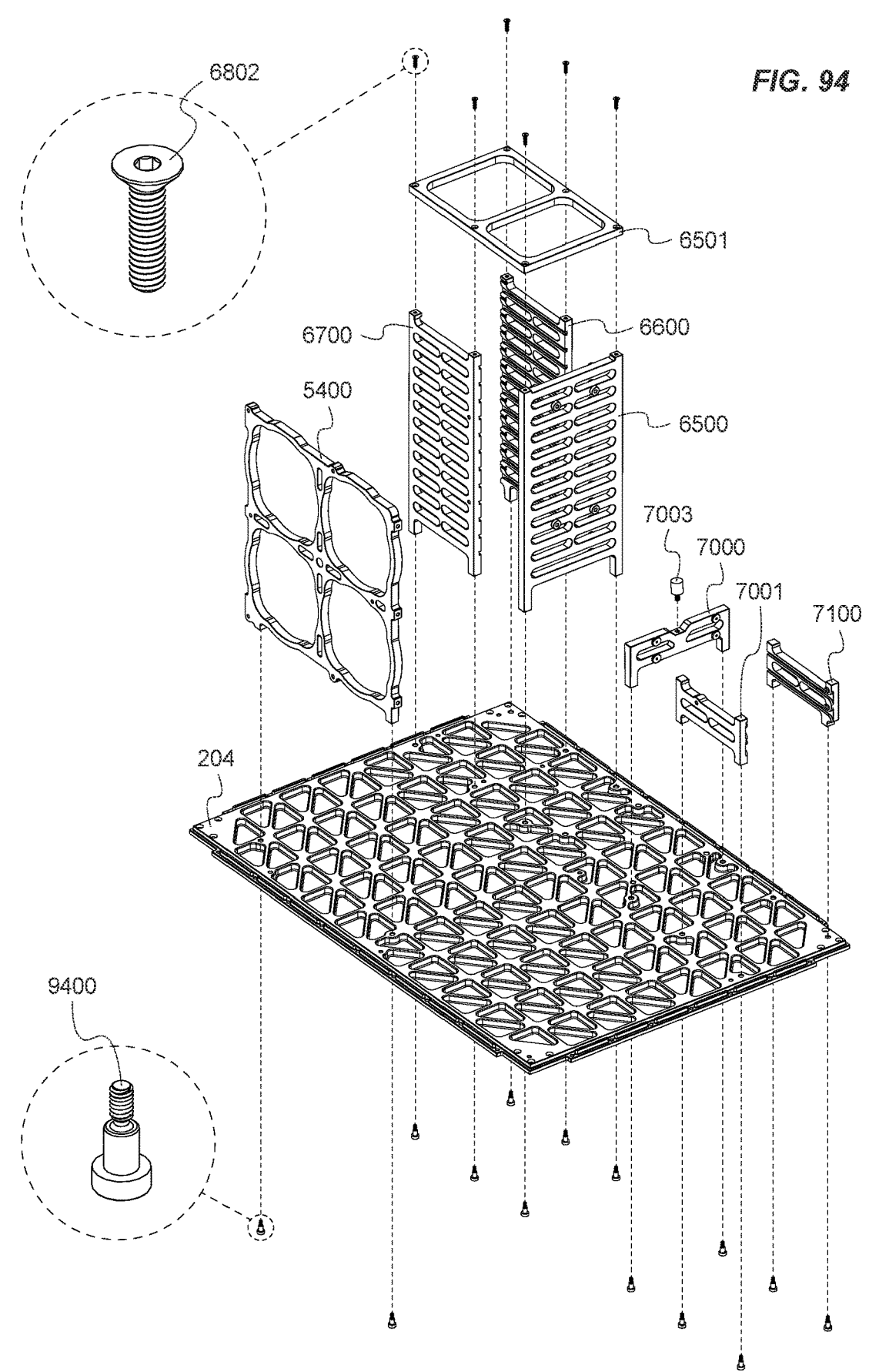

FIG. 94 illustrates a top, back, right exploded-view of the following: a bottom panel, cage top, left front locator, right front locator, front backplate, flat head screws, left rear locator, right rear locator, rear backplate, power bump, fan mount, and shoulder screws according to an embodiment.

Figure 95A:
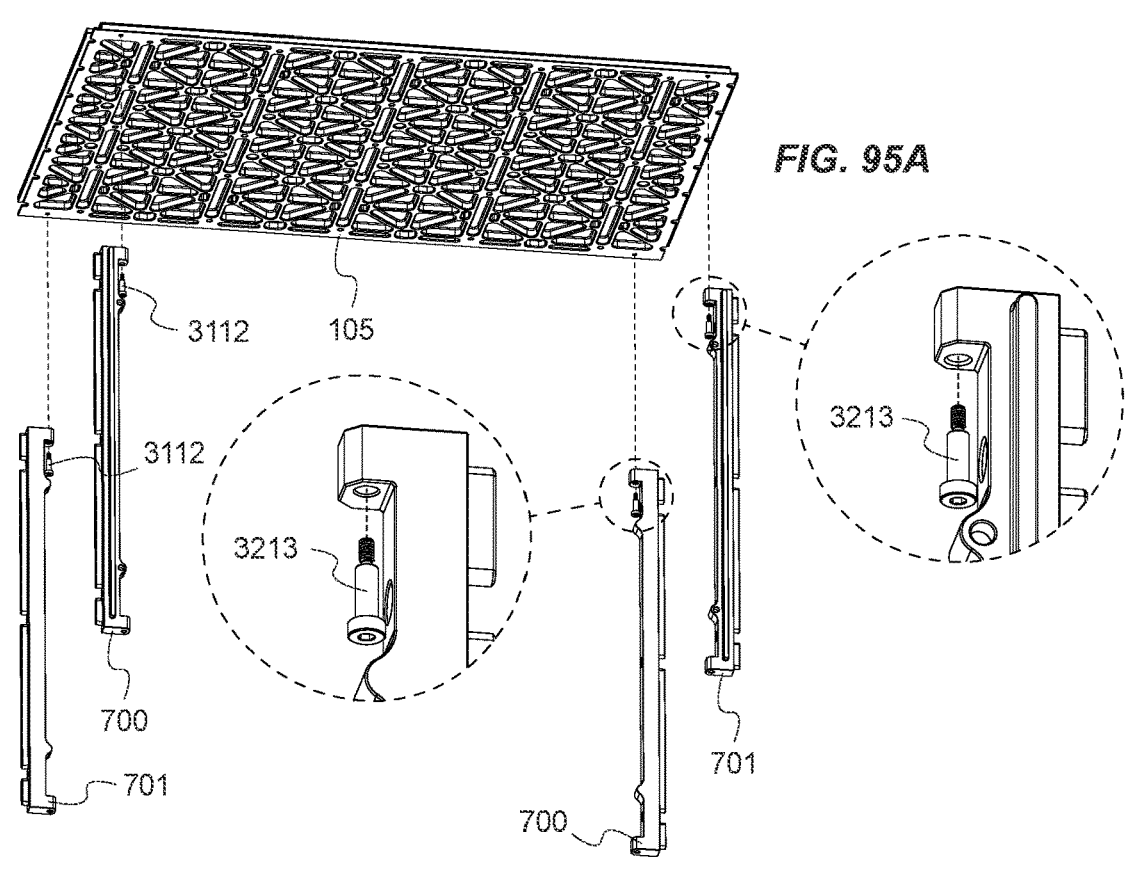

FIG. 95A illustrates an exploded-view of the following: a top panel, left panel aligners, right panel aligners, and shoulder screws according to an embodiment.

Figure 95B:
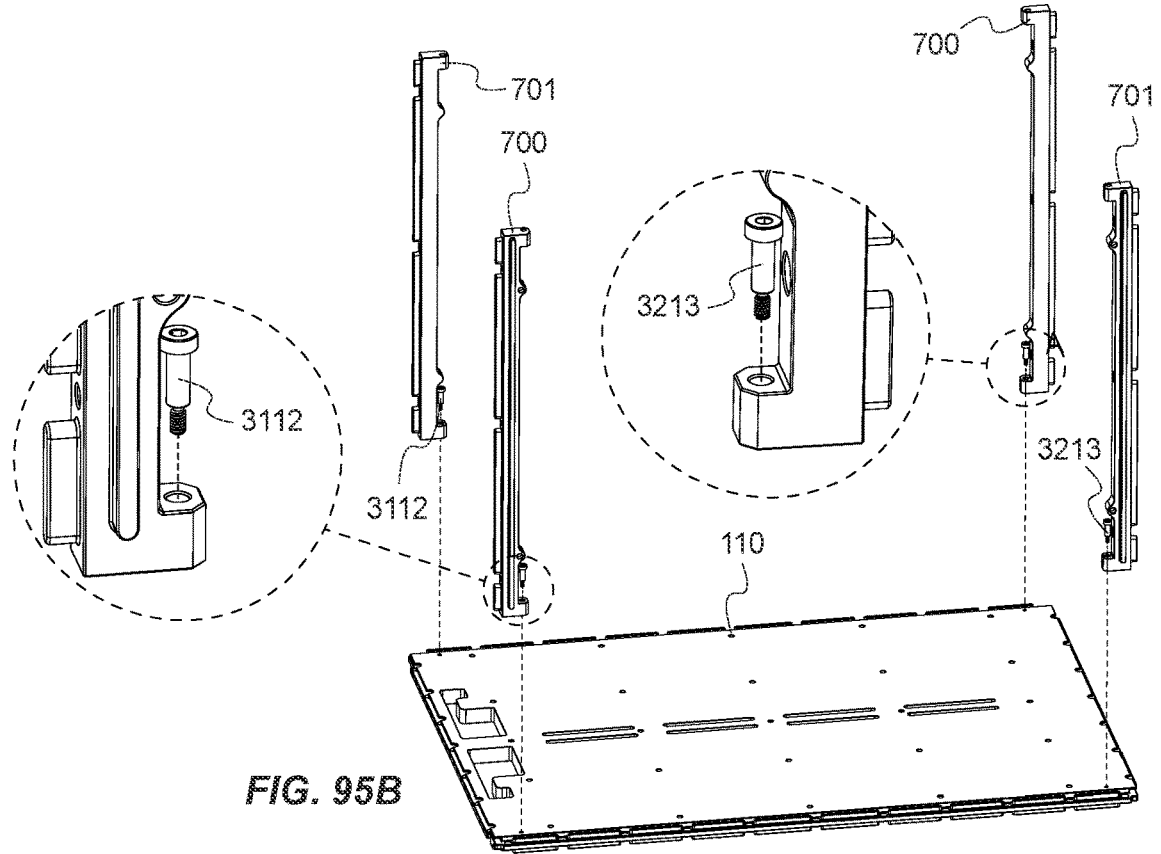

FIG. 95B illustrates an exploded-view of the following: a middle panel, left panel aligners, right panel aligners, and shoulder screws according to an embodiment.

Figures 96A, 96B:
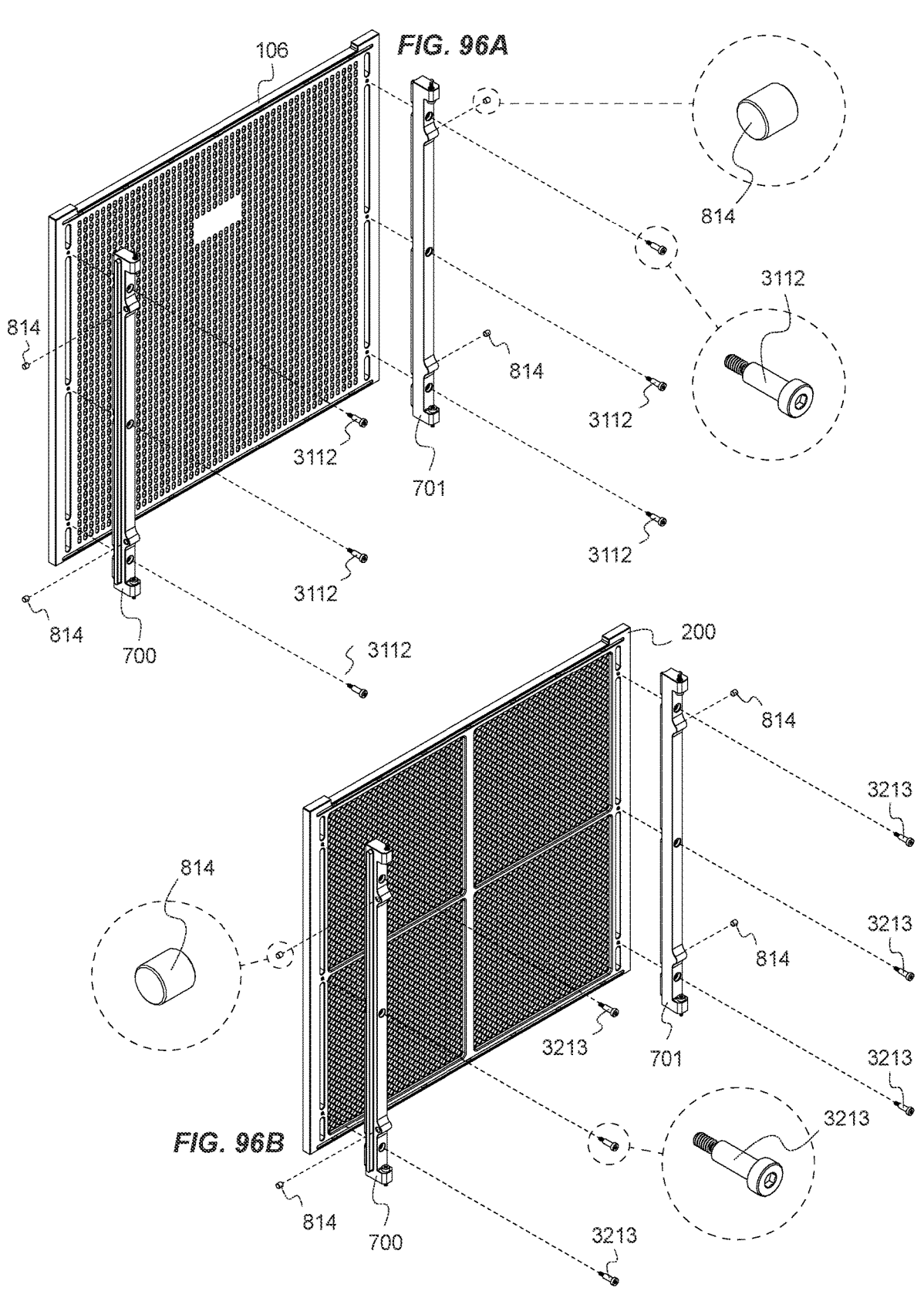

FIG. 96A illustrates an exploded-view of the following: a front upper panel, panel magnets, left panel aligner, right panel aligner, and shoulder screws according to an embodiment.

FIG. 96B illustrates an exploded-view of the following: a back upper panel, panel magnets, left panel aligner, right panel aligner, and shoulder screws according to an embodiment.

Figures 97A, 97B:
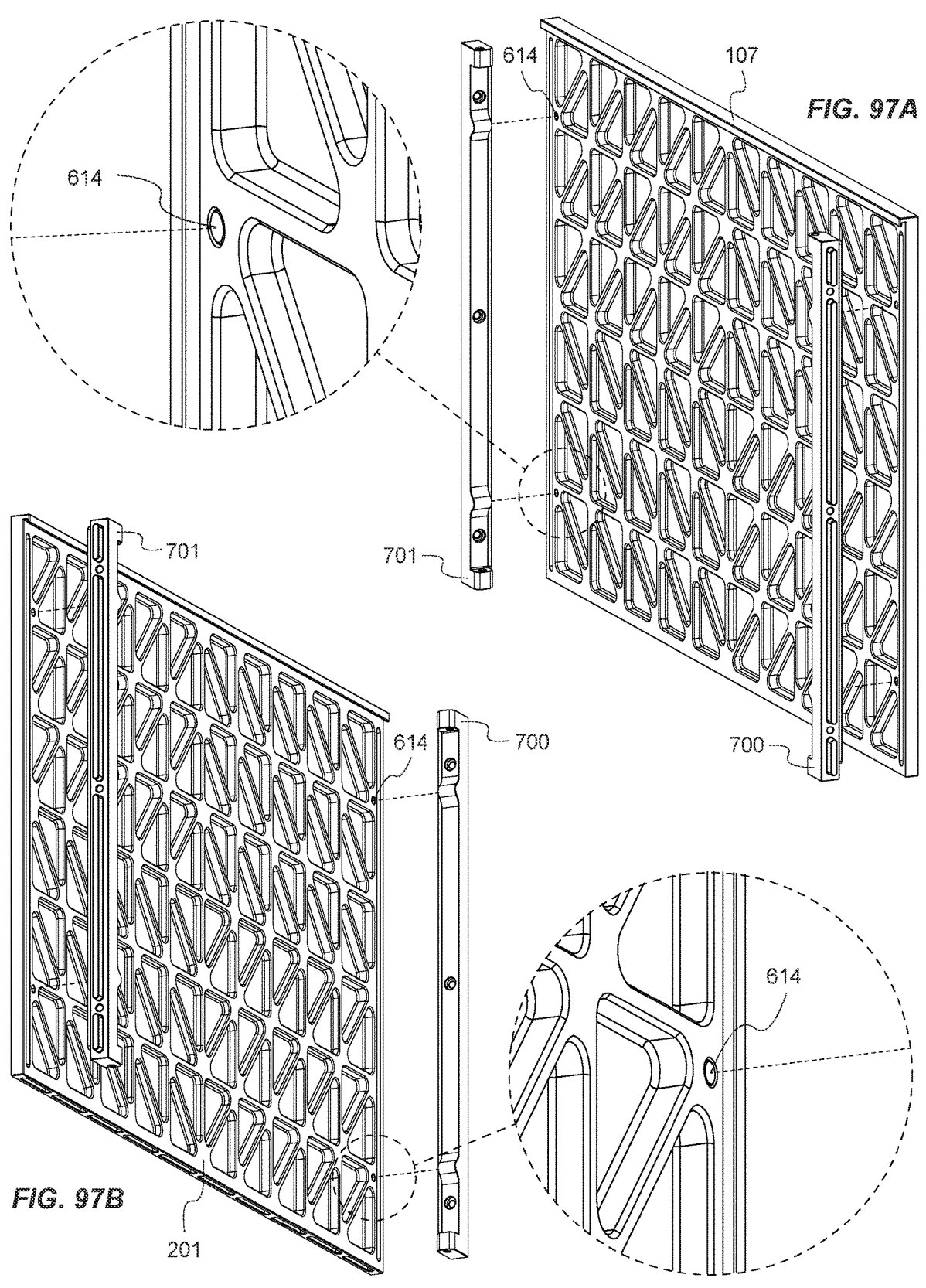

FIGS. 97A and 97B illustrate exploded-views of the following: an access panel, left panel aligner, right panel aligner, and panel magnets according to an embodiment.

Figures 98A, 98B:
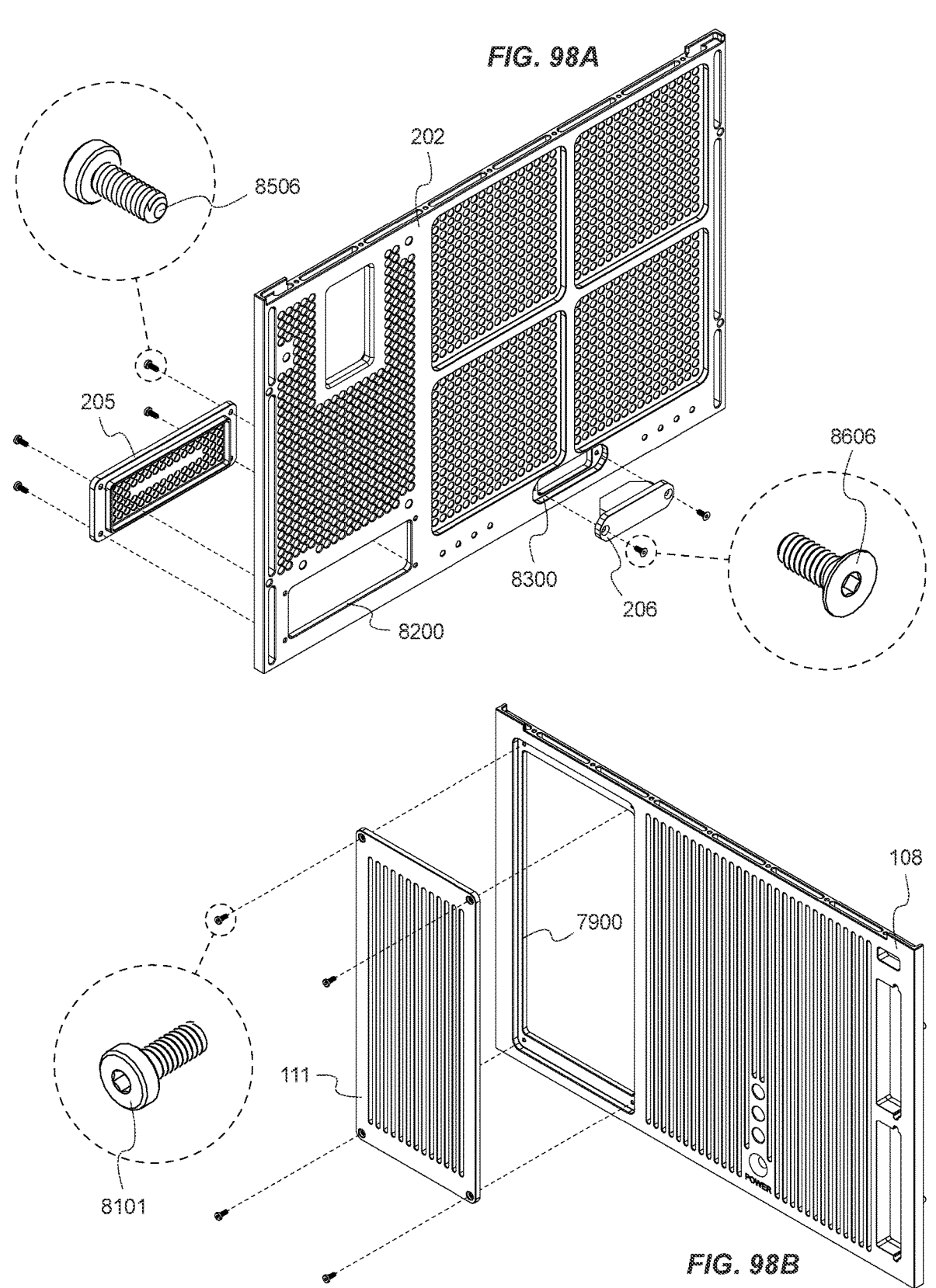

FIG. 98A illustrates an exploded-view of the following: a back lower panel, back hatch, low-profile socket head screws, security hatch, and flat head screws according to an embodiment.

FIG. 98B illustrates an exploded-view of the following: a front lower panel, front hatch, and low-profile socket head screws according to an embodiment.

Figures 99A, 99B:
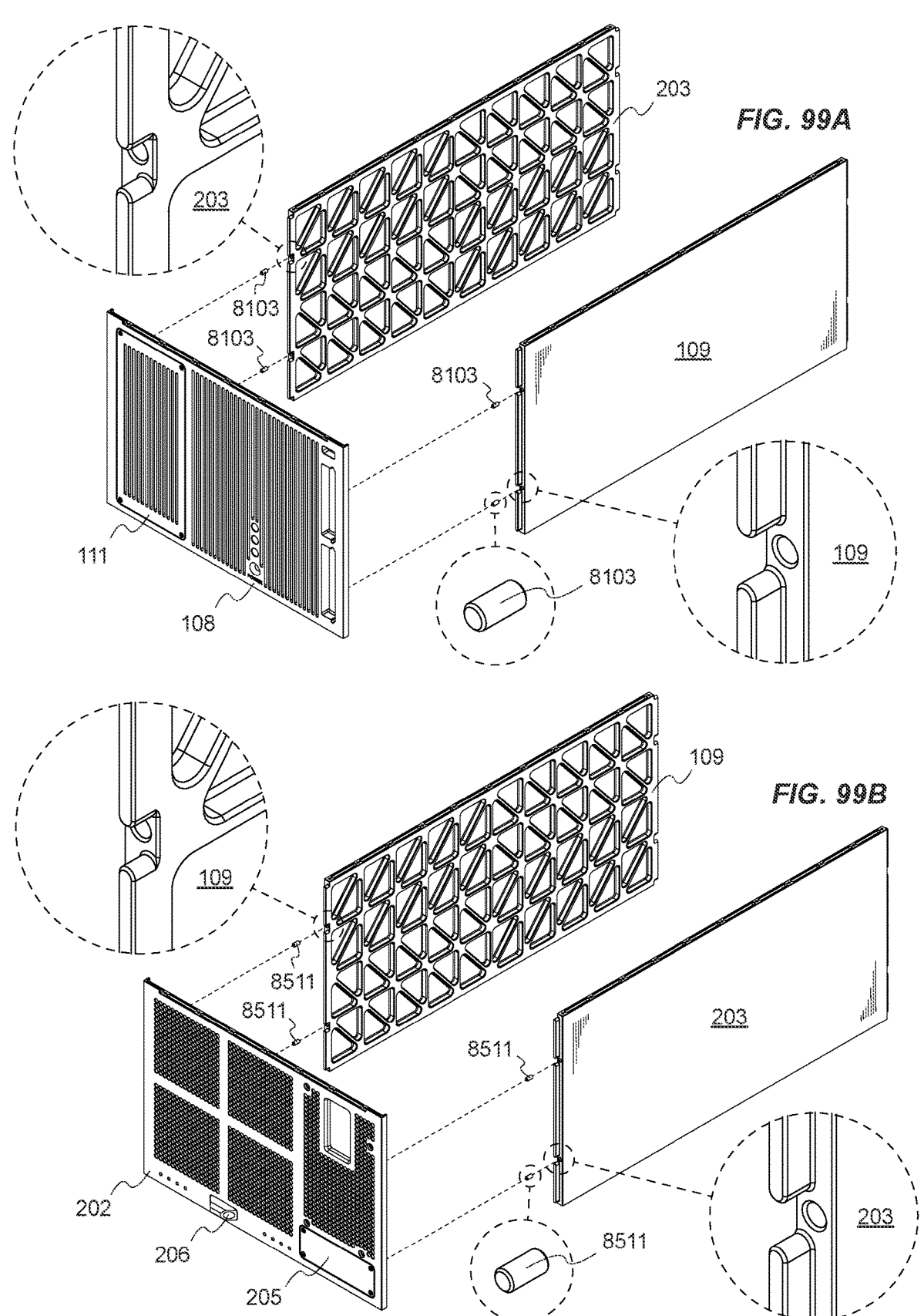

FIG. 99A illustrates a top, front, right exploded-view of the following: a front lower panel, front hatch, low-profile socket head screws, left side panel, right side panel, and dowel pins according to an embodiment.

FIG. 99B illustrates a top, back, left exploded-view of the following: a back lower panel, back hatch, low-profile socket head screws, security hatch, flat head screws, left side panel, right side panel, and dowel pins according to an embodiment.

Figures 100A, 100B:
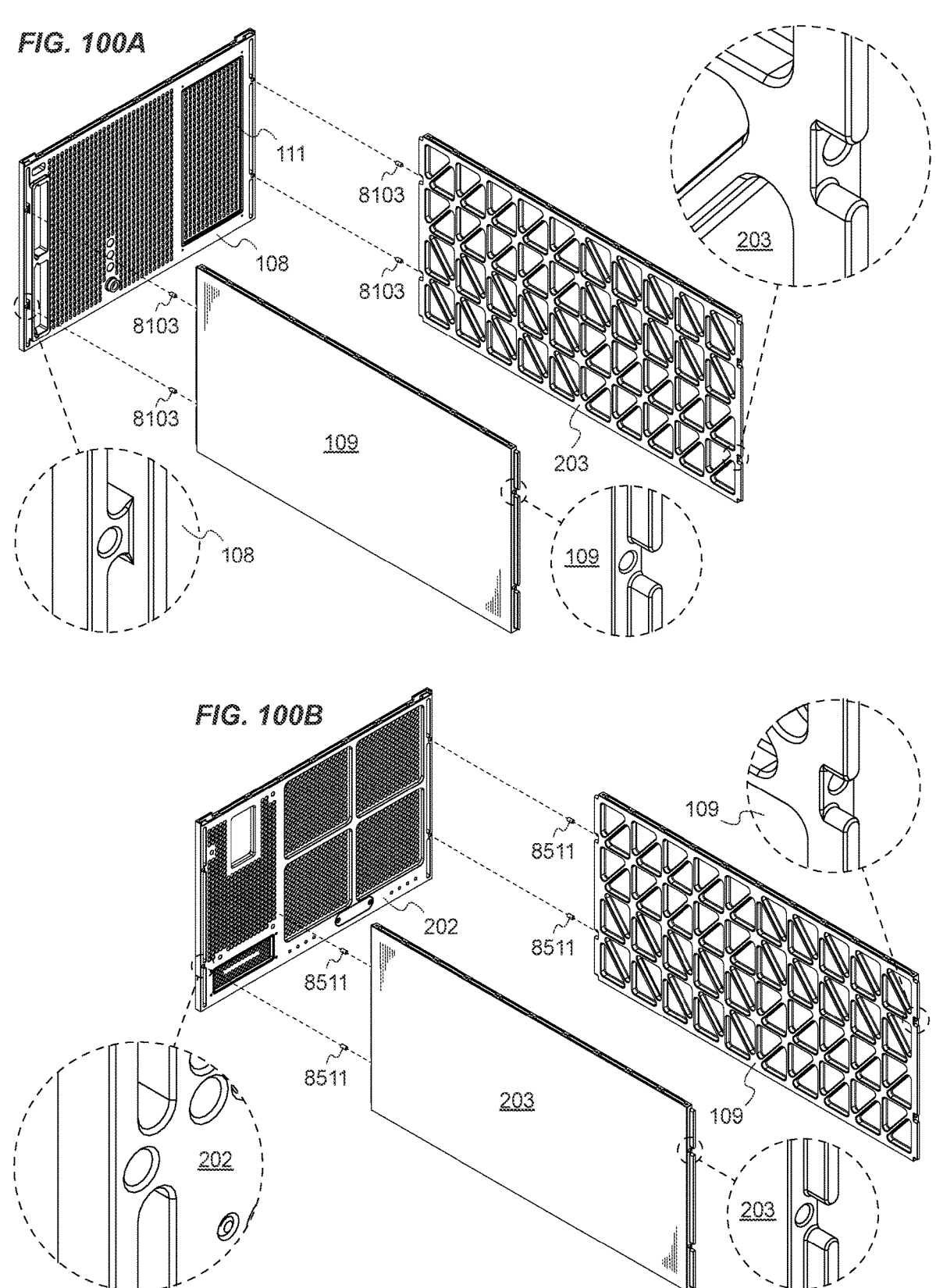

FIG. 100A illustrates a top, back, right exploded-view of the following: a front lower panel, front hatch, low-profile socket head screws, left side panel, right side panel, and dowel pins according to an embodiment.

FIG. 100B illustrates a top, front, left exploded-view of the following: a back lower panel, back hatch, low-profile socket head screws, security hatch, flat head screws, left side panel, right side panel, and dowel pins according to an embodiment.

Figures 101A, 101B, 101C, 101D:
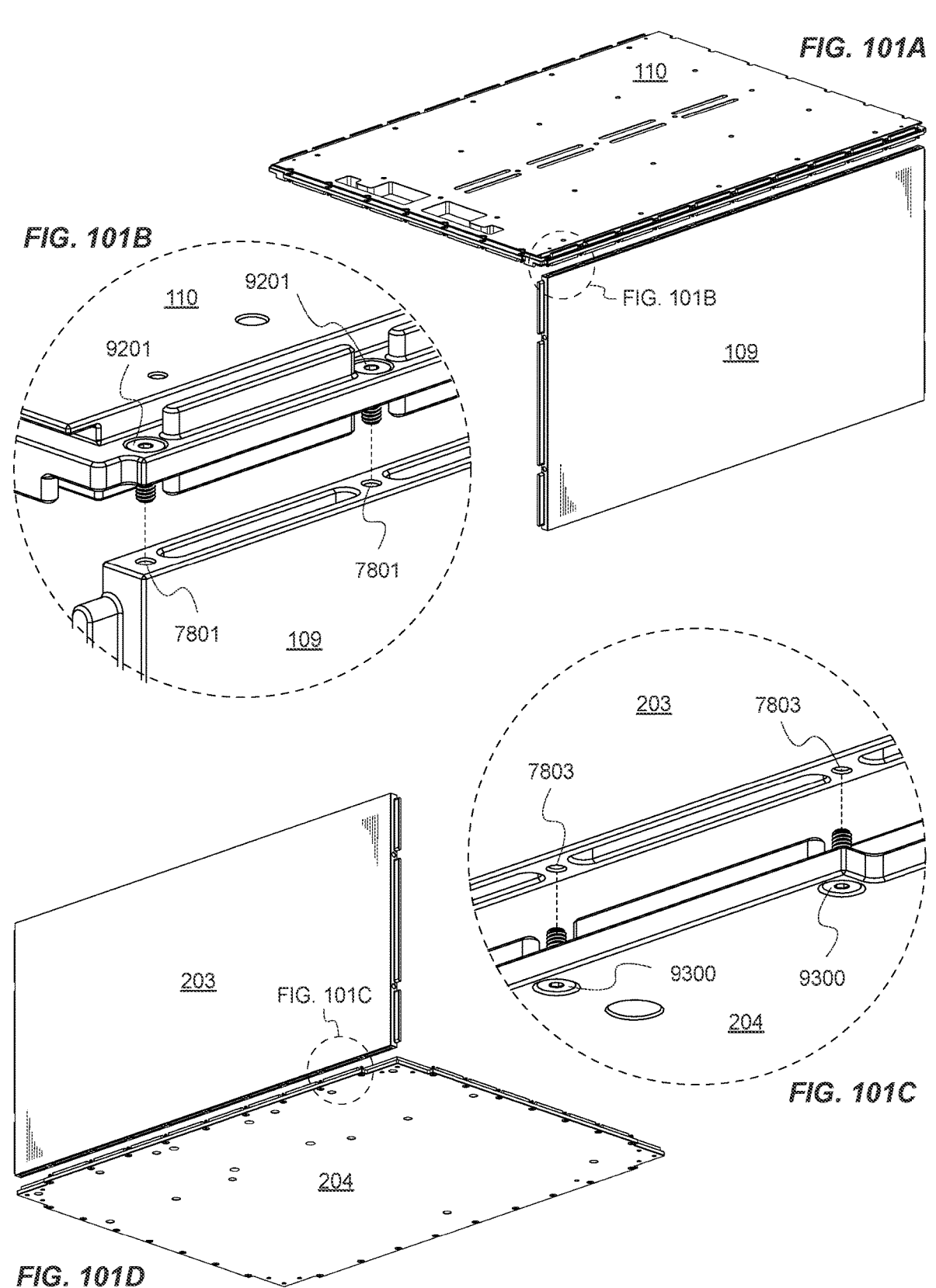

FIG. 101A illustrates an exploded-view of the following being assembled: a middle panel, right side panel, and flat head screws according to an embodiment.

FIG. 101B illustrates a detail-view of the following being assembled: a middle panel, right side panel, and flat head screws according to an embodiment.

FIG. 101C illustrates a detail-view of the following being assembled: a bottom panel, left side panel, and flat head screws according to an embodiment.

FIG. 101D illustrates an exploded-view of the following being assembled: a bottom panel, left side panel, and flat head screws according to an embodiment.

Figures 102A, 102B, 102C, 102D:
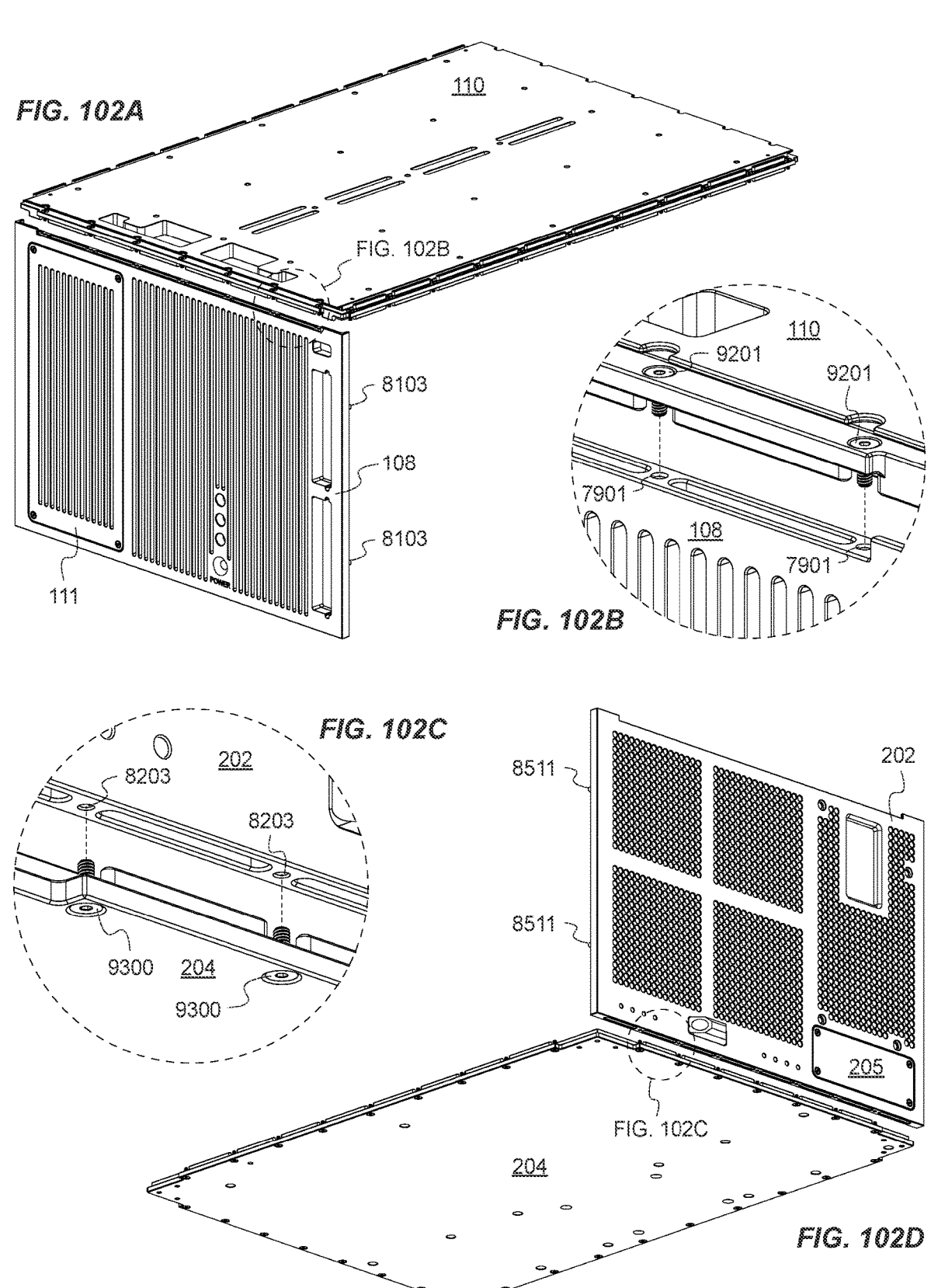

FIG. 102A illustrates an exploded-view of the following: a middle panel, front lower panel, front hatch, low-profile socket head screws, dowel pins, and flat head screws according to an embodiment.

FIG. 102B illustrates a detail-view of the following being assembled: a middle panel, front lower panel, and flat head screws according to an embodiment.

FIG. 102C illustrates a detail-view of the following being assembled: a bottom panel, back lower panel, and flat head screws according to an embodiment.

FIG. 102D illustrates an exploded-view of the following: a bottom panel, back lower panel, back hatch, low-profile socket head screws, security hatch, flat head screws, dowel pins, and flat head screws according to an embodiment.

Figures 103A, 103B, 103C, 103D:
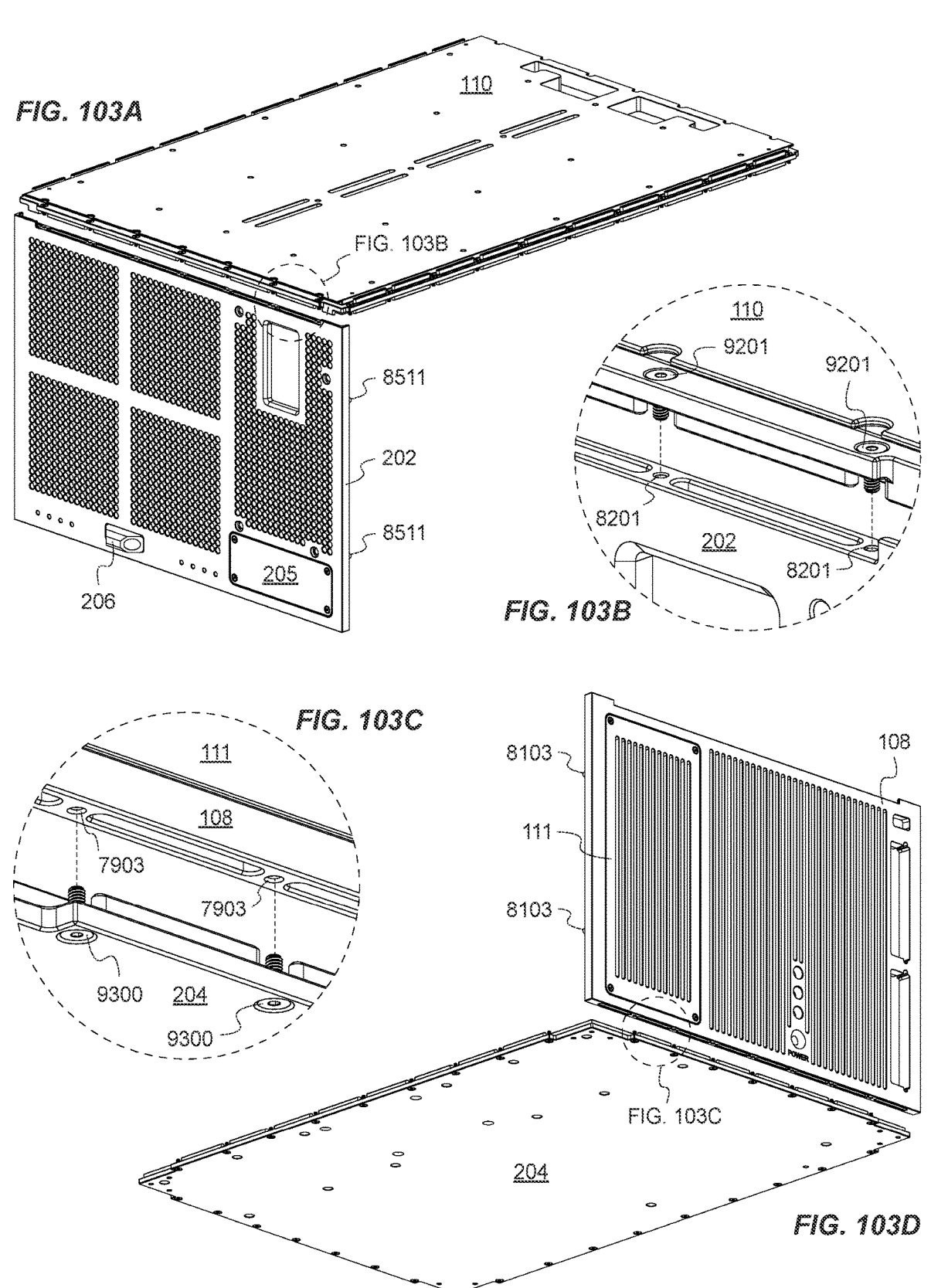

FIG. 103A illustrates an exploded-view of the following: a middle panel, back lower panel, back hatch, low-profile socket head screws, security hatch, flat head screws, dowel pins, and flat head screws according to an embodiment.

FIG. 103B illustrates a detail-view of the following being assembled: a middle panel, back lower panel, and flat head screws according to an embodiment.

FIG. 103C illustrates a detail-view of the following being assembled: a bottom panel, front lower panel, and flat head screws according to an embodiment.

FIG. 103D illustrates an exploded-view of the following: a bottom panel, front lower panel, front hatch, low-profile socket head screws, dowel pins, and flat head screws according to an embodiment.

Figures 104A, 104B, 104C:
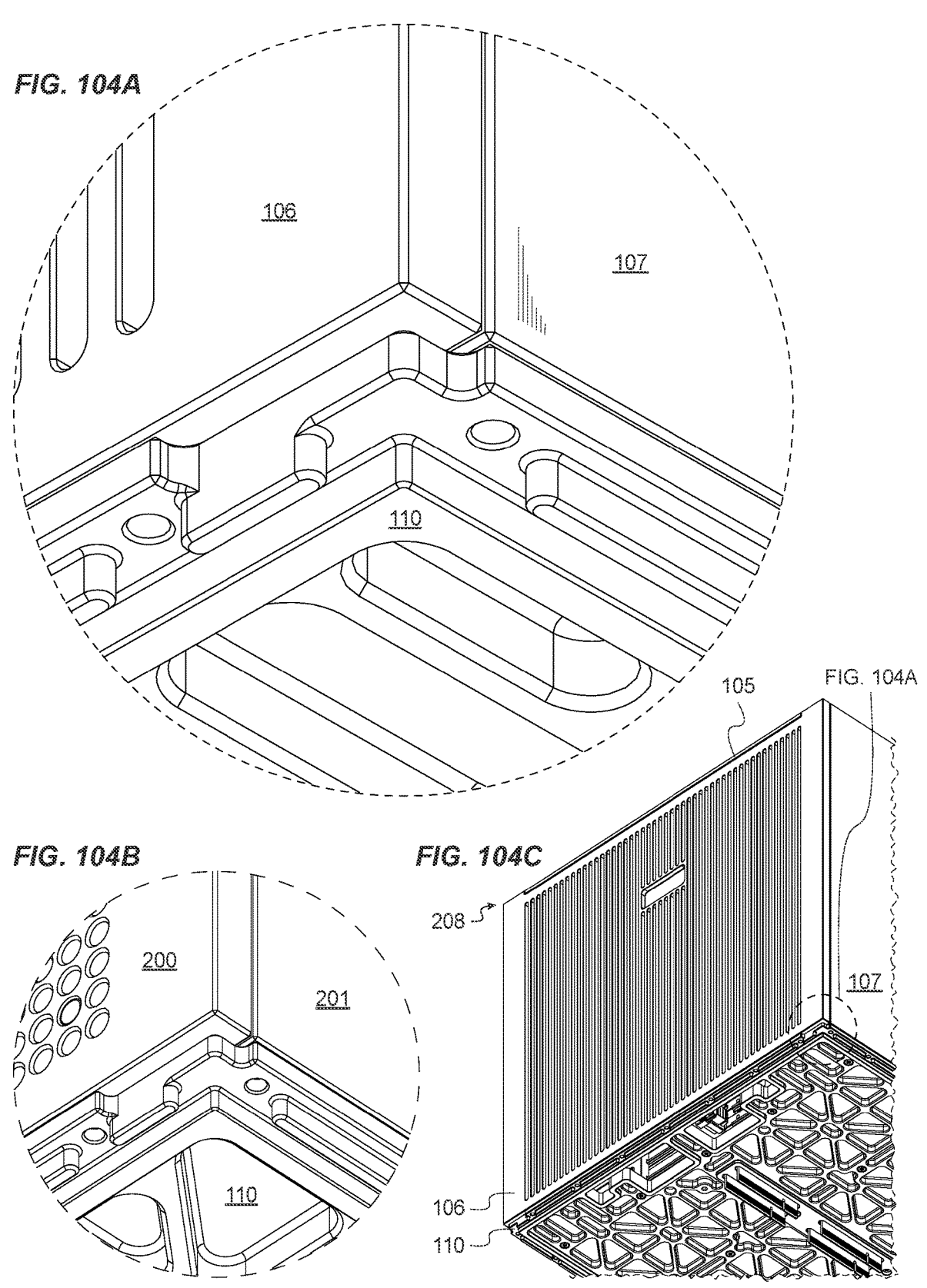

FIG. 104A illustrates a detail-view of the following: a middle panel, front upper panel, and right access panel according to an embodiment.

FIG. 104B illustrates a detail-view of the following: a middle panel, back upper panel, and left access panel according to an embodiment.

FIG. 104C illustrates a bottom, front, right partial-view of a top section according to an embodiment.

Figures 105A, 105B, 105C:
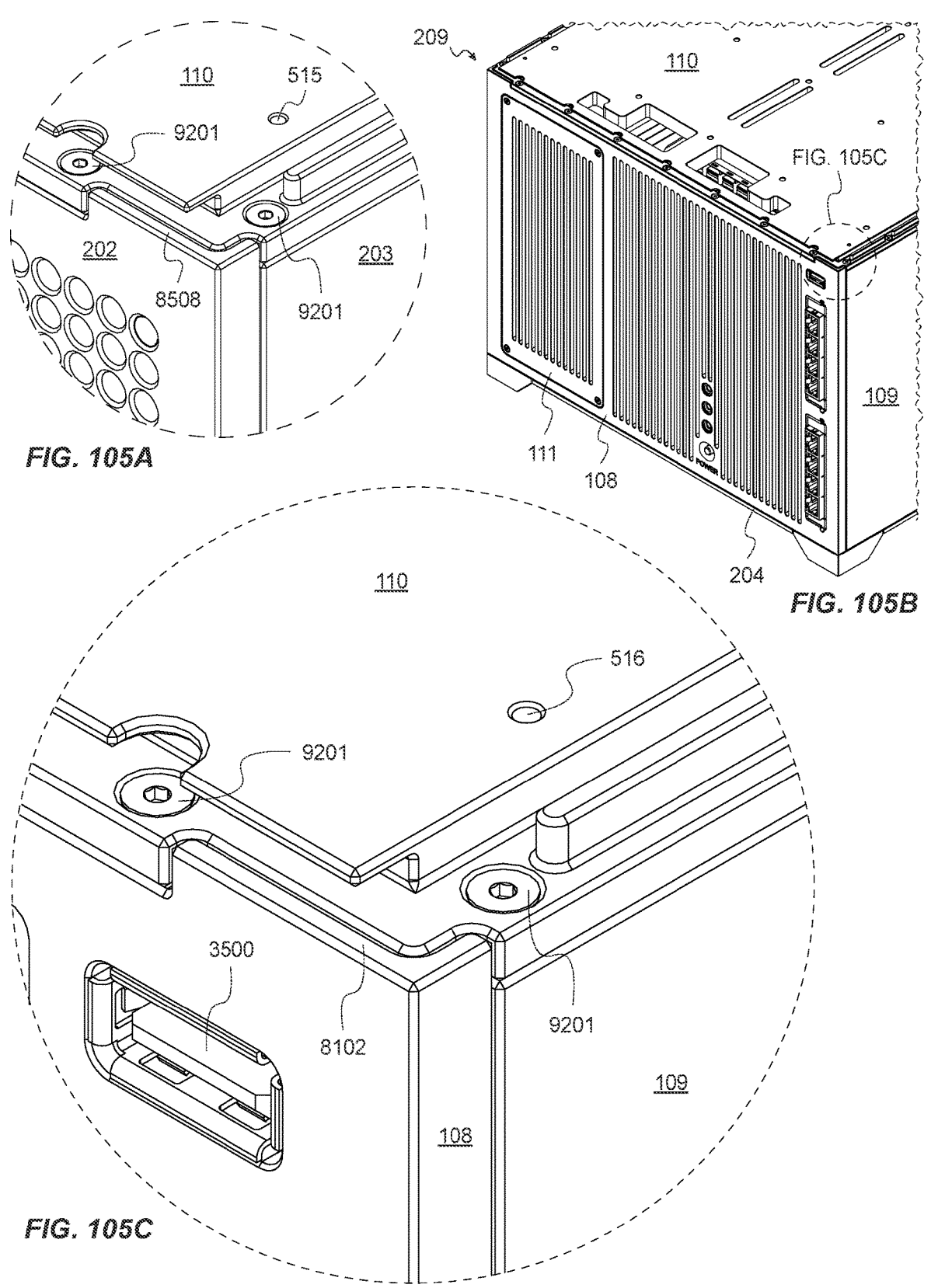

FIG. 105A illustrates a detail-view of the following: a middle panel, back lower panel, and left side panel according to an embodiment.

FIG. 105B illustrates a top, front, right partial-view of a bottom section according to an embodiment.

FIG. 105C illustrates a detail-view of the following: a middle panel, front lower panel, and right side panel according to an embodiment.

FIG. 106 illustrates various pin assignments for the following: plug receptacles of a left connector group, plug receptacles of a host connector, and a left custom cable end (i.e. plug) according to an embodiment.

FIG. 107 illustrates various pin assignments for the following: plug receptacles of a right connector group, plug receptacles of a host connector, and a right custom cable end (i.e. plug) according to an embodiment.

FIG. 108A illustrates an embodiment of a storage server which includes a host adapter.

FIG. 108B illustrates an embodiment of a storage server which includes a hybrid adapter.

Figure 109:
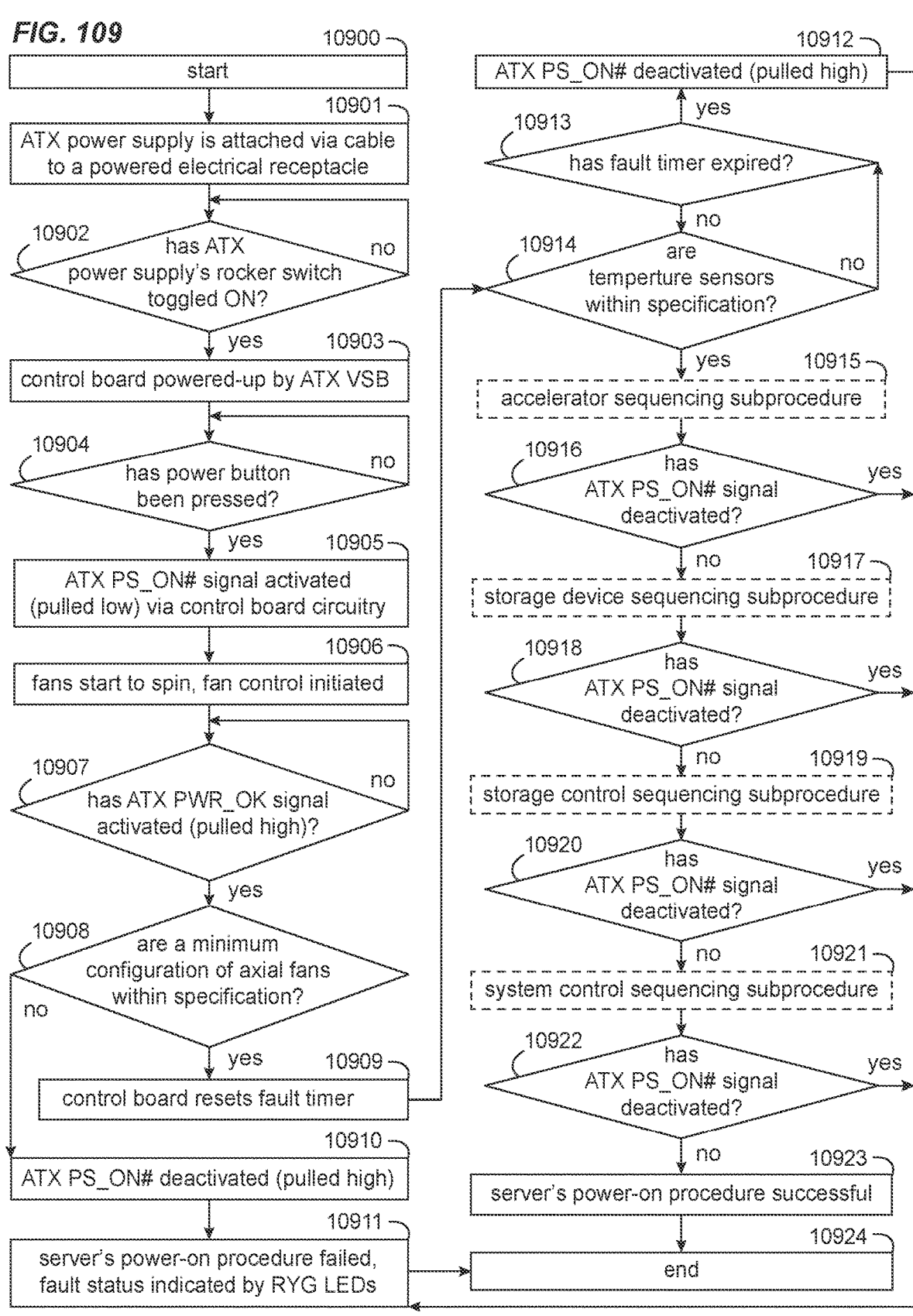

FIG. 109 illustrates a power-on procedure of a storage server according to an embodiment.

Figure 110:
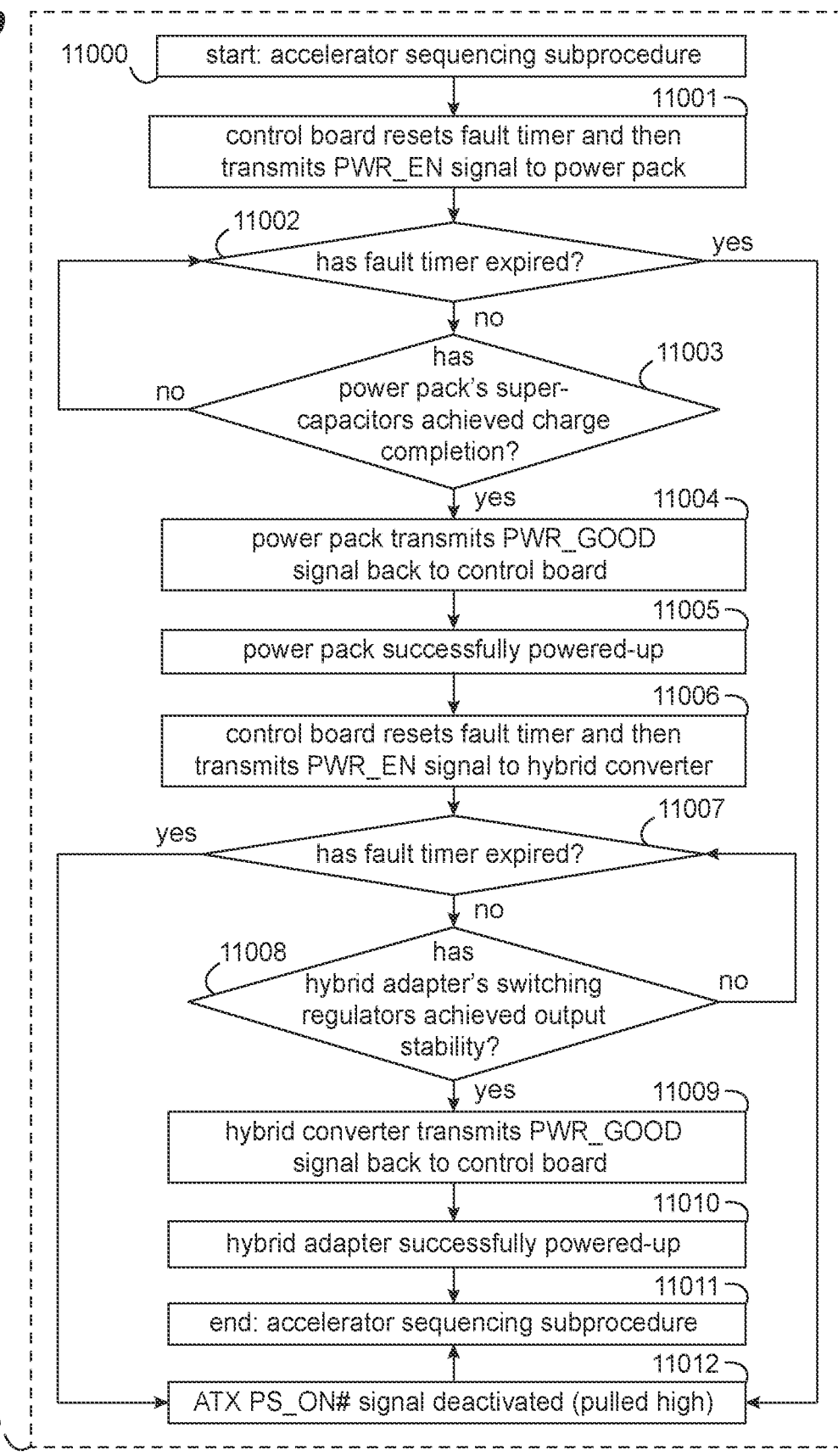

FIG. 110 illustrates an accelerator sequencing subprocedure of a storage server according to an embodiment.

Figure 111:
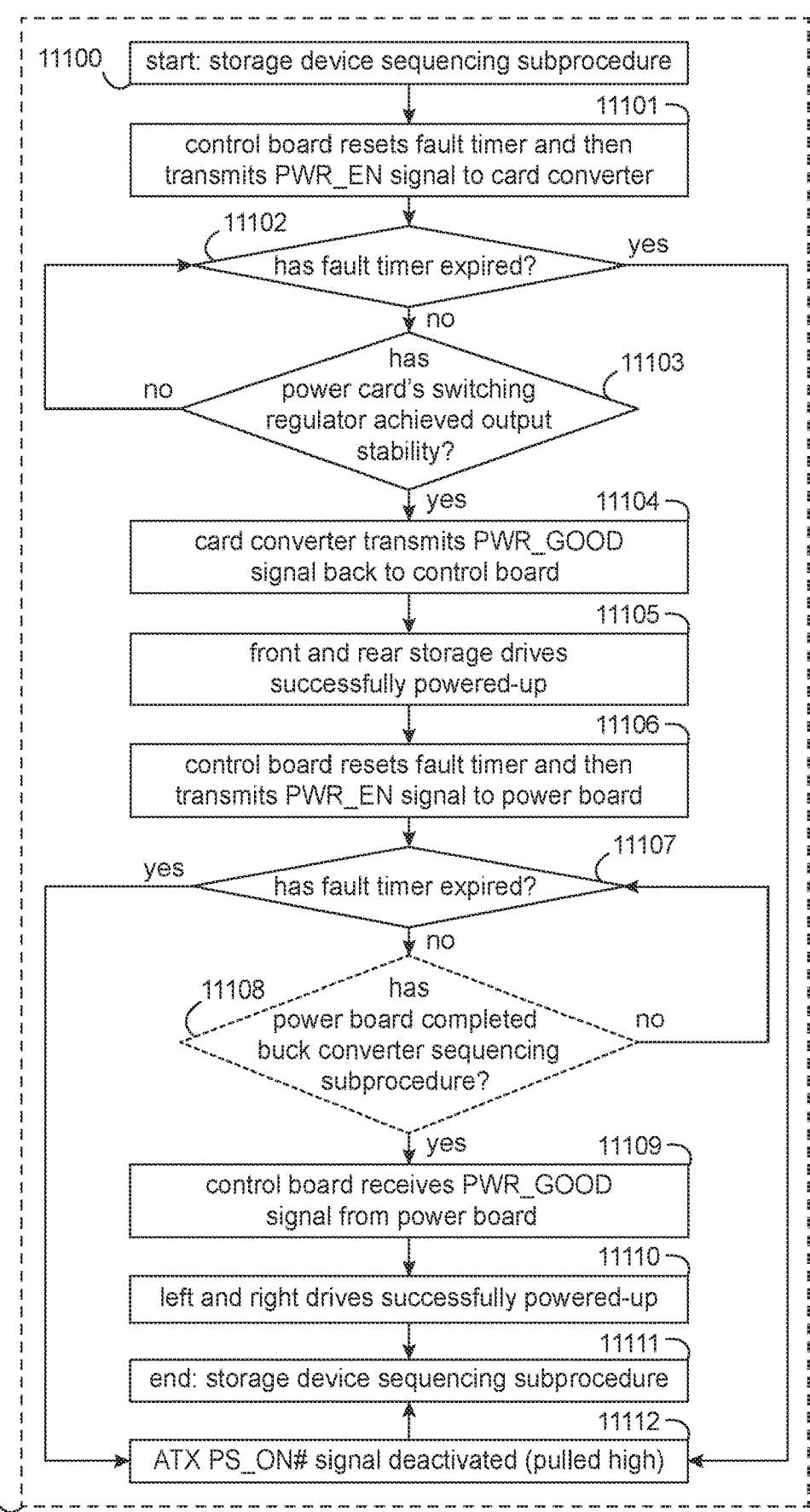

FIG. 111 illustrates a storage device sequencing subprocedure of a storage server according to an embodiment.

FIG. 112 illustrates a storage control sequencing subprocedure of a storage server according to an embodiment.

Figure 113:
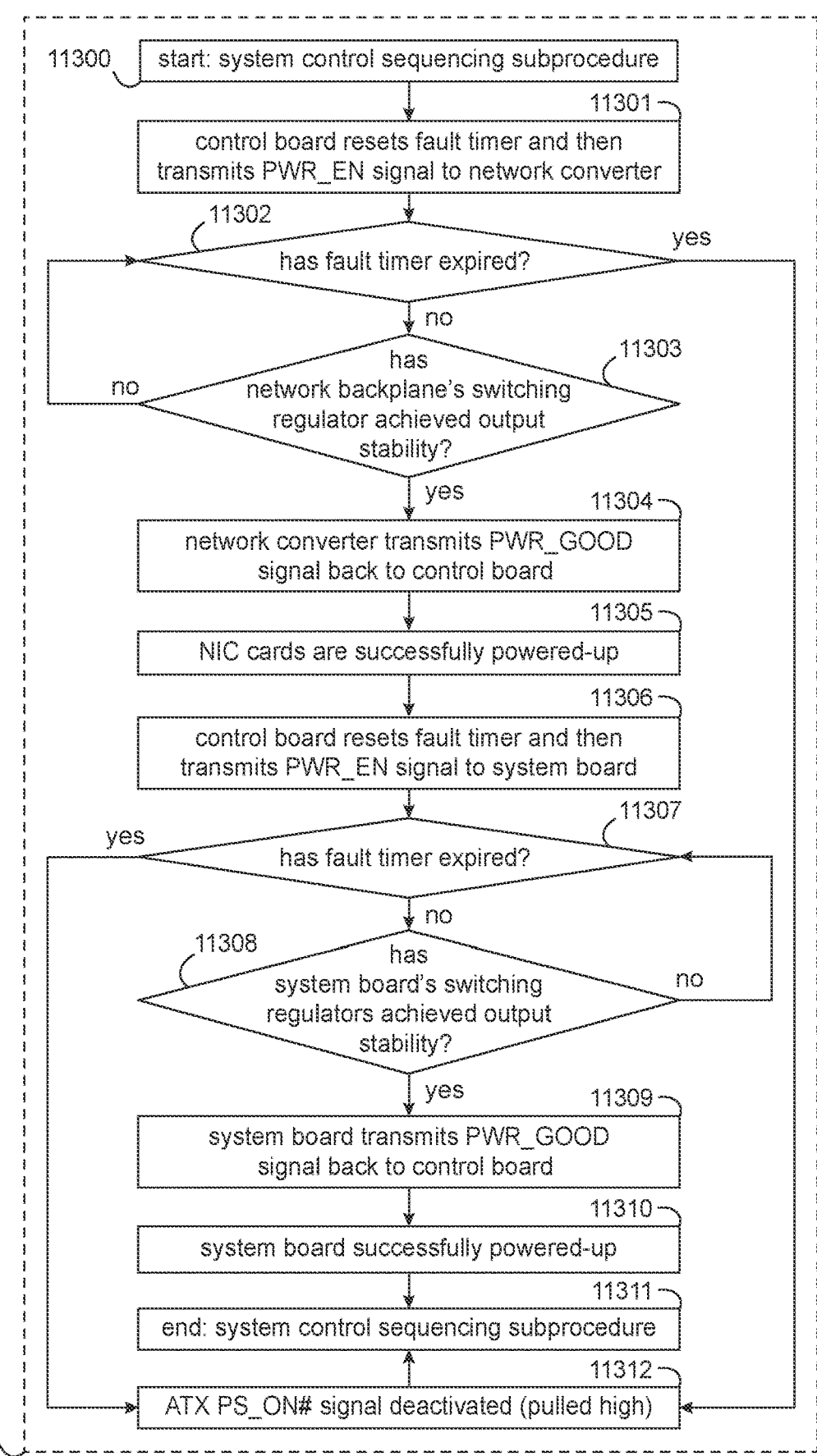

FIG. 113 illustrates a system control sequencing subprocedure of a storage server according to an embodiment.

Figure 114:
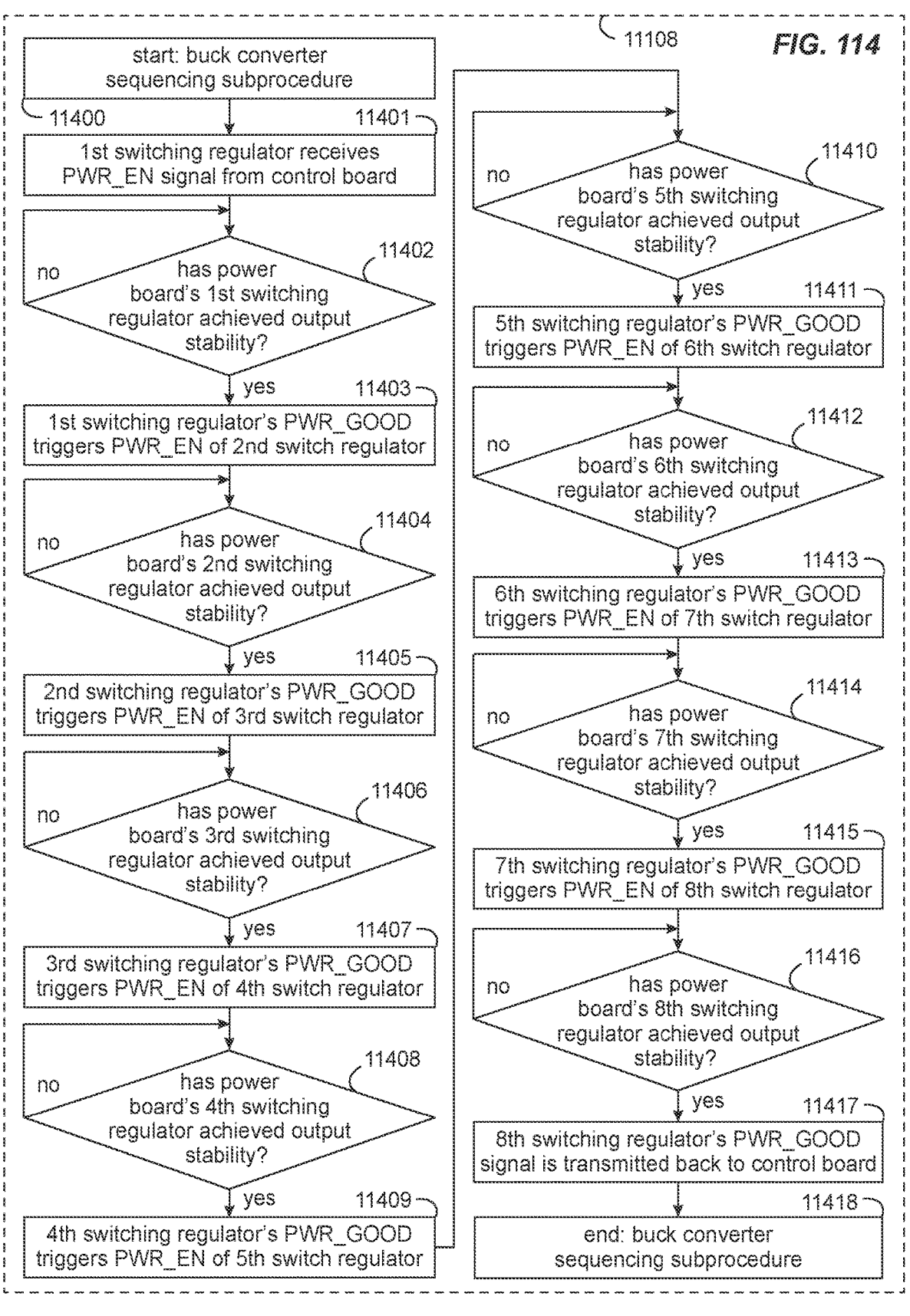

FIG. 114 illustrates a buck converter sequencing subprocedure of a storage server according to an embodiment.

Figure 115:
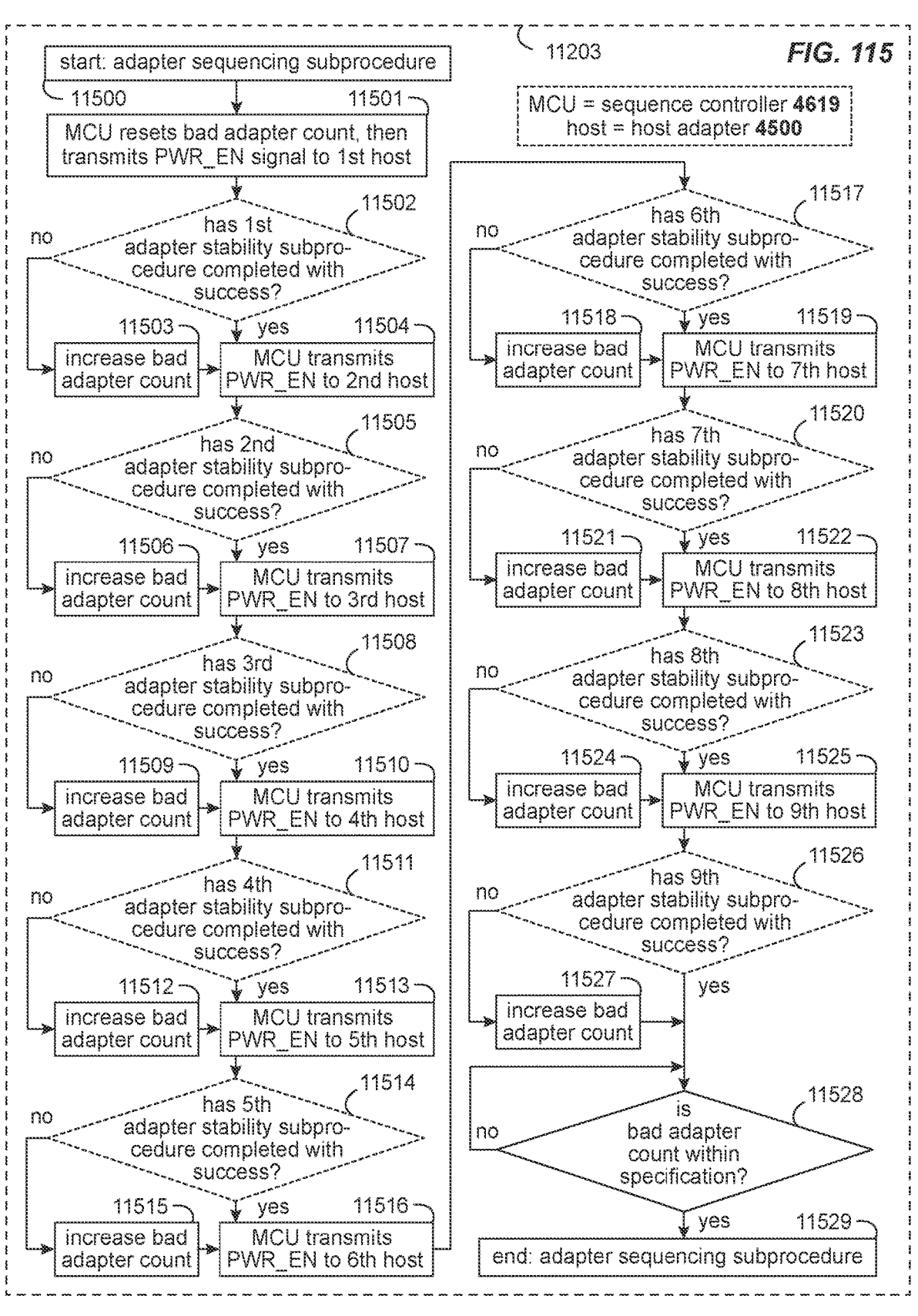

FIG. 115 illustrates an adapter sequencing subprocedure of a storage server according to an embodiment.

Figure 116:
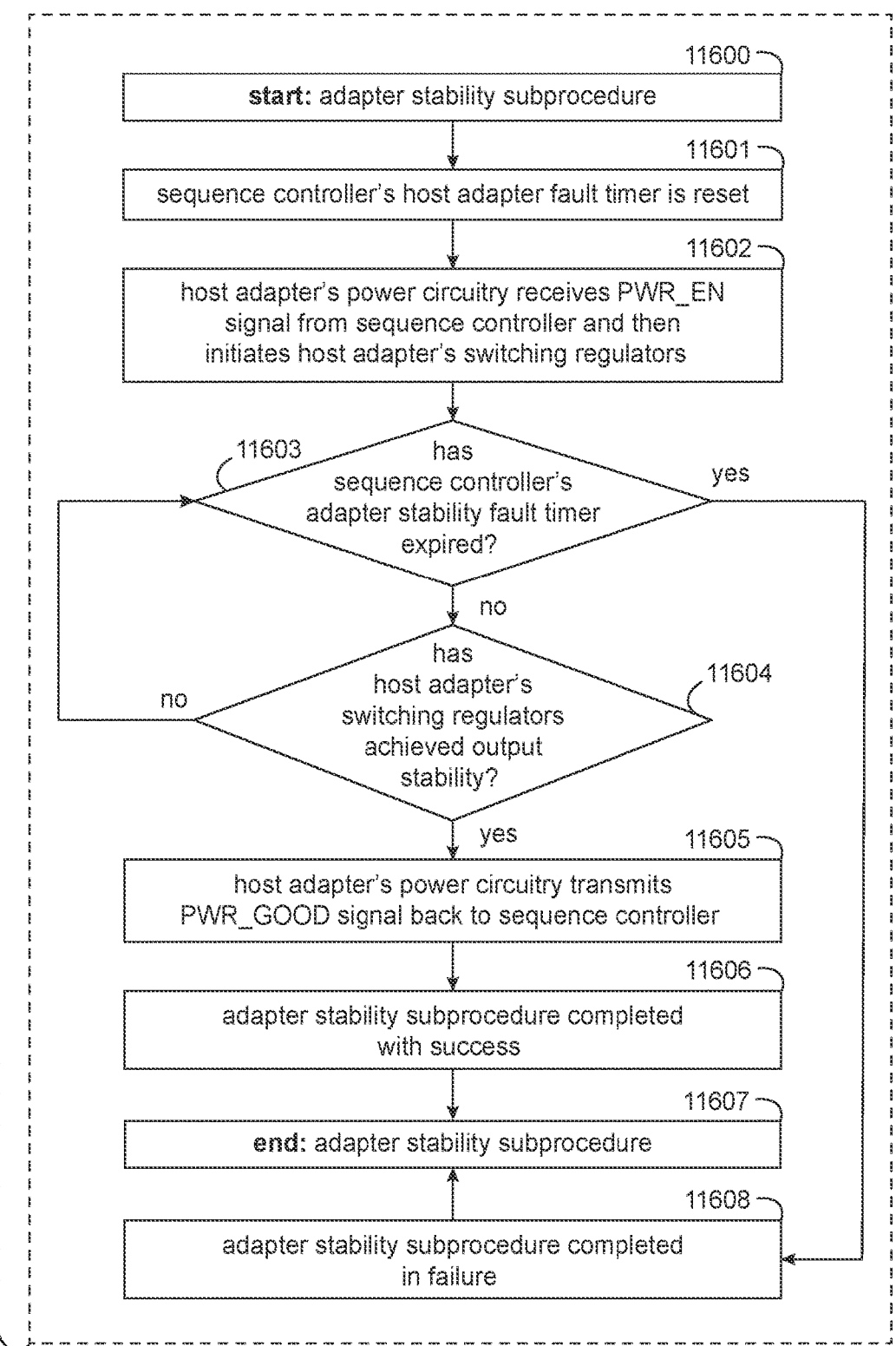

FIG. 116 illustrates an adapter stability subprocedure of a storage server according to an embodiment.

Figure 117:
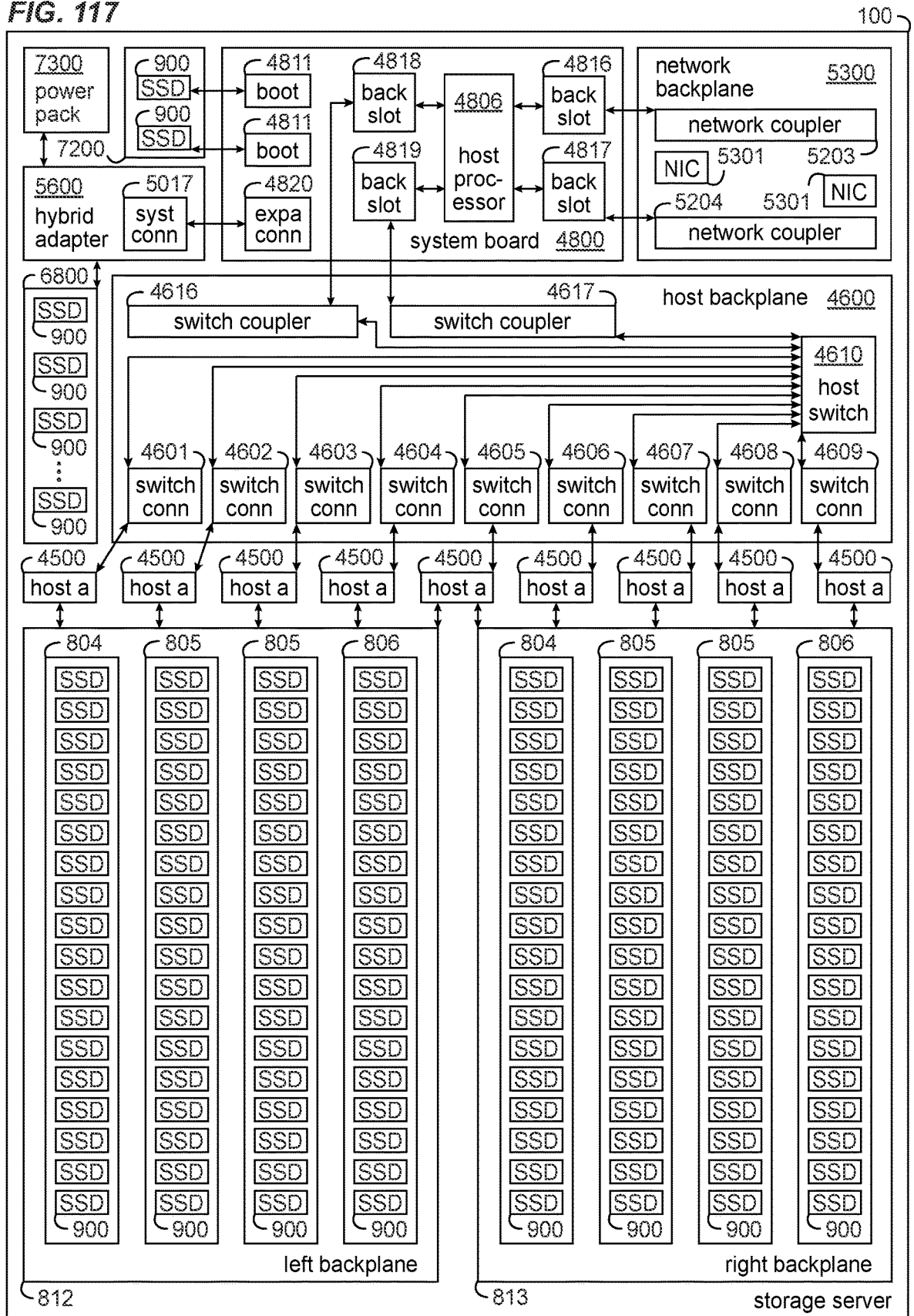

FIG. 117 illustrates an embodiment of a storage server.

Figure 118A:
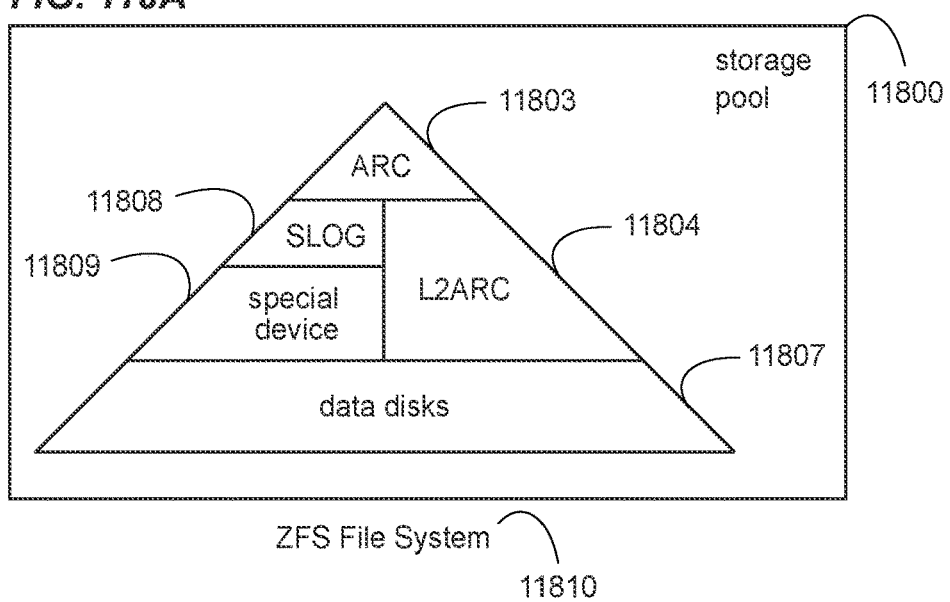

FIG. 118A illustrates an embodiment of a ZFS file system.

Figure 118B:
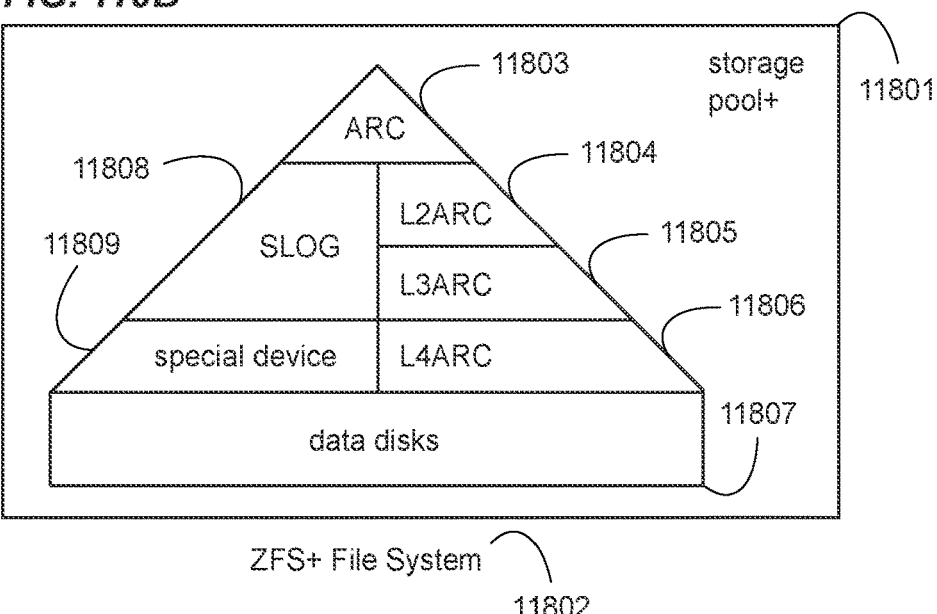

FIG. 118B illustrates an embodiment of a ZFS+ file system.

Figure 118C:
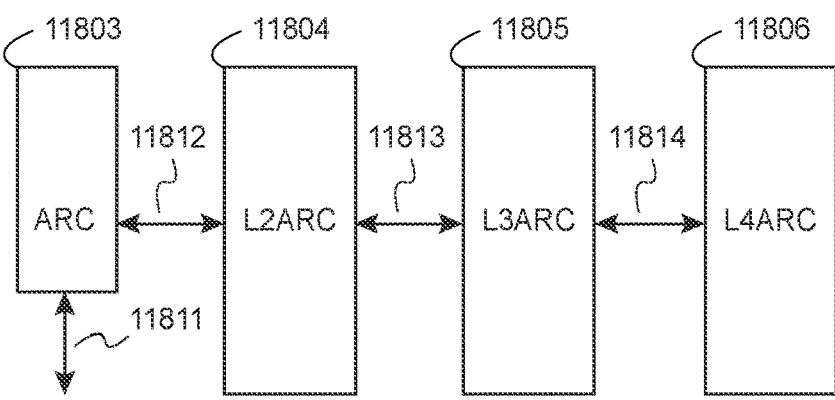

FIG. 118C illustrates an embodiment of a read cache tiering mechanism of a ZFS+ file system.

Figure 119:
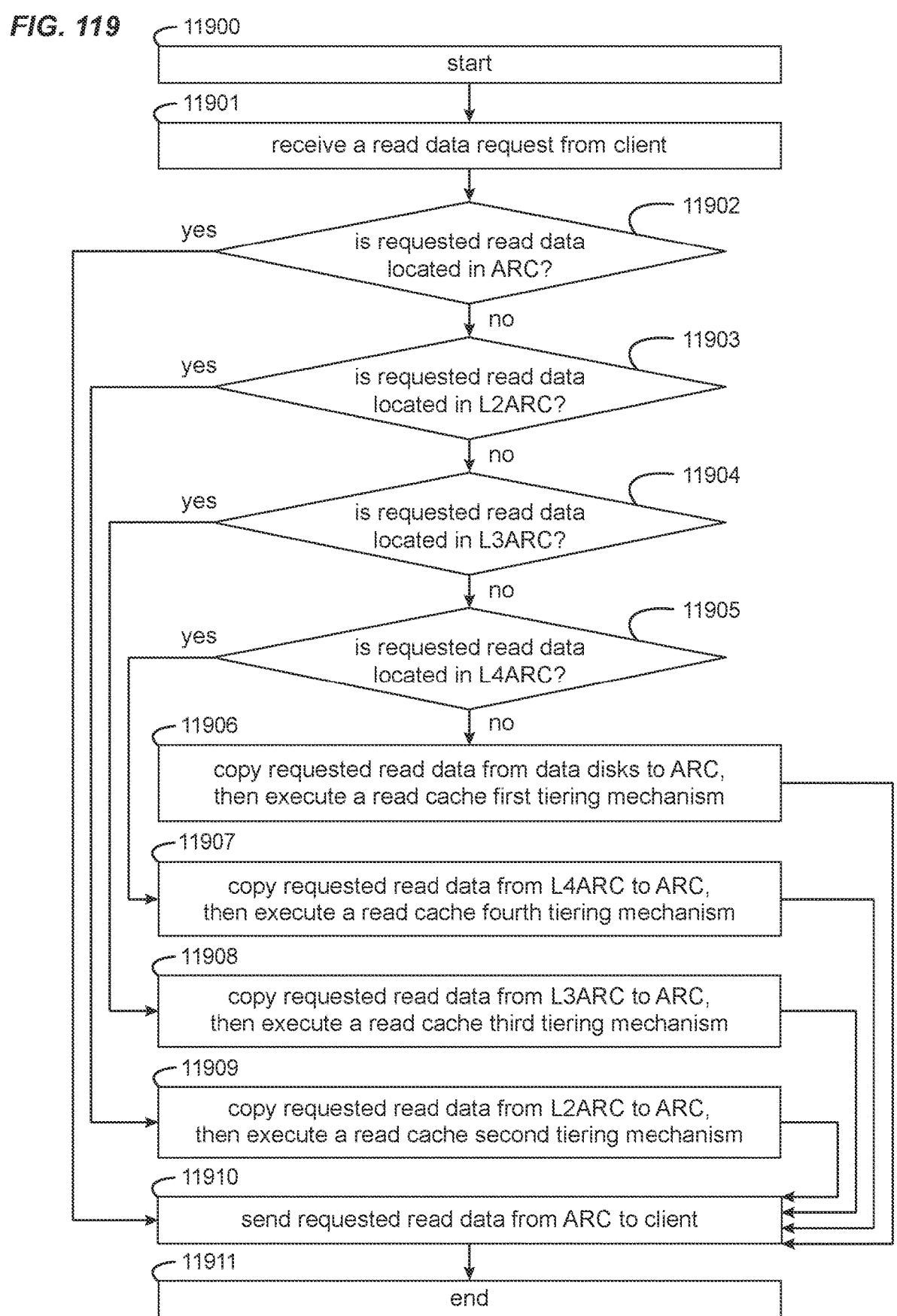

FIG. 119 illustrates a read cache tiering process of a ZFS+ file system according to an embodiment.

Figure 120:
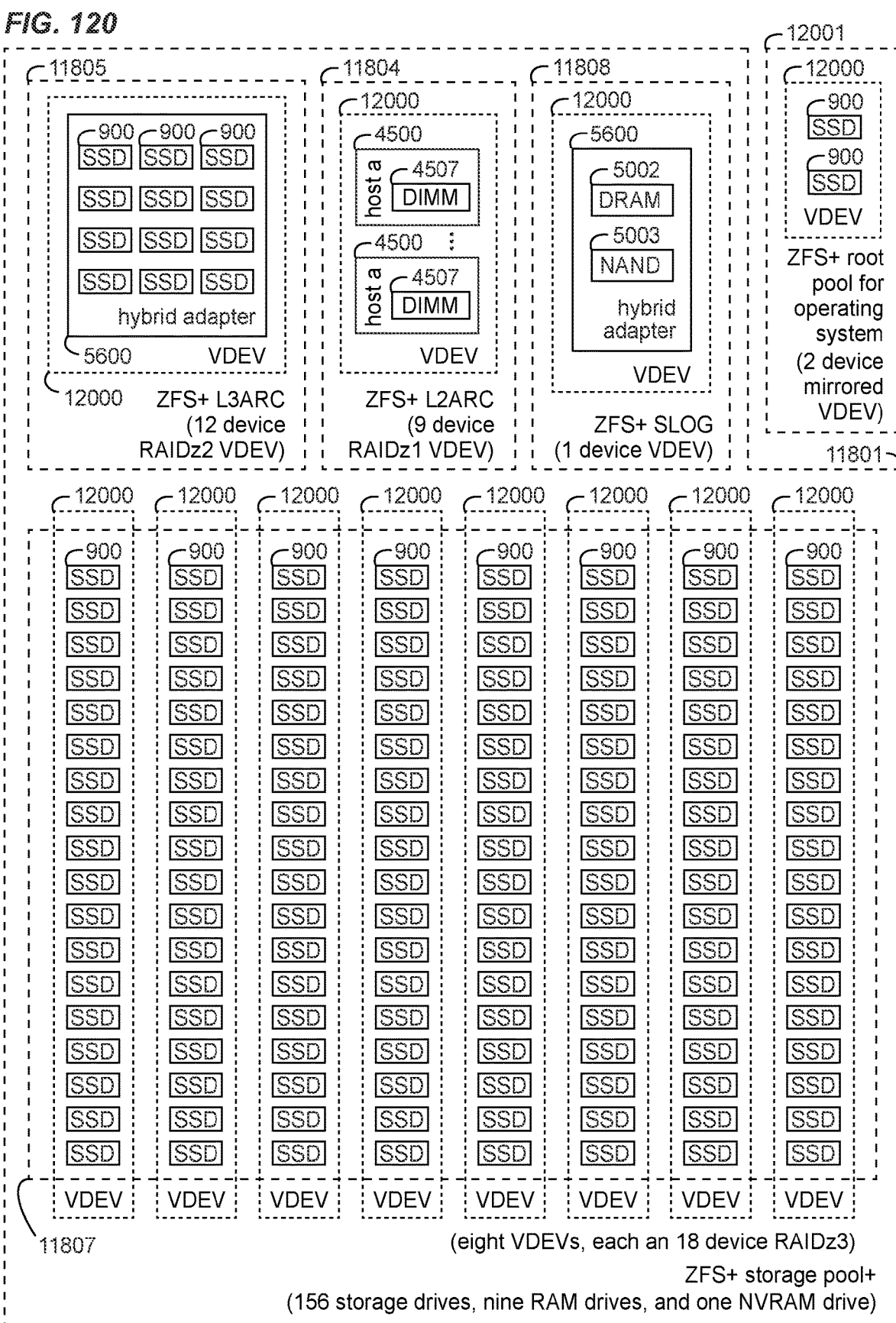

FIG. 120 illustrates an embodiment of various storage devices of a storage server mapped to various VDEVs of a ZFS+ file system.

Figure 121:
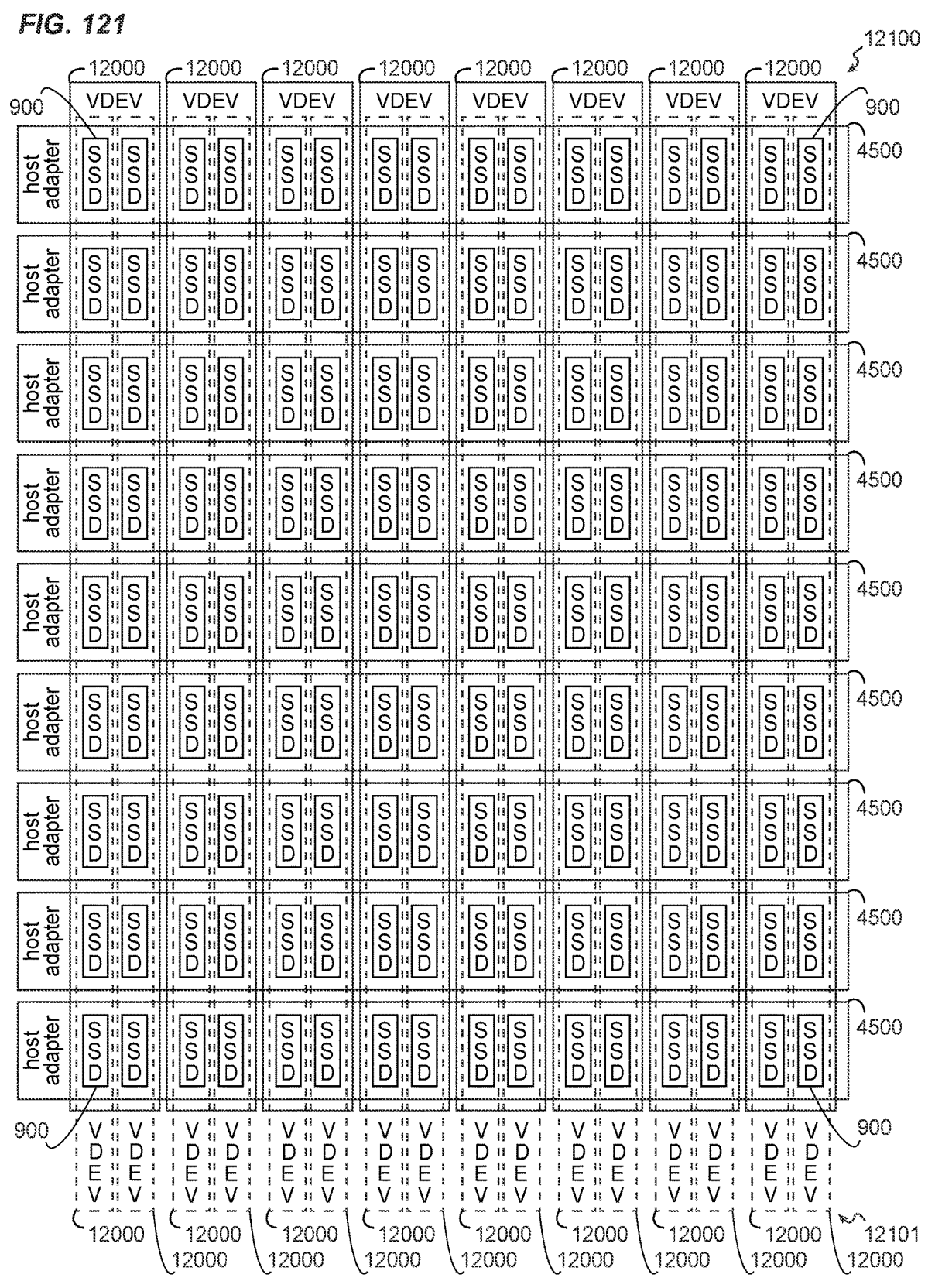

FIG. 121 illustrates two separate embodiments of storage drives located in a top section of a storage server being mapped to various VDEVs of a ZFS+ file system.

DETAILED DESCRIPTION OF EMBODIMENTS

Storage systems destined for a data center, and not a "desktop", are typically designed to be placed within a standardized enclosure (e.g. server rack cabinet). One such standard is the 19-inch rack in accordance with the Electronic Industries Association or EIA-310. Storage systems designed for installation in a 19-inch rack are often described as "rack-mounted". These 19-inch racks have designated form factors that are based on an agreed spacing standard, i.e. a rack unit, as defined in EIA-310. Examples may include "rack-mount" storage systems compliant to EIA-310 form factors, such as: one rack unit (1U), two rack units (2U), and four rack units (4U). These rack unit spaced enclosures are designed to be installed within a separate free-standing server rack cabinet. As used herein, a "free-standing" enclosure is a self-supporting and independent structure that is not intended to be mounted within a separate corresponding enclosure. Ergo, "desktop" storage systems (e.g. Desktop NAS) are free-standing, but "rack-mount" storage systems (e.g. 1U, 2U, and 4U) are not. As "rack-mount" storage systems are designed to be mounted within a corresponding server rack cabinet.

The term "desktop" is used herein to refer to possible placements of a free-standing storage system, but the inventive aspects of this disclosure apply to a plurality of possible storage system placements, positions, and locations. For example, said placements may include "on top of" the desk, "on the floor" besides the desk, "on the floor" under the desk, "on a shelf" above the desk, "on a stand" next to the desk, "on a shelf" in the office, and "on a cart" for mobility. Further, end-users value the amount of usable "desktop" space remaining following storage system placement. Thereby, these end-users may benefit from a reduction in the volume of the storage system targeting said placements. These end-user benefits resulting from a reduction in the volume of the storage system may be increased when said reduction applies to said storage system's "desktop" projection or footprint.

Further, the term "desktop" is used herein not only to refer to possible placements of a free-standing storage system, but to also refer to a default orientation (e.g. zero degree rotation) of said storage system. But, the inventive aspects of this disclosure apply to one or more possible orientations of said storage system, in addition to said default orientation. These orientations include various degrees of rotation (e.g. 90, 180, and 270 degrees) applied to said storage system with a complete rotation being defined as 360 degrees. Thus, a storage system's "desktop" orientation may include placement on either side of said storage system or even upside down (i.e. 180 degree rotation).

The term "NAS" is used herein and typically refers to a particular data type stored, in this case file-level (as opposed to block-level), but the inventive aspects of this disclosure apply to a plurality of stored data types and may include: file-level, block-level, and object-level. This block-level is typically the data type stored with a SAN (Storage Area Network). Thus, the inventive aspects of this disclosure apply to not only NAS servers, but also SAN and object servers.

The term "NAS" may also infer the type of external (to enclosure) cable attachment, in this case network attached (as opposed to Direct Attached Storage, i.e. DAS), but the inventive aspects of this disclosure apply to a plurality of attachment types and may include: Ethernet, PCIe (Peripheral Component Interconnect express), Thunderbolt, USB (Universal Serial Bus), and Fibre Channel. Said plurality of attachment types may also include specific transport protocols such as NVMe (Non-Volatile Memory express) over PCIe and multiple types of NVMe-oF (NVMe over Fabrics); such fabrics may include TCP/IP, Fibre Channel, InfiniBand, and RDMA.

The term "storage server" is used herein and refers to a storage system which supports (but is not limited to) various data being read and written to said system, via various networking protocols (e.g. NFS and/or SMB), by one or more clients (often concurrently). The storage system actualizes said data transfers (i.e. reads and writes) to a plurality of internally mounted storage drives, via various storage protocols (e.g. SATA and/or NVMe). Further, this storage system, which may utilize a client-server architecture, may provide not only shared storage but also various services, often via an API or Application Programming Interface, to such clients. Notably, the inventive aspects of this disclosure may also apply to alternative configurations of such storage system, such as a workstation and/or a personal computer. For example, a storage system (with both the client and server running locally on said system) may add an internally installed video card (e.g. GPU) and an externally attached monitor, keyboard, and mouse to also function as a work-station or even a personal computer.

The term "solid-state storage drive" is used herein, but the inventive aspects of this disclosure apply to a plurality of possible non-volatile storage media. For example, said media may include: SLC NAND, MLC NAND, TLC NAND, QLC NAND, PLC NAND, PCRAM, MRAM, STT-MRAM, ReRAM, NanoRAM, DDR type SDRAM backed by flash memory (via supercapacitors), and magnetic recordings via rotating platters (e.g. PMR/SMR, EAMR, HAMR, and MAMR).

The term "2.5-inch form factor" is used herein, but the inventive aspects of this disclosure apply to a plurality of possible storage drive form factors. For example, said form factors may include: 2.5" (SFF-8201/SFF-8223), 3.5" (SFF-8301/SFF-8323), 1.8" (SFF-8123), E1.S (SFF-TA-1006), E1.L (SFF-TA-1007), E3 (SFF-TA-1008), U.2 (SFF-8639), U.3 (SFF-TA-1001), Slim SATA (MO-297), mSATA (MO-300), and M.2 (2242, 2260, 2280, and 22110).

Although the present disclosure may be detailed and/or illustrated herein with respect to a 2.5" storage drive with either a designated, implied, or undisclosed height; the inventive aspects of this disclosure apply to a plurality of 2.5" storage drive heights. For example, heights (A1 dimension) as detailed in SFF-8201 Rev3.4 may include: 19.05 mm, 17.00 mm, 15.00 mm, 12.70 mm, 10.50 mm, 9.50 mm, 8.47 mm, 7.00 mm, and 5.00 mm.

The term "storage drive" is used herein, but the inventive aspects of this disclosure apply to various functionalities, in addition to a storage device, which may include: storage, non-storage, and combined storage and non-storage (e.g. computational storage) functionalities. Further, such functionality may include storage along with customized compute acceleration via an FPGA, CPU, GPU, DPU, or ASIC component(s). Such functionalities may also include generative AI applications.

The term "drive carrier capacity" as used herein, refers to the number of storage drives, via drive carriers, a storage system may support. Typically, a drive carrier is a mechanism used to secure a storage drive and facilitate installing said storage drive, via said carrier, into a storage system's "drive bay". This drive bay provides for physically containing, securing, and electrically connecting a storage drive to a storage system. Although certain inventive aspects of this disclosure apply to drive carriers as described herein, other inventive aspects apply to alternative drive carrier mechanisms and apparatus. These alternative carrier mechanisms and apparatus include install mechanisms which do not utilize a drive carrier attached to a storage drive and are often referred to as "carrier-less".

The term "CNC milling" is used herein, but the inventive aspects of this disclosure apply to a plurality of possible methods of production. For example, these methods may include CNC machining (i.e. CNC milling), die casting, additive manufacturing (i.e. 3D printing), a combination of casting and then CNC milling, or a combination of 3D printing and then milling.

The term "aluminum" is used herein, but the inventive aspects of this disclosure apply to a plurality of possible materials. For example, these materials may include various grades of aluminum alloy: 6061, 7075, 2024, and 5052. Further examples of such materials may include: titanium, brass, copper, stainless steel, plastics (e.g. acetal), and various high temp nickel alloys.

The term "surface treatment" is used herein, but the inventive aspects of this disclosure apply to a plurality of possible surface treatments (i.e. finishes). These treatments may include: electroless nickel, anodizing types I, IL, and III, and anodized light-absorbing matte black.

The term "file system" is used herein, but the inventive aspects of this disclosure apply to various possible functional combinations of both a file system and a volume manager. For example, the ZFS file system as defined prior to this disclosure and then improvements to said file system, such as the herein defined ZFS+ file system.

The present disclosure relates to a high-density storage system utilizing a free-standing enclosure. This high-density may be accomplished by maximizing the storage system's drive carrier capacity, which in turn maximizes the number of storage drives, all the while optimizing certain characteristics for "desktop" use. These characteristics may include, the storage system's desired power, thermal, and acoustic levels. These three characteristics are highly interdependent and thereby integral not only early in the product design and development phase, but to the final product. Also, they typically require dedicated feedback control systems continuously running within such storage system. For example, when the storage system's power utilization is increased (e.g. storage drive reads and writes), the fans may need to increase RPM (Revolutions Per Minute) to mitigate the resulting thermal increase as indicated by enclosure temperature sensors, which in turn may amplify the sound pressure levels (i.e. fan noise) resulting from said RPM increase. Thus, it is beneficial for the storage system to simultaneously optimize for all three of these characteristics. Further, it is beneficial to both maximize the number of storage drives within the storage system and to minimize the form factor of the storage system containing said storage drives, while delivering the acoustic, thermal, and power characteristics that are expected by an end-user for a storage system configured for "desktop" placement.

As to "desktop" power, the storage system's consumption profile should abide by the specifications of the AC mains electricity available to said "desktop", but the inventive aspects of this disclosure apply to a plurality of mains electricity types (i.e. utility power) and interfaces. For example in the United States and Canada, NEMA 5-15R is commonly the 15 A/125V specified electrical receptacle used by electrical outlets frequently found in residential and commercial properties. So for these markets, a NEMA 5-15R based outlet may correlate with the upper-limit of a "desktop" storage system's capabilities. That is, as the number of storage drives in a storage system are increased, the power draw consumed by said storage system may increase accordingly. Herein, idle power shall be defined as the minimum power an electrical device (e.g. storage drive or storage system) may use while functioning within specification and is typically less than said device's aver-age and peak power usage. So, the maximum number of storage drives that may be used by a storage system, with each storage drive drawing idle power, may be determined by the load capacity of the electrical outlet in which said storage system is connected. Ergo, the electrical outlet used by a "desktop" storage system may impose a theoretical and/or practical limit on the drive carrier capacity of said storage system and thereby the resulting storage capacity and data density provided by said storage system.

A process and/or mechanism which may enable a storage system to use a storage drive's idle power instead of said storage drive's peak power to optimally increase the maximum number of said storage drives able to be used by said storage system, when attached to various electrical outlets, shall be disclosed herein.

As to "desktop" thermals, the storage system should be capable of enclosure cooling which satisfies, within a specified margin, the thermal specifications of all the supported storage drives and all other electrical components within said enclosure. This cooling capability is typically provided by internally mounted fans, but the inventive aspects of this disclosure apply to a plurality of cooling methods which may include: heat pipe, thermosiphon, and refrigerant. For example, a storage system's multi-core CPU may use a heatsink with a graphene-based heat pipe.

As to "desktop" acoustics, a consequence of a storage system's "desktop" placement is often the proximity of said storage system to end-users. Minimizing the storage system's noise level may benefit end-users in the general vicinity of said storage system. Thus, a lower noise level is typically more desirable than a higher noise level for a storage system targeting the "desktop". This noise level will often correspond to the type, dimension, and RPM of one or more fans used to cool said storage system, e.g. a larger diameter fan may be more desirable as said fan may spin at a lower RPM to produce the same airflow (i.e. CFM) as a smaller diameter fan spinning at a higher RPM. This reduction of a fan's RPM typically reduces ambient noise. Even though the present disclosure may be detailed and/or illustrated herein utilizing certain fans, the inventive aspects of this disclosure apply to a plurality of fan types, fan dimensions, and fan speeds. For example, said plurality of fan types may include both axial and centrifugal fans and may include "long life" (e.g. 180,000 h/60 C) versions for difficult to access storage system locations and "standard life" (e.g. 40,000 h/60 C) otherwise.

Various examples of the high-density and free-standing storage system, introduced above, will now be described in further detail. The following description provides specific details for a thorough understanding and enabling description of these examples. One skilled in the relevant art will understand, however, that the techniques discussed herein may be practiced without many of these details. Likewise, one skilled in the relevant art will also understand that the embodiments may include many other obvious features not described in detail herein. Also, certain well-known structures or functions may not be shown or described in detail below, therefore avoiding the needless obscuring of the relevant description.

The terminology used below is to be interpreted in its broadest reasonable manner, even though said terminology is being used in conjunction with a detailed description of certain embodiments. For example, the term "may" refers to expressing the possibility that specific features or functions are present in an embodiment, and as such it is understood that said embodiment is not necessarily limited to having said features or functions. Indeed, some terms may even be emphasized below; however, any and all terminology intended to be interpreted in a restrictive manner will be specifically and overtly defined as such herein.

Figure 1:
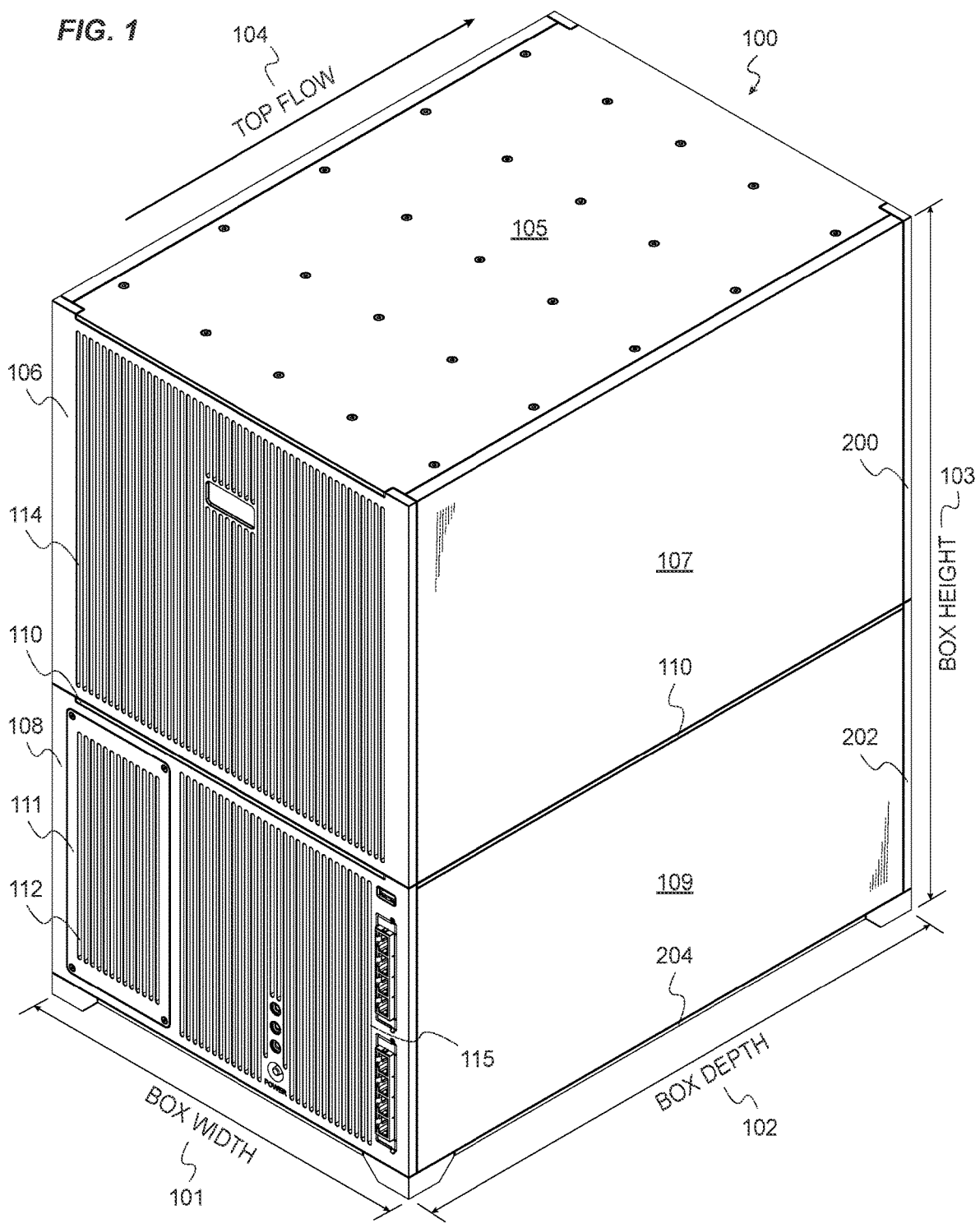
FIG. 1 illustrates a top, front, right perspective-view of a storage server according to an embodiment.
Figure 2:
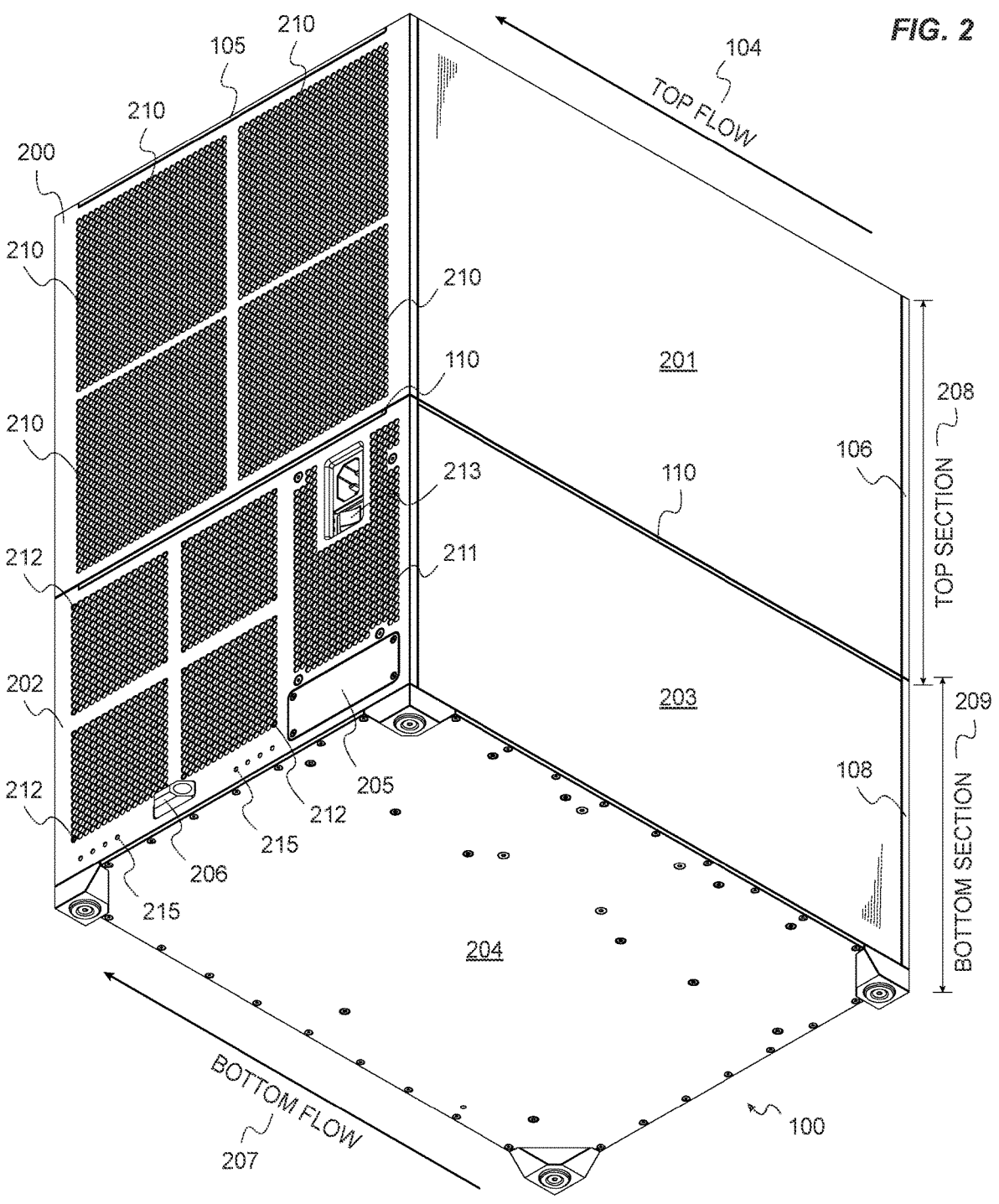
FIG. 2 illustrates a bottom, back, left perspective-view of a storage server according to an embodiment.

FIGS. 1 and 2 illustrate an embodiment of a desktop "storage system", named a storage server 100, which is high-density and free-standing. The storage server's 100 exterior dimensions used herein to refer to said server 100 are named as follows: a box width 101, a box depth 102, and a box height 103. For example, one embodiment of the storage server 100 may have the following approximate dimensions: 11" (279.4 mm) box width 101, 15.5" (393.7 mm) box depth 102, and 18.6" (472.4 mm) box height 103 which results in an approximate volume of 52 liters. However, the inventive aspects of this disclosure apply to various storage server 100 dimensional measurements (i.e. box width 101, box depth 102, and box height 103) and resulting volumes.

In further reference to FIGS. 1 and 2, the storage server's 100 exterior is comprised of "aluminum panels", named exterior panels, which include and are named: a top panel 105, a front upper panel 106, a right access panel 107, a front lower panel 108, a right side panel 109, a middle panel 110, a back upper panel 200, a left access panel 201, a back lower panel 202, a left side panel 203, and a bottom panel 204. The front lower panel 108 may have a "front access hatch", named a front hatch 111, and the back lower panel 202 may have a "back access hatch", named a back hatch 205. The left 201 and right 107 access panels, as well as the front 111 and back 205 hatches, are able to be removed and then reinstalled by the end-user, via various mechanisms, and may enable a bilateral accessibility to hot-swappable "storage devices", each named a storage drive 900, via "device sleds", each named a drive carrier 800.

Herein, the basis for defining the terms "bilateral access" is a naming nomenclature for the exterior sides (or faces) of the storage server's 100 enclosure. This naming nomenclature is as follows: FIG. 3A illustrates a top face 304 of the storage server 100, FIG. 3B illustrates a bottom face 305 of said server 100, FIG. 3C illustrates a front face 300 of said server 100, FIG. 3D illustrates a back face 301 of said server 100, FIG. 3E illustrates a left side 302 of said server 100, and FIG. 3F illustrates a right side 303 of said server 100. The present disclosure depicts the storage server 100 as a substantially rectangular cuboid, but the inventive aspects of this disclosure apply to various three-dimensional shapes for said server 100, such as a substantially square cuboid.

As illustrated in FIGS. 1 and 2, the storage server 100 is comprised of one or more sections. In an embodiment, two vertically delineated sections are depicted in FIG. 2, the first is an "upper section", named a top section 208 and the second is a "lower section", named a bottom section 209. The top section 208 may include the following exterior panels: the top panel 105, front upper panel 106, back upper panel 200, left access panel 201, right access panel 107, and the shared middle panel 110. Further, the bottom section 209 may include the following exterior panels: the shared middle panel 110, front lower panel 108, back lower panel 202, left side panel 203, right side panel 109, and the bottom panel 204. Also optionally included in the bottom section 209 is a "security mechanism", named a security hatch 206. The middle panel 110 may be shared between the top 208 and bottom 209 sections, per the overlap (as depicted in FIG. 2) of said sections 208 and 209. By sharing the middle panel 110, between such sections 208 and 209, the total number of panels used to construct the storage server 100 is reduced, which may result in a decreased cost and complexity for said server 100.

In alternative embodiments (not shown in figures), instead of the middle panel 110 being shared between the top 208 and bottom 209 sections, a separate panel exists for each said section 208 and 209.

In further reference to FIGS. 1 and 2. The top section's 208 "airflow direction", named a top flow 104, may flow from the front face 300, via the front upper panel's 106 "air intake", named a top intake 114, to the back face 301, via the back upper panel's 200 "air exhaust", named a top exhaust 210. The bottom section's 209 "airflow direction", named a bottom flow 207, may flow from the front face 300, via the front lower panel's 108 "air intake", named a bottom intake 115, and the front hatch's 111 "air intake", named a hatch intake 112, to the back face 301, via the back lower panel's 202 "air exhaust", named a bottom exhaust 212, and a separate "air exhaust", named a power exhaust 211. The power exhaust 211 exhausts air which may originate from an "ATX based power supply", named a power supply 213. Also, the truncated flow path originating from the back lower panel's 202 "air intake", named a back intake 215, may be purposefully restricted to minimize air ingest from said intake 215. This truncated flow path, relative to the bottom flow's 207 primary path, results from the back intake's 215 proximity to the bottom exhaust 212. Further, the substantially front face 300 to back face 301 direction of top flow 104 may be beneficial for bilateral access of drive carriers 800 from the left 302 and right 303 sides of the storage server 100.

Both FIGS. 1 and 2 illustrate an embodiment of the storage server 100 with bilateral drive carrier 800 access. The terms "bilateral access" as used herein, refer to storage drives 900, via drive carriers 800, which are accessible from two opposite or substantially opposite sides (or faces) of the storage server 100 which is free-standing. Two examples of such bilateral drive carrier 800 accessibility are illustrated in FIGS. 1 and 2. A first example includes drive carriers 800 bilaterally accessed from the left side 302 (via left access panel 201) and right side 303 (via right access panel 107). A second example includes drive carriers 800 bilaterally accessed from the front face 300 (via the front hatch 111) and back face 301 (via the back hatch 205). Although, the inventive aspects of this disclosure apply to all possible permutations of bilateral access of drive carriers 800 (and thus storage drives 900) from two opposite or substantially opposite sides and/or faces of the storage server 100.

In alternative embodiments (not shown in figures), drive carriers 800 are bilaterally accessed from: solely the left side 302 and right side 303, solely the front face 300 and back face 301, or all three opposing sides or faces (e.g. the left side 302 and right side 303, the front face 300 and back face 301, and the top face 304 and bottom face 305).

Figures 4A, 4B, 4C:
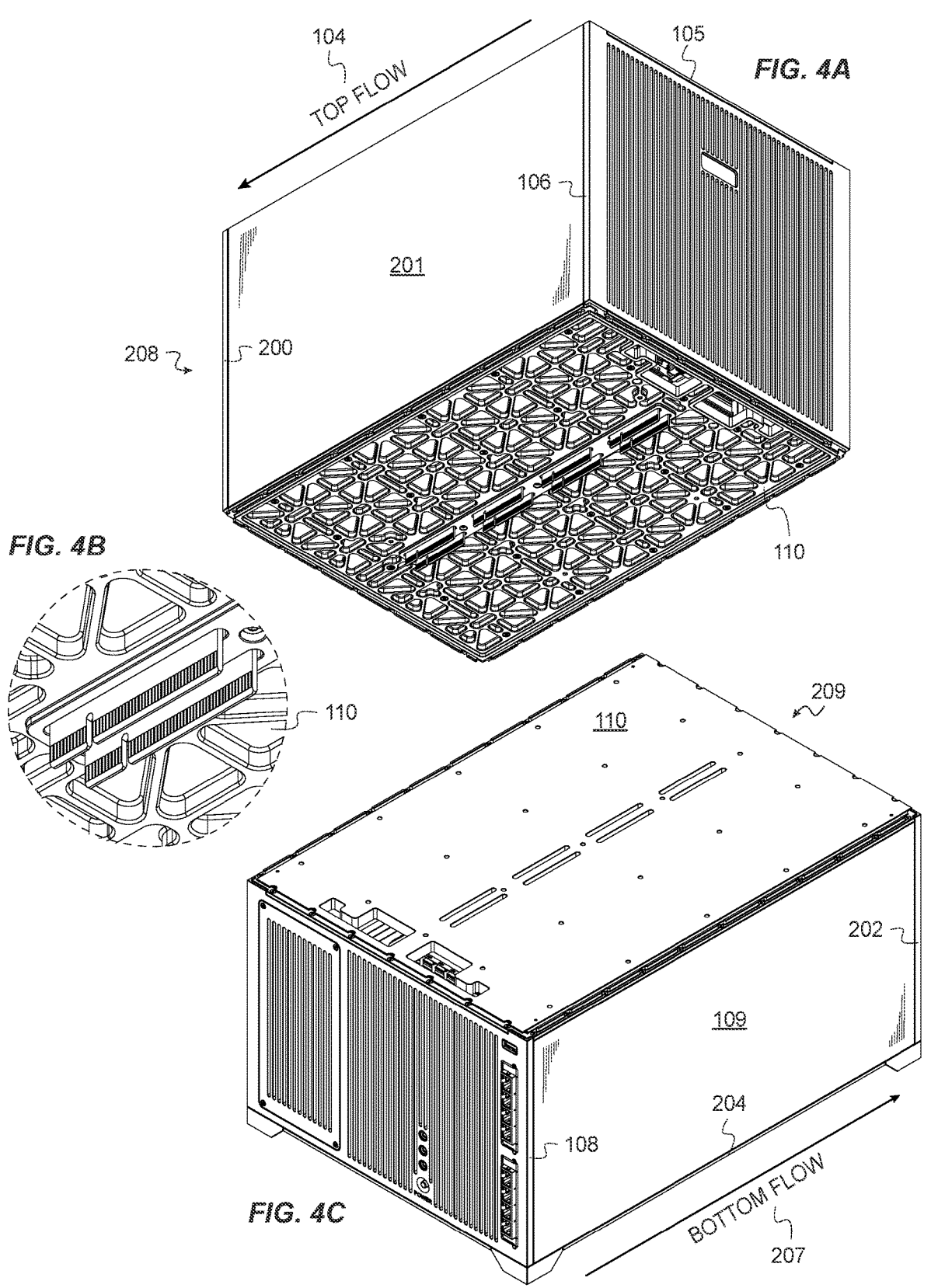
FIG. 4A illustrates a bottom, front, left perspective-view of a top section according to an embodiment.
FIG. 4B illustrates a detail-view of a top section according to an embodiment.
FIG. 4C illustrates a top, front, right perspective-view of a bottom section according to an embodiment.

As illustrated in FIGS. 4A and 4C, the storage server 100 is comprised of the top section 208 and bottom section 209 respectively, where each such section 208 and 209 utilizes the same, and thus shared, middle panel 110. The storage server 100 may be constructed as such so that each section 208 and 209 equates to a bounded volume, as demarcated by the corresponding exterior panels 105-110 and 200-204, and where each may be volumetrically optimized for a specific purpose. In FIG. 4A, the top section 208 is purposed to maximize drive carrier 800 capacity via opposite facing "row/column" arrangements of drive carriers 800 optimized to support bilateral accessibility. In FIG. 4C, the bottom section 209 is purposed to contain the computer and control subsystems (including power conversion for the storage drives 900) and supplemental storage capacity via additional storage drives 900. So, as the top section 208 may be located above (i.e. on top of) the bottom section 209 this vertically stacked configuration may desirably result in storage servers 100 with increased aggregate drive carrier 800 capacity and may do so without increasing said server's 100 "desktop" footprint (i.e. box width 101 times box depth 102). Also, the storage server's 100 top 208 and bottom 209 sections may perform beneficially as stand-alone thermal zones, where each such zone may have dedicated cooling mechanisms which may be controlled and optimized independently.

The storage server 100 may support two or more drive carriers 800 and thus two or more storage drives 900. In an embodiment, the top section's 208 left 302 and right 303 sides may each have the drive carrier 800 capacity of seventy-two, resulting in the top section's 208 combined capacity of one hundred forty-four storage drives 900. The bottom section's 209 front face 300 may have the drive carrier 800 capacity of twelve and the back face 301 may have the drive carrier 800 capacity of two for the bottom section 209 total of fourteen storage drives 900. So, the storage server 100 may have a total drive carrier 800 capacity of one hundred fifty-eight hot-swappable storage drives 900. Further, the one hundred fifty-eight storage drives 900 may be bilaterally accessed from the free-standing storage server 100 which may have an enclosure volume of approximately fifty-two liters (e.g. 11" box width 101, 15.5" box depth 102, 18.6" box height 103); thereby resulting in a data density of approximately 0.33 L per storage drive 900. However, the inventive aspects of this disclosure apply to various storage server 100 dimensions (e.g. box width 101, box depth 102, and box height 103), various resulting enclosure volumes of said server's 100 various dimensions (e.g. box width 101, box depth 102, and box height 103), and various data densities per storage drive 900 resulting from said server's 100 various enclosure volumes.

As illustrated in FIGS. 4A-4C, the shared middle panel 110 integrates the top section 208 to the bottom section 209. Illustrated in FIGS. 5A-5L, this integration is achieved via certain mechanisms which include but are not limited to the following: one or more (e.g. twenty-five) counterbored clearance holes 501-504 and four threaded blind holes 514-517 to structurally attach the middle panel 110 to the top section 208, two or more (e.g. thirty-six) countersunk clearance holes 525-528 to structurally attach the middle panel 110 to the bottom section 209, one or more (e.g. four) "oblong holes" which are each named a left power slit 532-535 to enable a "storage backplane" which is named a left backplane 812 to extend from the top section 208 into the bottom section 209, one or more (e.g. four) "oblong holes" each of which is named a right power slit 536-539 to enable a "storage backplane" which is named a right backplane 813 to extend from the top section 208 into the bottom section 209, and one or more (e.g. two) irregular cutouts where the left side's 302 "irregular cutout" is named a left cutout 530 and the right side's 303 "irregular cutout" is named a right cutout 531. The left 530 and right 531 cutouts may be used to channel the storage drive's 900 electrical connections (i.e. cables) between the top 208 and bottom 209 sections. Also, the middle panel 110 may be used to reduce EMI radiating between the top 208 and bottom 209 sections.

Figures 5A, 5B:
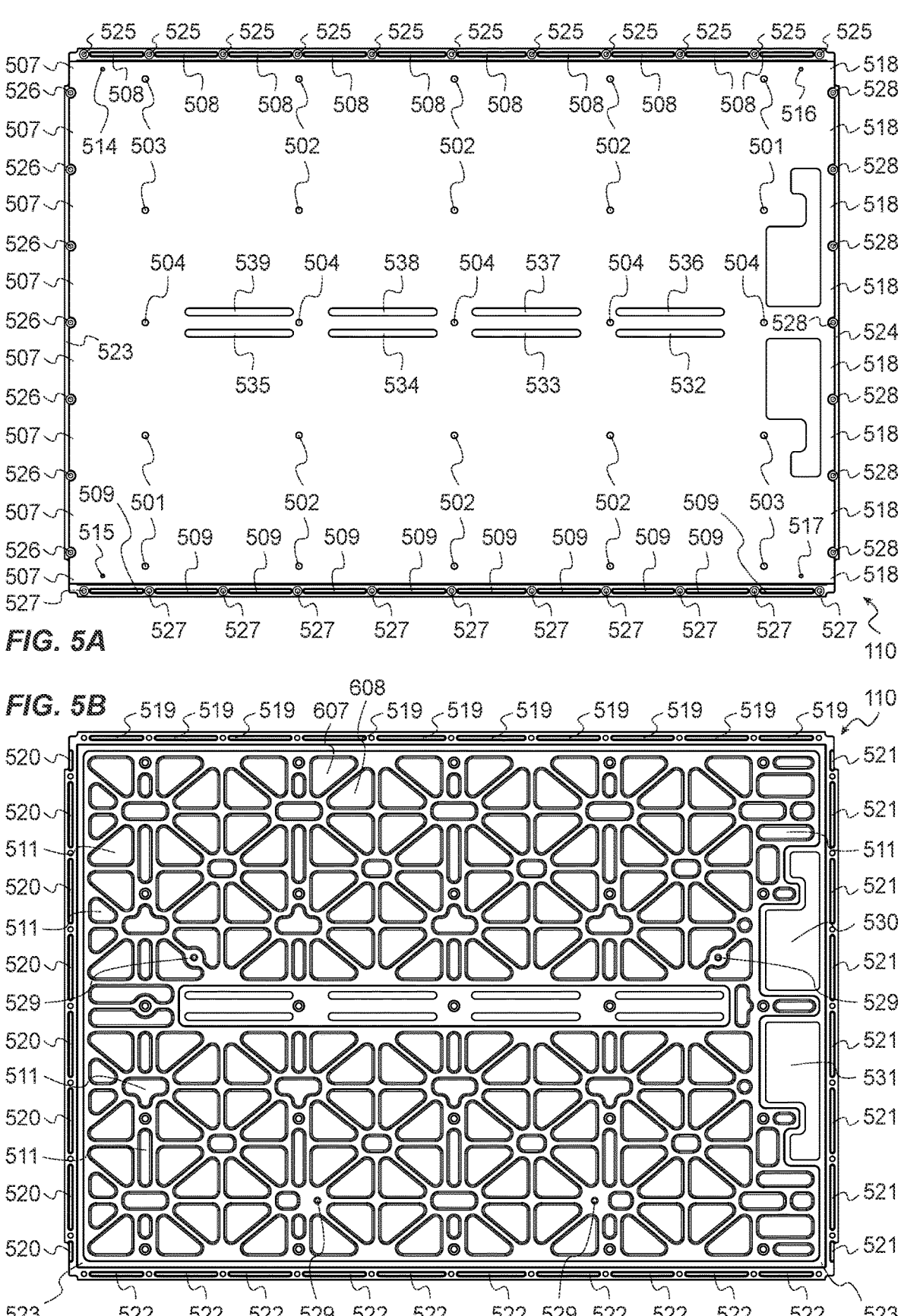
FIG. 5A illustrates a top orthographic-view of a middle panel according to an embodiment.
FIG. 5B illustrates a bottom orthographic-view of a middle panel according to an embodiment.
Figures 5C, 5D, 5E, 5F:
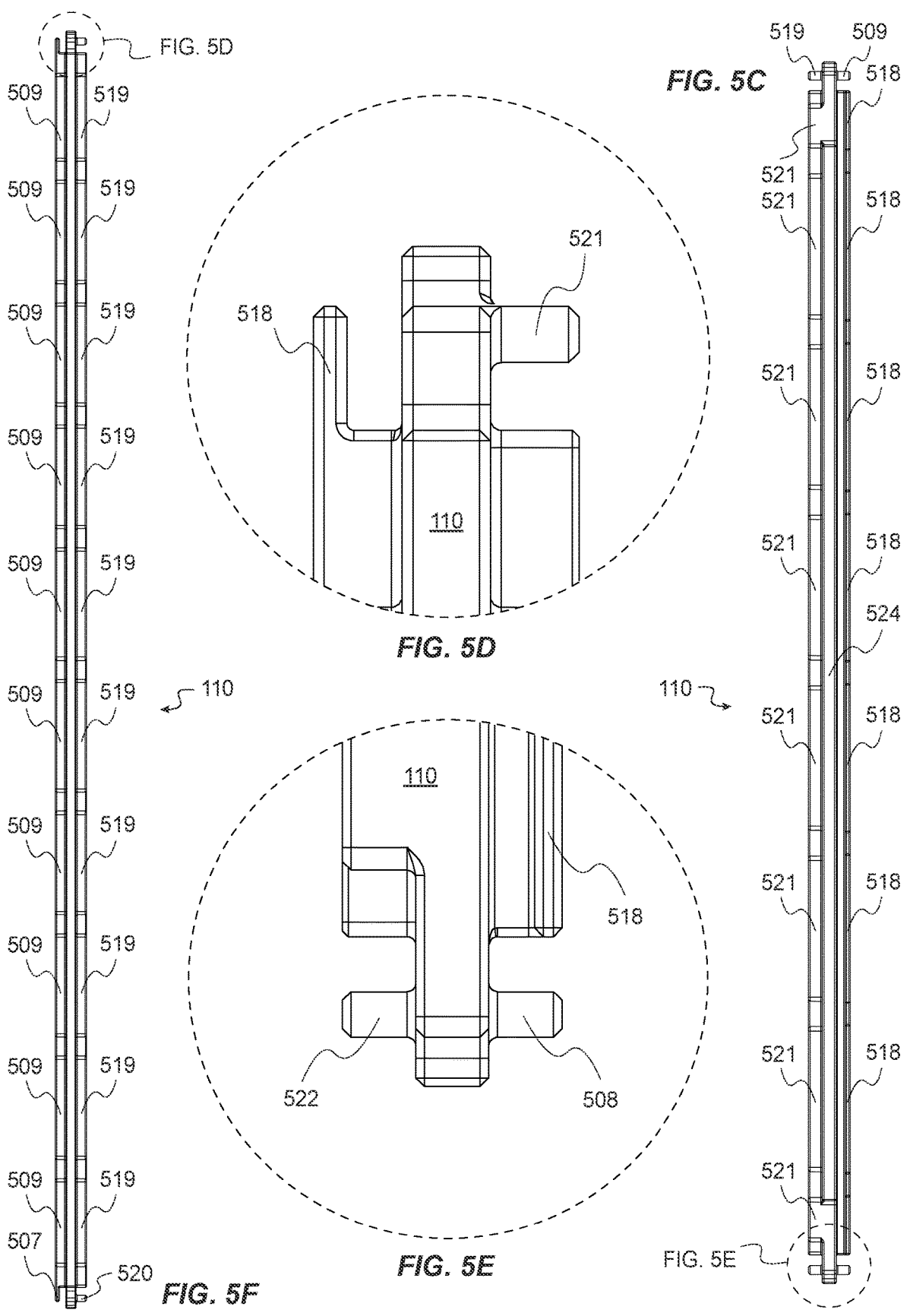
FIG. 5C illustrates a front orthographic-view of a middle panel according to an embodiment.
FIGS. 5D and 5E illustrate detail-views of a middle panel according to an embodiment.
FIG. 5F illustrates a left orthographic-view of a middle panel according to an embodiment.

Illustrated in FIGS. 5A and 5B is the middle panel 110 which integrates various EMI containment mechanisms. These EMI mechanisms may include: two or more (e.g. sixteen) EMI blades 507 and 518 which may be inserted into two or more (e.g. sixteen) EMI sheaths 3206 and 3106 respectively, two or more (e.g. ten) top facing 304 EMI tabs 509, two or more (e.g. ten) top facing 304 EMI tabs 508, two or more (e.g. ten) bottom facing 305 EMI tabs 519, two or more (e.g. ten) bottom facing 305 EMI tabs 522, and two or more (e.g. sixteen) bottom facing 305 EMI tabs 520 and 521.

Also illustrated in FIGS. 5A and 5B, the middle panel 110 includes the left cutout 530 to route the left custom cables 10600 and the right cutout 531 to route the right custom cables 10700 between the top section 208 and the bottom section 209. The left cutout 530 (channeling left custom cables 10600) and the right cutout 531 (channeling right custom cables 10700) may or may not be sealed (e.g. airtight or not airtight), and thus may result in a certain amount of air exchange between such sections 208 and 209. Therefore, the top 104 and bottom 207 flows may intermix within the storage server 100, but the volume of such interchange may be minor relative to the aggregate volume of said flows 104 and 207.

As illustrated in FIG. 5B, the storage server's 100 middle panel 110 has a plurality of "pockets", each named a panel pocket 511. The panel pockets 511 may be predominately triangle shaped, but the inventive aspects of this disclosure apply to a plurality of possible pocket shapes (e.g. circle, rectangle, and slotted hole). As such panel pockets 511 may be formed via CNC milling, said pocket's 511 interior corners (i.e. angles) typically have concave fillets 618 (e.g. 0.13" radius) to ease said milling. The "user facing" surface (e.g. in FIG. 5A, FIG. 6B, FIG. 30A, FIG. 58A, and FIG. 78C) of the panel pockets 511 may be solid as said pockets 511 are machined to a depth that minimizes said surface's thickness (e.g. 0.05") while still providing said surface with structural integrity. The panel pocket's 511 machined "floor", named a pocket floor 619, may have a "fillet", named a pocket fillet 620 (e.g. 0.03" radius), to facilitate machining; and the panel pocket's 511 machined "wall", named a pocket wall 621, may have a "chamfer", named a wall chamfer 622 (e.g. 0.025"), to ease end-user handling. The panel pockets 511 may be utilized to reduce the mass (i.e. weight) of certain exterior panels (e.g. top panel 105, right access panel 107, right side panel 109, middle panel 110, left access panel 201, left side panel 203, and bottom panel 204) of the storage server 100 while retaining as much of the structural integrity of the pre-pocketed panel as is possible and practical.

As illustrated in FIGS. 6A-6F, a "end-user removable panel", named an access panel 600, is designed in such a way as to be used as both the storage server's 100 left access panel 201 and right access panel 107. Minimizing the number of distinct panels may be beneficial as said minimization may lower production cost. The access panel 600 when instanced as both the left access panel 201 and the right access panel 107 may provide the following functionality: a bilateral accessibility to the top section's 208 drive carriers 800, a mechanism to safeguard drive carriers 800 (and thus storage drives 900) from unintended removal, an electromagnetic interference (EMI) containment capability, and a marketing messaging capability via engraving 601 of a company name, a product name, and/or logo.

Figures 6D, 6E, 6F:
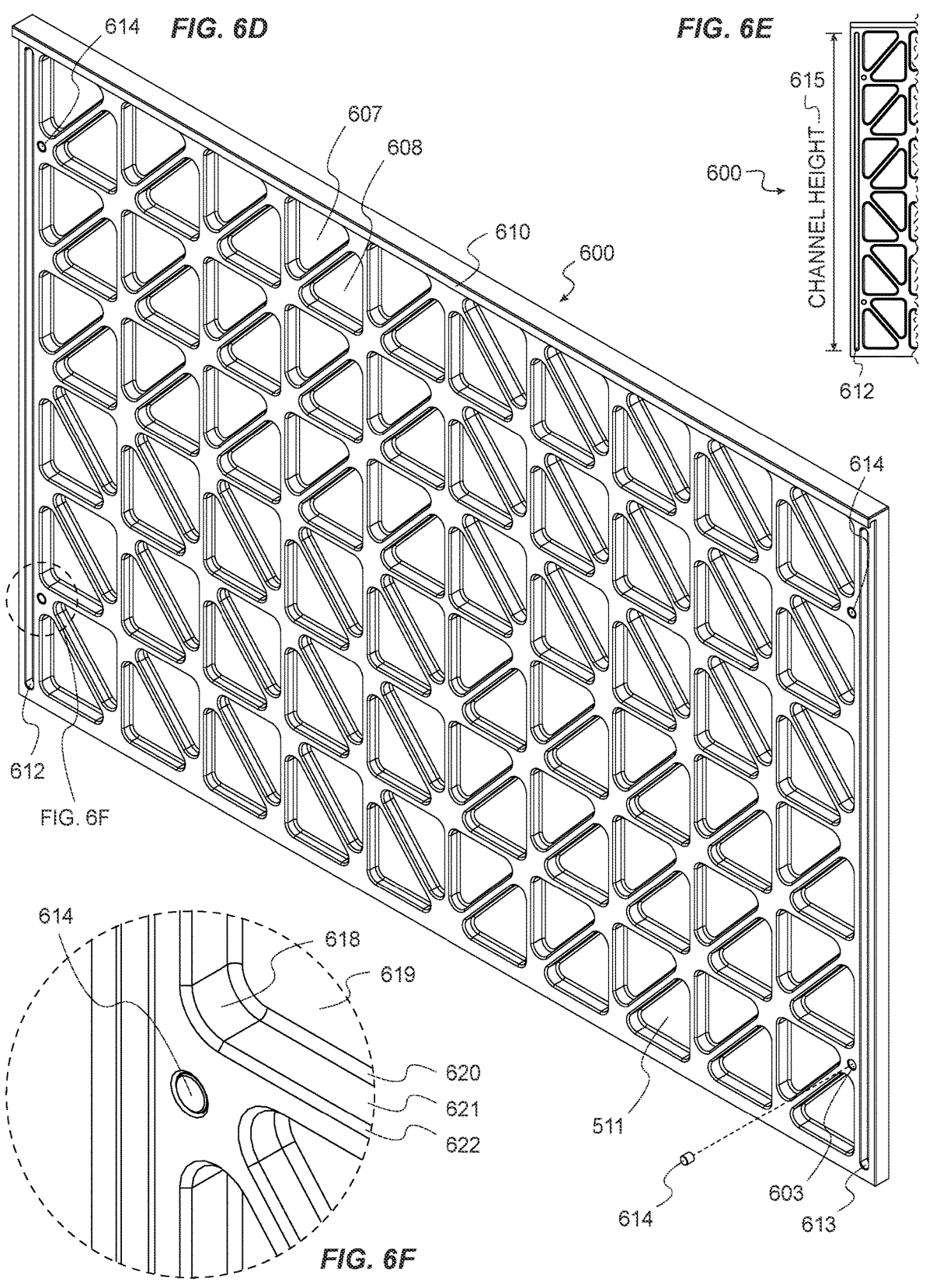
FIG. 6D illustrates a perspective-view of an access panel according to an embodiment.
FIG. 6E illustrates a partial-view of a channel height of an access panel according to an embodiment.
FIG. 6F illustrates a detail-view of an access panel according to an embodiment.

As illustrated in FIGS. 6A and 6D, the access panel's 600 mass is minimized, while maximizing structural rigidity, by implementing particular patterns of panel pockets 511. These patterns may include mirroring about a vertical center line, as indicated via a first dashed line 606, and/or a horizontal center line, as indicated via a second dashed line 609. These mirrored patterns may be comprised of replicated panel pockets 511, replicated subpatterns of said pockets 511, or replicated groupings of subpatterns of said pockets 511. In an embodiment, a sub-pattern may be comprised of a specifically positioned pair of panel pockets 511 with are also right triangles a "first" of which is named a first right pocket 607 and a "second" of which is named a second right pocket 608. The right pockets 607 and 608 may be positioned such that the hypotenuse of the first right pocket 607 is both parallel to and alongside the hypotenuse of the second right pocket 608 to create a rectangular shaped sub-pattern which may then be replicated and mirrored. This replication, of a rectangular composited sub-pattern, may be repeated in a horizontal direction, a vertical direction, or concurrently in both directions. For example, in FIG. 6A this composited sub-pattern of right pockets 607 and 608 is instanced five times horizontally and three times vertically and then mirrored about a horizontal center line 609 and then mirrored again about the vertical center line 606 to create sixty subpatterns of said right pockets 607 and 608.

As illustrated in FIGS. 6D and 6F, the access panel 600 embeds one or more (e.g. four) "magnets", each named a panel magnet 614, for affixing said panel 600 to the storage server 100. In an embodiment, panel magnets 614 (e.g. nickel coated neodymium, grade N42 or N52) may facilitate self-alignment of the left access panel 201 and the right access panel 107. The panel magnets 614 may be embedded into the access panel's 600 blind holes 602-605 via an arbor press or with various adhesive glues (e.g. 3M Epoxy DP100). The blind holes 602-605 may be CNC drilled to a depth equal to the thickness (e.g. ⅛" or ¼") of such panel magnets 614 or with an additional depth if an adhesive is used to secure said magnets 614. This combined depth is typically less than the corresponding access panel 600 thickness (e.g. ¼"). These panel magnets 614 may be replaced with various ferromagnetic materials of different shapes and sizes which in turn may adjust the expected removal force of the access panels 107 and 201.

As illustrated in FIGS. 6A and 6D, the access panel 600 includes a plurality of EMI containment cavities (i.e. slotted holes) which may be continuous, the "first cavity" is named a first EMI channel 612 and the "second cavity" is named a second EMI channel 613. The EMI channels 612 and 613 may enclose corresponding EMI containment protrusions (which may also be continuous), the "first protrusion" is named a first EMI rail 724 and the "second protrusion" is named a second EMI rail 725.

Illustrated in FIG. 6E is a partial-view of the access panel 600. This partial-view depicts an EMI channels 612 with an elongated "height", named a channel height 615.

Illustrated in FIG. 6C, the access panel 600 includes a plurality of EMI containment "cavities" (i.e. slotted holes), each named an EMI slot 611. The EMI slots 611 may enclose corresponding EMI containment protrusions, a "first protrusion" is named a first EMI tab 508 and a "second protrusion" is named a second EMI tab 509. To wit, the left access panel's 201 EMI slots 611 may enclose the middle panel's 110 second EMI tabs 509, and the right access panel's 107 EMI slots 611 may enclose the middle panel's 110 first EMI tabs 508. Nominally, the access panels 600 may be designed such that when installed the EMI slots 611 and the corresponding EMI tabs 508 and 509 may be separated by a minimized air gap (e.g. 0.01"). As access panels 107 and 201 may be CNC milled, such air gaps may be specified to account for variances resulting from said machining and to improve fitment (i.e. attachment and removal). Hence, these air gaps beneficially facilitate the attachment and removal of left 201 and right 107 access panels and to and from the middle panel 110. Further, the EMI slots 611 may have a "fillet", named an access fillet 617 (e.g. 0.025" radius), to ease CNC milling and a "chamfer", named an access chamfer 616 (e.g. 0.015"), to ease end-user handling. EMI slots 611 (similarly for the corresponding EMI tabs 508 and 509) may share various features: length, width, depth for EMI slots (or height for EMI tabs), and air gap adjustments. However, the inventive aspects of this disclosure apply to a plurality of such features and dimensions.

As illustrated in FIGS. 6A, 6C, and 6D, the access panel 600 includes a continuous EMI containment "protrusion" which is named an EMI overhang 610. The EMI overhang 610 may interlock with a corresponding EMI containment recess (which may also be continuous), named an EMI gutter 3005 and 3006. To wit, the left access panel's 201 EMI overhang 610 may interlock with the top panel's 105 EMI gutter 3005, and the right access panel's 107 EMI overhang 610 may interlock with the top panel's 105 EMI gutter 3006. This continuity is defined herein as follows: for the juncture upon which EMI is being mitigated there exists one EMI overhang 610 that corresponds to each EMI gutter 3005 and 3006 for the length of said juncture. Said continuity of the EMI overhang 610 and the corresponding EMI gutter 3005 and 3006 may improve the EMI mitigation effectiveness of said overhang 610 and gutter 3005 and 3006. Nominally, access panels 107 and 201 may be designed such that when installed the EMI overhang 610 and the corresponding EMI gutters 3005 and 3006 may be separated by a minimized air gap (e.g. 0.01"). This air gap may beneficially facilitate the attachment and removal of access panels 107 and 201 to and from the top panel 105. EMI mitigation may also benefit when such gaps are minimized and CNC milling of such panels 107 and 201 may assist in such. The EMI gutters 3005 and 3006 may share similar features: length, width, height, and air gapping. However, the inventive aspects of this disclosure apply to a plurality of such features and dimensions.

Figure 6G:
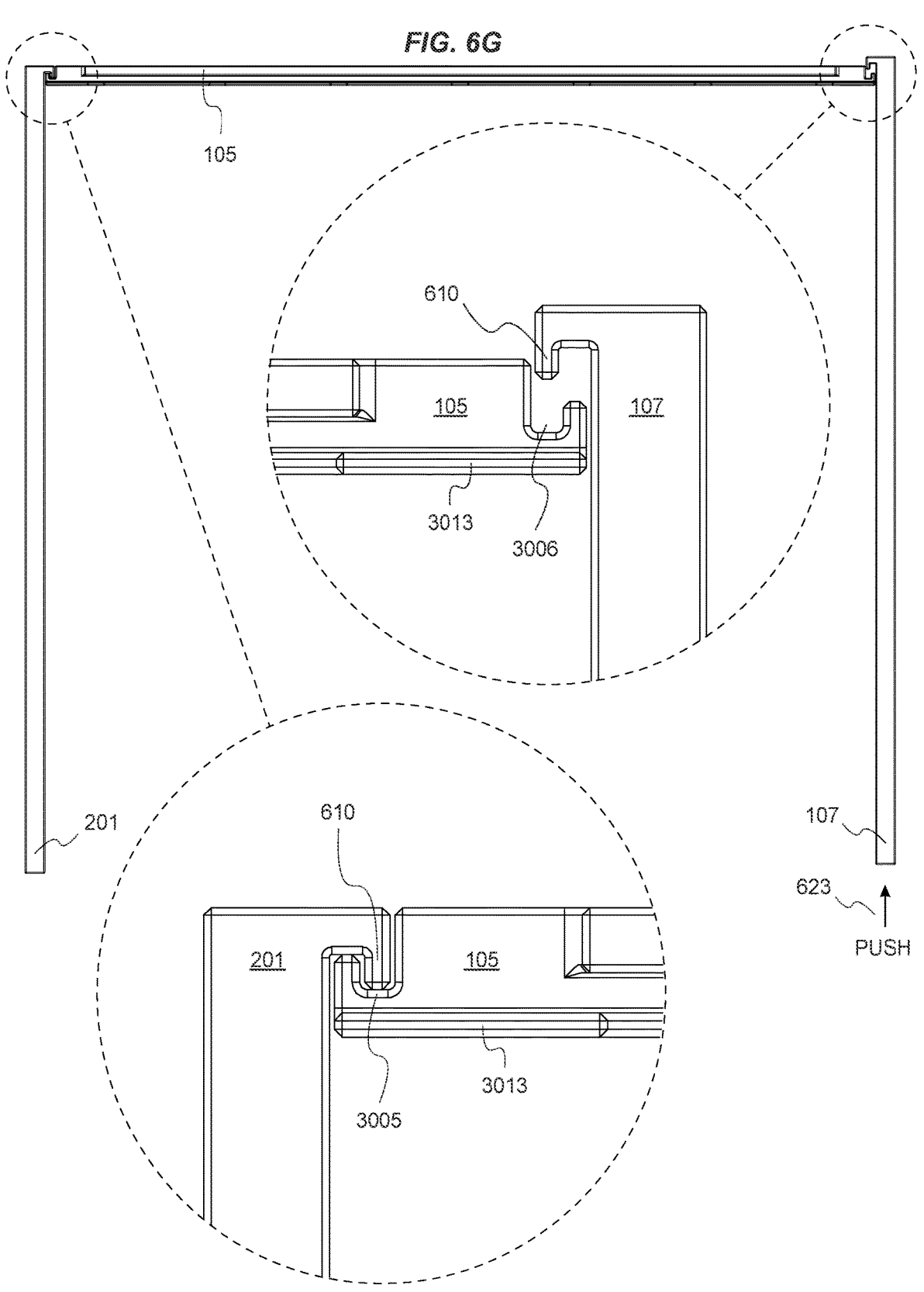
FIG. 6G illustrates a front orthographic-view, with additional detail-views, of a left access panel attached to a top panel and the removal of a right access panel from a top panel according to an embodiment.
Figure 6H:
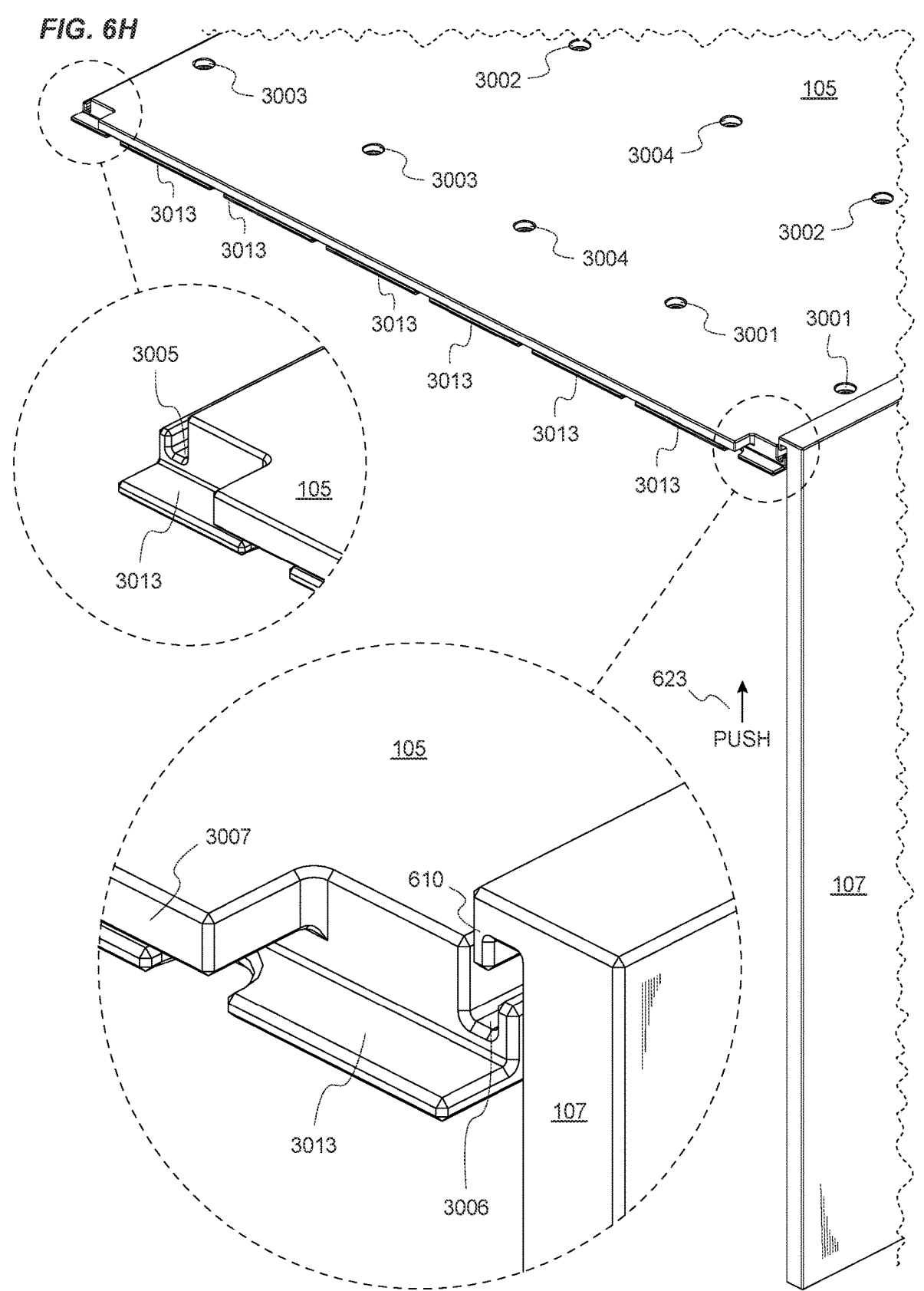
FIG. 6H illustrates a partial-view, with additional detail-views, of the removal of a right access panel from a top panel according to an embodiment.

Illustrated in FIGS. 6G and 6H (via a partial-view) are the left 201 and/or right 107 access panels in various installation positions (i.e. states) relative to the top panel 105. To wit, the left access panel 201 may be fully attached to the top panel 105 (see FIG. 6G), the right access panel 107 may be partially removed from said panel 105 (see FIGS. 6G and 6H), and the left access panel 201 may be fully removed from said panel 105 (see FIGS. 6I-6M).

Figures 6I, 6J, 6K, 6L, 6M:
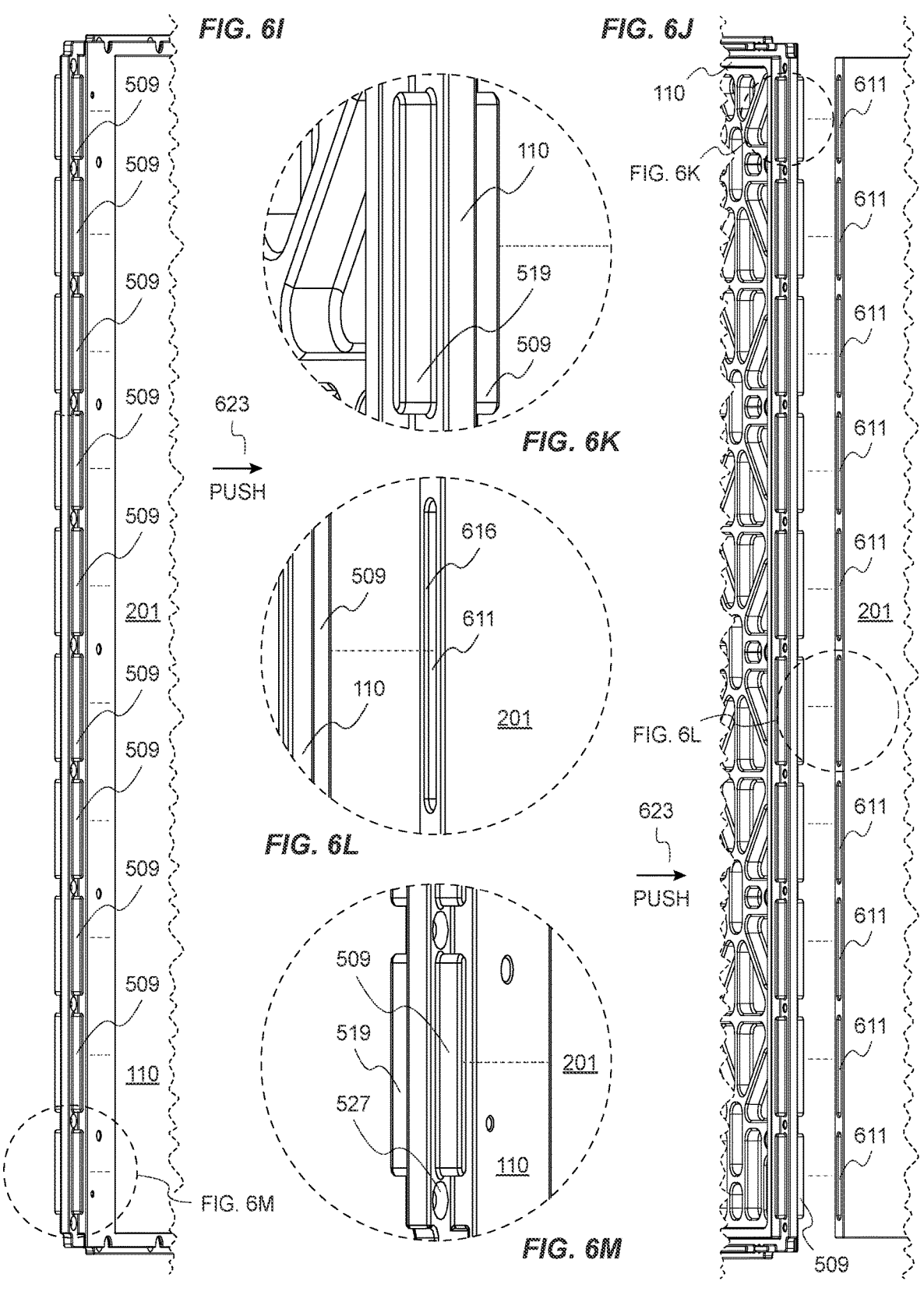
FIGS. 6I and 6J illustrate partial-views of the removal of a left access panel from a middle panel according to an embodiment.
FIGS. 6K-6M illustrate, with detail-views, the removal of a left access panel from a middle panel according to an embodiment.

Illustrated in FIGS. 6I and 6J are partial-views of both the middle panel 110 and the left access panel 201. These partial-views depict the attachment of the left access panel 201 to the middle panel 110; said attachment may include said panel's 110 EMI tabs 509 to be aligned and then inserted into said panel's 201 EMI slots 611 (see FIGS. 6K-6M) to ensure EMI containment.

In alternative embodiments (not shown in figures), the end-user removable access panels 107 and 201 are replaced with various panels that are permanently affixed (i.e. not end-user removable). Such non-removable panels are attached to the storage server 100 via various methods which could include: screws, magnets, and hinges. But, for storage drives 900 to be hot-swappable these non-removable panels require some mechanism to enable an end-user to access drive carriers 800 while such server 100 is operating. Such a mechanism may include panel cutouts (i.e. voids) corresponding to each drive carrier 800, these cutouts may support access and removal of drive carriers 800 without removal of said panel.

Figures 7A, 7B, 7C, 7D:
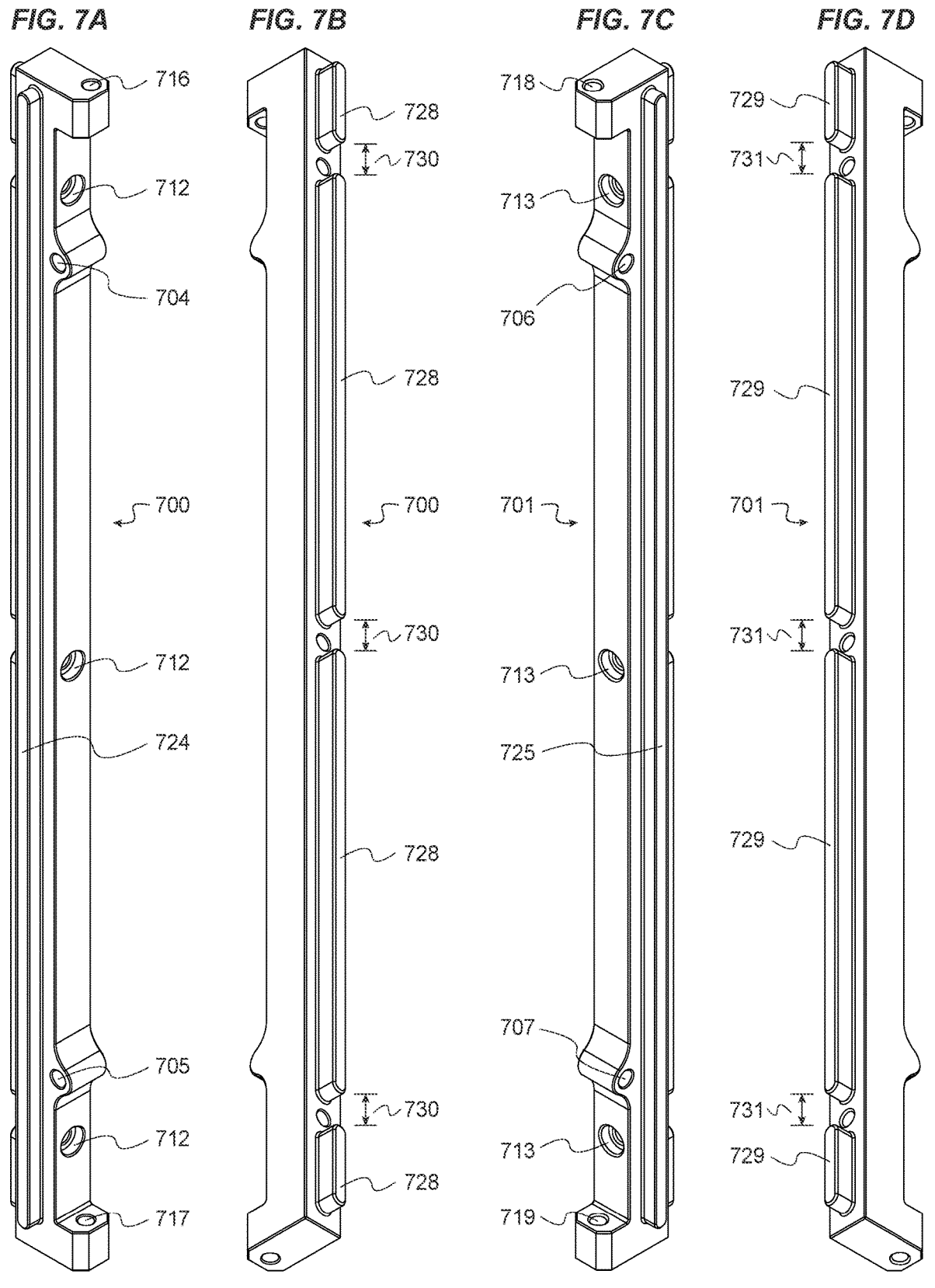
FIGS. 7A and 7B illustrate perspective-views of a left panel aligner according to an embodiment.
FIGS. 7C and 7D illustrate perspective-views of a right panel aligner according to an embodiment.

Illustrated in FIGS. 7A and 7B, is a structural support element which is used within the top section 208, named a left panel aligner 700; also illustrated in FIGS. 7C and 7D, is a structural support element which is also utilized within the top section 208, named a right panel aligner 701. A pairing of the left 700 and right 701 panel aligners may be used to align and attach (via shoulder screws) the front upper panel 106 to the top section 208; another pairing of left 700 and right 701 panel aligners may be used to align and attach (via shoulder screws) the back upper panel 200 to the top section 208. The top section 208 may require one or more (e.g. four) of such structural support elements (e.g. one at each of the four corners of said section 208). The left 700 and right 701 panel aligners may be designed in such a way so that these four structural support elements may be accomplished with two instances of each said aligner 700 and 701, thus minimizing the number of distinct elements in the storage server 100. This minimization of the number of distinct elements may be beneficial as said minimization may simplify machining and thus lower fabrication cost.

In certain embodiments, the channel height 615 may be elongated relative to the height of the corresponding EMI rails 724 and 725. The channel height 615 elongation (e.g. 0.175") may facilitate access panel 107 and 201 removal and then reattachment. In an embodiment, the access panel 600 may be detached by placing an end-user's palms (and/or fingers) on the exterior side of said panel 600 (i.e. exterior sides of such panels 107 and 201 are shown in FIG. 6B) and then pushing 623 (see FIG. 6G) said panel 600 vertically towards the top panel 105. Once the access panel 600 has slid a distance approximating the EMI channel's 612 and 613 height elongation, said channel 612 and 613 may come in contact with the corresponding EMI rail 724 and 725 and cease sliding. The pushing 623 may result in such panel's 600 EMI overhang 610 obtaining clearance from the corresponding top panel's 105 EMI gutter 3005 and 3006 and said panel's 600 magnets 614 being magnetically released from the corresponding panel aligner's 700 and 701 magnets 814, thus allowing said panel 600 to be grasped and detached from the storage server 100.

In certain embodiments, a pairing of the left 700 and right 701 panel aligners may be used to align and attach (via magnets) the left access panel 201 to the top section 208; another pairing of left 700 and right 701 panel aligners may be used to align and attach (via magnets) the right access panel 107 to the top section 208. To wit, the left access panel's 201 first EMI channel 612 may enclose the right panel aligner's 701 second EMI rail 725, and the left access panel's 201 second EMI channel 613 may enclose the left panel aligner's 700 first EMI rail 724; and the right access panel's 107 first EMI channel 612 may enclose the right panel aligner's 701 second EMI rail 725, and the right access panel's 107 second EMI channel 613 may enclose the left panel aligner's 700 first EMI rail 724. The continuity of the EMI channels 612 and 613 and EMI rails 724 and 725 is defined herein as follows: for the juncture (i.e. joining of two surfaces) upon which EMI is being mitigated there exists EMT channels 612 and 613 that correspond to EMI rails 724 and 725 for the length of said juncture. This continuity of EMI channels 612 and 613 to corresponding EMI rails 724 and 725 may improve the effectiveness of the intended EMI mitigation. So, the converse of this continuity may be a non-continuous EMI mitigation, e.g. corresponding to a juncture which includes one or more breaks, a "first break" is named a first fastener break 730 and a "second break" is named a second fastener break 731 (see FIGS. 7B and 7D).

Illustrated in FIGS. 7A-7D, the left 700 and right 701 panel aligners provide EMI containment capability via one or more types of EMI rails 724, 725, 728, and 729. A first type may be a continuous (i.e. single) EMI rail 724 and 725 when attached to the left 201 or right 107 access panel; a second type may be two or more (e.g. four) non-continuous EMI rails 728 and 729 when attached to the front 106 or back 200 upper panel. The non-continuous EMI rails 728 and 729 may arise from use of fastener breaks 730 and 731 which may result from counterbored clearance 712 and 713 which may be used to affix the left 700 and the right 701 panel aligner to the front 106 and the back 200 upper panel. The EMI rails 724, 725, 728, and 729 (similarly for the corresponding EMI channels 612, 613, 3103, 3104, 3203, and 3204) may share various features: length, width, height for EMI rails (or depth for EMI channels), and certain air gap adjustments. However, the inventive aspects of this disclosure apply to a plurality of these feature dimensions.

Herein, "removably attached" means to securely attach (e.g. via fasteners) but with the intended capability and support of future removal by an end-user, said removal may be predicated upon the prior removal of both access panels 107 and 201. Conversely, herein "structurally attached" means to securely attach but without the intention and/or support of end-user removal. For example, the back upper panel 200 may be removed to service certain aspects of the top section 208.

As illustrated in FIGS. 7A-7D, the left 700 and right 701 panel aligners each have one or more (e.g. three) counterbored clearance holes 712 and 713. To wit, the left panel aligner's 700 counterbored holes 712 may be used to removably attach (via shoulder screws 3112) the front upper panel 106 via threaded holes 3101; and the right panel aligner's 701 counterbored holes 713 may be used to removably attach (via shoulder screws 3112) the front upper panel 106 via threaded holes 3102. Further, the left panel aligner's 700 counterbored holes 712 may be used to removably attach (via shoulder screws 3213) the back upper panel 200 via threaded holes 3201; and the right panel aligner's 701 counterbored holes 713 may be used to removably attach (via shoulder screws 3213) the back upper panel 200 via threaded holes 3202. The screws 3112 and 3213 may feature 18-8 stainless steel, 3 mm shoulder diameter, 8 mm shoulder length, and M2×0.4 mm thread. However, the inventive aspects of this disclosure apply to a plurality of shoulder screw features.

As illustrated in FIGS. 7A-7D, the left 700 and right 701 panel aligners each have one or more (e.g. two) non-counterbored clearance holes 716-719. To wit, the left panel aligner's 700 clearance hole 716 may be used to structurally attach (via the shoulder screw 3213) the top panel 105 via a threaded hole 3009, and the right panel aligner's 701 clearance hole 718 may be used to structurally attach (via the shoulder screw 3112) the top panel 105 via a threaded hole 3011; and the left panel aligner's 700 clearance hole 716 may be used to structurally attach (via the shoulder screw 3112) the top panel 105 via a threaded hole 3012, and the right panel aligner's 701 clearance hole 718 may be used to structurally attach (via the shoulder screw 3213) the top panel 105 via a threaded hole 3010. Further, the left panel aligner's 700 clearance hole 717 may be used to structurally attach (via the shoulder screw 3213) the middle panel 110 via a threaded hole 515, and the right panel aligner's 701 clearance hole 719 may be used to structurally attach (via the shoulder screw 3112) the middle panel 110 via a threaded hole 517; and the left panel aligner's 700 clearance hole 717 may be used to structurally attach (via the shoulder screw 3112) the middle panel 110 via a threaded hole 516, and the right panel aligner's 701 clearance hole 719 may be used to structurally attach (via the shoulder screw 3213) the middle panel 110 via a threaded hole 514. Screws 3112 and 3213 used for structural attachment may use a thread locking adhesive to assist said attachment.

Illustrated in FIGS. 7A and 7C, the left 700 and right 701 panel aligners each embed (via blind holes 704-707) one or more (e.g. two) panel magnets 814 for attaching access panels 600 to said aligners 700 and 701. In an embodiment, panel magnets 614 and 814 (e.g. nickel coated neodymium, grade N42 or N52) may, when joined, facilitate an inherent self-alignment mechanism between the aligners 700 and 701 and the respective access panels 107 and 201. Panel magnets 814 may be embedded into the panel aligner's 700 and 701 blind holes 704-707 via an arbor press or with an adhesive glue. The blind holes 704-707 may be CNC drilled to a depth equal to a panel magnet's 814 thickness (e.g. ⅛" or ¼") or with an additional depth if an adhesive is used to secure said magnets 814. This combined depth is typically less than the corresponding aligner 700 and 701 thickness (e.g. 0.35"). The panel magnets 814 may be replaced with ferromagnetic materials of different shapes and sizes to alter the removal force which is required to detach such access panels 107 and 201.

Illustrated in FIGS. 7A-7D are panel aligners 700 and 701, each with one or more (e.g. two) blind holes 704-707. The blind holes 704-707 may be CNC drilled to embed panel magnets 814. The panel magnets 814 may be used to align and affix to the respective panel magnets 614. To wit, the left panel aligner's 700 blind holes 704 and 705 may attach (via magnets 614 and 814) to the left 201 or right 107 access panel's blind holes 602 and 603 respectively; and the right panel aligner's 701 blind holes 706 and 707 may attach (via magnets 614 and 814) to the left 201 or right 107 access panel's blind holes 604 and 605 respectively. Further, panel magnets 814 when joined with the access panel's 107 and 201 magnets 614 may promote alignment via a self-centering capability resulting from the purposeful polarization of said magnets 614 and 814. This purposeful polarization may beneficially match opposite pole pairs to generate magnetic attraction between removably attached access panels 107 and 201 and structurally attached panel aligners 700 and 701. The access panel's 107 and 201 intended removal force may correspond to the magnetic pull force, which may vary with said magnet's 614 and 814 type and dimensions.

The panel magnets 614 and 814 may be comprised of rare-earth type materials such as Neodymium-Iron-Boron (i.e. NdFeB), which may also be nickel plated (e.g. Ni—Cu—Ni). Ergo, these rare-earth based magnets may be electrically conductive and thus beneficial for improving EMI mitigation between the access panels 107 and 201 and the panel aligners 700 and 701.

Drive carriers 800 may be bilaterally accessible from the top section 208 either by an end-user removing the left access panel 201 (as in FIG. 8A), the right access panel 107 (as in FIG. 8B), or both the left access panel 201 and right access panel 107. The storage server 100 may be capable of left access panel 201, right access panel 107, and drive carrier 800 removal, followed by reinstallation of said carrier 800, left access panel 201, and right access panel 107, all while said server 100 is powered-on.

Figures 8A, 8B:
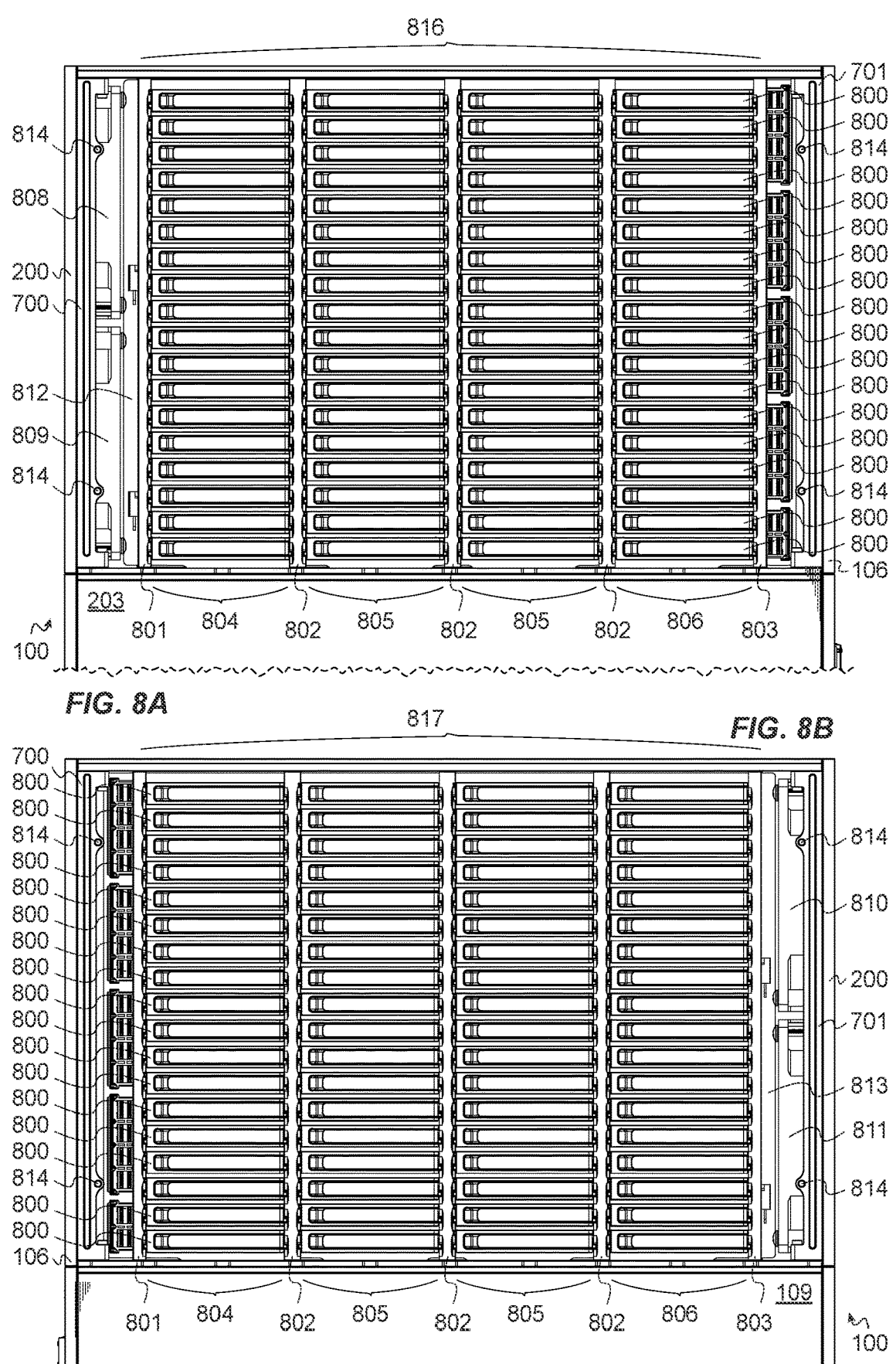
FIG. 8A illustrates a partial-view of a left side of a storage server according to an embodiment.
FIG. 8B illustrates a partial-view of a right side of a storage server according to an embodiment.

Illustrated in FIGS. 8A and 8B are partial-views of the storage server 100. These partial-views depict a "row/column arrangement" of drive carriers 800 on the left side 302 (see FIG. 8A), named a left column group 816, and on the right side 303 (see FIG. 8B), named a right column group 817, of the storage server 100. The vertical positioning (or vertical locating) of drive carriers 800, and thus storage drives 900, within each of the column groups 816 and 817 may be accomplished by a pair of structural supports which may be one of three distinct types: a "left locator type", named a left vertical locator 801, which may vertically position drive carriers 800 on the front facing 300 side (see FIG. 8A) or back facing 301 side (see FIG. 8B) of said locator 801; an "inner locator type", named an inner vertical locator 802, which may vertically position drive carriers 800 on both the front 300 and back 301 facing sides of said locator 802; and a "right locator type", named a right vertical locator 803, which may vertically position drive carriers 800 on the back facing 301 side (see FIG. 8A) or front facing 300 side (see FIG. 8B) of said locator 803. Further, each of the left 816 and right 817 column groups may be comprised of ordered arrangements of three distinct column types, each type vertically positioning one or more (e.g. eighteen) drive carriers 800, and these types may include: a "left column type", named a left carrier column 804, which pairs the left vertical locator 801 with the inner vertical locator 802; an "inner column type", named an inner carrier column 805, which pairs two inner vertical locators 802; and a "right column type", named a right carrier column 806, which pairs the inner vertical locator 802 with the right vertical locator 803. As shown in FIG. 8A, the left column group 816 is comprised of one or more (e.g. four) carrier columns 804-806, ordered as follows: one left carrier column 804, two inner carrier columns 805, and one right carrier column 806; and as shown in FIG. 8B, the right column group 817 is comprised of one or more (e.g. four) carrier columns 804-806, ordered as follows: one left carrier column 804, two inner carrier columns 805, and one right carrier column 806. Thereby, the storage server's 100 top section 208, which contains the left 816 and right 817 column groups, may collectively be comprised of eight carrier columns 804-806. Further, each of the carrier columns 804-806, via corresponding vertical locators 801-803, may beneficially facilitate both the physical and electrical mating and unmating of the drive carriers' 800 storage drives 900 to the corresponding left 812 or right 813 backplane.

Also illustrated in FIGS. 8A and 8B, the vertical locators 801-803 such as the left vertical locator 801, the inner vertical locator 802, and the right vertical locator 803 are designed to be used in both the left 816 and right 817 column groups. This reuse may decrease the number of distinct parts comprising the storage server 100 and thereby may reduce the cost and complexity of said server 100. The inventive aspects of this disclosure apply to various drive carrier 800 orientations when being bilaterally accessed from the storage server 100.

In alternative embodiments (not shown in figures), the vertical locators 801-803 are replaced with similarly purposed "horizontal locators". For example, these "horizontal locators" alter the drive carrier's 800 orientation by 90 degrees along a specified "centerline".

Also illustrated in FIGS. 8A and 8B, each drive carrier 800 is comprised of one storage drive 900 which is beneficial when supporting hot swapability. Herein, hot-swappable is defined as the capability to replace the storage drive 900, once said drive 900 has failed (i.e. not fully-functional) or indicates failure, with the new (i.e. fully-functional) storage drive 900 while the storage server 100 is powered-on.

In alternative embodiments (not shown in figures), the drive carrier 800 is attached to two or more storage drives 900, but now the storage server 100 requires specific mechanisms to handle consequences that result from removing one or more fully-functional storage drives 900 concurrently with the removal of a single faulty storage drive 900.

Figures 9A, 9B:
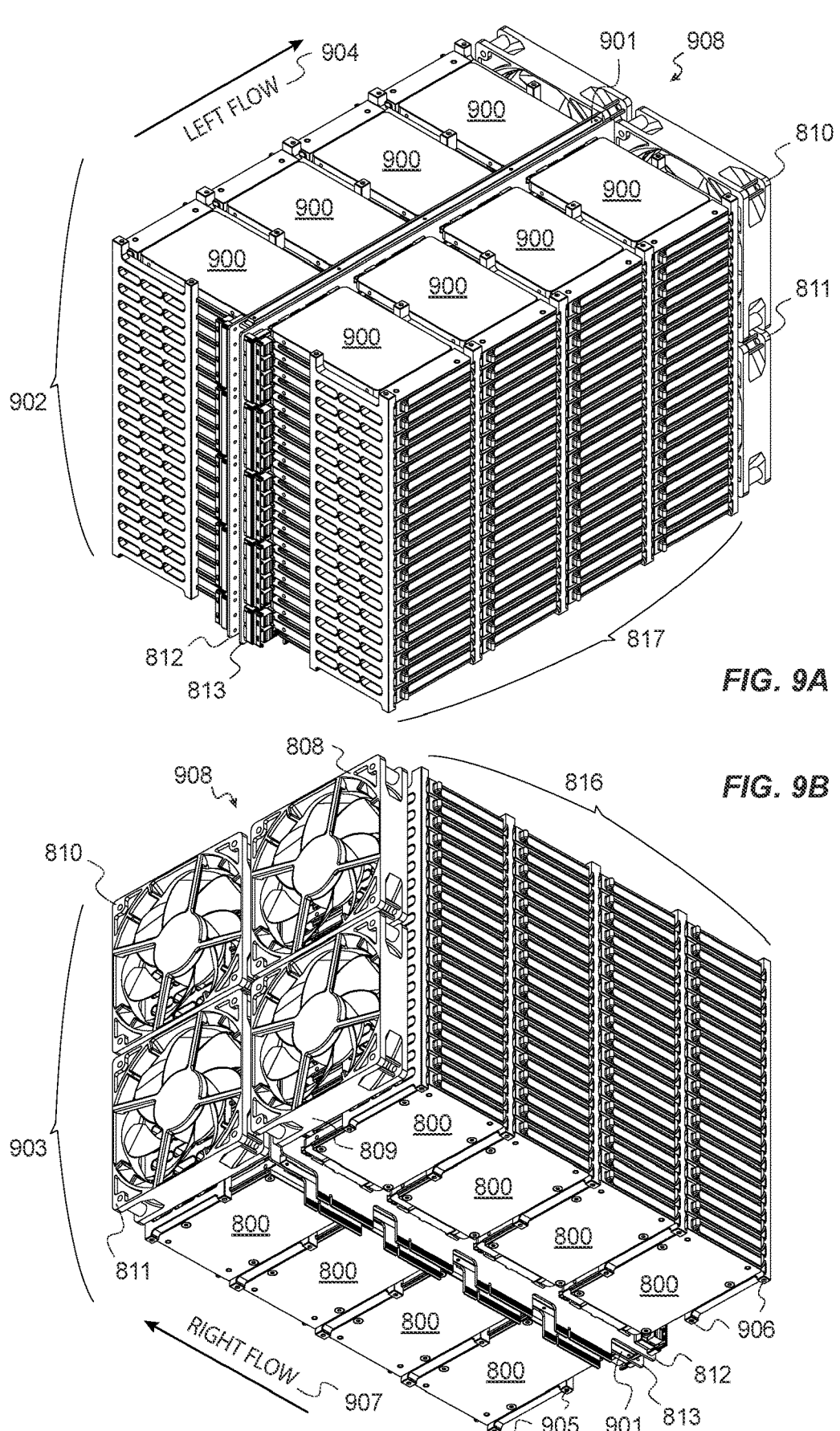
FIG. 9A illustrates a top, front, right perspective-view of a top inside according to an embodiment.
FIG. 9B illustrates a bottom, back, left perspective-view of a top inside according to an embodiment.
Figures 10A, 10B:
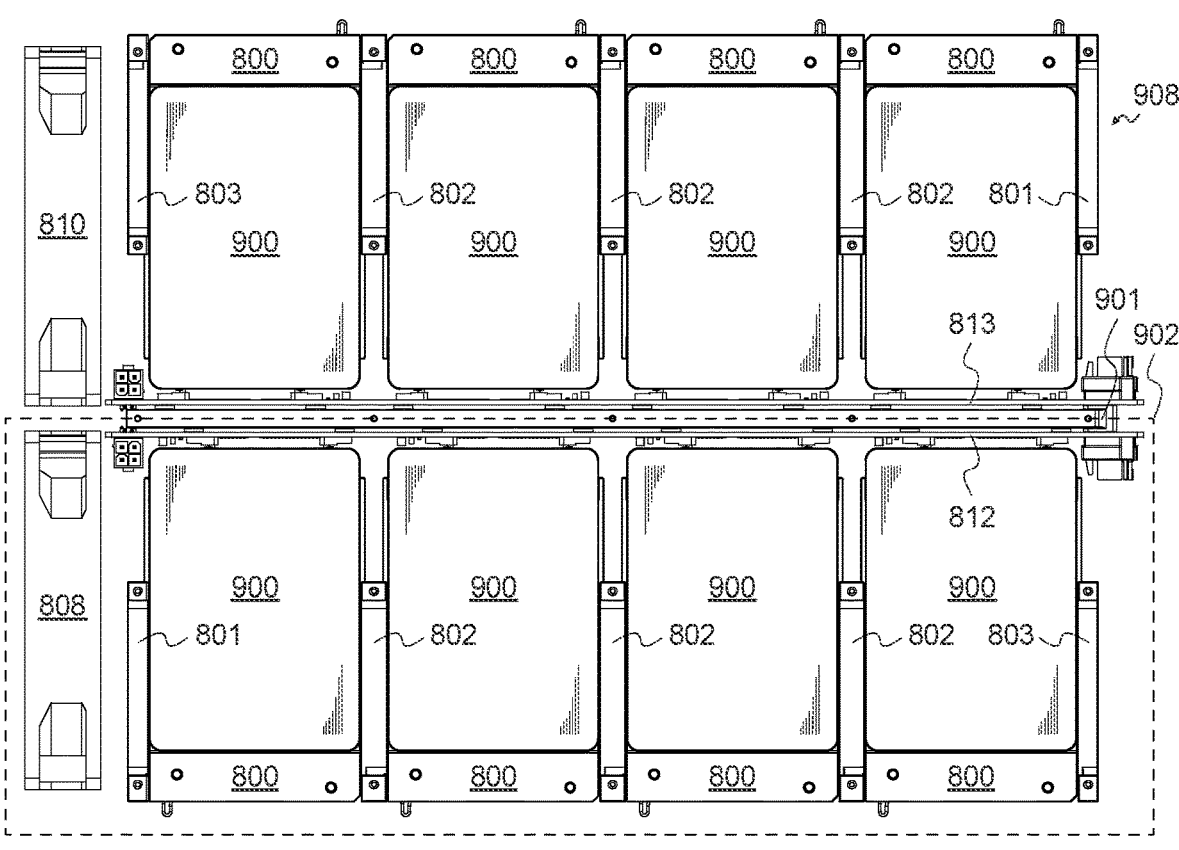
FIG. 10A illustrates a top orthographic-view of a top inside according to an embodiment.
FIG. 10B illustrates a bottom orthographic-view of a top inside according to an embodiment.
Figure 11A:
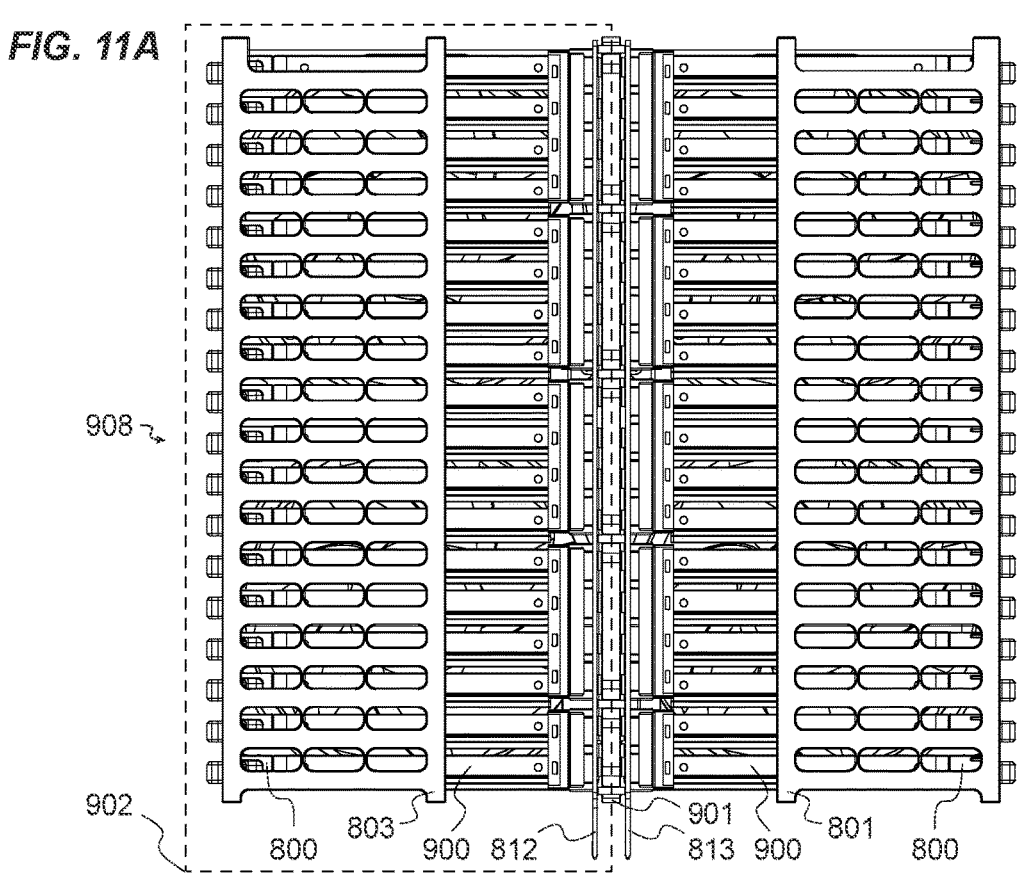
FIG. 11A illustrates a front orthographic-view of a top inside according to an embodiment.
Figure 11B:
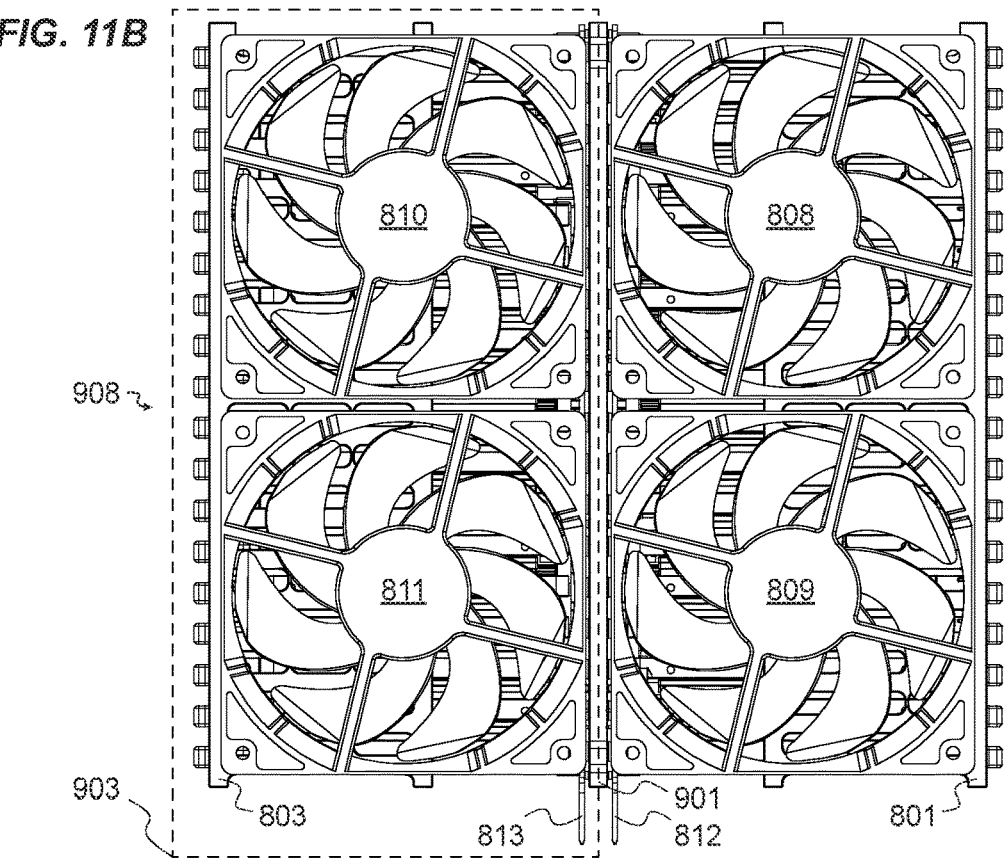
FIG. 11B illustrates a back orthographic-view of a top inside according to an embodiment.

As illustrated in FIGS. 9A and 9B, an internal support member, named a backing plate 901, equally bisects the top section 208 of the storage server 100 and thus equally bisects said server 100. The backing plate 901 may be double-sided, herein meaning the left backplane 812 may be attached to the left side 302 of said plate 901 and the right backplane 813 may be attached to the right side 303 of said plate 901. Further, the left 812 and right 813 backplanes are parallel or substantially parallel to each other and parallel or substantially parallel to the backing plate 901. The backing plate 901 may locate such backplanes 812 and 813 primarily within the top section 208, but with certain aspects extending into the bottom section 209 (see FIG. 4B).

In alternative embodiments (not shown in figures), two single-sided "backing members", which only attach to one backplane 812 and 813 (i.e. not double-sided), are used within the top section 208 in place of the backing plate 901. Thereby, the top section 208 requires two single-sided "backing members" as each is affixed to either the left 812 or the right 813 backplane (but not both). An undesirable consequence of using two single-sided "backing members" instead of one backing plate 901 could adversely increase the box width 101 of the storage server 100, thus expanding said server's 100 "desktop" footprint (i.e. box width 101 times box depth 102).

Illustrated in FIGS. 9A, 9B, 10A, 10B, 11A, 11B, 12A, and 12B, is the top section 208 with certain components removed, which is named a top inside 908. These removed components include: the top panel 105, front upper panel 106, back upper panel 200, left access panel 201, right access panel 107, sixteen panel magnets 614 and 814, four panel aligners 700 and 701, twenty shoulder screws 3112 and 3213, sixteen pan head screws 3216, fifty shoulder screws 9001 and 9100, and the shared middle panel 110. These removals may facilitate visibility of the top inside 908 which may be comprised of: the left column group 816, right column group 817, left backplane 812, right backplane 813, one or more (e.g. four) "axial fans" where each is named a top axial fan 808-811, and the backing plate 901.

As illustrated and denoted with dashed rectangular boundaries in FIGS. 10A, 10B, 11A, 11B, 12A, and 12B, the storage server's 100 top inside 908 is partitioned into two or more (e.g. two) opposite facing subsections. These subsections may provide the basis for the top section's 208 bilateral accessibility of drive carriers 800 (and thus storage drives 900). In an embodiment, the top inside 908 may be horizontally delineated into two such subsections, a "first subsection" named a left subsection 902 and a "second subsection" named a right subsection 903. The left subsection 902 may be accessed from the storage server's 100 left side 302 and the right subsection 903 may be accessed from said server's 100 right side 303. The bilaterally accessed left 902 and right 903 subsections may incorporate left 816 and right 817 column groups respectively.

As illustrated in FIGS. 10A, 10B, 11A, and 11B, the left subsection 902 is comprised of the shared backing plate 901, left column group 816, left backplane 812, and the left fan group 1310 (e.g. 120 mm×120 mm×25 mm) which may be controlled, monitored, and powered by said backplane 812; and the right subsection 903 is comprised of the shared backing plate 901, right column group 817, right backplane 813, and right fan group 1410 (e.g. 120 mm×120 mm×25 mm) which may be controlled, monitored, and powered by said backplane 813. The bilateral subsections 902 and 903 may inherently support various types of fault tolerance, e.g. the cooling mechanisms of the subsections 902 and 903 may be independent of each other.

Figures 12A, 12B:
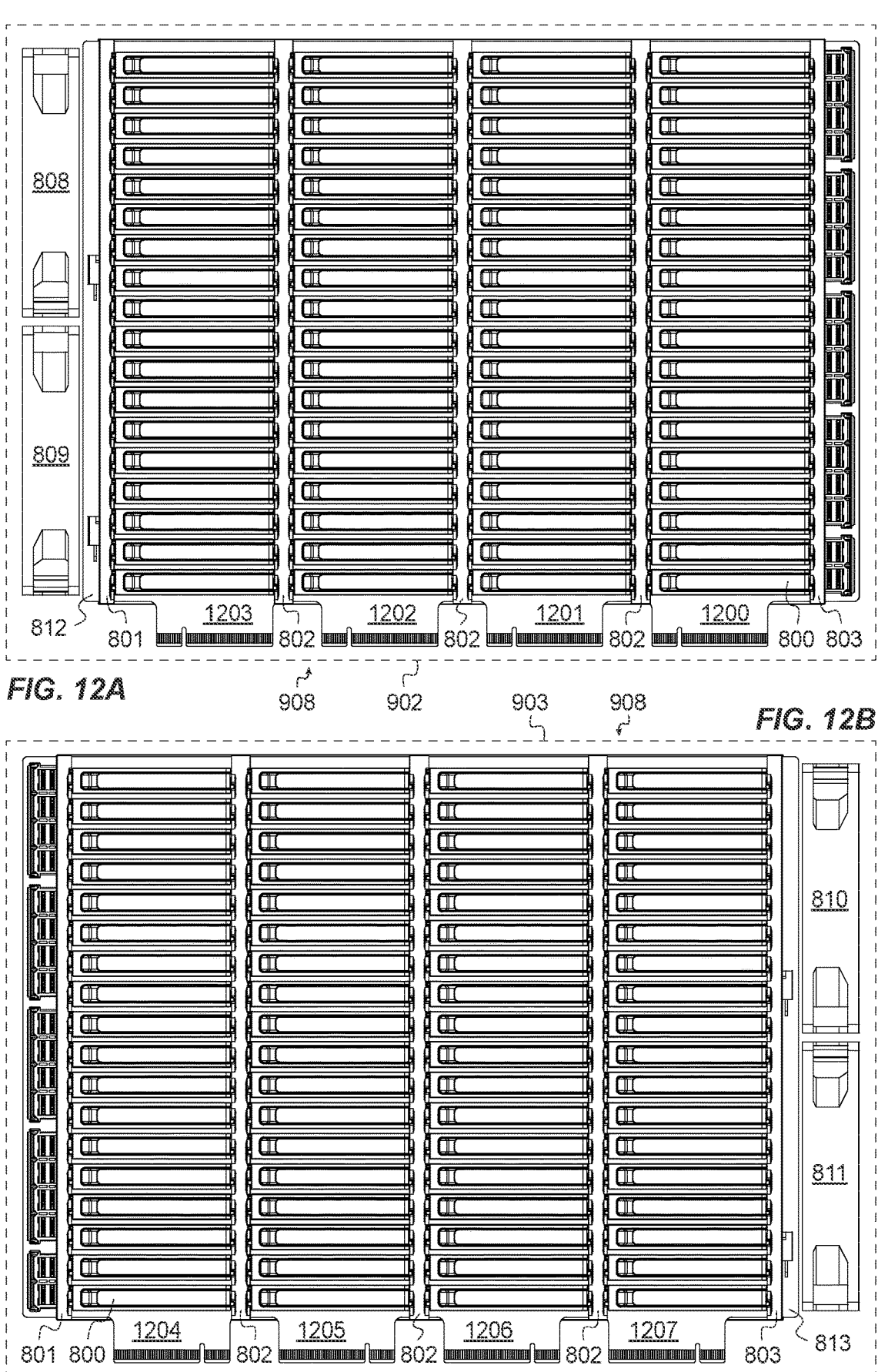
FIG. 12A illustrates a left orthographic-view of a top inside according to an embodiment.
FIG. 12B illustrates a right orthographic-view of a top inside according to an embodiment.

As used herein, the terms "drive carrier" are equivalent to, and a shortened notation of, the terms "drive carrier assembly". Moreover, the drive carrier 800 as displayed in FIGS. 12A and 12B is further illustrated via exploded-views in FIGS. 25A and 25B. Herein, the drive carrier 800 shall be defined to be comprised of one affixed storage drive 900 (e.g. 2.5" SSD) unless otherwise noted.

Illustrated in FIGS. 12A and 12B, the left 902 and right 903 subsections each contain one or more drive carriers 800, and thus storage drives 900. In the bilaterally accessed top inside 908, the left subsection 902 may contain the left column group 816 and the right subsection 903 may contain the right column group 817, where each of the carrier columns 804-806 of said column groups 816 and 817 may support eighteen drive carriers 800. Hence, resulting in a total of seventy-two storage drives 900 for the left subsection 902 and a total of seventy-two storage drives 900 for the right subsection 903 and thus a grand total for the top inside 908 of one hundred forty-four storage drives 900.

Figures 17A, 17B:
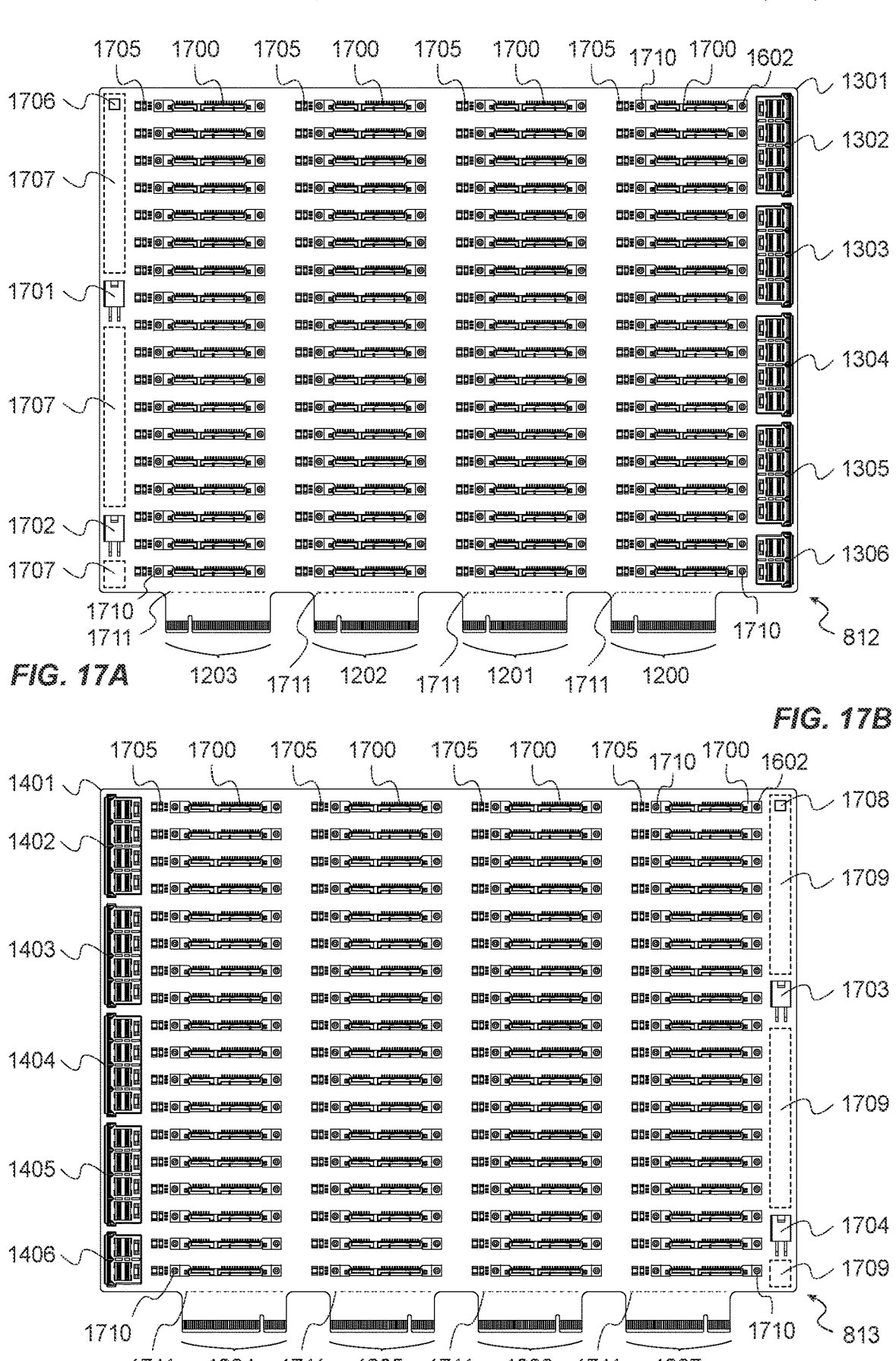
FIG. 17A illustrates a left orthographic-view of a left backplane according to an embodiment.
FIG. 17B illustrates a right orthographic-view of a left backplane according to an embodiment.

As illustrated in FIGS. 12A and 12B, the left 812 and right 813 backplanes each have one or more "printed circuit board edge connectors", each named a power coupler 1200-1207. The power couplers 1200-1207 may be used to supply power, which may be sourced from the bottom section 209, to backplanes 812 and 813 that may be located primarily in the top section 208. The extent of each power coupler 1200-1207 is indicated in FIGS. 17A and 17B with a dashed line 1711. The power couplers 1200-1207 may be partially compatible with industry standard PCIe CEM (Card ElectroMechanical) specifications and may utilize various lane counts, such as: x1, x2, x4, x8, and x16. For example, the power couplers 1200-1207 illustrated in FIGS. 17A and 17B are mechanically, but not electrically, compatible with the PCIe CEM specification and utilize a x8 lane count. In an embodiment, the left 812 and right 813 backplanes each have four power couplers 1200-1207 respectively to supply power to storage drives 900 mated to said backplanes 812 and 813. Also, power couplers 1200-1207 may use non-standard circuit assignments but retain mechanical compatibility with numerous PCIe edge card connectors (e.g. MOLEX 87715-9206). This PCIe connector compatibility may be beneficial as these card connectors are widely used and thus may have lower cost and better availability compared to alternative connectors.

As illustrated in FIGS. 9A and 9B, the storage server's 100 left 902 and right 903 subsections provide bilateral access to drive carriers 800 within the top section 208. Notably, the subsection's 902 and 903 left 302 and right 303 sided arrangement of storage drives 900 may result in an beneficial placement of left 812 and right 813 backplanes that may then enable improved thermal regulation (i.e. cooling) of said drives 900. So, this improved thermal regulation of storage drives 900 is largely a result of the left 812 and right 813 backplanes having a position parallel or substantially parallel, but not perpendicular, to the top flow 104. Backplanes 812 and 813 situated parallel or substantially parallel to the top flow 104 may provide a less restrictive pathway (i.e. lower resistance), for said flow 104, and thereby may increase the airflow rate (i.e. CFM) of said flow 104. This increase of the top flow's 104 CFM (Cubic Feet per Minute) may then enhance the cooling capacity of the top section 208, thus improving the thermal regulation of storage drives 900 within said section 208.

Also illustrated in FIGS. 9A and 9B, the storage server's 100 top flow 104 is further directed, within the top section 208, by the left 812 and the right 813 backplane to predominately bifurcate said flow 104 into the left subsection's 902 "airflow", named a left flow 904, and the right subsection's 903 "airflow", named a right flow 907. The left flow 904 is primarily the airflow entering the front upper panel 106 and then channeling between the left access panel 201, the left backplane 812, the top panel 105, and the middle panel 110 and then exiting the back upper panel 200 by means of one or more (e.g. two) top axial fans 808 and 809. The right flow 907 is primarily the airflow entering the front upper panel 106 and then channeling between the right access panel 107, the right backplane 813, the top panel 105, and the middle panel 110 and then exiting the back upper panel 200 by means of one or more (e.g. two) top axial fans 810 and 811. As with top flow 104, the left flow 904 is parallel or substantially parallel to the left backplane 812 and the right flow 907 is parallel or substantially parallel to the right backplane 813. So, the storage server's 100 bilateral drive carrier 800 accessibility may result in beneficial placement of the left 812 and right 813 backplanes which may then result in the improved top section's 208 cooling capability and the predominately bifurcated top flow 104. The bifurcated left 904 and right 907 flows are then enabled to be independently managed, monitored, and thermally regulated from within each subsection 902 and 903 to additionally optimize the cooling of the storage drives 900.

Illustrated in FIGS. 9A and 9B, both the left 812 and right 813 backplanes are attached in a parallel or substantially parallel orientation to the backing plate 901 via a CNC milled standoff mechanism, this mechanism results in an airgap (e.g. 0.05") between said backplanes 812 and 813 and said plate 901. While the majority of top flow 104 may bifurcate into left 904 and right 907 flows, a portion of said flow 104 may part into third and fourth airflows. This third airflow, typically a fraction of the left flow 904, may move between the left backplane 812 and the backing plate 901. Similarly, this fourth airflow, typically a fraction of the right flow 907, may move between the right backplane 813 and the backing plate 901. These third and fourth airflows, both moving from the front face 300 to the back face 301, may be beneficial as said airflows may facilitate cooling of the backplanes 812 and 813 and the backing plate 901.

In alternative embodiments (not shown in figures), the storage server's 100 top section 208, with the top flow 104, is configured with drive carriers 800 bilaterally accessed from the front face 300 and back face 301. This front 300 and back 301 faced bilateral arrangement of storage drives 900 could result in an adverse placement of corresponding storage "backplanes", where each said "backplane" is perpendicular or substantially perpendicular, but not parallel, to top flow 104. This perpendicularity of the storage "backplane" to the top flow 104 results in a more restrictive pathway (i.e. higher resistance) for said flow 104, and thereby decreases the airflow rate (i.e. CFM) of said flow 104. This decrease of the top flow's 104 CFM then decreases said section's 208 ability to thermally regulate the storage drives 900 within said section 208. The extent of the restrictiveness resulting from a storage "backplane" position being perpendicular or substantially perpendicular to an airflow, may be reduced with the prevailing practice of strategically placed printed circuit board cutouts (i.e. voids) within said storage "backplane". But, the benefits of such printed circuit board cutouts to an airflow are self-limiting, as said benefits are constrained by an inherent difficulty in suitable placement of said cutouts amongst storage "backplane" features such as connectors, differential traces, and decoupling capacitors. Ergo, this difficulty in placing airflow improving printed circuit board cutouts inherently self-limits the number and thus the aggregate impact of said printed circuit board cutouts.

When the storage server 100 uses the front face 300 to back face 301 directed airflow (i.e. the top flow 104 and bottom flow 207) to thermally regulate (i.e. cool) storage drives 900 within said server 100, bilaterally accessing drive carriers 800 from the left 302 and right 303 sides may be beneficial compared to bilaterally accessing said carriers 800 from the front 300 and back 301 faces.

Figures 13A, 13B:
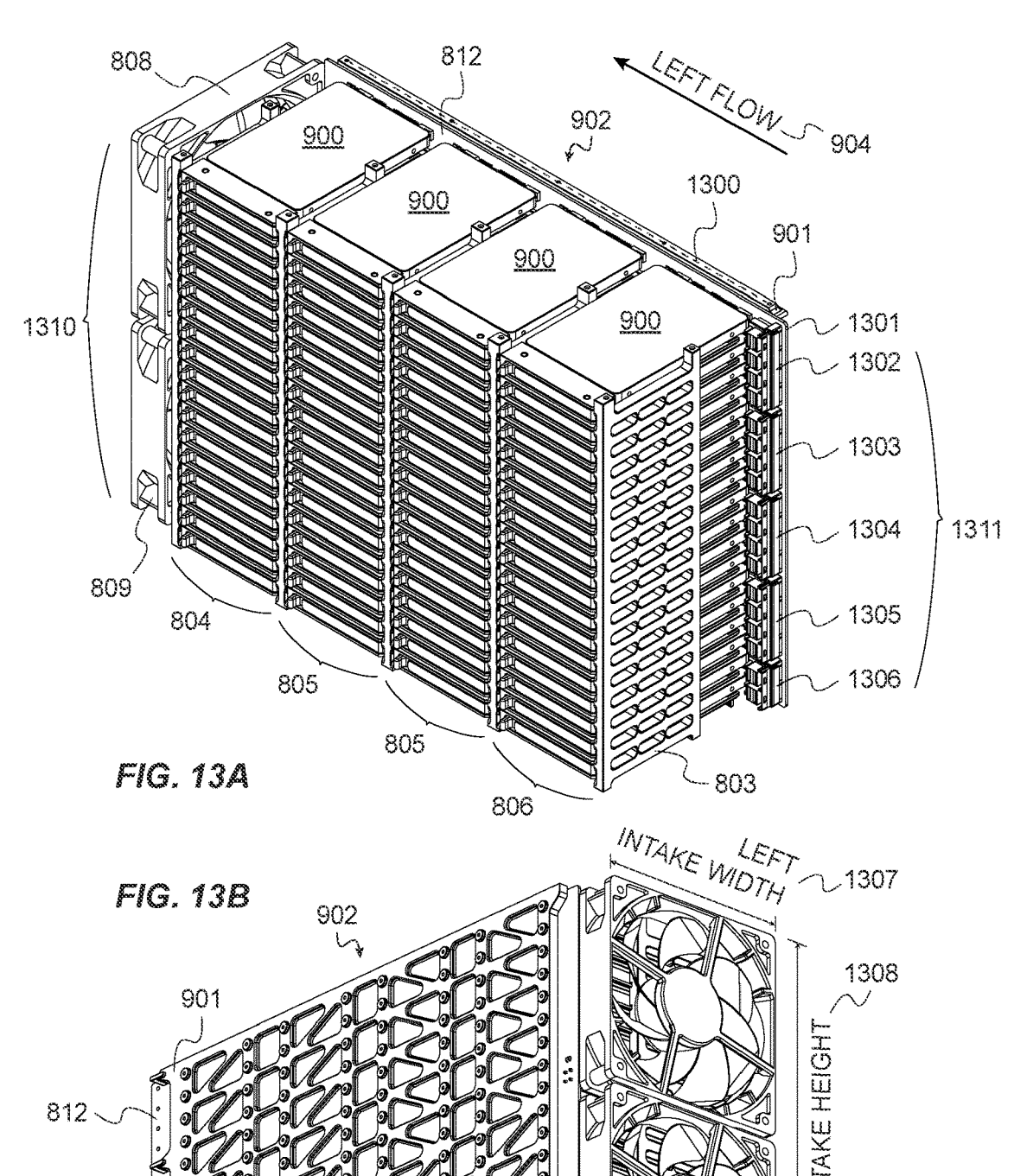
FIG. 13A illustrates a top, front, left perspective-view of a left subsection according to an embodiment.
FIG. 13B illustrates a bottom, back, right perspective-view of a left subsection according to an embodiment.

Illustrated in FIGS. 13A and 13B is the top section's 208 left subsection 902 which uses one or more (e.g. five) "high-speed connectors" (e.g. MOLEX 170729-0002 and MOLEX 170729-0004), and is named a left connector group 1311. The left backplane 812 may include the left connector group 1311 to transmit differential signaling from said left backplane 812, via one or more (e.g. eighteen) left custom cables 10600. The left custom cables 10600 may pass through the middle panel 110 via the left cutout 530. Also, one or more (e.g. two) of the top axial fans 808 and 809, located within the left subsection 902, is named a left fan group 1310 and may generate or primarily generate the left subsection's 902 left flow 904.

Illustrated in FIGS. 13A, 13B, 14A, and 14B, each subsection 902 and 903 optimizes certain printed circuit board edges of both backplanes 812 and 813. The left subsection's 902 "printed circuit board edge", named a left perimeter edge 1301, and the right subsection's 903 "printed circuit board edge", named a right perimeter edge 1401, may have purposefully minimized air gaps between said perimeter edges 1301 and 1401 and each of the following: the front upper panel 106, top panel 105, middle panel 110, and the top axial fans 808-811. Minimizing these air gaps may decrease air exchange between the subsections 902 and 903, thus optimizing each subsection's 902 and 903 ability to manage, monitor, and thermally regulate said airflows 904 and 907 independently.

Figures 14A, 14B:
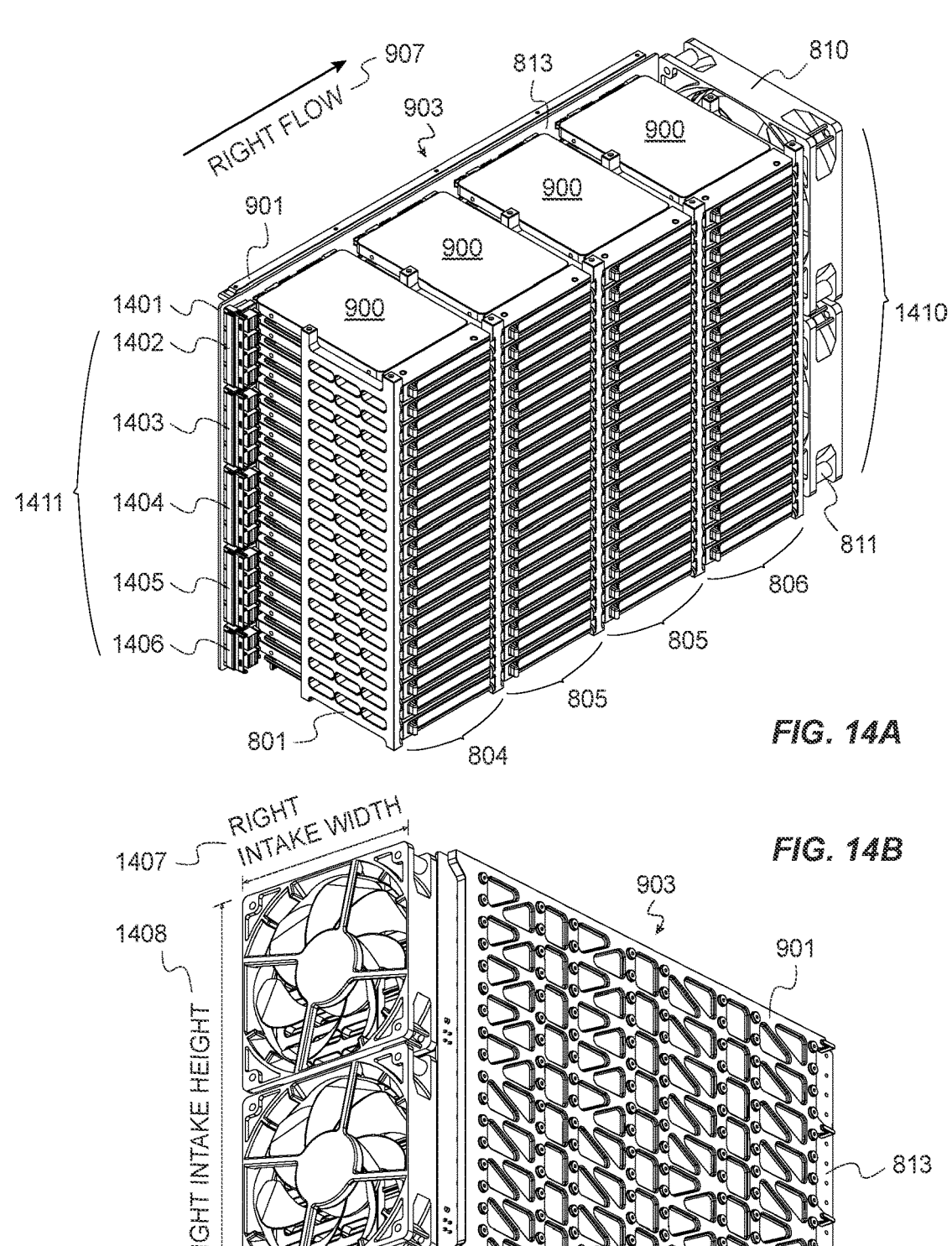
FIG. 14A illustrates a top, front, right perspective-view of a right subsection according to an embodiment.
FIG. 14B illustrates a bottom, back, left perspective-view of a right subsection according to an embodiment.

Illustrated in FIGS. 14A and 14B is the top section's 208 right subsection 903 which uses one or more (e.g. five) "high-speed connectors" (e.g. MOLEX 170729-0002 and MOLEX 170729-0004), and is named a right connector group 1411. The right backplane 813 may include the right connector group 1411 to transmit differential signaling from said right backplane 813, via one or more (e.g. eighteen) right custom cables 10700. The right custom cables 10700 may pass through the middle panel 110 via the right cutout 531. Also, one or more (e.g. two) of the top axial fans 810 and 811, located within the right subsection 903, is named a right fan group 1410 and may generate or primarily generate the right subsection's 903 right flow 907.

As illustrated in FIGS. 13A and 13B, the left subsection 902 is beneficially dimensioned so that the left column group 816 is spatially proportioned to maximize correspondence with the "left fan flow intake" of one or more top axial fans 808 and 809. This left fan flow intake has a "width dimension", named a left intake width 1307, and a "height dimension", named a left intake height 1308. The extent of this left fan flow intake may be defined as the left intake width 1307 times the left intake height 1308 and may approximate the aggregate of two fan flow inlets (e.g. one such inlet for each top axial fan 808 and 809 within the left subsection 902). In an embodiment, the left column group 816 within the left subsection 902 may be spatially proportioned to correspond with the left fan flow intake aggregated from inlets of two vertically aligned top axial fans 808 and 809. For the left column group 816, this spatial proportioning may result in locating eighteen drive carriers 800 with a suitable (e.g. approx. 0.0794") vertical air gap separating said carriers 800. For each of the drive carriers 800, this spatial proportioning may be optimized for storage drives 900 based on the SFF-8201 standard with a 7 mm height. So, a maximized correspondence between the left subsection's 902 left intake width 1307 and left intake height 1308 to the dimensions of the left column group 816 may maximize not only the density of storage drives 900 supported, but may also provide a basis for an optimized thermal regulation of said drives 900.

As illustrated in FIGS. 14A and 14B, the right subsection 903 is beneficially dimensioned so that the right column group 817 is spatially proportioned to maximize correspondence with the "right fan flow intake" of one or more top axial fans 810 and 811. This right fan flow intake has a "width dimension", named a right intake width 1407, and a "height dimension", named a right intake height 1408. The extent of this right fan flow intake may be defined as the right intake width 1407 times the right intake height 1408 and may approximate the aggregate of two fan flow inlets (e.g. one such inlet for each top axial fan 810 and 811 within the right subsection 903). In an embodiment, the right column group 817 within the right subsection 903 may be spatially proportioned to correspond with the right fan flow intake aggregated from inlets of two vertically aligned top axial fans 810 and 811. For the right column group 817, this spatial proportioning may result in locating eighteen drive carriers 800 with a suitable (e.g. approximately 0.0794") vertical air gap separating said carriers 800. For each of the drive carriers 800, this spatial proportioning may be optimized for storage drives 900 based on the SFF-8201 standard with a 7 mm height. So, a maximized correspondence between the right subsection's 903 right intake width 1407 and right intake height 1408 to the dimensions of the right column group 817 may maximize not only the density of storage drives 900 supported, but may also provide a basis for an optimized thermal regulation of said drives 900.

Figures 15A, 15B:
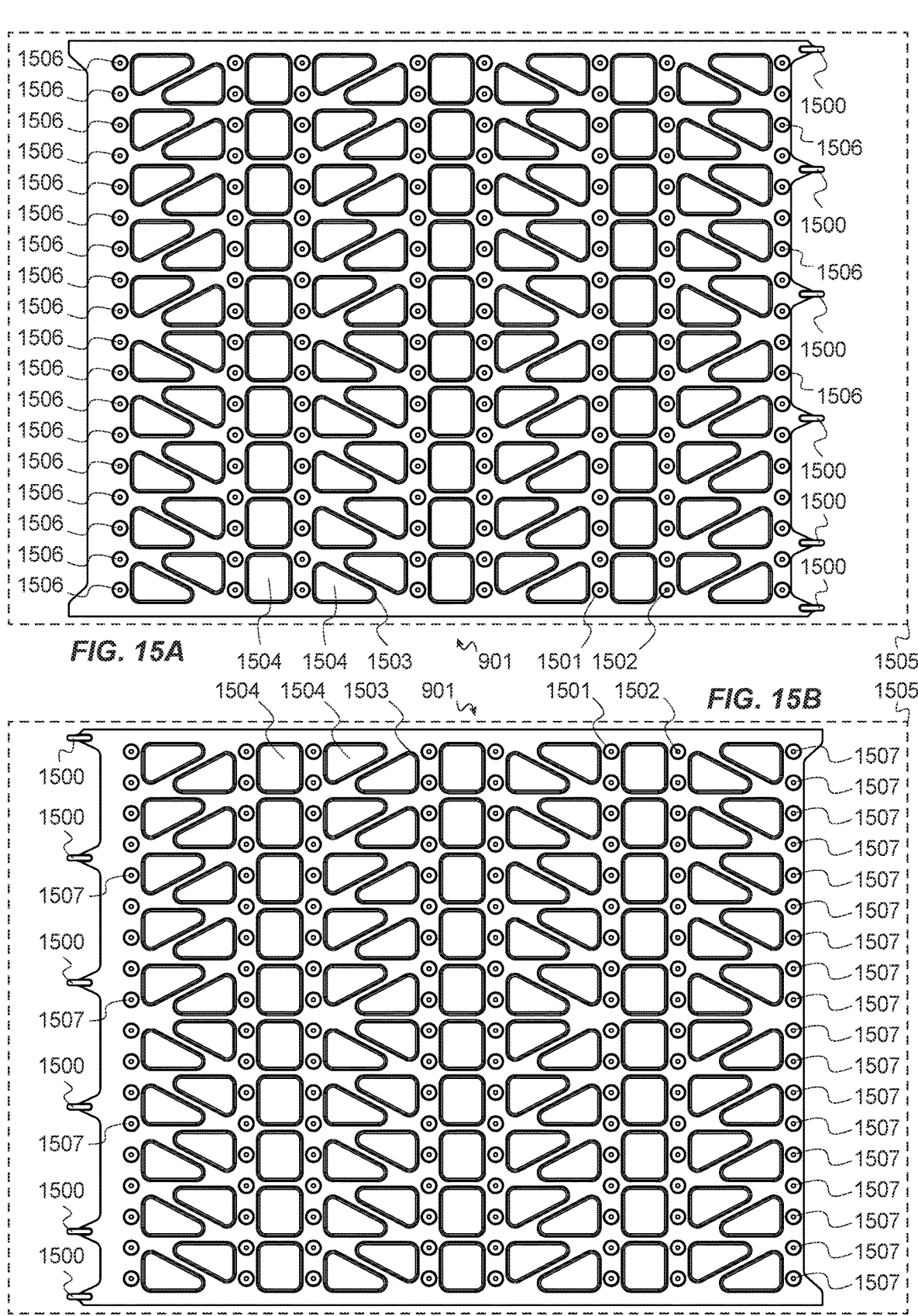
FIG. 15A illustrates a left orthographic-view of a backing plate according to an embodiment.
FIG. 15B illustrates a right orthographic-view of a backing plate according to an embodiment.

Illustrated in FIGS. 15A and 15B, is the storage server's 100 backing plate 901. The backing plate 901 may structurally attach to the top panel 105 and the middle panel 110 via shoulder screws 9001 and 9100 (e.g. 18-8 stainless steel, 3 mm shoulder diameter, 4 mm shoulder length, and a M2×0.4 mm thread) respectively. To wit, the top panel's 105 clearance holes 3004 may be used to attach to the backing plate's 901 threaded blind holes 3600 via one or more (e.g. five) shoulder screws 9001, and the middle panel's 110 clearance holes 504 may be used to attach to said plate's 901 threaded blind holes 1409 via one or more (e.g. five) shoulder screws 9100. The backing plate 901 may perform as the shared separator between the left 902 and right 903 subsections.

As illustrated in FIGS. 15A and 15B, the storage server's 100 backing plate 901 utilizes one or more "pockets", each named a plate pocket 1504. The plate pockets 1504 may be right triangle or rectangle shaped and may use mirrored patterns of such shapes. As the plate pockets 1504 may be generated via CNC milling, said pocket's 1504 interior corners 1503 (i.e. angles) often have concave fillets (e.g. 0.13" radius) to ease said machining. The plate pockets 1504 are located on the left 302 and the right 303 side of the installed backing plate 901; and the pattern of pockets 1504 is "side to side" asymmetrical, i.e. said pattern may be offset between said sides. The plate pockets 1504 may be machined to a depth that leaves a minimum backing plate 901 thickness remaining (e.g. 0.05"); and the plate pocket's 1504 floor may have a floor fillet (e.g. 0.03" radius) and said pocket's 1504 wall may have a wall chamfer (e.g. 0.025"). The plate pockets 1504 may be used to desirably reduce the mass (i.e. weight) of the backing plate 901 while retaining as much of the structural integrity of said plate 901, that existed prior to pocketing, as is practical and/or possible.

Illustrated in FIGS. 15A and 15B, is a mechanism the backing plate 901 uses to secure, position, and align backplanes 812 and 813 within the storage server's 100 top 208 and bottom 209 sections. This mechanism may use CNC milled "circular bosses", each named a plate boss 1501, which may be of equal height and circumference. The plate bosses 1501 may be machined from the same aluminum billet (e.g. bar stock) as the backing plate 901. Further, in the same operation in which plate bosses 1501 are machined, a CNC driven form tap may thread form (via displacement) a "threaded blind hole", named a plate hole 1502. Each plate hole 1502 may be centered within each corresponding plate boss 1501 and may be utilized to attach various components to the backing plate 901 via machine screws. The aggregation of "planar attachment surfaces", named a left surface 1506, from individual plate bosses 1501 located on the left side 302 (see FIG. 15A) of the backing plate 901 may be used to affix the left backplane 812 to said backing plate 901; and the aggregation of "planar attachment surfaces", named a right surface 1507, from individual plate bosses 1501 located on the right side 303 (see FIG. 15B) of said backing plate 901 may be used to affix the right backplane 813 to said backing plate 901. In an embodiment (see FIGS. 15A and 15B), the left surface 1506 is an aggregation, which is planar, of one hundred forty-four plate boss 1501 attachment surfaces; similarly, the right surface 1507 is an aggregation, which is planar, of one hundred forty-four plate boss 1501 attachment surfaces. The planar left surface 1506 combined with corresponding plate holes 1502 may be used to attach and align the left backplane 812 to the backing plate 901; similarly the planar right surface 1507 combined with corresponding plate holes 1502 may be used to attach and align the right backplane 813 to said backing plate 901.

Also, plate bosses 1501 may beneficially enable, via an air gap, various airflows between the backing plate 901 and the affixed backplanes 812 and 813.

In alternative embodiments (not shown in figures), the backing plate 901 uses individual standoffs, which are screwed into said plate 901, in place of the CNC milled plate bosses 1501 and plate holes 1502. The aggregation of the planar attachment surfaces of these standoffs provides the basis for the planar left 1506 and right 1507 surfaces. For example, these standoffs may include various fasteners such as: male-female hex standoffs, female-female hex standoffs, female-female round standoffs, and female-female square standoffs.

Additionally, plate bosses 1501 may serve dual purposes: first as planar surfaces with which backplanes 812 and 813 may be attached to the backing plate 901; and second, as electrical grounding connections for said backplanes 812 and 813. These ground connections may require: first, an electrically conductive backing plate 901 surface treatment (e.g. electroless nickel) or a non-conductive surface treatment (e.g. anodized) paired with plate boss 1501 attachment surface masking; and second, backplanes 812 and 813 which utilize PTHs (Plated Through Holes) with asymmetric top and bottom layer pad diameters. This "larger diameter bottom layer pad", named a bottom pad 1600, may have a circular pattern of solder bumps which perform as an electrical connection between the backplanes 812 and 813 and the plate bosses 1501.

Further, the plate holes 1502 may serve dual purposes: first, as threaded holes to affix backplanes 812 and 813 to the backing plate 901; and second, as threaded holes to affix a solid-state "storage receptacle", named a disk receptacle 1700, to the backplane 812 and 813. The disk receptacles 1700 (e.g. 3M 5622-2222-ML) are backplane 812 and 813 populated connectors used for mating and unmating of storage drives 900. The disk receptacle 1700 may be not only soldered to the backplane 812 and 813 but also affixed via machine screws to the backing plate 901 and thus beneficially capable of an increased number of mating/unmating cycles compared to disk receptacles 1700 which are merely soldered. Disk receptacles 1700, such as the 5622-2222-ML, may each have two flange holes 1710 which are intended to be used by "threaded bolts", each named a receptacle screw 1602, and corresponding nuts per the datasheet; but the backing plate 901 utilizing plate bosses 1501 and plate holes 1502 may beneficially negate the need for and thus installation of such "threaded bolt" nuts.

The storage server 100 may use the backing plate's 901 plate bosses 1501 and plate holes 1502 to negate the necessity for distinct or dedicated backplane 812 and 813 mounting and/or grounding mechanisms and because of such may optimize the printed circuit board layout of the left 812 and right 813 backplanes.

In alternative embodiments (not shown in figures), the backplanes 812 and 813 use dedicated hex standoffs for the mounting and/or grounding mechanisms. These standoffs require matching PTHs located across the backplanes 812 and 813 to provide structural support for mating and unmating of storage drives 900 and optionally to provide chassis ground connections.

Illustrated in FIG. 13A is a dashed line that equally bisects the backing plate 901, which is named a top midline 1300; and illustrated in FIG. 13B is a dashed line that also equally bisects the backing plate 901, which is named a bottom midline 1309. These midlines 1300 and 1309 are each herein defined as a geometrical line which is straight, one-dimensional, and with an infinite length. The top 1300 and bottom 1309 midlines both exist (i.e. lies) in a "two-dimensional plane", named a median plane 1505, and said plane 1505 equally bisects the backing plate 901. Further, the median plane 1505, on which both midlines 1300 and 1309 lie, may be the basis for bilateral symmetry within a three-dimensional coordinate space delimited by the storage server's 100 volume. Herein, the midlines 1300 and 1309 exist in the median plane 1505 because any two unique points from either midline 1300 and 1309 also exist in said median plane 1505. Herein, the terms "bilateral symmetry" and "bilaterally symmetrical" are defined (per OXFORD Languages) as the property of being divisible into symmetrical halves on either side of a unique plane (e.g. median plane 1505). Herein, the terms "bilateral symmetry" and "bilaterally symmetrical" shall incorporate expected tolerances and inherent variations resulting from both the storage server's 100 fabrication and assembly. This fabrication may include not only the tolerances resulting from milling the storage server's 100 various aluminum components (e.g. backing plate 901), but also the tolerances resulting from fabricating said server's 100 various printed circuit boards (e.g. left 812 and right 813 backplanes). Further, such tolerances are compounded with additional tolerances resulting from populating (e.g. pick-and-place machines, surface mount reflow ovens, and through-hole wave soldering) said printed circuit boards with various connectors (e.g. disk receptacle 1700) and components. These tolerances are additionally stacked (i.e. tolerance stacking) when such aluminum components (e.g. backing plate 901) are attached to other aluminum components (e.g. middle panel 110) with various fasteners (e.g. shoulder screws 9100). These tolerances are further tolerance stacked when such aluminum components (e.g. backing plate 901) and printed circuit boards (e.g. left 812 and right 813 backplanes) are assembled with various fasteners (e.g. receptacle screws 1602). Also, the left power slits 532-535 may be bilaterally symmetrical about the median plane 1505 to the right power slits 536-539 respectively; and the left cutout 530 may be bilaterally symmetrical about the median plane 1505 to the right cutout 531. The left 1506 and right 1507 surfaces are parallel or substantially parallel to each other and the median plane 1505, further said plane 1505 is equidistant to said surfaces 1506 and 1507.

Illustrated in FIGS. 15A and 15B are "printed circuit board supports", each named a back support 1500, which extend from both the left 302 and right 303 sides of the backing plate 901. The back supports 1500 may be used to reduce left backplane 812 deflection when the left custom cables 10600 are plugged into the left connector group 1311; while the same back supports 1500 may be used to reduce right backplane 813 deflection when the right custom cables 10700 are plugged into the right connector group 1411. This reduction in backplane 812 and 813 deflection during installation of the left custom cables 10600 and right custom cables 10700 may be beneficial as said deflection may harm press-fit type connections such as those used by the left connector group 1311 and the right connector group 1411.

Figure 16A:
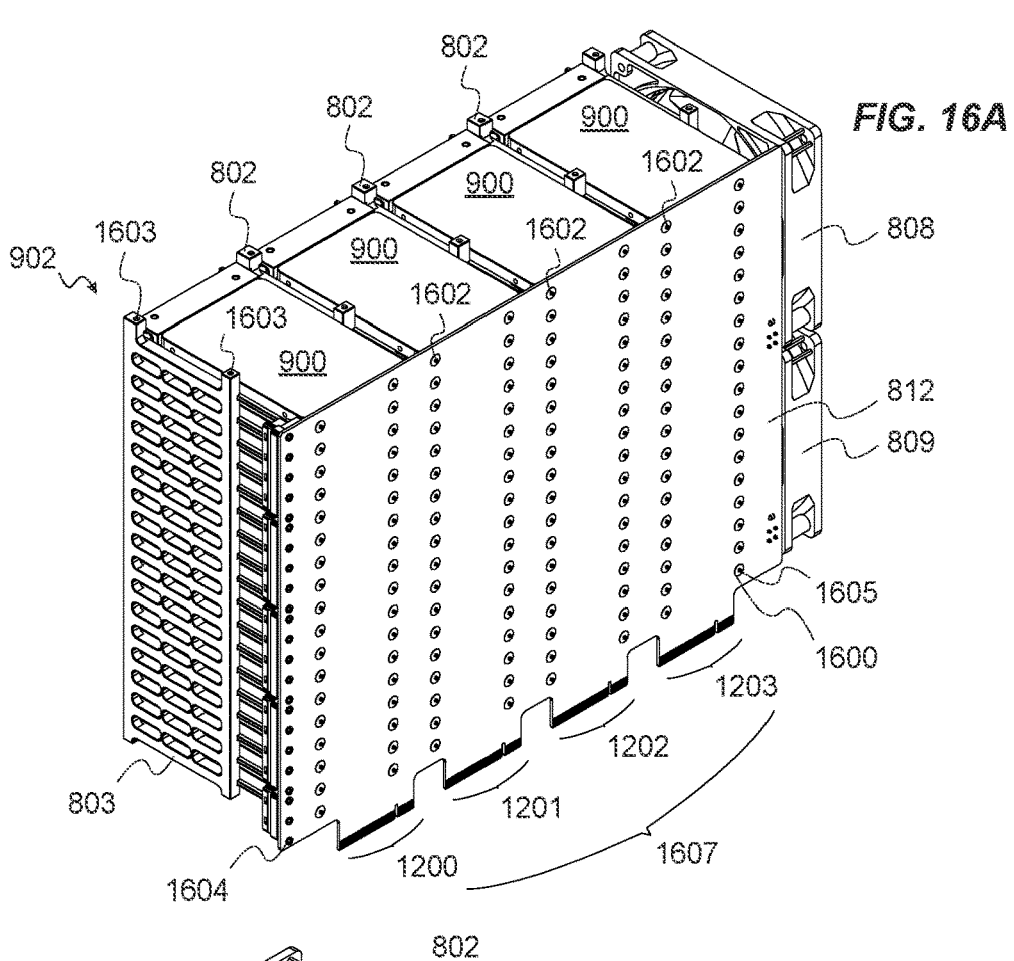
FIG. 16A illustrates a top, front, right perspective-view of a left subsection with a backing plate removed according to an embodiment.
Figure 16B:
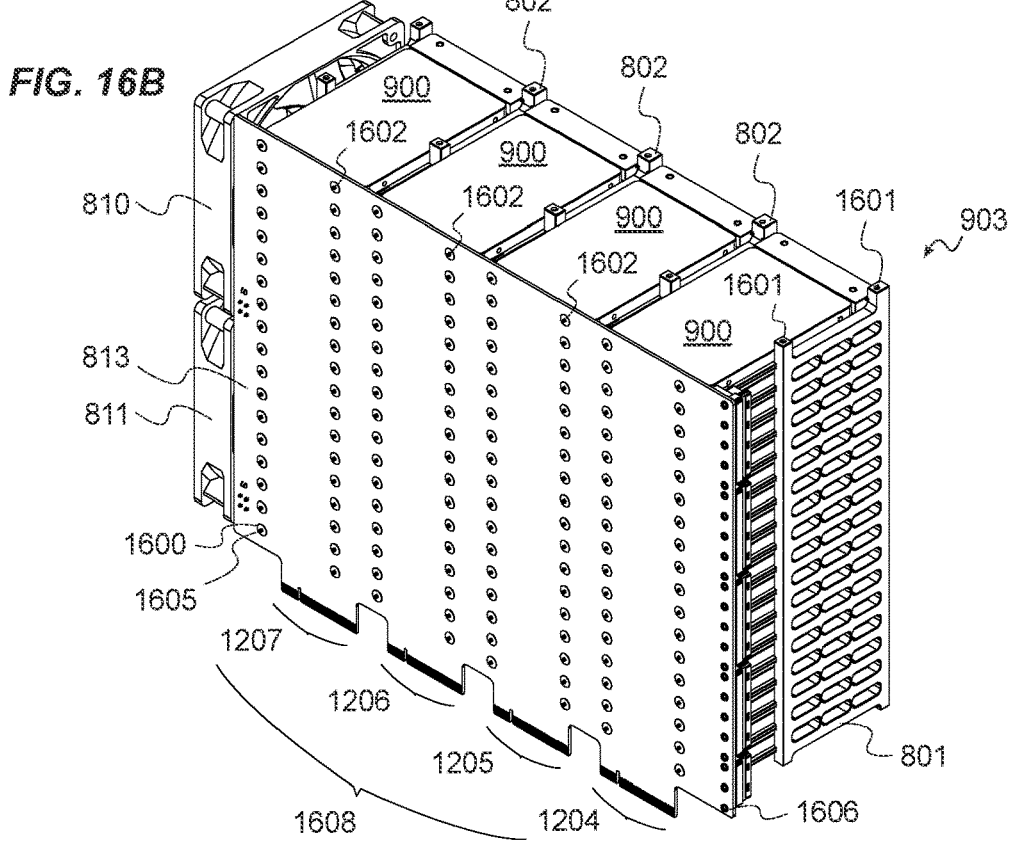
FIG. 16B illustrates a top, front, left perspective-view of a right subsection with a backing plate removed according to an embodiment.

Illustrated in FIGS. 16A and 16B are the left 902 and right 903 subsections without the shared backing plate 901, and thus displaying the PTHs 1605 and bottom pads 1600 for the left 802 and right 803 backplanes. For each left backplane 812 and right backplane 813, these large diameter (e.g. 0.250") bottom pads 1600 may be located on the bottom layer while the corresponding top layer pads are of a smaller diameter (e.g. 0.175"). These smaller top pads are sized to fit beneath the extent of the disk receptacle 1700 and thus will not be evident in FIG. 17A or 17B. In an embodiment, each backplane 812 and 813 populated disk receptacle 1700 may have two flange holes 1710 where each hole 1710 may be centered to the bottom pad 1600. The bottom pads 1600 may electrically connect with and center to plate bosses 1501, thus enabling "up to" one hundred forty-four backing plate 901 grounding connections per backplane 812 and 813. By providing two plate bosses 1501 (as structural supports) per disk receptacle 1700, backplane 812 and 813 deflection resulting from drives 900 being mated and unmated may be beneficially reduced. Also, the left connector group 1311 may use various "fasteners", each named a left screw 1604, to attach and secure said connector group 1311 to the left backplane 812; and the right connector group 1411 may use various "fasteners", each named a right screw 1606, to attach and secure said connector group 1411 to the right backplane 813. Herein, the left backplane's 812 power couplers 1200-1203 are named a left edge group 1607 and the right backplane's 813 power couplers 1204-1207 are named a right edge group 1608.

Illustrated in FIG. 17A is the left backplane 812 which includes but is not limited to the following: seventy-two disk receptacles 1700, one hundred forty-four receptacle screws 1602, seventy-two "bypass capacitor groups" where each is named a bypass group 1705, one left connector group 1311, twenty-three left screws 1604, one left edge group 1607, two "right-angle dual-row connectors" each named a left fan connector 1701 and 1702, a "temperature sensor" which is named a left temp sensor 1706, and PWM control circuitry 1707. The left backplane 812 may support seventy-two storage drives 900 which may be mated to said left backplane 812 via the seventy-two disk receptacles 1700.

Illustrated in FIG. 17B is the right backplane 813 which includes but is not limited to the following: seventy-two disk receptacles 1700, one hundred forty-four receptacle screws 1602, seventy-two bypass groups 1705, one right connector group 1411, twenty-three right screws 1606, one right edge group 1608, two "right-angle dual-row connectors" each named a right fan connector 1703 and 1704, a "temperature sensor" which is named a right temp sensor 1708, and PWM control circuitry 1709. The right backplane 813 may support seventy-two storage drives 900 which may be mated to said right backplane 813 via the seventy-two disk receptacles 1700.

Illustrated in FIGS. 17A and 17B are the left 812 and right 813 backplanes respectively. The left 812 and right 813 backplanes may use novel circuit board layouts which enable not only bilateral accessibility to storage drives 900 located in the left 902 and right 903 subsections, but also a bilaterally symmetrical mounting of said drives 900 within said subsections 902 and 903. Further, this bilateral symmetry of the storage drive's 900 mounting mechanism may be in relation to the backing plate's 901 median plane 1505. The storage drive's 900 mounting mechanism may include one or more (e.g. four) "threaded or non-threaded bottom mounting holes", where each is named a mounting hole 2525. The storage drives 900 may mate and unmate, with backplane 812 and 813 populated disk receptacles 1700, via an integrated "storage device interface connector" named a device connector 1800 (see FIGS. 18A and 18B). The storage drive's 900 device connector 1800 may be neither centered nor symmetric in relation to the exterior of said drive 900. So, even if aspects of the storage drive 900, such as said drive's 900 mounting holes 2525, are able to be positioned bilaterally symmetrical about the median plane 1505, the device connector 1800 may not. In an embodiment, the disk receptacles 1700, which mate and unmate with the device connectors 1800, are positioned in such a way that the mounting holes 2525 of the storage drives 900 located in the left subsection 902 are bilaterally symmetrical about the backing plate's 901 median plane 1505 to the mounting holes 2525 of the storage drives 900 located in the right subsection 903. This bilaterally symmetrical placement of such mounting holes 2525 may increase the storage server's 100 drive carrier 800, and thus storage drive 900, density by enabling an optimized placement of said carriers 800 within said server 100. Thereby, this resulting optimized drive carrier 800 placement may beneficially provide a reduction or minimization of the storage server's 100 volume via corresponding reductions in one or more of said server's 100 dimensions (i.e. box width 101, box depth 102, and box height 103).

In alternative embodiments (not shown in figures), storage drives 900 conform to the M.2 specification and thereby provide a single plated (or non-plated) through-hole or partial through-hole to serve as the mounting hole 2525 of said drives 900.

Figures 43A, 43B, 43C:
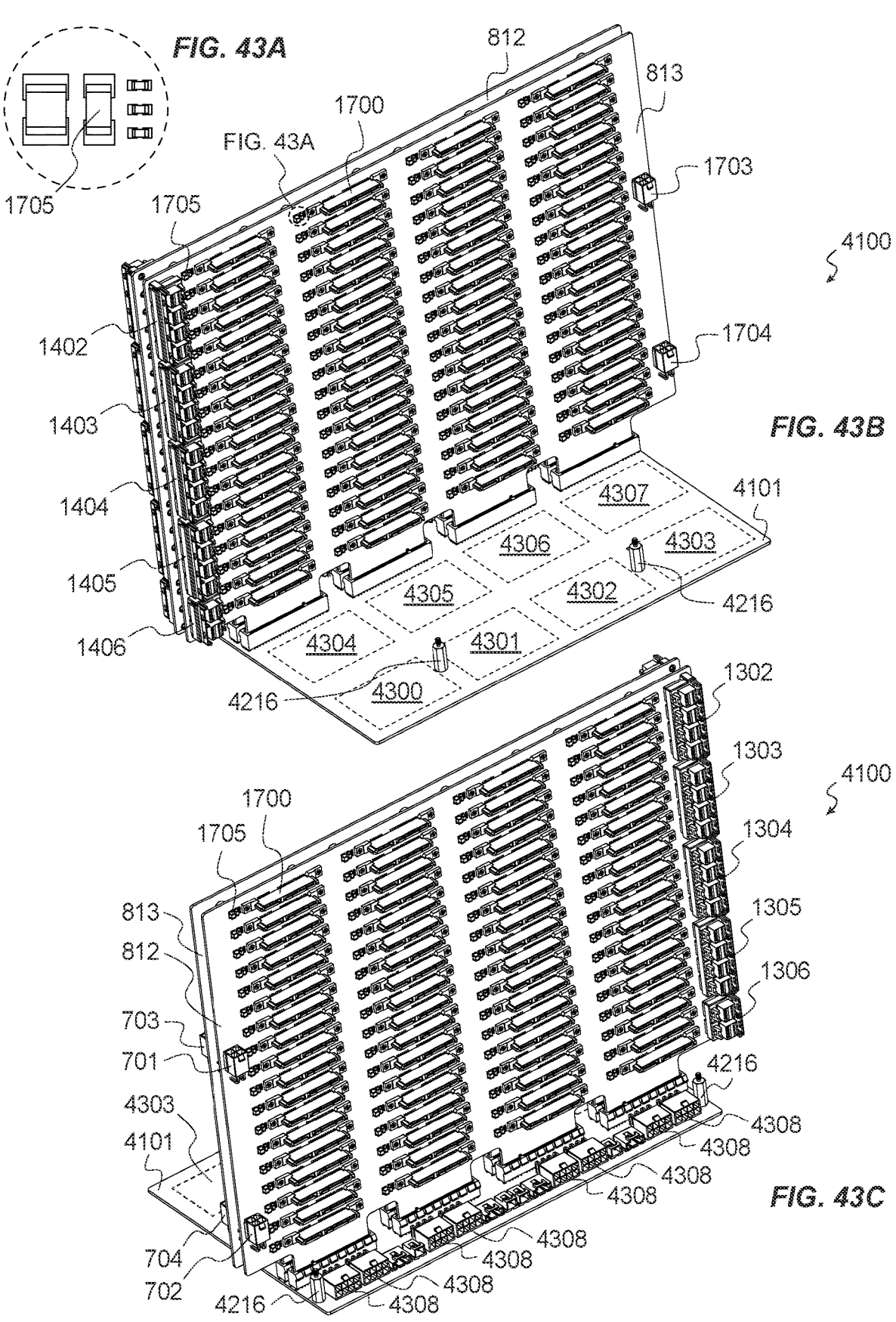
FIG. 43A illustrates a detail-view of a bypass group according to an embodiment.
FIG. 43B illustrates a top, front, right perspective-view of a power system with a middle panel and a backing plate removed according to an embodiment.
FIG. 43C illustrates a top, back, left perspective-view of a power system with a middle panel and a backing plate removed according to an embodiment.

Also illustrated in FIGS. 17A and 17B are the left 1311 and right 1411 connector groups. The left connector group 1311 (see FIG. 17A) may be positioned bilaterally symmetrical about the median plane 1505 to the right connector group 1411 (see FIG. 17B). Further, the left backplane's 812 power couplers 1200-1203 may be bilaterally symmetrical about the median plane 1505 to the right backplane's 813 power couplers 1204-1207 respectively, thus the left backplane's 812 left edge group 1607 may be bilaterally symmetrical about the median plane 1505 to the right backplane's 813 right edge group 1608. In certain embodiments, these bilateral symmetries may result in backplane 812 and 813 placements which may result in minimized storage server 100 dimensions (e.g. box width 101, box depth 102, and box height 103. Power delivery from the backplanes 812 and 813 to each storage drive 900, via the disk receptacle 1700, may be improved (e.g. less ripple voltage) with the specific placement of bypass groups 1705. To wit, one or more (e.g. one) bypass groups 1705 may be assigned and positioned next to each disk receptacle 1700. The bypass groups 1705 may use various capacitor types such as MLCC, organic polymer, and/or aluminum organic. As illustrated in FIG. 43A, the bypass group 1705 includes but is not limited to the following: one 1210 MLCC, one 1206 MLCC, and three 0402 MLCCs. Also, the MLCCs in the bypass group 1705 may be selected and positioned to align with the extent of the disk receptacle 1700 in such a way as to optimize the routing of differential signals by not impeding the shortest path of said signals.

Illustrated in FIG. 17A is the left backplane 812 which may manage the thermal regulation of the left flow 904 as said flow 904 passes through the left subsection 902. The left flow 904 may be generated by the left fan group 1310 which may be mounted bilaterally symmetrical, about the median plane 1505, to the right fan group 1410. The left fan group 1310 may be controlled by a PWM (Pulse-Width Modulation) directed electrical signal output by a microcontroller (e.g. PIC18LF26K22) and associated circuitry (e.g. SN74LV1T34). This fan control circuitry may be populated (i.e. located) in an area on the left backplane 812 as indicated by dashed rectangles 1707. The RPM of the left fan group's 1310 top axial fans 808 and 809 may be determined by the output from the left temp sensor 1706 (e.g. MCP9808) which may supply continuous temperature readings to the corresponding controller. The top axial fans 808 and 809 may each be powered, controlled, and monitored via one left fan connector 1701 and 1702 (e.g. MOLEX 39301042) respectively.

Illustrated in FIG. 17B is the right backplane 813 which may manage the thermal regulation of the right flow 907 as said flow 907 passes through the right subsection 903. The right flow 907 may be generated by the right fan group 1410 which may be mounted bilaterally symmetrical, about the median plane 1505, to the left fan group 1310. The right fan group 1410 may be driven by a PWM directed electrical signal output by a microcontroller (e.g. PIC18LF26K22) and associated circuitry (e.g. SN74LV1T34). This fan control circuitry may be populated (i.e. located) in an area on the right backplane 813 as indicated by dashed rectangles 1709. The RPM of the right fan group's 1410 top axial fans 810 and 811 may be determined by the output from the right temp sensor 1708 (e.g. MCP9808) which may supply continuous temperature readings to a corresponding microcontroller. The top axial fans 810 and 811 may each be powered, controlled, and monitored via one right fan connector 1703 and 1704 (e.g. MOLEX 39301042) respectively. The robustness of the fan connectors 1701-1704 may support an increased frequency of insertions and removals to and from said connectors 1701-1704.

Illustrated in FIGS. 17A and 17B, are the left 812 and the right 813 backplanes respectively. The backplanes 812 and 813 may use printed circuit board layouts that enable an optimized panelization. As the cost to fabricate printed circuit boards is typically based on a per panel basis, maximizing the number of said printed circuit boards per panel may reduce the individual cost of said printed circuit boards. In an embodiment, the layout of the left backplane 812 may be joined with the layout of the right backplane 813 to create a combined printed circuit board layout that may then be fabricated beneficially from a single industry standard 18"×24" panel.

Figure 18A:
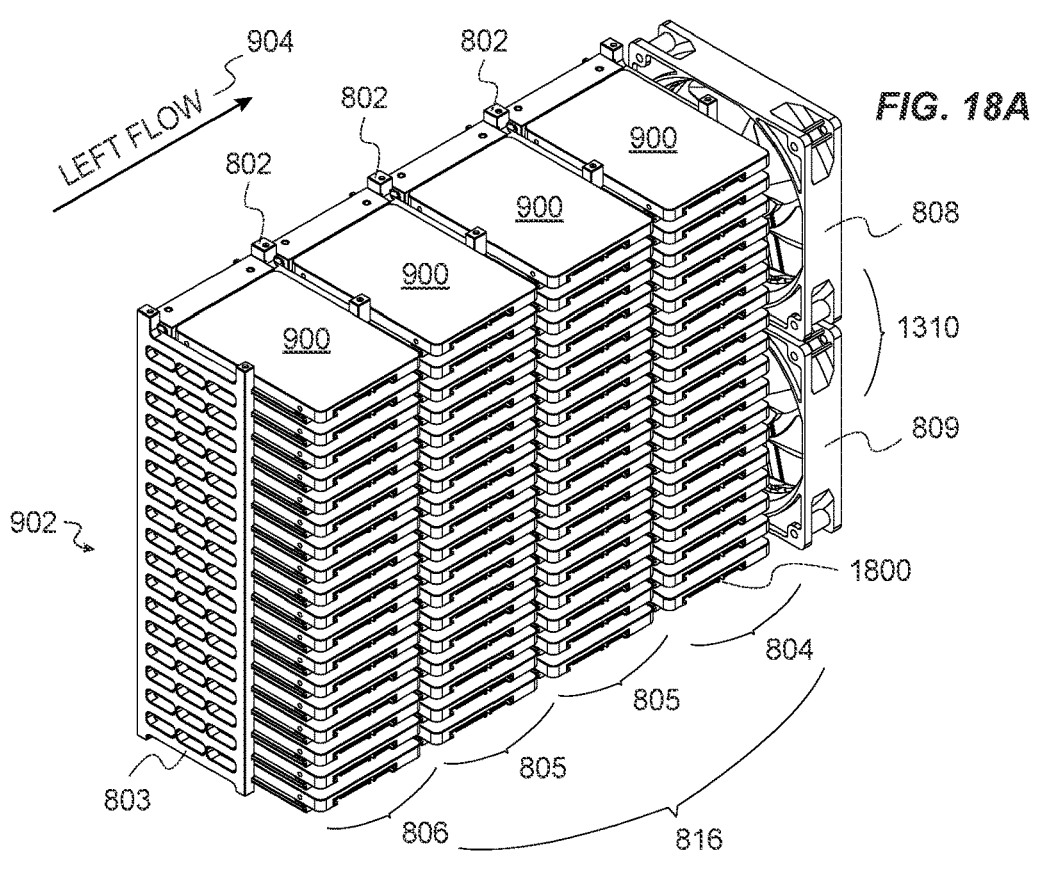
FIG. 18A illustrates a top, front, right perspective-view of a left subsection with a backing plate and a left backplane removed according to an embodiment.
Figure 18B:
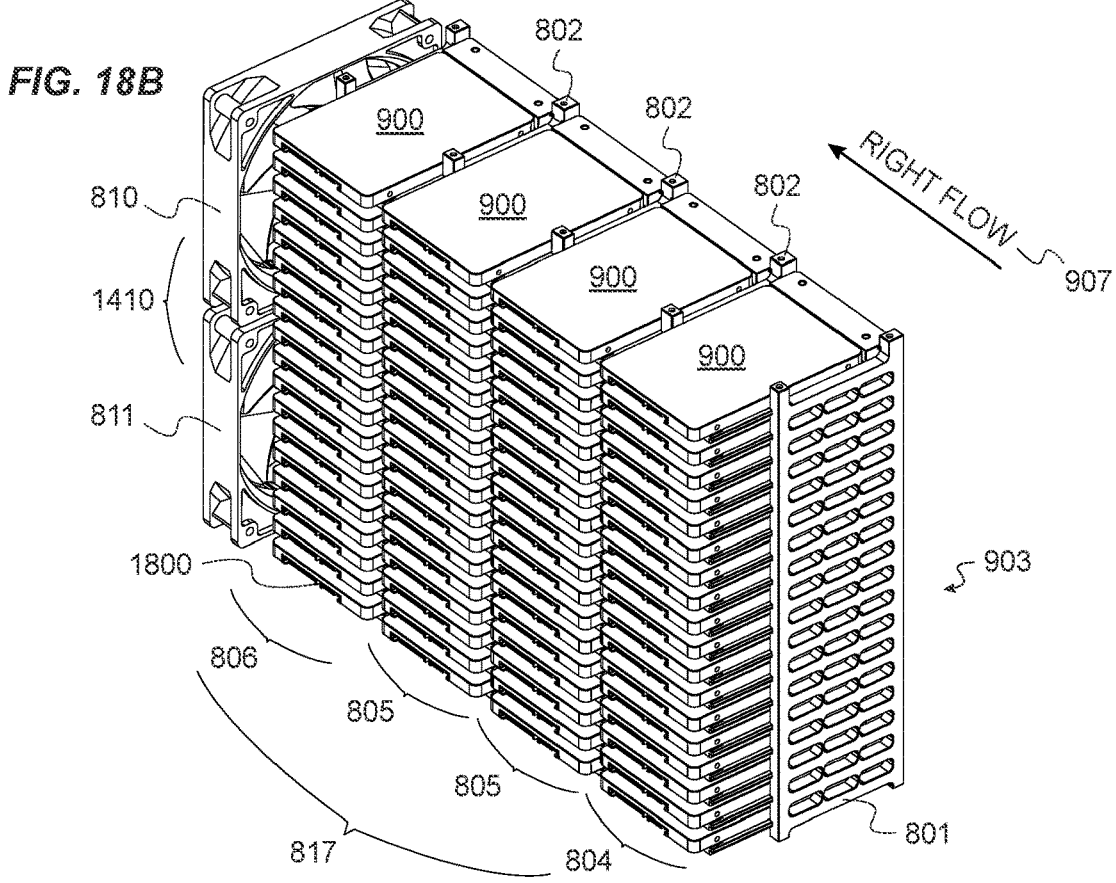
FIG. 18B illustrates a top, front, left perspective-view of a right subsection with a backing plate and a right backplane removed according to an embodiment.

Illustrated in FIGS. 18A and 18B are the left 902 and right 903 subsections respectively, each without the shared backing plate 901 and corresponding backplanes 812 and 813.

Figures 39A, 39B:
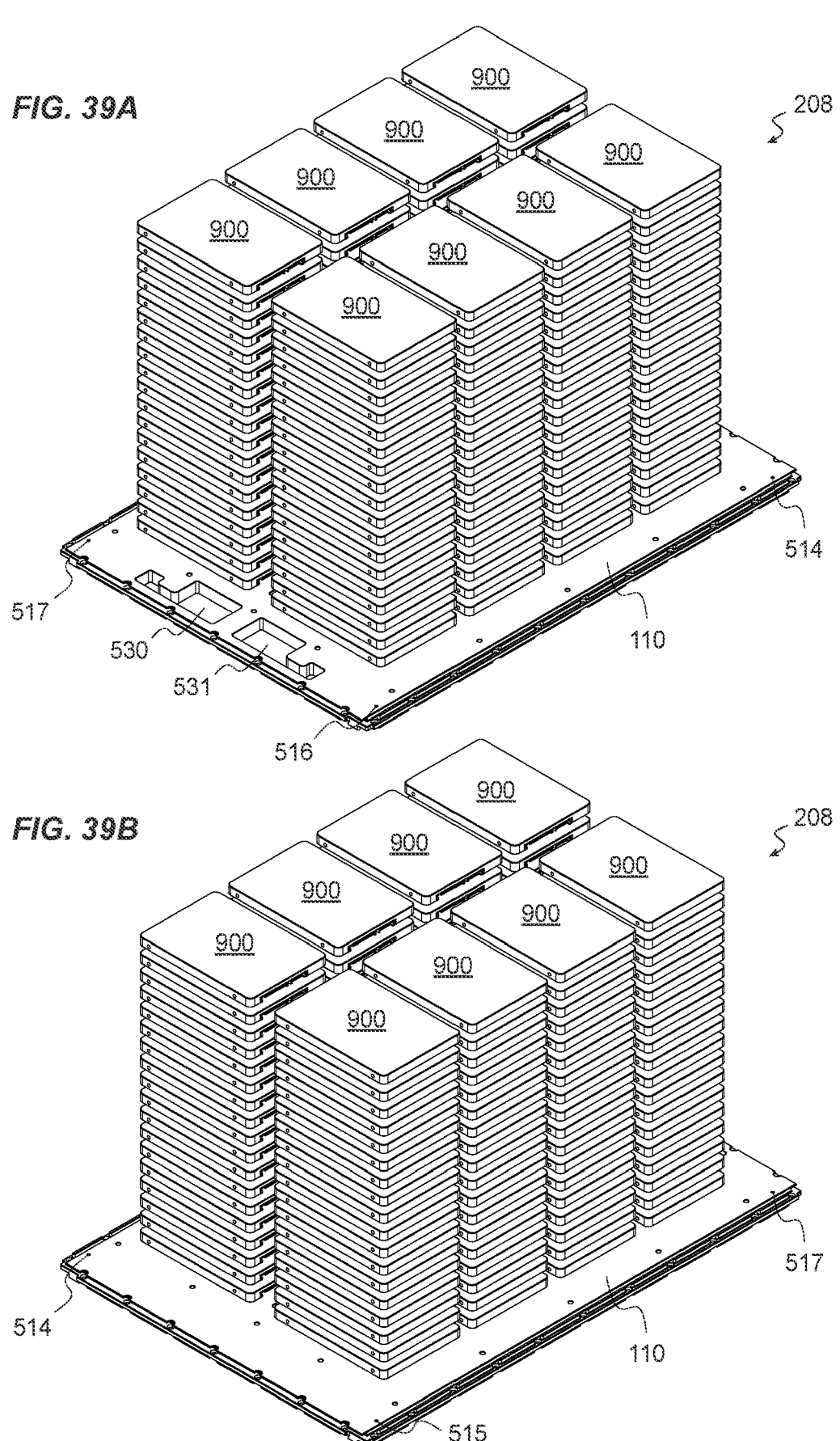
FIG. 39A illustrates a top, front, right perspective-view of a top section with various components removed to present certain bilateral symmetries about a median plane according to an embodiment.
FIG. 39B illustrates a top, back, left perspective-view of a top section with various components removed to present certain bilateral symmetries about a median plane according to an embodiment.

Thus, the device connector 1800 of each storage drive 900 within each subsection 902 and 903 is visible. As further shown in FIG. 26B, the device connector 1800 is not centered within the storage drive's 900 connector face 2603; also, said connector 1800 is not symmetric about said drive's 900 carrier centerline 2605. To adjust for these device connector 1800 attributes the backplane 812 and 813 populated disk receptacles 1700 may be specifically positioned in such a way (see FIGS. 17A and 17B) that the mounting holes 2525 of the storage drives 900 located in the left subsection 902 may be bilaterally symmetrical about the median plane 1505 to the mounting holes 2525 of the storage drives 900 located in the right subsection 903. The bilaterally symmetrical mounting holes 2525 and the resulting storage drive 900 placements within the left 902 and right 903 subsections are also illustrated in FIGS. 39A and 39B.

Illustrated in FIGS. 19A and 19B is the left vertical locator 801, which is one of three types of vertical locators 801-803. The left vertical locator 801 when paired with the inner vertical locator 802 and one or more (e.g. eighteen) drive carriers 800 may compose the left carrier column 804, which is one of three types of carrier columns 804-806. The vertical locators 801-803 may function as follows: first, to facilitate insertion and removal of drive carriers 800 to and from the carrier columns 804-806; second, to facilitate mating and unmating of the drive carrier's 800 attached storage drive 900 to the corresponding backplane 812 and 813. This facilitation of drive carrier 800 insertion/removal and storage drive 900 to backplane 812 and 813 mating/unmating may underlie the drive carrier's 800 role in enabling the end-user serviceability of the storage server 100.

Also illustrated in FIG. 19B, the left vertical locator's 801 "slide channels", each named an insertion channel 1901, may be used to guide the drive carrier 800 towards carrier column 804-806 insertion. The carrier column 804-806 insertion may also use "horizontal rails" protruding from said carrier 800, each named an insertion rail 2601. The insertion rails 2601 extend out from both the drive carrier's 800 "left side", named a left carrier side 2401, and said carrier's 800 "right side", named a right carrier side 2402. Each insertion rail 2601 has a "slide surface", named a rail slide 2602, which may contact with a corresponding "slide surface" of an insertion channel 1901, named a channel slide 1902. To ease carrier column 804-806 insertion of the drive carriers 800, the entrance of the vertical locator's 801-803 insertion channel 1901 may be flared, thus facilitating such insertion.

Also illustrated in FIG. 19B, the left vertical locator's 801 "notch", named a wing notch 1900, may be used to enforce the drive carrier's 800 orientation during carrier column 804-806 insertion. The wing notch 1900 may correspond to the drive carrier's 800 "orientation protrusion", named a wing guide 2516. The wing guide 2516 when joined with the corresponding wing notch 1900 may promote a proper insertion orientation of the drive carrier 800, while the improper drive carrier 800 orientation may result in a physical obstruction between said guide 2516 and the corresponding vertical locator 801-803. The enforcement of proper insertion orientation may desirably prevent mating damage to the backplanes 812 and 813.

Also illustrated in FIGS. 19A and 19B are "ventilation voids", each named a vent void 1903. The vent voids 1903 may be similarly utilized by the three types of vertical locators 801-803 and may function as follows: to reduce airflow resistance to the top flow 104, which may result in an increased CFM of said flow 104; and, to reduce the mass (or weight) of said locators 801-803.

Illustrated in FIGS. 20A and 20B is the right vertical locator 803, which when paired with the inner vertical locator 802 and one or more (e.g. eighteen) drive carriers 800 may compose the right carrier column 806. The vertical locators 801-803 may function not only to align drive carrier 800 insertions and storage drive 900 to backplane 812 and 813 mating, but also to provide structural rigidity to the top section 208.

Illustrated in FIG. 20B is the right vertical locator's 803 "retention cavity", named a retent cell 2000. The retent cell 2000, in addition to the mating of the device connector 1800 to the disk receptacle 1700, may function to retain the drive carrier's 800 position following carrier column 804-806 insertion. This holding mechanism may use a "retention bar" which may protrude from the drive carrier 800, named a retent bar 2508. During drive carrier 800 insertion, the retent bar 2508 may pivot into the retent cell 2000 and thereby prevent said carrier 800 from unintentional removal.

Illustrated in FIGS. 21A and 21B is the inner vertical locator 802, which when paired with another inner vertical locator 802 and one or more (e.g. eighteen) drive carriers 800 may compose the inner carrier column 805. For the left 816 and right 817 column groups to properly align drive carriers 800: the inner vertical locator's 802 features shown in FIG. 21A should have identical dimensions to the left vertical locator's 801 features shown in FIG. 19B; and similarly, the inner vertical locator's 802 features illustrated in FIG. 21B should have identical dimensions to the right vertical locator's 803 features illustrated in FIG. 20B.

Figure 22:
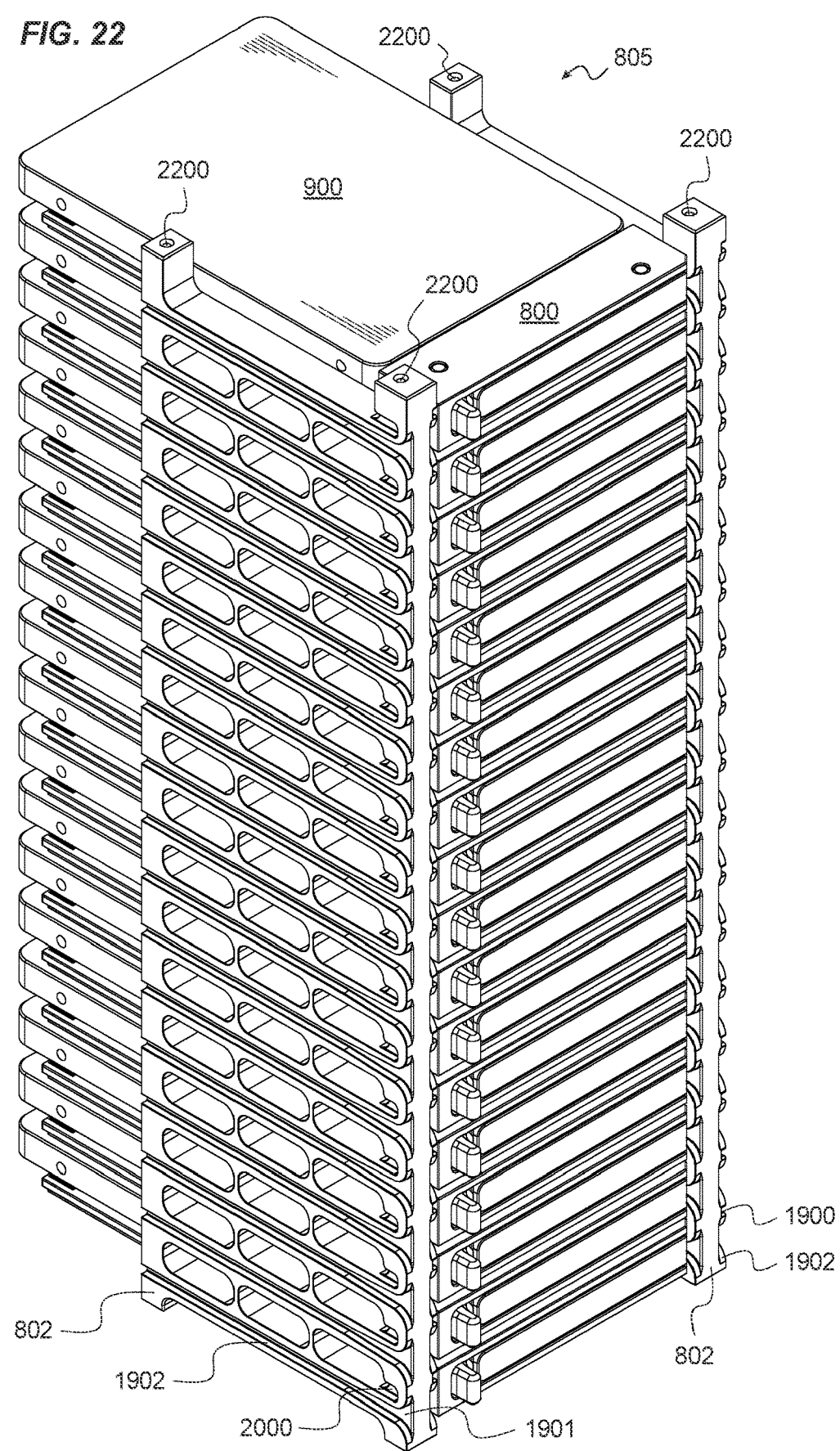
FIGS. 22 and 23 illustrate perspective-views of an inner carrier column according to an embodiment.
Figure 23:
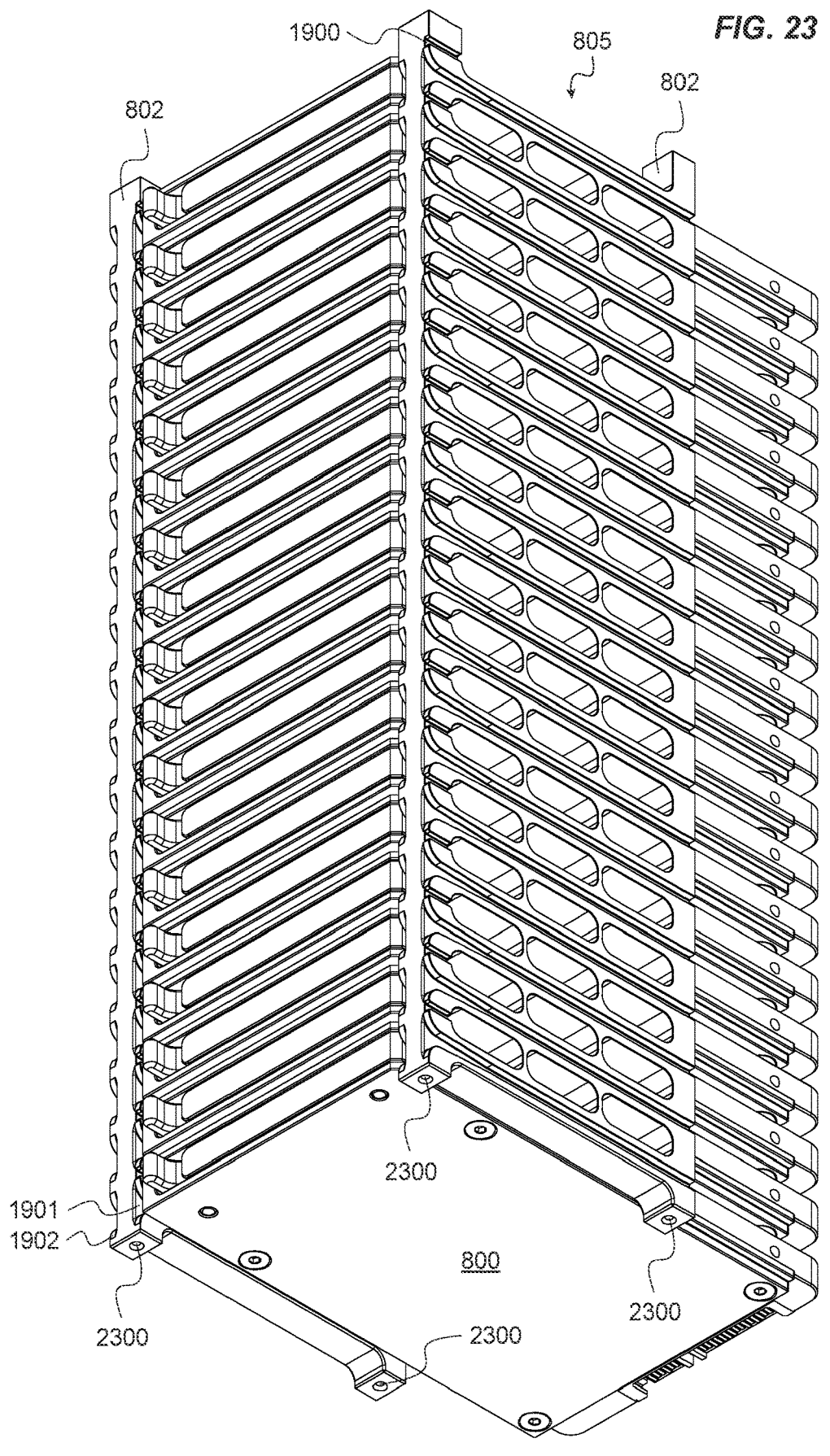

Illustrated in FIGS. 22 and 23 is an embodiment of the inner carrier column 805. The inner carrier column's 805 threaded blind holes 2200 and 2300 which may structurally attach, via shoulder screws 9001 and 9100, to the top panel's 105 and middle panel's 110 counterbored clearance holes 3002 and 502 respectively. To wit, the inner vertical locator's 802 threaded holes 2200 may be used to structurally attach to the top panel's 105 clearance holes 3002 with shoulder screws 9001, and the inner vertical locator's 802 threaded holes 2300 may be used to structurally attach to the middle panel's 110 clearance holes 502 with shoulder screws 9100. Further, the left vertical locator 801 may structurally attach, via shoulder screws 9001 and 9100, to the top panel's 105 and middle panel's 110 counterbored clearance holes 3001 and 501 respectively. To wit, the left vertical locator's 801 threaded holes 3400 may be used to structurally attach to the top panel's 105 clearance holes 3001 with shoulder screws 9001, and the left vertical locator's 801 threaded holes 905 may be used to structurally attach to the middle panel's 110 clearance holes 501 with shoulder screws 9100. Further, the right vertical locator 803 may structurally attach, via screws 9001 and 9100, to the top panel's 105 and the middle panel's 110 counterbored clearance holes 3003 and 503 respectively. To wit, the right vertical locator's 803 threaded holes 3401 may be used to structurally attach to the top panel's 105 clearance holes 3003 with shoulder screws 9001, and the right vertical locator's 803 threaded holes 906 may be used to structurally attach to the middle panel's 110 clearance holes 503 with shoulder screws 9100. The shoulder screws 9001 and 9100 may have the same features: 18-8 stainless steel, 3 mm shoulder diameter, 4 mm shoulder length, and a M2×0.4 mm thread.

Illustrated in FIGS. 24A-24F is the drive carrier 800 which may be inserted into one of three types of carrier columns 804-806 by an end-user with the following orientation: first, said carrier's 800 "front face", named a front carrier face 2405, is directed towards an end-user while said carrier's 800 "back face", named a back carrier face 2406, is directed towards the storage server 100; second, said carrier's 800 "top face", named a top carrier face 2403, is held upward while said carrier's 800 "bottom face", named a bottom carrier face 2404, is held downward. Following proper orientation of the drive carrier 800, the next step is to keep both insertion rails 2601 aligned within the corresponding insertion channels 1901 while sliding said carrier 800 towards a mating with the respective backplane 812 and 813.

Figures 24E, 24F:
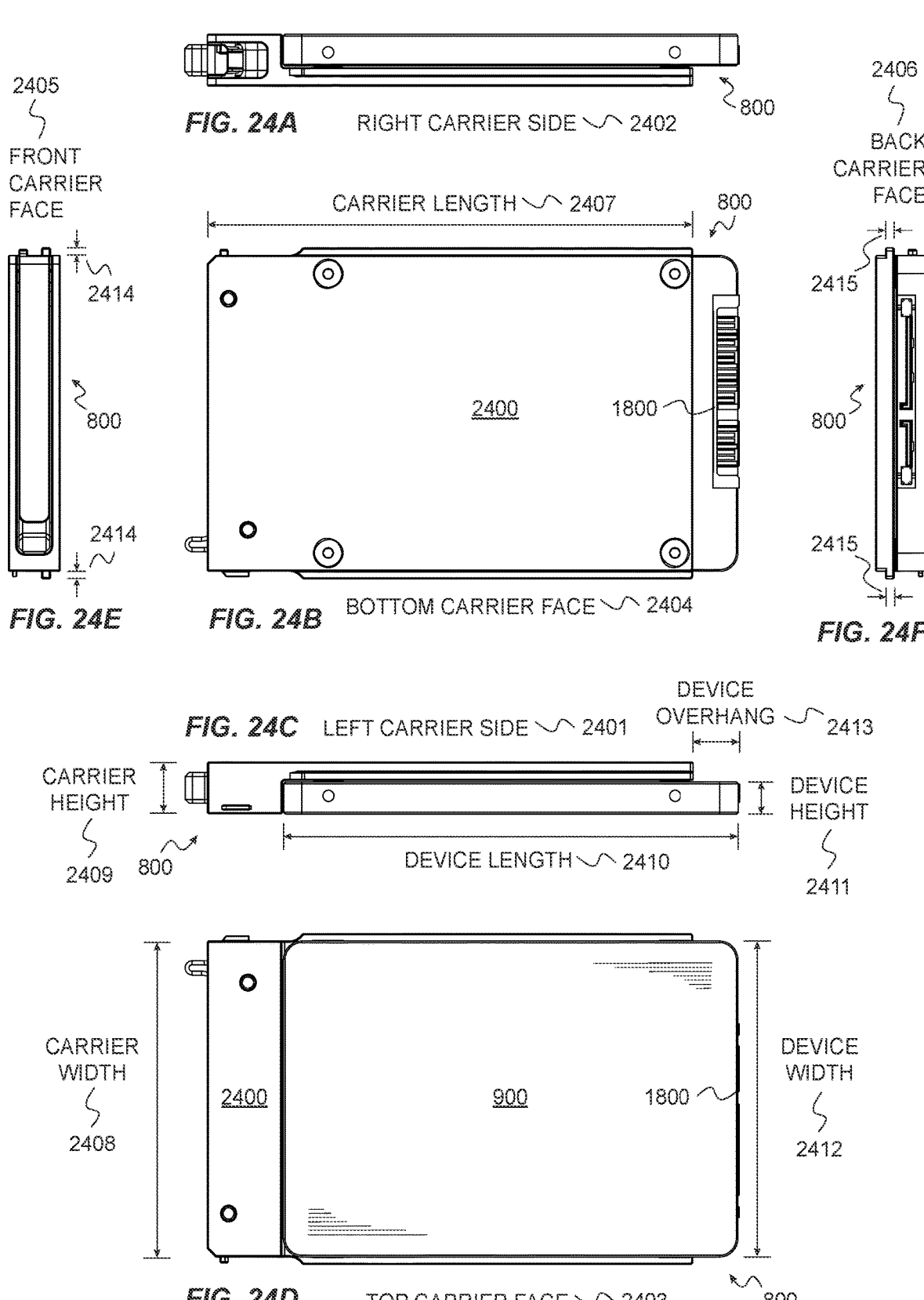
FIG. 24E illustrates a front carrier face orthographic-view of a drive carrier, which includes a storage drive, according to an embodiment.
FIG. 24F illustrates a back carrier face orthographic-view of a drive carrier, which includes a storage drive, according to an embodiment.

Also illustrated in FIGS. 24A-24F is the drive carrier 800 with an affixed 2.5" solid-state storage drive 900 (e.g. SSD), as defined by SFF-8201/8223. In an embodiment, the storage drive 900 may have a "height" of 7 mm which is named a device height 2411, a "length" of 100.45 mm (i.e. SFF-8201 A6 dimension) which is named a device length 2410, and a "width" of 69.85 mm (i.e. SFF-8201 A4 dimension) which is named a device width 2412. the drive carrier's 800 "width" (which does not include the width of the two insertion rails 2601), named a carrier width 2408, may equal the storage drive's 900 device width 2412 to additionally minimize the overall dimensions and thus spatial volume of said carrier 800. The drive carrier's 800 "height", which is named a carrier height 2409, may be set so that the top carrier face 2403 is coplanar with the storage drive 900 as shown in FIGS. 24A and 24C, being coplanar may further minimize the overall dimensions and thus spatial volume of said carrier 800. The drive carrier's 800 "length" which is named a carrier length 2407 may be set so that the storage drive 900 may be affixed to said carrier 800 with an "overhang" which is named a carrier overhang 2413. The carrier overhang 2413 may be beneficial in two regards: first, to provide clearance for the storage drive's 900 device connector 1800 when mating and unmating to the backplane's 812 and 813 disk receptacle 1700; second, to minimize the carrier length 2407 and thereby the drive carrier's 800 mass. The carrier length 2407 may be minimized by limiting said carrier length 2407 to the minimum that may still allow the drive carrier's 800 "billet based chassis", named a carrier chassis 2400, to be attached to the storage drive's 900 mounting holes 2525 via one or more (e.g. four) "fasteners" where each is named a carrier fastener 2507 (e.g. M3 screws).

Figure 25A:
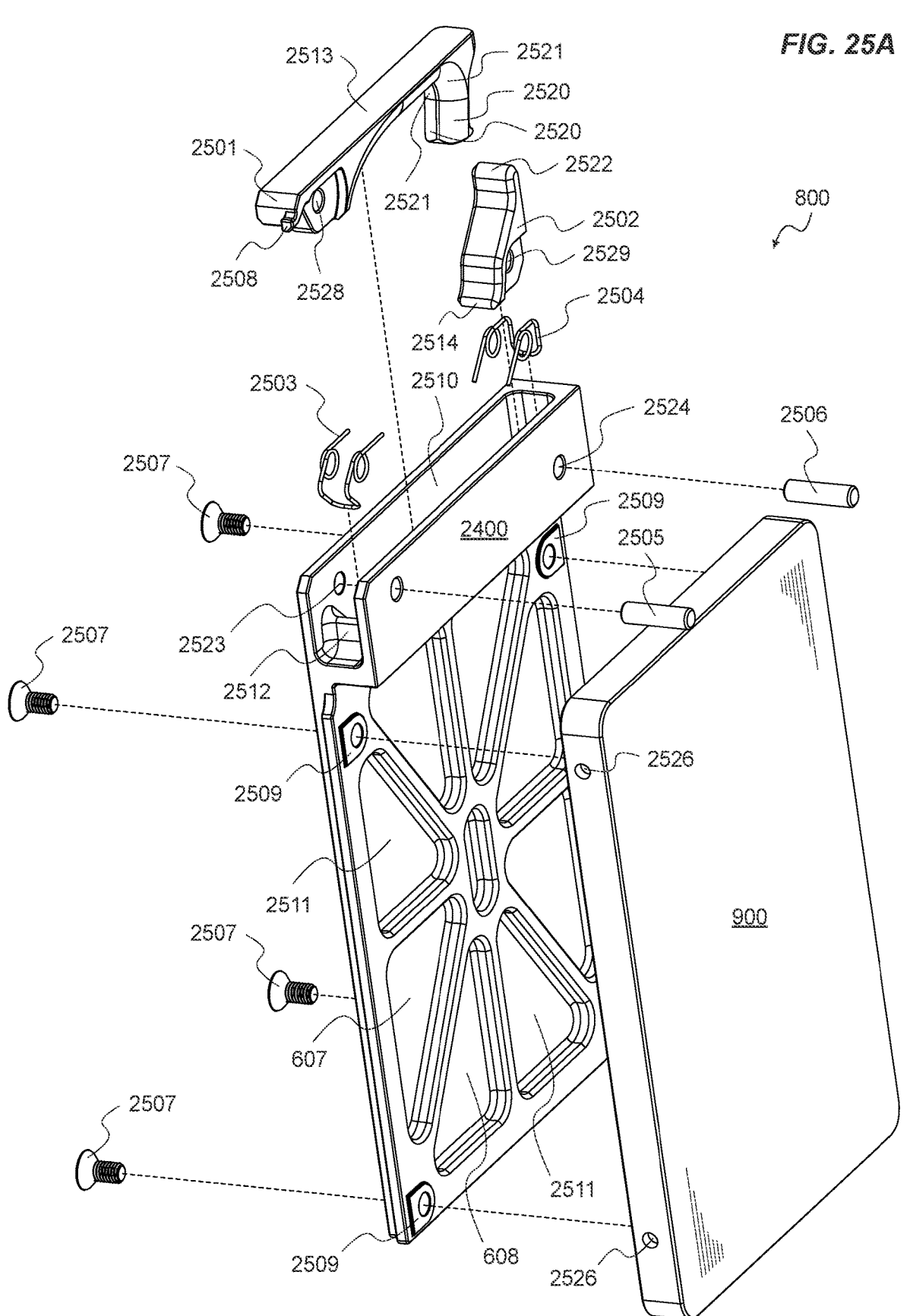
FIG. 25A illustrates an exploded-view of a drive carrier, which includes a storage drive, according to an embodiment.

Illustrated in FIG. 25A is the drive carrier 800, via an exploded-view, and underlying to said carrier 800 may be the carrier chassis 2400. The carrier chassis 2400 may provide the basis for not only the drive carrier's 800 structural foundation, but also an attachment apparatus for components which may include: the storage drive 900, an "extraction lever" named a carrier lever 2501, an "extraction trigger" named a carrier trigger 2502, a "carrier lever spring" named a lever spring 2503, a "carrier trigger spring" named a trigger spring 2504, a "carrier lever dowel" named a lever dowel 2505, a "carrier trigger dowel" named a trigger dowel 2506, and one or more (e.g. four) carrier fasteners 2507. In an embodiment, the carrier chassis 2400 may be designed to be CNC milled from billet material (e.g. 6061-T6). Certain benefits may be gained by machining the carrier chassis 2400 from billet which may include improved torsional and lateral rigidity of said chassis 2400. Further, "pockets", each named a carrier pocket 2511, may be CNC milled concurrent with the carrier chassis 2400 to minimize the mass (i.e. weight) of said chassis 2400. The carrier pockets 2511 are typically CNC milled to a depth that leaves the carrier chassis 2400 with a minimum thickness remaining (e.g. 0.05"). Similar to panel pockets 511, the carrier pocket 2511 may have a floor fillet (e.g. 0.03" radius) and a wall chamfer (e.g. 0.025") to ease milling and handling. The carrier chassis' 2400 structural rigidity may be maximized by implementing particular patterns of such pockets 2511 which may be vertically and/or horizontally mirrored and comprised of replications of said pockets 2511, replicated subpatterns of said pockets 2511, or replicated groupings of subpatterns of said pockets 2511. In an embodiment, these subpatterns may be comprised of various orientations of paired right pockets 607 and 608. This may create a rectangular shaped sub-pattern which may then be mirrored horizontally and/or vertically. Also, a "cavity slot", named a carrier cavity 2510, may be CNC milled into the carrier chassis 2400 to attach, retain, and enclose the drive carrier's 800 extraction mechanism. The carrier chassis 2400 may include one or more (e.g. four) carrier spacers 2509 which may beneficially enable an air gap (e.g. 0.015"), and thereby an airflow, between the attached storage drive 900 and said chassis 2400. Also shown in FIGS. 25A and 25C are the unused "side positioned holes" of certain storage drives 900 where each is named an alternate hole 2526.

In alternative embodiments (not shown in figures), the alternate holes 2526 are used to mount storage drives 900 to drive carriers 800 instead of the mounting holes 2525.

In alternative embodiments (not shown in figures), the alternate holes 2526 are used to mount one or more storage drives 900 to the storage drive 900 already mounted to the drive carrier 800.

Figures 25B, 25C:
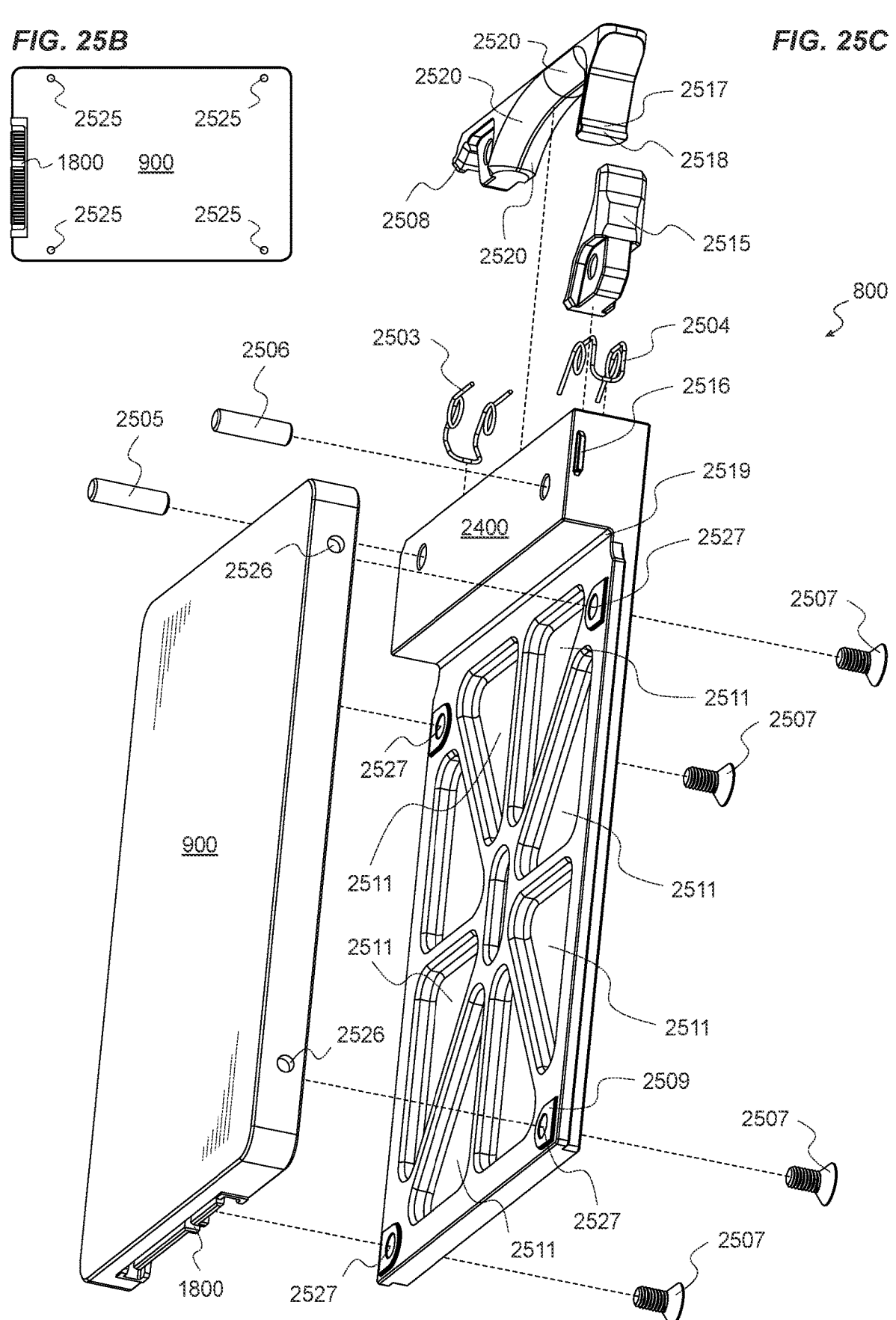
FIG. 25B illustrates a storage drive, which includes a device connector and mounting holes, according to an embodiment.
FIG. 25C illustrates an exploded-view of a drive carrier, which includes a storage drive, according to an embodiment.

Illustrated in FIG. 25C, via an exploded-view, is the drive carrier 800 with the ancillary mechanisms enabled by said carrier 800 exemplified, which include but are limited to the following: the use of carrier fasteners 2507 to affix the carrier chassis 2400, via "countersunk holes" where each is named a carrier hole 2527, to the storage drive's 900 mounting holes 2525 (see FIG. 25B); the lever dowel 2505 which may enable pivoting the carrier lever 2501 relative to said chassis 2400; and the trigger dowel 2506 which may enable pivoting the carrier trigger 2502 relative to said chassis 2400. The carrier trigger 2502 may have a "contact surface", named a back rest 2515, which may press against a "cavity" named a cavity wall 2704 when said trigger 2502 is not being end-user operated. The lever dowel 2505 may be pressed (e.g. arbor press) into a through hole 2523 via the top carrier face 2403 of the carrier cavity 2510 (via a first press-fit) and then into the carrier lever's 2501 through hole 2528 (via a slip-fit) and then into the through hole 2523 (via a second press-fit) of the bottom carrier face 2404. The trigger dowel 2506 may be pressed (e.g. by an arbor press) into a through hole 2524 via the top carrier face 2403 of the carrier cavity 2510 (via a first press-fit) and then into the carrier trigger's 2502 through hole 2529 (via a slip-fit) and then into the through hole 2524 (via a second press-fit) of the bottom carrier face 2404. Also, the lever spring 2503 may be custom wound to encircle the respective lever dowel 2505 twice to facilitate the centering of the carrier lever 2501 within the carrier cavity 2510; also, the trigger spring 2504 may be custom wound to encircle the respective trigger dowel 2506 twice to facilitate the centering of the carrier trigger 2502 within said cavity 2510. Further, both the carrier lever 2501 and the carrier trigger 2502 may be designed in such a way so that the respective lever spring 2503 and trigger spring 2504 may be the same part, thus easing part procurement; and the carrier chassis 2400, carrier lever 2501, and carrier trigger 2502 may be designed in such a way that the corresponding dowel pins 2505 and 2506 may also be the same part (e.g. precision ground, 18-8 stainless steel, ⅛" diameter, and a ⁷⁄₁₆" length).

In alternative embodiments (not shown in figures), the storage drive's 900 internal printed circuit board and associated components are removed (similar to "drive shucking") from said drive's 900 protective shell and then mounted directly onto the respective carrier chassis 2400 via non-conductive spacers (which prevent short circuits with said chassis 2400).

Figures 26A, 26B, 26C:
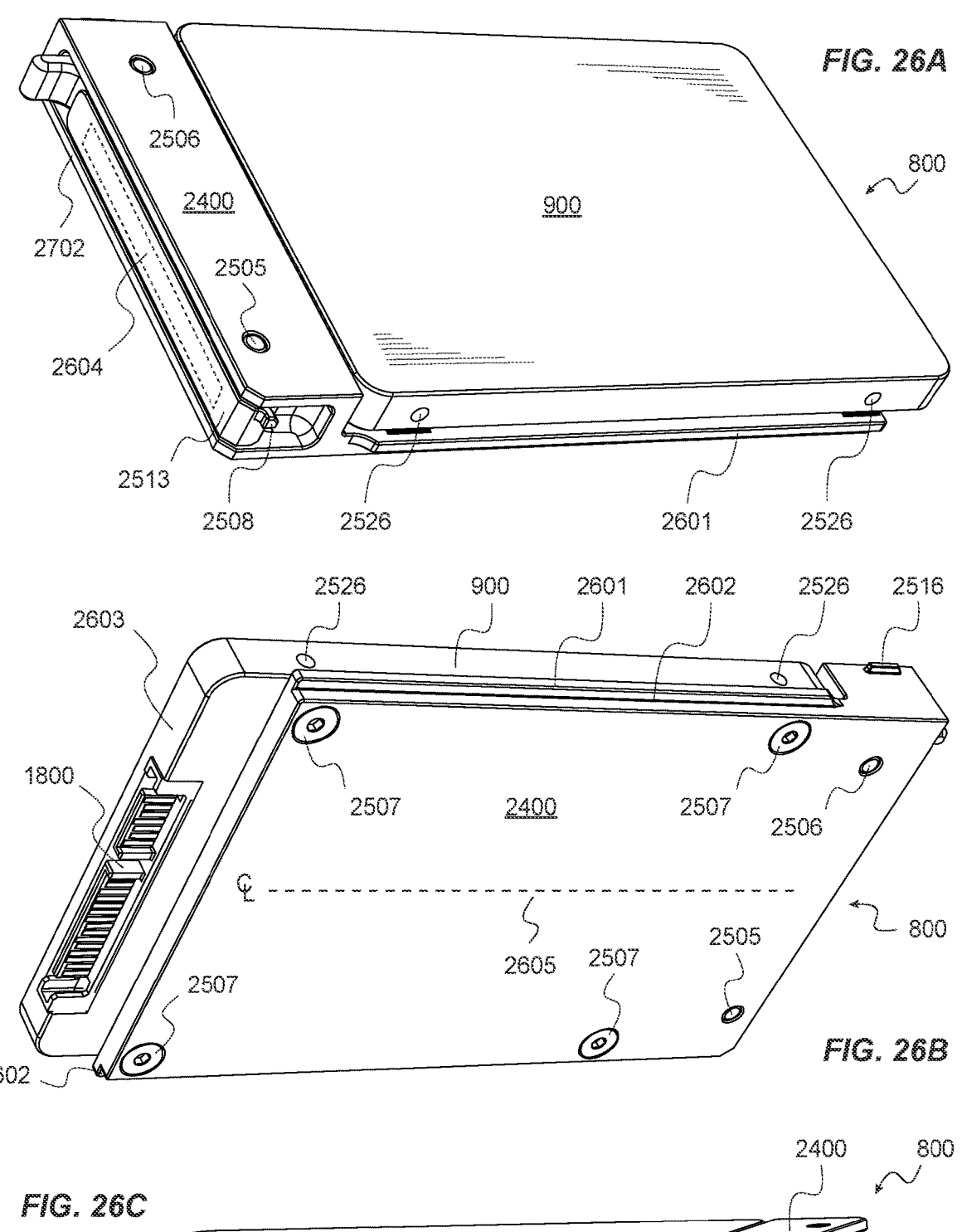
FIG. 26A illustrates a perspective-view of a drive carrier, which includes a storage drive and insertion rails, according to an embodiment.
FIG. 26B illustrates a perspective-view of a drive carrier, which includes a storage drive and carrier fasteners, according to an embodiment.
FIG. 26C illustrates a perspective-view of a drive carrier, which includes a storage drive and a carrier lever, according to an embodiment.

Illustrated in FIGS. 26A, 26B, and 26C is the drive carrier 800 with the insertion rails 2601 of the left 2401 and right 2402 carrier sides depicted. The insertion rails 2601 as well as the respective insertion channels 1901 may be designed in such a way that both the rail width 2414 (e.g. 0.065") and rail height 2415 (e.g. 0.075") are minimized, but only to such a degree that the durability of said rails 2601 may provide a practically unlimited number of drive carrier 800 extraction cycles. Further, the minimized rail width 2414 and rail height 2415 may then allow the corresponding dimensions of the insertion channel 1901 to be minimized, thereby allowing the corresponding vent void's 1903 cutout area to be maximized. So, maximizing the vent void 1903 cutout area may beneficially provide a reduction in top flow 104 resistance and hence an increased CFM of said flow 104, this increased CFM may then improve the top flow's 104 cooling capacity.

Illustrated in FIG. 26A is the drive carrier 800 with the extraction mechanism in a closed (i.e. locked) position. This extraction mechanism may be comprised of: the carrier chassis 2400, the carrier lever 2501, the carrier trigger 2502, carrier springs 2503 and 2504, and carrier dowels 2505 and 2506. The carrier lever 2501 may have the front carrier face 2405 "surface", named a lever surface 2513. The lever surface 2513 may be CNC engraved in a region as indicated by the dashed rectangle 2604. Further, this engraving may indicate the storage server's 100 manufacturer and/or a numbering scheme used to determine the proper placement of said server's 100 storage drives 900.

Illustrated in FIG. 26B is the drive carrier 800 with the indicated carrier centerline 2605 which equally bisects both the said carrier's 800 carrier width 2408 and the affixed storage drive's 900 device width 2412.

Illustrated in FIG. 26C is the drive carrier 800 with the extraction mechanism in an open or unlocked position. An extraction cycle is defined herein as the removal of the drive carrier 800 from the storage server 100 followed by a reinsertion of said carrier 800 back into said server 100, prior to this extraction cycle the corresponding access panel 107 and 201 could require removal.

Figure 27:
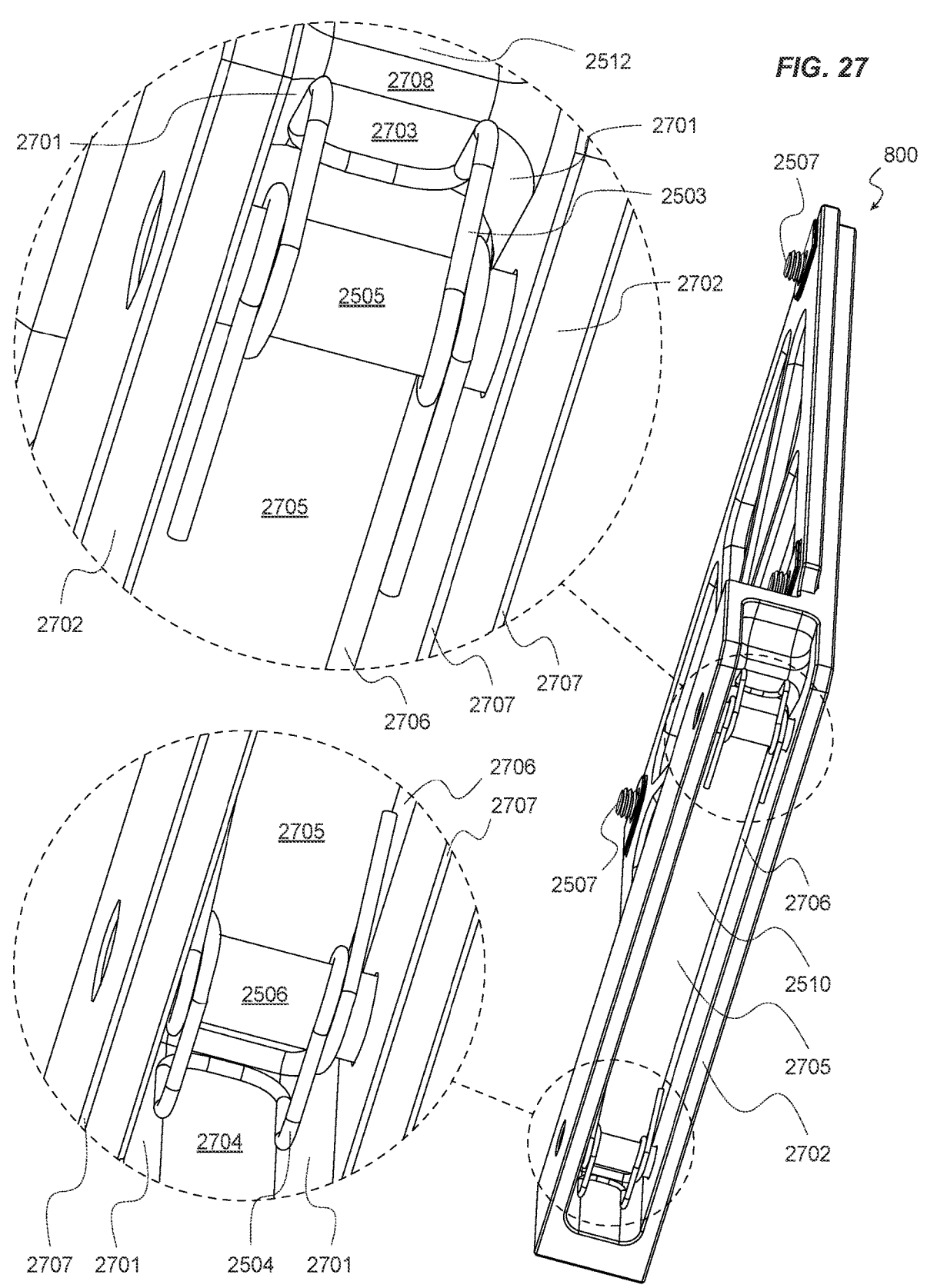
FIG. 27 illustrates a perspective-view of a drive carrier with a storage drive removed and detail-views of a drive carrier's extraction mechanism according to an embodiment.
Figures 28A, 28B, 28C, 28D, 28E:
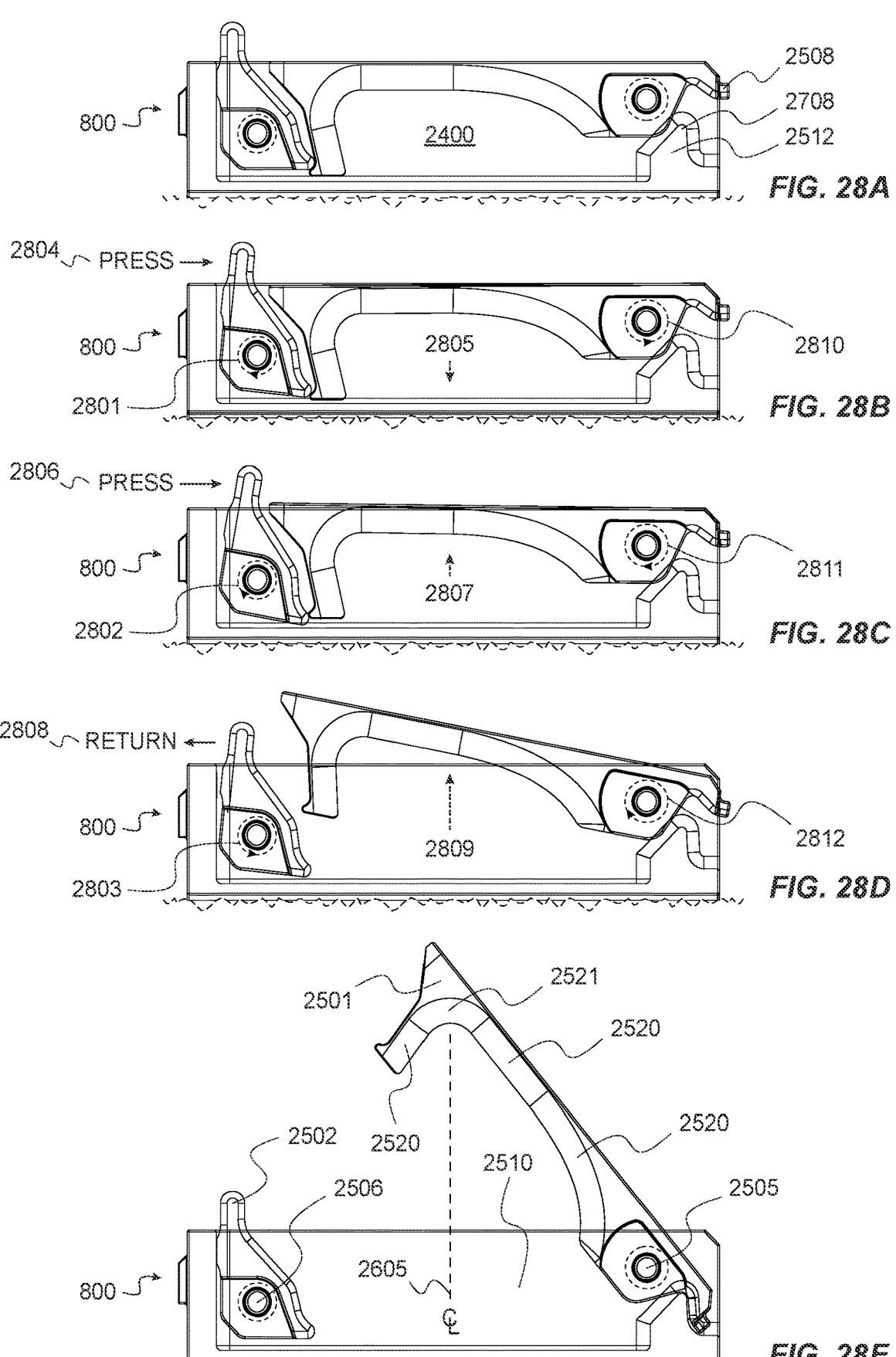
FIGS. 28A-28E illustrate partial-views, with hidden lines visible, of various stages of a drive carrier's extraction mechanism being opened according to an embodiment.

Illustrated in FIG. 27 is the drive carrier 800 with the storage drive 900, the carrier lever 2501, and the carrier trigger 2502 removed to provide carrier spring 2503 and 2504 visibility. The carrier cavity 2510 may be CNC milled a specified distance (e.g. 0.597") from said cavity's 2510 "surface", named a ceiling surface 2702, to said cavity's 2510 "surface", named a floor surface 2705, to provide a casing (or shell) for the drive carrier's 800 extraction mechanism. The floor surface 2705 may have a "floor fillet", named a carrier fillet 2706 (e.g. 0.025" radius), and the ceiling surface 2702 may have a ceiling chamfer 2707 (e.g. 0.01"). Protruding from the floor surface 2705 may be an "angled mount", named a lever mount 2512, which provides a support surface which is specifically angled so that the lever spring 2503 and the trigger spring 2504 may be the same part. The "apex" of the lever mount 2512, named a mount apex 2708, provides a physical stop (i.e. rest) for when the carrier lever 2501 is in the open position, as shown in FIG. 28E. Further, the lever mount 2512 provides added structural integrity to the carrier cavity 2510 itself and may beneficially improve repeatability of the dowel pin 2505 and 2506 press-fit assembly. Also, the lever mount 2512 may have carrier cavity 2510 "centering fillets", each named a spring fillet 2701. Further, the spring fillets 2701 may have a specific radius (e.g. 0.0675") that when matched to the carrier spring's 2503 and 2504 wire radius may result in a desirable self-centering effect between said springs 2503 and 2504 and the carrier cavity 2510. The lever mount 2512 may have an "angled surface", named a mount wall 2703, that when used together with spring fillets 2701 may provide a steady base for compression of the lever spring 2503. Similarly, the carrier cavity 2510 may provide the cavity wall 2704 that when used together with spring fillets 2701 provides a steady foundation for compression of the trigger spring 2504.

Illustrated (with hidden lines visible) in FIGS. 28A-28E are partial-views of the drive carrier 800, with both carrier springs 2503 and 2504 removed, depicting extraction mechanics. For the entire range of allowed lever spring 2503 travel, said spring 2503 is typically partially compressed to dampen mechanical vibrations and thereby noise. Increasing the compression of the lever spring 2503, via the carrier lever 2501, may apply a counter-clockwise force (as indicated by a directional dashed circle 2810) about the lever dowel 2505 (which may perform as a pivot point). Decreasing the compression of the lever spring 2503, via the carrier lever 2501, may apply a clockwise force (as indicated by directional dashed circles 2811 and 2812) about the lever dowel 2505 (which may perform as a pivot point). Further, for the entire range of allowed trigger spring 2504 travel, said spring 2504 is typically partially compressed to dampen mechanical vibrations and thus noise. Increasing the compression of the trigger spring 2504, via the carrier trigger 2502, may apply a clockwise force (as indicated by directional dashed circles 2801 and 2802) about the trigger dowel 2506 (which may perform as a pivot point). Decreasing the compression of the trigger spring 2504, via the carrier trigger 2502, may apply a counter-clockwise force (as shown by a directional dashed circle 2803) about the trigger dowel 2506 (which may perform as a pivot point).

Illustrated (with hidden lines visible) in FIG. 28A, is a partial-view of the drive carrier 800, with carrier springs 2503 and 2504 removed, depicting a "closed" extraction state. This "closed position" as well as an "opened position" may be the two principal positions (or states) of an extraction mechanism. Further, a closed position may be defined herein as the back rest 2515 being in contact with (i.e. parallel or substantially parallel to) the cavity wall 2704 which may in turn position the lever surface 2513 planar (i.e. on the same plane), or substantially planar, to the ceiling surface 2702. Also, when the drive carrier 800 is in a closed position and fully inserted into one of three types of carrier columns 804-806, said carrier 800 may be designated as "locked". This locked position is typically a result of the retent bar 2508 that has been pivoted into the corresponding retent cell 2000 thereby preventing drive carrier 800 removal. The retent bar 2508 may have a flexible surface coating applied (e.g. dipped silicone or urethane conformal coating) so that said bar 2508 acquires an improved engagement with the respective retent cell 2000. This improved engagement may not only assist in dampening vibrations between the retent bar 2508 and the retent cell 2000, but also may beneficially reduce any noise which would otherwise be induced by such vibration. This closed and locked position is typically the default extraction state of the drive carrier 800 and may also be a prerequisite to installing the corresponding left 201 and/or right 107 access panels.

Illustrated (with hidden lines visible) in FIG. 28E, is a partial-view of the drive carrier 800, with carrier springs 2503 and 2504 removed, depicting an "opened" extraction state. This opened position (or state) may be defined herein as the carrier lever 2501 being in contact with the lever mount 2512 (via the mount apex 2708) and the back rest 2515 being in contact with (i.e. parallel or substantially parallel to) the cavity wall 2704. Further, this opened position beneficially centers, via the indicated carrier centerline 2605, certain pull surfaces 2521 of the carrier lever 2501 to the drive carrier's 800 front carrier face 2405 which may facilitate said carrier's 800 extraction by an end-user. Also, when the drive carrier 800 assumes this opened position said carrier 800 may be designated as "unlocked". This unlocked position is typically a fully released (or extended) carrier lever 2501 which may in turn position the retent bar 2508 entirely within the confines of the carrier cavity 2510 and thus removed from the retent cell 2000. This opened and unlocked position is typically what enables an end-user to extract the drive carrier 800 from the corresponding carrier column 804-806. The manner in which the carrier lever 2501 is grasped by an end-user may be improved, to assist in such extraction, with CNC milled "finger fillets", each named a pull surface 2520 and 2521. For example, an end-user may remove the opened drive carrier 800 by grasping the centered, via the carrier centerline 2605, pull surfaces 2521 with an index finger while other fingers are grasping other pull surfaces 2520.

Illustrated (with hidden lines visible) in FIGS. 28B-28D are partial-views of the drive carrier 800, with the carrier springs 2503 and 2504 removed, which depict intermediate extraction states. These intermediate states are a result of the drive carrier's 800 extraction mechanism transitioning from a closed position (as shown in FIG. 28A) to an opened position (as shown in FIG. 28E). This transition may be initiated by the carrier trigger 2502 being pressed (as approximated by a directional dashed line 2804) towards the drive carrier's 800 right carrier side 2402. With this actuation of the carrier trigger 2502, a "convex surface", named a trigger grip 2522, and another "convex surface", named a trigger roller 2514, are both pivoted in the clockwise direction 2801. The carrier trigger 2502 pivot (about the trigger dowel 2506) in turn pivots (about the lever dowel 2505) the carrier lever 2501 in the counter-clockwise direction 2810 and thus moves said lever 2501 downwards (as approximated by a directional dashed line 2805) as shown in FIG. 28B. The carrier lever 2501 may have a "convex surface", named a lever roller 2518, and a "concave surface", named a lever hold 2517. Upon further pressing (as approximated by a directional dashed line 2806) of the carrier trigger 2502 there is a point reached where the carrier lever 2501 stops pivoting in the counter-clockwise direction 2810 and starts pivoting in the clockwise direction 2811 and thus moves said lever 2501 upwards (as approximated by the directional dashed line 2807) as a in FIG. 28C. Once the carrier lever 2501 has been released by the trigger roller 2514 and the carrier trigger 2502 is no longer being pressed, said trigger 2502 will return (as approximated by the directional dashed line 2808), via the trigger spring 2504 decompression, to an orientation where the back rest 2515 is in contact with (i.e. parallel or substantially parallel) to the cavity wall 2704. Further, concurrent with the trigger's 2502 return travel is the continued clockwise pivoting 2812 (as approximated by a directional dashed line 2809) of the carrier lever 2501 via the lever spring 2503 decompression, as shown in in FIG. 28D. The clockwise pivoting 2812 of the carrier lever 2501 ends when said lever 2501 makes contact with the lever mount 2512. With this contact with the lever mount 2512 the carrier lever 2501 is fully released (i.e. at full extension), thus placing the drive carrier 800 in an opened position (also unlocked). To transition from this opened position back to the closed position, the carrier lever 2501 may be pressed towards the drive carrier's 800 back carrier face 2406 (i.e. the counter-clockwise 2810 pivot of said lever 2501) until the trigger roller 2514 is enveloped by the lever hold 2517 and both springs 2503 and 2504 are in equilibrium.

Figures 29A, 29B, 29C, 29D, 29E:
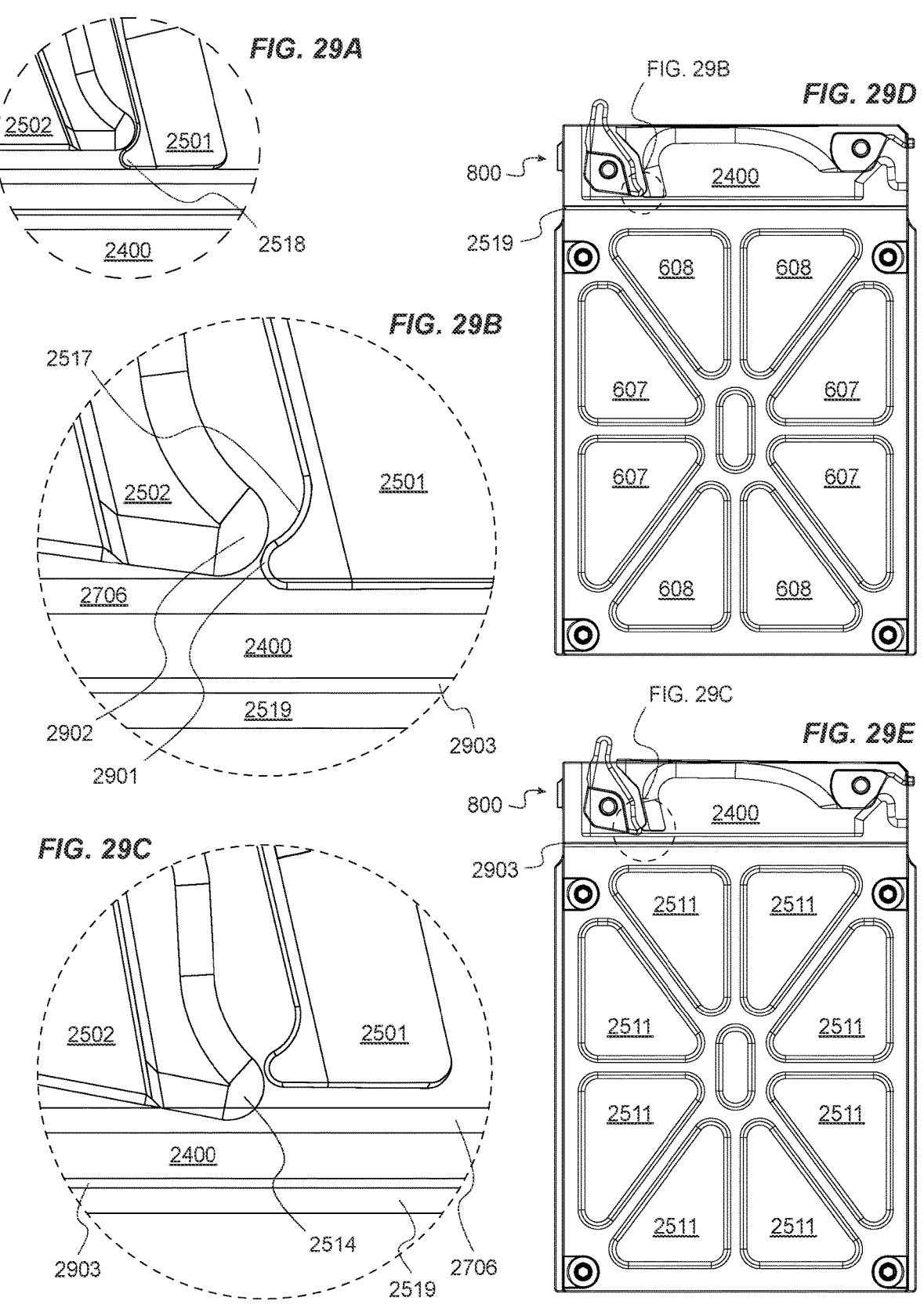
FIGS. 29A-29C illustrate detail-views of certain aspects of a drive carrier's extraction mechanism, including a carrier lever and a carrier trigger, according to an embodiment.
FIGS. 29D and 29E illustrate orthographic-views, with hidden lines visible, of certain aspects of a drive carrier, including a carrier chassis, according to an embodiment.

Illustrated via a detail-view (hidden lines visible) in FIG. 29A is the carrier chassis 2400, carrier lever 2501, and the carrier trigger 2502. This detail-view depicts the closed position of an extraction mechanism. This closed position is where the trigger roller 2514 may be enveloped and held stationary by the corresponding lever hold 2517. The closed position may be an equilibrium of the "spring forces", per Hooke's Law, originating from the lever 2503 and trigger 2504 springs.

Illustrated (with hidden lines visible) in FIGS. 29B-29E is the drive carrier 800, with the carrier springs 2503 and 2504 and storage drive 900 removed, depicting intermediate extraction states that may occur while transitioning from a closed state to an opened state. Specifically the travel of the trigger roller 2514 as said roller 2514 exits the lever hold 2517 (as approximated in FIG. 29B) and then slides around the lever roller 2518 (as approximated in FIG. 29C) until said rollers 2514 and 2518 disengage, thereby permitting the lever 2501 and trigger 2502 to pivot separately. In addition, the carrier chassis 2400 may be CNC milled in such a way that certain edges may be chamfered and certain corners may be filleted to facilitate end-user handling and ease of fabrication respectively. For example, "chamfers" which are named a lever chamfer 2901 (e.g. 0.005"), a trigger chamfer 2902 (e.g. 0.034"), and a carrier chamfer 2903 (e.g. 0.01"); and the carrier fillet 2706 (e.g. 0.025" radius) and a "fillet" named a holder fillet 2519 (e.g. 0.025" radius).

Figures 30C, 30D, 30E, 30F:
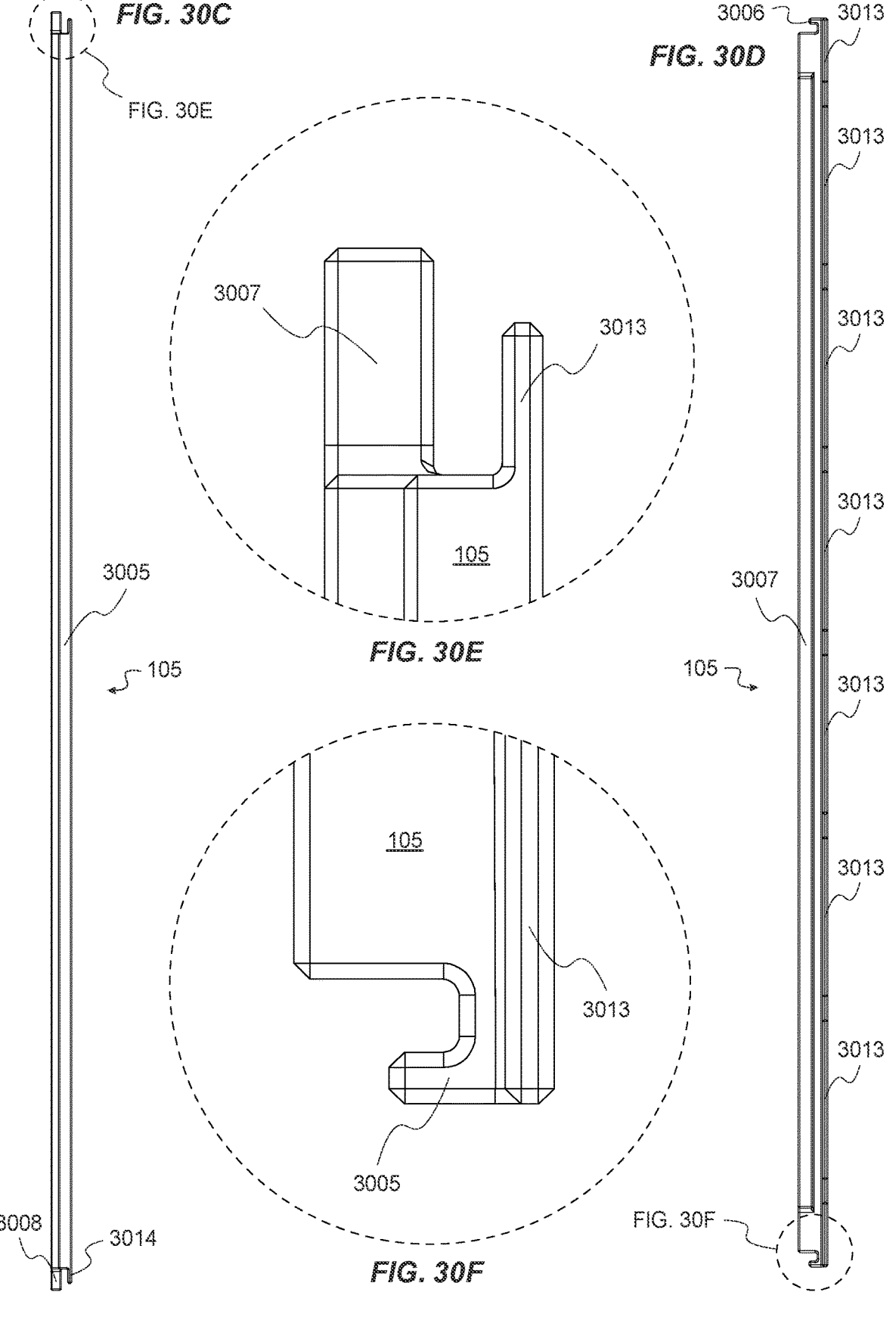
FIG. 30C illustrates a left orthographic-view of a top panel according to an embodiment.
FIG. 30D illustrates a front orthographic-view of a top panel according to an embodiment.
FIGS. 30E and 30F illustrate detail-views of certain aspects of a top panel according to an embodiment.
Figures 30G, 30H, 30I, 30J, 30K, 30L:
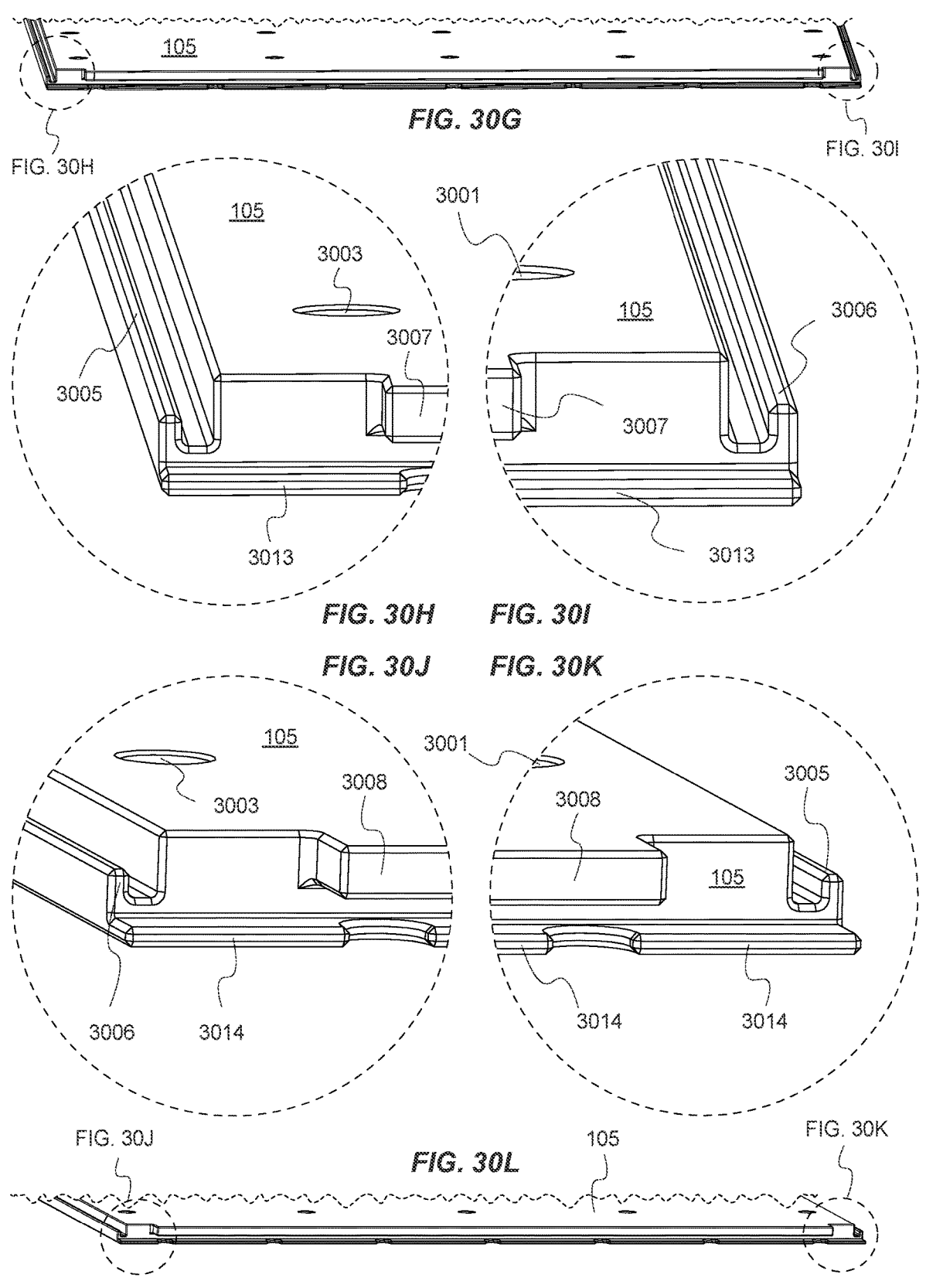
FIG. 30G illustrates a partial-view of a top panel according to an embodiment.
FIGS. 30H-30K illustrate detail-views of a top panel according to an embodiment.
FIG. 30L illustrates a partial-view of a top panel according to an embodiment.

Illustrated in FIGS. 30A-30L (FIGS. 30G and 30L are partial-views) is the storage server's 100 top panel 105. The top panel 105 may integrate various attachment mechanisms, including one or more (e.g. twenty-five) counter-bored clearance holes 3001-3004 and one or more (e.g. four) threaded blind holes 3009-3012. Further, the top panel 105 may integrate various EMI containment mechanisms which may include: one or more (e.g. two) EMI gutters 3005 and 3006 that may be used to interlock with the corresponding EMI overhangs 610 of the left 201 and right 107 access panels; one or more (e.g. sixteen) "EMI containment protrusions", each named an EMI blade 3013 and 3014, which may be non-continuous (or continuous); and one or more (e.g. two) "EMI containment protrusions" which are typically continuous, each named an EMI soffit 3007 and 3008. The EMI blades 3013 and 3014 may be enclosed by one or more (e.g. sixteen) corresponding EMI "containment cavities" which may also be non-continuous (or continuous), each named an EMI sheath 3105 and 3205. To wit, the top panel's 105 front facing 300 EMI blades 3013 may be enclosed by the front upper panel's 106 EMI sheaths 3105, and the top panel's 105 back facing 301 EMI blades 3014 may be enclosed by the back upper panel's 200 EMI sheaths 3205. The EMI soffits 3007 and 3008 may cover (i.e. extend over) the front 106 and back 200 upper panels respectively, thus improving the EMI containment/mitigation efficacy of the EMI blades 3013 and 3014 and EMI sheaths 3105 and 3205. EMI mitigation via non-continuous EMI blades 3013 and 3014 may provide improved structural rigidity of the respective EMI sheaths 3105 and 3205 (as fastener access may not be applicable between the top panel 105 and the front 106 and back 200 upper panels). Additional increases in the quantity of the EMI blades 3013 and 3014 and EMI sheaths 3105 and 3205 may result in a reduction of EMI mitigation efficacy.

As illustrated in FIG. 30B, the storage server's 100 top panel 105 has a plurality of panel pockets 511. The top panel's 105 mass may be minimized and said panel's 105 structural rigidity may be maximized by implementing particular patterns of such panel pockets 511. These particular patterns may be vertically and/or horizontally mirrored and comprised of replicated panel pockets 511, replicated subpatterns of said pockets 511, or replicated groupings of subpatterns of said pockets 511. In an embodiment, these subpatterns may be comprised of various orientations of two right pockets 607 and 608. For example, pockets 607 and 608 may be positioned such that the hypotenuse of the first right triangle 607 is both parallel to and alongside the hypotenuse of the second right triangle 608. This creates a rectangular shaped sub-pattern which may then be mirrored and/or replicated (or replicated and then mirrored). Sizing of the pockets 607 and 608 may vary to conform to various features of the top panel 105, e.g. holes 3001-3004.

Figures 31A, 31B:
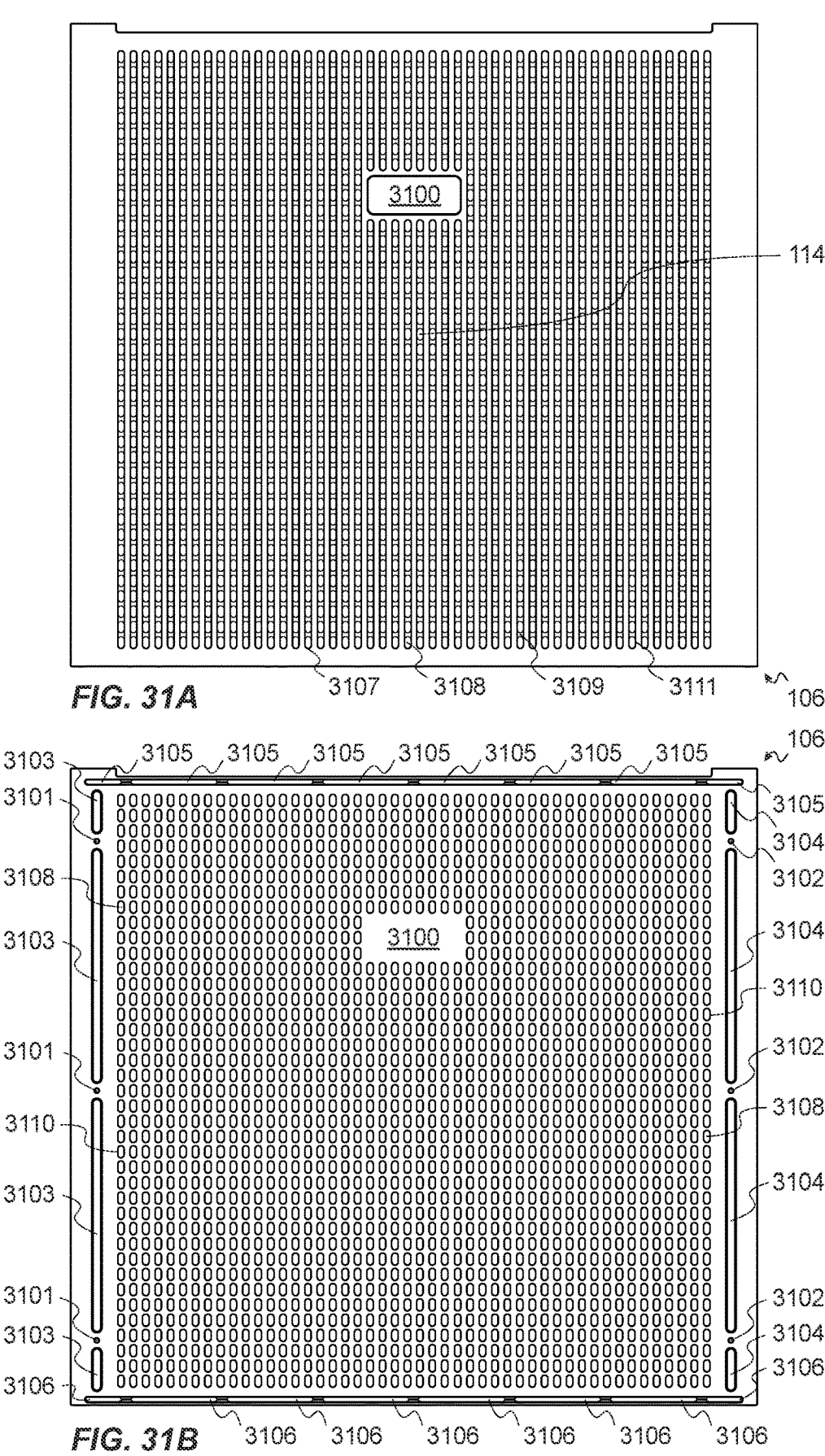
FIG. 31A illustrates a front orthographic-view of a front upper panel according to an embodiment.
FIG. 31B illustrates a back orthographic-view of a front upper panel according to an embodiment.

Illustrated in FIGS. 31A and 31B is the storage server's 100 front upper panel 106. The front upper panel 106 may integrate various attachment mechanisms, which may include one or more (e.g. six) threaded blind holes 3101 and 3102. The blind holes 3101 and 3102 and the corresponding shoulder screws 3112 may be used to removably attach the front upper panel 106 to the storage server 100. Attaching the front upper panel 106 via shoulder screws 3112 may improve placement accuracy and precision with the corresponding panel aligners 700 and 701. An end-user may remove one or both access panels 107 and 201 prior to accessing such screws 3112. The front upper panel 106 may integrate various EMI containment mechanisms which may include: two or more (e.g. sixteen) EMI sheaths 3105 and 3106 that may enclose two or more (e.g. sixteen) EMI blades 3013 and 518 respectively, and two or more (e.g. eight) EMI channels 3103 and 3104 that may enclose two or more (e.g. eight) EMI rails 728 and 729 respectively. To wit, the front upper panel's 106 EMI sheaths 3106 may enclose the middle panel's 110 front facing 300 EMI blades 518. The front upper panel 106 may be removed by unscrewing the shoulder screws 3112 attached to the blind holes 3101 and 3102 and then pulling said panel 106 in a direction that is perpendicular (or primarily perpendicular) to the front face 300 and directionally away from the storage server 100.

Figures 31C, 31D:
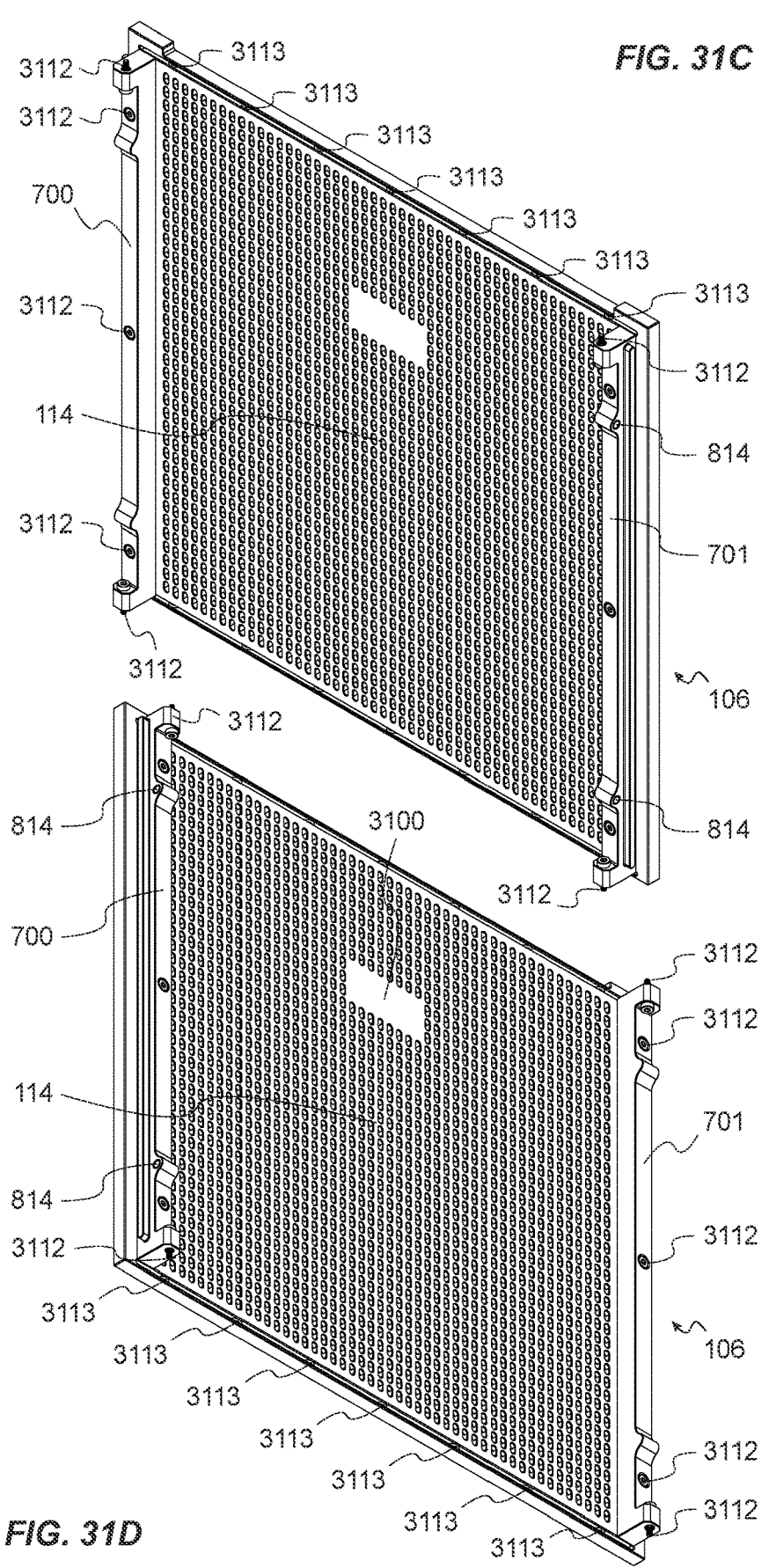
FIGS. 31C and 31D illustrate perspective-views of a left panel aligner and a right panel aligner which are attached to a front upper panel according to an embodiment.

Illustrated in FIGS. 31C and 31D is the storage server's 100 front upper panel 106 with each of the left 700 and right 701 panel aligners removably attached with three shoulder screws 3112. Also shown (for reference) are the four shoulder screws 3112 which may be used to structurally attach to the top 105 and middle 110 panels. Further shown, are one or more (e.g. fourteen) "breaks", each named a blade break 3113, that separate the front panel's 106 EMI sheaths 3105 and 3106. The blade breaks 3113 may be used to structurally strengthen the front upper panel 106, as such strengthening (i.e. rigidness) may be beneficial in regards to the protection of said panel 106 during end-user removal, reattachment, and general handling. Typically, an increase in the number of the blade breaks 3113 may increase the structural integrity of the EMI sheaths 3105 and 3106 and a decrease in the number of said breaks 3113 may improve the EMI containment capability of said sheaths 3105 and 3106. Determination of the optimized number of such blade breaks 3113 may be a compromise between both these structural and EMI containment features.

Figures 31E, 31F, 31G, 31H, 31I, 31J:
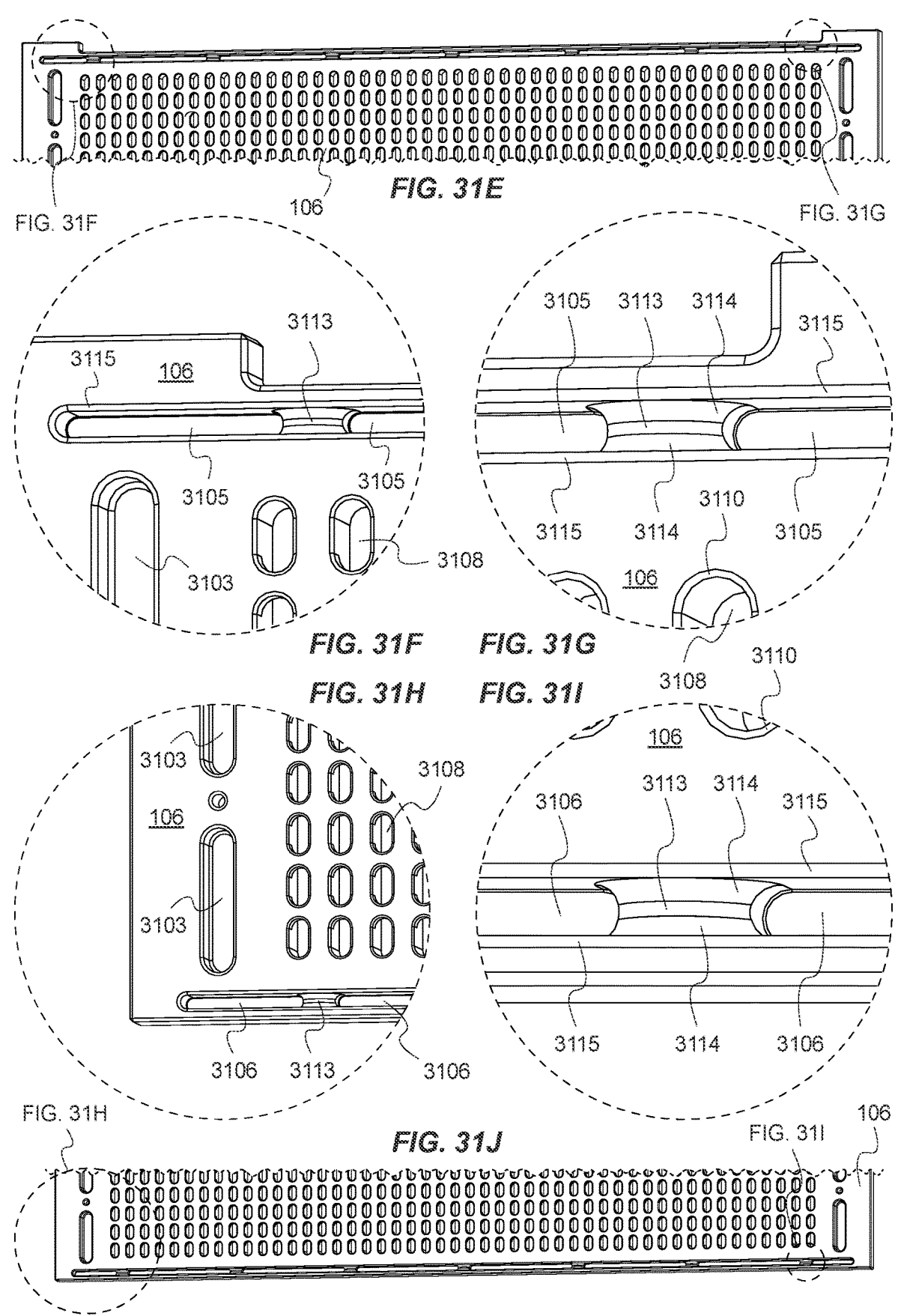
FIG. 31E illustrates a partial-view of a front upper panel according to an embodiment.
FIGS. 31F-31I illustrate detail-views of a front upper panel according to an embodiment.
FIG. 31J illustrates a partial-view of a front upper panel according to an embodiment.

Illustrated in FIGS. 31E and 31J are partial-views of the front upper panel 106. These partial-views depict EMI channels 3103 and 3104, EMI sheaths 3105 and 3106, and blade breaks 3113. The blade breaks 3113 may be CNC machined and may include fillets 3114 (see FIGS. 31F-31I): to ease said machining, to structurally strengthen the EMI sheaths 3105 and 3106, and to improve EMI containment between said sheaths 3105 and 3106 and the corresponding EMI blades 3013 and 518 respectively. This improved EMI mitigation may be achieved by minimizing the distance (i.e. air gap) between said sheaths 3105 and 3106 and said blades 3013 and 518. EMI sheaths 3105 and 3106 may include a perimeter chamfer 3115 to ease panel 106 attachment.

Figures 32A, 32B:
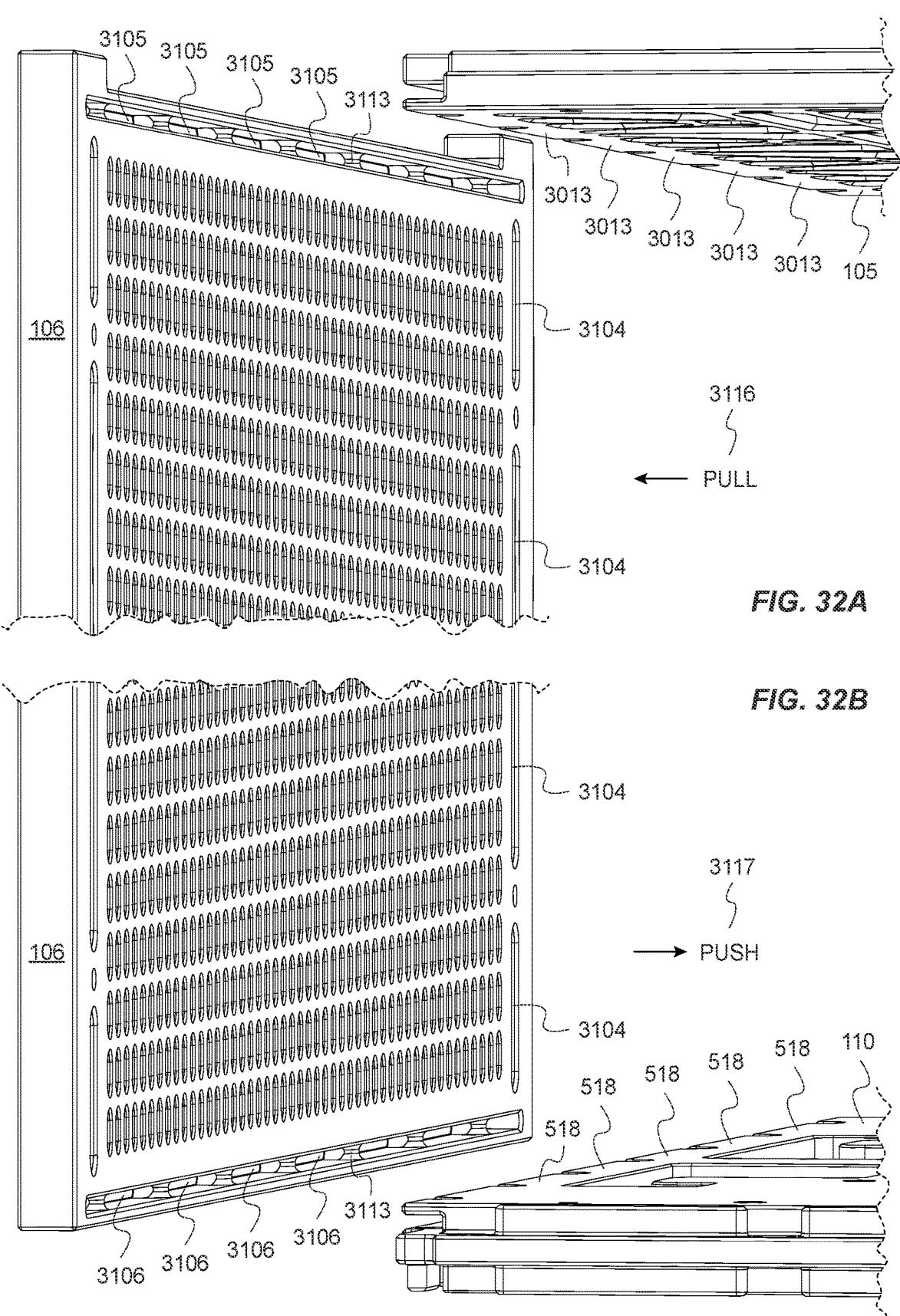
FIG. 32A illustrates a partial-view of a front upper panel being removed from a top panel according to an embodiment.
FIG. 32B illustrates a partial-view of a front upper panel being attached to a middle panel according to an embodiment.

Illustrated in FIG. 32A is a partial-view of the front upper panel 106 and the top panel 105, and illustrated in FIG. 32B is a partial-view of the front upper panel 106 and the middle panel 110. The FIG. 32A partial-view depicts the removal (i.e. pull 3116) of the front upper panel 106 from the top panel 105, and the FIG. 32B partial-view depicts the attachment (i.e. push 3117) of the front upper panel 106 to the middle panel 110. In FIG. 32A the EMI blades 3013 of the top panel 105 are being extracted (i.e. pull 3116) from the EMI sheaths 3105 of the front upper panel 106, and in FIG. 32B the EMI blades 518 of the middle panel 110 are being inserted (i.e. push 3117) into the EMI sheaths 3106 of the front upper panel 106.

In addition to attachment and EMI containment mechanisms, the front upper panel 106, via the top intake 114, may ingest a majority of the intake air for the top section's 208 top flow 104. The top intake 114 may be comprised of CNC milled "slotted thru holes", each named an intake hole 3108. The intake holes 3108 may be CNC milled within a vertically oriented "slotted groove", named an intake groove 3107. Each intake groove 3107 may be CNC milled (i.e. slotted) to a specific depth (e.g. 0.175"), said depth is typically less than the front upper panel's 106 thickness (e.g. 0.25"). Further, within each intake groove 3107 and between the vertically adjacent intake holes 3108 are "solid spans", each named an intake span 3109. To ease handling, both the intake grooves 3107 and the intake holes 3108 may be chamfered 3111 and 3110 (e.g. 0.01") respectively. The top intake 114 comprised of intake holes 3108, intake spans 3109, and intake grooves 3107 may collectively function as an integrated (i.e. built-in) and removable particulate filter for the top flow 104 of the top section 208. For marketing and/or identification purposes (e.g. product name, company logo, and/or serial number) certain intake holes 3108 and intake grooves 3107 may be displaced with a rectangular region 3100 to base such purposes.

Figures 33A, 33B:
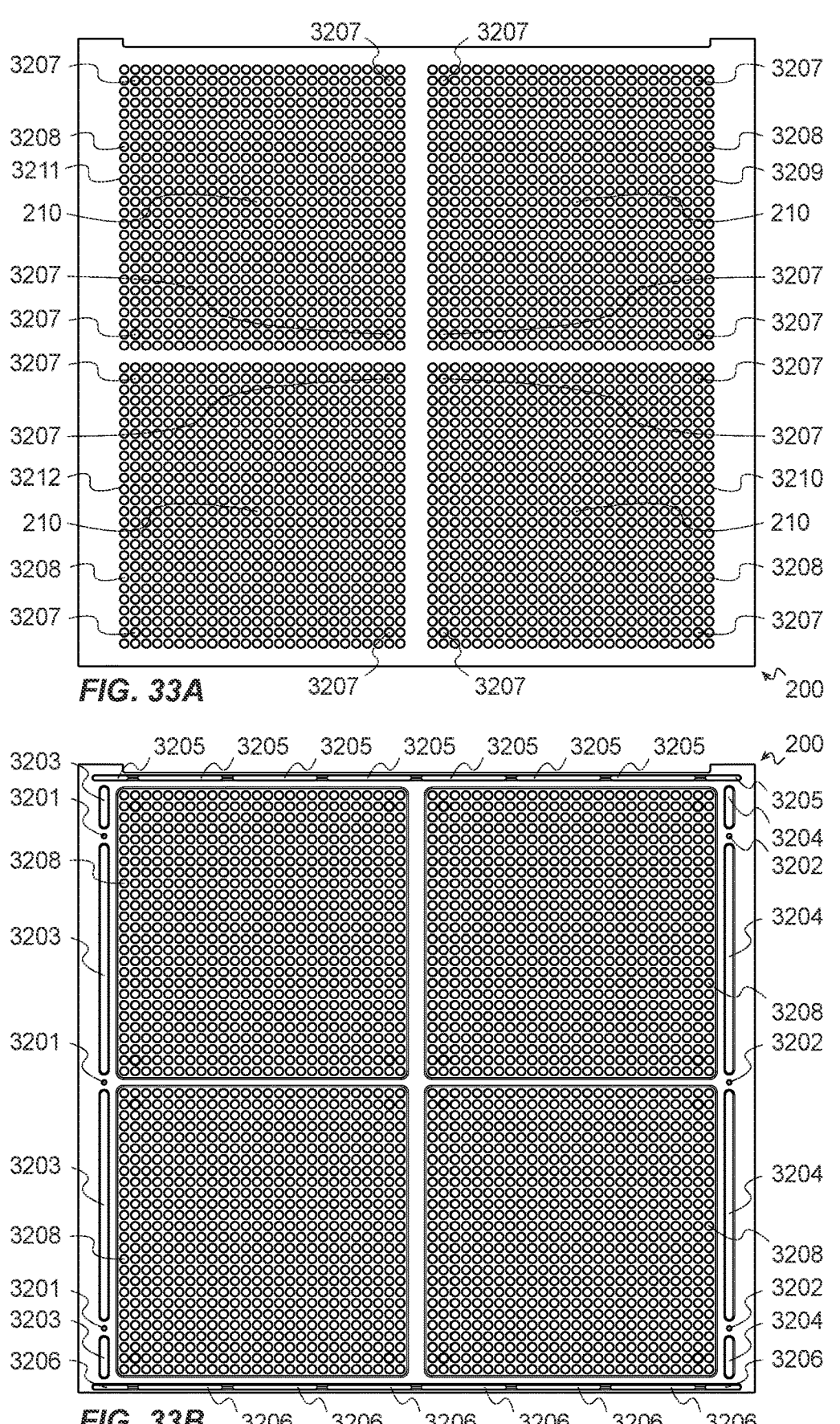
FIG. 33A illustrates a back orthographic-view of a back upper panel according to an embodiment.
FIG. 33B illustrates a front orthographic-view of a back upper panel according to an embodiment.

Illustrated in FIGS. 33A and 33B is the storage server's 100 back upper panel 200. The back upper panel 200 may integrate various attachment mechanisms, which may include one or more (e.g. six) threaded blind holes 3201 and 3202 and one or more (e.g. sixteen) threaded through holes 3207. The blind holes 3201 and 3202 and the corresponding shoulder screws 3213 may be used to removably attach the back upper panel 200 to such storage server 100. Further, these threaded through holes 3207, via pan head screws 3216, may be used to attach one or more (e.g. four) top axial fans 808-811 to the back upper panel 200. Attaching the back upper panel 200 via shoulder screws 3213 may improve placement accuracy and precision with the corresponding panel aligners 700 and 701. An end-user may remove one or both access panels 107 and 201 prior to accessing such screws 3213. The back upper panel 200 may integrate various EMI containment mechanisms which may include: two or more (e.g. sixteen) EMI sheaths 3205 and 3206 which may enclose two or more (e.g. sixteen) EMI blades 3014 and 507 respectively, and two or more (e.g. eight) EMI channels 3203 and 3204 which may enclose two or more (e.g. eight) EMI rails 728 and 729 respectively. To wit, the back upper panel's 200 EMI sheaths 3206 may enclose the middle panel's 110 back facing 301 EMI blades 507. The back upper panel 200 may be removed by unscrewing the shoulder screws 3213 attached to the blind holes 3201 and 3202 and then pulling said panel 200 in a direction perpendicular to the back face 301 and directionally away from the storage server 100.

Figures 33C, 33D:
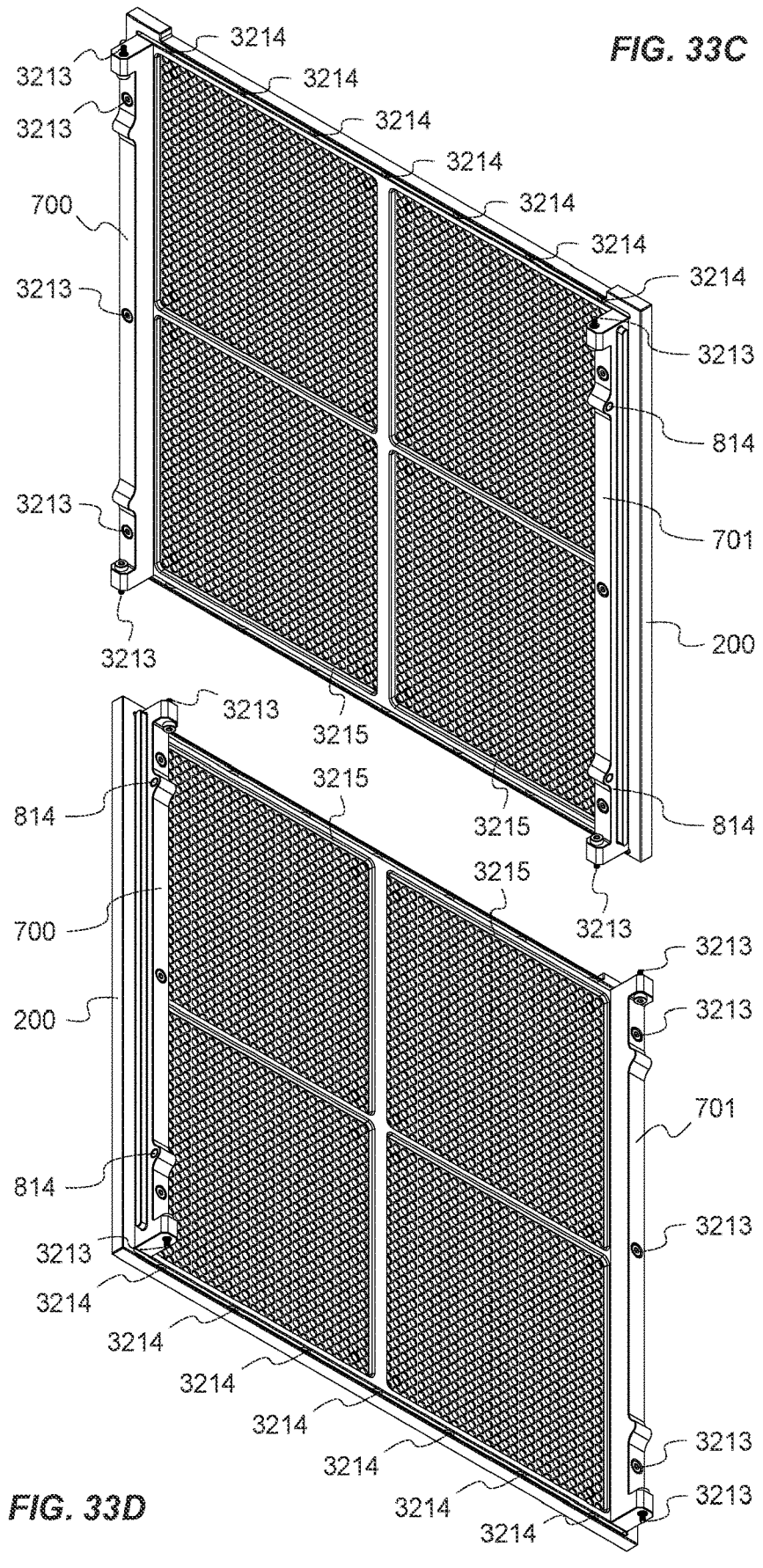
FIGS. 33C and 33D illustrate perspective-views of a left panel aligner and a right panel aligner which are attached to a back upper panel according to an embodiment.

Illustrated in FIGS. 33C and 33D is the storage server's 100 back upper panel 200 with each of the left 700 and right 701 panel aligners removably attached with three shoulder screws 3213. Also shown (for reference) are the four shoulder screws 3213 which may be used to structurally attach to the top 105 and middle 110 panels. Further shown, are one or more (e.g. fourteen) blade breaks 3214 that may separate the back upper panel's 200 EMI sheaths 3205 and 3206. The blade breaks 3214 may be used to structurally strengthen the back upper panel 200, as such strengthening (i.e. rigidness) may be beneficial in regards to the protection of said panel 200 during end-user removal, reattachment, and overall handling. Typically, an increase in the number of the blade breaks 3214 may increase the structural integrity of the EMI sheaths 3205 and 3206 and a decrease in the number of said breaks 3214 may improve the EMI containment capability of said sheaths 3205 and 3206. The determination of the optimized number of such blade breaks 3214 may be a compromise between both these structural and EMI containment features.

Figures 33E, 33F, 33G:
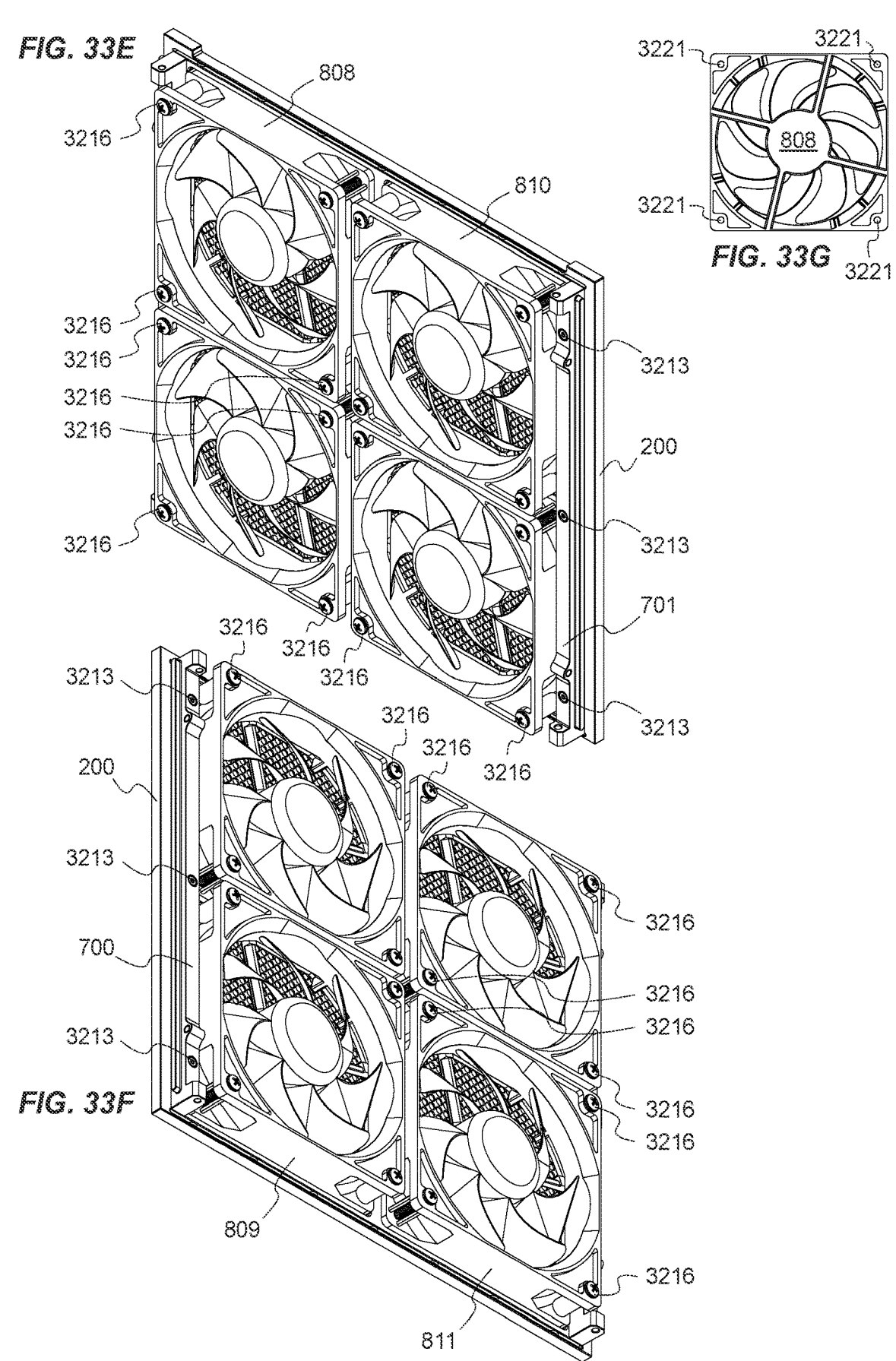
FIGS. 33E and 33F illustrate perspective-views of a left panel aligner, a right panel aligner, and top axial fans which are attached to a back upper panel according to an embodiment.
FIG. 33G illustrates a top axial fan with install holes according to an embodiment.

Illustrated in FIGS. 33E and 33F is the storage server's 100 back upper panel 200 with the left 700 and right 701 panel aligners removably attached (each using three shoulder screws 3213) and four top axial fans 808-811 removably attached (each using four pan head screws 3216). Illustrated in FIG. 33G is one of the four top axial fans 808 which depicts said top axial fan's 808 one or more (e.g. four) "installation holes" where each is named an install hole 3221. Further, the "installation holes" similarly located on the remaining three top axial fans 809-811 are also each named an install hole 3221.

Figures 33H, 33I, 33J, 33K, 33L, 33M:
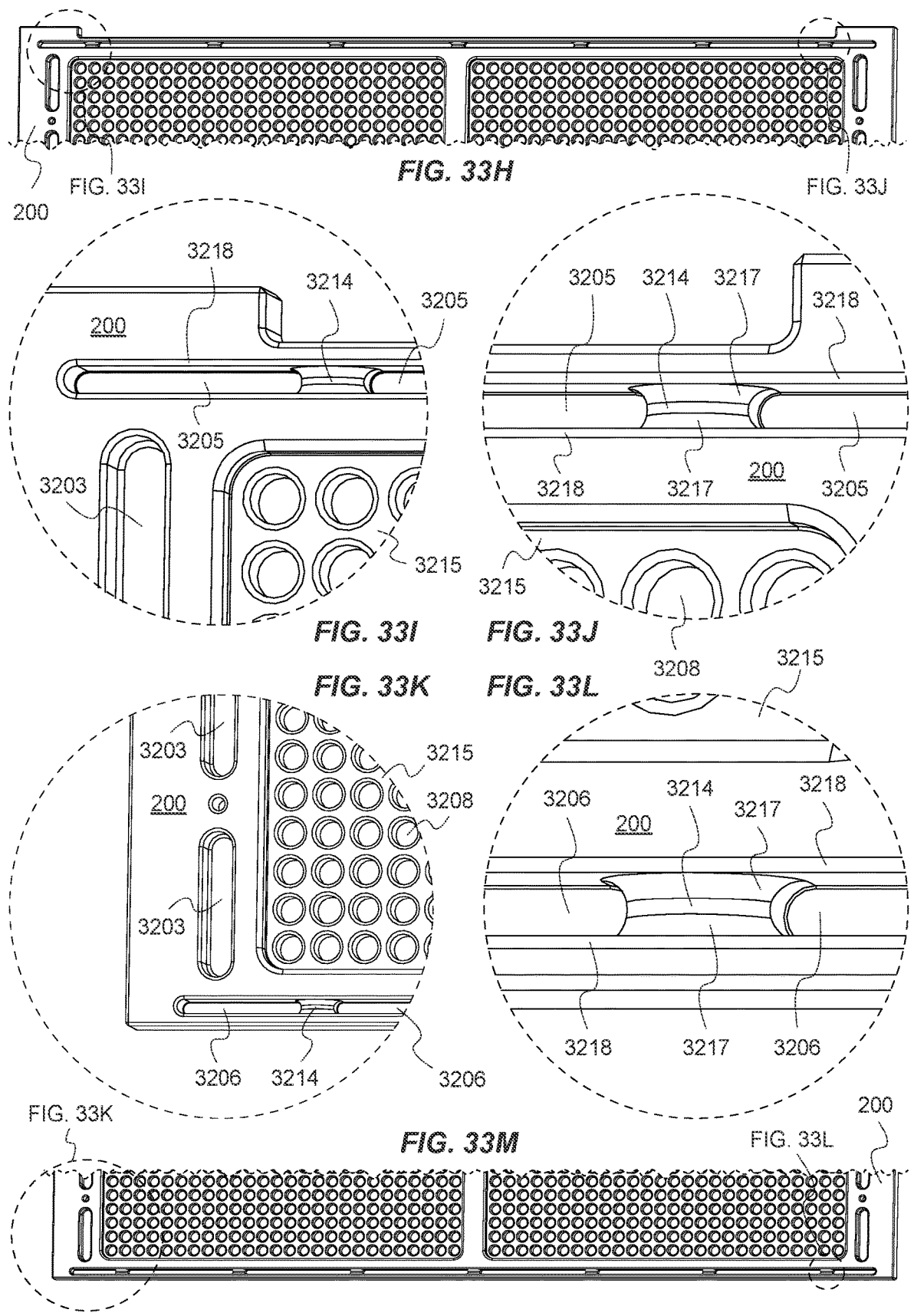
FIG. 33H illustrates a partial-view of a back upper panel according to an embodiment.
FIGS. 33I-33L illustrate detail-views of a back upper panel according to an embodiment.
FIG. 33M illustrates a partial-view of a back upper panel according to an embodiment.

Illustrated in FIGS. 33H and 33M are partial-views of the back upper panel 200. These partial-views depict EMI channels 3203 and 3204, EMI sheaths 3205 and 3206, and blade breaks 3214. The blade breaks 3214 may be CNC machined and may include fillets 3217 (see FIGS. 33I-33L): to ease said machining, to structurally strengthen EMI sheaths 3205 and 3206, and to improve the EMI containment between said sheaths 3205 and 3206 and the corresponding EMI blades 3014 and 507 respectively. This improved EMI mitigation may be achieved by minimizing the distance (i.e. air gap) between such sheaths 3205 and 3206 and such blades 3014 and 507. EMI sheaths 3205 and 3206 may include a perimeter chamfer 3218 to ease panel 200 attachment.

Figure 34A:
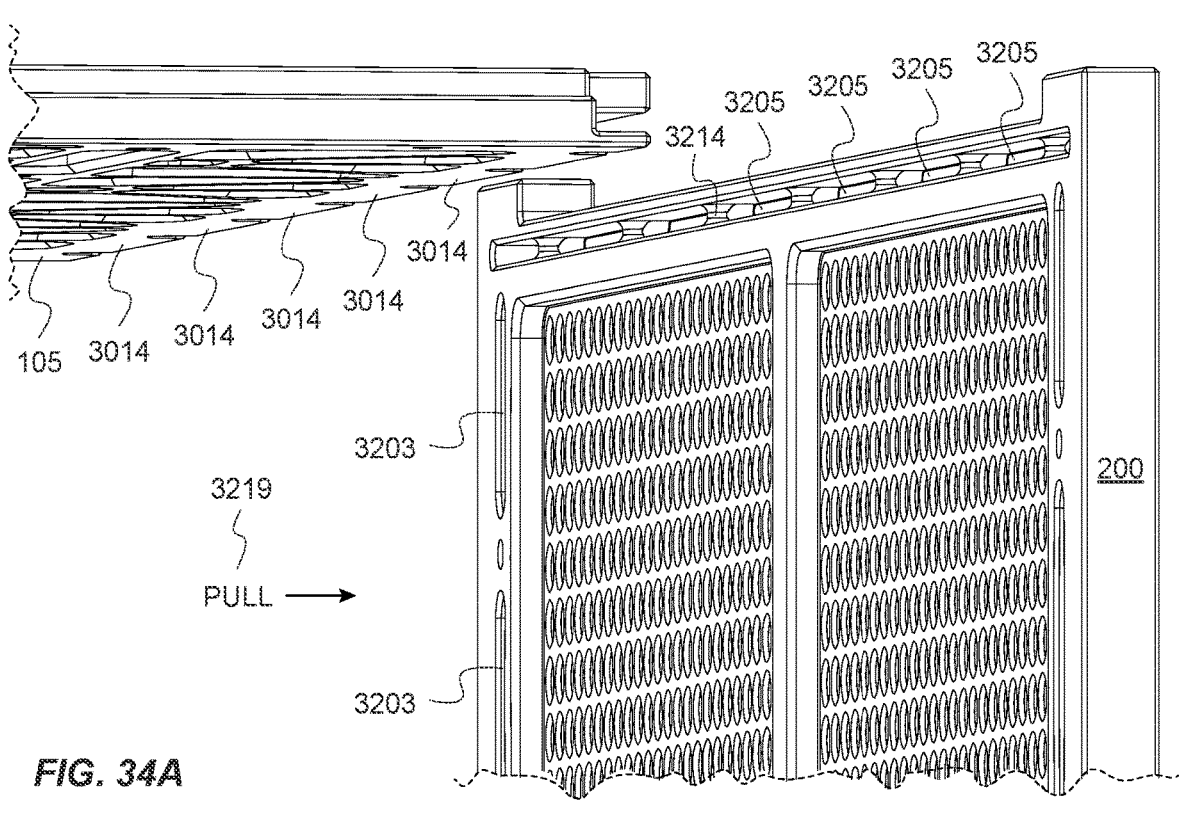
FIG. 34A illustrates a partial-view of a back upper panel being removed from a top panel according to an embodiment.
Figure 34B:
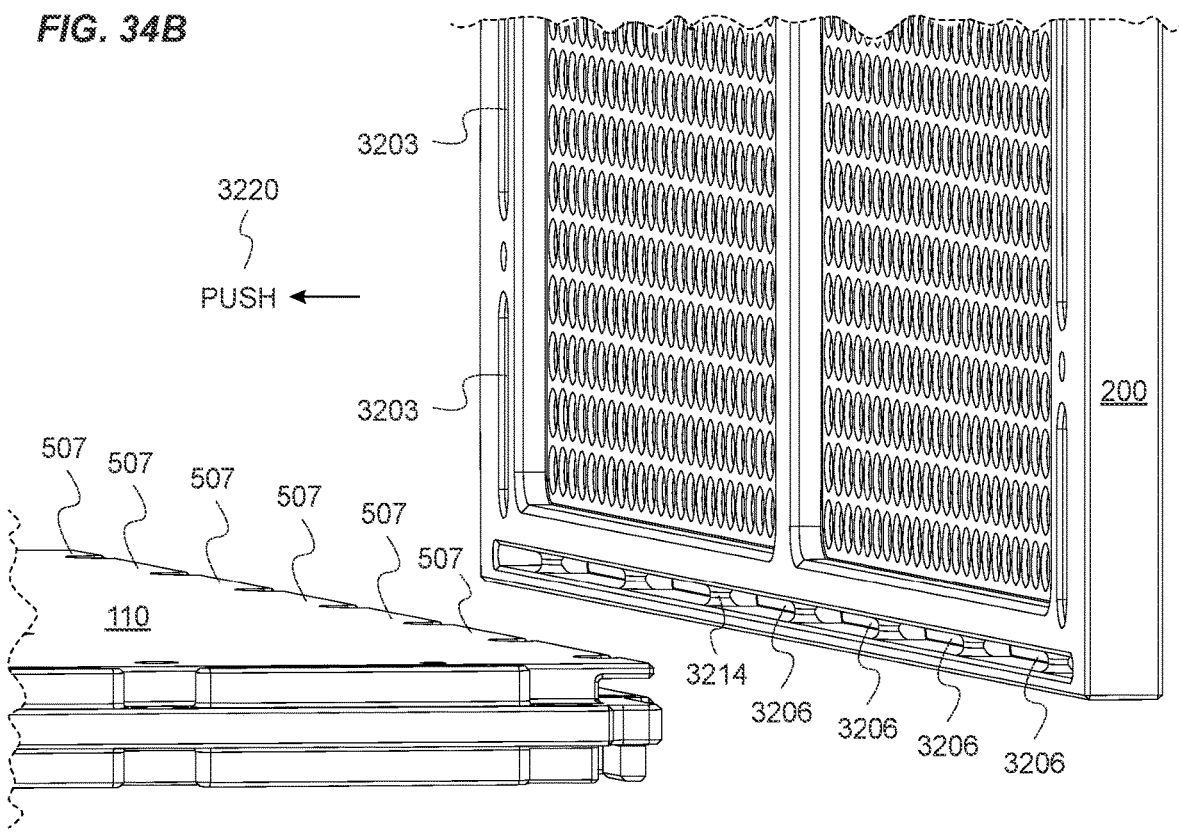
FIG. 34B illustrates a partial-view of a back upper panel being attached to a middle panel according to an embodiment.

Illustrated in FIG. 34A is a partial-view of the back upper panel 200 and the top panel 105, and illustrated in FIG. 34B is a partial-view of the back upper panel 200 and the middle panel 110. The FIG. 34A partial-view depicts the removal (i.e. pull 3219) of the back upper panel 200 from the top panel 105, and the FIG. 34B partial-view depicts the attachment (i.e. push 3220) of the back upper panel 200 to the middle panel 110. In FIG. 34A the EMI blades 3014 of the top panel 105 are being removed (i.e. pull 3219) from the EMI sheaths 3205 of the back upper panel 200, and in FIG.

34B the EMI blades 507 of the middle panel 110 are being attached (i.e. push 3220) to the EMI sheaths 3206 of the back upper panel 200.

In addition to attachment and EMI containment mechanisms, the back upper panel 200, via an air exhaust 210, may expel a majority of the exhaust air from the top section's 208 top flow 104. The air exhaust 210 may incorporate CNC drilled "through holes", each named an exhaust hole 3208. The exhaust holes 3208 may be located within four "rectangular regions", each named a fan quadrant 3209-3212. Each fan quadrant 3209-3212 may correspond to an installed top axial fan 808-811 respectively. On both the exterior (see FIG. 33A) and interior (see FIG. 33B) sides of the back upper panel 200, the exhaust holes 3208 may be CNC chamfered to ease end-user handling and top axial fan 808-811 mounting. On the interior side, of the back upper panel 200, the fan quadrants 3209-3212 may be located within the confines of corresponding CNC milled pockets 3215, which may be of various depths (e.g. 0.1"). The fan quadrants 3209-3212 may use such pockets to spatially embed top axial fans 808-811 during attachment. The embedded top axial fans 808-811 may beneficially maximize the operable volumetric space within the storage server's 100 top section 208. Each fan quadrant 3209-3212 may have one or more (e.g. four) threaded (e.g. 6-32) through holes 3207 which correspond and center to the install holes 3221 of the top axial fan 808-811. The diameters of both the threaded through holes 3207 and exhaust holes 3208 may be equal or similar, which may result in fan quadrants 3209-3212 having an aesthetically uniform hole pattern.

The storage server's 100 top section 208 (see FIG. 4A) may be comprised of the following components: the top panel 105, the front upper panel 106, the back upper panel 200, the left access panel 201, the right access panel 107, sixteen panel magnets 614 and 814, the backing plate 901, ten vertical locators 801-803, twenty shoulder screws 3112 and 3213, four panel aligners 700 and 701, left 812 and right 813 backplanes, one hundred forty-four drive carriers 800 (each with the attached storage drive 900), four top axial fans 808-811, sixteen pan head screws 3216, fifty shoulder screws 9001 and 9100, and the middle panel 110 (typically shared with the bottom section 209). The top section 208 may be structurally self-supporting (with or without the front 106 and back 200 upper panels and left 201 and right 107 access panels) which may simplify storage server 100 assembly.

Figure 35A:
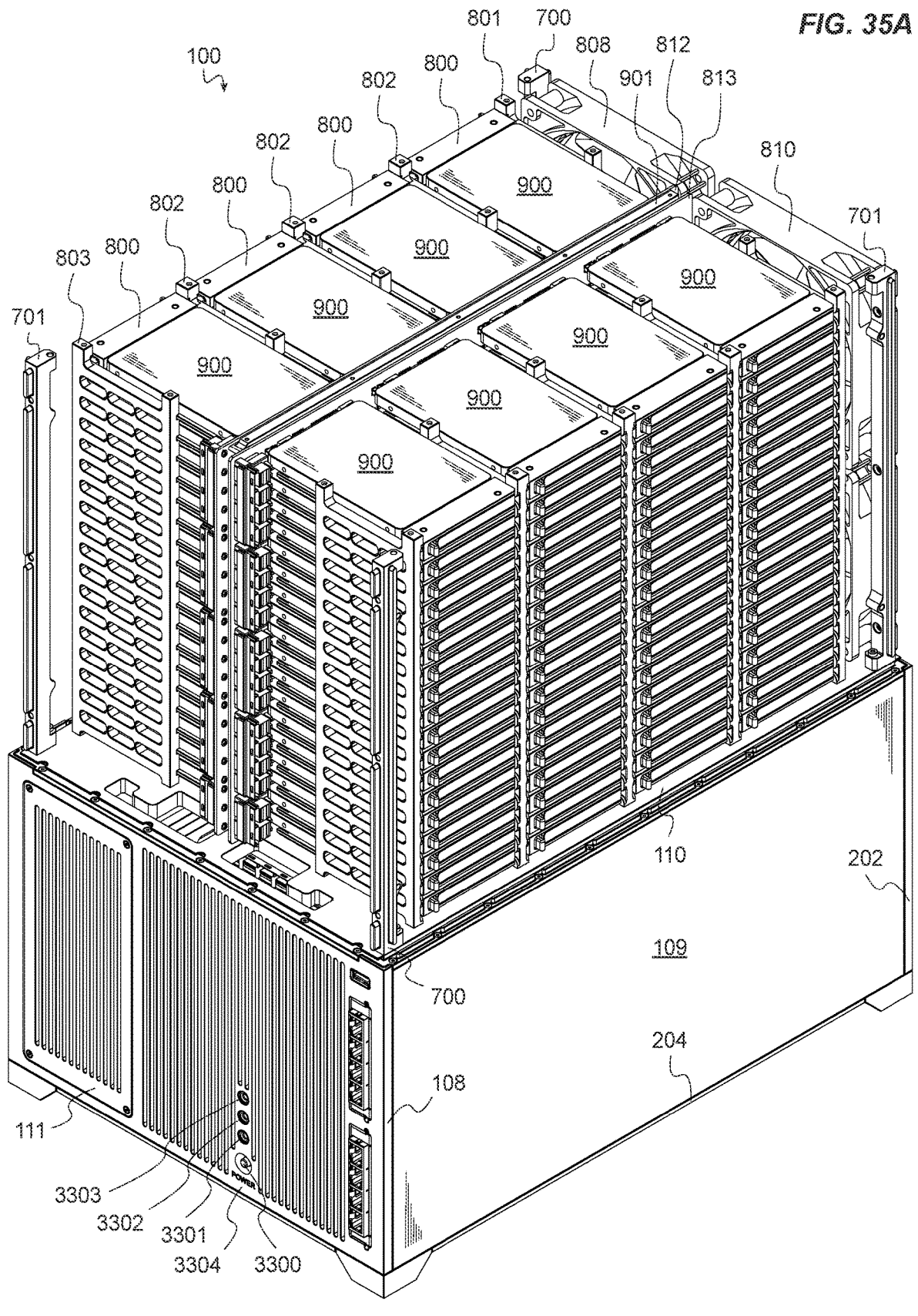
FIG. 35A illustrates a top, front, right perspective-view of a storage server according to an embodiment.

Illustrated in FIG. 35A is the free-standing storage server 100 with the top panel 105, front upper panel 106, back upper panel 200, left access panel 201, right access panel 107, eight panel magnets 614, sixteen pan head screws 3216, sixteen shoulder screws 3112 and 3213, and twenty-five shoulder screws 9001 removed to facilitate drive carrier 800 visibility. Also visible are the left 902 and right 903 subsections which may beneficially allow bilateral access (from the left 302 and right 303 sides) to one hundred forty-four storage drives 900 via the drive carriers 800.

Also illustrated in FIG. 35A, the free-standing storage server 100 has either affixed or etched, to the front lower panel 108, the following: a "pushbutton switch" named a power button 3300, an "LED" named a green LED 3301, an "LED" named a yellow LED 3302, an "LED" named a red LED 3303, and a CNC "engraving of POWER" named a power engraving 3304. The power button 3300 may be used to initiate the storage server's 100 power-on procedure and may be inset such that when installed may be positioned behind the front facing 300 exterior surface of the front lower panel 108. This insetting of the power button 3300 may be accomplished via a CNC chamfer (e.g. 0.123" depth) and may beneficially hinder unintentional use of said button 3300. The green LED 3301 may be solidly lit to indicate the storage server 100 has successfully powered on. The yellow 3302 and red 3303 LEDs may indicate not only various system servicing which is beneficial (e.g. storage drive 900 failure), but also numerous levels of escalation of said servicing. The LEDs 3301-3303 may utilize solid illumination and/or various blinking on/off states.

Figure 35B:
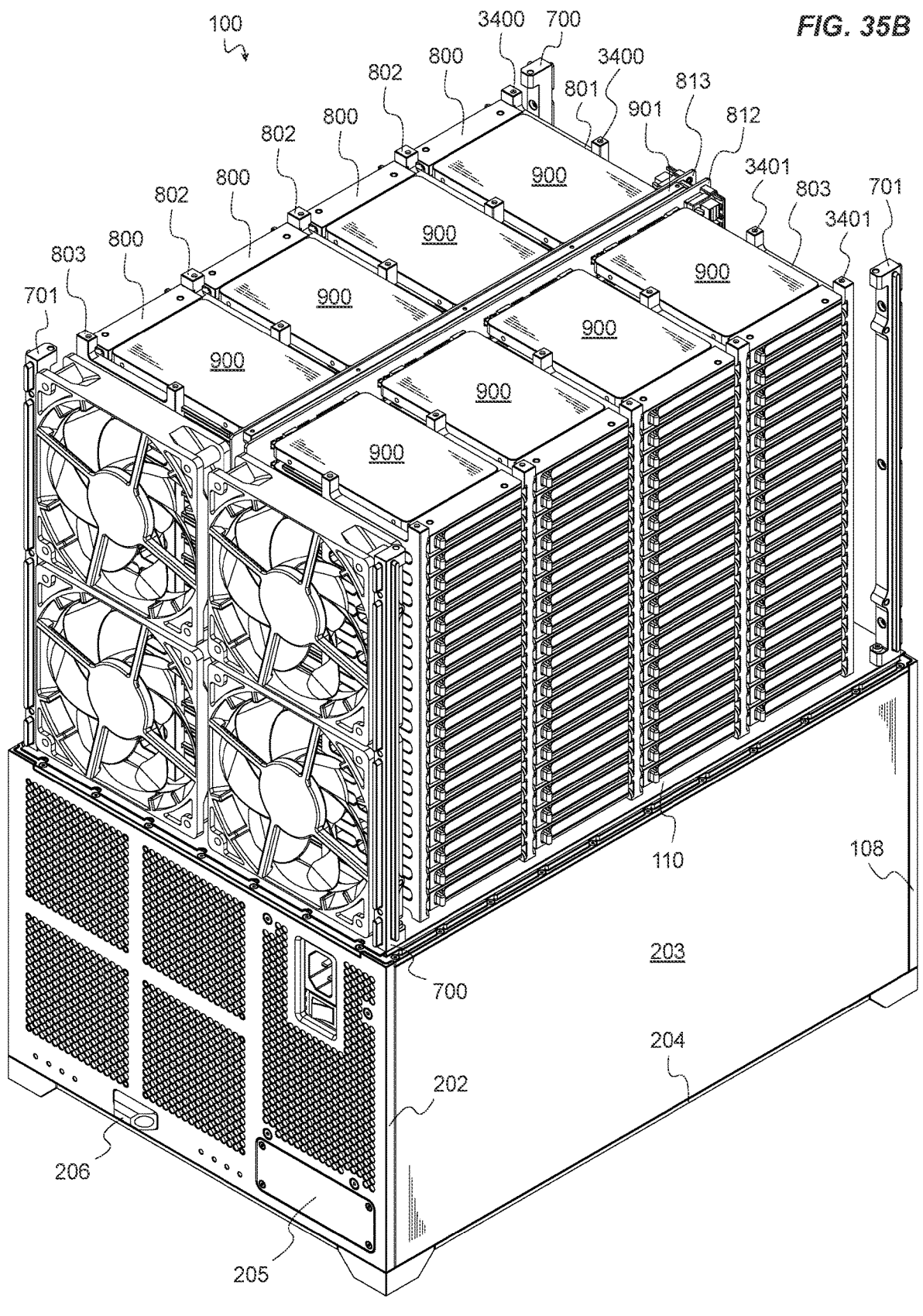
FIG. 35B illustrates a top, back, left perspective-view of a storage server according to an embodiment.

Illustrated in FIG. 35B is the free-standing storage server 100 with the top panel 105, front upper panel 106, back upper panel 200, left access panel 201, right access panel 107, eight panel magnets 614, sixteen pan head screws 3216, sixteen shoulder screws 3112 and 3213, and twenty-five shoulder screws 9001 removed to facilitate drive carrier 800 visibility. Also visible are the left 902 and right 903 subsections, where each subsection 902 and 903 may include four carrier columns 804-806. The carrier columns 804-806 may be sized to correspond with both the fan intake area created by the left intake width 1307 times the left intake height 1308 and the right intake width 1407 times the right intake height 1408, both of these fan intake areas may be approximated by the aggregate intake of two top axial fans 808-811 (see FIGS. 13B and 14B).

Figure 36:
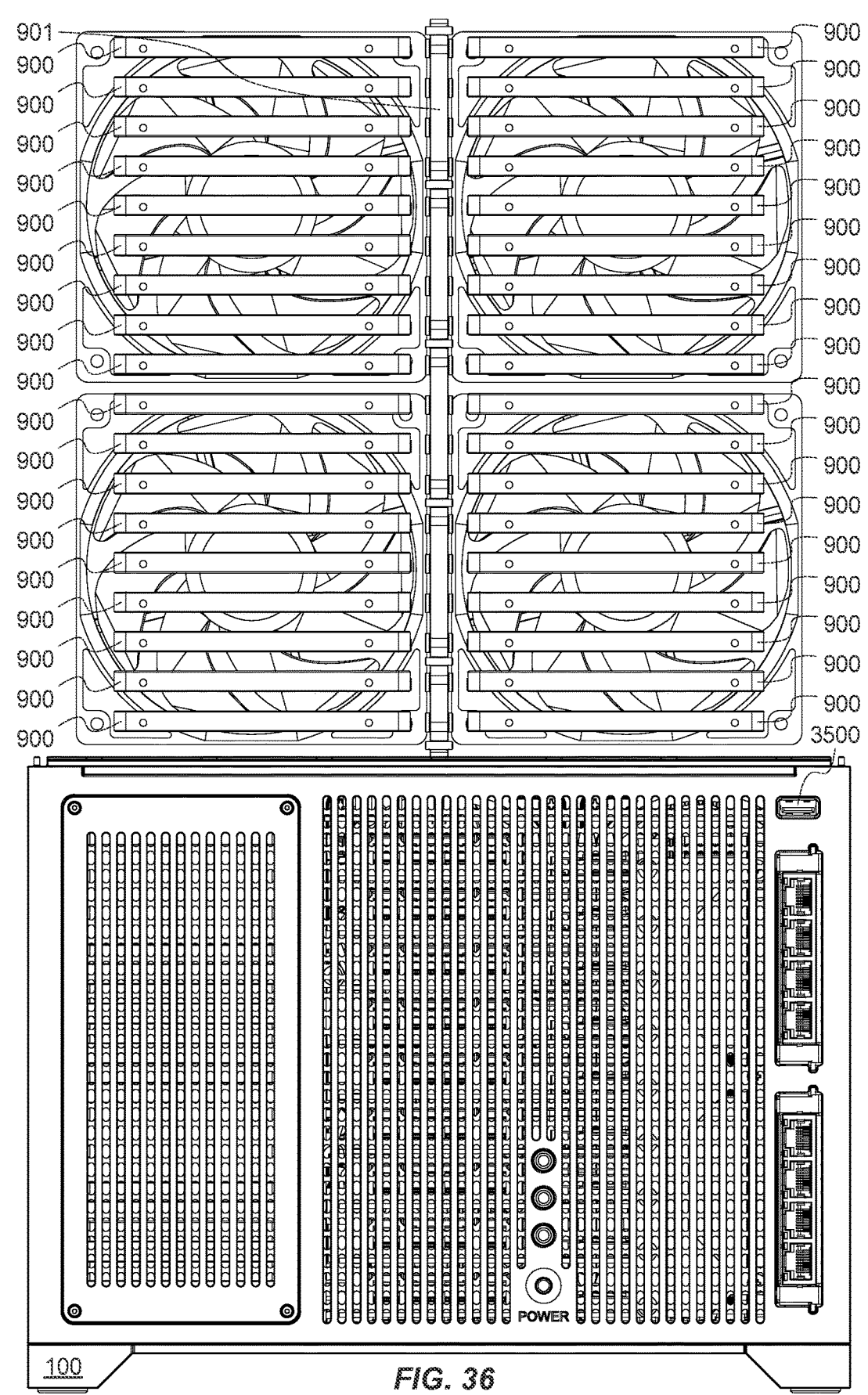
FIG. 36 illustrates a front orthographic-view of a storage server with various components removed to present certain bilateral symmetries about a median plane according to an embodiment.

Illustrated in FIG. 36 is the free-standing storage server 100 with the top panel 105, front upper panel 106, back upper panel 200, left access panel 201, right access panel 107, ten vertical locators 801-803, four panel aligners 700 and 701, left 812 and right 813 backplanes, sixteen panel magnets 614 and 814, twenty shoulder screws 3112 and 3213, forty-five shoulder screws 9001 and 9100, sixteen pan head screws 3216, and one hundred forty-four drive carriers 800 (excluding storage drives 900) removed to depict the bilaterally symmetrical, about the median plane 1505, placement of the mounting holes 2525, of said drives 900, in relation to the bilaterally symmetrical, about the median plane 1505, placement of the install holes 3221 of the top axial fans 808-811.

Also illustrated in FIG. 36 is a possible placement for an optional panel-mount "USB connector" (e.g. Type-A or Type-C), named a firmware port 3500. The firmware port 3500 may connect via an internal cable to either a "command and control management board", named a control board 6400, or the "host motherboard", named a system board 4800, and may utilize a proprietary procedure (i.e. not publicly disclosed) for updating said board's 6400 one or more firmwares and/or said board's 4800 BIOS. In an embodiment, the firmware port 3500 may not be accessible from either the storage server's 100 operating system or BIOS, this lack of accessibility may inherently obstruct malware type exploits. But, the firmware port 3500 may be accessed by connecting said port 3500 directly to the control board 6400, which may then utilize a proprietary procedure to interface with and update the system board's 4800 BIOS. Limiting firmware updates to be sourced solely from the firmware port 3500, i.e. exclude alternative sources such as BIOS discoverable USB drives and/or BMC attached devices, may be beneficial and can inhibit or even thwart various ransomware attacks from targeting and thereby infecting the storage server 100. Plugged into the firmware port 3500 may be an industry standard USB storage device (e.g. flash drive) which may store various firmware update and security validation type files.

Figure 37A:
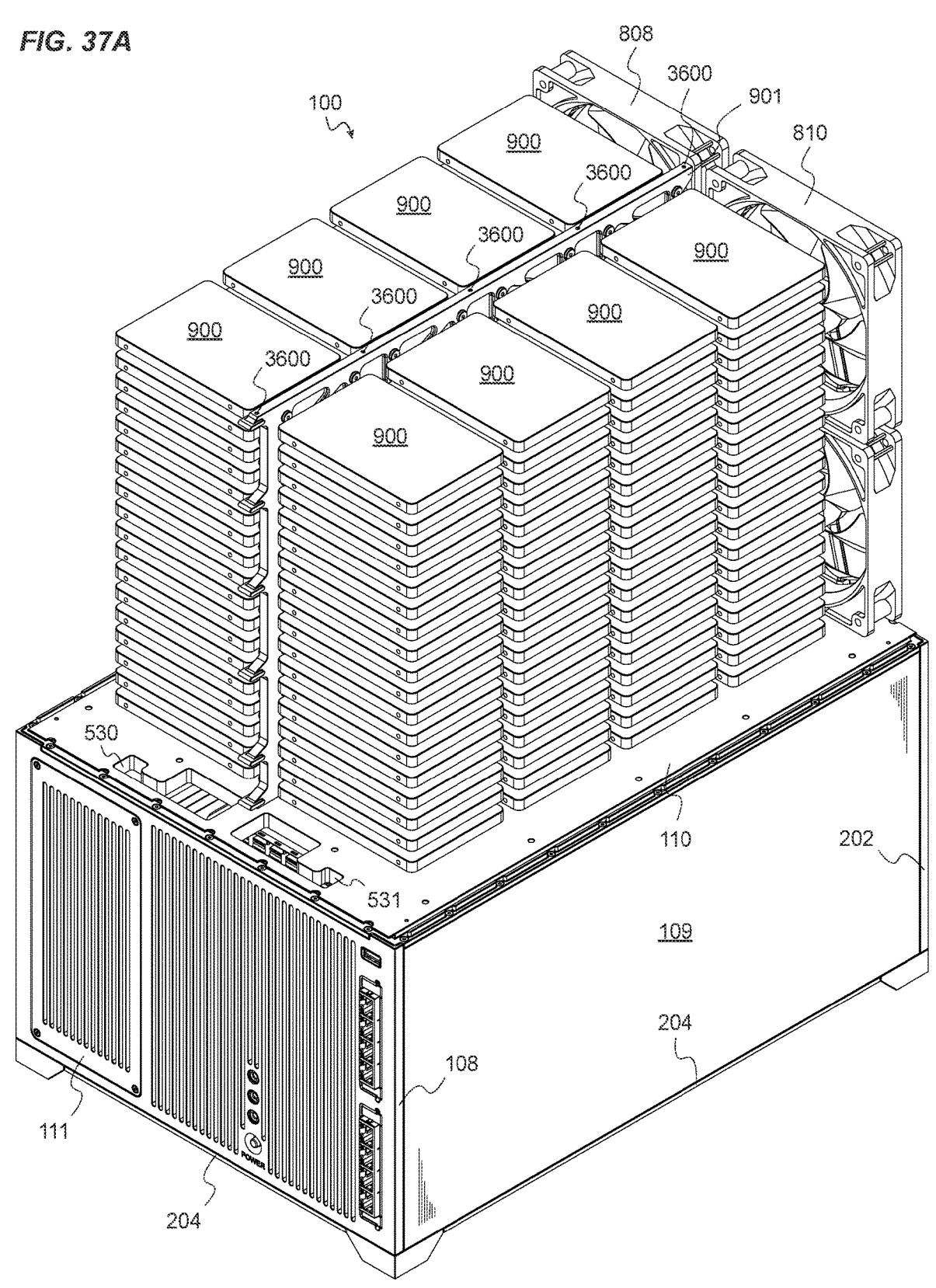
FIG. 37A illustrates a top, front, right perspective-view of a storage server with various components removed to present certain bilateral symmetries about a median plane according to an embodiment.

Illustrated in FIG. 37A is the free-standing storage server 100 with the top panel 105, front upper panel 106, back upper panel 200, left access panel 201, right access panel 107, ten vertical locators 801-803, four panel aligners 700 and 701, left 812 and right 813 backplanes, sixteen panel magnets 614 and 814, twenty shoulder screws 3112 and 3213, sixteen pan head screws 3216, forty-five shoulder screws 9001 and 9100, and one hundred forty-four drive carriers 800 (excluding storage drives 900) removed to depict the spatial distribution and density of said drives 900 in relation to the bounding volume of the storage server's 100 top section 208.

Figure 37B:
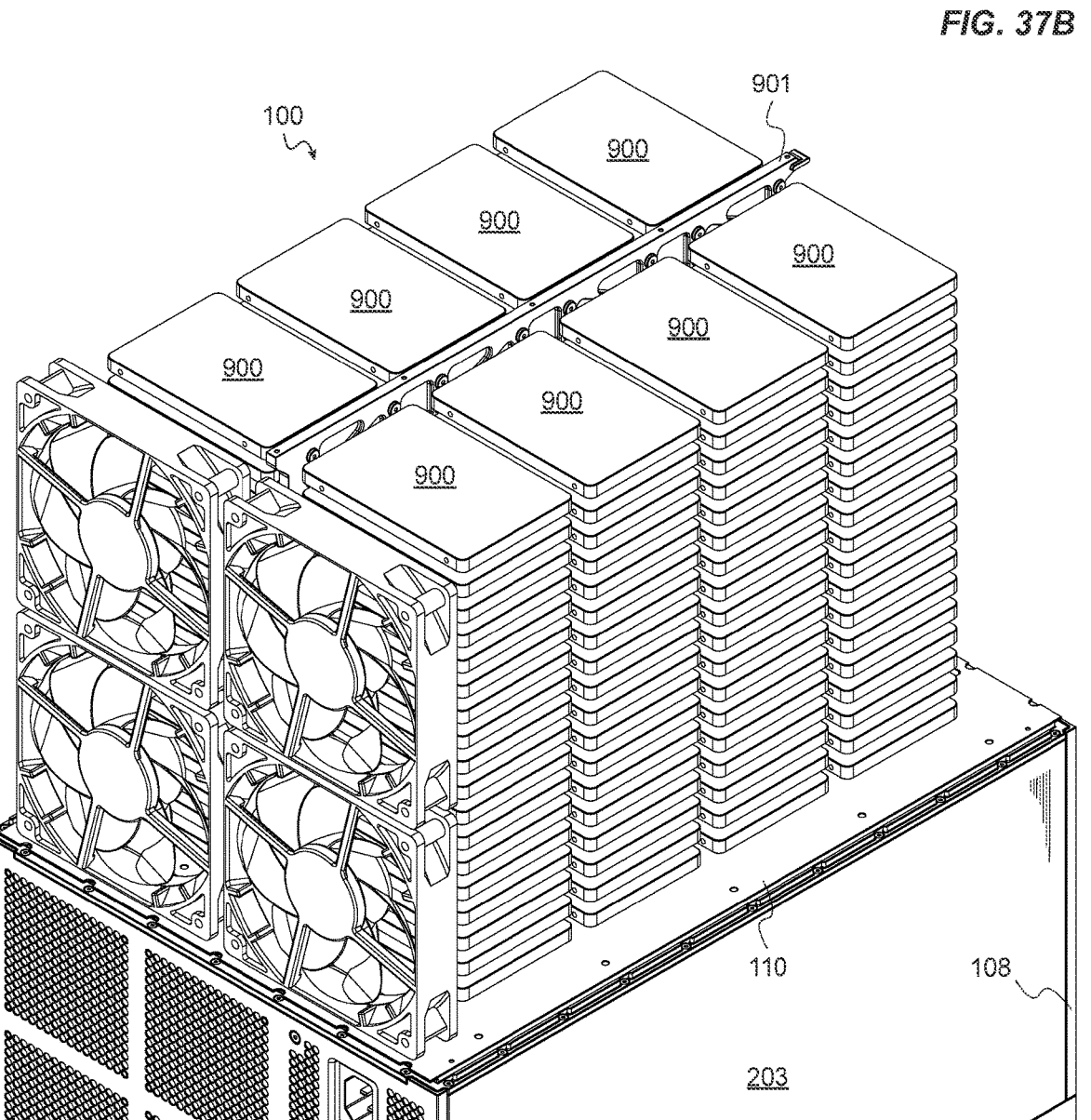
FIG. 37B illustrates a top, back, left perspective-view of a storage server with various components removed to present certain bilateral symmetries about a median plane according to an embodiment.

Illustrated in FIG. 37B is the free-standing storage server 100 with the top panel 105, front upper panel 106, back upper panel 200, left access panel 201, right access panel 107, ten vertical locators 801-803, four panel aligners 700 and 701, left 812 and right 813 backplanes, sixteen panel magnets 614 and 814, twenty shoulder screws 3112 and 3213, sixteen pan head screws 3216, forty-five shoulder screws 9001 and 9100, and one hundred forty-four drive carriers 800 (excluding storage drives 900) removed to depict the placement of said drives 900 and the four top axial fans 808-811 in relation to the bounding volume of the storage server's 100 top section 208.

Figures 38A, 38B:
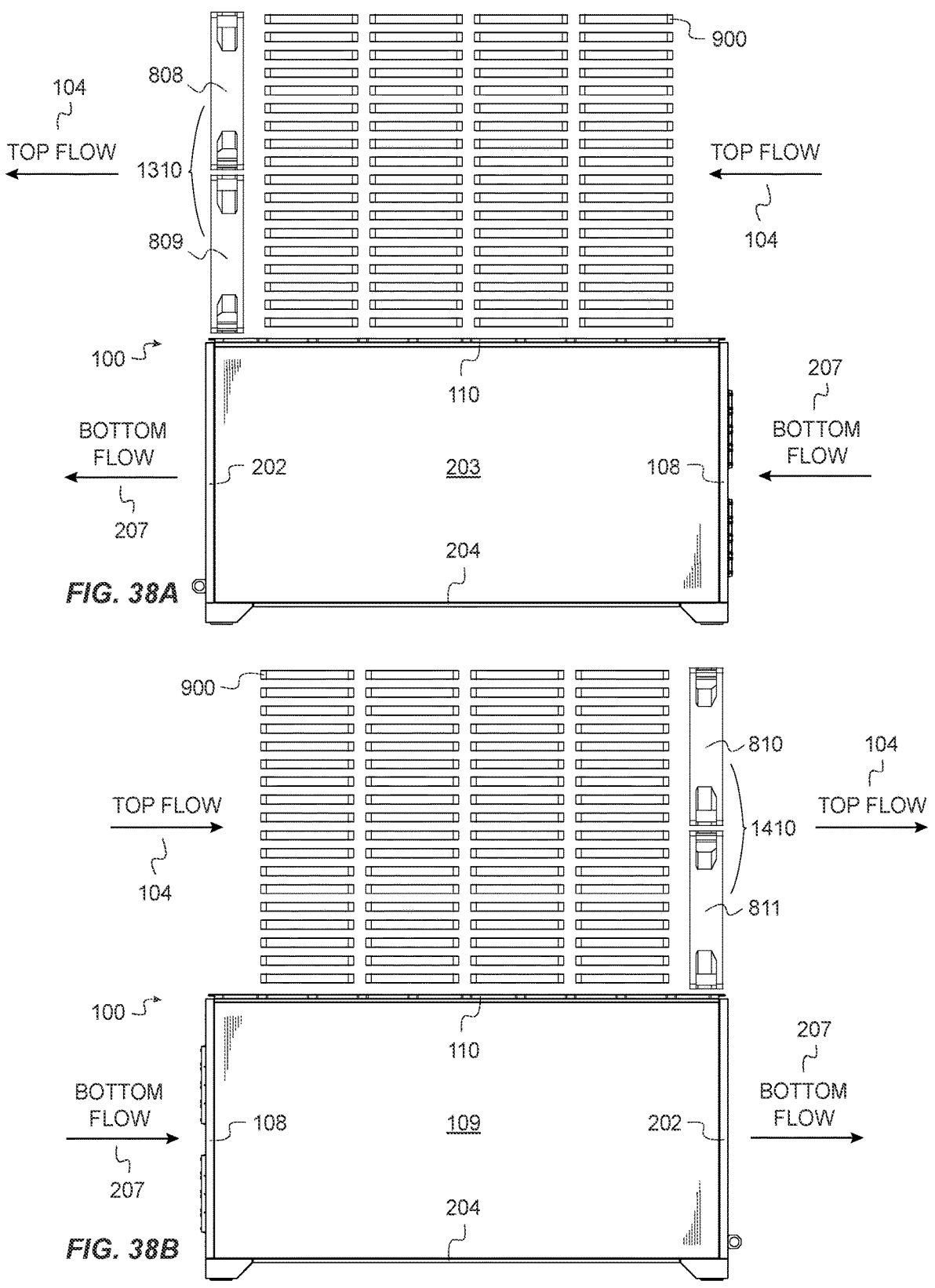
FIG. 38A illustrates a left orthographic-view of a storage server with various components removed to present certain bilateral symmetries about a median plane according to an embodiment.
FIG. 38B illustrates a right orthographic-view of a storage server with various components removed to present certain bilateral symmetries about a median plane according to an embodiment.

As illustrated in FIGS. 38A and 38B, the free-standing storage server 100 with the top panel 105, front upper panel 106, back upper panel 200, left access panel 201, right access panel 107, backing plate 901, ten vertical locators 801-803, four panel aligners 700 and 701, left 812 and right 813 backplanes, sixteen panel magnets 614 and 814, twenty shoulder screws 3112 and 3213, sixteen pan head screws 3216, fifty shoulder screws 9001 and 9100, and one hundred forty-four drive carriers 800 (excluding storage drives 900) removed to depict the bilaterally symmetrical, about the median plane 1505, placement of the mounting holes 2525 of said drives 900 in relation to the left 902 and right 903 subsections. As shown, the storage server's 100 top section 208 has a sum total of one hundred forty-four storage drives 900 that are bilaterally accessed from the left 302 and right 303 sides. To wit, in FIG. 38A the left subsection's 902 two dimensional array of seventy-two storage drives 900 are visible while concealing the bilaterally symmetrical mounting (via mounting holes 2525 and about the median plane 1505) of the seventy-two storage drives 900 of the right subsection 903; and also in FIG. 38B the right subsection's 903 two dimensional array of seventy-two storage drives 900 are visible while concealing the bilaterally symmetrical mounting (via mounting holes 2525 and about the median plane 1505) of the seventy-two storage drives 900 of the left subsection 902. Also, visible in FIG. 38A is the left subsection's 902 left fan group 1310 which conceals the bilaterally symmetrical mounting (via install holes 3221 and about the median plane 1505) of the right fan group 1410 (of the right subsection 903); and visible in FIG. 38B is the right subsection's 903 right fan group 1410 which conceals the bilaterally symmetrical mounting (via install holes 3221 and about the median plane 1505) of the left fan group 1310 (of the left subsection 902).

As illustrated in FIGS. 39A and 39B, the storage server's 100 top section 208 has the following removed: the top panel 105, front upper panel 106, back upper panel 200, left access panel 201, right access panel 107, backing plate 901, four panel aligners 700 and 701, ten vertical locators 801-803, left 812 and right 813 backplanes, twenty shoulder screws 3112 and 3213, sixteen panel magnets 614 and 814, sixteen pan head screws 3216, four top axial fans 808-811, fifty shoulder screws 9001 and 9100, and one hundred forty-four drive carriers 800 (excluding storage drives 900) to depict the spatial distribution of said drives 900 in relation to the middle panel 110.

In alternative embodiments (not shown in figures), the disk receptacles 1700 of the left 812 and right 813 backplanes are partially populated with storage drives 900, although having an even number of said drives 900 in the top section 208 enables all the mounting holes 2525 of the storage drives 900 located in the left subsection 902 to be bilaterally symmetrical about the median plane 1505 to all the mounting holes 2525 of the storage drives 900 located in the right subsection 903 when said drives 900 are equally distributed between said subsections 902 and 903 and purposefully positioned.

Figures 40A, 40B:
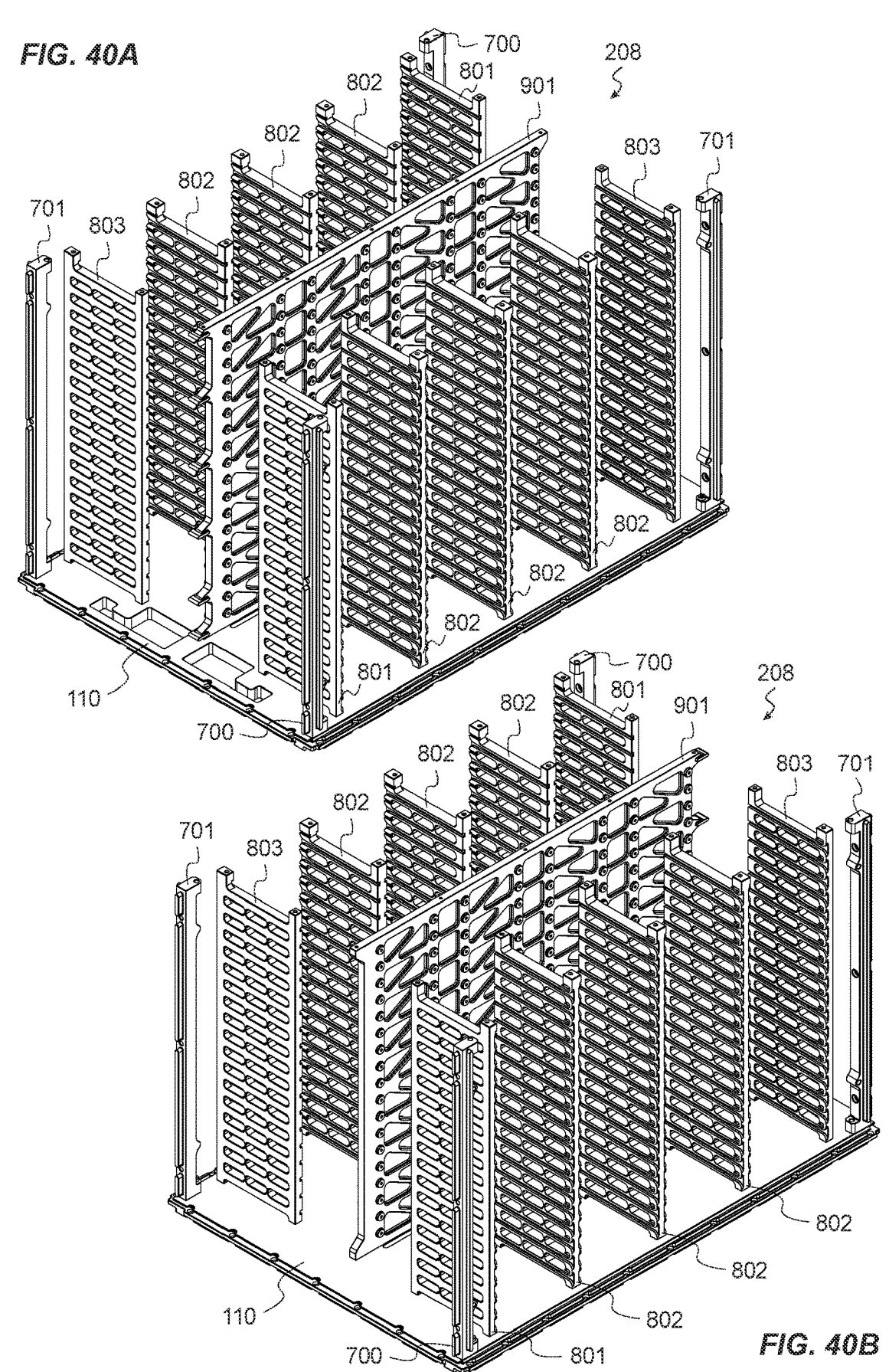
FIG. 40A illustrates a top, front, right perspective-view of a top section with various components removed to present components which provide structural integrity and rigidity to a top section according to an embodiment.
FIG. 40B illustrates a top, back, left perspective-view of a top section with various components removed to present components which provide structural integrity and rigidity to a top section according to an embodiment.

As illustrated in FIGS. 40A and 40B, the storage server's 100 top section 208 has the following removed: the top panel 105, front upper panel 106, back upper panel 200, left access panel 201, right access panel 107, left 812 and right 813 backplanes, eight panel magnets 614, sixteen shoulder screws 3112 and 3213, four top axial fans 808-811, sixteen pan head screws 3216, twenty-five shoulder screws 9001, and one hundred forty-four drive carriers 800 so that certain components which are integral to the structural integrity/rigidity of said section 208 are visible.

Figures 40C, 40D:
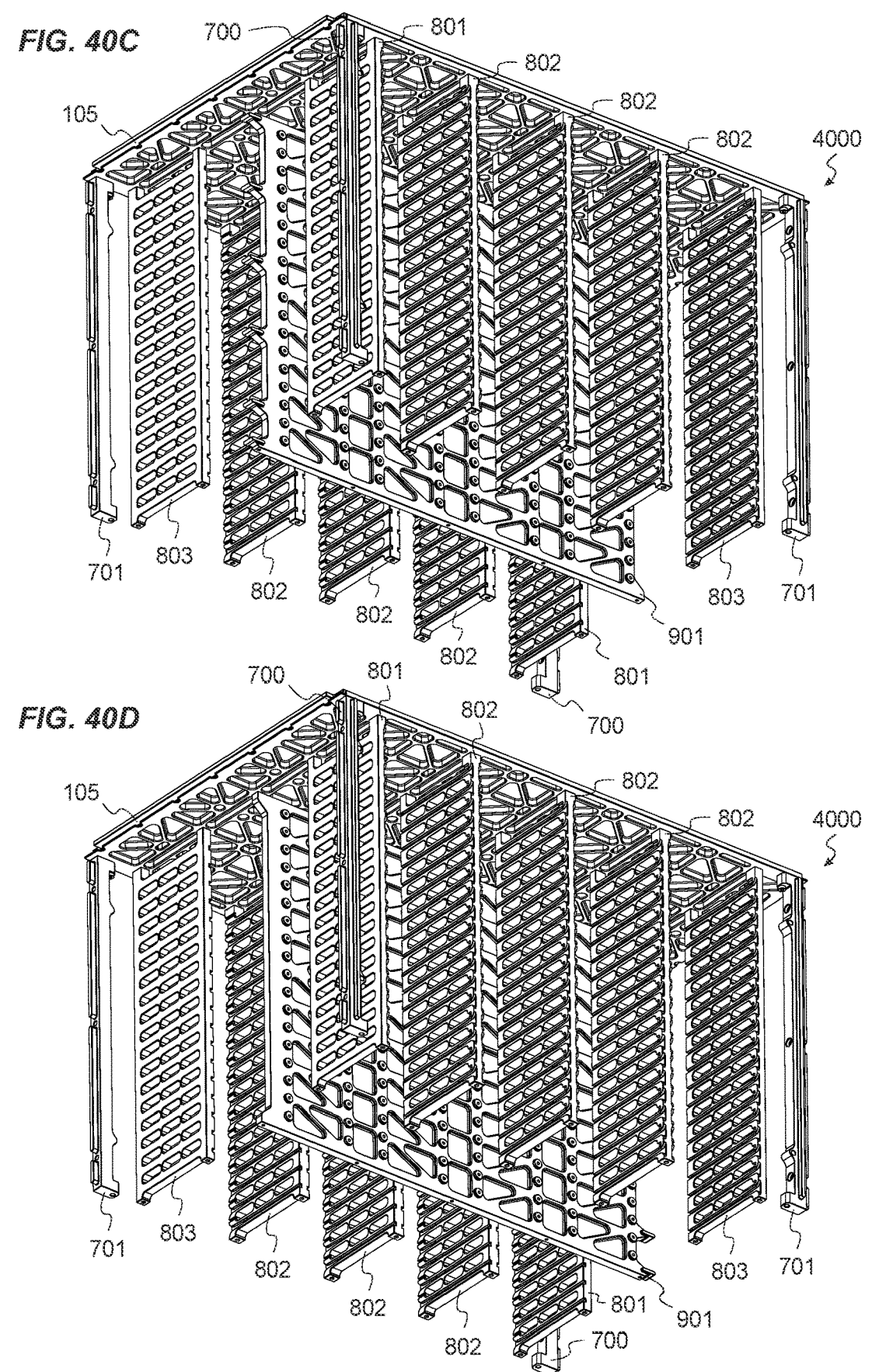
FIG. 40C illustrates a bottom, front, right perspective-view of a partial endoskeleton according to an embodiment.
FIG. 40D illustrates a bottom, back, left perspective-view of a partial endoskeleton according to an embodiment.

Illustrated in FIGS. 40C and 40D is an "assembly of components" which is named a partial endoskeleton 4000. The partial endoskeleton 4000 may include the following: the top panel 105, backing plate 901, ten vertical locators 801-803, four panel aligners 700 and 701, eight panel magnets 814, four shoulder screws 3112 and 3213, and twenty-five shoulder screws 9001. When the middle panel 110 is attached to the partial endoskeleton 4000, with twenty-five shoulder screws 9100 and four shoulder screws 3112 and 3213, a type of "endoskeleton", named an endoskeleton frame 9000, is assembled. The endoskeleton frame 9000 may provide integrated attachment mechanisms, integrated EMI containment mechanisms, and a beneficial structural integrity and/or rigidity for the storage server's 100 top section 208. An endoskeleton frame 9000 may structurally enable removal of the left 201 and right 107 access panels and/or the front 106 and back 200 upper panels so that system servicing operations may be performed.

Figures 41A, 41B:
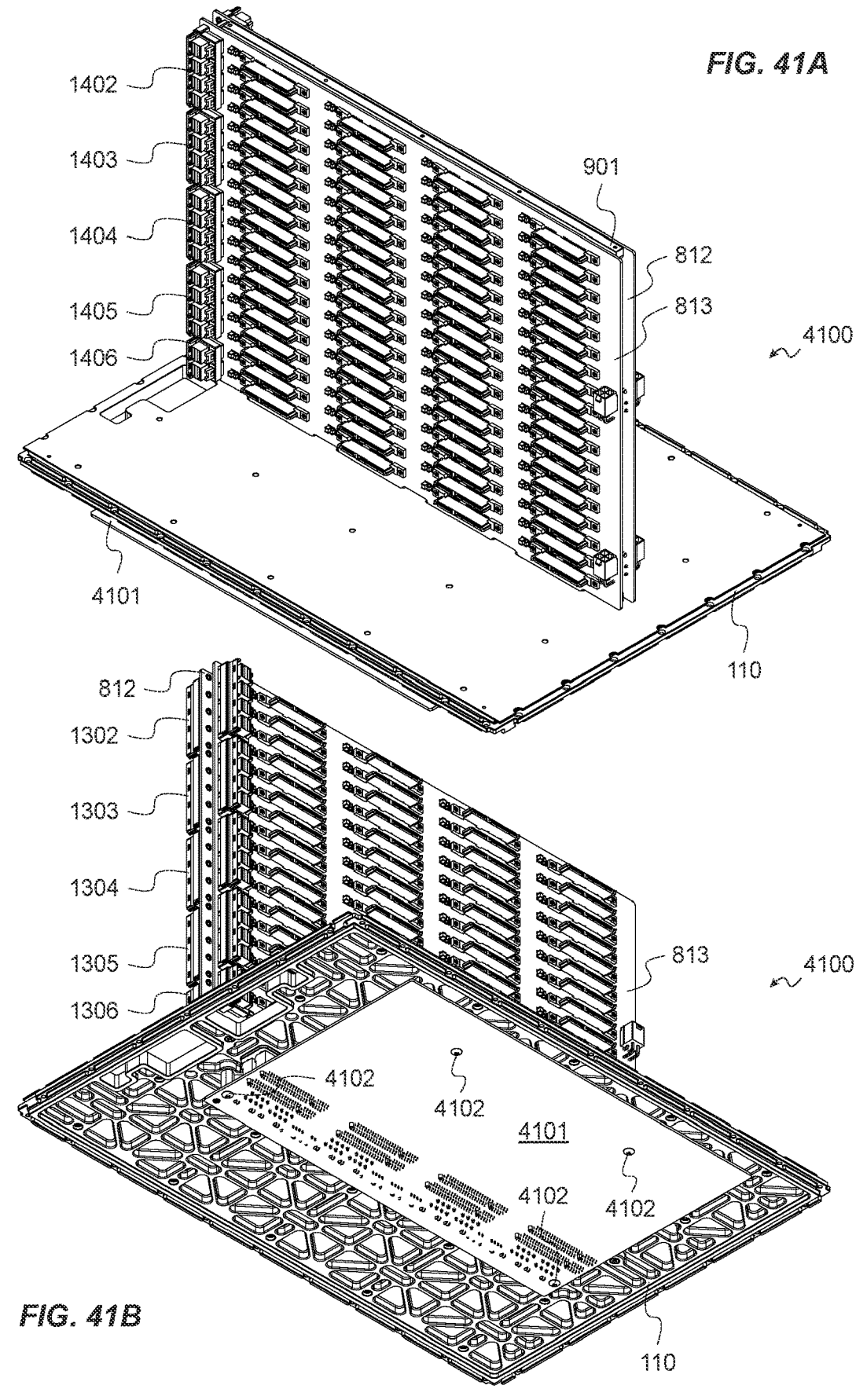
FIG. 41A illustrates a top, back, right perspective-view of a power system according to an embodiment.
FIG. 41B illustrates a bottom, front, right perspective-view of a power system according to an embodiment.

Illustrated in FIGS. 41A and 41B are components from both the top 208 and bottom 209 sections that collectively function as a "power generation and transportation system", named a power system 4100, for the top section's 208 storage drives 900. The power system 4100 may comprise: the backing plate 901, left 812 and right 813 backplanes, middle panel 110, and a power providing "printed circuit board" which is named a power board 4101 and may be populated with one or more (e.g. eight) switching regulators. The power board 4101 may be affixed to the middle panel 110 in a parallel or substantially parallel orientation, the backplanes 812 and 813 may be affixed to the backing plate 901 in a parallel or substantially parallel orientation, and the backing plate 901 may be affixed to the middle panel 110 in a perpendicular or substantially perpendicular orientation. Thus, the middle panel 110 not only performs as a shared separator between the top 208 and bottom 209 sections of the storage server 100, but as a thermal and EMI separator between the top section's 208 storage drives 900 and the power board 4101 which provides power to said drives 900. During the power board's 4101 production of power, said board 4101 also generates (i.e. radiates) both thermal output (i.e. heat) and EMI output which may be partially or fully shielded from the top section's 208 storage drives 900, by this middle panel 110. Shielding thermal and EMI output from storage drives 900 may beneficially improve the operation of said drives 900. Further, by locating components such as the power board 4101 and one or more (e.g. nine)

"host bus adapters", each named a host adapter 4500, in the bottom section 209 which is separated, via the middle panel 110, from the storage drives 900 in the top section 208, the top flow's 104 CFM may well be improved as a result of said board 4101 and said adapters 4500 not impeding or imping-ing said flow 104.

As illustrated in FIGS. 41A and 41B, the power board 4101 is attached to the middle panel 110 via the following: one or more (e.g. four) threaded blind holes 529 in said panel 110, one or more (e.g. four) male-female hex standoffs 4216, one or more (e.g. four) unplated through holes 4402, and one or more (e.g. four) truss head screws 4102. To wit, four male-female hex standoffs 4216 may first be screwed into the middle panel 110 and then four truss head screws 4102 may be used to fasten the power board 4101, via through holes 4402, to said standoffs 4216.

The high-density free-standing storage server 100 by definition may involve three interrelated aspects. First, physically enclosing the storage drives 900, including data cable interconnect and end-user accessibility, in such a way that delivers such high-density. Second, the power conver-sion circuitry and an apparatus to supply said power to such drives 900. Third, provide cooling to both the enclosed drives 900 and the step-down converters supplying said drives 900. For example, in an embodiment this first aspect may be accomplished via the top section's 208 structural framework, specifically the bilaterally symmetrical place-ment of the storage drive's 900 mounting holes 2525 within the left 902 and right 903 subsections. This second aspect may be realized via the power system 4100, specifically the power board's 4101 placement which may be beneficially located in the bottom section 209 and thus partitioned, by the middle panel 110, from the storage drives 900 powered by said board 4101. So, with storage drives 900 located in the top section 208 and the power board 4101 supplying said drives 900 located in the bottom section 209, this third aspect may be achieved with separate cooling mechanisms which are independently monitored and controlled, i.e. one such mechanism for each such section 208 and 209.

In alternative embodiments (not shown in figures), the four 120 mm×120 mm×25 mm top axial fans 808-811 of the top section 208 are replaced with nine 80 mm×80 mm×25 mm axial fans. These nine 80 mm axial fans are positioned in an array of three rows by three columns. This three-by-three matrix of 80 mm axial fans is then attached to the back upper panel 200 in place of the two-by-two matrix of 120 mm top axial fans 808-811, hence providing additional fan redundancy.

Figures 42A, 42B:
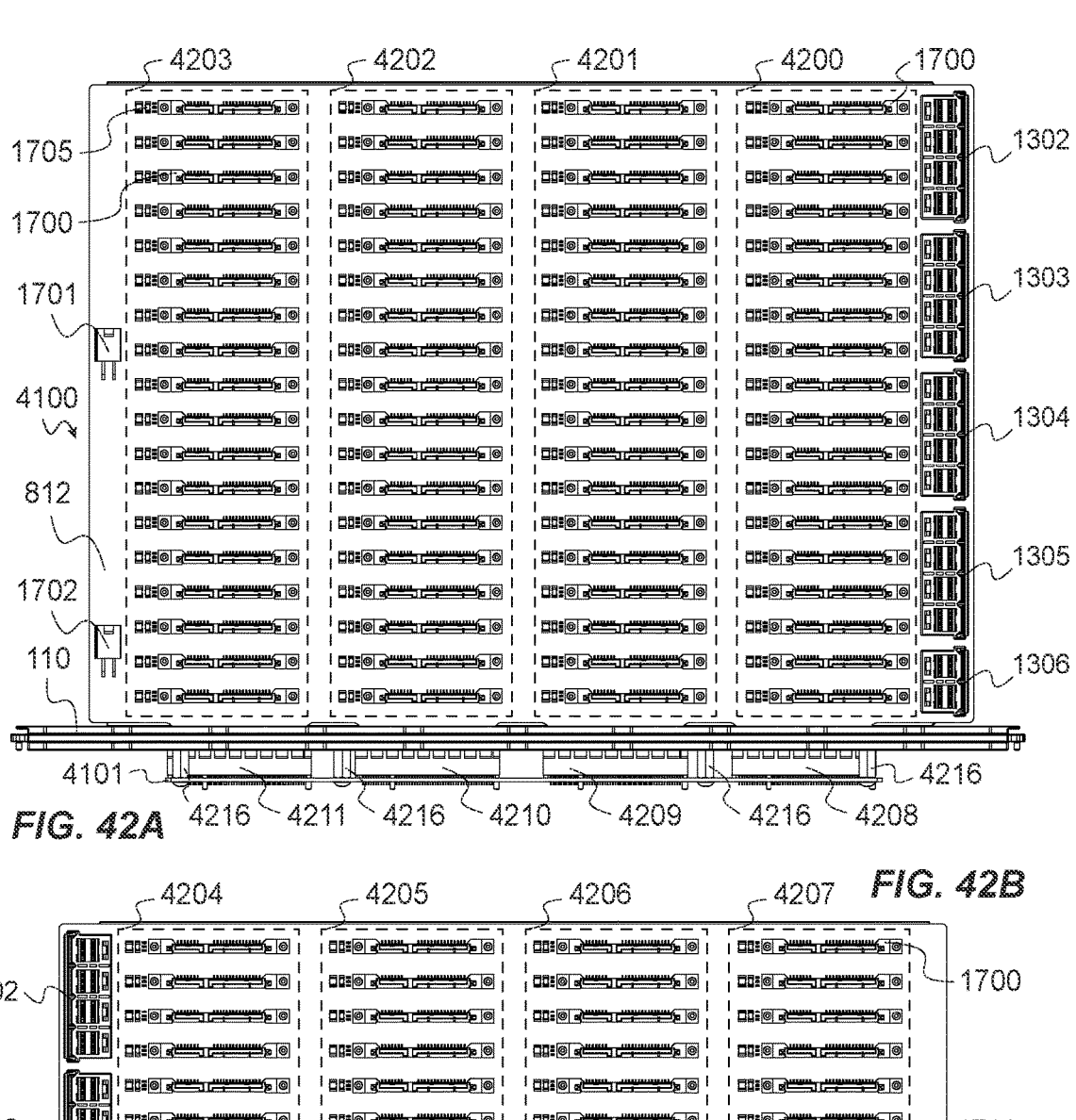
FIG. 42A illustrates a left orthographic-view of a power system according to an embodiment.
FIG. 42B illustrates a right orthographic-view of a power system according to an embodiment.

As illustrated in FIGS. 42A and 42B, each backplane 812 and 813 of the power system 4100 has one or more (e.g. four) vertically oriented "multilayer power planes", each named a power plane 4200-4207, which are approximated with dashed rectangles for ease of depiction. In an embodi-ment, the four power planes 4200-4203 of the left backplane 812 may deliver power to storage drives 900 mated to said backplane 812 and secured by the left column group 816; and similarly, the four power planes 4204-4207 of the right backplane 813 may deliver power to storage drives 900 mated to said backplane 813 and secured by the right column group 817. To wit, for the left backplane 812, power plane 4200 may supply the left column group's 816 right carrier column 806, power plane 4201 may supply the left column group's 816 first inner carrier column 805, power plane 4202 may supply the left column group's 816 second inner carrier column 805, and power plane 4203 may supply the left column group's 816 left carrier column 804; and for the right backplane 813, power plane 4204 may supply the right column group's 817 left carrier column 804, power plane 4205 may supply the right column group's 817 first inner carrier column 805, power plane 4206 may supply the right column group's 817 second inner carrier column 805, and power plane 4207 may supply the right column group's 817 right carrier column 806. The power planes 4200-4207 are often multilayer and thus comprised of one or more (e.g. two) internal printed circuit board layers. Each such layer may utilize copper cladding of increased thickness (e.g. 2 oz) to reduce plane impedance, which may reduce parasitic power loss and improve the backplane's 812 and 813 heat dissipation. To wit, the left backplane's 812 eight layer printed circuit board stackup may include the following: a top layer of the storage drive's 900 differential traces, a second layer ground plane, a third layer ground plane, a fourth layer with a first instance of the power planes 4200-4203, a fifth layer with a second instance of the power planes 4200-4203, a sixth layer ground plane, a seventh layer ground plane, and a bottom layer of the storage drive's 900 differential traces; and the right backplane's 813 eight layer printed circuit board stackup may include the following: a top layer of the storage drive's 900 differential traces, a second layer ground plane, a third layer ground plane, a fourth layer with a first instance of the power planes 4204-4207, a fifth layer with a second instance of the power planes 4204-4207, a sixth layer ground plane, a seventh layer ground plane, and a bottom layer of the storage drive's 900 differential traces.

Also illustrated in FIGS. 42A and 42B, the vertical orientation of the power planes 4200-4207, within the back-planes 812 and 813, enables the electrical current within said planes 4200-4207 to flow bidirectionally in a vertical ori-entation (i.e. top face 304 to bottom face 305 and bottom face 305 to top face 304). The differential traces connecting the disk receptacles 1700 to both connector groups 1311 and 1411 may be routed bidirectionally in a horizontal orienta-tion (i.e. front face 300 to back face 301 and back face 301 to front face 300). Therefore, this perpendicularity or sub-stantially perpendicularity of the current flow relative to the differential routing may improve the signal integrity (e.g. crosstalk reduction) of said differential traces, which in turn may improve the data integrity of transfers to and from the storage drives 900, which in turn may improve the overall data integrity of the storage server 100. Herein, the term "substantially perpendicularity" shall incorporate expected tolerances and inherent variations resulting from the fabri-cation and assembly of the storage server 100.

As shown in FIGS. 42A and 42B, the backplane's 812 and 813 power planes 4200-4207 are approximated with dashed rectangles for ease of depiction, said planes 4200-4207 extend towards and electrically connect with the gold fingers of the power couplers 1200-1207 respectively. These gold fingers are herein defined as the narrow gold plated electrical contacts which may be found on the edges of printed circuit boards. The power couplers 1200-1207 may insert into "PCIe card connectors" (e.g. MOLEX 87715-9206), each named a power slot 4208-4215 respectively, to transport the stepped-down voltage generated from the power system's 4100 power board 4101. The power slots 4208-4215 may provide insertion tolerances which facilitate power system 4100 assembly and operation. The perpendicular or substan-tially perpendicular orientation and attachment, via shoulder screws 9100, of the backing plate 901 to the middle panel 110 facilitates the alignment of the backplane's 812 and 813 power couplers 1200-1207, as said couplers 1200-1207 pass through said panel's 110 power slits 532-539 respectively and are inserted into the power board's 4101 power slots 4208-4215 respectively.

Illustrated in FIGS. 43B and 43C are one or more (e.g. eight) dashed rectangles which depict approximate printed circuit board placement of "DC-to-DC step-down converters" (e.g. INFINEON IR38064), each named a buck converter 4300-4307. The buck converters 4300-4307 may supply power to the power board's 4101 power planes 4200-4207 respectively, which in turn may supply said power to power slots 4208-4215 respectively, which in turn may supply said power to power couplers 1200-1207 respectively, which in turn may supply said power to the backplane's 812 and 813 power planes 4200-4207 respectively, which in turn may supply said power to the top section's 208 storage drives 900 (via disk receptacles 1700). These dashed rectangles may also depict the approximate printed circuit board placement of the buck converter's 4300-4307 ancillary components which may include: an inductor, a plurality of input capacitors, and a plurality of output capacitors. The buck converters 4300-4307 may step-down a certain input voltage (e.g. 12V) to a certain output voltage (e.g. 5V) which may then be used to power storage drives 900 (e.g. SATA devices). This input voltage may be supplied by the power supply 213, via one or more (e.g. eight) cables with latched receptacles (e.g. MOLEX 39012085) which may be plugged into the power board 4101 via one or more (e.g. eight) "8-pin dual-row right-angle connectors" each named a buck connector 4308 (e.g. MOLEX 39301082).

Figure 44A:
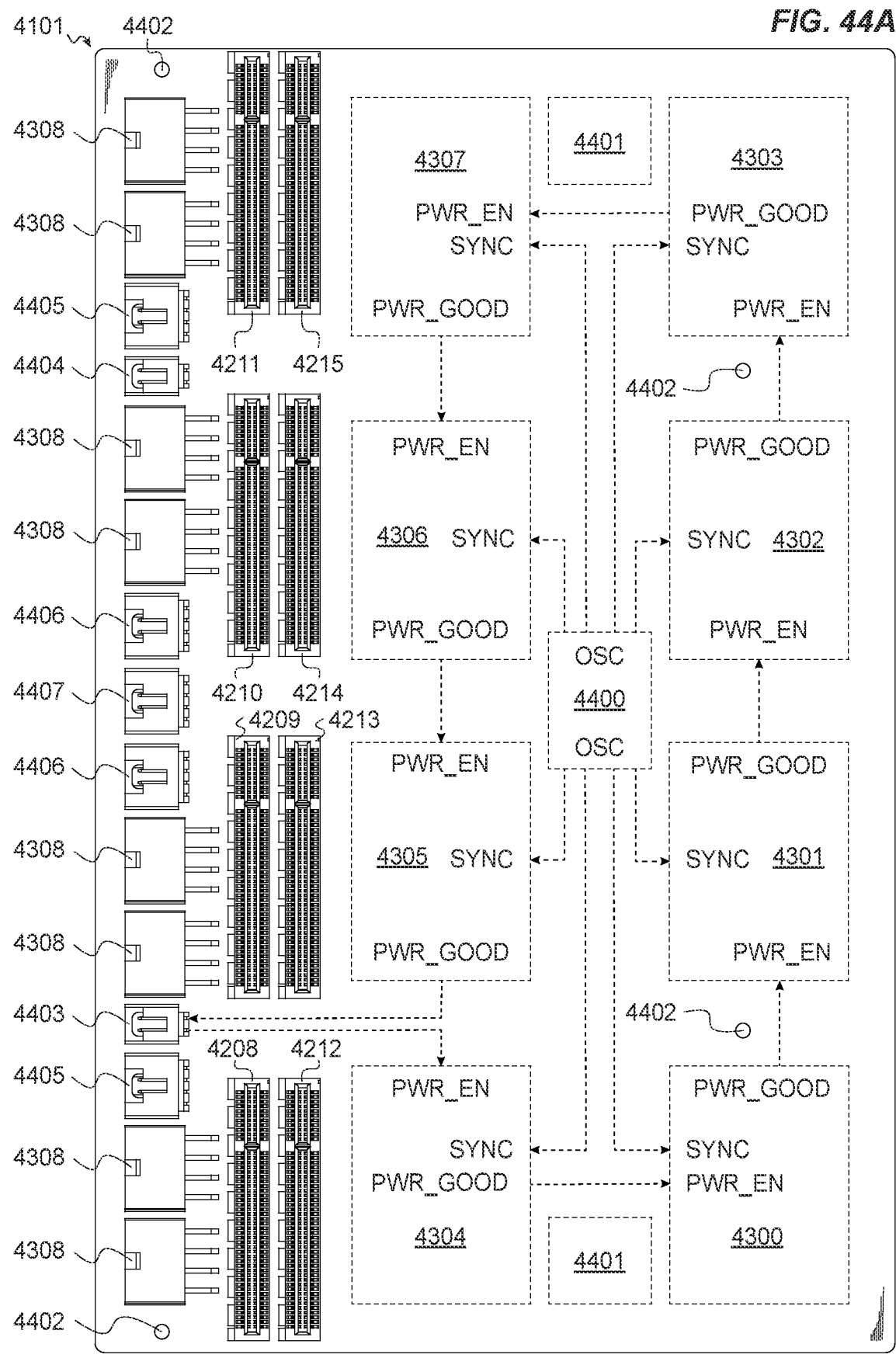
FIG. 44A illustrates a top orthographic-view of a power board's buck converter sequencing subprocedure according to an embodiment.

Illustrated in FIG. 44A is the power system's 4100 power board 4101. Also depicted is a power-up sequencing procedure, named a buck converter sequencing subprocedure (see FIG. 114), and a method of synchronization of the on-board buck converters 4300-4307. In an embodiment, this buck converter sequencing subprocedure may start with an activated signal (e.g. pulled high) transmitted from the storage server's 100 control board 6400 and received by the power board 4101 via a "2-pin header" which is named a start header 4403, said header 4403 may enable (i.e. PWR_EN) the first buck converter 4304 to turn on, which once voltage stabilized may activate a first power good signal (i.e. PWR_GOOD) which in turn may enable the second buck converter 4300, which once stabilized may activate a second power good signal which in turn may enable the third buck converter 4301, which once stabilized may activate a third power good signal which in turn may enable the fourth buck converter 4302, which once stabilized may activate a fourth power good signal which in turn may enable the fifth buck converter 4303, which once stabilized may activate a fifth power good signal which in turn may enable the sixth buck converter 4307, which once stabilized may activate a sixth power good signal which in turn may enable the seventh buck converter 4306, which once stabilized may activate a seventh power good signal which in turn may enable the eighth buck converter 4305, which once stabilized may activate an eighth power good signal which in turn may be transmitted back to the control board 6400 (via the start header 4403). For example, each of the eight buck converters 4300-4307 may power eighteen storage drives 900 from each of eight carrier columns 804-806 located in the storage server's 100 top section 208. The power board's 4101 buck converter sequencing subprocedure may beneficially constrain inrush current by minimizing the number of storage drives 900 which are powered-up concurrently during the storage server's 100 boot process. Further, phase synchronizing (e.g. 45 degrees) the buck converters 4300-4307 via a multiphase (e.g. eight) capable "precision oscillator" (e.g.

LINEAR LTC6909), named a phase clock 4400, may be beneficial in the reduction of the storage server's 100 EMI.

Figure 44B:
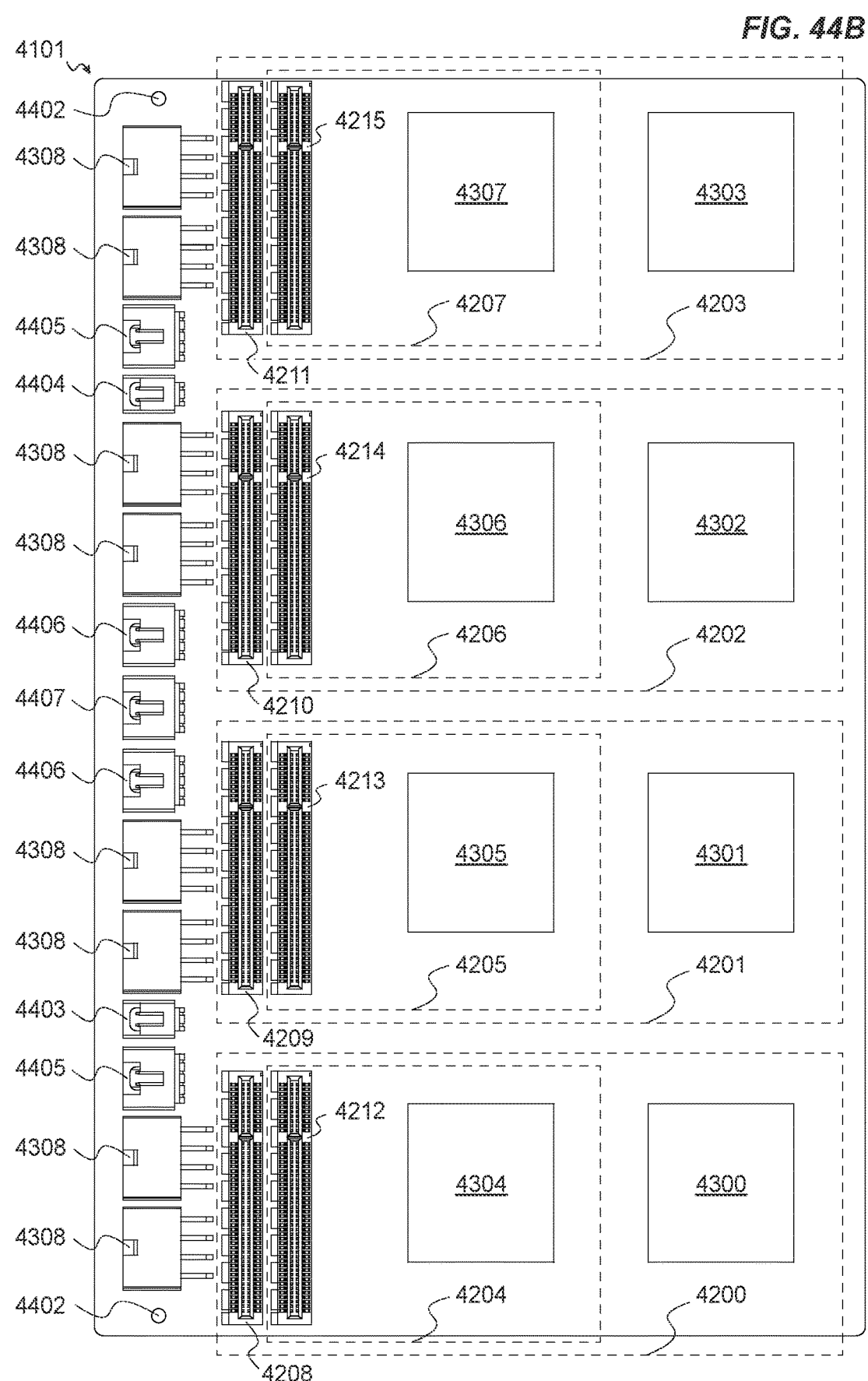
FIG. 44B illustrates a top orthographic-view of a power board and superimposed power planes according to an embodiment.

Illustrated in FIG. 44B are the power board's 4101 superimposed (i.e. overlap of two or more internal printed circuit board layers) power planes 4200-4207 which are approximated with dashed rectangles for ease of depiction. The power planes 4200-4207 may extend towards and electrically connect with the power slots 4208-4215 respectively. To improve EMI performance, the power board's 4101 twelve layer printed circuit board stackup may include: a top layer populated with buck converters 4300-4307 and power slots 4208-4215, a second layer ground plane, a third layer of power planes 4200-4203, a fourth layer of power planes 4204-4207, a fifth layer ground plane, a sixth layer input voltage plane, a seventh layer input voltage plane, an eighth layer ground plane, a ninth layer of power planes 4204-4207, a tenth layer of power planes 4200-4203, an eleventh layer ground plane, and the bottom layer of the phase clock 4400 to buck converter 4300-4307 traces. The power planes 4200-4207 may originate with the power board 4101 but are then provided continuity via power slots 4208-4215 and power couplers 1200-1207 to extend said planes 4200-4207 to the left 812 and right 813 backplanes which may then provide power to storage drives 900.

Illustrated in FIG. 44B is the power system's 4100 power board 4101, which may transmit (via several on-board headers) various control, diagnostic, and/or support signals which may in turn be received by the storage server's 100 control board 6400. In an embodiment, the eight power good signals, which are buck converter 4300-4307 outputs, may be transmitted from two 4-pin headers 4405 (e.g. MOLEX 70555-0073) to two 4-pin headers 6433 of the control board 6400. The eight power slots 4208-4215 may each relay a single signal, via two 4-pin headers 4406 (e.g. MOLEX 70555-0073) and two 4-pin headers 6432 of the control board 6400; the power coupler 1200-1207 originating signals may include four which indicate top axial fan 808-811 status (e.g. good/fail) and one I2C bus per backplane 812 and 813 for 2-way transmission between said backplanes 812 and 813 and the control board 6400. The power board 4101 may have two on-board "temperature sensors" (e.g. MCP9808), each named a power temp sensor 4401, a first positioned near the storage server's 100 front face 300 and a second near said server's 100 back face 301. The power temp sensors 4401 may each utilize a 2-pin I2C bus via the 4-pin header 4407 (e.g. MOLEX 70555-0073) which may connect to the control board 6400 via a 4-pin header 6431. Further, the eight buck converters 4300-4307 may utilize a digital power management protocol (e.g. PMBUS) for control and/or diagnostic data, this management protocol may utilize a 2-pin header 4404 (e.g. MOLEX 70555-0071) to transmit/receive said protocol to the control board 6400 via a 2-pin header 6426. Buck converters 4300-4307 may have attached heatsinks, which use the interior space between the power board 4101 and the middle panel 110, and use various types of TIM to attach said heatsinks.

Illustrated in FIGS. 45B-45E is the storage server's 100 host adapter 4500, which may include but is not limited to the following: a "host controller" which is named a host controller 4501, one or more (e.g. four) "memory module sockets" (e.g. JEDEC DDR4 SO-DIMM) where each is named a memory socket 4505 and 4506, one or more (e.g. four) "memory modules" (e.g. 32 GB DDR4 SO-DIMM) where each is named a memory module 4507 and may be installed via the memory sockets 4505 and 4506, a "high-speed connector" (e.g. MOLEX 76867-1013) which is named a host connector 4502, a "heatsink" for the host controller 4501 which is named a host heatsink 4508, a "card edge connector" (e.g. SFF-TA-1002 or PCIe CEM) which is named a host coupler 4509 and may support various bus protocols (e.g. PCIe versions), one or more (e.g. two) "4-40 screw terminals" (e.g. KEYSTONE 7774) where each is named a screw terminal 4503 and 4504, and one or more (e.g. four) mounting through holes 4510. These through holes 4510, via one or more (e.g. four) truss head screws 4517 (e.g. 4-40 thread), may be used to attach the host heatsink 4508, via one or more (e.g. four) threaded blind holes 4512 which are integral to said heatsink 4508 (as shown in FIG. 45A), to the host adapter's 4500 printed circuit board.

Figures 45A, 45B, 45C, 45D, 45E, 45F:
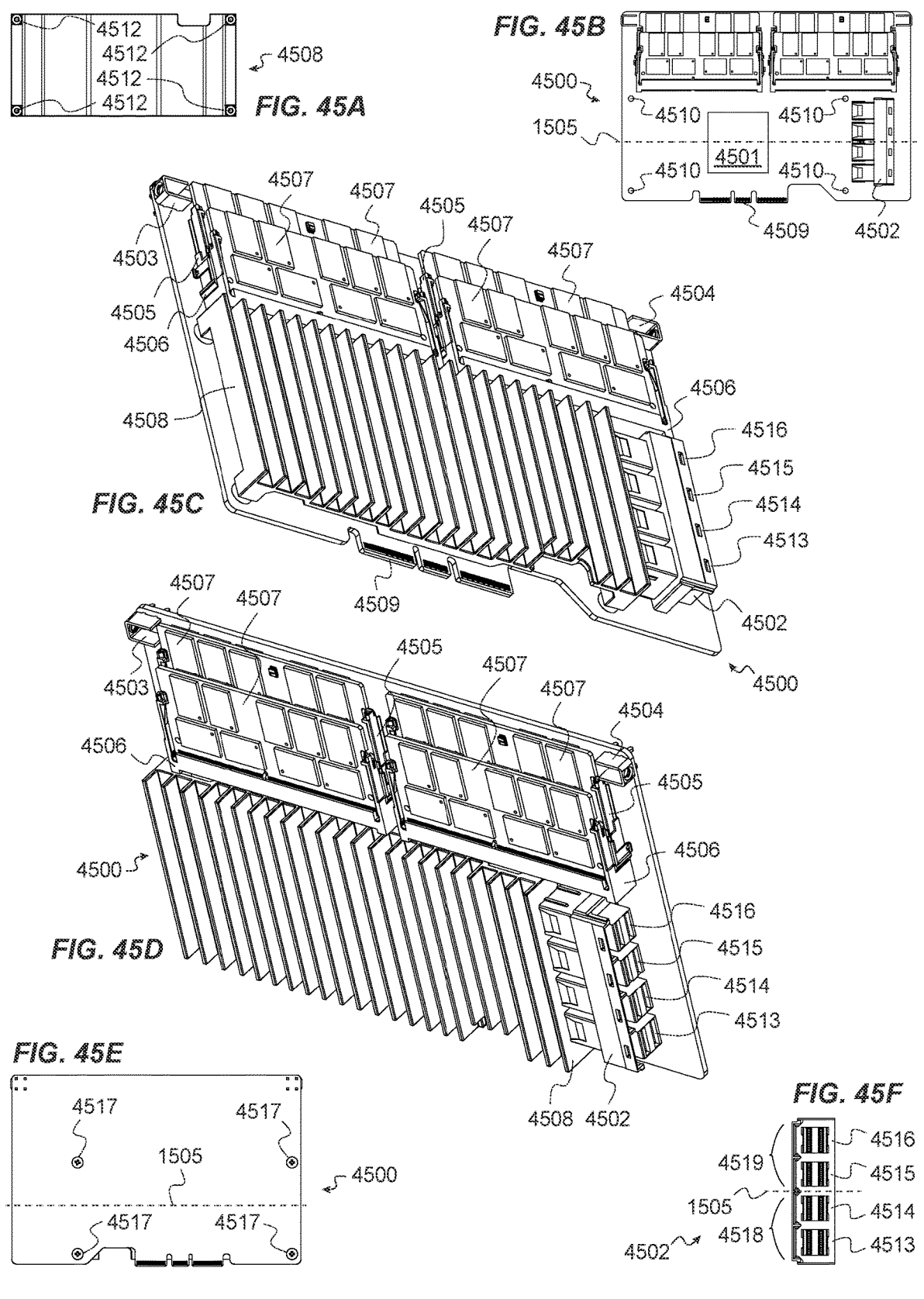
FIG. 45A illustrates an orthographic-view of a host heatsink according to an embodiment.
FIG. 45B illustrates an orthographic-view of a host adapter with a host heatsink removed and the intersection with a median plane according to an embodiment.
FIGS. 45C and 45D illustrate perspective-views of a host adapter according to an embodiment.

Illustrated in FIG. 45F is the host connector 4502 which integrates one or more (e.g. four) "individually pluggable receptacles", each named a plug receptacle 4513-4516. Where half (e.g. two) of the plug receptacles 4513 and 4514, named a left receptacle group 4518, are located on the left side 302 of the median plane 1505 and may receive one or more (e.g. two) left custom cables 10600; and the remaining half (e.g. two) of the plug receptacles 4515 and 4516, named a right receptacle group 4519, are located on the right side 303 of the median plane 1505 and may receive one or more (e.g. two) right custom cables 10700. The plug receptacles 4513-4516 enable differential signals, which encode the data read and written to each storage drive 900, to be coupled, via left 10600 and right 10700 custom cables, between the host adapters 4500 and the left 812 and right 813 backplanes. Further, the host connector 4502 may be positioned, via purposeful positioning of the host adapter 4500, such that said connector 4502 is equally bisected by the median plane 1505 (said bisection is depicted in FIGS. 45B and 45F). This equal bisection of the host connector 4502 by the median plane 1505 results in the left receptacle group 4518 being bilaterally symmetrical about said plane 1505 to the right receptacle group 4519.

In alternative embodiments (not shown in figures), the host connector 4502 with four plug receptacles 4513-4516 is replaced with either two dual receptacle connectors (e.g. MOLEX 76867-1012) or four single receptacle connectors (e.g. MOLEX 76867-1011), however said replacements are less space efficient and thus may increase the printed circuit board dimensions and thus cost of the host adapters 4500.

The term "host adapter", as in host adapter 4500, is defined herein as both the hardware and software which bidirectionally adapts one or more interfaces/protocols (e.g. SATA and/or DDR type SDRAM) into an interface/protocol (e.g. PCIe) supported by the system board 4800.

Illustrated in FIGS. 45B-45E is the storage server's 100 host adapter 4500, which may implement multiple functions (e.g. PCIe Multi-Function Endpoint). In an embodiment, one such function may implement a "volatile RAM drive" which is named a RAM drive 10808 and a second such function may implement an "HBA (Host Bus Adapter) card", which is named an HBA device 10807. For the host adapter 4500 to function as the RAM drive 10808 a "kernel-mode device driver" which is named a RAM device driver 10805; and for the host adapter 4500 to function as the HBA device 10807 a "kernel-mode device driver" which is named a HBA device driver 10804. Also, the host controller 4501, when utilizing an FPGA, may be loaded either statically or with dynamic partial reconfiguration to instantiate both the RAM drive 10808 and the HBA device 10807 concurrently, thus enabling both the host adapter 4500 and said controller 4501 to benefit from a single-chip solution.

The term "HBA device", as in HBA device 10807, is defined herein as both hardware (i.e. host adapter 4500) and software (i.e. HBA device driver 10804) which bidirectionally adapts a specific storage interface/protocol (e.g. SATA) into another host bus interface/protocol (e.g. PCIe) which is supported by the host system (i.e. system board 4800).

Illustrated in FIGS. 45B-45E is the storage server's 100 host adapter 4500 which utilizes memory modules 4507 as the storage medium when functioning as the RAM drive 10808. This may be comparable to how certain storage drives 900 (e.g. SSD) may utilize flash memory as the storage medium, but with volatility being a notable difference between the storage mediums (i.e. flash memory and memory modules 4507) being compared. To wit, the memory module 4507 is typically "volatile" while flash memory is typically "non-volatile". Herein, "volatile storage media" is defined as a type of storage media which loses the contents (i.e. data) of said media when power to said media is removed, while "non-volatile storage media" is defined as a type of storage media which retains the contents (i.e. data) of said media when power to said media is removed. Therefore, "volatile storage" is storage which utilizes volatile storage media, while "non-volatile storage" is storage which utilizes non-volatile storage media. For completeness, herein the storage drive 900 is also non-volatile storage.

Illustrated in FIGS. 45B-45E is the storage server's 100 host adapter 4500 which utilizes storage drives 900 as the storage medium when functioning as the HBA device 10807. The storage drives 900 may be connected to the HBA device 10807 via the following: backplanes 812 and 813, left 1311 and right 1411 connector groups, custom cables 10600 and 10700, and the host connectors 4502. Notable, is the HBA device 10807 (as defined herein) does not utilize the host adapter's 4500 memory modules 4507 and thus will differ from certain SCSI, SAS, and/or SATA "HBA cards" (a.k.a. SCSI, SAS, and/or SATA host bus adapters) which do use various types and forms of on-board DDR type SDRAM as a read cache and/or as a write cache when paired with a proper BBU (Battery Backup Unit).

Figures 46A, 46B, 46C, 46D, 46E:
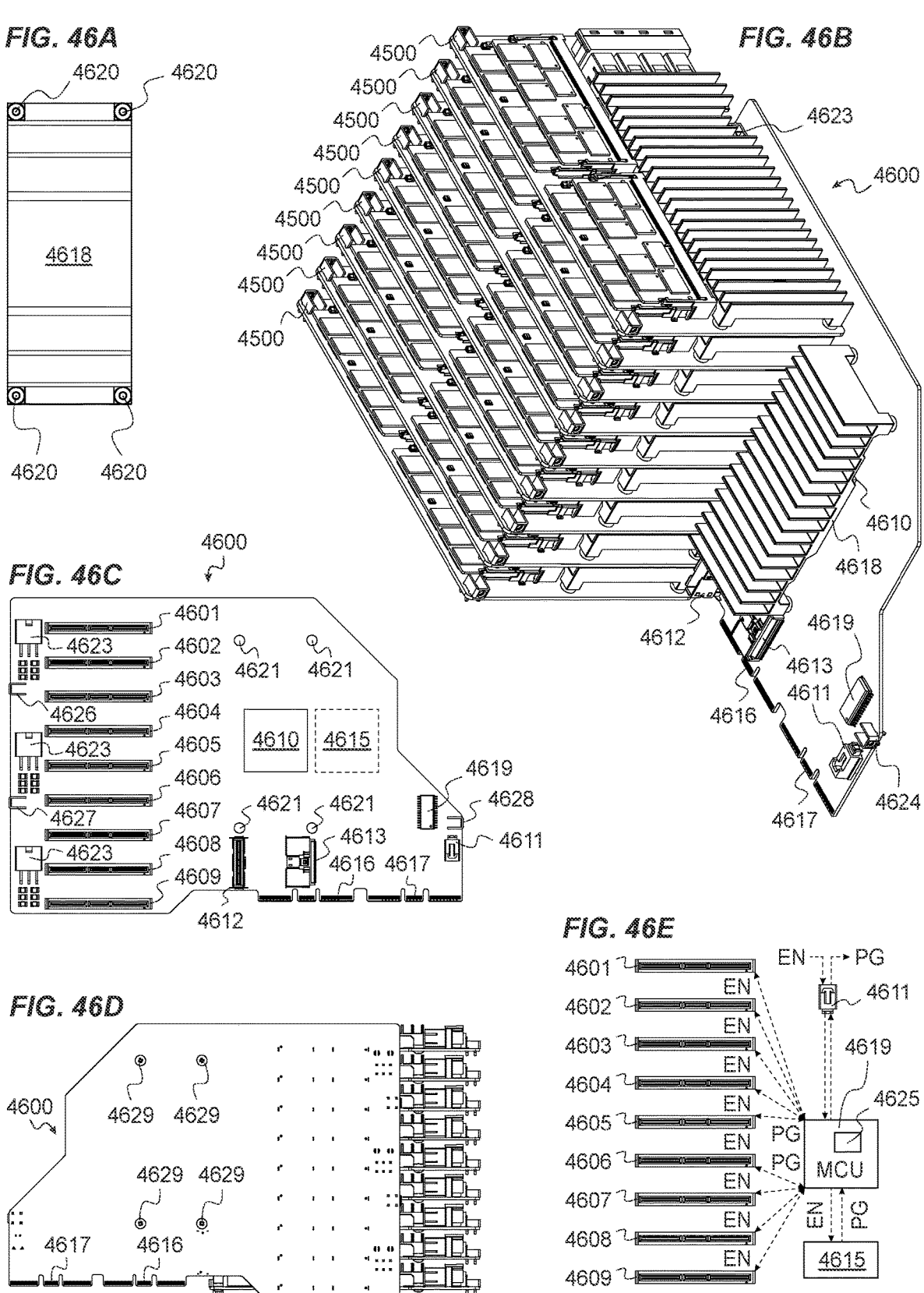

Illustrated in FIGS. 46B and 46D is the storage server's 100 "fanout switch backplane", named a host backplane 4600, which is populated with one or more (e.g. nine) host adapters 4500. In addition to the installed host adapters 4500, the host backplane 4600 may contain: a "PCIe switch" (e.g. PM8536) which is named a host switch 4610, a "point-of-load converter" for said switch 4610 which is named a switch converter 4615, one or more (e.g. nine) "PCIe connections" where each is named a switch connection 4601-4609 (e.g. TE 2327677 or MOLEX 87715-9206), one or more (e.g. two) "card edge connectors" where each is named a switch coupler 4616 and 4617, a "microcontroller" which is named a sequence controller 4619 (e.g. PIC18LF26K22), a "2-pin header" named an adapter header 4611 (e.g. MOLEX 70555-0071), one or more (e.g. three) "4-40 screw terminals" (e.g. KEYSTONE 7774) where each is named a screw terminal 4626-4628, a "heatsink" for said switch 4610 which is named a switch heatsink 4618, one or more (e.g. two) "SLIMSAS connectors" (e.g. TE 2292069 and TE 2291316) where each is named a cache connector 4612 and 4613, one or more (e.g. three) "6-pin dual-row connectors" each named a backplane connector 4623 (e.g. MOLEX 50362462), and one or more (e.g. four) non-plated holes 4621. One or more (e.g. four) truss head screws 4629 (e.g. 4-40 thread), via such holes 4621, may be utilized to attach the switch heatsink 4618, via one or more (e.g. four) threaded blind holes 4620 which are integral to said heatsink 4618 (shown in FIG. 46A), to the backplane's 4600 printed circuit board. Also, the switch connections 4601-4609 may each be enumerated (by the system board's 4800 BIOS and/or operating system 10803) and then memory mapped within the address space of said board's 4800 host processor 4806. This unique memory mapped address which may be allocated for each host adapter 4500 installed to the switch connection 4601-4609 may be utilized by an operating system's 10803 device drivers. For example, the HBA device driver 10804 for the HBA device 10807, the RAM device driver 10805 for the RAM drive 10808, and a "device driver" for a NVRAM drive 10809 which is named a NVRAM device driver 10806. Further, these uniquely memory mapped switch connections 4601-4609 may enable the one host adapter 4500 assigned to each said connection 4601-4609 to access (e.g. read and write) each and every of the remaining host adapters 4500 (assigned to the remaining said connections 4601-4609) directly without requiring involvement by the host processor 4806. This direct memory access between host adapters 4500 utilizing the switch connections 4601-4609 may be beneficial to the latency and throughput of such accesses and thereby improve the performance of the storage server 100. This unique identification of each switch connection 4601-4609 may also enable an end-user (or technician) to locate (e.g. via a pictorially representative web based interface) and then to physically replace host adapters 4500 which have failed.

The host switch 4610, of the host backplane 4600, may have ninety-six (or more) PCIe lanes. These lanes may be configured such that seventy-two of said lanes may be used by nine host adapters 4500, as each host adapter 4500 may use eight lanes, and the remaining lanes twenty-four (or more) may be used to connect to the system board's 4800 host processor 4806.

In alternative embodiments (not shown in figures), the PCIe lanes of the host switch 4610 are configured such that eighty of said lanes are used by ten host adapters 4500, each host adapter 4500 using eight lanes, and the remaining sixteen (or more) lanes are then be used to connect to the system board's 4800 host processor 4806. As each host adapter 4500 may support sixteen storage drives 900, ten such adapters 4500 may support a total of one hundred sixty of said drives 900.

Illustrated in FIG. 46C is the storage server's 100 host backplane 4600 with the host adapters 4500 and switch heatsink 4618 removed to improve visibility of said backplane's 4600 various connectors. The cache connectors 4612 and 4613 may be used to connect various storage drive controllers (e.g. SATA), which may be located on the system board 4800, to storage drives 900 located in the storage server's 100 bottom section 209. Also, cache connectors 4612 and 4613 may be specifically located on the host backplane 4600 (and not the system board 4800) and may be routed via switch couplers 4616 and 4617 to desirably minimize the form factor of said board 4800. The backplane connectors 4623, which may be cabled to the power supply 213, may supply an input voltage (e.g. 12V) to the switch converter 4615 which may then be stepped down by said converter 4615 to various output voltages (e.g. 1.8V and 0.92V) which may in turn be used to power the host switch 4610. The host switch 4610 (e.g. PM40100 and PM50100) may support not only current but future PCIe iterations. Also, the backplane connectors 4623 may provide the power supply 213 voltage rail (e.g. 12V) to switch connections 4601-4609, which may then supply said voltage, as an input voltage, to switching regulators that may be located on-board each host adapter 4500 and which may provide "enable" and "power good" pins. The dashed rectangle in FIG. 46C indicates the switch converter 4615, but may also depict the approximate placement of said converter 4615 and ancillary components such as: an inductor, input capacitors, and output capacitors. The switch converter 4615 may also provide both "enable" and "power good" pins, said pins may be used to sequence said converter 4615 during power-up.

In an embodiment, the backplane connectors 4623, which may be cabled to an ATX12VO (12V Only) Rev2.0 based power supply 213 and not an ATX Version 3.0, may only provide 12V and GND with any other PCIe type voltage (e.g. 3.3V) generated (i.e. stepped down from 12V) utilizing additional DC-DC switching regulators located on the host backplane 4600.

In alternative embodiments (not shown in figures), various voltages used by certain components (e.g. memory modules 4507) of the host adapter 4500 are generated on-board the host backplane 4600 and then supplied to all said adapters 4500 via the switch connections 4601-4609.

Illustrated in FIG. 46E are the host backplane's 4600 two power-up sequencing procedures, named a storage control sequencing subprocedure 10919 (see FIG. 112) and the adapter sequencing subprocedure (see FIG. 115). Both of these subprocedures may use the host backplane's 4600 sequence controller 4619 for execution. In an embodiment, the storage control sequencing subprocedure 10919 may be started with an activated signal (e.g. pulled high) transmitted from the storage server's 100 control board 6400 and received (via the adapter header 4611) by the host backplane's 4600 sequence controller 4619. The sequence controller 4619 may have a "non-volatile variable", named a bad adapter count 4625, which may track (i.e. count) the number of host adapters 4500 which fail to power-up properly because of a failure of one or more voltage regulators (e.g. linear or switching) which may be utilized by said adapter 4500 to operate within specification. Following the sequence controller 4619 receiving this enable signal via the adapter header 4611, said controller 4619 will clear (i.e. zero) bad adapter count 4625 and then proceed to transmit power enable signals (i.e. EN), one transmission at a time, to each host adapter 4500 of the host backplane 4600. With each host adapter 4500 enablement one or more voltage regulators, of said adapter 4500, are in turn enabled which leads to one of two outcomes: firstly, these regulators pass internal self-tests and stabilize output which results in said adapter 4500 transmitting a power good signal (i.e. PG) back to the sequence controller 4619; or secondly, these voltage regulators do not stabilize and the power good signal is not transmitted. For each enable signal transmitted by the sequence controller 4619, via the switch connection 4601-4609, a fault timer is started which will timeout if the corresponding power good signal is not received within a prescribed time period of said enable's transmission. Timeouts which originate from host adapter 4500 enablement will increment the bad adapter count 4625 variable. Once bad adapter count 4625 reflects enablement of all host adapters 4500, this count is compared to an allowed number of host adapter 4500 failures. If bad adapter count 4625 is less than or equal to this number then the sequence controller 4619 transmits an enable signal to the switch converter 4615, if said converter 4615 passes the internal self-test and stabilizes voltage output then said converter 4615 will transmit a power good signal back to the sequence controller 4619 which in turn triggers the sequence controller's 4619 power good signal back to the control board 6400 thereby ending the storage control sequencing subprocedure 10919; alternately if said converter 4615 fails the internal self-test or doesn't stabilize voltage output then the sequence controller 4619 will timeout which in turn triggers the control board 6400 to timeout thus ending the storage control sequencing subprocedure 10919. Conversely, if bad adapter count 4625 is greater than the allowed number of host adapter 4500 failures then the sequence controller 4619 initiates an endless loop which will in turn trigger the control board 6400 to timeout thus ending the storage control sequencing subprocedure 10919. The host backplane's 4600 adapter sequencing subprocedure may beneficially constrain inrush current by powering up each host adapter 4500 individually during the storage server's 100 power-on procedure.

Figure 47A:
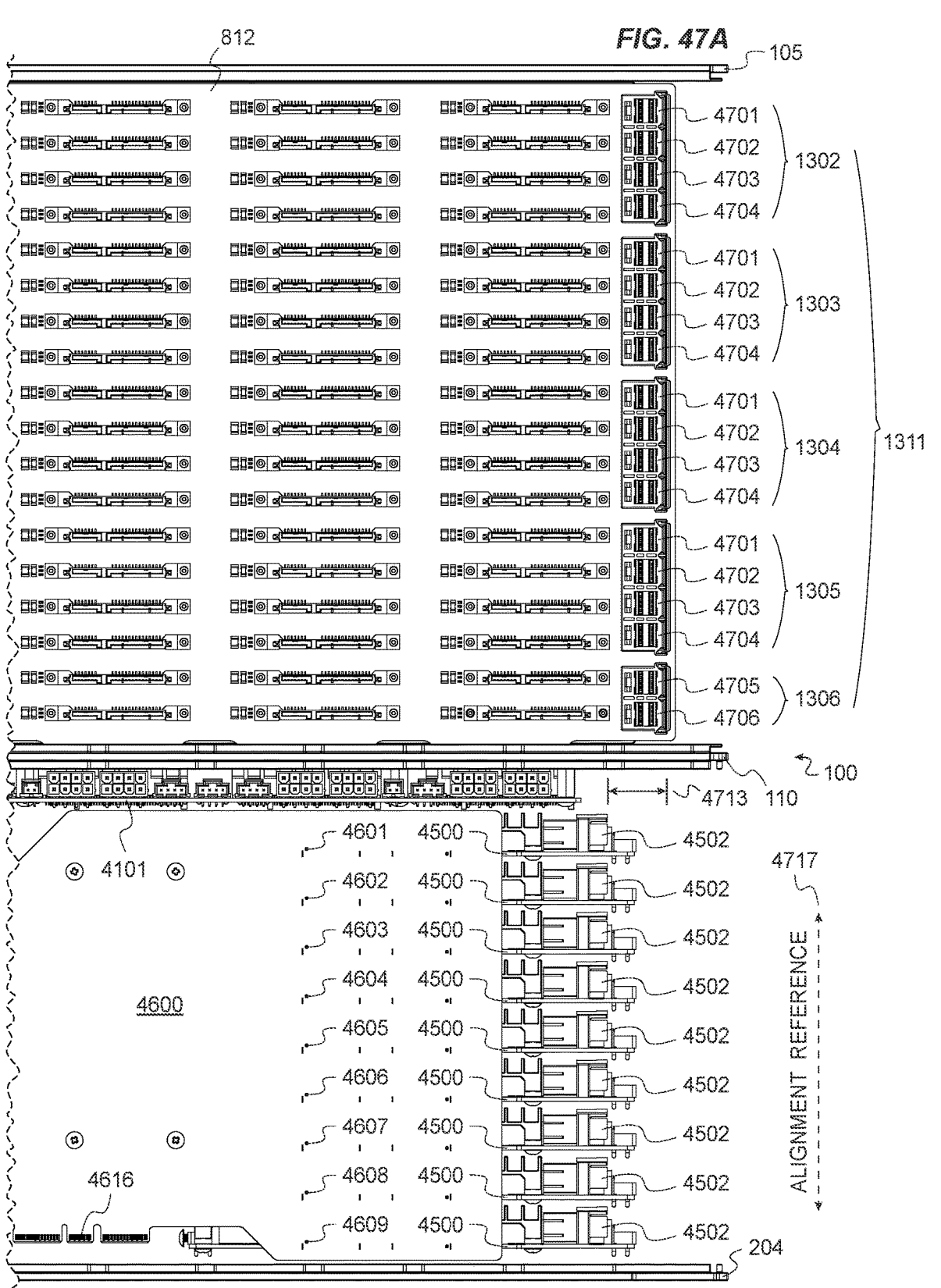

Illustrated in FIG. 47A is a partial-view of the storage server 100 with particular components visible, such as: the top panel 105, middle panel 110, bottom panel 204, backing plate 901, left 812 and right 813 backplanes, power board 4101, and the host backplane 4600. Notable are the placements of the host adapters 4500 which are purposefully positioned so that the host connectors 4502 are not directly under (when viewed from the left side 302) either the left connector group 1311 or right connector group 1411, but have a "setback distance", named a host setback 4713, towards the storage server's 100 back face 301. The host setback 4713 of the host connectors 4502 may create clearance for the plugs (i.e. ends) of the custom cables 10600 and 10700 which install into said connector's 4502 plug receptacles 4513-4516 while also creating clearance for the custom cable's 10600 and 10700 bend radius which may exist to provide for the ninety degree turn prior to entering the middle panel's 110 corresponding left cutout 530 or right cutout 531. Thus, the host connector's 4502 host setback 4713 may beneficially minimize the lengths of the left 10600 and right 10700 custom cables.

Also, illustrated in FIG. 47A is a partial-view which depicts the left connector group 1311. The left connector group 1311 may be comprised of one or more (e.g. two) connector types: a first "quad connector type" is named a left quad connector 1302-1305 (e.g. MOLEX 170729-0004) as each said connector 1302-1305 includes four plug receptacles 4701-4704; and a second "dual connector type" is named a left dual connector 1306 (e.g. MOLEX 170729-0002) as said connector 1306 includes two plug receptacles 4705 and 4706. Thereby, each left quad connector 1302-1305 may have a total of four left custom cables 10600 plugged into said connector's 1302-1305 plug receptacles 4701-4704; and the left dual connector 1306 may have a total of two left custom cables 10600 plugged into said connector's 1306 plug receptacles 4705 and 4706.

Figure 47B:
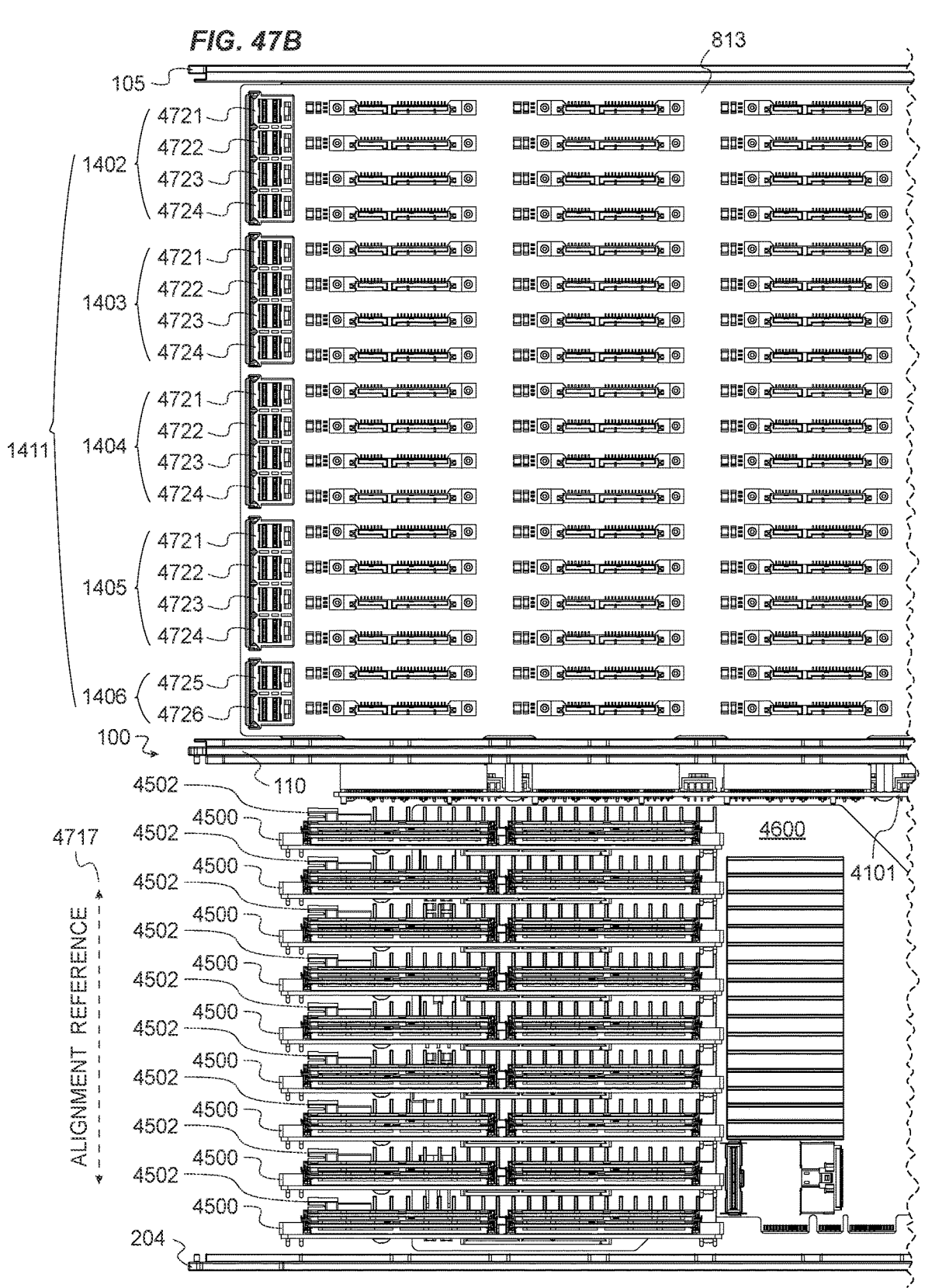

Illustrated in FIG. 47B is a partial-view of the storage server 100 with particular components visible, such as: the top panel 105, middle panel 110, bottom panel 204, backing plate 901, left 812 and right 813 backplanes, power board 4101, and the host backplane 4600. Also illustrated is a partial-view which depicts the right connector group 1411. The right connector group 1411 may be comprised of one or more (e.g. two) connector types: a first "quad connector type" is named a right quad connector 1402-1405 (e.g. MOLEX 170729-0004) as each said connector 1402-1405 includes four plug receptacles 4721-4724; and a second "dual connector type" is named a right dual connector 1406 (e.g. MOLEX 170729-0002) as said connector 1406 includes two plug receptacles 4725 and 4726. Thereby, each right quad connector 1402-1405 may have a total of four right custom cables 10700 plugged into said connector's 1402-1405 plug receptacles 4721-4724; and the right dual connector 1406 may have a total of two right custom cables 10700 plugged into said connector's 1406 plug receptacles 4725 and 4726.

In certain embodiments, the plug receptacles 4513-4516, 4701-4706, and 4721-4726 specified herein (see FIGS. 47A-47D) are depicted as an integration of four said receptacles 4513-4516, 4701-4704, and 4721-4724 or two said receptacles 4705, 4706, 4725, and 4726 and are of various orientations (e.g. vertical or right-angle), but the inventive aspects of this disclosure apply to various instantiations of said receptacles 4513-4516, 4701-4706, and 4721-4726 which may include variations of specific connectors 1302-1306, 1402-1406, and 4502 and/or various alternative cable plug assemblies and technologies (e.g. SFF-8654, A.K.A. SLIMSAS).

In alternative embodiments (not shown in figures), each vertically oriented left quad connector 1302-1305 or right quad connector 1402-1405 could be replaced with, but is not limited to, the following: one quad right-angle modular connector (e.g. MOLEX 76867-1013), two dual right-angle modular connectors (e.g. MOLEX 76867-1012), two dual vertical modular connectors (e.g. MOLEX 170729-0002), four single right-angle modular connectors (e.g. MOLEX 76867-1011), or four single vertical modular connectors (e.g. MOLEX 170729-0005); similarly, each vertically oriented left dual connector 1306 or right dual connector 1406 could be replaced with, but is not limited to, the following: one dual right-angle modular connector (e.g. MOLEX 76867-1012), two single right-angle modular connectors (e.g. MOLEX 76867-1011), or two single vertical modular connectors (e.g. MOLEX 170729-0005). However, these various replacements are typically less space efficient and thereby increase the printed circuit board dimensions on which said replacements are populated. The increased printed circuit board dimensions typically result in decreased manufacturability (i.e. printed circuit board panelization) of the left 812 and right 813 backplanes.

Figure 47C:
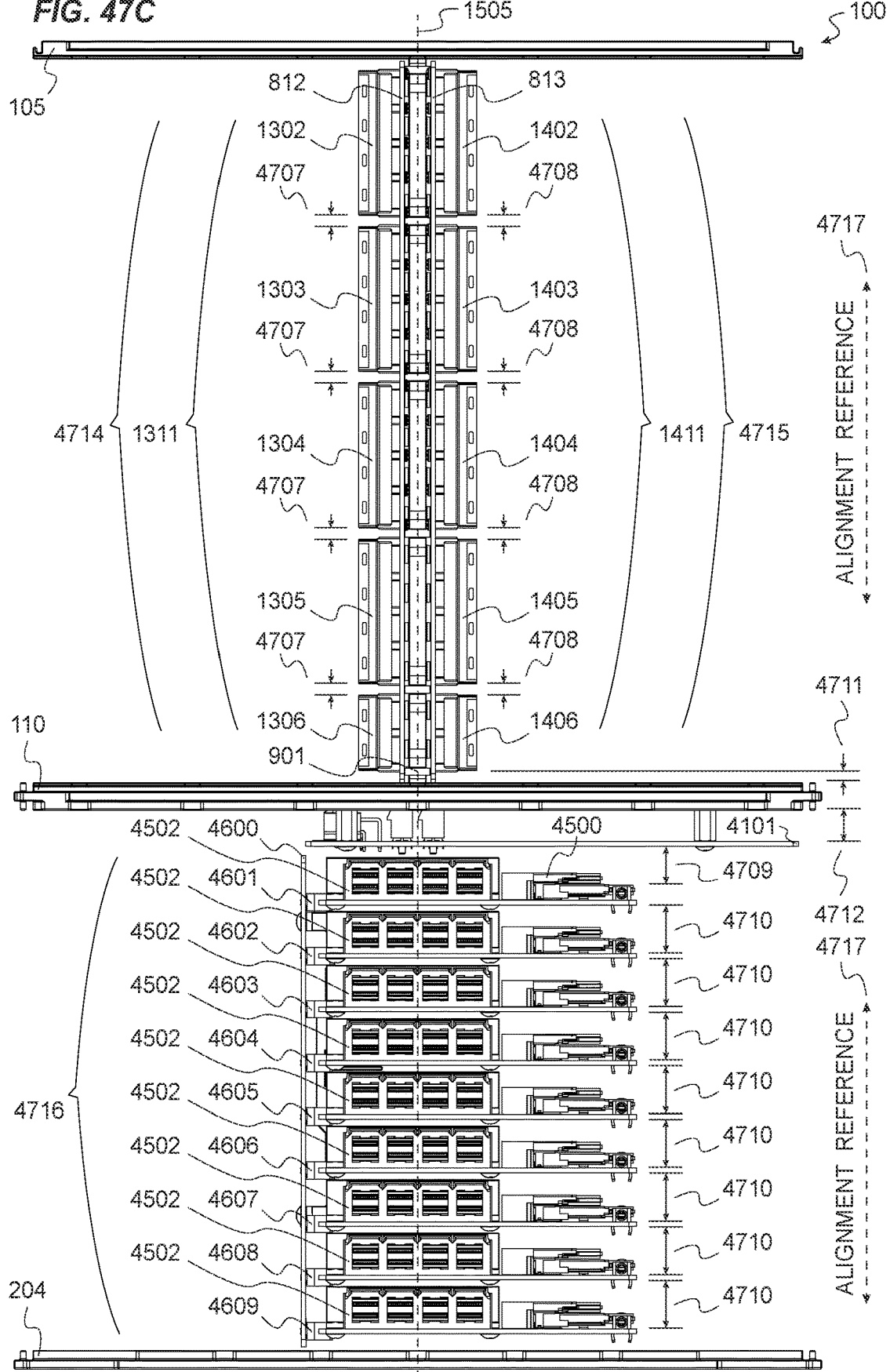

Illustrated in FIG. 47C is the storage server 100 with particular components made visible, such as: the top panel 105, middle panel 110, bottom panel 204, backing plate 901, left 812 and right 813 backplanes, power board 4101, and the host backplane 4600 which includes nine host adapters 4500. The host backplane 4600 may include nine switch connections 4601-4609, and each of said connections 4601-4609 may have an installed host adapter 4500. These nine host adapters 4500 may be physically positioned and aligned, relative to each other, in a "vertically stacked orientation" which is named a host vertical stacking 4716. Further, the host vertical stacking 4716 defines the nine host adapters 4500 as being sequentially ordered starting with the host adapter 4500 installed into switch connection 4601 and ending with the host adapter 4500 installed into switch connection 4609, with each successive host adapter 4500 positioned beneath the preceding host adapter 4500. Also, each host adapter 4500 may be populated with one or more (e.g. one) host connectors 4502. Further, the host backplane 4600 may operate as an extension of the system board 4800 via various packet protocols (e.g. PCIe versions 3.0/4.0/5.0). The host backplane 4600 may be installed into the system board 4800, via the switch couplers 4616 and 4617, and as a consequence of said installation may be oriented perpendicular or substantially perpendicular (see FIG. 49B) to said board 4800. The host backplane's 4600 perpendicular positioning, relative to the system board 4800, may result in the perpendicular or substantially perpendicular positioning of installed host adapters 4500 to both the left 812 and right 813 backplanes. This host adapter 4500 to backplane 812 and 813 orientation may result in a positioning of the host connectors 4502 which may be optimum relative to the positioning of the left connector group 1311 and right connector group 1411. The centeredness (herein defined as the state of being centered) or the substantially centeredness between the host connectors 4502 and the backing plate's 901 median plane 1505 may beneficially minimize the length of the left custom cables 10600 and right custom cables 10700 used to connect the host adapters 4500 to the left 812 and right 813 backplanes respectively. Herein, the term "aligned" shall be defined as "to place or arrange (elements) in a straight line".

Herein, the terms "substantially centeredness" shall incorporate expected tolerances and inherent variations resulting from both the storage server's 100 fabrication and assembly. This fabrication may include not only the tolerances resulting from milling the storage server's 100 various aluminum components (e.g. bottom plate 204), but also the tolerances resulting from fabricating said server's 100 various printed circuit boards (e.g. host backplane 4600). Further, such tolerances are compounded with additional tolerances resulting from populating (e.g. pick-and-place machines, surface mount reflow ovens, and through-hole wave soldering) said printed circuit boards with various connectors (e.g. switch connections 4601-4609) and components. These tolerances are additionally stacked (i.e. tolerance stacking) when such aluminum components (e.g. middle panel 110) are attached to other aluminum components (e.g. side panels 109 and 203) with various fasteners (e.g. flat head screws 9201). These tolerances may be further tolerance stacked when such aluminum components (e.g. middle panel 110) and printed circuit boards (e.g. power board 4101) are assembled with various fasteners (e.g. hex standoffs 4216).

Also illustrated in FIG. 47C is the enablement of minimized custom cable 10600 and 10700 lengths when host adapters 4500, installed to switch connections 4601-4609, are purposefully positioned with both a "minimized proximity", named a power proximity 4709, to the power board 4101 and a "minimized proximity", named a host proximity 4710, between said adapters 4500. Both the power proximity 4709 and the host proximity 4710 should provide for proper component clearances. The lengths of the left custom cables 10600 may be further minimized when the left quad connectors 1302-1305 and the left dual connector 1306 (of the left connector group 1311) are purposefully positioned with a "minimized proximity", named a left proximity 4707, between said connectors 1302-1306. The lengths of the right custom cables 10700 may be further minimized when the right quad connectors 1402-1405 and the right dual connector 1406 (of the right connector group 1411) are purposefully positioned with a "minimized proximity", named a right proximity 4708, between said connectors 1402-1406. Also, custom cable 10600 and 10700 lengths may be additionally minimized when a "span distance", named a panel span 4711, between the middle panel 110 and both the left dual connector 1306 and the right dual connector 1406 is minimized; and when a "gap distance", named a panel gap 4712, between the middle panel 110 and the power board 4101 is minimized. Minimized custom cable 10600 and 10700 lengths may be beneficial as reducing said lengths may improve the signal integrity (e.g. jitter reduction) of said custom cables 10600 and 10700, which in turn may improve the data integrity of the storage server 100. Further, these minimized custom cable 10600 and 10700 lengths may provide for a reduction in the storage server's 100 box height 103, which in turn may decrease said server's 100 volume and thereby beneficially increase the data density of said server 100.

Also illustrated in FIG. 47C is that the left connector group 1311 is bilaterally symmetrical about the median plane 1505 to the right connector group 1411. The four left quad connectors 1302-1305 and the one left dual connector 1306, of the left connector group 1311, may be physically positioned and aligned, relative to each other, in a "vertically stacked orientation" which is named a left vertical stacking 4714. Further, the left vertical stacking 4714 is defined as being sequentially ordered starting with the left quad connector 1302 and then the left quad connector 1303 positioned beneath said connector 1302 and then the left quad connector 1304 positioned beneath said connector 1303 and then the left quad connector 1305 positioned beneath said connector 1304 and ending with the left dual connector 1306 positioned beneath said connector 1305. Similarly, the four right quad connectors 1402-1405 and the one right dual connector 1406, of the right connector group 1411, may be physically positioned and aligned, relative to each other, in a "vertically stacked orientation" which is named a right vertical stacking 4715. Further, the right vertical stacking 4715 is defined as being sequentially ordered starting with the right quad connector 1402 and then the right quad connector 1403 positioned beneath said connector 1402 and then the right quad connector 1404 positioned beneath said connector 1403 and then the right quad connector 1405 positioned beneath said connector 1404 and ending with the right dual connector 1406 positioned beneath said connector 1405.

Also illustrated in FIG. 47C is the left connector group 1311 which is aligned via the left vertical stacking 4714 and is comprised of the left quad 1302-1305 and left dual 1306 connectors and these connectors 1302-1306 are comprised of plug receptacles 4701-4706, thus said receptacles 4701-4706 are physically positioned and aligned, relative to each other, in a vertically stacked orientation. In an embodiment, the sequentially ordered plug receptacles 4701-4704 of each left quad connector 1302-1305 may be positioned as such: starting with plug receptacle 4701 and then the plug receptacle 4702 positioned beneath said receptacle 4701 and then the plug receptacle 4703 positioned beneath said receptacle 4702 and then ending with the plug receptacle 4704 positioned beneath said receptacle 4703; and the sequentially ordered plug receptacles 4705 and 4706 of the left dual connector 1306 may be positioned as such: starting with plug receptacle 4705 and then ending with the plug receptacle 4706 positioned beneath said receptacle 4705.

Also illustrated in FIG. 47C is the right connector group 1411 which is aligned via the right vertical stacking 4715 and is comprised of the right quad 1402-1405 and right dual 1406 connectors and these connectors 1402-1406 are comprised of plug receptacles 4721-4726, thus said receptacles 4721-4726 are physically positioned and aligned, relative to each other, in a vertically stacked orientation. This alignment, per the three vertical stackings 4714-4716, may be parallel or substantially parallel to a "geometrical line", named an alignment reference 4717 (see FIGS. 47A-47C), which may be parallel or substantially parallel to the median plane 1505, as said reference 4717 neither lies in nor intersects said plane 1505. In an embodiment, the sequentially ordered plug receptacles 4721-4724 of each right quad connector 1402-1405 may be positioned as such: starting with plug receptacle 4721 and then the plug receptacle 4722 positioned beneath said receptacle 4721 and then the plug receptacle 4723 positioned beneath said receptacle 4722 and then ending with the plug receptacle 4724 positioned beneath said receptacle 4723; and the sequentially ordered plug receptacles 4725 and 4726 of the right dual connector 1406 may be positioned as such: starting with plug receptacle 4725 and then ending with the plug receptacle 4726 positioned beneath said receptacle 4725. The connectors 1402-1406 of the right connector group 1411 are rotated 180 degrees relative to the connectors 1302-1306 of the left connector group 1311, said rotation enables the bilateral symmetry about the median plane 1505 between the left 1311 and right 1411 connector groups.

In alternative embodiments (not shown in figures), the orientation of the vertical stackings 4714-4716 may be rotated by various degrees of rotation (e.g. 90, 180, and 270 degrees) where a complete rotation is defined as 360 degrees.

Figure 47D:
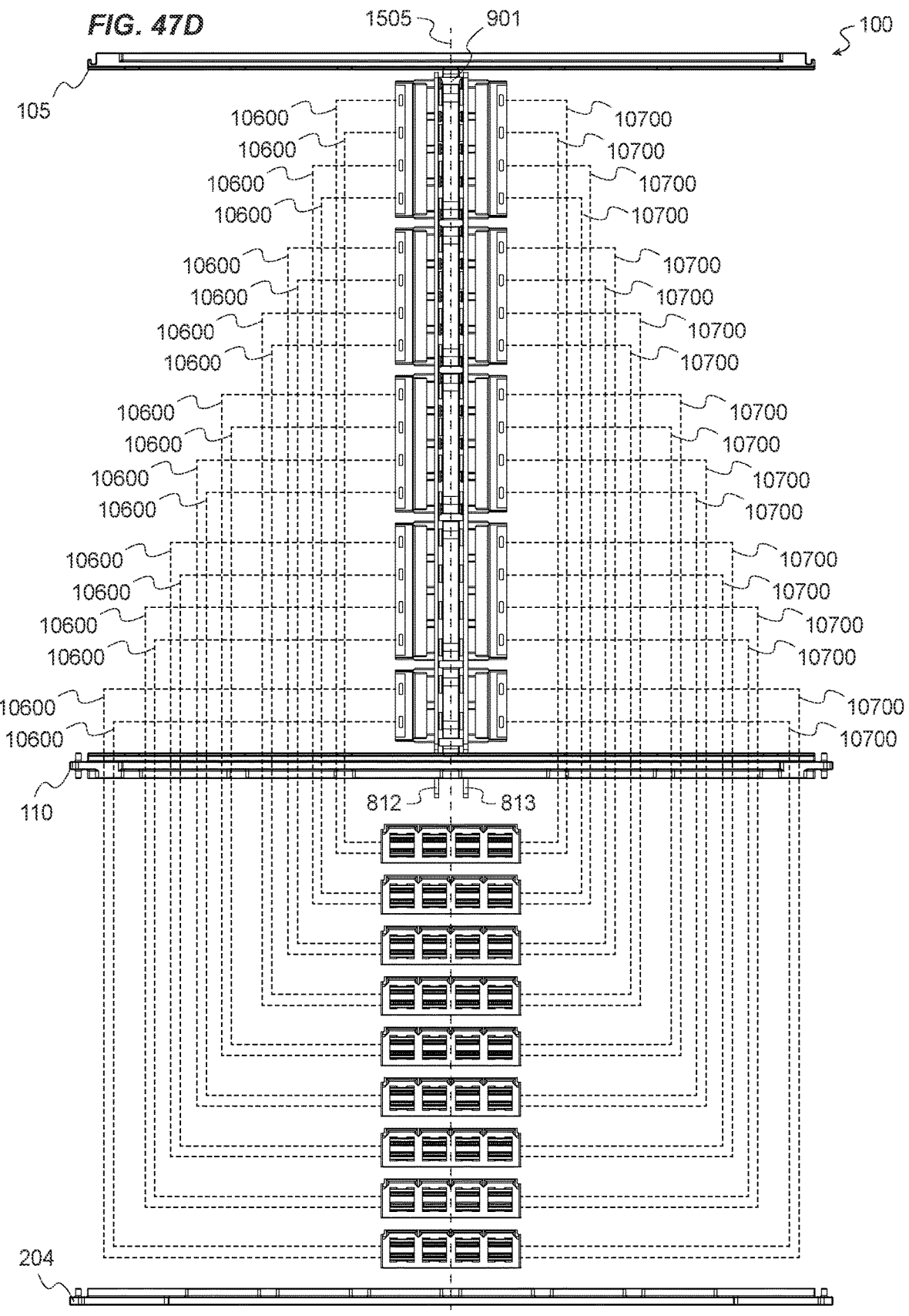

Illustrated in FIG. 47D is the storage server 100 with particular components made visible, such as: the top panel 105, middle panel 110, bottom panel 204, backing plate 901, left 812 and right 813 backplanes, eighteen left custom cables 10600 (indicated with dashed lines), eighteen right custom cables 10700 (indicated with dashed lines), and nine host connectors 4502. Although not indicated via the thirty-six dashed lines, the eighteen left custom cables 10600 pass through the middle panel 110 via the left cutout 530, and the eighteen right custom cables 10700 pass through the middle panel 110 via the right cutout 531. The left 1311 and right 1411 connector groups located in the top section 208 of the storage server 100 may be connected, via one or more (e.g. eighteen) left custom cables 10600 and one or more (e.g. eighteen) right custom cables 10700, to corresponding host connectors 4502 located in the bottom section 209 of said server 100. To wit, the left backplane's 812 connections may include: the left quad connector's 1302 plug receptacles 4701 and 4702 may connect via two left custom cables 10600 to the host connector's 4502 plug receptacles 4513 and 4514 located by the switch connection 4601 respectively, the left quad connector's 1302 plug receptacles 4703 and 4704 may connect via two left custom cables 10600 to the host connector's 4502 plug receptacles 4513 and 4514 located by the switch connection 4602 respectively, the left quad connector's 1303 plug receptacles 4701 and 4702 may connect via two left custom cables 10600 to the host connector's 4502 plug receptacles 4513 and 4514 located by the switch connection 4603 respectively, the left quad connector's 1303 plug receptacles 4703 and 4704 may connect via two left custom cables 10600 to the host connector's 4502 plug receptacles 4513 and 4514 located by the switch connection 4604 respectively, the left quad connector's 1304 plug receptacles 4701 and 4702 may connect via two left custom cables 10600 to the host connector's 4502 plug receptacles 4513 and 4514 located by the switch connection 4605 respectively, the left quad connector's 1304 plug receptacles 4703 and 4704 may connect via two left custom cables 10600 to the host connector's 4502 plug receptacles 4513 and 4514 located by the switch connection 4606 respectively, the left quad connector's 1305 plug receptacles 4701 and 4702 may connect via two left custom cables 10600 to the host connector's 4502 plug receptacles 4513 and 4514 located by the switch connection 4607 respectively, the left quad connector's 1305 plug receptacles 4703 and 4704 may connect via two left custom cables 10600 to the host connector's 4502 plug receptacles 4513 and 4514 located by the switch connection 4608 respectively, and the left dual connector's 1306 plug receptacles 4705 and 4706 may connect via two left custom cables 10600 to the host connector's 4502 plug receptacles 4513 and 4514 located by the switch connection 4609 respectively. To wit, the right backplane's 813 connections may include: the right quad connector's 1402 plug receptacles 4721 and 4722 may connect via two right custom cables 10700 to the host connector's 4502 plug receptacles 4516 and 4515 located by the switch connection 4601 respectively, the right quad connector's 1402 plug receptacles 4723 and 4724 may connect via two right custom cables 10700 to the host connector's 4502 plug receptacles 4516 and 4515 located by the switch connection 4602 respectively, the right quad connector's 1403 plug receptacles 4721 and 4722 may connect via two right custom cables 10700 to the host connector's 4502 plug receptacles 4516 and 4515 located by the switch connection 4603 respectively, the right quad connector's 1403 plug receptacles 4723 and 4724 may connect via two right custom cables 10700 to the host connector's 4502 plug receptacles 4516 and 4515 located by the switch connection 4604 respectively, the right quad connector's 1404 plug receptacles 4721 and 4722 may connect via two right custom cables 10700 to the host connector's 4502 plug receptacles 4516 and 4515 located by the switch connection 4605 respectively, the right quad connector's 1404 plug receptacles 4723 and 4724 may connect via two right custom cables 10700 to the host connector's 4502 plug receptacles 4516 and 4515 located by the switch connection 4606 respectively, the right quad connector's 1405 plug receptacles 4721 and 4722 may connect via two right custom cables 10700 to the host connector's 4502 plug receptacles 4516 and 4515 located by the switch connection 4607 respectively, the right quad connector's 1405 plug receptacles 4723 and 4724 may connect via two right custom cables 10700 to the host connector's 4502 plug receptacles 4516 and 4515 located by the switch connection 4608 respectively, and the right dual connector's 1406 plug receptacles 4725 and 4726 may connect via two right custom cables 10700 to the host connector's 4502 plug receptacles 4516 and 4515 located by the switch connection 4609 respectively. The left quad connector's 1302-1305 plug receptacles 4701-4704, left dual connector's 1306 plug receptacles 4705 and 4706, and the host connector's 4502 plug receptacles 4513 and 4514 may be purposefully positioned about the median plane 1505 to result in a minimized length of the left custom cables 10600. The right quad connector's 1402-1405 plug receptacles 4721-4724, right dual connector's 1406 plug receptacles 4725 and 4726, and the host connector's 4502 plug receptacles 4515 and 4516 may be purposefully positioned about the median plane 1505 to result in a minimized length of the right custom cables 10700. Although, the left 1311 and right 1411 connector groups to host connector 4502 connections, as listed herein, may be used in certain embodiments, the inventive aspects of this disclosure apply to various permutations of the plug receptacle 4701-4706 and 4721-4726 to plug receptacle 4513-4516 connections.

Figure 48A:
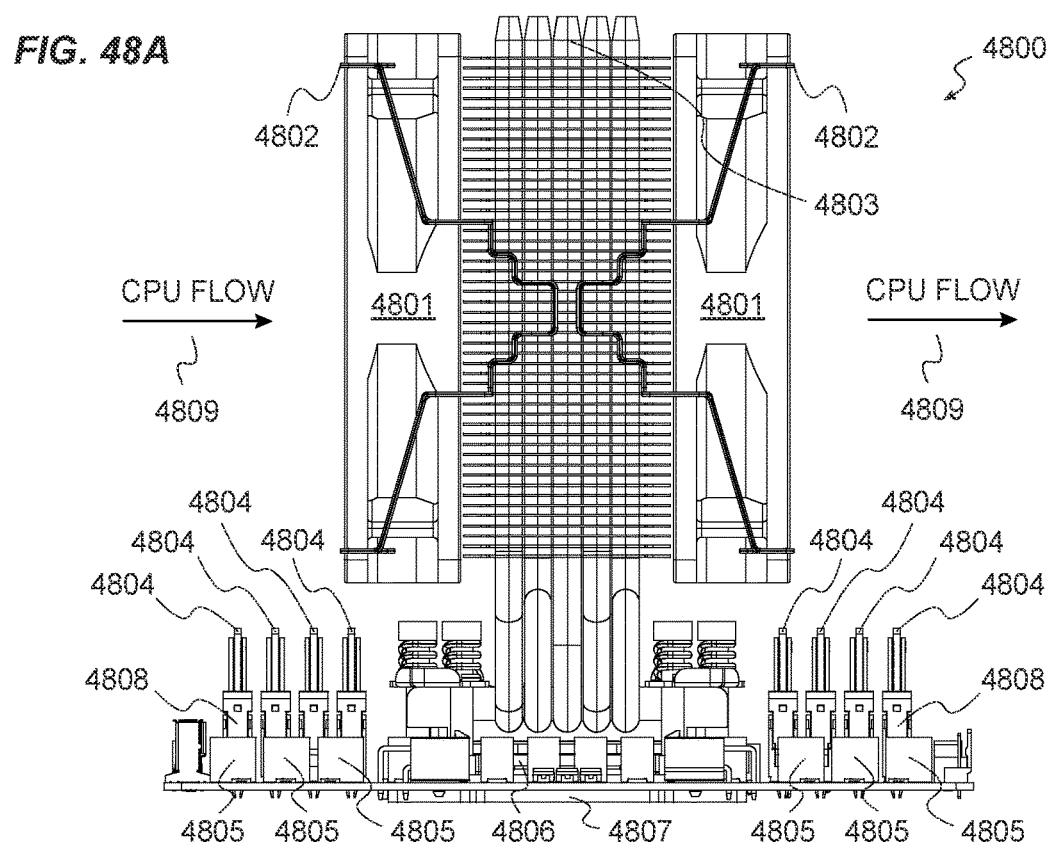
Figure 48B:
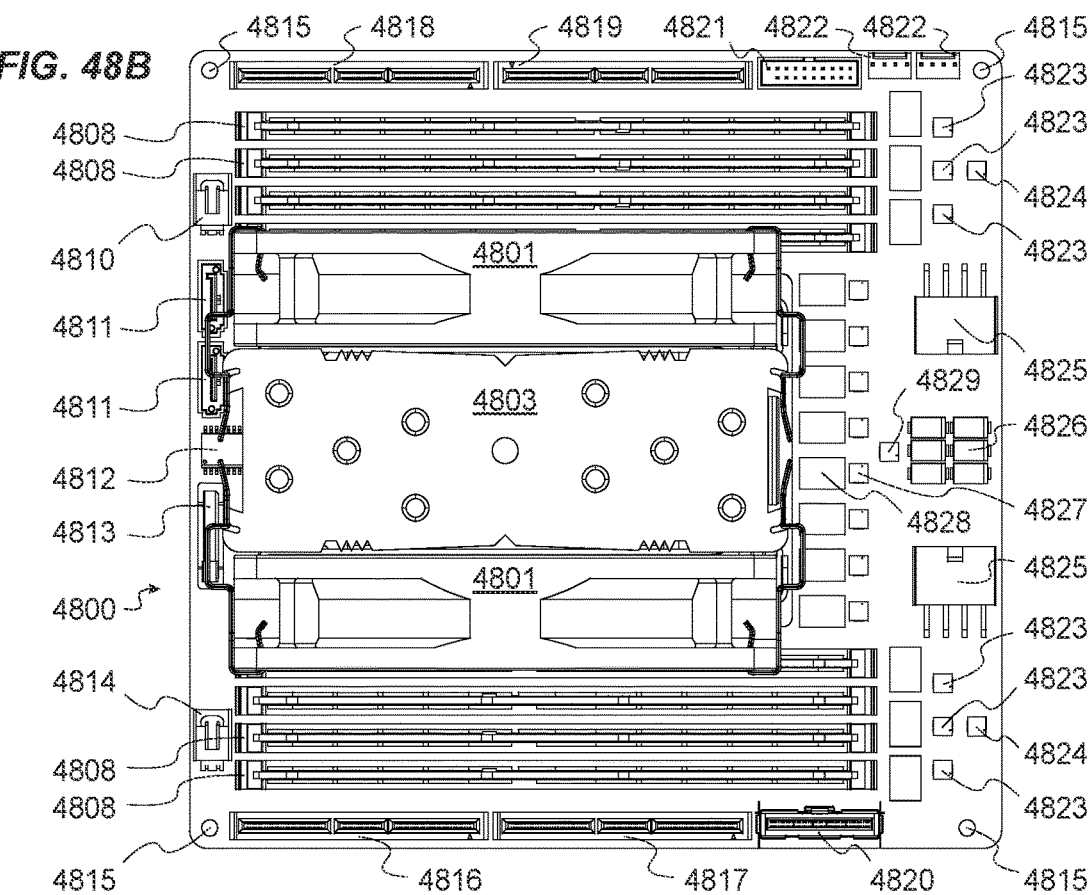

Illustrated in FIGS. 48A and 48B is the storage server's 100 system board 4800, which may include but is not limited to the following: a "CPU socket" (e.g. AMD SP3/SP6) which is named a processor socket 4807, a "CPU" (e.g. EPYC 7773X) which is named a host processor 4806, a "CPU heatsink" (e.g. NOCTUA NH-U12S) which is named a host heatpipe 4803, one or more (e.g. two) "axial fans", each named a cpu axial fan 4801 (e.g. 120 mm×120 mm×25 mm), which cool said heatpipe 4803, one or more (e.g. two) "NOCTUA mounting wire brackets" where each is named a fan bracket 4802, one or more (e.g. eight) "memory sockets" (e.g. JEDEC DDR4 socket) where each is named a host socket 4808, one or more (e.g. eight) "memory modules" (e.g. 64 GB DDR4 DIMM) where each is named a host module 4804, one or more (e.g. eight) "VRM inductors" where each is named a host inductor 4828, one or more (e.g. eight) "VRM MOSFETs" where each is named a host mosfet 4827, one or more (e.g. one) "VRM controllers" where each is named a host controller 4829, one or more (e.g. six) "input capacitors" (e.g. PANASONIC SP-CAP) where each is named a host capacitor 4826, one or more (e.g. two) "8-pin dual-row right-angle connectors" where each is named an input connector 4825 (e.g. MOLEX 39301082), one or more (e.g. six) "VRM inductors" where each is named a module inductor 4805, one or more (e.g. six) "VRM MOSFETs" where each is named a module mosfet 4823, one or more (e.g. two) "VRM controllers" where each is named a module controller 4824, one or more (e.g. four) "PCIe connectors" where each is named a backplane slot 4816-4819 (e.g. TE 2327677 or MOLEX 87715-9206), a "SLIMSAS connector" (e.g. TE 2291316) which is named an expansion connector 4820, a "USB 20-pin header" which is named a build header 4821, one or more (e.g. two) "4-pin headers" where each is named a fan header 4822, a "2-pin header" named a board header 4810 (e.g. MOLEX 70555-0071), one or more (e.g. two) "SATA connectors" where each is named a boot connector 4811 (e.g. MOLEX 0678005002), a BIOS chip 4812, a CMOS battery 4813, a "2-pin header" named a control header 4814 (e.g. MOLEX 70555-0071), and one or more (e.g. four) "plated through holes" where each is named a system hole 4815.

Illustrated in FIGS. 48A and 48B is the storage server's 100 system board 4800, which executes, via the host processor 4806, various device drivers (e.g. HBA device driver 10804, RAM device driver 10805, and NVRAM device driver 10806), the operating system 10803 (e.g. Linux or FREEBSD), the file system 10802 (e.g. ZFS or ZFS+), and several network file sharing protocols 10801. The system board 4800 may be functionally extended via the volumetrically optimized and perpendicularly inserted host backplane 4600 and a "network extension backplane" which is named a network backplane 5300. To wit, the host backplane 4600 may be installed, via switch couplers 4616 and 4617, using the backplane slots 4818 and 4819 respectively; while the network backplane 5300 may be installed, via "card edge connectors" where each is named a network coupler 5203 and 5204, using the backplane slots 4816 and 4817 respectively. Also, the input connector 4825 may supply an input voltage (e.g. 12V) to the host 4827 and module 4823 mosfets, which may then supply stepped-down voltages to power the host processor 4806 and host modules 4804. The host 4829 and module 4824 controllers may both have "enable" and "power good" pins which may be utilized by on-board circuitry for power sequencing, this sequencing may be coordinated via the board header 4810. Also, the cpu axial fans 4801 may be connected to the fan headers 4822. Such headers 4822 may be managed by the sequence controller 4619, which may be located on the host backplane 4600. Signals (e.g. PWM and TACH) carried by the headers 4822 may be routed via the backplane slots 4818 and 4819 and are both transmitted and received by the sequence controller 4619. The sequence controller 4619 may monitor and then modulate the RPM of each cpu axial fan 4801 based on temperature readings received from the host processor 4806 via the backplane slots 4818 and 4819. Also, the build header 4821 may be used, during storage server 100 assembly, to attach a keyboard and mouse so that the system board 4800 may be loaded with various software (e.g. operating system 10803). In an embodiment, the build header 4821 will not connect to the firmware port 3500, as such connection may increase the probability of malware and/or ransomware infections.

As illustrated in FIG. 48A, the "fan flow", named a cpu flow 4809, by one or more (e.g. two) of the cpu axial fans 4801 flows from the right side 303 to the left side 302 and said flow's 4809 orientation may benefit heat evacuation as said flow 4809 is primarily directed towards the intake of the power supply's 213 "axial fan" which is named a psu axial fan 8422.

As illustrated in FIG. 48B, the system board's 4800 printed circuit board has the following dimensions: 6.95 inches by 7.07 inches. These printed circuit board dimensions may be the basis for a proprietary form factor, but the inventive aspects of this disclosure apply to various printed circuit board dimensions of the system board 4800. For example, an industry standard Mini-ITX form factor (i.e. 6.70 inches by 6.70 inches) motherboard could be used in place of the system board 4800, if corresponding modifications to the storage server's 100 interior were performed.

In alternative embodiments (not shown in figures), various system board 4800 form factors are used when corresponding adaptations to the storage server 100 are performed, one such example is the ASROCK RACK ROMED4ID-2T motherboard with dimensions of 6.7 inches by 8.2 inches.

Illustrated in FIGS. 49A and 49B is the storage server 100 with particular components visible, such as: the middle panel 110, power board 4101, an installed host backplane 4600 with nine installed host adapters 4500, and the system board 4800. These particular components were chosen to depict the host backplane 4600 plugged into the system board 4800 while also depicting the host adapters 4500 plugged into said backplane 4600. The host backplane's 4600 perpendicular positioning, relative to the system board 4800, may result in the perpendicular or substantially perpendicular positioning of the host adapters 4500 to both the left 812 and right 813 backplanes. Also, the system board 4800 depicts a single installed heatsink 4901 for the host mosfets 4827 and a single installed heatsink 4902 for each of two groups of module mosfets 4823, where said heatsinks 4902 receive airflow from the back intake 215.

Herein, the terms "substantially perpendicular" and "substantially parallel" shall incorporate expected tolerances and inherent variations resulting from the storage server's 100 fabrication and assembly. This fabrication may include not only the tolerances resulting from milling the storage server's 100 various aluminum components, but also the tolerances resulting from fabricating said server's 100 various printed circuit boards (e.g. host backplane 4600 and system board 4800). Further, such tolerances are compounded when populating said printed circuit boards with various connectors and components (e.g. host adapters 4500) plugged into said connectors (e.g. switch connections 4601-4609). These tolerances are additionally stacked when such components are attached to other components with various fasteners.

Illustrated in FIGS. 50A-50C is a device with "volatile and non-volatile memories", named a NVRAM device 5000, which includes but is not limited to the following: a "FPGA" (e.g. ARRIA V GZ 5AGZEI) which is named a configure chip 5001, a "programable bitstream" which is named a storage bitstream 5016 (depicted via dashed rectangle in FIG. 50A), one or more (e.g. sixteen) "DDR type SDRAM" components (e.g. MICRON MT41K1G4) where each is named a DRAM 5002, one or more (e.g. eight) "flash memory" components (e.g. SAMSUNG K9K8G08U08) where each is named a NAND 5003, a "SLIMSAS connector" (e.g. TE 2292069) which is named a system connector 5017, a "2-pin header" which is named a chip header 5007 (e.g. MOLEX 70555-0071), a 4-pin header (e.g. MOLEX 70555-0073) which is named a backup header 5008, a "6-pin dual-row connector" named a backup connector 5006 (e.g. MOLEX 39310060), a "CNC milled heatsink" which is named a controller heatsink 5011 and thermally regulates said chip 5001, one or more (e.g. four) "plated through-holes" each named a memory hole 5010, one or more (e.g. four) "male-female hex standoffs" each named a board standoff 5014, one or more (e.g. four) truss head screws 5019, a plurality of "point-of-load converters" (depicted with dashed rectangles in FIG. 50A) where each is named a hybrid converter 5015, a "back-up power cutoff circuit" which is named a power switch 5018, one or more (e.g. four) "non-plated through-holes" each named a heatsink hole 5009, and one or more (e.g. four) truss head screws 5013. To wit, the four truss head screws 5013, via four heatsink holes 5009, may be used to attach the controller heatsink 5011, via threaded blind holes 5607, to the NVRAM device's 5000 printed circuit board. The hybrid converters 5015 may not only power the NVRAM device 5000, but may also provide "enable" and "power good" functionality. The NVRAM device 5000 may optionally include one or more (e.g. two) "SLIMSAS connectors" (e.g. TE 2292069), each named a cache connector 5004 and 5005, although said connectors 5004 and 5005 are not utilized by the storage bitstream 5016. If the cache connectors 5004 and 5005 are populated and differentially routed then the storage bitstream 5016 can be replaced "in-the-field" with a bitstream that does use said connectors 5004 and 5005.

Also illustrated in FIGS. 50A-50C, is the NVRAM device's 5000 backup connector 5006 which may supply an input voltage (e.g. 12V) to the hybrid converters 5015. The hybrid converters 5015 may supply stepped-down voltages to power on-board components which may include: the configure chip 5001, DRAM 5002, and the NAND 5003. The hybrid converters' 5015 "enable" and "power good" pins may be utilized by on-board circuitry for power sequencing, said sequencing may be started and terminated via the chip header 5007. Additionally, the NVRAM device's 5000 system connector 5017 may be attached, via cable, to the system board's 4800 expansion connector 4820.

Illustrated in FIGS. 56B and 56C is an attached "PCIe multi-function endpoint device" which is named a hybrid adapter 5600. The hybrid adapter 5600 includes equivalent hardware to the NVRAM device 5000, with the addition of one or more (e.g. two) cache connectors 5004 and 5005 which are populated and differentially routed to the configure chip 5001. The configure chip 5001 requires a "programable bitstream", named a hybrid bitstream 5601 (depicted via dashed rectangle in FIG. 56B), to operate as the hybrid adapter 5600. The hybrid adapter 5600 may implement one or more (e.g. two) PCIe endpoint functions: a "first function" is named a NVRAM drive 10809 and the second function is the HBA device 10807. For the hybrid adapter 5600 to operate as the NVRAM drive 10809 or the HBA device 10807 a kernel-mode device driver is typically utilized for each such function, i.e. the NVRAM device driver 10806 and the HBA device driver 10804 respectively. The configure chip 5001, e.g. an FPGA with sufficient logic cells, may be programed either statically or via partial reconfiguration to implement both the NVRAM drive 10809 and the HBA device 10807, thus desirably enabling the hybrid adapter 5600 to be a single-chip solution. As the hybrid adapter 5600 may have an equivalent form factor and memory hole 5010 configuration to that of the NVRAM device 5000, the storage server 100 may beneficially be configured with either said adapter 5600 or said device 5000 during assembly or via an "in-the-field" end-user upgrade.

Illustrated in FIGS. 51A-51C are three components that collectively operate as Open Compute Project (OCP) NIC 3.0 "card guide rails", a "top guide rail" is named a top guide slide 5101, a "middle guide rail" is named a middle guide slide 5102, and a "bottom guide rail" is named a bottom guide slide 5103. The guide slides 5101-5103 may have attributes in common, such as the following: one or two "OCP NIC 3.0 card guides" where each is named a card guide 5110, one or more (e.g. two) "blind holes for SMT threaded insert clearance" where each is named an insert hole 5105, one or more (e.g. two) "counterbored clearance holes" where each is named a guide hole 5106, a "planar surface" which is named a guide surface 5104, and one or more (e.g. two) "clearance holes" where each is named a slider hole 5107. The top 5101 and bottom 5103 guide slides may each have a "counterbored and threaded socket head hole" named a lock hole 5108 and a "blind hole for socket head thread clearance" named a clear hole 5109. The guide slides 5101-5103 are designed in such a way as to facilitate being CNC milled from aluminum billet.

Illustrated in FIGS. 52A and 52B is a "OCP NIC 3.0 backplane" which is named a backplane board 5200. The backplane board 5200 may transport various protocols (e.g. PCIe Gen3, Gen4, and Gen5) and depending on which protocol may be either a "passive" or an "active" type backplane. On-board redrivers or retimers may be utilized to improve the signal integrity and/or transfer rate of such protocols. The backplane board 5200 may have a "printed circuit board side" facing the right side 303, named a right board side 5201, and a "printed circuit board side" facing the left side 302, named a left board side 5202; said board 5200 may include various attachment mechanisms such as the following: one or more (e.g. two) network couplers 5203 and 5204, one or more (e.g. two) "card edge connectors" where each is named a connect coupler 5206 and are compliant with the SFF-TA-1002 specification (e.g. 4C+), one or more (e.g. two) "SFF-TA-1002 connectors" (e.g. straddle mount) where each is named a straddle connector 5216 and are soldered to said couplers 5206, one or more (e.g. four) "SFF-TA-1002 connector fasteners" (e.g. button head screws) where each is named a straddle fastener 5217 and secure said connectors 5216 to said board 5200, one or more (e.g. four) "non-plated through-holes" where each is named a board hole 5205 and are used by said fasteners 5217, one or more (e.g. ten) "plated through-holes" each named an alignment hole 5207-5210, one or more (e.g. ten) "SMT threaded inserts" (e.g. KEYSTONE 4939) where each is named an SMT insert 5218 and are soldered to said alignment holes 5207-5210, one or more (e.g. three) "non-plated through-holes" where each is named a network hole 5211, a "2-pin header" backplane header 5212 (e.g. MOLEX 70555-0071), and a "point-of-load converter" (depicted with a dashed rectangle in FIG. 52B) which is named a network converter 5213. In FIG. 52A, the backplane board's 5200 straddle connectors 5216, straddle fasteners 5217, and SMT inserts 5218 are hidden from view so that the board holes 5205 and alignment holes 5207-5210 are visible. The straddle connectors 5216 use a right-angle type connectors instead of straddle type connectors.

Also illustrated in FIGS. 52A and 52B are the backplane board's 5200 alignment holes 5207-5210 which use SMT inserts 5218, to attach either the NVRAM device 5000 or the hybrid adapter 5600 using board standoffs 5014 and truss head screws 5019. The network couplers 5203 and 5204 may supply an input voltage, typically 12V, to both the network converter 5213 and various devices which may be mated to the backplane board 5200 via straddle connectors 5216. As OCP NIC 3.0 devices typically require 12V and 3.3V rails (per the OCP specification), the network converter 5213 may input said 12V, via network couplers 5203 and

5204, and then output a stepped-down voltage, typically 3.3V, to supply such OCP devices (e.g. SFF and LFF). The network converter 5213 may include "enable" and "power good" pins which may be used by on-board circuitry for power sequencing and may be accessed via the backplane header 5212.

In alternative embodiments (not shown in figures), the OCP NIC 3.0 specification defines two mechanical form factors (i.e. SFF and LFF) and the backplane board 5200 uses one such LFF card in place of the two existing SFF cards. This replacement is possible as the LFF width (139 mm) is less than twice the SFF width (76 mm). This LFF enablement may allow non-NIC use cases.

Illustrated in FIGS. 53A-53D is the storage server's 100 network backplane 5300 which includes but is not limited to the following: the backplane board 5200, top guide slide 5101, middle guide slide 5102, bottom guide slide 5103, one or more (e.g. two) mated "OCP NIC 3.0 SFF cards" (e.g. Quad Port 10GbE Base-T NIC or Network Interface Controller) where each is named a NIC card 5301, one or more (e.g. two) shoulder screws 5303 per guide slide 5101-5103, one or more (e.g. two) male-female "hex standoffs" where each is named a fan standoff 5304 per guide slide 5101-5103, one or more (e.g. two) extra-wide truss head screws 5305 per guide slide 5101-5103, and one or more (e.g. two) "socket head screws" (e.g. ¼" length, 4-40 thread) where each is named a lock screw 5302. The guide slides 5101-5103 may be attached, via shoulder screws 5303, to the backplane board 5200 using said board's 5200 soldered SMT inserts 5218. To wit, the top guide slide 5101, via counterbored guide holes 5106 and corresponding shoulder screws 5303, may be attached to the backplane board 5200 via SMT inserts 5218 which are soldered to plated holes 5207; the middle guide slide 5102, via counterbored guide holes 5106 and corresponding shoulder screws 5303, may be attached to the backplane board 5200 via SMT inserts 5218 which are soldered to plated holes 5208; and the bottom guide slide 5103, via counterbored guide holes 5106 and corresponding shoulder screws 5303, may be attached to the backplane board 5200 via SMT inserts 5218 which are soldered to the plated holes 5209. The insert holes 5105, which are both centered and opposite to the guide holes 5106, may enable the guide slides' 5101-5103 guide surfaces 5104 to be coplanar with the backplane board's 5200 left board side 5202 by providing a cavity to envelop the SMT insert's 5218 height (e.g. 0.012"). The fan standoffs 5304 may be attached to the guide slides 5101-5103 using truss head screws 5305 and via the backplane board's 5200 network holes 5211 and the guide slides' 5101-5103 slider holes 5107. There is one lock screw 5302, via the lock hole 5108, per NIC card 5301 that may impede removal of said card 5301 from the network backplane 5300. The clear holes 5109 may be centered and opposite to lock holes 5108, and the clear holes 5109 may ease the threading of lock holes 5108. In FIGS. 53B and 53C, the network backplane's 5300 NIC cards 5301 are uninstalled to highlight said card's 5301 mounting mechanism.

Illustrated in FIG. 53E is an exploded-view of the network backplane 5300 (excluding the NIC cards 5301, straddle connectors 5216, and fasteners 5217). This exploded-view depicts structural mechanisms which may facilitate the following: attachment of the guide slides 5101-5103 to the backplane board's 5200 SMT inserts 5218 via six shoulder screws 5303, attachment of the six truss head screws 5305 to the six male-female fan standoffs 5304 via the guide slides' 5101-5103 slider holes 5107, and attachment of two lock screws 5302 to the guide slides' 5101 and 5103 threaded lock holes 5108. The use of shoulder screws 5303 is desirable, as said screws 5303 may provide the positional accuracy and precision which is beneficial for the guide slides 5101-5103 to facilitate the NIC card 5301 insertions and the mating of said cards 5301 with the straddle connectors 5216. These shoulder screws 5303 may be paired with the corresponding clearance holes 5106 which may be drilled and bored to various tolerances to further optimize this positional accuracy and precision.

Illustrated in FIG. 53A is the network backplane 5300 which accepts one or more (e.g. two) NIC cards 5301. The NIC cards 5301 may be power sequenced by the storage server's 100 power-on procedure. Sequencing may be started by an enable signal, received via the backplane header 5212, which may in turn enable the network converter 5213. Once the network converter's 5213 output voltage, typically 3.3V, is stabilized said converter's 5213 power good signal may be used to activate the OCP NIC 3.0 defined AUX_PWR_EN signal (B12 pin). After enabling AUX_PWR_EN, this power good signal may also be used to activate the OCP NIC 3.0 defined MAIN_PWR_EN signal (OCP_B2 pin). Following enablement of AUX_PWR_EN and MAIN_PWR_EN and subsequent stabilizing of the NIC card's 5301 AUX and MAIN power do-mains, the NIC_PWR_GOOD signal (OCP_B1 pin) may be sent back to the network backplane 5300. This NIC_PWR_GOOD signal may trigger, via network backplane 5300 circuitry, said backplane's 5300 power good signal to be transmitted to the control board 6400 via the backplane header 5212. As there may be two NIC cards 5301 mated to such backplane 5300, enablement of AUX_PWR_EN and MAIN_PWR_EN and the subsequent NIC_PWR_GOOD sequencing may occur with each such NIC card 5301. In an embodiment, the NIC_PWR_GOOD pins may be input into a logic OR function such that if one or both of the NIC cards 5301 outputs NIC_PWR_GOOD then the network backplane's 5300 power good signal may be relayed back to the control board 6400 via the backplane header 5212.

Illustrated in FIGS. 54A-54E is a "structural fan mounting mechanism", named a fan mount 5400, which is utilized to mount various axial fans. The fan mount 5400 may integrate various attachment mechanisms, such as: one or more (e.g. sixteen) threaded blind holes 5401, two threaded blind holes 5402 which may attach the two fan standoffs 5304 of the top guide slide 5101, two threaded blind holes 5403 which may attach the two fan standoffs 5304 of the middle guide slide 5102, two threaded blind holes 5404 which may attach the two fan standoffs 5304 of the bottom guide slide 5103, two threaded blind holes 5407 which may attach to the bottom panel 204, and one or more (e.g. six) threaded blind holes 5405 and 5406 which may be used to structurally rein-force the host adapters 4500 of the host backplane 4600. The fan mount 5400 may be designed in such a way as to be CNC machined from aluminum billet to increase rigidity.

Illustrated in FIGS. 55A-55D is a "fan array with structural support features", named a fan assembly 5500, which includes but is not limited to the following: the fan mount 5400, one or more (e.g. four) "axial fans" where each is named a host axial fan 5501-5504 (e.g. 80 mm by 80 mm by 25 mm), and one or more (e.g. sixteen) pan head screws 5505 (e.g. 6-32 thread and 1.125" length). The pan head screws 5505 may be used to attach the four host axial fans 5501-5504, via threaded blind holes 5401, to the fan mount 5400. As the fan assembly 5500 may be structurally attached to the bottom panel 204, said assembly 5500 may be used to secure the placement of the network backplane 5300 via said backplane's 5300 fan standoffs 5304, guide slides 5101-5103, and truss head screws 5305. The fan assembly's 5500 placement and host axial fan 5501-5504 configuration may be optimized for thermal regulation of the host adapters 4500, specifically the memory modules 4507 and host controllers 4501 (via host heatsinks 4508). The fan assembly's 5500 placement and configuration may also indirectly cool the NIC cards 5301.

Illustrated in FIG. 56A is a OCP NIC 3.0 mechanically compatible NIC card 5301 and as such includes "locking notches on each side" of the card rail edge, named a top notch 5603 and a bottom notch 5602. The top notch 5603 may be used by the lock screw 5302, via the top guide slide's 5101 lock hole 5108, to impede removal of the NIC card 5301 which is installed using the top guide slide 5101 and middle guide slide 5102; and the bottom notch 5602 may be used by the lock screw 5302, via the bottom guide slide's 5103 lock hole 5108, to impede removal of the NIC card 5301 that is installed using the bottom guide slide 5103 and middle guide slide 5102. The NIC cards 5301 may have SFF-TA-1002 specified "card edge connectors", where each is named a card coupler 5604. Up to two NIC cards 5301 may be seated into the network backplane 5300 by sliding each of said card's 5301 "rail edges", each named a card edge 5605, into a set of guide slides' 5101-5103 card guides 5110 until said card's 5301 card coupler 5604 mates with said backplane's 5300 straddle connector 5216. To wit, the NIC card 5301 may slide into the card guides 5110 of either the top guide slide 5101 and middle guide slide 5102 or the bottom guide slide 5103 and middle guide slide 5102.

Illustrated in FIGS. 56B and 56C is the network backplane 5300 with the fan assembly 5500 and hybrid adapter 5600 structurally attached, which collectively is named a system extension 5608. Also, NIC cards 5301, which are mated to straddle connectors 5216, may have various cable end connectors and support various networking technologies. One such connector, named an ethernet connector 5606, fits a RJ-45 cable end and supports various ethernet standards (e.g. 10GBASE-T); said connector 5606 may connect, via an ethernet cable, a client device to the storage server 100.

Illustrated in FIGS. 57C and 57D are flat brackets, where the front face 300 attached "front flat bracket" is named a front adapter plate 5700 and the back face 301 attached "back flat bracket" is named a back adapter plate 5708; said adapter plates 5700 and 5708 are used to attach nine host adapters 4500 to the system extension 5608. The adapter plates 5700 and 5708 may include various attachment mechanisms: such as one or more (e.g. six) through holes 5702 and 5707, which may be used to attach said plates 5700 and 5708 to the fan mount 5400; and one or more (e.g. eighteen) through holes 5701 and 5709, which may be used to attach said plates 5700 and 5708 to nine host adapters 4500. To wit, the front face 300 oriented (see FIG. 57A) fan mount's 5400 threaded holes 5405 may be attached to the front adapter plate's 5700 holes 5702 via truss head screws 5704; and the back face 301 oriented (see FIG. 57B) fan mount's 5400 threaded holes 5406 may be attached to the back adapter plate's 5708 holes 5707 via truss head screws 5706. Further, the front face 300 oriented (see FIG. 57A) host adapters' 4500 screw terminals 4504 may be attached to the front adapter plate's 5700 through holes 5701 via truss head screws 5703; and the back face 301 oriented (see FIG. 57B) host adapters' 4500 screw terminals 4503 may be attached to the back adapter plate's 5708 through holes 5709 via truss head screws 5705. The adapter plates 5700 and 5708 are designed in such a way that said plates 5700 and

5708 may be interchangeable, which minimizes the number of distinct components used by the storage server 100 and thereby reduces said server's 100 cost. The adapter plates 5700 and 5708 may be fabricated using various methods, which include laser cutting aluminum (e.g. 5052) sheet (e.g. 0.062" thick) followed by surface treatment.

Illustrated in FIGS. 57A and 57B is the middle panel 110, power board 4101, four male-female hex standoffs 4216 with attached truss head screws 4102, host backplane 4600, two adapter plates 5700 and 5708, twenty-four attached truss head screws 5703-5706, and the system extension 5608 (with the hybrid adapter's 5600 only visible component an affixed printed circuit board).

Illustrated in FIGS. 58A-58F is the storage server's 100 bottom panel 204. The bottom panel 204 may integrate various attachment mechanisms such as: one or more (e.g. two) counterbored clearance holes 5805 for attaching the fan mount 5400, one or more (e.g. six) counterbored clearance holes 5801-5803 for attaching the front facing 300 storage drive 900 "cage" which is named a front cage 6800, one or more (e.g. six) counterbored clearance holes 5818-5820 for attaching the back facing 301 storage drive 900 "cage" which is named a back cage 7200, one or more (e.g. twelve) countersunk clearance holes 5804 for attaching the "enclosure feet" of the storage server 100 where each is named a case riser 5900, two or more (e.g. thirty-two) countersunk clearance holes 5806-5809 to attach the bottom panel 204 to the bottom section 209, one or more (e.g. four) threaded (e.g. 4-40) blind holes 5814 for attaching the system board 4800, one or more (e.g. four) threaded (e.g. 4-40) blind holes 5815 for attaching a "power generation board" which is named a power card 6300 and may supply power to the front 6800 and back 7200 cages, and one or more (e.g. four) countersunk clearance holes 5817 for attaching the hybrid adapter's 5600 "backup power pack" which is named a power pack 7300. Further, the bottom panel 204 may include an access hole 5816 which may be used to adjust the bottom guide slide's 5103 lock screw 5302. This lock screw 5302 enables the NIC card 5301, which is guided by the bottom guide slide 5103 and middle guide slide 5102, to be removed without disassembly of the storage server 100. The access hole 5816 may be externally covered with an anti-tamper security label. The bottom panel 204 includes various integrated EMI containment capabilities, specifically "EMI containment protrusions" where each is named an EMI tab 5810-5813 and located on the periphery of said panel 204.

Illustrated in FIG. 58B, the bottom panel's 204 mass is minimized, while maximizing structural rigidity, by milling various patterns of panel pockets 511. These patterns may include mirroring about a vertical center line, as indicated via a first dashed line 5822, and/or a horizontal center line, as indicated via a second dashed line 5821. These mirrored patterns may be comprised of replicated panel pockets 511, replicated subpatterns of said pockets 511, or replicated groupings of subpatterns of said pockets 511. In an embodiment, this sub-pattern may be comprised of two right pockets 607 and 608. These pockets 607 and 608 may be positioned such that the hypotenuse of the first right triangle 607 is both parallel to and alongside the hypotenuse of the second right triangle 608 to create a rectangular shaped sub-pattern which may then be replicated and mirrored, e.g. this composited sub-pattern of two pockets 607 and 608 may be instanced five times horizontally and four times vertically and then mirrored about the horizontal center line 5821 and then mirrored again about the vertical center line 5822 to create a total of eighty such pocket 607 and 608 subpatterns that may be CNC milled into the bottom panel 204. Certain of these panel pockets 607 and 608 may be adapted to include integrated attachment mechanisms, e.g. clearance holes 5801-5803 used to attach the front cage 6800.

Illustrated in FIGS. 59B and 59G is the case riser 5900 which includes but is not limited to the following: a "riser shell" which is named a riser frame 5901 (see FIG. 59A), a "glider puck" which is named a riser glider 5904 (see FIG. 59H), and a hex drive flat head screw 5905 (e.g. 18-8 stainless steel, 8 mm length, and M4×0.7 mm thread). The riser frame 5901 may be designed in such a way that said frame 5901 may be CNC milled from aluminum billet and the riser glider 5904 may be designed in such a way that said glider 5904 may be CNC turned from polyoxymethylene rod. The riser frame 5901 may include a threaded blind hole 5902 which is centered within a wider blind hole 5903. The riser glider 5904 may include a countersunk clearance hole 5909 which may be used by a flat head screw 5905 to attach said glider 5904 to the threaded blind hole 5902 of the riser frame 5901. The riser glider 5904 may be dimensioned such that said glider 5904 may extend out from the riser frame's 5901 blind hole 5903, also the flat head screw 5905 may be inset within the clearance hole 5909 such that said screw 5905 does not extend past the glide surface 5910. These glide surfaces 5910 may facilitate end-user initiated movement of the storage server 100 upon the corresponding surface in which said server 100 is placed (e.g. an end-user's desktop). The need to move (or rotate) such storage server 100 may be in response to one or more failed storage drives 900 and the subsequent end-user replacement of said drives 900. The four riser frames 5901 may each have one or more (e.g. three) threaded blind holes 5907 which align to corresponding countersunk clearance holes 5804 of the bottom panel 204 (see FIGS. 59C-59F). To wit, the one or more (e.g. four) riser frames 5901, via threaded blind holes 5907, may be attached to the bottom panel 204, via clearance holes 5804, with hex driven flat head screws 5906 (e.g. 18-8 stainless steel, 8 mm length, and M2×0.4 mm thread). The riser frame 5901, of the case riser 5900, may integrate one or more (e.g. two) EMI tabs 5908. These EMI tabs 5908 may supplement the bottom panel's 204 EMI tabs 5810-5813, thus improving EMI mitigation and containment of the bottom section 209.

Illustrated in FIGS. 59C and 59F is the bottom panel 204 with four case risers 5900 installed via twelve flat head screws 5906, this "assembly of parts" is named a bottom base 5911.

Illustrated in FIG. 59I is an exploded-view of the bottom base 5911. This exploded-view depicts the assembly of the bottom base 5911 from the following components: the bottom panel 204, twelve flat head screws 5906, four riser frames 5901, four riser gliders 5904, and four flat head screws 5905. The riser gliders 5904 may facilitate storage server 100 positioning upon a "desktop" surface.

Illustrated in FIGS. 60A and 60C is the bottom base 5911, system board 4800, and the fan assembly 5500 installed upon said base 5911. To wit, the system board 4800 may be attached onto the bottom base 5911 via one or more (e.g. four) sets (see FIG. 60B) of the male-female hex standoff 6002 and corresponding truss head screw 6001. To wit, these hex standoffs 6002 may first be screwed into the bottom panel 204, via threaded blind holes 5814, and then the truss head screws 6001 may be used to fasten the system board 4800, via system holes 4815, to said standoffs 6002. The fan assembly 5500 may be attached to the bottom base 5911 via one or more (e.g. two) shoulder screws 9400. To wit, shoulder screws 9400 may use the counterbored clearance holes 5805 of the bottom panel 204 to attach to the threaded blind holes 5407 of the fan mount 5400.

Illustrated in FIGS. 61A and 61B is the bottom base 5911 with the following installed: the system board 4800, host backplane 4600, system extension 5608, two adapter plates 5700 and 5708 with each using twelve truss head screws 5703-5706, and four male-female hex standoffs 6002 utilizing four truss head screws 6001. As shown in FIG. 61A, the system extension 5608 has the top face 304 NIC card 5301 uninstalled so that the placement of the fan assembly's 5500 host axial fan 5503, which may beneficially assist in the cooling of said card 5301, is visible.

Illustrated in FIG. 62 is a "storage backplane" which is named a front backplane 6200 and includes but is not limited to the following: one or more (e.g. twelve) "SATA connectors" where each is named a front connector 6202 and 6203 (e.g. MOLEX 0678005002), one or more (e.g. twelve) disk receptacles 1700 (e.g. 3M 5622-2222-ML), two or more (e.g. twenty-four) "plated through-holes" where each is named a front hole 6801 (shown in FIG. 68B) and may have asymmetric bottom pad 1600 sizes, two or more (e.g. twenty-four) receptacle screws 1602, one or more (e.g. twelve) bypass groups 1705, a TVS device 6204, and a "14-pin header" named a front header 6201 (see FIG. 63D). The front holes 6801 may have bottom pads 1600 such that said pad's 1600 diameter may exceed the diameter of the respective plate boss 6508 of a "structural member" which is named a front backplate 6500. The front connectors 6202 and 6203 are positioned to minimize differential pair length and avoid differential crossovers. The front backplane 6200 may enable one or more (e.g. twelve) storage drives 900 to be mated, via disk receptacles 1700, to said backplane 6200. The front backplane 6200 may use one or more (e.g. two) breakout cables to connect to the corresponding storage controllers contained within either the configure chip 5001, via the hybrid bitstream 5601, or the host processor 4806. To wit, in an embodiment a first breakout cable may connect the front connectors 6203 to the hybrid adapter's 5600 cache connector 5004 and a second breakout cable may connect the front connectors 6202 to the hybrid adapter's 5600 cache connector 5005; and in alternative embodiments a first breakout cable may connect the front connectors 6202 to the host backplane's 4600 cache connector 4612 and a second breakout cable may connect the front connectors 6203 to the host backplane's 4600 cache connector 4613. By using the hybrid adapter's 5600 connectors 5004 and 5005 and storage controllers instanced via the hybrid bitstream 5601 of the configure chip 5001, PCIe lane count and thereby bandwidth between the host switch 4610 and the host processor 4806 may be increased.

Illustrated in FIGS. 63A and 63C is the power card 6300 which is connected to the front backplane 6200. The power card 6300 may include certain components which collectively function as a power generation and delivery system. The power card 6300 may supply power to storage drives 900 which are front face 300 accessed via the front backplane 6200 and back face 301 accessed via a separate "storage backplane", which is named a rear backplane 7201. Additionally, the power card 6300 may include the following: a "DC-DC step-down converter" which is named a card converter 6301 (e.g. INFINEON 1R38064) and is depicted via a dashed rectangle, a 14-pin "socket header" (e.g. 0.100") named a card receptacle 6302 (shown in FIG. 63B), a "2-pin header" which is named a go header 6303 (e.g. MOLEX 70555-0071), a 2-pin "shrouded header" (e.g. MOLEX 70555-0071) named a side header 6304, a 6-pin "shrouded header" (e.g. MOLEX 70555-0075) named an input header 6305, one or more (e.g. four) plated through holes 6306, one or more (e.g. four) male-female hex stand-offs 6308, and one or more (e.g. four) truss head screws 6307. The power card 6300 may be installed onto the bottom base 5911 via one or more (e.g. four) sets (shown in FIG. 60B) of a male-female hex standoff 6308 and the corresponding truss head screw 6307. To wit, these hex standoffs 6308 may first be screwed into the bottom panel 204, via threaded blind holes 5815, and then the card receptacle 6302 may be slid onto the protruding pins of the front header 6201; and then following such, the truss head screws 6307 may be used to attach the power card 6300, via through holes 6306, to said standoffs 6308.

The parallel or substantially parallel orientation of the left 812 and right 813 backplane relative to the top flow 104 may be beneficial, as said parallel orientation may decrease said flow's 104 resistance. Further, the bottom flow 207 may have an increased resistance in comparison, as said flow 207 may be perpendicular or substantially perpendicular to the bottom section's 209 front 6200 and rear 7201 backplanes.

Illustrated in FIG. 63C is a dashed rectangle that indicates a card converter 6301, but also depicts the approximate placement of ancillary components to said converter 6301, such as: an inductor, input capacitors, and output capacitors. Further, a card converter 6301 may support "enable" and "power good" pins, such pins may coordinate on-board circuitry to sequence said converter 6301 during power-up. This power-up sequencing may be coordinated via the go header 6303. The card converter 6301 may step-down an input voltage (e.g. 12V) to an output voltage (e.g. 5V) which may be used by the storage drives 900 attached to the front 6200 and rear 7201 backplanes.

Illustrated in FIG. 64A is the control board 6400 which implements the storage server's 100 power-up and shutdown procedures. This "power-up procedure", named a power-on procedure, may control and coordinate a plurality of distinct power sequencing mechanisms. The control board 6400 (as shown in FIG. 64B) may also control (e.g. PWM signals), monitor (e.g. TACH signals), and power (e.g. 12V) the four "axial fans" where each is named a bottom axial fan 8501-8504 which are attached to the back lower panel 202 and the four host axial fans 5501-5504 which are attached to the fan mount 5400. Further, the control board 6400 (as shown in FIG. 64B) may receive an input voltage (e.g. 12V), from the power supply 213, and then pass-through said voltage to the power card 6300 via header 6305 and the power pack 7300 via header 7306. To implement such functionality, the control board 6400 may include the following: one or more microcontrollers 6402, a "2-pin header" (e.g. MOLEX 70555-0071) which is named a button header 6416, a "2-pin header" (e.g. MOLEX 70555-0071) which is named a green header 6408, a "2-pin header" (e.g. MOLEX 70555-0071) which is named a yellow header 6409, a "2-pin header" (e.g. MOLEX 70555-0071) which is named a red header 6410, one or more (e.g. eight) "4-pin headers" (e.g. MOLEX 70555-0073) where each is named an axial header 6417-6424, a 2-pin header 6426 (e.g. MOLEX 70555-0071) which may transport a power management protocol, two 4-pin headers 6433 (e.g. MOLEX 70555-0073) which may carry certain power good signals, two 4-pin headers 6432 (e.g. MOLEX 70555-0073) which may transport I2C and fan 808-811 status signals, a 4-pin header 6431 (e.g. MOLEX 70555-0073) which may support power temp sensor 4401 readings, a "2-pin header" (e.g. MOLEX 70555-0071) which is named a SMB header 6425, a "4-pin header" (e.g. MOLEX 70555-0073) which is named a super header 6430, a "6-pin header" (e.g. MOLEX 70555-

0075) which is named a cage header 6415, one or more (e.g. two) "6-pin dual-row connectors" each named a control connector 6404 and 6407 (e.g. MOLEX 5036-2462), one or more (e.g. two) "4-pin dual-row connectors" each named a head connector 6405 and 6406 (e.g. MOLEX 26013128), a "2-pin header" (e.g. MOLEX 70555-0071) which is named a pack header 6429, a "2-pin header" (e.g. MOLEX 70555-0071) which is named a hybrid header 6428, a "2-pin header" (e.g. MOLEX 70555-0071) which is named a board header 6427, a "2-pin header" (e.g. MOLEX 70555-0071) which is named a card header 6414, a "2-pin header" (e.g. MOLEX 70555-0071) which is named a host header 6413, a "2-pin header" (e.g. MOLEX 70555-0071) which is named a network header 6412, a "2-pin header" (e.g. MOLEX 70555-0071) which is named a system header 6411, an "audible indicator" which is named a system speaker 6403, a "9-pin USB header" named a power header 6434, and one or more (e.g. four) "plated through-holes" each named a control hole 6401 to attach said board 6400. These control holes 6401 may each have an oversized bottom pad 1600 in which said pad's 1600 diameter may exceed the diameter of the corresponding front backplate's 6500 plate boss 6507.

Also illustrated in FIG. 64A are the connectors of the control board 6400 which are connected via various cables to corresponding connectors located within the storage server's 100 bottom section 209. To wit, a button header 6416 may be connected, via a cable, to the power button 3300 (see FIG. 35A) which may be mounted to the front lower panel 108; the green 6408, yellow 6409, and the red 6410 headers may be connected, via cables, to corresponding panel-mount (e.g. front lower panel 108) LEDs 3301-3303 (see FIG. 35A) respectively; a super header 6430 may be connected, via a cable, to the power pack's 7300 "4-pin header" named a charge header 7306; a pack header 6429 may be connected, via a cable, to the power pack's 7300 "2-pin header" which is named an ultracap header 7305; a hybrid header 6428 may be connected, via a cable, to the hybrid adapter's 5600 chip header 5007; a cage header 6415 may be connected, via a cable, to the power card's 6300 input header 6305; a card header 6414 may be connected, via a cable, to the power card's 6300 go header 6303; a board header 6427 may be connected, via a cable, to the power board's 4101 start header 4403; the host header 6413 may be connected, via a cable, to the host backplane's 4600 adapter header 4611; a network header 6412 may be connected, via a cable, to the network backplane's 5300 backplane header 5212; a system header 6411 may be connected, via a cable, to the system board's 4800 board header 4810; a SMB header 6425 may be connected, via a cable, to the system board's 4800 control header 4814; the axial headers 6417-6420 may be connected, via four cables, to host axial fans 5501-5504 respectively; the axial headers 6421-6424 may be connected, via four cables, to bottom axial fans 8501-8504 respectively.

The control board's 6400 SMB header 6425 may transport an SMBus (i.e. SMBCLK and SMBDAT) which may provide bidirectional communication between the system board's 4800 host processor 4806 and the control board's 6400 microcontroller 6402. This bidirectional communication may require the system board 4800 to be powered-up, and following such may also require the successful completion of the storage server's 100 power-on procedure. This SMBus, via header 6425, may be used to communicate the system status of the control board 6400 which may include: power temp sensor 4401 readings, monitoring of the host axial fans 5501-5504 and bottom axial fans 8501-8504, and buck converter 4300-4307 health. The system status may be received by the host processor 4806 from one or more microcontrollers 6402, via a polling mechanism, and may be indicated to an end-user via various methods which may include the green 3301, yellow 3302, and the red 3303 LEDs (mounted on the front lower panel 108) and/or an HTML based GUI interface (i.e. data dashboard) which may be dynamically generated and updated by the storage server's 100 internal web server.

In alternative embodiments (not shown in figures), the PMBus polling mechanism is replaced with an interrupt driven mechanism.

Illustrated in FIG. 64B is the control board 6400 which includes one or more microcontrollers 6402 and one or more connectors 6411-6414 and 6427-6429 which together enable said board 6400 to initiate and coordinate the storage server's 100 power-on procedure. This power-on procedure may include sequentially executing one or more sequencing subprocedures for various components of such storage server 100. Each sequencing subprocedure may include recursively executing one or more sequencing subprocedures. Sequencing subprocedures may be initiated with a PWR_EN signal and may be terminated with the corresponding PWR_GOOD signal. A successful sequencing subprocedure may generate a PWR_GOOD signal for each PWR_EN signal (i.e. a one-to-one correspondence between PWR_EN and PWR_GOOD signals) and a failed sequencing subprocedure will typically timeout by the circuitry that initiated said PWR_EN signal. As sequencing subprocedures may be recursively executed, timeouts may beget timeouts ad infinitum. In an embodiment, the storage server's 100 power-on procedure may include the following components being power-up sequenced consecutively: the power pack 7300, hybrid adapter 5600, power card 6300, power board 4101, host backplane 4600, network backplane 5300, and the system board 4800. But, the inventive aspects of this disclosure apply to a plurality of permutations of the power-up sequencing of such components within the power-on procedure.

The storage server's 100 power-on procedure may instantiate the following system-level strategy: execute the power-up procedure which charges the power pack 7300 prior to executing the power-up procedure utilized to power the hybrid adapter 5600, then execute power-up procedures utilized to power the storage drives 900 prior to power-up procedures utilized to power the host adapters 4500 which interface to said drives 900, and then execute the power-up procedures utilized to power the host adapters 4500 prior to the power-up procedure utilized to power the system board 4800 which interfaces to said adapters 4500. But, the inventive aspects of this disclosure apply to various permutations of such power-up procedures as the storage server 100 is booted.

In alternative embodiments (not shown in figures), when using a typical ATX motherboard and ATX based power supply 213 configuration (e.g. ATX Version 3.0 Multi Rail Desktop Platform Power Supply Revision 2.0 February 2022 and ATX12V Specific Guidelines 3.0), various power supply 213 signals (e.g. PS_ON #, PWR_OK, and +5VSB) are directly connected to said motherboard via a standardized 24-pin connector. ATX specified motherboards use a standardized 9-pin front panel header to connect the power switch (e.g. power button 3300) to said motherboard (via pins 6 and 8 of said panel header). When this power switch is pressed the following server components are powered-on concurrently (i.e. not consecutively): the motherboard, one or more HBAs which are connected to said motherboard via PCIe, and one or more storage drives 900 which are interfaced to said HBAs via cables. The combined inrush current of all such components (i.e. motherboard, HBAs, and storage drives 900) does not exceed the power supply's 213 rated output current as otherwise an overcurrent protection mechanism triggers a complete shutdown of said supply 213 to prevent damage resulting from the rated output current being exceeded. This inrush current, defined herein as the maximal instantaneous input current drawn by one or more electrical devices when said devices are turned-on, occurs as the motherboard and attached components are first booted up. These inrush currents can be several times the steady-state current used by these electrical devices normally. Another cause of inrush current is the charging of discharged input capacitors used by DC-DC switching regulators. So, the combined inrush current from an ATX motherboard and concurrently powered-on storage components is purposefully limited to less than the power supply's 213 rated output current. The overall result of this purposeful limitation is a restriction in the number of attached components (e.g. host adapters 4500 and storage drives 900) to such ATX motherboard.

The storage server's 100 power-on procedure may be initiated when an end-user presses the front lower panel's 108 power button 3300, said initiation may require the power supply's 213 rocker switch 8421 to be toggled on and the AC input plug 8420 to be connected, via cable, to a powered electrical receptacle/outlet. Unlike existing Desktop NAS type systems which may concurrently power on both the motherboard and attached storage drives 900, the storage server's 100 power-on procedure may consecutively execute power-up procedures via a self-governed control board 6400. Also, the control board's 6400 implementation of this power-on procedure may beneficially result in the system board 4800 being booted up last as opposed to first as is typical with NAS type motherboards (e.g. Mini-ITX). Booting the system board 4800 last may facilitate said board's 4800 PCIe enumeration of host adapters 4500 in addition to said adapters' 4500 enumeration of attached storage drives 900. These enumerations may inherently benefit from this ordering of power-up procedures as the devices being enumerated may be powered prior to, not during, said enumerations which may result in enhanced determinism during the storage server's 100 boot process and a minimization of enumeration failures. Consecutive (i.e. not concurrent) execution of power-up procedures may limit the magnitude and/or duration of instantaneous inrush currents thus allowing the storage server 100 to avoid exceeding the power supply's 213 rated output current during boot. This reduction in magnitude and/or duration of inrush currents may allow an increased number of host adapters 4500 and/or storage drives 900 to be utilized by the storage server 100.

The power supply's 213 rated output current is defined herein as the maximum continuous load current that said supply 213 may provide, at a certain ambient temperature, to the storage server 100. Typically, this rated output current may be exceeded in specific cases (such as inrush currents during power-on) by a specified percentage (e.g. 125%) and for a limited duration (e.g. 16 ms) without triggering the integrated over current protection functionality. When the rated output current is exceeded, which is named a current excursion, the power supply 213 may handle certain of these excursions via built-in and properly sized hold-up/decoupling capacitors.

The storage server's 100 power supply 213 may connect, via a pluggable cable, to an electrical outlet via an electrical receptacle (e.g. NEMA 5-15R). This receptacle may be connected via cable (e.g. MC or NM-B 12/2) to an electrical panel (i.e. service panel) via a branch circuit and circuit breaker. This circuit breaker may prevent damage, which could be caused by overcurrent or a short circuit, to the storage server 100 by interrupting current flow once a specified current threshold is reached. This circuit breaker's current threshold (e.g. 15 A or 20 A) may dictate the maximum rated output current allowed by the storage server's 100 power supply 213. For example, a 15 A AC circuit breaker's current threshold (i.e. tripping point) with a 120V nominal voltage may provide for a non-continuous load limit of 1,800 W that may be connected, via an individual branch circuit, to the storage server's 100 power supply 213 (e.g. SEASONIC TX-1600) with a rated output current of 133 A DC and a 12V nominal voltage that may produce a peak load of 1,600 W. Thereby, the power supply's 213 rated output current may be sized such that said output current avoids tripping the corresponding circuit breaker's current threshold during expected (i.e. non-fault) operation. If the power supply's 213 current output did trip the corresponding circuit breaker's current threshold, then the storage server 100 would lose power and shutdown. Hence, maximizing the number of storage drives 900 and/or host adapters 4500 used by the storage server 100 may include maximizing the rated output current capability of said server's 100 power supply 213 in relation to the circuit breaker and trip unit in which said server 100 is connected.

Defined herein are the following: each electrical outlet may supply one or more (e.g. two) electrical receptacles (e.g. two-pole, three-wire with hot, neutral, and ground prongs); each branch circuit may connect to a single circuit breaker and may supply one or more (e.g. eight) electrical outlets; and a specific type of branch circuit, which is named an individual branch circuit, may supply only a single piece of utilization equipment. This equipment may be defined as devices that utilize electrical energy for various purposes. An individual branch circuit may supply a single receptacle the full ampere rating of the circuit breaker connecting said branch circuit to the electrical panel, but specific national electrical codes (e.g. NFPA 70) may derate cord-and-plug connected utilization equipment, that is not fastened in place, to 80% of said ampere rating.

In an embodiment, the peak power draw for the storage server 100 comprised of the following: one hundred forty-four 5 W storage drives 900 of the top section 208, four 4 W top axial fans 808-811, fourteen 5 W storage drives 900 of the bottom section 209, eight 4 W host axial fans 5501-5504 and bottom axial fans 8501-8504, nine 35 W host adapters 4500, 20 W host backplane 4600, 300 W system board 4800, 75 W power board 4101, and two 25 W NIC cards 5301. Thereby, the sum total of peak power draw utilized by the storage server 100 could approximate 1,598 W. Thus, a 1,598 W peak powered storage server 100 could connect, via a NEMA 5-15R receptacle, to an individual branch circuit which then connects to a service panel with a 15 A circuit breaker. However, the inventive aspects of this disclosure apply to various peak power draws. In alternative embodiments, the storage server 100 could utilize storage drives 900 with a peak power draw of 10 W, instead of 5 W as in the prior paragraph, but that would increase the peak power of said server 100 to approximately 2,388 W (with other peak power unchanged). Notably, this 2,388 W of peak power draw could be supplied by the 2,400 W capacity of a NEMA 5-20R receptacle, individual branch circuit, and 20 A circuit breaker. But, what if this same storage server 100, with a potential peak power of 2,388 W, could be connected to the more prevalent NEMA 5-15R receptacle, individual branch circuit, and 15 A circuit breaker by regulating peak power to 1,600 W or less and thereby preventing overcurrent tripping? Such a capability, within limits, could provide for not only receptacle reassignments, but also handle when an individual branch circuit is unavailable yet branch circuits with various populated receptacles are available.

The storage server 100 may be allocated and/or allowed various ampere capacities depending on the branch circuit type said server 100 is connected and the various types of utilization equipment which may also be connected to said server's 100 branch circuit. Thus, the storage server 100 capable of dynamically (and/or statically) regulating the operational current draw of said server 100 may be fundamental in the maximization of said server's 100 storage capacity and data density.

The storage server's 100 power supply 213 at any point in time may have a certain current draw, defined herein as instantaneous current draw, as a result of powering said server 100 which may be a certain fraction, named a current fraction, of said supply's 213 rated output current. In an embodiment, the storage server's 100 power supply 213 may be compatible with the ATX12VO Desktop Power Supply Rev2.0 and later revisions or the ATX Version 3.0 Desktop Power Supply Rev2.0 and later revisions. In either of these cases, the voltage rail to which the rated output current applies is 12V. In embodiments where the power supply 213 is compatible with ATX V3.0 and later revisions, the 5V and 3.3V rails may not be used. This current fraction may be calculated by dividing the instantaneous current draw by the power supply's 213 rated output current. This current fraction may be represented by a unitless number between zero and one, which may be translated into and utilized as an unsigned binary number of varying bit depths (e.g. 8, 16, or 32-bit). An increasing bit depth may enable a greater current fraction granularity which may lead to improved control of power supply 213 utilization. A current fraction of zero may equate to a powered off storage server 100, while a current fraction of one may equate to the power supply 213 providing the rated output current. In theory, a current fraction greater than one should not occur as such a current draw would exceed the rated output current and thereby cause an overcurrent protection event and power off the storage server 100. The storage server 100 is defined herein "powered off" when the power supply's 213 primary voltage rail (e.g. 12V) is powered off while said supply's 213 standby voltage rail (e.g. +12VSB or +5VSB) is powered on. The prerequisites of this powered off state may include the power supply 213 being plugged into a powered electrical receptacle and the rocker switch 8421 being on, whereas the storage server 100 is defined herein as "powered down" when said switch 8421 is off.

The storage server 100 may run (i.e. execute) various operating systems (e.g. FREEBSD, LINUX, and WINDOWS) that may provide integrated network file sharing capabilities using various network file sharing protocols 10801 (e.g. NFS). To support such file sharing protocols, the operating system may include various built-in or downloadable device drivers for various HBAs (e.g. BROADCOM 9305-16i) and storage drives 900 (e.g. SATA) attached to said HBAs. These operating systems may allow device drivers 10804-10806 to be used with proprietary storage server 100 hardware such as the host adapters 4500 and the hybrid adapter 5600. These device drivers 10804-10806 may be beneficially written to support system-level functionality such as regulating the operational current draw, via the current fraction, of the storage server's 100 power supply 213, and not just device-level functionality such as the storage drive's 900 health via built-in S.M.A.R.T. (Self-Monitoring, Analysis, and Reporting Technology) attributes.

The storage server's 100 implementation of a network file sharing protocol ultimately translates to read and write requests (i.e. input/output) directed to said server's 100 storage drives 900. The quantity of these read and write requests typically exceeds the capability of the storage drives 900 to complete said requests. Hence, a regulation mechanism is applied to each storage drive 900 which controls the flow of such requests and may include a command (i.e. read/write) queue and said queue may have an associated queue depth. This queue depth may determine the maximum number of commands that may be outstanding (in-process) at any point in time for the intended storage drive 900. The storage server 100 may have the HBA device driver 10804 control-ling storage drives 900 which reads a command queue's metadata to determine the number of commands outstanding prior to sending a new command to said drive 900. If the command queue indicates full then the HBA device driver 10804 may "return" and "wait" for queue availability, and if said queue is not full said driver 10804 may update said queue's metadata and then send this new command to such storage drive 900. A command queue may provide an elastic buffer type functionality.

The storage server's 100 operating system typically uses a storage architecture which allows for variability in the functionality of storage drives 900 which are used by said system 100. For example, AHCI devices may have a single command queue with a queue depth of thirty-two, while an NVMe device may have 64K "command queues" with each having a 64K queue depth. To support such variability, an operating system may use a layered architecture of storage drivers. For example, Window's storage architecture includes a storage class driver, a storage port driver, and a storport miniport driver that handles hardware specific aspects of a particular HBA. This layered architecture was created to account for device-level variability, but may be utilized to regulate the storage server's 100 operational current draw on a command by command basis.

A mechanism for regulating the operational current draw of the storage server 100 may include a device driver's subroutine accessing (i.e. reading from but not writing to) a real-time and continuously updated programing variable which contains a delimited representation of the current fraction. Evaluating the current fraction may occur after (or less beneficially before) the device driver evaluates a programing variable representing the queue count of the storage drive 900. This queue count is the total number of outstanding commands (i.e. read/write) which currently exist in the command queue and may be less than or equal to the queue depth. If the queue count is "zero based" then the queue count may be less than (including zero) the queue depth. This process of evaluating the queue count to regulate the execution of read/write commands by the storage drive 900 and thereafter evaluating the current fraction to regulate utilization of current from the power supply 213 that powers the storage server 100 is both novel and efficient.

This process of evaluating the current fraction may include comparing said fraction to an end-user defined or manufacture's default value which represents the maximum allowed utilization of the power supply's 213 rated output current and is herein defined as the current cutoff. This current cutoff may be delimited to a unitless percentage and may be represented by a number between zero and one which may be translated into and utilized as an unsigned binary number of varying bit depths (e.g. 8, 16, or 32-bit). This current cutoff is typically juxtaposed to the minimum allowed utilization of the power supply's 213 rated output current which is defined herein as the current bottom. This current bottom may be delimited to a unitless percentage and may be represented by a number between zero and one which may be translated into and utilized as an unsigned binary number of varying bit depths (e.g. 8, 16, or 32-bit). For example, the current cutoff when represented as a 32-bit unsigned hexadecimal number may be set to 0xFFFFFFFF to indicate all of the power supply's 213 rated output current may be used by the storage server 100.

Illustrated in FIG. 64C is an embodiment of a PCIe device and said device's device driver subroutine which initiates and executes a read/write command including said command's data transfer to (or from) said device. The completion of this read/write command, which is not depicted, typically uses a separate device driver subroutine which is called to update the read/write command's metadata, all of which is a byproduct of the interrupt thrown in step 6444. This corresponding interrupt completion subroutine is unchanged by the addition of the current fraction's evaluation to regulate utilization of the power supply's 213 current draw. This command processing starts with step 6435 and then the process proceeds to step 6436. In step 6436, a device driver's subroutine is called to execute either a read or write command and then the process proceeds to step 6437. In step 6437, the queue count is compared to the queue depth. If the queue count, which is zero based, is less than the queue depth then the process proceeds to step 6438. If the queue count is equal to or greater than the queue depth then the process proceeds to step 6445. In step 6438, the current fraction is compared to the current cutoff. If the current fraction, which is zero based, is less than the current cutoff then the process proceeds to step 6439. If the current fraction is equal to or greater than the current cutoff then the process proceeds to step 6445. In step 6439, a device driver's subroutine writes the SGL's (Scatter Gather List) DMA (Direct Memory Access) descriptors to the PCIe device's BAR1 (Base Address Register), these DMA descriptors are used to transfer user space buffers to (or from) the PCIe device, and then the process proceeds to step 6440. In step 6440, a device driver's subroutine writes the target LBA (Logical Block Address) to either the read or write offset of the PCIe device's BAR0 and then the process proceeds to step 6441. In step 6441, the PCIe device's on-board DMA engine initiates the read/write command's SGL which directs transfers between main memory 4804 and the PCIe device and then the process proceeds to step 6442. In step 6442, a device driver's subroutine stores a command pointer in the command queue, increments the queue head pointer, and increments the queue count and then the process proceeds to step 6443. In step 6443, a device driver's subroutine returns from being called with an ACCEPT status, meaning the command was accepted by the PCIe device for execution, and then the process proceeds to step 6444. In step 6444, the PCIe device's DMA engine completes the SGL, increments the SGL completion count, and throws an interrupt and then the process proceeds to step 6445. In step 6445, the device driver's subroutine returns from being called with a BUSY status, meaning the command was not accepted for execution because the command queue was full or the power supply 213 was fully utilized, and then the process proceeds to step 6446. In step 6446, the process ends. This PCIe device may represent either the host adapter 4500 or hybrid adapter 5600, as the DMA engines of said adapter's 4500 and 5600 may have similarities and certain differences. These differences may include queue depth and/or sector size as the storage media is either DRAM 5002 or storage drives 900. The device driver routine referenced above (in this paragraph) is representative of the device drivers 10804-10806 used by the storage server 100.

An example scenario when an end-user may set the current cutoff to less than 100% is as follows: two identical storage servers 100 connected using a duplex NEMA 5-15R receptacle to a branch circuit and service panel via a 15A circuit breaker. The first of these two servers 100 may be software configured as the production storage server 100 while the second as the backup storage server 100. This scenario could arise because an end-user was unable to provide individual branch circuits to each server 100 or elected to share a normal branch circuit for cost reasons. Either way, setting the current cutoff to 0x7FFFFFFF (i.e. approximately 50%), using an HTML based GUI interface, would result in the current cutoff regulating each storage server 100 to a nominal 800 W (i.e. 66.67A at 12V) when the power supplies 213 of said servers 100 are 1600 W. This HTML based GUI interface, may also display the current fraction via various visual representations which may include varied time series graphs of said fraction for historical perspective.

The current fraction may be sourced and/or generated via various methods and mechanisms, for example: first by using the I_PSU % signal provided by power supplies 213 compatible with the ATX12VO Power Supply Design Guide Revision 2.0 (March 2022) or future iterations; second by using a "physical data link", named a power link 8427, which may transfer data representing said supply's 213 instantaneous current draw to the control board's 6400 microcontroller 6402; and third by using a proprietary power supply 213 design which may beneficially provide an increased accuracy and precision in said fraction's measurement. This measurement may result in a greater granularity of the current fraction and thus an improved ability to fully use said supply 213. The power link 8427 may quantify a power supply's 213 immediate current draw and then transfer such quantity, via various formats and protocols, to be transformed into the current fraction. Enablement of the current fraction and programable access to such by the system board's 4800 operating system, via a device driver, may be provided for by the control board 6400 or by alternative means. But, the inventive aspects of this disclosure apply to varied current fraction derivations and deliveries.

The storage server's 100 power-on procedure may be used to mitigate said server's 100 inrush current and therefore may enable an increased number of storage drives 900 to be used by said server 100. Further, the storage server's 100 current fraction may regulate read/write command execution, for which said server 100 is purposed to provide, thereby enabling an improved utilization of the power supply's 213 rated output current. This regulation, via the current fraction, of the aggregate peak power of the storage server's 100 storage drives 900 and the resulting improved utilization of said server's 100 power supply 213 may also enable an increased number of storage drives 900 to be used by said server 100. These remedies to the aggregate inrush current and peak power of storage drives 900 may be the basis for the high-density storage server 100.

Illustrated in FIG. 65A is a "structural member", named a cage top 6501, which when attached to the front backplate 6500, a "structural member" which is named a left front locator 6600, and a "structural member" which is named a right front locator 6700 composes a "structural framework", named a front structure 6900 (see FIG. 69B), upon which the front cage 6800 may be based. This attachment of the cage top 6501 to the front backplate 6500, the left front locator 6600, and the right front locator 6700 may utilize one or more (e.g. six) countersunk clearance holes 6502-6504. To wit, the cage top's 6501 clearance holes 6502 may be used by flat head screws 6802 to attach to the front backplate's 6500 threaded blind holes 6506; the cage top's 6501 clearance holes 6503 may be used by flat head screws 6802 to attach to the left front locator's 6600 threaded blind holes 6602; and the cage top's 6501 clearance holes 6504 may be used by flat head screws 6802 to attach to the right front locator's 6700 threaded blind holes 6702.

Illustrated in FIGS. 65B-65E is the front backplate 6500, which integrates but is not limited to the following: one or more (e.g. twenty-four) plate bosses 6508 used to mount the front backplane 6200, one or more (e.g. twenty-four) plate holes 6509 (e.g. M2 thread) used to attach the front backplane 6200, one or more (e.g. four) plate bosses 6507 used to mount the control board 6400, one or more (e.g. four) plate holes 6510 (e.g. 4-40 thread) used to attach the control board 6400, one or more (e.g. two) threaded blind holes 6505 used to attach to the bottom panel 204 via clearance holes 5801, one or more (e.g. two) threaded blind holes 6506 used to attach the cage top 6501, and one or more (e.g. twenty-one) vent voids 6511. To wit, the front backplane 6200 may be mounted and secured by first centering said backplane's 6200 front holes 6801 (see FIG. 68B) to the plate holes 6509 of the front backplate 6500 and then affixing said backplane's 6200 disk receptacles 1700, via receptacle screws 1602, to said threaded holes 6509. Further, the front backplane's 6200 back sided and larger diameter pads 1600 may electrically connect to the front backplate's 6500 plate bosses 6508 and thus provide "up to" twenty-four integrated chassis ground connections. Similarly, the control board 6400 may be positioned and secured by first centering said board's 6400 control holes 6401 to the plate holes 6510 of the front backplate 6500 and then affixing said board 6400, via truss head screws 6901, to said holes 6510. Further, the control board's 6400 back sided and larger diameter pads 1600 may electrically connect to the front backplate's 6500 plate bosses 6507 and thereby provide "up to" four integrated chassis ground connections. Also, shoulder screws 9400 may use the counterbored clearance holes 5801 of the bottom panel 204 to attach to the threaded blind holes 6505 of the front backplate 6500. The front cage 6800 may use the front backplate's 6500 plate bosses 6507 and 6508 and plate holes 6509 and 6510 to negate the necessity for distinct or dedicated mounting and/or grounding mechanisms and thus may enable desirable optimizations of both the front backplane's 6200 and the control board's 6400 printed circuit board layout.

Illustrated in FIGS. 65D and 65E, is one of various mechanisms the front backplate 6500 may use to secure, position, and align various printed circuit boards within the front cage 6800. An embodiment may use CNC milled plate bosses 6507 and 6508. These bosses 6507 and 6508 may be machined from the same aluminum billet (e.g. bar stock) as the front backplate 6500. Further, in the same CNC operation that plate bosses 6507 and 6508 are machined, a CNC driven form tap may thread form (via displacement) plate holes 6509 and 6510. This combination of plate bosses 6507 and 6508 and plate holes 6509 and 6510 may beneficially enable the front backplane 6200 and control board 6400 to be attached and aligned to the front backplate 6500 with both accuracy and precision. Also, the vent voids 6511 may beneficially enable a reduction in the mass (i.e. weight) of the front backplate 6500.

In alternative embodiments (not shown in figures), the front backplate 6500 uses individual standoffs in place of integrated bosses 6507 and 6508 and holes 6509 and 6510.

Additionally, plate bosses 6507 and 6508 may serve dual purposes: first as planar surfaces with which both the front backplane 6200 and control board 6400 may be attached to the front backplate 6500; and second, as electrical grounding connections for said backplane 6200 and said board 6400. These ground connections may require: first, an electrically conductive front backplate 6500 surface treatment (e.g. electroless nickel) or a non-conductive surface treatment (e.g. anodized) paired with plate boss 6507 and 6508 masking; and second, a printed circuit board which uses PTHs with a sufficiently large bottom layer pad diameter. This larger diameter bottom layer pad 1600 (often with a circular pattern of solder bumps) may perform as an electrical contact between the front backplane 6200 or control board 6400 and the front backplate 6500.

In alternative embodiments (not shown in figures), the front backplane 6200 and/or control board 6400 have dedicated mounting and/or grounding mechanisms which use standoffs. These individual standoffs then require matching PTHs located across the printed circuit board to provide structural support for the mating and unmating of storage drives 900 (if applicable) and optionally to also provide chassis ground connections.

Further, plate holes 6509 may serve dual purposes: first, as threaded holes to attach the front backplane's 6200 printed circuit board to the front backplate 6500; and second, as threaded holes to secure the front backplane's 6200 disk receptacles 1700 to the front backplate 6500. These disk receptacles 1700 (e.g. 3M 5622-2222-ML) may populate the front backplane 6200 and may be used for mating and unmating of storage drives 900. Each disk receptacle 1700 may be not only soldered to the front backplane 6200 but also secured via receptacle screws 1602 to the front backplate 6500 and thus capable of an increased number of mating/unmating cycles compared to the disk receptacle 1700 which is merely soldered. Disk receptacles 1700 may have two flange holes 1710 that are intended to be used by both receptacle screws 1602 and corresponding nuts per the manufacturer's datasheet, but the front backplate 6500 that uses both plate bosses 6508 and plate holes 6509 may beneficially negate the need for and thus the installation of such receptacle screw 1602 nuts.

Illustrated in FIGS. 66A-66E, is the left front locator 6600, which is designed to join with structural members such as the right front locator 6700, front backplate 6500, and the cage top 6501 to form the front structure 6900 of the front cage 6800. These left 6600 and right 6700 front locators may function as follows: first, to facilitate insertion (and removal) of carriers 800 into (and out of) the front cage 6800; and second, to facilitate mating (and unmating) of drive carrier 800 attached drives 900 to (and from) the front backplane 6200. The drive carrier 800 insertion/removal and storage drive 900 mating/unmating facilitation may underlie the storage server 100 which is serviceable by an end-user of said server 100, and such serviceability is beneficial.

As illustrated in FIGS. 66A-66C, the left front locator 6600 includes but is not limited to the following: one or more (e.g. two) threaded blind holes 6601 used to attach to the bottom panel 204, one or more (e.g. two) threaded blind holes 6602 used to attach the cage top 6501, and one or more (e.g. twenty-two) vent voids 6603. To wit, shoulder screws 9400 may use the counterbored clearance holes 5802 of the bottom panel 204 to attach to the threaded blind holes 6601 of the left front locator 6600.

As illustrated in FIGS. 67A-67E, the right front locator 6700 includes but is not limited to the following: one or more (e.g. two) threaded blind holes 6701 used to attach to the bottom panel 204, one or more (e.g. two) threaded blind holes 6702 used to attach the cage top 6501, one or more (e.g. two) threaded blind holes 6703 and 6704 used to secure the host backplane 4600, and two or more (e.g. twenty-two) vent voids 6705. To wit, two shoulder screws 9400 may use counterbored clearance holes 5803 of the bottom panel 204 to attach to the two threaded blind holes 6701 of the right front locator 6700. Further, the vent voids 6603 and 6705 may reduce the mass (i.e. weight) of the left 6600 and right 6700 front locators respectively while also improving the cooling, via the bottom flow 207, of storage drives 900 found in the storage server's 100 front cage 6800.

Figures 67A, 67B, 67C:
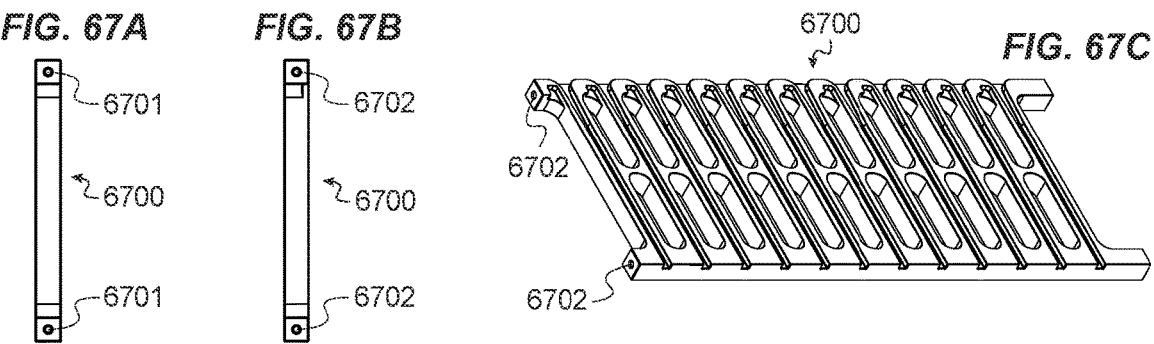
Figure 67D:
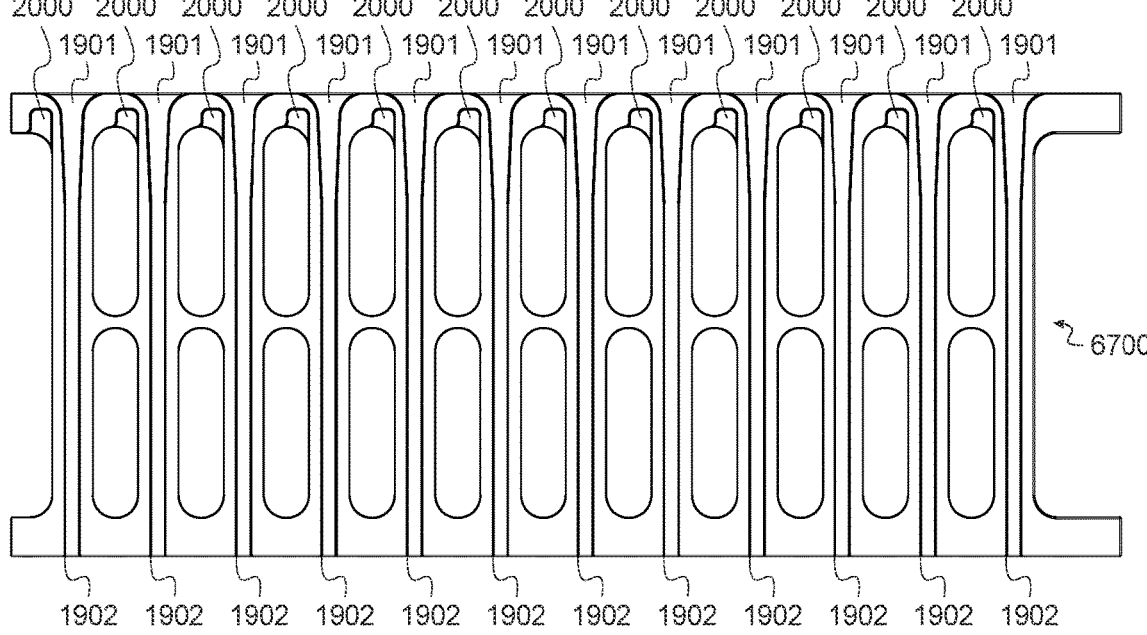
Figure 67E:
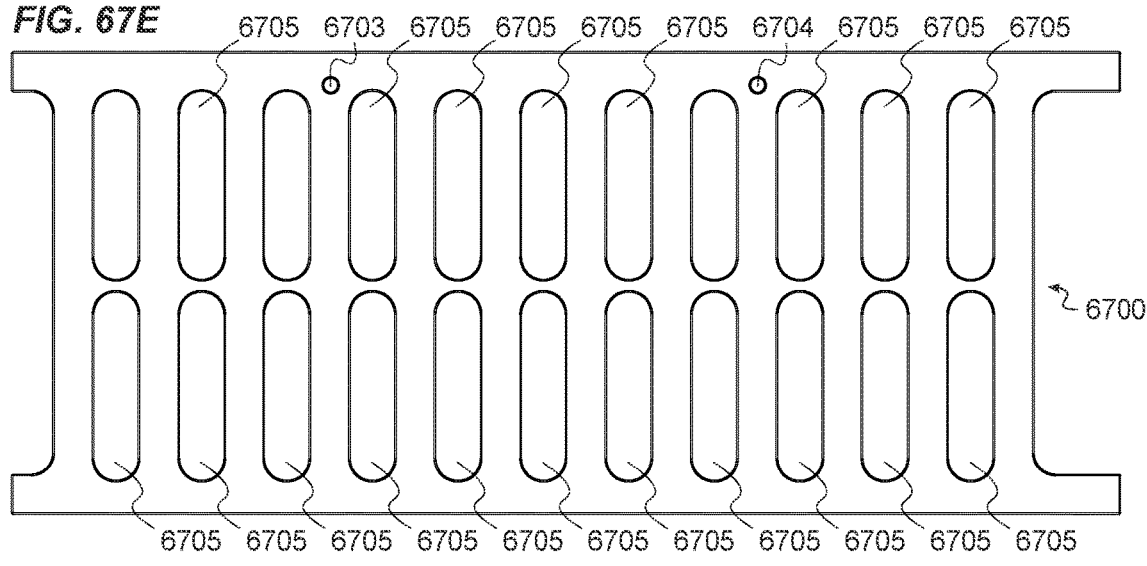

As illustrated in FIGS. 66D and 67D, the left 6600 and right 6700 front locator's insertion channels 1901, via channel slides 1902, are used to guide drive carriers 800, via insertion rails 2601, towards front cage 6800 insertion (and removal). To ease this insertion of drive carriers 800, the entrance of both front locator's 6600 and 6700 insertion channels 1901 can be flared.

As illustrated in FIG. 66D, the left front locator's 6600 wing notches 1900 are utilized to enforce the drive carrier's 800 orientation during front cage 6800 insertion. Each wing notch 1900 may correspond to the drive carrier's 800 wing guide 2516. The wing guide 2516 may use a wing notch 1900 to promote the proper insertion orientation of the drive carrier 800 being inserted into the front cage 6800, while the improper drive carrier 800 orientation may result in a physical obstruction between said guide 2516 and either the left 6600 or right 6700 front locators. This proper drive carrier 800 insertion orientation may prevent damage to components of the front backplane 6200.

Illustrated in FIG. 67D are the right front locator's 6700 retent cells 2000. Each retent cell 2000, in addition to the device connector 1800 to disk receptacle 1700 mate, may function to retain the drive carrier's 800 position following front cage 6800 insertion. To wit, during drive carrier 800 insertion, said carrier's 800 retent bar 2508 may pivot into the retent cell 2000 and thereby prevent an already inserted drive carrier 800 from unintentional front cage 6800 removal.

Illustrated in FIGS. 68A and 69A is the front cage 6800 which includes but is not limited to the following: one or more (e.g. twelve) vertically positioned drive carriers 800, left front locator 6600, right front locator 6700, front backplate 6500, cage top 6501, front backplane 6200, control board 6400, power card 6300, one or more (e.g. six) flat head screws 6802 (e.g. M2×0.4 mm thread and an 8 mm length), and one or more (e.g. four) truss head screws 6901. Vertical positioning of drive carriers 800 within the front cage 6800, and thus storage drives 900 via device connectors 1800, may be provided by the left front locator 6600 via channel slides 1902, the right front locator 6700 via channel slides 1902, and the front backplane 6200 via disk receptacles 1700.

Illustrated in FIG. 70A is a "structural member", named a rear backplate 7000, which includes but is not limited to the following: one or more (e.g. four) plate bosses 7004 which may be used to mount the rear backplane 7201, one or more (e.g. four) plate holes 7005 (e.g. M2 thread) which may be used to attach the rear backplane 7201, one or more (e.g. two) threaded blind holes 7101 used to attach to the bottom panel 204, a threaded blind hole 7104 used for the power supply 213 support mechanism, a "load rated bumper" (see FIG. 72A) named a power bump 7003 (e.g. polyurethane, 4-40 thread, 9/32" diameter, 5/16" height), and one or more (e.g. two) vent voids 7006. To wit, the rear backplane 7201 may be mounted and secured by first centering said backplane's 7201 PTHs 7204 (see FIG. 72C) to the plate holes 7005 of the rear backplate 7000 and then attaching said backplane's 7201 disk receptacles 1700, via receptacle screws 1602, to said holes 7005. Further, the rear backplane's 7201 back sided and larger diameter pads 1600 may electrically connect to the rear backplate's 7000 plate bosses 7004 and thus provide "up to" four integrated chassis ground connections. To wit, the power bump 7003 may be screwed into the rear backplate 7000 via said backplate's 7000 threaded blind hole 7104. Further, shoulder screws 9400 may use the counterbored clearance holes 5818 of the bottom panel 204 to attach to the threaded blind holes 7101 of a rear backplate 7000. The back cage 7200 may use the rear backplate's 7000 plate bosses 7004 and plate holes 7005 to negate the necessity for separate (i.e. dedicated) mounting and/or grounding mechanisms and thus may enable desirable optimizations of the rear backplane's 7201 printed circuit board layout.

Illustrated in FIGS. 70A, 71A, and 71B, is one of various mechanisms a rear backplate 7000 uses to secure, position, and align a printed circuit board within the back cage 7200. An embodiment may use CNC milled plate bosses 7004. These plate bosses 7004 may be CNC milled from the same aluminum billet (e.g. bar stock) as the rear backplate 7000. Further, in the same CNC operation that plate bosses 7004 are machined, a CNC driven form tap may thread form (via displacement) plate holes 7005. This combination of plate bosses 7004 and plate holes 7005 may beneficially enable the rear backplane 7201 to be attached and aligned to a rear backplate 7000 with both accuracy and precision. Also, vent voids 7006 may beneficially enable a reduction in the mass (i.e. weight) of a rear backplate 7000.

In alternative embodiments (not shown in figures), the rear backplate 7000 uses individual standoffs instead of the integrated bosses 7004 and holes 7005.

Additionally, plate bosses 7004 may serve dual purposes: first as planar surfaces with which the rear backplane 7201 may be attached to a rear backplate 7000; and second, as electrically grounded connections between said backplane 7201 and said backplate 7000. These ground connections may require: first, an electrically conductive rear backplate 7000 surface treatment (e.g. electroless nickel) or a non-conductive surface treatment (e.g. anodized) paired with plate boss 7004 masking; and second, a mounted printed circuit board which uses PTHs with a certain large bottom layer pad diameter. This larger diameter bottom layer pad 1600 (often with a circular pattern of solder bumps) may perform as an electrical contact between the rear backplane 7201 and the rear backplate 7000.

In alternative embodiments (not shown in figures), the rear backplane 7201 has dedicated mounting and/or grounding mechanisms using standoffs. These individual standoffs then require corresponding PTHs positioned across the printed circuit board to provide structural support for mating and unmating of storage drives 900 and optionally to provide chassis ground connections.

Further, plate holes 7005 may serve dual purposes: first, as threaded holes to attach the rear backplane's 7201 printed circuit board to the rear backplate 7000; and second, as threaded holes to secure the rear backplane's 7201 disk receptacles 1700 to the rear backplate 7000. These disk receptacles 1700 (e.g. 3M 5622-2222-ML) may be rear backplane 7201 populated connectors used for mating and unmating of storage drives 900. Each disk receptacle 1700 may be not only soldered to the rear backplane 7201 but also attached via receptacle screws 1602 to a rear backplate 7000 and thus capable of an increased number of mating/unmating cycles compared to the disk receptacle 1700 which is merely soldered. Disk receptacles 1700 may have two flange holes 1710 which are intended to be utilized by receptacle screws 1602 and corresponding nuts per the manufacturer's datasheet, but a rear backplate 7000 that uses both plate bosses 7004 and plate holes 7005 may beneficially negate the need for and thus the installation of such receptacle screw 1602 nuts.

Illustrated in FIGS. 70B, 70C, and 71C is a "structural member", named a right rear locator 7001, which functions with both a "structural member" which is named a left rear locator 7100 and the rear backplate 7000. These left 7100 and right 7001 rear locators may function as follows: first, to facilitate insertion (and removal) of carriers 800 into (and out of) the back cage 7200; and second, to facilitate mating (and unmating) of carrier 800 attached drives 900 to (and from) the rear backplane 7201. The drive carrier 800 insertion/removal and storage drive 900 mating/unmating facilitation may underlie the storage server 100 which is serviceable by the end-users of said server 100.

As illustrated in FIGS. 70B, 70C, and 71C, the right rear locator 7001 includes but is not limited to the following: one or more (e.g. two) threaded blind holes 7102 used to attach to the bottom panel 204, a threaded blind hole 7002 used to secure the host backplane 4600, and one or more (e.g. two) vent voids 7007. To wit, two shoulder screws 9400 may use the counterbored clearance holes 5820 of the bottom panel 204 to attach to the two threaded blind holes 7102 of the right rear locator 7001.

Illustrated in FIGS. 71D and 71E is the left rear locator 7100 which includes but is not limited to the following: one or more (e.g. two) threaded blind holes 7103 used to attach to the bottom panel 204 and one or more (e.g. two) vent voids 7105. To wit, shoulder screws 9400 may use the counterbored clearance holes 5819 of the bottom panel 204 to attach to the threaded blind holes 7103 of the left rear locator 7100. Also, vent voids 7105 and 7007 may reduce the mass (i.e. weight) of the left 7100 and right 7001 rear locators respectively while also beneficially improving the cooling, via increased air flow, of the storage drives 900 located in the storage server's 100 back cage 7200.

As illustrated in FIGS. 71E and 70B, the left 7100 and right 7001 rear locator's insertion channels 1901 are utilized to guide drive carriers 800, via insertion rails 2601, towards back cage 7200 insertion (and removal). To ease the back cage 7200 insertion of drive carriers 800, the entrance of the left 7100 and right 7001 rear locator's insertion channels 1901 may be flared.

As illustrated in FIG. 70B, the right rear locator's 7001 wing notches 1900 are used to enforce the drive carrier's 800 orientation during back cage 7200 insertion. Each wing notch 1900 may correspond to the drive carrier's 800 wing guide 2516. The wing guide 2516 may use a wing notch 1900 to promote the proper insertion orientation of the drive carrier 800 being inserted into the back cage 7200, while the improper drive carrier 800 orientation may result in a physical obstruction between said guide 2516 and either the left 7100 or right 7001 rear locator. The proper drive carrier 800 insertion orientation may prevent damage to rear backplane 7201 components.

Illustrated in FIG. 71E are the left rear locator's 7100 retent cells 2000. Each retent cell 2000, in addition to the device connector 1800 to disk receptacle 1700 mate, may function to retain the drive carrier's 800 position following back cage 7200 insertion. To wit, during such drive carrier

800 insertion, said carrier's 800 retent bar 2508 may pivot into the retent cell 2000 and thereby prevent an already inserted drive carrier 800 from unintentional back cage 7200 removal.

Illustrated in FIGS. 72C and 72D is the rear backplane 7201 which includes but is not limited to the following: one or more (e.g. two) "SATA connectors" (e.g. MOLEX 0678005002) where each is named a rear connector 7203, one or more (e.g. two) disk receptacles 1700 (e.g. 3M 5622-2222-ML), two or more (e.g. four) PTHs 7204 with asymmetric pad 1600 sizes, two or more (e.g. four) receptacle screws 1602, one or more (e.g. two) bypass groups 1705, and a 2-pin "shrouded header" (e.g. MOLEX 70555-0071) which is named a source header 7202. These PTHs 7204 may each have an oversized bottom pad 1600 such that said pad's 1600 diameter may exceed the diameter of the respective rear backplate's 7000 plate boss 7004. These rear connectors 7203 may be positioned to minimize differential pair length and avoid differential crossovers. The rear backplane 7201 may enable one or more (e.g. two) storage drives 900, via device connectors 1800, to be mated to said backplane 7201, via disk receptacles 1700. To wit, the rear backplane 7201 may be supplied power (e.g. 5V) by a cable that connects said backplane's 7201 source header 7202 to the power card's 6300 side header 6304. Further, the rear backplane's 7201 rear connectors 7203 may use two separate cables (e.g. SATA) to connect to the system board's 4800 boot connectors 4811.

Illustrated in FIGS. 72B and 72E is the back cage 7200 which includes but is not limited to the following: one or more (e.g. two) vertically positioned drive carriers 800, the left rear locator 7100, the right rear locator 7001, a rear backplate 7000, and the rear backplane 7201. Such vertical positioning of drive carriers 800, and thus storage drives 900 via device connectors 1800, within the back cage 7200 may be provided for via the combined functionality of the left rear locator 7100, the right rear locator 7001, and the rear backplane 7201 via disk receptacles 1700. Each left 7100 and right 7001 rear locator may have a "support surface of elevated height", named a power post 7205. These power posts 7205 may function along with the power bump 7003 in such a way that the power supply 213 may be supported by said posts 7205 and said bump 7003. This support of such power supply 213 may beneficially protect various back cage 7200 components, such as the rear backplane 7201, from damage by said supply 213 during storage server 100 transport.

The left 816 and right 817 column groups, front cage 6800, and the back cage 7200 are embodiments that exemplifies apparatus that facilitates the physical insertion (and removal), in addition to the electrical mating (and unmating), of the drive carrier's 800 attached storage drive 900 to (and from) the corresponding left backplane 812, right backplane 813, front backplane 6200, and rear backplane 7201 respectively. The design of the three types of carrier columns 804-806 may maximize the number of drive carriers 800 within said columns 804-806 by attaching said columns 804-806 directly to the top panel 105 and middle panel 110 while said columns 804-806 also provide structural integrity to the top section 208 which may include removable access panels 600; the design of the front cage 6800 may maximize the number of drive carriers 800 vertically positioned within said cage 6800 when said cage 6800 may only attach to the bottom panel 204 and forgoes attachment to the middle panel 110, via use of the cage top 6501, so that the storage server's 100 assembly may be simplified; and the design of the back cage 7200 may minimize structural members when said cage 7200 may only attach to the bottom panel 204 and may lack the clearance for an equivalent of the cage top 6501.

Illustrated in FIGS. 73A-73F is the power pack 7300 which includes but is not limited to the following: a "supercapacitor charging and control circuit board" which is named a control module 7302, a "supercapacitor mounting and balancing circuit board" which is named an energy module 7303, a "protective shell with an integrated venting relief mechanism" for said modules 7302 and 7303 which is named a super shell 7301, and one or more (e.g. six) truss head screws 7316 and 7317.

As illustrated in FIG. 73A, the power pack's 7300 control module 7302 includes but is not limited to the following connectors and mounting mechanisms: a 4-pin "shrouded header" named a hold-up header 7304 (e.g. MOLEX 70555-0073), the ultracap header 7305 (e.g. MOLEX 70555-0071), a 4-pin charge header 7306, a 14-pin "right angle socket header" (e.g. 0.100″) named a control receptacle 7309, and one or more (e.g. six) "4-40 terminals" (e.g. KEYSTONE 7774) where each is named a screw terminal 7307 and 7308. Analogous to the host backplane's 4600 screw terminals 4626-4628, the screw terminals 7307 and 7308, of a control module 7302, may be repurposed from wire attachment to a novel mounting mechanism. The power pack's 7300 hold-up header 7304 may be connected via cable to the hybrid adapter's 5600 backup header 5008 to provide back-up power.

As illustrated in FIG. 74C, the power pack's 7300 energy module 7303 includes but is not limited to the following: one or more (e.g. five) supercapacitors 7402 (e.g. HB1860-2R5117-R), one or more (e.g. four) active balancing circuits 7521, a "14-pin header" named an energy header 7310, one or more (e.g. two) plated through holes 7403, and an applied foam strip 7311 which may prevent electrical shorts of the soldered supercapacitor 7402 leads and/or active balancing circuits 7521. To wit, a control module's 7302 screw terminals 7308 may be used to physically attach an energy module 7303, via plated through holes 7403, to said module 7302 via truss head screws 7317. The energy module's 7303 supercapacitors 7402 may provide energy storage characteristics that are beneficial to alternative battery technologies, but supercapacitors 7402 still have a finite lifetime and thus may require replacement after a specified time frame (e.g. 5 years). The power pack 7300 may be designed in such a way that minimizes the financial cost and ecological impact of supercapacitor 7402 replacement. In an embodiment, this may result in an energy module 7303 that minimizes ancillary components supporting such supercapacitors 7402 within said module 7303. The power pack 7300 may allow only the energy module 7303, and not the control module 7302 and/or super shell 7301, to be replaced when said capacitors 7402 reach end-of-life.

As illustrated in FIGS. 74D and 74E, the power pack's 7300 super shell 7301 includes but is not limited to the following: one or more (e.g. four) "flush self-clinching press-in threaded metal inserts" (e.g. PEM F-440-1) where each is named a flush nut 7312, one or more (e.g. four) clearance through holes 7401, one or more (e.g. five) "circular holes" (e.g. 0.475″ diameter) where each is named a vent viewer 7404, a "clearance gap" between the supercapacitor's 7402 vents and the vent viewers 7404 which is named an expansion gap 7314, and one or more (e.g. two) "openings" where each is named a screw relief 7315. The expansion gap 7314 may enable aging supercapacitors 7402 to safely increase in length during service life, and the screw reliefs 7315 may allow a super shell 7301 to beneficially contort while being attached to the control module's 7302 screw terminals 3307. To wit, the control module's 7302 screw terminals 7307 may be used to attach the super shell 7301, via clearance holes 7401, to said module 7302 with truss head screws 7316; and the super shell's 7301 flush nuts 7312 may be used by flat head screws 7408 (e.g. M3×0.5 mm and 8 mm length) to affix the power pack 7300 to the bottom panel 204 via countersunk clearance holes 5817. These flush nuts 7312 may be arranged in a 2.5" industry standard mounting pattern 7313 per SFF-8201. A super shell 7301 may be fabricated via various methods, including laser cut aluminum (e.g. 5052) sheet (e.g. 0.062" thick) which is then bent using a "pan and box brake" type device.

The super shell 7301 may be integral to the power pack 7300 design and may provide the supercapacitors 7402 protection from damage during handling while still enabling visual inspection of the supercapacitor's 7402 vent status (e.g. ruptured). As shown in FIG. 73D, the super shell 7301 includes a vent viewer 7404 for each supercapacitor 7402, thus allowing an end-user to view each supercapacitor's 7402 vent (typically implemented as an engraved plus sign in the metal cap). If a supercapacitor 7402 would "vent" the damage may be visible without requiring disassembly of the power pack 7300. Venting is defined as a process which may originate internal to a supercapacitor 7402, but results in gas generation which may force the metal cap to breach externally. Each supercapacitor's 7402 vent may also expand over time and vent viewers 7404 may enable an end-user to monitor such expansion without power pack 7300 disassembly.

Illustrated in FIGS. 74A-74C is a multi-step process to remove (or install) the power pack's 7300 energy module 7303 from (or to) the control module 7302 and attached super shell 7301. The control module 7302 with the attached super shell 7301, via truss head screws 7316, is named a power cabinet 7400. This removal process may include the following: first, unscrew the truss head screws 7317 from the control module's 7302 screw terminals 7308; and second, while holding the power cabinet 7400 stationary pull the energy module 7303 from said cabinet 7400 (as shown in FIG. 74B) in the indicated direction 7405 until the energy header 7310 has disengaged from the control receptacle 7309 and the supercapacitor's 7402 are clear from said cabinet 7400 (as shown in FIG. 74C). The install process may include the following: first, while holding the power cabinet 7400 stationary, and aligning the energy header 7310 to the control receptacle 7309, push the energy module 7303 (as shown in FIG. 74C) in the indicated direction 7406 until the energy header 7310 inserts into the control receptacle 7309 and the energy module's 7303 printed circuit board comes into contact with the control module's 7302 screw terminals 7308 (as shown in FIG. 74A); and second, screw truss head screws 7317 into the control module's 7302 screw terminals 7308. Also, two strips of foam, typically 0.062" thick, may be used to secure an installed energy module's 7303 supercapacitors 4202 by locating one strip 7407 on the super shell 7301 (as indicated with dashed lines in FIGS. 74D and 74E) and a second correspondingly located foam strip on the non-component side of a control module's 7302 printed circuit board. These two foam strips may contour (via the top 304 and bottom 305 sides) to each supercapacitor's 4202 cylindrical shape, thus beneficially immobilizing said capacitors 4202 during storage server 100 transport.

Illustrated in FIG. 74F is an exploded-view of the power pack 7300. This exploded-view depicts the assembly of the power pack 7300 from the following components: a control module 7302, an energy module 7303, a super shell 7301, and six truss head screws 7316 and 7317. Also depicted are the flat head screws 7408 used to affix the power pack 7300 to the bottom panel 204.

As illustrated in FIG. 75, the power pack 7300 is purposefully designed so that the energy module's 7303 supercapacitors 7402 are charged with a charge current that circumvents the device (e.g. hybrid adapter 5600) for which said supercapacitors 7402 provide back-up power. To wit, this charge current, received via the power pack's 7300 charge header 7306, may be sourced from the control board 6400, via a super header 6430; and the charge current provided by said board 6400 may be sourced (i.e. originates) from the storage server's 100 power supply 213. The power pack's 7300 use of a charge current not derived from the device (e.g. hybrid adapter 5600 or the NVRAM device 5000) in which said pack 7300 provides back-up power may enable maximizing the magnitude of said current and thus minimizing the time to "charge completion", which is nominally defined as the voltage in which such supercapacitors 7402 are fully charged.

Also illustrated in FIG. 75 is the power pack 7300 which includes but is not limited to a control module 7302, an energy module 7303, and a super shell 7301. The control module 7302 may include a "two-stage charging circuit" named a charging system 7500, a load switch 7509 (e.g. TPS2590), a SR(Set-Reset) latch 7510 (e.g. SN74LVC2G02), and a temperature logging system 7513. The charging system 7500 may include a "first stage" non-synchronous (e.g. IRF7726/B340A) voltage mode controller 7502 (e.g. TPS40200) which is paired with a current shunt monitor 7503 (e.g. INA206), which may include integrated voltage comparators, to create a constant-current charging circuit which is named a current circuit 7501. The current circuit 7501 may be followed by a "second stage" constant-voltage charging circuit via a low-noise linear regulator (e.g. TPS7A4501), along with ancillary components, which is named a voltage circuit 7504. A voltage circuit 7504 with low output voltage noise and high ripple rejection may be beneficial as supercapacitors 7402 are typically susceptible to internal heat generation when exposed to ripple current. This heat generation may then negatively result in electrolyte decomposition, gas generation, and increased ESR; each of which may lead to a reduced operational lifetime. Also, the current circuit 7501 may require a Schottky diode 7516 (e.g. B340A) between the charge header 7306 and said circuit 7501 to provide reverse current protection, while the voltage circuit 7504 may include a voltage regulator with built-in reverse current protection, such as the TPS7A4501.

The charging system 7500 may be designed in such a way as to expeditiously reach "charge completion" which herein is the nominal steady state voltage (named a back-up voltage) in which supercapacitors 7402, connected in a series, are defined to be fully charged. This back-up voltage (e.g. 9.9V) often results in a voltage for each individual supercapacitor 7402 that is less than said capacitor's 7402 working voltage (e.g. 2.5V) and may be specified to optimize supercapacitor 7402 longevity. This back-up voltage may be achieved by the control module's 7302 charging system 7500 via a mechanism that alternates between a current circuit 7501 and a voltage circuit 7504. In an embodiment, the current circuit 7501 may charge in series supercapacitors 7402 to a voltage (named an over-voltage) which is greater than (or equal to) the back-up voltage. Albeit, this over-voltage will typically not exceed either the surge or working voltage of each individual supercapacitor 7402. Once this "over-voltage" is reached the current circuit 7501 may be disabled and the voltage circuit 7504 may be enabled. Once enabled, the voltage circuit 7504 may decrease this over-voltage until the back-up voltage is reached and then may hold said back-up voltage indefinitely or until the charge header's 7306 input voltage (typically 12V) falls below a specified limit (which will occur when the storage server 100 is intentionally or unintentionally powered off/down). Besides powering off the storage server 100, there may be dedicated fail-safes that trigger the transition from a voltage circuit 7504 back to a current circuit 7501. These fail-safes may be triggered by voltage comparators 7511 and 7512 (e.g. TLV3011) that continually monitor the back-up voltage and charge header 7306 input voltage respectively.

In alternative embodiments (not shown in figures), the charging system 7500 is designed in such a way that a current circuit 7501 charges the in series connected super-capacitors 7402 to a voltage (named an under-voltage) that is less than the back-up voltage, which is then followed by a voltage circuit 7504 that charges said capacitors 7402 from this "under-voltage" to the back-up voltage. This "under-voltage" method may increase the charge completion time compared to the "over-voltage" method which has been detailed herein.

In both the "over-voltage" and "under-voltage" methods, resistor dividers may be used to determine when each method's fail-safe voltages are reached and thus may require said voltages to differ from specified nominal voltages by an amount that is determined to avoid ineffectual toggling between current 7501 and voltage 7504 circuits. For example, the voltage comparator output that determines the transition from the current circuit 7501 to the voltage circuit 7504 may be latched, as with the INA206, and therefore may require a reset prior to transitioning from the voltage circuit 7504 back to the current circuit 7501. This comparator latch reset may be triggered by various fail-safe voltage compara-tors that monitor both the back-up voltage and the charge header 7306 input voltage. To wit, when the charge header 7306 input voltage decreases below a specified limit (e.g. 10.8V) a fail-safe voltage comparator may reset such com-parator latch. Similarly, when the back-up voltage decreases below a specified limit (e.g. 9.5V) a second fail-safe voltage comparator may reset this same comparator latch. Either latch reset, may trigger a transition from the charge system's 7500 second stage back to the initial first stage.

The control module 7302 may indicate various modes of operation via one or more (e.g. four) on-board LEDs, such as: a lit orange LED 7409 to indicate stored temperature values are actively transferring to a MicroSD card 7514, a lit green LED 7410 to indicate a charge current source is connected, a lit yellow LED 7411 to indicate the charge system's 7500 first stage (i.e. charging circuit 7501) is actively charging, and a lit red LED 7412 to indicate a load switch 7509 has encountered a fault condition and will remain lit until said fault condition is remedied.

The power pack 7300 may be able to suppress and thus protect against various transient voltage events with the following components: a TVS device 7518 (e.g. SMCJ12A) which protects a hold-up header's 7304 output voltage, a TVS device 7519 (e.g. SMCJ12A) which protects a charge header's 7306 input voltage, a TVS device 7517 (e.g. SMBJ12A) which protects a load switch 7509 input from positive voltage spikes, and a Schottky diode 7515 (e.g. B340A) which protects a load switch 7509 output from inductive negative voltage spikes. Also, for diagnostic pur-poses the control module 7302 may have one or more test points 7520 (e.g. KEYSTONE 5015).

Both the hybrid adapter 5600 and NVRAM device 5000 are powered by the storage server's 100 power supply 213 during normal operation and only utilize the power pack 7300 if said supply 213 fails or is powered off/down (e.g. unplugged). When either the hybrid adapter 5600 or NVRAM device 5000 does use the power pack 7300, said pack's 7300 load switch 7509 and related circuitry may be integral to such utilization. First, a load switch 7509 may provide short circuit protection for the power pack's 7300 energy module 7303. This short circuit protection may include a non-current-limiting fault threshold, a hard current limit threshold, and/or a fault timer. The non-current-limit-ing threshold may allow an energy module 7303 to supply high currents for short durations without causing a fault or unwanted voltage droop. If the hard current limit is exceeded then a fault condition does occur and the red LED 7412 may be illuminated. Second, the load switch 7509 may provide on/off control of whether the power pack's 7300 energy module 7303 is externally available, via the hold-up header 7304, to either the hybrid adapter 5600 or NVRAM device 5000. An SR latch 7510 (e.g. constructed from two positive-NOR gates) may determine the state (i.e. on/off) of such load switch 7509. Specifically, the output of the SR latch 7510 may dictate whether a load switch 7509 is either enabled or disabled. Each of the two inputs to the SR latch 7510 may be supplied by a dedicated comparator that continuously monitors the back-up voltage. These voltage comparators are operational when either the power supply 213 is properly powered or the energy module 7303 has been charged to a comparator specific minimum working voltage. The inputs to both voltage comparators may be generated with resistor dividers which scale the back-up voltage to each compara-tor's reference voltage. To wit, a first voltage comparator may continuously monitor if the over-voltage (or under-voltage) has been reached and when true will set the SR latch 7510 accordingly to turn-on the load switch 7509. Both the hybrid adapter 5600 and NVRAM device 5000 may require a certain "minimum working voltage", named a cutoff voltage, for operational correctness. Thus, neither the hybrid adapter 5600 nor NVRAM device 5000 should be subjected to voltages below such cutoff voltage. To wit, the second voltage comparator may continuously monitor if this cutoff voltage has been reached and when true will set the SR latch 7510 accordingly to turn-off the load switch 7509. This cutoff voltage is always less than and not equal to the back-up voltage, thus these two comparators are configured to not output true simultaneously, as an SR latch 7510 is not meant to have both inputs set at the same time during normal operation. The SR latch 7510 provides a memory element type function which controls the load switch's 7509 on/off state provided said latch's 7510 minimum working voltage (e.g. 1.65V) is satisfied.

The power pack's 7300 load switch 7509, SR latch 7510, and related circuitry provide a mechanism to electronically disconnect said pack 7300, and thus the energy module 7303, from either the hybrid adapter 5600 or NVRAM device 5000. Additional power switch 5018 circuitry may be located on the hybrid adapter 5600 and the NVRAM device 5000 which may also electronically disconnect the power pack 7300 from said adapter 5600 or said device 5000. Power switch 5018 circuitry may include a power path controller (e.g. LTC4414) which regulates two P-channel MOSFETs (e.g. BSC080P03LS-G) to construct a near "ideal diode" type mechanism. Herein, the charge completion time is defined as the length of time to charge, via the charging system 7500, the energy module 7303 to the back-up volt-age. This charge completion time may be reduced if the power pack 7300 is electronically disconnected after the back-up procedure is complete but before said pack's 7300 cutoff voltage is reached. Herein, the back-up procedure is defined as transferring the data contents of the hybrid adapter's 5600 or NVRAM device's 5000 volatile memory to non-volatile memory, i.e. transferring the contents of DRAM 5002 to NAND 5003. This electrical disconnection, via the power switch 5018, that follows a back-up procedure completion may be desirable as said disconnect may minimize the power drain of said procedure. This power drain minimization may then lead to a reduction in the next charge completion time. Further, the power switch's 5018 inherently lower voltage drop (e.g. 20 mV) may allow both the hybrid adapter 5600 and NVRAM device 5000 to efficiently switch between a power supply 213 (via the backup connector 5006) and the power pack 7300 (via the backup header 5008).

In alternative embodiments (not shown in figures), Schottky diode OR'ing is used in place of the power switch 5018, but said OR'ing imparts a higher and less desirable voltage drop (e.g. 400 mV). The power switch's 5018 minimized voltage drop beneficially enables a larger proportion of the back-up voltage to be used by the back-up procedure or to lower said back-up voltage.

Illustrated in FIG. 75 is an energy module 7303 which is comprised of one or more supercapacitors 7402 connected in series to increase said module's 7303 back-up voltage. These in series supercapacitors 7402 may beneficially use one or more active balancing circuits 7521. These active balancing circuits 7521 may use low power op-amps (e.g. LM321) to ensure the supercapacitors' 7402 individual voltages are nominally equal during charging and may be most effective as the back-up voltage is reached. Active balancing typically protects each supercapacitor 7402 from possible overvoltage that may result from a charging procedure. A supercapacitor's 7402 working voltage may be derated to increase longevity and/or increase the allowable ambient temperature. This voltage derating is defined as charging and then holding a supercapacitor 7402 to a voltage lower than the manufacturer specified working voltage (e.g. 2.5V).

Also illustrated in FIG. 75, the control module 7302 is electrically connected to the energy module 7303 via a control receptacle 7309, right-angle through-hole 14-pin receiver (e.g. PPPC141LGBN-RC), energy header 7310, and a through-hole 14-pin header (e.g. PRPC014SAAN-RC). The inherent inductance of this 14-pin receiver/header pair may be further reduced by assigning seven pins to carry the supercapacitor 7402 current (SC) interleaved with seven pins to carry the return current (RC). To wit, pin assignments may be as follows: pin 1 is RC, pin 2 is SC, pin 3 is RC, pin 4 is SC, pin 5 is RC, pin 6 is SC, pin 7 is RC, pin 8 is SC, pin 9 is RC, pin 10 is SC, pin 11 is RC, pin 12 is SC, pin 13 is RC, and pin 14 is SC. This inductance reduction may be a consequence of the charge/discharge currents flowing in parallel but opposite directions to the resulting return currents, thereby enabling a degree of inductance cancellation.

The control module 7302 may be comprised of one or more supercapacitors 7402 which typically have a finite lifetime. The end-of-life (or failure mode) of each supercapacitor 7402 may be a certain decrease in capacitance and/or a certain increase in ESR (Equivalent Series Resistance), both of which may be directly affected by ambient temperature. For example, a certain manufacturer's guideline states that raising ambient temperature by 10 degree Celsius may decrease a supercapacitor's 7402 lifetime by a factor of two and reducing temperature by 10 degree Celsius may double said capacitor's 7402 expected lifetime. Thus ambient temperature may be a deciding factor in determining the power pack's 7300 warranty period and the terms and conditions of said warranty, e.g. one such warranty condition may be a maximum sustained ambient temperature. Thus a temperature logging system 7513 may log ambient temperature highs and with a sampling rate that leads to properly determined warranty outcomes for the power pack 7300.

The temperature logging system 7513 may include: a microcontroller (e.g. PIC18LF26K22) which is programmed to perform the logging procedure, a temperature sensor (e.g. MCP9808) which communicates to said microcontroller via a bus (e.g. I2C), one or more (e.g. two) NOR devices (e.g. M25P16) which may communicate to said microcontroller via SPI (Serial Peripheral Interface), a MicroSD card connector 7522 (e.g. DM3D-SF), a provided MicroSD card 7514 which may be installed into said connector 7522, and an orange LED 7409 to indicate MicroSD card 7514 writing activity. In an embodiment, such logging system 7513 may be programmed for an ambient temperature sample rate of once per second and with the highest of the prior sixty temperature samples being permanently stored at a rate of once per minute. The stored temperature format may be as follows: one byte per sample, the byte format is [MSB] 7 6 5 4 3 2 1 0 [LSB] or in hexadecimal 0xXX, bit 7 is a sign bit where 0x1 represents less than zero degree Celsius and 0x0 represents greater than or equal to zero degree Celsius, and a sample of 0xFF representing not a temperature but a placeholder for writing a future sample. These temperature values may range from −126 to +127 degree Celsius which is typically within a temperature sensor's range. An aggregate non-volatile NOR capacity of 4 MB may be utilized and thus 4,194,304 samples may be logged allowing seven plus years of permanently stored ambient temperature samples, which desirably exceeds a typical five year product warranty period.

The temperature logging system 7513 may be powered via the charge header 7306. The use of the charge header 7306 as the sole power source allows such logging system 7513 to be automatically disabled when the power supply 213 is powered off/down or lost and thus beneficially avoids using the power pack's 7300 energy module 7303 while a back-up is in progress.

Illustrated in FIGS. 76A and 76E is the bottom base 5911 with the following installed: the front cage 6800, power pack 7300, back cage 7200, one or more (e.g. three) angle brackets 7600-7602 (see FIGS. 76B-76D), and one or more (e.g. six) truss head screws 7609-7614. To wit, a first angle bracket 7601, via a clearance hole 7605, may be attached to the right front locator 6700, via a threaded blind hole 6703, with a truss head screw 7611; a second angle bracket 7602, via a clearance hole 7607, may be attached to the right front locator 6700, via a threaded blind hole 6704, with a truss head screw 7613; and a third angle bracket 7600, via a clearance hole 7604, may be attached to the right rear locator 7001, via a threaded blind hole 7002, with a truss head screw 7609. These angle brackets 7600-7602 may be used to attach, and secure for storage server 100 transport, the host backplane 4600. To wit, a first angle bracket 7601, via a clearance hole 7606, may be attached to the host backplane 4600, via a screw terminal 4626, with a truss head screw 7612; a second angle bracket 7602, via a clearance hole 7608, may be attached to the host backplane 4600, via a screw terminal 4627, with a truss head screw 7614; a third angle bracket 7600, via a clearance hole 7603, may be attached to the host backplane 4600, via a screw terminal 4628, with a truss head screw 7610. The angle brackets 7600-7602 may be fabricated utilizing various methods, including laser cut aluminum (e.g. 5052) sheet (e.g. 0.062" thick) that may be bent using a "pan and box brake" type device and then anodized.

Illustrated in FIG. 77 is the bottom base 5911 with the following installed: the front cage 6800 (with the twelve drive carriers 800 uninstalled), power pack 7300, back cage 7200 (with the two drive carriers 800 uninstalled), system board 4800, host backplane 4600, system extension 5608 (with the two NIC cards 5301 uninstalled), three angle brackets 7600-7602 with six truss head screws 7609-7614, two adapter plates 5700 and 5708 with twenty-four truss head screws 5703-5706, and four male-female hex standoffs 6002 with four corresponding truss head screws 6001. Herein, this specific "configuration of components" is named a bottom build 7700.

Illustrated in FIGS. 78A-78F is a "structural member", named a side panel 7800, which is designed to function as both the left side panel 203 and right side panel 109 of the storage server 100. Minimizing the number of distinct panels in the storage server 100 may be beneficial as such may ease assembly and thus may lower production cost. The side panel 7800 may provide both structural rigidity for the bottom section 209 and electromagnetic interference containment features and capabilities. Certain structural rigidity and EMI containment capabilities may be enabled by one or more (e.g. eleven) threaded blind holes 7801 which may be used to attach the side panel 7800 to the middle panel 110 and one or more (e.g. nine) threaded blind holes 7803 which may be used to attach said panel 7800 to the bottom panel 204. To wit, the left side panel 203, via threaded holes 7801, may be attached to the middle panel 110, via clearance holes 527, with one or more (e.g. eleven) flat head screws 9201; and the left side panel 203, via threaded holes 7803, may be attached to the bottom panel 204, via clearance holes 5808, with one or more (e.g. nine) flat head screws 9300. Further, the right side panel 109, via threaded holes 7801, may be attached to the middle panel 110, via clearance holes 525, with one or more (e.g. eleven) flat head screws 9201; and the right side panel 109, via threaded holes 7803, may be attached to the bottom panel 204, via clearance holes 5809, with one or more (e.g. nine) flat head screws 9300. These flat head screws 9201 and 9300 may beneficially share the same specifications, such as: 18-8 stainless steel, a 6 mm length, and a M2×0.4 mm thread.

As illustrated in FIG. 78F, the side panel's 7800 mass is minimized, while maximizing structural rigidity, by milling particular patterns of panel pockets 511. These patterns may include mirroring about a vertical center line, as indicated via a first dashed line 7811, and/or a horizontal center line, as indicated via a second dashed line 7810. These mirrored patterns may be comprised of replicated panel pockets 511, replicated subpatterns of said pockets 511, or replicated groupings of subpatterns of said pockets 511. In an embodiment, this sub-pattern may be comprised of two right pockets 607 and 608. These pockets 607 and 608 may be positioned such that the hypotenuse of the first right triangle 607 is both parallel to and alongside the hypotenuse of the second right triangle 608 to create a rectangular shaped sub-pattern which may then be replicated and mirrored, e.g. this composited sub-pattern of two pockets 607 and 608 may be instanced five times horizontally and two times vertically and then mirrored about a horizontal center line 7810 and then mirrored again about a vertical center line 7811 to create a total of forty such pocket 607 and 608 subpatterns to be CNC milled into each side panel 7800.

As illustrated in FIGS. 78A and 78B, the side panel 7800 includes one or more (e.g. twenty) EMI slots 7802 and 7804. Each side panel's 7800 EMI slot 7802 (i.e. containment cavity) may enclose the corresponding middle panel's 110 EMI tab 519 and 522 (i.e. containment protrusion). To wit, the left side panel's 203 EMI slots 7802 may enclose the middle panel's 110 EMI tabs 519, and the right side panel's 109 EMI slots 7802 may enclose the middle panel's 110 EMI tabs 522. Each side panel's 7800 EMI slot 7804 may enclose the corresponding bottom panel's 204 EMI tab 5810 and 5812. To wit, the left side panel's 203 EMI slots 7804 may enclose the bottom panel's 204 EMI tabs 5810, and the right side panel's 109 EMI slots 7804 may enclose the bottom panel's 204 EMI tabs 5812. Nominally, these side panels 7800 may be designed in such a way that the EMI slots 7802 and 7804 and the corresponding EMI tabs 519, 522, 5810, and 5812 may be separated by a minimized air gap (e.g. 0.01"). The side panels 7800 may be CNC milled, such air gaps may be nominally specified to account for variances resulting from said machining and to improve fitment (i.e. attachment and removal). Hence, these air gaps beneficially facilitate the attachment and removal of left 203 and right 109 side panels to and from both the middle panel 110 and the bottom panel 204. Further, these EMI slots 7802 and 7804 may have a floor fillet (e.g. 0.025" radius) to ease milling and a wall chamfer (e.g. 0.015") to ease handling. These EMI slots 7802 and 7804 (similarly for the corresponding EMI tabs 519, 522, 5810, and 5812) may share various features: length, width, depth for EMI slots (or height for EMI tabs), and air gap adjustments. However, the inventive aspects of this disclosure apply to a plurality of such feature dimensions.

As illustrated in FIGS. 78A-78F, the side panel 7800 provides EMI containment capability via one or more (e.g. six) non-continuous EMI rails 7806 and 7807 (e.g. three per end). The non-continuous aspect of these EMI rails 7806 and 7807 results from using one or more (e.g. four) "breaks" between said rails 7806 and 7807, each named a dowel break 7812, which enable use of certain "structural pins", each named a dowel pin 7805 (see FIG. 78G), to affix the left 203 and right 109 side panels to the front 108 and back 202 lower panels. The side panel 7800 may have one or more (e.g. four) blind holes, each named a dowel hole 7808 and 7809, which may be used to "removably attach" dowel pins 7805. These dowel pins 7805 may be of 18-8 stainless steel, a ⅛" diameter, and a ¼" length. Dowel holes 7808 and 7809 may be drilled and then bored for a specific interference fit, e.g. resulting in an insertion force that may be generated with a rubber mallet. EMI rails 7806 and 7807 may be positioned at the edge of the surface 7813 from which said rails 7806 and 7807 protrude (see FIGS. 78D and 78E) and differ from the EMI rails 728 and 729 of the left 700 and right 701 panel aligner that are centered (see FIGS. 7B and 7D). The EMI rail 7806 and 7807 edge alignment may result in an beneficial placement of the corresponding EMI channels 7909, 7912, 8206, and 8207. Also, the EMI rails 7806 and 7807 may have a floor fillet 7814 (e.g. 0.025" radius) to ease milling and a wall chamfer 7815 (e.g. 0.015") to ease handling. EMI rails 7806 and 7807 (similarly for the corresponding EMI channels 7909, 7912, 8206, and 8207) may share various features: length, width, height for EMI rails (or depth for EMI channels), and air gap adjustments. However, the inventive aspects of this disclosure apply to a plurality of these feature dimensions.

Illustrated in FIGS. 79A-79D is the storage server's 100 front lower panel 108 which provides but is not limited to the following functionality: structural rigidity and various EMI containment capabilities for the bottom section 209, a "mounting mechanism" of the front hatch 111 which is named a front mount 7900, a rectangular cutout 7908 which may be used to access the attached firmware port 3500, one or more (e.g. two) "irregular cutouts" where each is named a front cutout 7907 and may be utilized to access installed NIC cards 5301, a threaded through hole 7913 to mount (e.g. screw-in) the green LED 3301, a threaded through hole 7914 to mount (e.g. screw-in) the yellow LED 3302, a threaded through hole 7915 to mount (e.g. screw-in) the red LED 3303, a threaded through hole 7916 to mount (e.g. screw-in) the power button 3300, a protruding boss 7905 used as a depth stop for said button 3300 during screw-in, a protruding "irregular boss" named an EMI collar 7906, and the bottom intake 115. These EMI containment capabilities include enclosing the middle panel's 110 EMI tabs 521 with the front lower panel's 108 "EMI containment cavities" where each is named a top EMI slot 7902, and the bottom panel's 204 EMI tabs 5813 with the front lower panel's 108 "EMI containment cavities" where each is named a bottom EMI slot 7904.

Figures 79A, 79B, 79C, 79D:
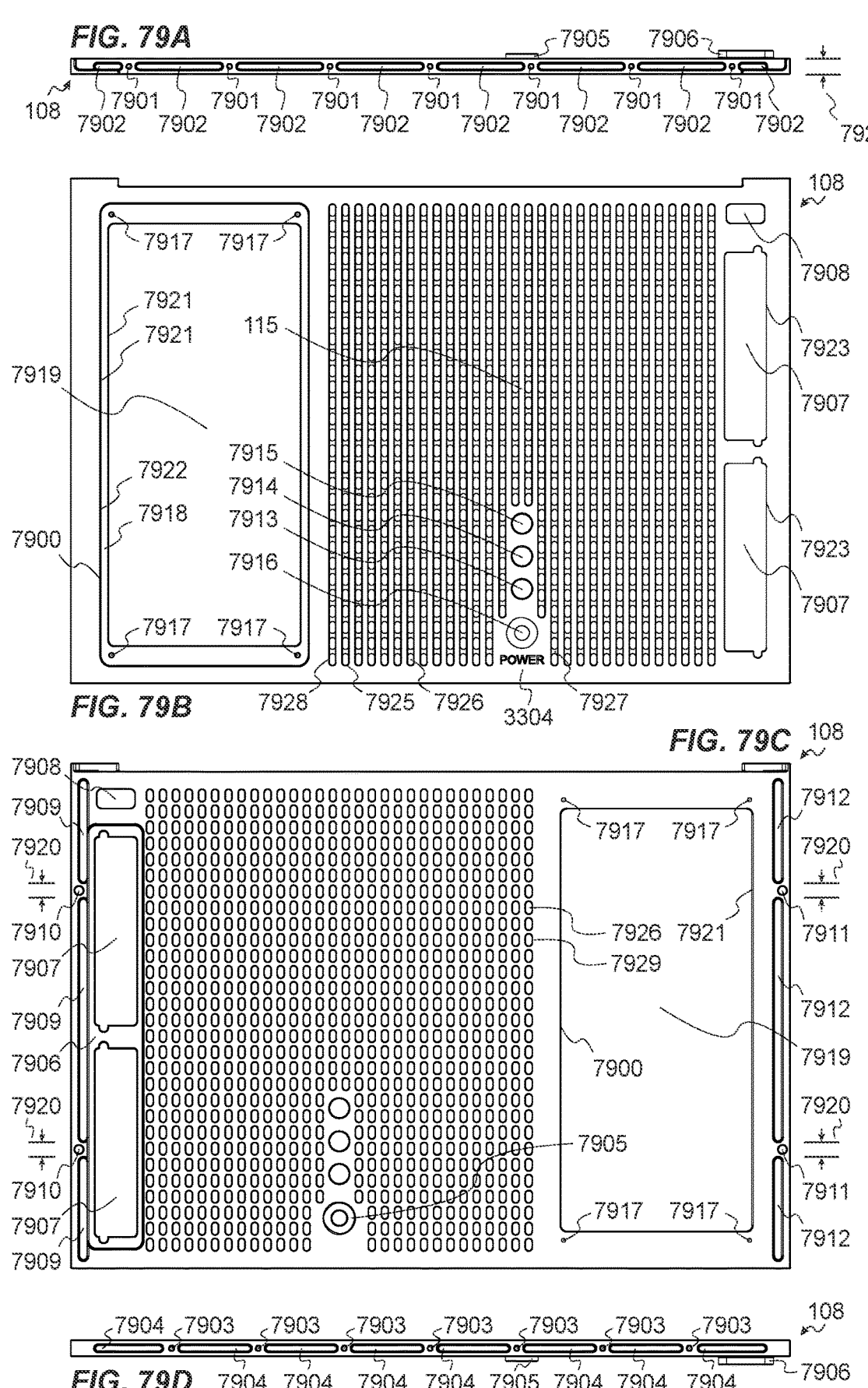

As illustrated in FIGS. 79A and 79D, both structural rigidity and EMI containment capabilities are enabled by one or more (e.g. seven) threaded blind holes 7901 which are used to attach the front lower panel 108 to the middle panel 110 and one or more (e.g. seven) threaded blind holes 7903 which are used to attach said panel 108 to the bottom panel 204. To wit, the front lower panel 108, via threaded holes 7901, may be attached to the middle panel 110, via clearance holes 528, with one or more (e.g. seven) flat head screws 9201; and the front lower panel 108, via threaded holes 7903, may be attached to the bottom panel 204, via clearance holes 5807, with one or more (e.g. seven) flat head screws 9300. The flat head screws 9201 and 9300 may alternatively use aluminum alloys instead of stainless steel alloys, to reduce mass and to allow a degree of color matching to surface treatments used by the storage server's 100 exterior panels (i.e. the top panel 105, front upper panel 106, back upper panel 200, left access panel 201, right access panel 107, middle panel 110, front lower panel 108, back lower panel 202, left side panel 203, right side panel 109, and the bottom panel 204) said screws 9201 and 9300 are used to fasten.

As illustrated in FIG. 79C, the front lower panel 108 provides EMI containment capability via one or more (e.g. six) non-continuous EMI channels 7909 and 7912 (e.g. 3 per side). To wit, one or more (e.g. three) EMI channels 7912, of the front lower panel 108, may enclose one or more (e.g. three) EMI rails 7807, of the left side panel 203; and one or more (e.g. three) EMI channels 7909, of the front lower panel 108, may enclose one or more (e.g. three) EMI rails 7806, of the right side panel 109. The non-continuous aspect of these EMI channels 7909 and 7912 results from using one or more (e.g. four) dowel breaks 7920 between said channels 7909 and 7912. Thereby, these dowel breaks 7920 may enable the use of dowel pins 8103 (see FIG. 78G) to affix the front lower panel 108 to the left 203 and right 109 side panels. For example, dowel breaks 7920 may have one or more (e.g. four) CNC drilled and bored dowel holes 7910 and 7911 which may then be used to "structurally attach" dowel pins 8103. For example, an arbor press may be used to interference fit dowel pins 8103 into dowel holes 7910 and 7911. To wit, one or more (e.g. two) dowel holes 7911, of the front lower panel 108, may be affixed to one or more (e.g. two) dowel holes 7809, of the left side panel 203, with dowel pins 8103; and one or more (e.g. two) dowel holes 7910, of the front lower panel 108, may be affixed to one or more (e.g. two) dowel holes 7808, of the right side panel 109, with dowel pins 8103. Using a handheld rubber mallet, the left 203 and right 109 side panels may be "removably attached" to the press-fit dowel pins 8103 of the front lower panel 108.

As illustrated in FIGS. 79B and 79C, the front lower panel 108 includes the front mount 7900 which is used to attach the front hatch 111. The front hatch 111 may allow end-user access to storage drives 900, via drive carriers 800, located within the front cage 6800. This attachment (or removal) of the front hatch 111 to (or from) the front mount 7900 is shown in FIG. 98B. The front mount 7900 may include the following: one or more (e.g. four) threaded through holes 7917, a flat "coupling surface" which is named a panel ledge 7918, a "rectangular cutout" which is named a front cutout 7919, two planar or substantially planar "surfaces" where each is named an EMI barrier 8006 and 8007, one or more (e.g. three) edge chamfers 7921 (e.g. 0.015"), and a corner fillet 7922 (e.g. 0.005" radius). These chamfers 7921 may ease end-user handling and the fillet 7922 may ease machining. Also, EMI barriers 8006 and 8007 may be parallel or substantially parallel to each other and may be perpendicular or substantially perpendicular to a panel ledge 7918.

As illustrated in FIGS. 79A-79D, the front lower panel 108 includes front cutouts 7907 and an EMI collar 7906. The front cutouts 7907 may provide access to network backplane 5300 installed NIC cards 5301. The NIC cards 5301 may include various types of EMI fingers 5609 (e.g. LAIRD LT18CJ1920 and LAIRD LT18CJ1921) and 5610 (e.g. LAIRD LT18DP1911). The EMI collar 7906 may dimensionally extend the "walls", each named a front wall 7923, of these front cut-outs 7907 such that these EMI fingers 5609 and 5610 make an electrical connection with said walls 7923 and thereby enable the EMI containment intended from said fingers 5609 and 5610.

As illustrated in FIGS. 80A and 80B, the front mount's 7900 panel ledge 7918 is CNC milled into the front lower panel 108. The panel ledge 7918 may be machined to the midpoint (e.g. 0.125") of the front lower panel's 108 depth 7924 (e.g. 0.25"). The front hatch 111 may also have a flat "coupling surface", named a hatch ledge 8002, that may correspond to the panel ledge 7918. The hatch ledge 8002 may be similarly machined to the midpoint (e.g. 0.125") of the front hatch's 111 depth 8008 (e.g. 0.25"). Both the panel 7918 and hatch 8002 ledges may be designed in such a way that when the front hatch 111 is attached, via socket head screws 8101, to the front mount 7900 said ledges 7918 and 8002 may be in contact and thereby provide a measure of EMI containment as a consequence of said contact. To further mitigate EMI resulting from this junction of the front hatch 111 and the front mount 7900, the panel 7918 and hatch 8002 ledges may be planar or substantially planar and when coupled may be parallel or substantially parallel. EMI mitigation measures may include minimizing air gaps (e.g. 0.005") between the front mount's 7900 EMI barriers 8006 and 8007 and the front hatch's 111 EMI barriers 8003 and 8004 respectively.

As illustrated in FIGS. 80C-80F, the front hatch 111 includes the following: a hatch ledge 8002, one or more (e.g. four) counterbored clearance holes 8001, two EMI barriers 8003 and 8004 which may be parallel or substantially parallel to each other and perpendicular or substantially perpendicular to said ledge 8002, an air intake 112, and a "clearance cavity" which is named a trigger cavity 8005. A trigger cavity 8005 may provide a clearance space between the front hatch 111 and carrier triggers 2502, which may protrude from drive carriers 800 located in the front cage 6800. Both the removal and attachment of the front hatch 111 may be accomplished by an end-user and is often performed to replace the failed storage drive 900. To wit, the front hatch 111, via clearance holes 8001, may be attached to the front mount 7900, via threaded holes 7917, with low-profile socket head screws 8101 (e.g. 18-8 stainless steel, hex drive, M2×0.4 mm thread, and 5 mm length).

As illustrated in FIGS. 81A and 81D, a "collection of components", named a front lower assembly 8100, includes but is not limited to the following: the front lower panel 108, front hatch 111, one or more (e.g. four) low-profile socket head screws 8101, power button 3300 (see FIG. 81B), green LED 3301 (see FIG. 81C), yellow LED 3302, red LED 3303, and one or more (e.g. four) interference fit dowel pins 8103.

Also illustrated in FIGS. 81A and 81D, the front lower assembly 8100, via the hatch intake 112 and bottom intake 115, ingests a majority of the intake air for the bottom section's 209 bottom flow 207. The first air intake 112 may be comprised of one or more (e.g. thirteen) vertically oriented intake grooves 7925, and each of these intake grooves 7925 may be comprised of one or more (e.g. twenty-five) intake holes 7926 and one or more (e.g. twenty-four) intake spans 7927. The second air intake 115 may be comprised of one or more (e.g. thirty) vertically oriented intake grooves 7925, and each of these intake grooves 7925 may be comprised of one or more (e.g. up to twenty-nine) intake holes 7926 and one or more (e.g. up to twenty-eight) intake spans 7927. These intake grooves 7925 may be CNC milled (i.e. slotted) to a certain depth, and said depth is typically less than the front lower panel's 108 thickness 7924 (e.g. 0.25"). Further, to ease handling both the intake grooves 7925 (on the exterior side) and the intake holes 7926 (on the interior side) may be chamfered 7928 and 7929 (e.g. 0.01") respectively. These intakes 112 and 115 (via intake holes 7926, intake spans 7927, and intake grooves 7925) may function beneficially as an integrated (i.e. built-in) particulate filter for the bottom flow 207 of the bottom section 209. Also, the front lower panel 108 may have "EMI extensions", each named an EMI ear 8102. These ears 8102 may improve EMI containment within the bottom section 209 via the beneficial corner placement.

Illustrated in FIGS. 82A-82D is the storage server's 100 back lower panel 202 which provides but is not limited to the following functionality: structural rigidity and various EMI containment capabilities for the bottom section 209, a "mounting mechanism" of the back hatch 205 which is named a back mount 8200, a "mounting mechanism" of the security hatch 206 which is named a security mount 8300, a rectangular cutout 8211 which may be used to access certain power supply 213 components, one or more (e.g. four) counterbored clearance holes 8210 which may be arranged in an industry standard ATX hole pattern to mount the power supply 213, the power exhaust 211 which may correspond to and channel the power supply's 213 exhaust grille 8426, the bottom exhaust 212 which may be partitioned into quadrants where each quadrant supports an embedded fan feature, and the back intake 215. These EMI containment capabilities include enclosing the middle panel's 110 EMI tabs 520 with the back lower panel's 202 "EMI containment cavities" where each is named a top EMI slot 8202, and the bottom panel's 204 EMI tabs 5811 with the back lower panel's 202 "EMI containment cavities" where each is named a bottom EMI slot 8204.

Figures 82A, 82B, 82C, 82D:
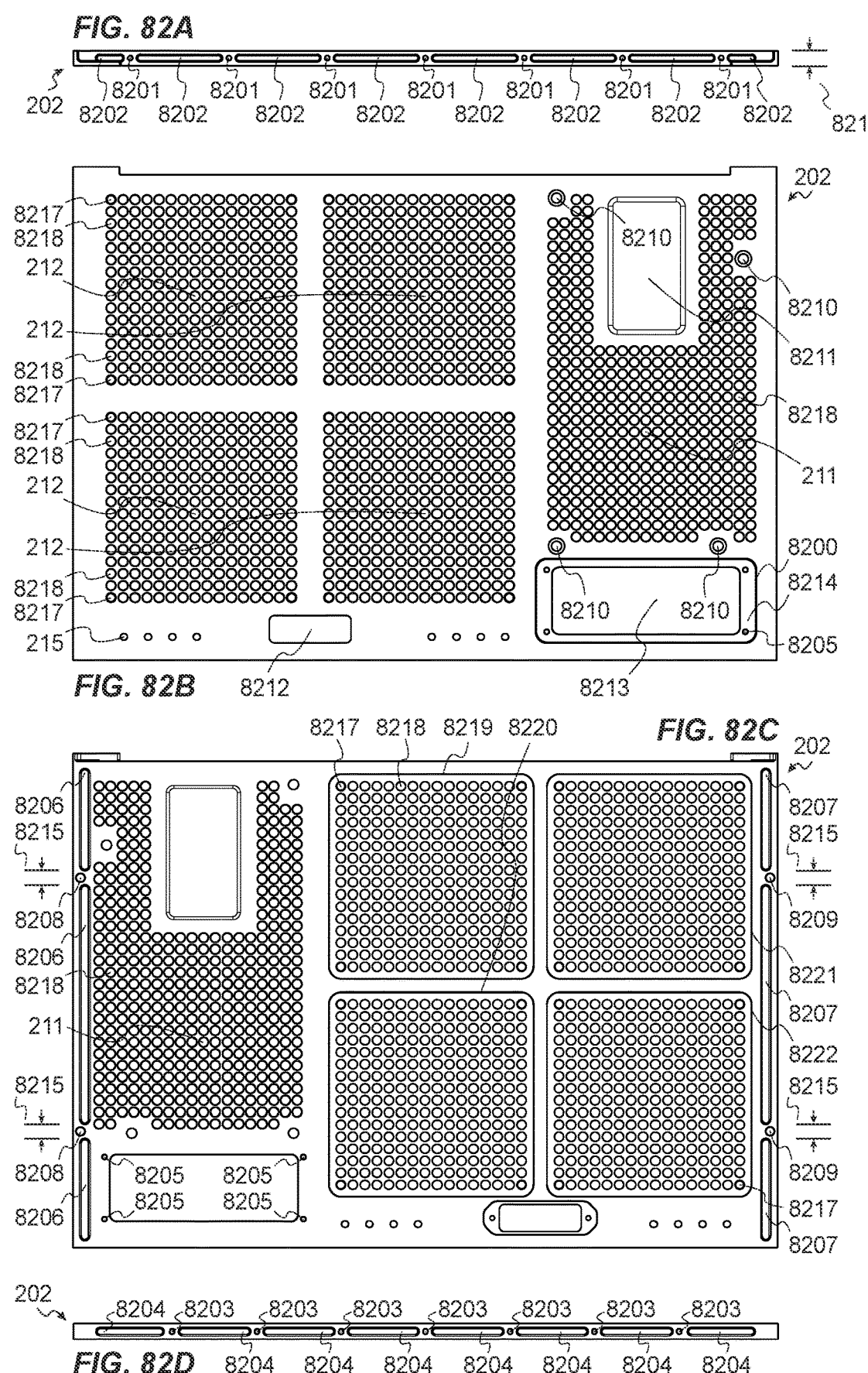

As illustrated in FIGS. 82A and 82D, both structural rigidity and EMI containment capabilities are enabled by one or more (e.g. seven) threaded blind holes 8201 which are used to attach the back lower panel 202 to the middle panel 110 and one or more (e.g. seven) threaded blind holes 8203 which are used to attach said panel 202 to the bottom panel 204. To wit, the back lower panel 202, via threaded holes 8201, may be attached to the middle panel 110, via clearance holes 526, using one or more (e.g. seven) flat head screws 9201; and the back lower panel 202, via threaded holes 8203, may be attached to the bottom panel 204, via clearance holes 5806, utilizing one or more (e.g. seven) flat head screws 9300.

As illustrated in FIG. 82C, the back lower panel 202 provides EMI containment capability via one or more (e.g. six) non-continuous EMI channels 8206 and 8207 (e.g. three per side). To wit, one or more (e.g. three) EMI channels 8206, of the back lower panel 202, may enclose one or more (e.g. three) EMI rails 7806, of the left side panel 203; and one or more (e.g. three) EMI channels 8207, of the back lower panel 202, may enclose one or more (e.g. three) EMI rails 7807, of the right side panel 109. The non-continuous aspect of these EMI channels 8206 and 8207 results from using one or more (e.g. four) dowel breaks 8215 between said channels 8206 and 8207. Thereby, these dowel breaks 8215 may enable the use of dowel pins 8511 (see FIG. 78G) to affix the back lower panel 202 to the left 203 and right 109 side panels. For example, these dowel breaks 8215 may have one or more (e.g. four) CNC drilled and bored dowel holes 8208 and 8209 which may then be used to "structurally attach" dowel pins 8511. For example, an arbor press may be used to interference fit dowel pins 8511 into dowel holes 8208 and 8209. To wit, one or more (e.g. two) dowel holes 8208, of the back lower panel 202, may be attached to one or more (e.g. two) dowel holes 7808, of the left side panel 203, with dowel pins 8511; and one or more (e.g. two) dowel holes 8209, of the back lower panel 202, may be attached to one or more (e.g. two) dowel holes 7809, of the right side panel 109, with dowel pins 8511. Using a handheld rubber mallet, the left 203 and right 109 side panels may be "removably attached" to the press-fit dowel pins 8511 of the back lower panel 202.

As illustrated in FIGS. 82B and 82C, the back lower panel 202 includes the back mount 8200 which is used to attach the back hatch 205. The back hatch 205 may allow end-user access to storage drives 900, via drive carriers 800, located within the back cage 7200. This attachment (or removal) of the back hatch 205 to (or from) the back mount 8200 is shown in FIG. 98A. The back mount 8200 may include the following: one or more (e.g. four) threaded through holes 8205, a panel ledge 8214 which may be utilized to couple with the back hatch 205, the back cutout 8213, two EMI barriers 8307 and 8308, one or more (e.g. three) edge chamfers 8315 (e.g. 0.015"), and a corner fillet 8314 (e.g. 0.005" radius). These edge chamfers 8315 may ease end-user handling and the corner fillet 8314 may ease milling. Further, these EMI barriers 8307 and 8308, which may improve both EMI containment and EMC testing, may be parallel or substantially parallel to each other and may be perpendicular or substantially perpendicular to a panel ledge 8214.

As illustrated in FIGS. 83A and 83B, the back mount's 8200 panel ledge 8214 is CNC milled into the back lower panel 202. The panel ledge 8214 may be machined to the midpoint (e.g. 0.125") of the back lower panel's 202 depth 8216 (e.g. 0.25"). The back hatch 205 may include a hatch ledge 8302 which may be a flat coupling surface that corresponds to a panel ledge 8214. The hatch ledge 8302 may be similarly CNC milled to the midpoint (e.g. 0.125") of the back hatch's 205 depth 8313 (e.g. 0.25"). Both the panel 8214 and hatch 8302 ledges may be designed in such a way that when the back hatch 205 is attached, via socket head screws 8506, to the back mount 8200 said ledges 8214 and 8302 may be in contact and thereby provide a measure of EMI containment as a consequence of said contact. To further mitigate EMI resulting from this junction of the back hatch 205 and the back mount 8200, the panel 8214 and hatch 8302 ledges may be planar or substantially planar and when coupled may be parallel or substantially parallel. EMI mitigation measures may include minimizing air gaps (e.g. 0.005") between the back mount's 8200 EMI barriers 8307 and 8308 and the back hatch's 205 EMI barriers 8303 and 8304 respectively.

As illustrated in FIGS. 83C-83F, the back hatch 205 includes but is not limited to the following: a hatch ledge 8302, one or more (e.g. four) counterbored clearance holes 8301, two EMI barriers 8303 and 8304 which may be parallel or substantially parallel to each other and perpendicular or substantially perpendicular to said ledge 8302, a trigger cavity 8305, and two or more drilled and chamfered blind holes 8306 which may be utilized to reduce the mass (i.e. weight) of said hatch 205. The trigger cavity 8305 may provide a clearance space between the back hatch 205 and carrier triggers 2502, which may protrude from drive carriers 800 located in the back cage 7200. Both the removal and attachment of the back hatch 205 may be accomplished by an end-user and is typically performed to replace the failed storage drive 900. To wit, the back hatch 205, via clearance holes 8301, may be attached to the back mount 8200, via threaded holes 8205, with low-profile socket head screws 8506 (e.g. 18-8 stainless steel, hex drive, M2×0.4 mm thread, and a 5 mm length).

As illustrated in FIGS. 82B and 82C, the back lower panel 202 includes the security mount 8300 which is used to attach the security hatch 206. The security hatch 206 may enable the storage server 100 to be secured to a "desktop" such that the theft of said server 100 may be pre-vented. The security hatch 206 attachment (or removal) to (or from) the security mount 8300 is depicted in FIG. 98A. The security mount 8300 may include the following: one or more (e.g. two) threaded blind holes 8311, a panel ledge 8312 which may be utilized to couple with the security hatch 206, a security cutout 8212, and two EMI barriers 8309 and 8310. These EMI barriers 8309 and 8310, which may improve both EMI mitigation and EMC, may be parallel or substantially parallel to each other and may be perpendicular or substantially perpendicular to a panel ledge 8312.

As illustrated in FIGS. 83A and 83B, the security mount's 8300 panel ledge 8312 is CNC milled into the back lower panel 202. The panel ledge 8312 may be machined to the midpoint (e.g. 0.125") of the back lower panel's 202 depth 8216 (e.g. 0.25"). The security hatch 206 may include the hatch ledge 8602 which may be a flat coupling surface that corresponds to the panel ledge 8312. The hatch ledge 8602 may be similarly CNC milled to a depth 8512 (e.g. 0.125") that may equal a panel ledge's 8312 depth. Both the panel 8312 and hatch 8602 ledges may be designed in such a way that when the security hatch 206 is attached, via flat head screws 8606, to the security mount 8300 said ledges 8312 and 8602 may be in contact and thereby provide a measure of EMI containment as a consequence of said contact. To further mitigate EMI resulting from this junction of the security hatch 206 and the security mount 8300, the panel 8312 and hatch 8602 ledges may be planar or substantially planar and when coupled may be parallel or substantially parallel. EMI mitigation measures may include minimizing the air gaps between the security mount's 8300 EMI barriers 8309 and 8310 and the security hatch's 206 EMI barriers 8604 and 8605 respectively.

Illustrated in FIGS. 84A-84C is an ATX standardized power supply 213, which includes but is not limited to the following: one or more (e.g. eighteen) "integrated output connectors" where each is named a source connector 5401-5418 of various pin counts, an AC input plug 8420 (e.g. IEC 60320 C14), a rocker switch 8421 to toggle said supply 213 on/off, an exhaust grille 8426, an internally mounted psu axial fan 8422 which may be monitored and controlled by said power supply 213, power link 8427, and one or more (e.g. four) threaded through holes 8419 (e.g. 6-32 thread) which may be positioned and patterned as defined by the ATX12VO Rev2.0 Design Guide. To wit, the power supply 213, via threaded holes 8419, may be attached to the back lower panel 202, via clearance holes 8210, with low-profile socket head screws 8507 (e.g. 18-8 stainless steel, hex drive, 6-32 thread, and a 0.25" length). The power supply 213 may rectify alternating current (i.e. AC), sourced from an AC input plug 8420, to direct current (i.e. DC) which may then be utilized to power, via source connectors 8401-8418, the storage server 100, via one or more (e.g. eighteen) sheathed cables. To wit, source connectors 8401 and 8402 provide two voltage pins (e.g. 12V) and two ground pins (i.e. GND) to the head connector 6405 (via a first cable) and source connectors 8401 and 8402 also provide a pin for an active-low signal PS_ON #, a pin for an active-high signal PWR_OK, a voltage pin (e.g. +5V SB), and a ground pin to the head connector 6406 (via a second cable); the eight source connectors 8403-8410 each provide four voltage pins (e.g. 12V) and four ground pins to the eight buck connectors 4308 via eight sheathed cables; two source connectors 8411 and 8412 each provide four voltage pins (e.g. 12V) and four ground pins to the two input connectors 4825 via two sheathed cables; the three source connectors 8413-8415 each provide three voltage pins (e.g. 12V) and three ground pins to three backplane connectors 4623 via three sheathed cables; the source connector 8416 may provide three voltage pins (e.g. 12V) and three ground pins to the backup connector 5006 via a sheathed cable; and the two source connectors 8417 and 8418 may each provide three voltage pins (e.g. 12V) and three ground pins to each of two control connectors 6404 and 6407 via two sheathed cables. Further, the power link 8427 (e.g. CORSAIR LINK) may be connected, via a cable, to the control board's 6400 power header 6434. The power supply 213 may have standardized dimensions (per ATX specifications) herein named a power height 8424 (e.g. 150 mm), power width 8425 (e.g. 86 mm), and power depth 8423 (e.g. 200 mm). Notably, the power depth 8423 dimension may vary, hence the storage server 100 may be designed in such a way that various power depths 8423 (e.g. 140 mm-200 mm) may be purposely supported. The increased power depth 8423 may allow higher output wattages from the power supply 213 and thereby may beneficially enable an increased number of storage drives 900 to be used by the storage server 100 resulting in an increased storage capacity of said server 100. Also, prior to the power button 3300 being pressed, but after the power supply's 213 rocker switch 8421 is toggled on and the AC input plug 8420 is cabled to a powered outlet, the control board 6400 is powered via a standby voltage (e.g. +5VSB or +12VSB) provided by the source connectors 8401 and 8402 via the head connector 6406.

The efficacy of EMI containment and mitigation mechanisms (e.g. front hatch 111 coupled to the front mount 7900, the back hatch 205 coupled to the back mount 8200, and the security hatch 206 coupled to the security mount 8300) may be dependent on the surface finish and underlying material of the components which provide such mechanisms. For example, when the base material is an aluminum alloy (e.g. 6061) the surface finish may involve complete component coverage with an electrically conductive electroless nickel plating (e.g. matte-black) or partial component coverage (via selective masking) with a non-conductive anodizing type finish. Selective masking, often utilized with non-conductive finishes, results in masked areas retaining the electrical conductivity of the underlying material, typically a prerequisite for EMI containment. Selective masking may include various types and methods, such as rubber plugs (or gaskets) and adhesive tapes. For example, coupled areas that may be selectively masked include panel ledges 7918, 8214, and 8312 and the corresponding hatch ledges 8002, 8302, and 8602. Herein when relating to EMI containment/mitigation, the term "coupled" describes when hatches 111, 205, and 206 are installed and secured to corresponding mounts 7900, 8200, and 8300 with fasteners.

As illustrated in FIGS. 85B, 86A, and 86D, the security hatch 206 includes but is not limited to the following: a hatch ledge 8602, one or more (e.g. two) countersunk clearance holes 8601, two EMI barriers 8604 and 8605 which may be parallel or substantially parallel to each other and perpendicular or substantially perpendicular to said ledge 8602, and a "cylindrical cavity" which is named a cable cavity 8513. The cable cavity 8513 (e.g. 0.28" diameter) may be utilized by various cable locking mechanisms to secure the storage server 100. Neither the removal nor the attachment of the security hatch 206 may be performed without disassembly of the storage server's 100 bottom section 209. To wit, the security hatch 206, via clearance holes 8601, may be attached to the security mount 8300, via threaded holes 8311, with flat head screws 8606 (e.g. 18-8 stainless steel, hex drive, M2×0.4 mm thread, and a 5 mm length).

In alternative embodiments (not shown in figures), the flat head screws 8606 may use various tamper-resistant fastener drive styles such as a six-lobe with center post.

As illustrated in FIGS. 85A and 85C, a "collection of components", named a back lower assembly 8500, includes but is not limited to the following: the back lower panel 202, back hatch 205, one or more (e.g. four) low-profile socket head screws 8506 (e.g. M2×0.4 mm thread and 5 mm length), security hatch 206, one or more (e.g. two) flat head screws 8606 (e.g. M2×0.4 mm thread and 5 mm length), power supply 213, one or more (e.g. four) low-profile socket head screws 8507 (e.g. 6-32 thread and 0.25" length), one or more (e.g. four) bottom axial fans 8501-8504 (e.g. 9LG0812P4G001) where each may have a frame size of 80 mm×80 mm×25 mm, one or more (e.g. sixteen) pan head screws 8505 (e.g. 6-32 thread and 1.125" length), and one or more (e.g. four) interference fit dowel pins 8511.

As illustrated in FIGS. 85A and 85C, the back lower assembly 8500, via the power exhaust 211 and bottom exhaust 212, expels the majority of the exhaust air from the bottom section's 209 bottom flow 207. These exhausts 211 and 212 may be comprised of CNC drilled exhaust holes 8218. Certain exhaust holes 8218 may be arranged to form fan quadrants 8219-8222, each such quadrant 8219-8222 may correspond to a mounted bottom axial fan 8501-8504 respectively. On both the exterior (see FIG. 82B) and interior (see FIG. 82C) sides of the back lower panel 202, the exhaust holes 8218 may be CNC chamfered to ease handling and bottom axial fan 8501-8504 installation. On this interior side of the back lower panel 202, these fan quadrants

8219-8222 may be located within the confines of corresponding CNC milled pockets, that may be of various depths (e.g. 0.1"). These fan quadrants 8219-8222 may use such pockets to spatially embed bottom axial fans 8501-8504 when mounted. Embedded bottom axial fans 8501-8504 may beneficially maximize the operable volumetric space within the storage server's 100 bottom section 209. Each fan quadrant 8219-8222 may have one or more (e.g. four) threaded through holes 8217 which correspond and center to the installation holes of the bottom axial fan 8501-8504. These threaded holes 8217 may allow bottom axial fans 8501-8504 to be mounted, using pan head screws 8505, to the back lower panel 202. Further, the diameters of both the threaded holes 8217 and the exhaust holes 8218 may be similar, which may result in each fan quadrant 8219-8222 having an aesthetically uniform hole pattern. Certain exhaust holes 8218 may be arranged separately to form the power exhaust 211 which may align with and channel the air expelled from the power supply's 213 exhaust grill 8426. Also, the back lower panel 202 may have two EMI ears 8508 which may improve EMI containment within the bottom section 209.

In the top section 208, the top flow 104 (see FIGS. 38A and 38B) generated by the four top axial fans 808-811, is parallel or substantially parallel to both the left flow 904 (see FIG. 13A) and right flow 907 (see FIG. 14A); and in the bottom section 209, the bottom flow 207 (see FIG. 85C) is primarily generated by both the four bottom axial fans 8501-8504 and psu axial fan 8422 (see FIG. 84B). The psu axial fan 8422 generates an "airflow" which is named a psu flow 8510 (see FIG. 85A). The psu flow 8510, while originally generated in the right side 303 to left side 302 direction by the psu axial fan 8422, may be channeled via the interior of the power supply 213 to supplement the bottom flow 207. Further, in the bottom section 209 the cpu flow 4809 and host flow 6000 may each flow from the right side 303 to the left side 302 and thus flow perpendicular or substantially perpendicular to the bottom flow 207.

Illustrated in FIGS. 86B, 86C, 86E, and 86F is an "assembly of components" which is named a middle build 8600. The middle build 8600 may include the following: the front lower assembly 8100, the left side panel 203, the right side panel 109, the back lower assembly 8500 (with the power supply 213 and four socket head screws 8507 uninstalled), and eight dowel pins 8103 and 8511. These dowel pins 8103 and 8511 may be press-fit (e.g. via an arbor press) into the front lower panel 108 and back lower panel 202 respectively, and then press-fit (e.g. via a rubber mallet) into the left side panel 203 and right side panel 109. As a result of the dowel pin 8103 and 8511 fitment procedure, the middle build 8600 may acquire the structural integrity and/or rigidity to allow said build 8600 to be properly aligned with and then lowered 8603 onto the bottom build 7700, where said build's 7700 glider surfaces 5910 are placed upon (i.e. parallel to) the work surface in which said builds 7700 and 8600 are being assembled (i.e. joined). Next, while holding the middle build 8600 and bottom build 7700 aligned (i.e. clearance holes 5808, 5806, 5809, and 5807 centered to threaded holes 7803, 8203, 7801, and 7903 respectively) and engaged (i.e. EMI tabs 5810-5813 inserted into EMI slots 7804, 8204, 7802, and 7904 respectively) both may then be flipped over and screwed together using 32 flat head screws 9300. Finally, the middle 8600 and bottom 7700 builds may be flipped back to the bottom build's 7700 starting assembly orientation such that the power supply 213 may then be mounted utilizing the four socket head screws 8507.

Illustrated in FIGS. 87A-87F is an "assembly of components" which is named a partial exoskeleton 8700. The partial exoskeleton 8700 may include the following: the bottom base 5911, thirty-two flat head screws 9300, the front lower panel 108, the front hatch 111, four low-profile socket head screws 8101, the left side panel 203, the right side panel 109, the back lower panel 202, the back hatch 205, four low-profile socket head screws 8506, the security hatch 206, two flat head screws 8606, and eight dowel pins 8103 and 8511. When the middle panel 110 is attached (see FIG. 92) to the partial exoskeleton 8700, with thirty-six flat head screws 9201, a type of "exoskeleton", named an exoskeleton shell 9200, is assembled. The exoskeleton shell 9200 may provide integrated attachment mechanisms, integrated EMI containment mechanisms, and a beneficial structural integrity and/or rigidity for the storage server's 100 bottom section 209. The exoskeleton shell 9200 may beneficially maximize the operable volumetric space within such section 209.

The storage server's 100 bottom section 209 (see FIG. 4C) may be comprised of the following components: the middle panel 110 (which may be shared with the top section 208), thirty-six flat head screws 9201, power board 4101, four male-female hex standoffs 4216, four truss head screws 4102, front lower assembly 8100, left side panel 203, right side panel 109, back lower assembly 8500, front cage 6800, power pack 7300, back cage 7200, fourteen shoulder screws 9400, four flat head screws 7408, system board 4800, four male-female hex standoffs 6002, four truss head screws 6001, host backplane 4600, system extension 5608, two adapter plates 5700 and 5708, twenty-four truss head screws 5703-5706, three angle brackets 7600-7602, six truss head screws 7609-7614, bottom base 5911, and thirty-two flat head screws 9300. The bottom section 209, via the exoskeleton shell 9200, may be structurally self-supporting without the top section 208, but storage server 100 operation typically requires both sections 208 and 209.

Illustrated in FIGS. 88A-88F is the storage server's 100 bottom section 209, via six orthographic projections, with certain components removed for the purpose of interior visibility. To wit, FIG. 88A is the bottom section 209 with the middle panel 110 and thirty-six flat head screws 9201 removed; FIG. 88B is the bottom section 209 with the bottom base 5911, thirty-two flat head screws 9300, fourteen shoulder screws 9400, and four flat head screws 7408 removed; FIG. 88C is the bottom section 209 with the left side panel 203 removed; FIG. 88D is the bottom section 209 with the right side panel 109 removed; FIG. 88E is the bottom section 209 with the front lower panel 108, the front hatch 111, four socket head screws 8101, the power button 3300, the green LED 3301, the yellow LED 3302, and the red LED 3303 removed; and FIG. 88F is the bottom section 209 with the back lower panel 202, the back hatch 205, four low-profile socket head screws 8506, the security hatch 206, two flat head screws 8606, and four low-profile socket head screws 8507 removed.

Illustrated in FIGS. 89A and 89B is the storage server's 100 bottom section 209, via two perspective projections, with certain components removed for the purpose of interior visibility. To wit, FIG. 89A is the bottom section 209 with the middle panel 110, thirty-six flat head screws 9201, the power board 4101, four male-female hex standoffs 4216, four truss head screws 4102, the front lower panel 108, the front hatch 111, four socket head screws 8101, two dowel pins 8103, the power button 3300, the green LED 3301, the yellow LED 3302, the red LED 3303, the right side panel 109, and sixteen flat head screws 9300 removed; and FIG.

89B is the bottom section 209 with the middle panel 110, thirty-six flat head screws 9201, the power board 4101, four male-female hex standoffs 4216, four truss head screws 4102, the back lower panel 202, the back hatch 205, four socket head screws 8506, the security hatch 206, two flat head screws 8606, two dowel pins 8511, the left side panel 203, sixteen flat head screws 9300, and four socket head screws 8507 removed.

Illustrated in FIG. 90 is an exploded-view of the following components: the top panel 105, backing plate 901, ten vertical locators 801-803, middle panel 110, and twenty-five shoulder screws 9001. These components comprise a subset of an endoskeleton frame 9000 and this exploded-view depicts the attachment of the top panel 105, via twenty-five shoulder screws 9001, to said frame 9000. The use of shoulder screws 9001 is desirable, as said screws 9001 may provide the positional accuracy and precision which may be beneficial for the eight carrier columns 804-806 to facilitate drive carrier 800 insertions and storage drive 900 matings. Shoulder screws 9001 may be paired with corresponding clearance holes 3001-3004 that may be drilled and bored to various tolerances to further optimize this positional accuracy and precision.

Illustrated in FIG. 91 is an exploded-view of the following components: the top panel 105, backing plate 901, ten vertical locators 801-803, middle panel 110, and twenty-five shoulder screws 9100. These components comprise a subset of an endoskeleton frame 9000 and this exploded-view depicts the attachment of the middle panel 110, via twenty-five shoulder screws 9100, to said frame 9000. The use of shoulder screws 9100 is desirable, as said screws 9100 may provide the positional accuracy and precision which may be beneficial for the eight carrier columns 804-806 to facilitate drive carrier 800 insertions and storage drive 900 matings. Shoulder screws 9100 may be paired with corresponding clearance holes 501-504 which may be drilled and bored to various tolerances to further optimize this positional accuracy and precision.

Illustrated in FIG. 92 is an exploded-view of an exoskeleton shell 9200. This exploded-view depicts the attachment of the middle panel 110, via thirty-six flat head screws 9201, to such shell 9200. The placement, spacing, and quantity of these flat head screws 9201 may be integral to containing EMI that may originate from the storage server's 100 bottom section 209.

Illustrated in FIG. 93 is an exploded-view of an exoskeleton shell 9200 (excluding four case risers 5900 and twelve flat head screws 5906). This exploded-view depicts the attachment of the bottom panel 204, via thirty-two flat head screws 9300, to the exoskeleton shell 9200. The placement, center to center spacing, and quantity of flat head screws 9300 may be integral to containing EMI that originates from the storage server's 100 bottom section 209.

Illustrated in FIG. 94 is an exploded-view of the following components: the bottom panel 204, cage top 6501, left front locator 6600, right front locator 6700, front backplate 6500, six flat head screws 6802, left rear locator 7100, right rear locator 7001, rear backplate 7000, power bump 7003, fan mount 5400, and fourteen shoulder screws 9400. This exploded-view depicts the assembly of such components. The use of shoulder screws 9400 is desirable, as said screws 9400 provide the positional accuracy and precision which is beneficial for the front 6800 and back 7200 cages to facilitate drive carrier 800 insertions and storage drive 900 matings. These shoulder screws 9400 may be paired with corresponding clearance holes 5801-5803, 5805, and 5818-

5820 which may be CNC drilled and then CNC bored to various tolerances to further optimize such positional accuracy and precision.

In alternative embodiments (not shown in figures), certain bilateral symmetries of the storage server 100 occur about a coronal plane instead of the median plane 1505. This coronal plane is defined by containing the centerlines 3015 and 5822 of the top panel 105 and bottom panel 204 respectively. These centerlines 3015 and 5822 equally bisect their respective panel 105 and 204.

Illustrated in FIG. 95A is an exploded-view of the following components: the top panel 105, two left panel aligners 700, two right panel aligners 701, and four shoulder screws 3112 and 3213. This exploded-view depicts the attachment of the top panel 105, via four shoulder screws 3112 and 3213, to such panel aligners 700 and 701. The use of shoulder screws 3112 and 3213 is desirable, as said screws 3112 and 3213 provide the positional accuracy and precision which is beneficial for the left 201 and right 107 access panels (and front 106 and back 200 upper panels) to be end-user removed and reattached. These shoulder screws 3112 and 3213 may be paired with the corresponding clearance holes 716 and 718 which may be drilled and bored to various tolerances to further optimize this positional accuracy and precision.

Illustrated in FIG. 95B is an exploded-view of the following components: the middle panel 110, two left panel aligners 700, two right panel aligners 701, and four shoulder screws 3112 and 3213. This exploded-view depicts the attachment of the middle panel 110, via four shoulder screws 3112 and 3213, to panel aligners 700 and 701. The use of shoulder screws 3112 and 3213 is desirable, as said screws 3112 and 3213 provide the positional accuracy and precision which is beneficial for the left 201 and right 107 access panels (and front 106 and back 200 upper panels) to be end-user removed and reattached. These screws 3112 and 3213 may be paired with corresponding clearance holes 717 and 719 that may be drilled and bored to various tolerances to further optimize positional accuracy and precision.

Illustrated in FIG. 96A is an exploded-view of the following components: the front upper panel 106, four panel magnets 814, left panel aligner 700, right panel aligner 701, and ten shoulder screws 3112. This exploded-view depicts the attachment of the front upper panel 106, via six shoulder screws 3112, to two panel aligners 700 and 701; and the attachment of two panel magnets 814 per such panel aligner 700 and 701. The use of shoulder screws 3112 is desirable, as said screws 3112 provide the positional accuracy and precision which is beneficial for the left 201 and right 107 access panels to be end-user removed and reattached. Such shoulder screws 3112 may be paired with corresponding clearance holes 712 and 713 which may be drilled and bored to various tolerances to further optimize such positional accuracy and precision, and thereby resulting in the top section's 208 improved EMI containment.

Illustrated in FIG. 96B is an exploded-view of the following components: the back upper panel 200, four panel magnets 814, left panel aligner 700, right panel aligner 701, and ten shoulder screws 3213. This exploded-view depicts the attachment of the back upper panel 200, via six shoulder screws 3213, to two panel aligners 700 and 701; and the attachment of two panel magnets 814 per such panel aligner 700 and 701. The use of shoulder screws 3213 is desirable, as said screws 3213 provide the positional accuracy and precision which is beneficial for the left 201 and right 107 access panels to be end-user removed and reattached. Shoulder screws 3213 may be paired with corresponding clearance holes 712 and 713 which may be drilled and bored to various tolerances to further optimize such positional accuracy and precision, and thereby resulting in the top section's 208 improved EMI containment.

Illustrated in FIG. 97A is an exploded-view of the following components: the right access panel 107, left panel aligner 700, right panel aligner 701, and eight panel magnets 614 and 814. This exploded-view depicts the attachment (via opposite pole magnetic forces) of the right access panel 107, via four panel magnets 614, to panel aligners 700 and 701 via four panel magnets 814.

Illustrated in FIG. 97B is an exploded-view of the following components: the left access panel 201, left panel aligner 700, right panel aligner 701, and eight panel magnets 614 and 814. This exploded-view depicts the attachment (via opposite pole magnetic forces) of the left access panel 201, via four panel magnets 614, to panel aligners 700 and 701 via four panel magnets 814.

Illustrated in FIG. 98A is an exploded-view of the following components: the back lower panel 202, back hatch 205, four low-profile socket head screws 8506, security hatch 206, and two flat head screws 8606. This exploded-view depicts the attachment of the back hatch 205, via four socket head screws 8506, to the back lower panel's 202 back mount 8200; and also the attachment of the security hatch 206, via two flat head screws 8606, to said panel's 202 security mount 8300. In addition, once attached the back hatch's 205 exterior face, which may be parallel to the back face 301, may be coplanar with the back lower panel's 202 exterior face, which is also typically parallel to said back face 301. Furthermore, once attached the security hatch's 206 interior face, which may be parallel to the back face 301, may be coplanar with the back lower panel's 202 interior face, which is also typically parallel to said back face 301.

Illustrated in FIG. 98B is an exploded-view of the following components: the front lower panel 108, front hatch 111, and four low-profile socket head screws 8101. This exploded-view depicts the attachment of the front hatch 111, via four socket head screws 8101, to the front lower panel's 108 front mount 7900. Once attached, the front hatch's 111 exterior face, that may be parallel to the front face 300, may be coplanar with the front lower panel's 108 exterior face, that may also be parallel to said face 300. This coplanarity of the exterior faces of the front hatch 111 and back hatch 205 may enable the storage server's 100 dimensions (e.g. box width 101, box depth 102, and box height 103) to be minimized.

Illustrated in FIG. 9A is an exploded-view of the following components: the front lower panel 108, front hatch 111, four low-profile socket head screws 8101, left side panel 203, right side panel 109, and four dowel pins 8103. This exploded-view depicts the attachment of the front lower panel 108 to both the left 203 and right 109 side panels via four dowel pins 8103, said pins 8103 may improve the bottom section's 209 EMC.

Illustrated in FIG. 99B is an exploded-view of the following components: the back lower panel 202, back hatch 205, four low-profile socket head screws 8506, security hatch 206, two flat head screws 8606, left side panel 203, right side panel 109, and four dowel pins 8511. This exploded-view depicts the attachment of the back lower panel 202 to both the left 203 and right 109 side panels via four dowel pins 8511, said pins 8511 may desirably improve the EMI containment of the storage server's 100 bottom section 209.

Illustrated in FIG. 100A is an exploded-view of the following components: the front lower panel 108, front hatch 111, four low-profile socket head screws 8101, left side panel 203, right side panel 109, and four dowel pins 8103. This exploded-view depicts the attachment of the front lower panel 108 to both the left 203 and right 109 side panels via four dowel pins 8103, said pins 8103 may improve the bottom section's 209 EMI containment and thus improve the storage server's 100 EMI signature.

Illustrated in FIG. 100B is an exploded-view of the following components: the back lower panel 202, back hatch 205, four low-profile socket head screws 8506, security hatch 206, two flat head screws 8606, left side panel 203, right side panel 109, and four dowel pins 8511. This exploded-view depicts the attachment of the back lower panel 202 to both the left 203 and right 109 side panels via four dowel pins 8511, said pins 8511 may improve the bottom section's 209 EMI containment and thus improve the storage server's 100 EMI signature.

Illustrated in FIG. 101A is an exploded-view of the following components: the middle panel 110, right side panel 109, and thirty-six flat head screws 9201. Further, illustrated in FIG. 101B is an exploded-view which depicts the attachment of the middle panel 110 to the right side panel's 109 threaded blind holes 7801 via one or more flat head screws 9201, said screws 9201 may improve the bottom section's 209 EMI containment and thus improve the storage server's 100 EMI signature.

Illustrated in FIG. 101D is an exploded-view of the following components: the bottom panel 204, left side panel 203, and thirty-two flat head screws 9300. Further, illustrated in FIG. 101C is an exploded-view which depicts the attachment of the bottom panel 204 to the left side panel's 203 threaded blind holes 7803 via one or more flat head screws 9300, said screws 9300 may improve the bottom section's 209 EMI containment and thus improve the storage server's 100 EMI signature.

Illustrated in FIG. 102A is an exploded-view of the following components: the middle panel 110, front lower panel 108, front hatch 111, four low-profile socket head screws 8101, four dowel pins 8103, and thirty-six flat head screws 9201. Further, illustrated in FIG. 102B is an exploded-view which depicts the attachment of the middle panel 110 to the front lower panel's 108 threaded blind holes 7901 via one or more flat head screws 9201, said screws 9201 may improve the bottom section's 209 EMI containment capability and thus improve the storage server's 100 EMI signature.

Illustrated in FIG. 102D is an exploded-view of the following components: the bottom panel 204, back lower panel 202, back hatch 205, four low-profile socket head screws 8506, security hatch 206, two flat head screws 8606, four dowel pins 8511, and thirty-two flat head screws 9300. Further, illustrated in FIG. 102C is an exploded-view which depicts the attachment of the bottom panel 204 to the back lower panel's 202 threaded blind holes 8203 via one or more flat head screws 9300, said screws 9300 may improve the bottom section's 209 EMI containment and thus improve the storage server's 100 EMI signature.

Illustrated in FIG. 103A is an exploded-view of the following components: the middle panel 110, back lower panel 202, back hatch 205, four low-profile socket head screws 8506, security hatch 206, two flat head screws 8606, four dowel pins 8511, and thirty-six flat head screws 9201. Further, illustrated in FIG. 103B is a detail-view which depicts the attachment of the middle panel 110 to the back lower panel's 202 threaded blind holes 8201 via one or more flat head screws 9201, said screws 9201 may improve the bottom section's 209 EMI containment and thus improve the storage server's 100 EMI signature.

Illustrated in FIG. 103D is an exploded-view of the following components: the bottom panel 204, front lower panel 108, front hatch 111, four low-profile socket head screws 8101, four dowel pins 8103, and thirty-two flat head screws 9300. Further, illustrated in FIG. 103C is a detail-view which depicts the attachment of the bottom panel 204 to the front lower panel's 108 threaded blind holes 7903 via one or more flat head screws 9300, said screws 9300 may improve the bottom section's 209 EMI containment capability and thus improve the storage server's 100 EMI signature.

Illustrated in FIG. 104C is a partial-view of the storage server's 100 top section 208. Illustrated in FIG. 104A is a detail-view of the corner junction of the middle panel 110, front upper panel 106, and the right access panel 107. Illustrated in FIG. 104B is a detail-view of the opposing corner junction which includes the middle panel 110, back upper panel 200, and the left access panel 201. These corner junctions may benefit the top section's 208 EMI containment capability.

Illustrated in FIG. 105B is a partial-view of the storage server's 100 bottom section 209. Illustrated in FIG. 105C is a detail-view of the corner junction of the middle panel 110, front lower panel 108, and the right side panel 109. Illustrated in FIG. 105A is a detail-view of the opposing corner junction which includes the middle panel 110, back lower panel 202, and the left side panel 203. These corner junctions may benefit the bottom section's 209 EMI containment capability.

Illustrated in FIG. 106 are optimized storage drive 900 differential signal assignments for the left backplane's 812 left connector group 1311, host adapter's 4500 host connector 4502, and the left custom cable's 10600 connector. These optimized differential signal assignments may allow optimized differential signal printed circuit board routing on the left backplane 812. This printed circuit board routing may allow a decrease in differential trace length and thus improved signal integrity (e.g. jitter/crosstalk reduction).

Illustrated in FIG. 107 are optimized storage drive 900 differential signal assignments for the right backplane's 813 right connector group 1411, host adapter's 4500 host connector 4502, and the right custom cable's 10700 connector. These optimized differential signal assignments may allow optimized differential signal printed circuit board routing on the right backplane 813. This routing may allow a decrease in differential trace length and thus improved signal integrity (e.g. jitter/crosstalk reduction).

Illustrated in FIGS. 108A and 108B is the storage server 100 which includes both hardware 10810 and software 10800 which is utilized as a Desktop NAS device. In FIG. 108A, the hardware 10810 includes the host adapter 4500, configured as a PCIe multi-function endpoint, which integrates two distinct types of storage media: storage drives 900 and memory modules 4507. The host adapter 4500, which is multi-function, includes both the HBA device 10807 and the RAM drive 10808. Each of these two host adapter 4500 PCIe Functions are attached to proprietary device drivers: the HBA device 10807 (e.g. PCIe F0) utilizes the HBA device driver 10804 and the RAM drive 10808 (e.g. PCIe F1) utilizes the RAM device driver 10805. In FIG. 108A, the software 10800 includes one or more (e.g. two) device drivers (e.g. HBA device driver 10804 and RAM device driver 10805) which direct separate PCIe Functions (e.g. HBA device 10807 and RAM drive 10808) of the host adapter 4500 respectively. The host adapter's 4500 device drivers 10804 and 10805 also interact with an integrated software stack which includes: an operating system 10803 (e.g. LINUX or FREEBSD), a file system 10802 (e.g. ZFS or ZFS+), and network file sharing protocols 10801 (e.g. NFS and/or SMB). In FIG. 108B, the hardware 10810 includes the hybrid adapter 5600, configured as a PCIe multi-function endpoint, which integrates three distinct types of storage media: DRAM 5002, NAND 5003, and storage drives 900 (depicted in FIG. 108B as "SSD"). The multi-function hybrid adapter 5600 includes the NVRAM drive 10809 and HBA device 10807. The NVRAM drive 10809 will typically require the attached power pack 7300 to supply hold-up power for when the storage server 100 is unexpectedly powered off. The power pack 7300 supplies backup current to the hybrid adapter 5600 and receives charge current from a power supply 213. Each of these hybrid adapter 5600 PCIe Functions are attached to proprietary device drivers: the NVRAM drive 10809 (e.g. PCIe F0) utilizes the NVRAM device driver 10806 and the HBA device 10807 (e.g. PCIe F1) utilizes the HBA device driver 10804. In FIG. 108B, the software 10800 includes one or more (e.g. two) device drivers (e.g. HBA device driver 10804 and NVRAM device driver 10806) which direct separate PCIe Functions (e.g. HBA device 10807 and NVRAM drive 10809) of the hybrid adapter 5600 respectively. The host adapter's 4500 device drivers 10804 and 10806 also interact with an integrated software stack which includes: an operating system 10803 (e.g. LINUX or FREE-BSD), a file system 10802 (e.g. ZFS or ZFS+), and network file sharing protocols 10801 (e.g. NFS and/or SMB). The hardware 10810 and software 10800 operates in unison to provide the storage server's 100 network file sharing capability to one or more clients, these clients utilize said server 100 for varied purposes, such as video post-production and generative AI (Artificial Intelligence) type applications. So herein, the RAM drive 10808 is volatile storage as said drive 10808 uses memory modules 4507, while the NVRAM drive 10809 is non-volatile storage as said drive 10809 is designed so that both volatile and non-volatile storage media is paired in such a way as to perform in a manner consistent with non-volatile storage.

The storage server 100 may use various mechanisms for EMI containment, these mechanisms may be machined (e.g. CNC milled) into individual panels during said panel's fabrication. For example, EMI tabs 509 and EMI slots 611 are an EMI containment mechanism utilizing two separate, but intended to interlock, parts which when combined (i.e. assembled) provide for said containment. One of these two interlocking parts may utilize a convex shape (e.g. EMI tab 509) while the second corresponding part may be concave (e.g. EMI slot 611). This EMI containment capability may be improved with the addition of various conductive materials inserted into and/or affixed onto the base surface (i.e. bottom) of each concave part (e.g. EMI slot 611). Such materials may be purposed to enable an electrically conductive path between these parts (e.g. EMI tab 509 and EMI slot 611). These materials may include knitted mesh gaskets of various types, such as: wire mesh with a wire mesh core and wire mesh with an elastomer core. For example, gaskets may be placed via compression and/or affixed via a pressure sensitive adhesive (e.g. 3M F9469PC) to the substantially planer base or bottom of each EMI slot 611. By positioning these gaskets within the interior (i.e. at the planer base) of the concave part (e.g. EMI slot 611), and not the convex part (e.g. EMI tab 509), of each EMI containment mechanism these knitted wire mesh gaskets may be protected from damage and/or displacement resulting from end-user attachment, removal, and/or handling. These wire mesh gaskets, which may be round or rectangle shaped, will typically feature galvanic compatibility with the material (e.g. aluminum 6061) from which such panels are fabricated. In addition to EMI slots 611, knitted wire mesh gaskets may be used with other EMI containment mechanisms, such as: EMI gutters 3005 and 3006; EMI sheaths 3105, 3106, 3205, and 3206; EMI channels 612, 613, 3103, 3104, 3203, 3204, 7909, 7912, 8206, and 8207; and EMI slots 7802, 7804, 7902, 7904, 8202, and 8204. In place of the wire mesh gaskets: metal spring fingers, fabric shielding gaskets, particle-filled silicone gaskets, form-in-place gaskets, and other mechanisms may also be used to contain EMI by creating electrically conductive paths between various parts and/or panels used by the storage server 100.

Illustrated in FIG. 109 is an embodiment of the storage server's 100 power-on procedure. This process (i.e. storage server's 100 power-on procedure) starts with step 10900 and then this process proceeds to step 10901. In step 10901, the storage server's 100 power supply 213 is attached via a power cord to a powered electrical receptacle, and then this process proceeds to step 10902. In step 10902, the power supply's 213 rocker switch 8421 is determined to be either toggled ON or OFF; if said switch 8421 is toggled ON then this process proceeds to step 10903, and if said switch 8421 is toggled OFF then this process repeats step 10902. In step 10903, the power supply's 213 standby voltage (e.g. +5V or +12V) is utilized to power-up control board 6400 circuitry, which includes certain microcontrollers 6402, and continues to be powered provided said supply's 213 rocker switch 8421 remains toggled ON, and then this process proceeds to step 10904. In step 10904, the storage server's 100 power button 3300 is determined to be either pressed or not pressed; if said button 3300 is pressed then this process proceeds to step 10905, and if said button 3300 is not pressed then this process repeats step 10904. In step 10905, the ATX PS_ON #signal is activated (i.e. pulled low) by control board 6400 circuitry which results in certain power rails (e.g. 12V) of the power supply 213 to be initiated, and then this process proceeds to step 10906. In step 10906, as these power rails (e.g. 12V) are ramped to their designated (i.e. nominal) voltages the storage server's 100 top axial fans 808-811, host axial fans 5501-5504, and bottom axial fans 8501-8504 start to spin while fan control signals (e.g. PWM/TACH) for the top section's 208 top axial fans 808-811 are provided by the left 812 and right 813 backplanes and while separate fan control signals for the bottom section's 209 host axial fans 5501-5504 and bottom axial fans 8501-8504 are provided by the control board 6400, and then this process proceeds to step 10907. In step 10907, the ATX PWR_OK signal is determined to be either activated (i.e. pulled high) or not activated (i.e. pulled low); if this PWR_OK signal is activated then this process proceeds to step 10908, and if this PWR_OK signal is not activated then this process repeats step 10907. In step 10908, a determination is made of whether a minimum configuration of top axial fans 808-811 are operational and within specification in the top section 208 and whether a minimum configuration of host axial fans 5501-5504 and bottom axial fans 8501-8504 are operational and within specification in the bottom section 209; if the storage server's 100 top axial fans 808-811, host axial fans 5501-5504, and bottom axial fans 8501-8504 are within specification and satisfy a predetermined minimum configuration then this process proceeds to step 10909, and if said top axial fans 808-811, host axial fans 5501-5504, and bottom axial fans 8501-8504 are not within specification and/or do not satisfy a predetermined minimum configuration then this process proceeds to step 10910. In step 10909, the control board 6400 resets a temperature sensor fault timer and then this process proceeds to step 10914. In step 10914, temp sensors 1706, 1708, and 4401 are determined to be either within or not within specification, which is defined as said sensors 1706, 1708, and 4401 being both operational and returning (e.g. once per second) temperature readings within a predetermined temperature range; if said sensors 1706, 1708, and 4401 are within specification then this process proceeds to step 10915, and if said sensors 1706, 1708, and 4401 are not within specification (e.g. overheating storage server 100) then this process proceeds to step 10913. In step 10915, the accelerator sequencing subprocedure (see FIG. 110) is performed and then this process proceeds to step 10916. In step 10916, the ATX PS_ON #signal is determined to be either deactivated (i.e. pulled high) or not deactivated; if said signal is deactivated then this process proceeds to step 10911, and if said signal is not deactivated then this process proceeds to step 10917. In step 10917, the storage device sequencing subprocedure (see FIG. 111) is performed and then this process proceeds to step 10918. In step 10918, the ATX PS_ON #signal is determined to be either deactivated (i.e. pulled high) or not deactivated; if said signal is deactivated then this process proceeds to step 10911, and if said signal is not deactivated then this process proceeds to step 10919. In step 10919, the storage control sequencing subprocedure (see FIG. 112) is performed and then this process proceeds to step 10920. In step 10920, the ATX PS_ON #signal is determined to be either deactivated (i.e. pulled high) or not deactivated; if said signal is deactivated then this process proceeds to step 10911, and if said signal is not deactivated then this process proceeds to step 10921. In step 10921, the system control sequencing subprocedure (see FIG. 113) is performed and then this process proceeds to step 10922. In step 10922, the ATX PS_ON #signal is determined to be either deactivated (i.e. pulled high) or not deactivated; if said signal is deactivated then this process proceeds to step 10911, and if said signal is not deactivated then this process proceeds to step 10923. In step 10923, the storage server's 100 power-on procedure has succeeded and is indicated with the solidly lit green LED 3301 and then this process proceeds to step 10924. In step 10910, the ATX PS_ON #signal is deactivated (i.e. pulled high), and then this process proceeds to step 10911. In step 10911, the storage server's 100 power-on procedure has failed with the one or more fault conditions causing said failure indicated via one or more solidly lit and/or blinking LEDs 3301-3303, and then this process proceeds to step 10924. In step 10913, the control board's 6400 temperature sensor fault timer is determined to be either expired or not expired; if said timer is expired then this process proceeds to step 10912, and if said timer is not expired then this process proceeds to step 10914. In step 10912, the ATX PS_ON #signal is deactivated (i.e. pulled high), and then this process proceeds to step 10911. In step 10924, this process ends.

In alternate embodiments (not shown in figures), the ordering of the accelerator sequencing subprocedure 10915, storage device sequencing subprocedure 10917, storage control sequencing subprocedure 10919, and system control sequencing subprocedure 10921 within the storage server's 100 power-on procedure (see FIG. 109) is varied (i.e. all possible permutations). Further, one or more subprocedures (e.g. accelerator sequencing subprocedure 10915) is removed from the storage server's 100 power-on procedure or is allowed to fail without deactivating the ATX PS_ON #signal.

Consecutive (i.e. not concurrent) execution of the various sequencing subprocedures (see FIG. 109) within the storage server's 100 power-on procedure may minimize the magnitude and/or duration of aggregate inrush current, thereby enabling said server 100 to avoid exceeding the rated output current of said server's 100 power supply 213. This reduction in aggregate inrush current during the power-on procedure may beneficially enable said server 100 to utilize additional hardware components, such as GPUs and/or AI inferencing accelerators, without exceeding the power supply's 213 rated output current during said power-on procedure. But existing PCIe plug-in card based hardware (e.g. NVIDIA RTX 4090) may not be capable of being power sequenced during the boot process with various server 100 components (e.g. system board 4800, power pack 7300, hybrid adapter 5600, host adapters 4500, and storage drives 900). The enablement of a PCIe card's on-board switching regulators to utilize similar PWR_EN and PWR_GOOD circuitry may provide such sequencing capability which may then facilitate one or more sequencing subprocedures to be added to the power-on procedure. These additional sequencing subprocedures may be performed in between the storage control sequencing subprocedure 10919 and the system control sequencing subprocedure 10921 and may also use (or not use) ATX PS_ON #deactivation to exit such power-on procedure. Further, a plurality of hardware types may use similar PWR_EN and PWR_GOOD circuitry to enable said hardware to also be sequenced in this power-on procedure. Therefore, the storage server's 100 power-on procedure may beneficially minimize aggregate inrush current during the boot process so said current is not constraining the type and/or the number of hardware components said server 100 may utilize.

Illustrated in FIG. 110 is an embodiment of the accelerator sequencing subprocedure 10915 which is one of multiple subprocedures orchestrated by the storage server's 100 power-on procedure (see FIG. 109). This process (i.e. accelerator sequencing subprocedure 10915) starts with step 11000 and then this process proceeds to step 11001. In step 11001, the control board 6400 resets the charge power fault timer and then transmits the PWR_EN signal to the power pack 7300, and then this process proceeds to step 11002. In step 11002, the control board's 6400 charge power fault timer is determined to be either expired or not expired; if said fault timer is expired then this process proceeds to step 11012, and if said fault timer is not expired then this process proceeds to step 11003. In step 11003, the power pack's 7300 supercapacitors 7402 are determined to either have achieved or not achieved charge completion; if said supercapacitors 7402 have achieved charge completion then this process proceeds to step 11004, and if said supercapacitors 7402 have not achieved charge completion then this process proceeds to step 11002. In step 11004, the power pack 7300 transmits the PWR_GOOD signal back to the control board 6400, and then this process proceeds to step 11005. In step 11005, the power pack 7300 is successfully powered-up, and then this process proceeds to step 11006. In step 11006, the control board 6400 resets the hybrid power fault timer and then transmits the PWR_EN signal to the hybrid adapter's 5600 hybrid converter 5015, and then this process proceeds to step 11007. In step 11007, the control board's 6400 hybrid power fault timer is determined to be either expired or not expired; if said fault timer is expired then this process proceeds to step 11012, and if said fault timer is not expired then this process proceeds to step 11008. In step 11008, the hybrid adapter's 5600 hybrid converters 5015 are determined to either have achieved or not achieved output stability; if said converters 5015 have achieved output stability then this process proceeds to step 11009, and if said converters 5015 have not achieved output stability then this process proceeds to step 11007. In step 11009, the hybrid adapter's 5600 hybrid converter 5015 transmits the PWR_GOOD signal back to the control board 6400, and then this process proceeds to step 11010. In step 11010, the hybrid adapter 5600 is successfully powered-up and then this process proceeds to step 11011. In step 11012, the ATX PS_ON #signal is deactivated (i.e. pulled high), and then this process proceeds to step 11011. In step 11011, this process ends.

Illustrated in FIG. 111 is an embodiment of the storage device sequencing subprocedure 10917 which is one of multiple subprocedures orchestrated by the storage server's 100 power-on procedure (see FIG. 109). This process (i.e. storage device sequencing subprocedure 10917) starts with step 11100 and then this process proceeds to step 11101. In step 11101, the control board 6400 resets the card power fault timer and then transmits the PWR_EN signal to the power card's 6300 card converter 6301, and then this process proceeds to step 11102. In step 11102, the control board's 6400 card power fault timer is determined to be either expired or not expired; if said fault timer is expired then this process proceeds to step 11112, and if said fault timer is not expired then this process proceeds to step 11103. In step 11103, the power card's 6300 card converter 6301 is determined to either have achieved or not achieved output stability; if said converter 6301 has achieved output stability then this process proceeds to step 11104, and if said converter 6301 has not achieved output stability then this process proceeds to step 11102. In step 11104, the power card's 6300 card converter 6301 transmits the PWR_GOOD signal back to the control board 6400 and then this process proceeds to step 11105. In step 11105, storage drives 900 located in the front 6800 and back 7200 cages are successfully powered-up, and then this process proceeds to step 11106. In step 11106, the control board 6400 resets the buck power fault timer and then transmits the PWR_EN signal to the power board 4101, and then this process proceeds to step 11107. In step 11107, the control board's 6400 buck power fault timer is determined to be either expired or not expired; if said fault timer is expired then this process proceeds to step 11112, and if said fault timer is not expired then this process proceeds to step 11108. In step 11108, the power board's 4101 buck converter sequencing subprocedure is determined to either have completed or not completed; if said subprocedure has completed then this process proceeds to step 11109, and if said subprocedure has not completed then this process proceeds to step 11107. In step 11109, the control board 6400 receives the PWR_GOOD signal from the power board 4101, and then this process proceeds to step 11110. In step 11110, storage drives 900 located in the left 902 and right 903 subsections are successfully powered-up, and then this process proceeds to step 11111. In step 11112, the ATX PS_ON #signal is deactivated (i.e. pulled high) and then this process proceeds to step 11111. In step 11111, this process ends.

Illustrated in FIG. 112 is an embodiment of the storage control sequencing subprocedure 10919 which is one of multiple subprocedures orchestrated by the storage server's 100 power-on procedure. This process (i.e. storage control sequencing subprocedure 10919) starts with step 11200 and then this process proceeds to step 11201. In step 11201, the control board 6400 resets the host power fault timer and then transmits the PWR_EN signal to the sequence controller 4619, and then this process proceeds to step 11202. In step

11202, the control board's 6400 host power fault timer is determined to be either expired or not expired; if said fault timer is expired then this process proceeds to step 11212, and if said fault timer is not expired then this process proceeds to step 11203. In step 11203, the host backplane's 4600 adapter sequencing subprocedure is determined to either have completed or not completed; if said subprocedure has completed then this process proceeds to step 11204, and if said subprocedure has not completed then this process proceeds to step 11202. In step 11204, a minimum configuration of host adapters 4500 are successfully powered-up, and then this process proceeds to step 11205. In step 11205, the sequence controller 4619 resets the switch power fault timer and then transmits the PWR_EN signal to the host switch's 4610 switch converter 4615, and then this process proceeds to step 11206. In step 11206, the sequence controller's 4619 switch power fault timer is determined to be either expired or not expired; if said fault timer is expired then this process proceeds to step 11212, and if said fault timer is not expired then this process proceeds to step 11207. In step 11207, the host switch's 4610 switch converters 4615 are determined to either have achieved or not achieved output stability; if said converters 4615 have achieved output stability then this process proceeds to step 11208, and if said converters 4615 have not achieved output stability then this process proceeds to step 11206. In step 11208, the host switch's 4610 switch converter 4615 transmits the PWR_GOOD signal back to the sequence controller 4619, and then this process proceeds to step 11209. In step 11209, the sequence controller 4619 transmits the PWR_GOOD signal back to the control board 6400, and then this process proceeds to step 11210. In step 11210, the host switch 4610 is successfully powered-up, and then this process proceeds to step 11211. In step 11212, the ATX PS_ON #signal is deactivated (i.e. pulled high), and then this process proceeds to step 11211. In step 11211, this process ends.

Illustrated in FIG. 113 is an embodiment of the system control sequencing subprocedure 10921 which is one of multiple subprocedures orchestrated by the storage server's 100 power-on procedure (see FIG. 109). This process (i.e. system control sequencing subprocedure 10921) starts with step 11300 and then this process proceeds to step 11301. In step 11301, the control board 6400 resets the network power fault timer and then transmits the PWR_EN signal to the network backplane's 5300 network converter 5213, and then this process proceeds to step 11302. In step 11302, the control board's 6400 network power fault timer is determined to be either expired or not expired; if said fault timer is expired then this process proceeds to step 11312, and if said fault timer is not expired then this process proceeds to step 11303. In step 11303, the network backplane's 5300 network converter 5213 is determined to either have achieved or not achieved output stability; if said converter 5213 has achieved output stability then this process proceeds to step 11304, and if said converter 5213 has not achieved output stability then this process proceeds to step 11302. In step 11304, the network backplane's 5300 network converter 5213 transmits the PWR_GOOD signal back to the control board 6400, and then this process proceeds to step 11305. In step 11305, the NIC cards 5301 are successfully powered-up and then this process proceeds to step 11306. In step 11306, the control board 6400 resets the system power fault timer and then transmits the PWR_EN signal to the system board's 4800 switching regulator, and then this process proceeds to step 11307. In step 11307, the control board's 6400 system power fault timer is determined to be either expired or not expired; if said fault timer is expired then this process proceeds to step 11312, and if said fault timer is not expired then this process proceeds to step 11308. In step 11308, the system board's 4800 switching regulators are determined to either have achieved output stability or not achieved output stability; if said regulators have achieved output stability then this process proceeds to step 11309, and if said regulators have not achieved output stability then this process proceeds to step 11307. In step 11309, the system board's 4800 switching regulator transmits the PWR_GOOD signal back to the control board 6400, and then this process proceeds to step 11310. In step 11310, the system board 4800 is successfully powered-up, and then this process proceeds to step 11311. In step 11312, the ATX PS_ON #signal is deactivated (i.e. pulled high) and then this process proceeds to step 11311. In step 11311, this process ends.

Illustrated in FIG. 114 is an embodiment of the buck converter sequencing subprocedure which is one of multiple subprocedures orchestrated by the storage server's 100 power-on procedure (see FIG. 109). This process (i.e. buck converter sequencing subprocedure) starts with step 11400 and then this process proceeds to step 11401. In step 11401, a first buck converter 4304 receives a PWR_EN signal from the control board 6400, and then this process proceeds to step 11402. In step 11402, the power board's 4101 first buck converter 4304 is determined to either have achieved output stability or not achieved output stability; if said converter 4304 has achieved output stability then this process proceeds to step 11403, and if said converter 4304 has not achieved output stability then this process repeats step 11402. In step 11403, the first buck converter's 4304 PWR_GOOD output signal is used to trigger the PWR_EN input signal of the second buck converter 4300. In step 11404, the power board's 4101 second buck converter 4300 is determined to either have achieved output stability or not achieved output stability; if said converter 4300 has achieved output stability then this process proceeds to step 11405, and if said converter 4300 has not achieved output stability then this process repeats step 11404. In step 11405, the second buck converter's 4300 PWR_GOOD output signal is used to trigger the PWR_EN input signal of the third buck converter 4301. In step 11406, the power board's 4101 third buck converter 4301 is determined to either have achieved output stability or not achieved output stability; if said converter 4301 has achieved output stability then this process proceeds to step 11407, and if said converter 4301 has not achieved output stability then this process repeats step 11406. In step 11407, the third buck converter's 4301 PWR_GOOD output signal is used to trigger the PWR_EN input signal of the fourth buck converter 4302. In step 11408, the power board's 4101 fourth buck converter 4302 is determined to either have achieved output stability or not achieved output stability; if said converter 4302 has achieved output stability then this process proceeds to step 11409, and if said converter 4302 has not achieved output stability then this process repeats step 11408. In step 11409, the fourth buck converter's 4302 PWR_GOOD output signal is used to trigger the PWR_EN input signal of the fifth buck converter 4303. In step 11410, the power board's 4101 fifth buck converter 4303 is determined to either have achieved output stability or not achieved output stability; if said converter 4303 has achieved output stability then this process proceeds to step 11411, and if said converter 4303 has not achieved output stability then this process repeats step 11410. In step 11411, the fifth buck converter's 4303 PWR_GOOD output signal is used to trigger the PWR_EN input signal of the sixth buck converter 4307. In step 11412, the power board's 4101 sixth buck converter 4307 is determined to either have achieved output stability or not achieved output stability; if said converter 4307 has achieved output stability then this process proceeds to step 11413, and if said converter 4307 has not achieved output stability then this process repeats step 11412. In step 11413, the sixth buck converter's 4307 PWR_GOOD output signal is used to trigger the PWR_EN input signal of the seventh buck converter 4306. In step 11414, the power board's 4101 seventh buck converter 4306 is determined to either have achieved output stability or not achieved output stability; if said converter 4306 has achieved output stability then this process proceeds to step 11415, and if said converter 4306 has not achieved output stability then this process repeats step 11414. In step 11415, the seventh buck converter's 4306 PWR_GOOD output signal is used to trigger the PWR_EN input signal of the eighth buck converter 4305. In step 11416, the power board's 4101 eighth buck converter 4305 is determined to either have achieved output stability or not achieved output stability; if said converter 4305 has achieved output stability then this process proceeds to step 11417, and if said converter 4305 has not achieved output stability then this process repeats step 11416. In step 11417, the eighth buck converter's 4305 PWR_GOOD output signal is transmitted back to the control board 6400, and then this process proceeds to step 11418. In step 11418, this process ends.

Illustrated in FIG. 115 is an embodiment of the adapter sequencing subprocedure which is one of multiple subprocedures orchestrated by the storage server's 100 power-on procedure (see FIG. 109). This process (i.e. adapter sequencing subprocedure) starts with step 11500 and then this process proceeds to step 11501. In step 11501, the sequence controller 4619 (depicted as "MCU" in FIG. 115) clears the counter bad adapter count 4625 and then transmits a PWR_EN signal to a first host adapter 4500 (host adapters 4500 are depicted as "host" in FIG. 115). In step 11502, a first adapter stability subprocedure is determined to either have completed with success or completed in failure; if said subprocedure has completed with success then this process proceeds to step 11504, and if said subprocedure has completed in failure then this process proceeds to step 11503. In step 11503, the sequence controller 4619 increments the counter bad adapter count 4625, and then this process proceeds to step 11504. In step 11504, the sequence controller 4619 transmits a PWR_EN signal to a second host adapter 4500, and then this process proceeds to step 11505. In step 11505, a second adapter stability subprocedure is determined to either have completed with success or completed in failure; if said subprocedure has completed with success then this process proceeds to step 11507, and if said subprocedure has completed in failure then this process proceeds to step 11506. In step 11506, the sequence controller 4619 increments the counter bad adapter count 4625, and then this process proceeds to step 11507. In step 11507, the sequence controller 4619 transmits a PWR_EN signal to a third host adapter 4500, and then this process proceeds to step 11508. In step 11508, a third adapter stability subprocedure is determined to either have completed with success or completed in failure; if said subprocedure has completed with success then this process proceeds to step 11510, and if said subprocedure has completed in failure then this process proceeds to step 11509. In step 11509, the sequence controller 4619 increments the counter bad adapter count 4625, and then this process proceeds to step 11510. In step 11510, the sequence controller 4619 transmits a PWR_EN signal to a fourth host adapter 4500, and then this process proceeds to step 11511. In step 11511, a fourth adapter stability subprocedure is determined to either have completed with success or completed in failure; if said subprocedure has completed with success then this process proceeds to step 11513, and if said subprocedure has completed in failure then this process proceeds to step 11512. In step 11512, the sequence controller 4619 increments the counter bad adapter count 4625, and then this process proceeds to step 11513. In step 11513, the sequence controller 4619 transmits a PWR_EN signal to a fifth host adapter 4500, and then this process proceeds to step 11514. In step 11514, a fifth adapter stability subprocedure is determined to either have completed with success or completed in failure; if said subprocedure has completed with success then this process proceeds to step 11516, and if said subprocedure has completed in failure then this process proceeds to step 11515. In step 11515, the sequence controller 4619 increments the counter bad adapter count 4625, and then this process proceeds to step 11516. In step 11516, the sequence controller 4619 transmits a PWR_EN signal to a sixth host adapter 4500, and then this process proceeds to step 11517. In step 11517, a sixth adapter stability subprocedure is determined to either have completed with success or completed in failure; if said subprocedure has completed with success then this process proceeds to step 11519, and if said subprocedure has completed in failure then this process proceeds to step 11518. In step 11518, the sequence controller 4619 increments the counter bad adapter count 4625, and then this process proceeds to step 11519. In step 11519, the sequence controller 4619 transmits a PWR_EN signal to a seventh host adapter 4500, and then this process proceeds to step 11520. In step 11520, a seventh adapter stability subprocedure is determined to either have completed with success or completed in failure; if said subprocedure has completed with success then this process proceeds to step 11522, and if said subprocedure has completed in failure then this process proceeds to step 11521. In step 11521, the sequence controller 4619 increments the counter bad adapter count 4625, and then this process proceeds to step 11522. In step 11522, the sequence controller 4619 transmits a PWR_EN signal to an eighth host adapter 4500, and then this process proceeds to step 11523. In step 11523, an eighth adapter stability subprocedure is determined to either have completed with success or completed in failure; if said subprocedure has completed with success then this process proceeds to step 11525, and if said subprocedure has completed in failure then this process proceeds to step 11524. In step 11524, the sequence controller 4619 increments the counter bad adapter count 4625, and then this process proceeds to step 11525. In step 11525, the sequence controller 4619 transmits a PWR_EN signal to a ninth host adapter 4500, and then this process proceeds to step 11526. In step 11526, a ninth adapter stability subprocedure is determined to either have completed with success or completed in failure; if said subprocedure has completed with success then this process proceeds to step 11528, and if said subprocedure has completed in failure then this process proceeds to step 11527. In step 11527, the sequence controller 4619 increments the counter bad adapter count 4625, and then this process proceeds to step 11528. In step 11528, the counter bad adapter count 4625 is determined to either be within specification or not be within specification; if said counter is within specification then this process proceeds to step 11529, and if said counter is not within specification then this process repeats step 11528. In step 11529, this process ends.

Illustrated in FIG. 116 is an embodiment of the adapter stability subprocedure which is one of multiple subprocedures orchestrated by the storage server's 100 power-on procedure (see FIG. 109). This process (i.e. adapter stability subprocedure) starts with step 11600 and then this process proceeds to step 11601. In step 11601, the sequence controller 4619 resets the adapter stability fault timer, and then this process proceeds to step 11602. In step 11602, the host adapter's 4500 power circuitry receives a PWR_EN signal from the sequence controller 4619 which then initiates said adapter's 4500 switching regulators, and then this process proceeds to step 11603. In step 11603, the sequence controller's 4619 adapter stability fault timer is determined to be either expired or not expired; if said fault timer is expired then this process proceeds to step 11608, and if said fault timer is not expired then this process proceeds to step 11604. In step 11604, the host adapter's 4500 switching regulators are determined to either have achieved or not achieved output stability; if said regulators have achieved output stability then this process proceeds to step 11605, and if said regulators have not achieved output stability then this process proceeds to step 11603. In step 11605, the host adapter's 4500 power circuitry transmits a PWR_GOOD signal back to the sequence controller 4619, and then this process proceeds to step 11606. In step 11606, the adapter stability subprocedure is completed with success, and then this process proceeds to step 11607. In step 11608, the adapter stability subprocedure is completed in failure, and then this process proceeds to step 11607. In step 11607, this process ends.

Illustrated in FIG. 117 is an embodiment of the storage server 100. This storage server 100 includes the system board 4800 which comprises the host processor 4806, one or more (e.g. four) backplane slots 4816-4819 (depicted in FIG. 117 as "back slot"), an expansion connector 4820 (depicted in FIG. 117 as "expa conn"), and one or more (e.g. two) boot connectors 4811 (depicted in FIG. 117 as "boot"). These boot connectors 4811 each attach, via a cable (e.g. SATA), to the storage drive 900 (depicted in FIG. 117 as "SSD"); and these drives 900 are located in the back cage 7200. The expansion connector 4820 attaches to the hybrid adapter's 5600 system connector 5017 (depicted in FIG. 117 as "syst conn"), via a cable (e.g. SLIMSAS). These backplane slots 4816 and 4817 connect to the network backplane's 5300 network couplers 5203 and 5204, and the backplane slots 4818 and 4819 connect to the host backplane's 4600 switch couplers 4616 and 4617. The network backplane 5300 connects to one or more (e.g. two) NIC cards 5301 (depicted in FIG. 117 as "NIC"). The hybrid adapter 5600 is attached to the power pack 7300, via a cable; and said adapter 5600 is attached to one or more (e.g. twelve) storage drives 900, which is located in the front cage 6800, via cables. The host backplane 4600 includes the host switch 4610, one or more (e.g. two) switch couplers 4616-4617, and one or more (e.g. nine) switch connections 4601-4609 (depicted in FIG. 117 as "switch conn"). The host switch 4610 connects, via differential pairs, to both the switch couplers 4616-4617 and the switch connections 4601-4609. Each switch connection 4601-4609 has one host adapter 4500 (depicted in FIG. 117 as "host a") plugged into said connection 4601-4609. One or more (e.g. five) of these host adapters 4500 are attached, via cables, to the left backplane 812; and one or more (e.g. five) of these host adapters 4500 are attached, via cables, to the right backplane 813. The left backplane 812 connects to the left column group 816, and the right backplane 813 connects to the right column group 817. Each of the carrier columns 804-806, composing such column groups 816 and 817, includes one or more (e.g. eighteen) storage drives 900.

Illustrated in FIG. 118A is an embodiment of the present day ZFS file system 11810 which includes an "Adaptive Replacement Cache" which is named an ARC 11803, a "second Level Adaptive Replacement Cache" which is named an L2ARC 11804, a "Separate intent LOG" which is named a SLOG 11808, a "metadata type device" which is named a special device 11809, "block type devices" where each is named a data disk 11807, and "pools of storage" where each is named a storage pool 11800. These storage pools 11800 are comprised of an ARC 11803, one or more L2ARCs 11804, one or more SLOGs 11808, one or more special devices 11809, and one or more data disks 11807. These special devices 11809 store metadata, i.e. indirect blocks of user data, and deduplication tables, said devices 11809 also opt-in to cache certain small files. These data disks 11807 are one-to-one mapped to storage drives 900, and are often located within the/dev directory when using various LINUX operating systems.

Illustrated in FIG. 118B is an embodiment of an improved ZFS file system 11810 which is named a ZFS+ file system 11802. The ZFS+ file system 11802 includes an ARC 11803, an L2ARC 11804, a "third Level Adaptive Replacement Cache" which is named an L3ARC 11805, a "fourth Level Adaptive Replacement Cache" which is named an L4ARC 11806, a SLOG 11808, a special device 11809, data disks 11807, and an improved storage pool 11800 which is named a storage pool+11801. The storage pool+11801 may be comprised of an ARC 11803, one or more L2ARCs 11804, one or more L3ARCs 11805, one or more L4ARCs 11806, one or more SLOGs 11808, one or more special devices 11809, and one or more data disks 11807. This improvement, i.e. the addition of the L3ARC 11805 and L4ARC 11806 devices, supplements the read caching capabilities of the L2ARC 11804. Expansion of the read cache hierarchy, via additional devices 11805-11806, may increase the storage server's 100 performance.

Illustrated in FIG. 118C is an embodiment of a ZFS+ file system's 11802 read cache tiering mechanisms when L2ARC 11804, L3ARC 11805, and L4ARC 11806 storage devices are used by a storage pool+11801 created by said file system 11802. Optimally, the read latency of the ARC 11803 is less than the read latency of the L2ARC 11804, the read latency of the L2ARC 11804 is less than the read latency of the L3ARC 11805, the read latency of the L3ARC 11805 is less than the read latency of the L4ARC 11806, and the read latency of the L4ARC 11806 is less than the read latency of the one or more data disks 11807 in which said read data has been stored. The cache tiering mechanism between various sources (e.g. data disks 11807, L2ARC 11804, L3ARC 11805, and L4ARC 11806) and the ARC 11803 is named a first tiering 11811; the cache tiering mechanism between the ARC 11803 and the L2ARC 11804 is named a second tiering 11812; the cache tiering mechanism between the L2ARC 11804 and the L3ARC 11805 is named a third tiering 11813; and the cache tiering mechanism between the L3ARC 11805 and the L4ARC 11806 is named a fourth tiering 11814. These first 11811, second 11812, third 11813, and fourth 11814 tierings may implement various read cache policies and/or cache tiering strategies. However, the inventive aspects of this disclosure apply irrespective of which cache policies and/or tiering strategies are utilized by said tierings 11811-11814.

In alternative embodiments (not shown in figures), the ZFS+ file system's 11802 read cache tiering does not include the L4ARC 11806 device (and thus not the fourth tiering 11814), or does not include L3ARC 11805 and L4ARC 11806 devices (and thus not the third 11813 and fourth

11814 tierings), or does not include L2ARC 11804, L3ARC 11805, and L4ARC 11806 devices (and thus not the second 11812, third 11813, and fourth 11814 tierings). Similar to the L3ARC 11805 and L4ARC 11806 read cache tiering devices, the ZFS+ file system's 11802 storage pool+11801 further extends said read cache tiering with a L5ARC storage device and fifth tiering mechanism.

Illustrated in FIG. 119 is an embodiment of a ZFS+ file system's 11802 read cache hierarchy traversal procedure. This process (i.e. read cache hierarchy traversal procedure) starts with step 11900 and then this process proceeds to step 11901. In step 11901, the ZFS+ file system's 11802 storage pool+11801 receives a read data request from a client (via a network file sharing protocol 10801, such as NFS or SMB), and then this process proceeds to step 11902. In step 11902, the requested read data is determined to be either located in the ARC 11803 or not located in the ARC 11803; if said data is found then this process proceeds to step 11910, and if said data is not found then this process proceeds to step 11903. In step 11903, the requested read data is determined to be either located in the L2ARC 11804 or not located in the L2ARC 11804; if said data is found then this process proceeds to step 11909, and if said data is not found then this process proceeds to step 11904. In step 11904, the requested read data is determined to be either located in the L3ARC 11805 or not located in the L3ARC 11805; if said data is found then this process proceeds to step 11908, and if said data is not found then this process proceeds to step 11905. In step 11905, the requested read data is determined to be either located in the L4ARC 11806 or not located in the L4ARC 11806; if said data is found then this process proceeds to step 11907, and if said data is not found then this process proceeds to step 11906. In step 11906, the requested read data is copied from the relevant data disk(s) 11807 to the ARC 11803 and then the read cache hierarchy's first tiering 11811 mechanism is executed, and then this process proceeds to step 11910. In step 11907, the requested read data is copied from the L4ARC 11806 to the ARC 11803 and then the read cache hierarchy's fourth tiering 11814 mechanism is executed, and then this process proceeds to step 11910. In step 11908, the requested read data is copied from the L3ARC 11805 to the ARC 11803 and then the read cache hierarchy's third tiering 11813 mechanism is executed, and then this process proceeds to step 11910. In step 11909, the requested read data is copied from the L2ARC 11804 to the ARC 11803 and then the read cache hierarchy's second tiering 11812 mechanism is executed, and then this process proceeds to step 11910. In step 11910, the ZFS+ file system's 11802 storage pool+11801 sends the requested read data from the ARC 11803 to the client, and then this process proceeds to step 11911. In step 11911, this process ends.

Illustrated in FIG. 120 is an embodiment of the storage server 100 and how various hardware aspects (indicated with solid lines) of said server 100 may be mapped to various software aspects (indicated with dashed lines) of the ZFS+ file system 11802. The file system's 11802 storage pools+11801 may each be comprised of one or more "Virtual DEVices" where each is named a VDEV 12000. A VDEV 12000 may be comprised of one or more physical devices, and said devices may be of various types, such as: storage drives 900, RAM drives 10808, and NVRAM drives 10809. The VDEVs 12000 comprised of a plurality of physical devices, such as raidz groups (e.g. raidz1, raidz2, and raidz3) and mirrors (e.g. 2-way/3-way), may be organized according to various performance and/or fault tolerance (i.e. redundancy) levels. A raidz group's redundancy may feature single, double, or triple parity; thus said group may sustain one, two, or three physical device failures, respectively, without losing data. Further, 2-way and 3-way mirrors may lose one and two physical devices, respectively, without losing data. The storage server's 100 operating system 10803, on which an instance of the ZFS+ file system 11802 may be run, may boot from a "specific type of storage pool" which is named a root pool 12001. The root pool 12001 may be comprised of two data disks 11807 which are composed into a 2-way mirrored VDEV 12000 from which the operating system 10803 may be booted. Each of these two data disks 11807 may be mapped to the storage drive 900 (depicted in FIG. 120 as "SSD") which is located in the storage server's 100 back cage 7200. A storage pool+11801 providing storage to the end-users (i.e. clients) of the storage server 100 may be comprised of a specifically architected set of VDEVs 12000, such as a SLOG 11808, an L2ARC 11804, an L3ARC 11805, and eight raidz groups (e.g. raidz3). The SLOG 11808 may be mapped to the hybrid adapter's 5600 NVRAM drive 10809, the L2ARC 11804 may be mapped (and striped) to nine host adapters' 4500 RAM drives 10808, the L3ARC 11805 may be mapped (and striped) to twelve storage drives 900 (depicted in FIG. 120 as "SSD") which are located in the storage server's 100 front cage 6800 and are attached via the hybrid adapter's 5600 HBA device 10807, and each of these eight raidz groups may be mapped to eighteen storage drives 900 (depicted in FIG. 120 as "SSD"). Four of these eight raidz groups may be connected to the left backplane 812 while the remaining four of eight raidz groups may be connected to the right backplane 813. The hybrid adapter 5600 mapped to such SLOG 11808 may utilize said adapter's 5600 DRAM 5002 and NAND 5003 to underpin the NVRAM drive's 10809 non-volatile storage media; and the host adapters 4500 (depicted in FIG. 120 as "host a") mapped to such L2ARC 11804 may use said adapters' 4500 memory modules 4507 (depicted in FIG. 120 as "DIMM") to underpin the RAM drives' 10808 volatile storage media. Enablement of the L2ARC's 11804 persistence feature (i.e. tunable) when said L2ARC 11804 uses volatile storage media may be beneficial to said L2ARC's 11804 read performance.

The ZFS file system 11810 is not able to successfully enable the L2ARC's 11804 persistence feature when said L2ARC's 11804 storage media is volatile (e.g. RAM drives 10808). But, the ZFS+ file system 11802 may enable the use of L2ARC 11804 persistence, even with volatile storage media, by copying said L2ARC's 11804 contents to a properly sized destination (e.g. root pool) during a controlled shutdown of the storage server 100. This controlled shutdown may result in an L2ARC's 11804 contents being copied prior to the loss of the storage server's 100 power; then following said server's 100 next power-on procedure such contents may be copied back to said L2ARC 11804. A controlled shutdown may by definition not involve an unexpected power loss for the storage server 100. To beneficially minimize the storage requirements of the L2ARC's 11804 contents being copied, the metadata of said contents may be alternatively stored in place of said content.

As illustrated in FIG. 120, this embodiment of the storage server 100 comprises a specific set of VDEVs 12000 which optimally maps to a specific set of said server's 100 components to beneficially provide improved performance and fault tolerance from said server 100.

Illustrated in FIG. 121 are two superimposed embodiments of the storage server's 100 one hundred forty-four storage drives 900 (depicted in FIG. 121 as "SSD"), located in the top section 208 of said server 100, and the attachment of said drives 900 to host adapters 4500. Further, this depiction (via solid or dashed rectangles) captures the assignment of said disks 11807 to two separate but visibly superimposed VDEV 12000 configurations. In both configurations (i.e. embodiments) storage drives 900 are mapped one-to-one as data disks 11807. These embodiments may use either the ZFS 11810 or ZFS+11802 file system. The first embodiment uses a particular "VDEV 12000 configuration" which is named a single redundant configuration 12100. This single redundant configuration 12100 beneficially provides both data disk 11807 and host adapter 4500 fault tolerance. The VDEVs 12000 (indicated with solid rectangles) used by the single redundant configuration 12100 are configured as follows: sixteen storage drives 900 attached to each of nine host adapters 4500, with two of said drives 900 from each said adapter 4500 organized as one of eight raidz groups (either raidz2 or raidz3). In this single redundant configuration 12100, all eight VDEVs 12000 are created using the same parity level, i.e. no mixing of different raidz groups within said configuration 12100. The second embodiment uses a particular "VDEV 12000 configuration" which is named a multiple redundant configuration 12101. This multiple redundant configuration 12101 also beneficially provides both data disk 11807 and host adapter 4500 fault tolerance. The VDEVs 12000 (indicated with dashed rectangles) used by the multiple redundant configuration 12101 are configured as follows: sixteen storage drives 900 attached to each of nine host adapters 4500, with one of said drives 900 from each said adapter 4500 organized as one of sixteen raidz groups (either raidz1, raidz2, or raidz3). In this multiple redundant configuration 12101, all sixteen VDEVs 12000 are created using the same parity level, i.e. no mixing of different raidz groups within said configuration 12101. The extent (i.e. level) of host adapter 4500 redundancy provided by either the single redundant 12100 or multiple redundant 12101 configuration is derived from the VDEV's 12000 parity level.

For example, in the instance of the single redundant configuration 12100 created using raidz2 (i.e. double parity), said configuration 12100 is able to sustain any one of the nine host adapters 4500 to fail, and therefore the sixteen data disks 11807 attached to said failed adapter 4500 to fail, without data loss in the eight VDEVs 12000 comprising said configuration 12100. Further, the configuration 12100, following such host adapter 4500 failure, typically requires the resilvering (i.e. rebuilding) process to finish without an additional data disk 11807 failure to avoid data loss.

For example, in the instance of the single redundant configuration 12100 created using raidz3 (i.e. triple parity), said configuration 12100 is able to sustain any one of the nine host adapters 4500 to fail, and thereby the sixteen data disks 11807 attached to said failed adapter 4500 to fail, without data loss in the eight VDEVs 12000 comprising said configuration 12100. The configuration 12100 shall avoid data loss during the resulting resilvering even with eight additional data disk 11807 failures (during said resilvering), if said failures are limited to one per VDEV 12000.

For example, in the instance of the multiple redundant configuration 12101 created using raidz1 (i.e. single parity), said configuration 12101 is able to sustain any one of the nine host adapters 4500 to fail, and thereby the sixteen data disks 11807 attached to said failed adapter 4500 to fail, without data loss in the sixteen VDEVs 12000 comprising said configuration 12101. Further, the configuration 12101, following such host adapter 4500 failure, typically requires the resilvering (i.e. rebuilding) process to finish without an additional data disk 11807 failure to avoid data loss.

For example, in the instance of the multiple redundant configuration 12101 created using raidz2 (i.e. double parity), said configuration 12101 is able to sustain any one of the nine host adapters 4500 to fail, and thus the sixteen data disks 11807 attached to said failed adapter 4500 to fail, without data loss in the sixteen VDEVs 12000 comprising said configuration 12101. The configuration 12101 shall avoid data loss during the resulting resilvering even with 16 additional disk 11807 failures (during said resilvering), if said failures are limited to one per VDEV 12000.

For example, in the instance of the multiple redundant configuration 12101 created using raidz2 (i.e. double parity), said configuration 12101 is able to sustain any two of the nine host adapters 4500 to fail, and thus the sixteen disks 11807 attached to each of said failed adapters 4500 to fail, without data loss in the sixteen VDEVs 12000 comprising said configuration 12101. Also, the configuration 12101, following such host adapter 4500 failures, typically requires the resilvering (i.e. rebuilding) process to finish without an additional data disk 11807 failure to avoid data loss.

For example, in the instance of the multiple redundant configuration 12101 created using raidz3 (i.e. triple parity), said configuration 12101 is able to sustain any one of the nine host adapters 4500 to fail, and thereby the sixteen data disks 11807 attached to said failed adapter 4500 to fail, without data loss in the sixteen VDEVs 12000 comprising said configuration 12101. The configuration 12101 shall avoid data loss during the resulting resilvering even with 32 additional disk 11807 failures (during said resilvering), if said failures are limited to two per VDEV 12000.

For example, in the instance of the multiple redundant configuration 12101 created using raidz3 (i.e. triple parity), said configuration 12101 is able to sustain any two of the nine host adapters 4500 to fail, and thus the sixteen data disks 11807 attached to each of said failed adapters 4500 to fail, without data loss in the sixteen VDEVs 12000 comprising said configuration 12101. The configuration 12101 shall avoid data loss during the resulting resilvering even with 16 additional disk 11807 failures (during said resilvering), if said failures are limited to one per VDEV 12000.

For example, in the instance of the multiple redundant configuration 12101 created using raidz3 (i.e. triple parity), said configuration 12101 is able to sustain any three of the nine host adapters 4500 to fail, and thereby the sixteen data disks 11807 attached to each of said failed adapters 4500 to fail, without data loss in the sixteen VDEVs 12000 comprising said configuration 12101. But, the configuration 12101, following such host adapter 4500 failures, typically requires the resulting resilvering process to finish without an additional data disk 11807 failure to avoid data loss.

As illustrated in FIG. 121, there are at least two embodiments of the storage server's 100 one hundred forty-four storage drives 900 and how said drives 900, mapped one-to-one as data disks 11807, are attached to nine host adapters 4500 and then configured to either the single redundant configuration 12100 (with eight VDEVs 12000) or the multiple redundant configuration 12101 (with sixteen VDEVs 12000). However, the inventive aspects of this disclosure apply to a varying number of host adapters 4500, a varying number of storage drives 900 that are equally attached to said adapters 4500, and a varying number of VDEVs 12000 per alternative configuration that may support varying levels of redundancy for said adapters 4500 within the storage pool(+) 11810 and 11802. Further, these alternative configurations (not shown in FIG. 121) may also use raidz groups with increased parity (compared to raidz1, raidz2, and raidz3), such as raidz4 and raidz5. Notably, VDEVs 12000 organized with raidz4 or raidz5 have quadruple or quintuple parity respectively and thereby are able to sustain four or five physical device failures respectively without losing data.

The storage server 100 utilizing a free-standing enclosure with both bilateral accessibility of drive carriers 800 and the bilaterally symmetrical mounting (via mounting holes 2525) of storage drives 900 attached to said carriers 800 (within the top section 208) may maximize the number and density of said drives 900 within said server 100. This maximized number of storage drives 900, when mapped one-to-one as data disks 11807, may beneficially improve how said disks 11807 are able to be organized into VDEVs 12000. This improvement may be applicable to various ZFS file system 11810 and ZFS+ file system 11802 metrics, such as: increased storage capacity, increased storage performance, and increased storage fault tolerance. This increased capacity may be a result of a maximized number of storage drives 900 which are available for aggregation when creating a VDEV 12000. This increased performance may be a result of a maximized number of storage drives 900 enabling an increased number of VDEVs 12000 to be utilized when creating a storage pool 11810 or storage pool+11802. This increased fault tolerance may be a result of a maximized number of storage drives 900 enabling an increased parity level when selecting either a raidz group (e.g. raidz3 instead of raidz2) or mirror (e.g. 3-way instead of 2-way) to create a VDEV 12000. Finally, this increased fault tolerance via a maximized number of storage drives 900 may augment data disk 11807 redundancy with various levels of host adapter 4500 redundancy.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the disclosed subject matter (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but is not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or example language (e.g., "such as") provided herein, is intended merely to better illuminate the disclosed subject matter and does not pose a limitation on the scope of the invention unless otherwise claimed. No language in the specification should be construed as indicating any non-claimed element as essential to the practice of the invention.

Variations of the embodiments disclosed herein may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

It should further be noted that throughout the entire disclosure, the labels such as left, right, front, back, top, bottom, above, below or other similar terms such as upper, lower, vertical, horizontal, oblique, proximal, distal, parallel, perpendicular, transverse, longitudinal, etc. have been used for convenience purposes only and are not intended to imply any particular fixed direction or orientation. Instead, they are used to reflect relative locations and/or directions/orientations between various portions of an object. In addition, references to "first," "second," "third," and etc. members throughout the disclosure (and in particular, claims) are not used to show a serial or numerical limitation but instead are used to distinguish or identify the various members of the group.

The invention claimed is:

1. A storage server, comprising:

a plurality of storage drives, wherein each of the storage drives comprises a device connector and a plurality of mounting holes;

a left backplane comprising a plurality of disk receptacles and a plurality of plug receptacles, wherein each of the disk receptacles of the left backplane is mated with the device connector of a respective storage drive of the plurality of storage drives, and the plug receptacles of the left backplane are aligned in a vertically stacked orientation;

a right backplane comprising a plurality of disk receptacles and a plurality of plug receptacles, wherein each of the disk receptacles of the right backplane is mated with the device connector of a respective storage drive of the plurality of storage drives, and the plug receptacles of the right backplane are aligned in a vertically stacked orientation;

a backing plate comprising a left surface and a right surface, wherein the left backplane is secured to the left surface of the backing plate and the right backplane is secured to the right surface of the backing plate;

a plurality of host adapters, each of the host adapters comprises a left receptacle group and a right receptacle group, each of the left receptacle groups comprises a plurality of plug receptacles, each of the right receptacle groups comprises a plurality of plug receptacles, wherein the host adapters are aligned in a vertically stacked orientation;

a median plane, wherein:

i) the median plane equally bisects the backing plate, ii) the median plane is equidistant to the left surface and the right surface, iii) the mounting holes of each of the storage drives mated to the left backplane are bilaterally symmetrical about the median plane to the corresponding mounting holes of each of the storage drives mated to the right backplane, iv) the plug receptacles of the left backplane are bilaterally symmetrical about the median plane to the corresponding plug receptacles of the right backplane, v) the left receptacle group is bilaterally symmetrical about the median plane to the right receptacle group for each of the host adapters;

a plurality of cables, wherein:

vi) each of the plug receptacles of the left backplane is coupled to a corresponding plug receptacle of the plurality of plug receptacles of the left receptacle group of a host adapter of the plurality of host adapters using a respective cable of the plurality of cables, vii) each of the plug receptacles of the right backplane is coupled to a corresponding plug receptacle of the plurality of plug receptacles of the right receptacle group of a host adapter of the plurality of host adapters using a respective cable of the plurality of cables; and the storage server is free-standing and designed for independent operation and is not intended to be mounted within a separate server rack cabinet.

2. The storage server of claim 1, wherein each of the cables is configured to a minimized length.

* * * * *